US011069861B2

(12) United States Patent
Maeda et al.

(10) Patent No.: US 11,069,861 B2
(45) Date of Patent: Jul. 20, 2021

(54) MIXTURE, ORGANIC ELECTROLUMINESCENCE DEVICE AND ELECTRONIC EQUIPMENT

(71) Applicant: IDEMITSU KOSAN CO., LTD., Tokyo (JP)

(72) Inventors: Ryoji Maeda, Sodegaura (JP); Tasuku Haketa, Sodegaura (JP); Kazuki Nishimura, Sodegaura (JP); Masato Nakamura, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 17/077,493

(22) Filed: Oct. 22, 2020

(65) Prior Publication Data

US 2021/0043850 A1 Feb. 11, 2021

Related U.S. Application Data

(63) Continuation of application No. PCT/JP2020/028536, filed on Jul. 22, 2020.

(30) Foreign Application Priority Data

Jul. 25, 2019 (JP) ............................ JP2019-137133

(51) Int. Cl.
*H01L 51/00* (2006.01)
*C07C 13/08* (2006.01)
(Continued)

(52) U.S. Cl.
CPC ........ *H01L 51/0072* (2013.01); *H01L 51/006* (2013.01); *H01L 51/0073* (2013.01)

(58) Field of Classification Search
CPC .... C07C 13/08; C07D 221/18; C07D 241/36; H01L 51/0059; H01L 51/006; H01L 51/0072; H01L 51/0073
See application file for complete search history.

(56) References Cited

U.S. PATENT DOCUMENTS 8,088,901 B2 * 1/2012 Morishita ........... H01L 51/0072 532/1
8,288,013 B2 * 10/2012 Morishita ............ C07D 401/10 428/690

(Continued)

FOREIGN PATENT DOCUMENTS

CN 109928894 A 6/2019
JP 5507057 B2 5/2014

(Continued)

OTHER PUBLICATIONS

SciFinder Search (Year: 2020).*

(Continued)

*Primary Examiner* — Vu A Nguyen
(74) *Attorney, Agent, or Firm* — Foley & Lardner LLP

(57) ABSTRACT

A mixture contains a first compound and a second compound, in which the first compound has at least one of a first cyclic structure represented by a formula (11) below and a second cyclic structure represented by a formula (12) below, and the second compound is a compound represented by a formula (21) or a compound represented by a formula (22) below, and a total mass MT of the first and second compounds and a mass $M_2$ of the second compound in the mixture satisfy a relationship of a numerical formula (Numerical Formula 1) below, (Numerical Formula 1)

$$0.1 \leq (M_2/M_T) \times 100$$

(11)

(Continued)

-continued

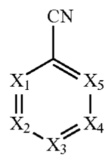

(12)

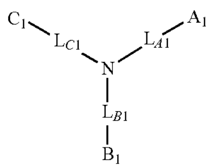

(21)

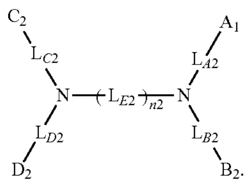

(22)

23 Claims, 12 Drawing Sheets

(51) Int. Cl.

| | |
|---|---|
| ***C07D 221/18*** | (2006.01) |
| ***C07D 241/36*** | (2006.01) |

(56) References Cited

U.S. PATENT DOCUMENTS 8,748,015 B2 * 6/2014 Morishita .............. C09K 11/06 428/690
2008/0265216 A1 10/2008 Hartmann et al.
2010/0019659 A1 1/2010 Morishita
2010/0102709 A1 4/2010 Zeika et al.
2011/0275814 A1 11/2011 Morishita
2011/0309309 A1 12/2011 Hartmann et al.
2012/0306362 A1 12/2012 Morishita
2014/0070145 A1 3/2014 Hartmann et al.
2014/0246663 A1 9/2014 Kambe et al.
2015/0097146 A1 4/2015 Hartmann et al.
2017/0200899 A1 7/2017 Kim et al.
2018/0006235 A1 1/2018 Yokoyama et al.
2018/0076389 A1 3/2018 Hartmann et al.
2018/0356743 A1 12/2018 Shimizu
2019/0074446 A1 3/2019 Xia
2020/0144552 A1 5/2020 Kim et al.
2020/0152873 A1 5/2020 Hartmann et al.
2020/0235304 A1 7/2020 Yun et al.

FOREIGN PATENT DOCUMENTS

JP 2015-065248 A 4/2015
JP 6126760 B2 5/2017
JP 2019-002950 A 1/2019
JP 2019-009156 A 1/2019
KR 10-2017-0003470 A 1/2017
KR 10-2019-0053809 A 5/2019
WO WO 2009/011327 A1 1/2009
WO WO-2012/176675 A1 12/2012
WO WO-2013/051234 A1 4/2013
WO WO-2018/178273 A1 10/2018
WO WO-2018/221871 A1 12/2018
WO WO-2021/015266 A1 1/2021

OTHER PUBLICATIONS

STN Search (Year: 2020).*
International Searching Authority, "International Search Report," issued in connection with International Patent Application No. PCT/JP2020/028536, dated Oct. 13, 2020.
International Searching Authority, "Written Opinion," issued in connection with International Patent Application No. PCT/JP2020/028536, dated Oct. 13, 2020.

* cited by examiner

MIXTURE, ORGANIC ELECTROLUMINESCENCE DEVICE AND ELECTRONIC EQUIPMENT

CROSS-REFERENCE TO RELATED APPLICATIONS

This application claims priority to Application No. PCT/JP2020/028536 filed on Jul. 22, 2020, which application claims priority to Japanese Application No. 2019-137133, filed on Jul. 25, 2019. The entire contents of the above applications are incorporated herein by reference in their entireties.

TECHNICAL FIELD

The present invention relates to a mixture, an organic electroluminescence device and electronic equipment.

BACKGROUND ART

When a voltage is applied to an organic electroluminescence device (hereinafter, referred to as an organic EL device), holes are injected from an anode and electrons are injected from a cathode into an emitting layer. The injected electrons and holes are recombined in the emitting layer to form excitons. Specifically, according to the electron spin statistics theory, singlet excitons and triplet excitons are generated at a ratio of 25%:75%.

Organic EL device finds its application in full-color displays of cellular phones, televisions, and the like. In order to enhance the performance of the organic EL device, various studies have been made for compounds used in the organic EL device (see, for instance, Patent Literature 1). The performance of the organic EL device is evaluated in terms of, for instance, luminance, emission wavelength, chromaticity, emission efficiency, drive voltage, and lifetime.

An organic EL device containing an organic layer other than an emitting layer, such as organic EL devices of Patent Literatures 1 to 6, has been widely known.

CITATION LIST

Patent Literature(S)

Patent Literature 1: JP 2015-65248 A
Patent Literature 2: International Publication No. WO2013/051234
Patent Literature 3: JP Patent No. 6126760 B
Patent Literature 4: JP Patent No. 5507057 B
Patent Literature 5: International Publication No. WO2018/221871
Patent Literature 6: Chinese Patent Application Publication No. 109928894

For instance, Patent Literature 1 discloses a method of forming a hole injecting layer, a hole transporting layer, an emitting layer, an electron transporting layer and an electron injectable electrode through vapor deposition. Thus, dry film-forming such as vapor deposition and sputtering has been used as a film forming method of an organic layer(s) in an organic EL device.

Patent Literature 1 employs a fused compound having a plurality of cyano groups when forming a hole injecting layer.

When the fused compound of Patent Literature 1 is used for forming the hole injecting layer through dry film-forming, a bulky adhering film is sometimes formed inside a film-forming device in addition to a support (e.g., substrate) as a film formation target. Thus, depending on a kind of an organic compound forming an organic layer, the bulky adhering film is sometimes formed inside the film-forming device. The adhering film formed inside the film-forming device narrows or blocks a path through which a vaporized organic material passes toward the support (e.g., substrate), resulting in a difficulty for the organic compound to selectively adhere on a desired region.

For this reason, when the bulky adhering film is formed inside the film-forming device, the adhering film needs to be removed, which lowers a production efficiency of the organic EL device.

SUMMARY OF THE INVENTION

An object of the invention is to provide a mixture capable of inhibiting formation of a bulky adhering film when forming an organic layer of an organic EL device.

In addition, another object of the invention is to provide an organic electroluminescence device including an organic layer formed of the above mixture and an electronic device including the organic electroluminescence device.

A mixture according to an exemplary embodiment of the invention contains a first compound and a second compound, in which the first compound has at least one of a first cyclic structure represented by a formula (11) below and a second cyclic structure represented by a formula (12) below; the second compound is a compound represented by a formula (21) below or a compound represented by a formula (22) below; and a total mass MT of the first and second compounds and a mass $M_2$ of the second compound in the mixture satisfy a relationship of a numerical formula (Numerical Formula 1) below.

$$0.1 \leq (M_2/M_T) \times 100 \quad \text{(Numerical Formula 1)}$$

(11)

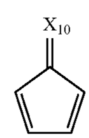

(12)

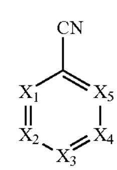

The first cyclic structure represented by the formula (11) is fused to at least one cyclic structure of a substituted or unsubstituted aromatic hydrocarbon ring having 6 to 50 ring carbon atoms or a substituted or unsubstituted heterocycle having 5 to 50 ring atoms in a molecule of the first compound.

A structure represented by $=X_{10}$ is represented by a formula (11a), (11b), (11c), (11d), (11e), (11f), (11g), (11h), (11i), (11j), (11k) or (11m).

[Formula 2]

(11a)

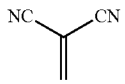

(11b)

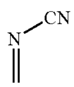

(11c)

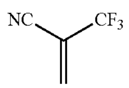

(11d)

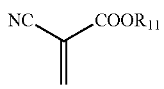

(11e)

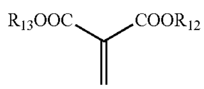

(11f)

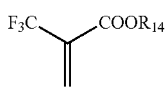

[Formula 3]

(11g)

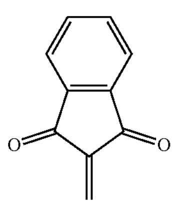

(11h)

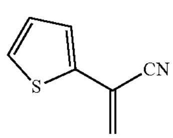

(11i)

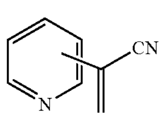

(11j)

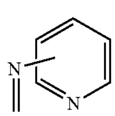

(11k)

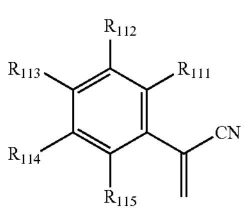

-continued (11m)

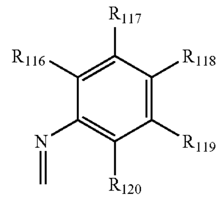

In the formula (11a), (11b), (11c), (11d), (11e), (11f), (11g), (11h), (11i), (11j), (11k) or (11m), $R_{11}$ to $R_{14}$ and $R_{111}$ to $R_{120}$ are each independently a hydrogen atom, a halogen atom, hydroxy group, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aryl group having 6 to 50 ring carbon atoms, or a substituted or unsubstituted heterocyclic group having 5 to 50 ring atoms.

In the formula (12), $X_1$ to $X_5$ are each independently a nitrogen atom, a carbon atom to be bonded to $R_{15}$, or a carbon atom to be bonded to another atom in the molecule of the first compound.

At least one of $X_1$ to $X_5$ is a carbon atom to be bonded to another atom in the molecule of the first compound.

$R_{15}$ is selected from the group consisting of a hydrogen atom, a halogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a substituted or unsubstituted aryl group having 6 to 50 ring carbon atoms, a substituted or unsubstituted heterocyclic group having 5 to 50 ring atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted alkenyl group having 2 to 50 carbon atoms, a substituted or unsubstituted aralkyl group having 7 to 50 carbon atoms, a carboxy group, a substituted or unsubstituted ester group, a substituted or unsubstituted carbamoyl group, a nitro group, and a substituted or unsubstituted siloxanyl group.

When a plurality of $R_{15}$ are present, the plurality of $R_{15}$ are mutually the same or different.

[Formula 4]

(21)

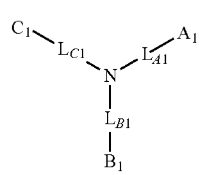

-continued (22)

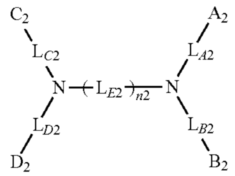

In the formulae (21) and (22), $L_{A1}$, $L_{B1}$, $L_{C1}$, $L_{A2}$, $L_{B2}$, $L_{C2}$ and $L_{D2}$ are each independently a single bond, a substituted or unsubstituted arylene group having 6 to 50 ring carbon atoms, or a substituted or unsubstituted divalent heterocyclic group having 5 to 50 ring atoms.

n2 is 1, 2, 3 or 4.

When n2 is 1, $L_{E2}$ is a substituted or unsubstituted arylene group having 6 to 50 ring carbon atoms, or a substituted or unsubstituted divalent heterocyclic group having 5 to 50 ring atoms.

When n2 is 2, 3 or 4, a plurality of $L_{E2}$ are mutually the same or different.

When n2 is 2, 3 or 4, the plurality of $L_{E2}$ are mutually bonded to form a substituted or unsubstituted monocyclic ring, mutually bonded to form a substituted or unsubstituted fused ring, or not mutually bonded.

$L_{E2}$ forming neither the monocyclic ring nor the fused ring is a substituted or unsubstituted arylene group having 6 to 50 ring carbon atoms, or a substituted or unsubstituted divalent heterocyclic group having 5 to 50 ring atoms.

$A_1$, $B_1$, $C_1$, $A_2$, $B_2$, $C_2$ and $D_2$ are each independently a substituted or unsubstituted aryl group having 6 to 50 ring carbon atoms, a substituted or unsubstituted heterocyclic group having 5 to 50 ring atoms, or —Si($R'_{901}$)($R'_{902}$)($R'_{903}$).

$R'_{901}$, $R'_{902}$ and $R'_{903}$ are each independently a substituted or unsubstituted aryl group having 6 to 50 ring carbon atoms.

When a plurality of $R'_{901}$ are present, the plurality of $R'_{901}$ are mutually the same or different.

When a plurality of $R'_{902}$ are present, the plurality of $R'_{902}$ are mutually the same or different.

When a plurality of $R'_{903}$ are present, the plurality of $R'_{903}$ are mutually the same or different.

In the first compound and the second compound, $R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

When a plurality of $R_{901}$ are present, the plurality of $R_{901}$ are mutually the same or different.

When a plurality of $R_{902}$ are present, the plurality of $R_{902}$ are mutually the same or different.

When a plurality of $R_{903}$ are present, the plurality of $R_{903}$ are mutually the same or different.

When a plurality of $R_{904}$ are present, the plurality of $R_{904}$ are mutually the same or different.

When a plurality of $R_{905}$ are present, the plurality of $R_{905}$ are mutually the same or different.

When a plurality of $R_{906}$ are present, the plurality of $R_{906}$ are mutually the same or different.

When a plurality of $R_{907}$ are present, the plurality of $R_{907}$ are mutually the same or different.

An organic electroluminescence device according to another aspect of the invention includes an anode, a cathode, and an organic layer containing a first compound and a second compound, in which the first compound has at least one of a first cyclic structure represented by the formula (11) and a second cyclic structure represented by the formula (12), and the second compound is a compound represented by the formula (21) or a compound represented by the formula (22), and a total mass WT of the first and second compounds and a mass $W_2$ of the second compound in the organic layer satisfy a relationship of a numerical formula (Numerical Formula 2) below.

$$0.1 \leq (W_2/W_T) \times 100 \quad \text{(Numerical Formula 2)}$$

According to still another aspect of the invention, an electronic device including the organic electroluminescence device according to the above aspect of the invention is provided.

According to the above aspect of the exemplary embodiment, a mixture capable of inhibiting formation of a bulky adhering film, when forming an organic layer of an organic EL device, can be provided.

According to the above aspect of the invention, an organic electroluminescence device including an organic layer formed of the mixture and an electronic device including the organic electroluminescence device can be provided.

DESCRIPTION OF EMBODIMENTS

Definitions

Figure 1:
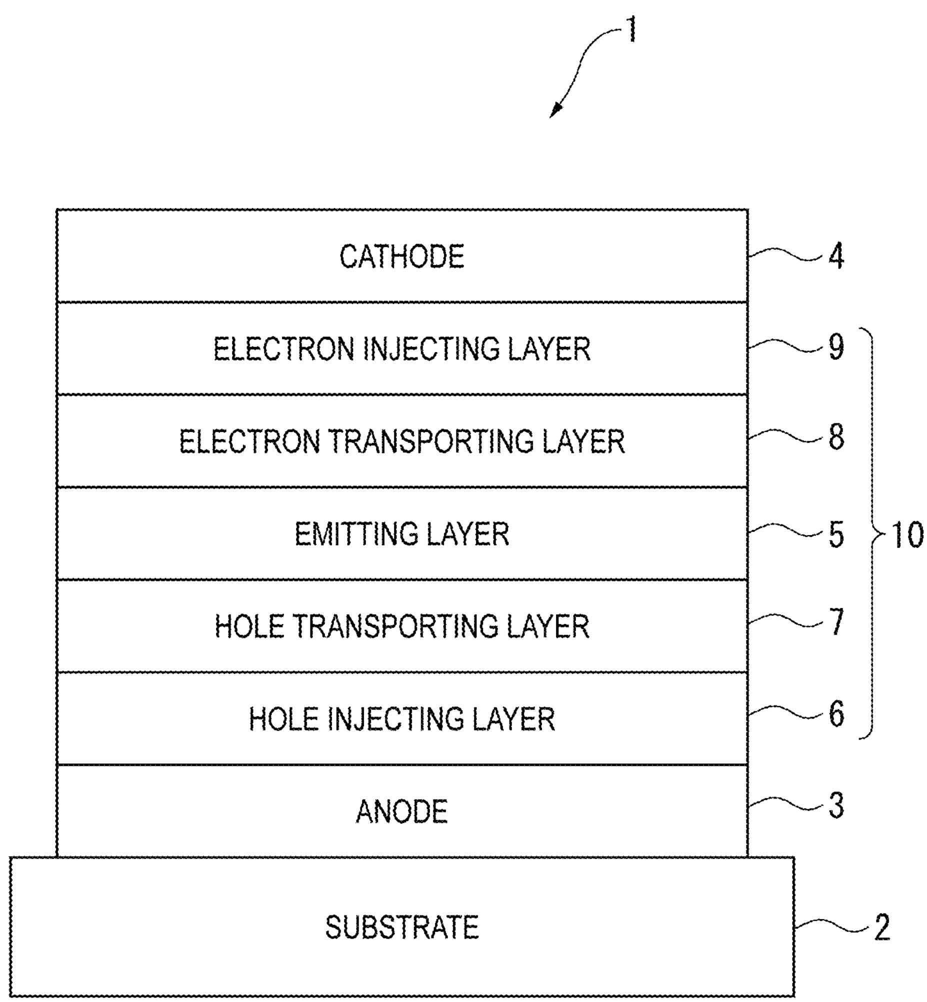
FIG. 1 schematically illustrates an arrangement of an organic electroluminescence device according to an exemplary embodiment of the invention.

Herein, a hydrogen atom includes isotope having different numbers of neutrons, specifically, protium, deuterium and tritium.

Herein, the ring carbon atoms refer to the number of carbon atoms among atoms forming a ring of a compound (e.g., a monocyclic compound, fused-ring compound, crosslinking compound, carbon ring compound, and heterocyclic compound) in which the atoms are bonded with each other to form the ring. When the ring is substituted by a substituent(s), carbon atom(s) contained in the substituent(s) is not counted in the ring carbon atoms. Unless otherwise specified, the same applies to the "ring carbon atoms" described later. For instance, a benzene ring has 6 ring carbon atoms, a naphthalene ring has 10 ring carbon atoms, a pyridine ring has 5 ring carbon atoms, and a furan ring has 4 ring carbon atoms. Further, for instance, 9,9-diphenylfluorenyl group has 13 ring carbon atoms and 9,9'-spirobifluorenyl group has 25 ring carbon atoms.

When a benzene ring is substituted by a substituent in a form of, for instance, an alkyl group, the number of carbon atoms of the alkyl group is not counted in the number of the ring carbon atoms of the benzene ring. Accordingly, the benzene ring substituted by an alkyl group has 6 ring carbon atoms. When a naphthalene ring is substituted by a substituent in a form of, for instance, an alkyl group, the number of carbon atoms of the alkyl group is not counted in the number of the ring carbon atoms of the naphthalene ring. Accordingly, the naphthalene ring substituted by an alkyl group has 10 ring carbon atoms.

Herein, the ring atoms refer to the number of atoms forming a ring of a compound (e.g., a monocyclic compound, fused-ring compound, crosslinking compound, carbon ring compound, and heterocyclic compound) in which the atoms are bonded to each other to form the ring (e.g., monocyclic ring, fused ring, and ring assembly). Atom(s) not forming the ring (e.g., hydrogen atom(s) for saturating the valence of the atom which forms the ring) and atom(s) in a substituent by which the ring is substituted are not counted as the ring atoms. Unless otherwise specified, the same applies to the "ring atoms" described later. For instance, a pyridine ring has 6 ring atoms, a quinazoline ring has 10 ring atoms, and a furan ring has 5 ring atoms. For instance, the number of hydrogen atom(s) bonded to a pyridine ring or the number of atoms forming a substituent are not counted as the pyridine ring atoms. Accordingly, a pyridine ring bonded with a hydrogen atom(s) or a substituent(s) has 6 ring atoms. For instance, the hydrogen atom(s) bonded to a quinazoline ring or the atoms forming a substituent are not counted as the quinazoline ring atoms. Accordingly, a quinazoline ring bonded with hydrogen atom(s) or a substituent(s) has 10 ring atoms.

Herein, "XX to YY carbon atoms" in the description of "substituted or unsubstituted ZZ group having XX to YY carbon atoms" represent carbon atoms of an unsubstituted ZZ group and do not include carbon atoms of a substituent(s) of the substituted ZZ group. Herein, "YY" is larger than "XX," "XX" representing an integer of 1 or more and "YY" representing an integer of 2 or more.

Herein, "XX to YY atoms" in the description of "substituted or unsubstituted ZZ group having XX to YY atoms" represent atoms of an unsubstituted ZZ group and does not include atoms of a substituent(s) of the substituted ZZ group. Herein, "YY" is larger than "XX," "XX" representing an integer of 1 or more and "YY" representing an integer of 2 or more.

Herein, the term "unsubstituted" used in a "substituted or unsubstituted ZZ group" means that a hydrogen atom(s) in the ZZ group is not substituted with a substituent(s).

Herein, the term "substituted" used in a "substituted or unsubstituted ZZ group" means that at least one hydrogen atom in the ZZ group is substituted with a substituent. Similarly, the term "substituted" used in a "BB group substituted by AA group" means that at least one hydrogen atom in the BB group is substituted with the AA group.

Substituent Mentioned Herein

Substituents mentioned herein will be described below.

An "unsubstituted aryl group" mentioned herein has, unless otherwise specified herein, 6 to 50, preferably 6 to 30, more preferably 6 to 18 ring carbon atoms.

An "unsubstituted heterocyclic group" mentioned herein has, unless otherwise specified herein, 5 to 50, preferably 5 to 30, more preferably 5 to 18 ring atoms.

An "unsubstituted alkyl group" mentioned herein has, unless otherwise specified herein, 1 to 50, preferably 1 to 20, more preferably 1 to 6 carbon atoms.

An "unsubstituted alkenyl group" mentioned herein has, unless otherwise specified herein, 2 to 50, preferably 2 to 20, more preferably 2 to 6 carbon atoms.

An "unsubstituted alkynyl group" mentioned herein has, unless otherwise specified herein, 2 to 50, preferably 2 to 20, more preferably 2 to 6 carbon atoms.

An "unsubstituted cycloalkyl group" mentioned herein has, unless otherwise specified herein, 3 to 50, preferably 3 to 20, more preferably 3 to 6 ring carbon atoms.

An "unsubstituted arylene group" mentioned herein has, unless otherwise specified herein, 6 to 50, preferably 6 to 30, more preferably 6 to 18 ring carbon atoms.

An "unsubstituted divalent heterocyclic group" mentioned herein has, unless otherwise specified herein, 5 to 50, preferably 5 to 30, more preferably 5 to 18 ring atoms.

An "unsubstituted alkylene group" mentioned herein has, unless otherwise specified herein, 1 to 50, preferably 1 to 20, more preferably 1 to 6 carbon atoms.

Substituted or Unsubstituted Aryl Group Specific examples (specific example group G1) of the "substituted or unsubstituted aryl group" mentioned herein include unsubstituted aryl groups (specific example group G1A) below and substituted aryl groups (specific example group G1B). (Herein, an unsubstituted aryl group refers to an "unsubstituted aryl group" in a "substituted or unsubstituted aryl group," and a substituted aryl group refers to a "substituted aryl group" in a "substituted or unsubstituted aryl group.") A simply termed "aryl group" herein includes both of "unsubstituted aryl group" and "substituted aryl group."

The "substituted aryl group" refers to a group derived by substituting at least one hydrogen atom in an "unsubstituted aryl group" with a substituent. Examples of the "substituted aryl group" include a group derived by substituting at least one hydrogen atom in the "unsubstituted aryl group" in the specific example group G1A below with a substituent, and examples of the substituted aryl group in the specific example group G1B below. It should be noted that the examples of the "unsubstituted aryl group" and the "substituted aryl group" mentioned herein are merely exemplary, and the "substituted aryl group" mentioned herein includes a group derived by substituting a hydrogen atom bonded to a carbon atom of a skeleton of the "substituted aryl group", and a group derived by substituting a hydrogen atom of a substituent of the "substituted aryl group".

Unsubstituted Aryl Group (Specific Example Group G1A):

a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, benzanthryl group, phenanthryl group, benzophenanthryl group, phenalenyl group, pyrenyl group, chrysenyl group, benzochrysenyl group, triphenylenyl group, benzotriphenylenyl group, tetracenyl group, pentacenyl group, fluorenyl group, 9,9'-spirobifluorenyl group, benzofluorenyl group, dibenzofluorenyl group, fluoranthenyl group, benzofluoranthenyl group, a perylenyl group, and a monovalent aryl group derived from cyclic structures represented by formulae (TEMP-1) to (TEMP-15) below.

[Formula 5]

(TEMP-1)

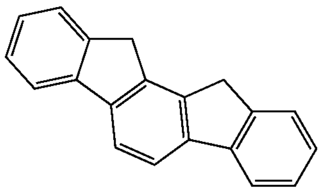

(TEMP-2)

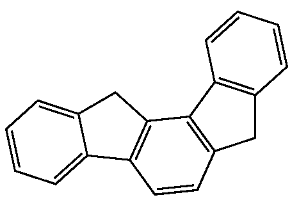

(TEMP-3)

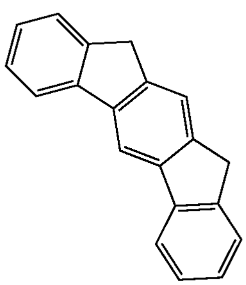

(TEMP-4)

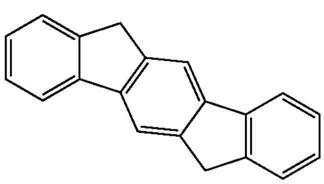

(TEMP-5)

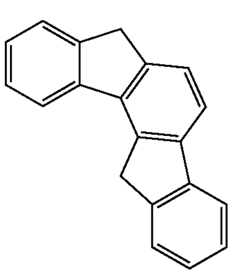

-continued (TEMP-6)

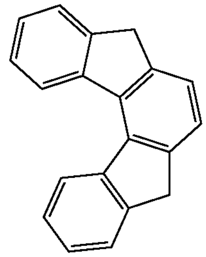

(TEMP-7)

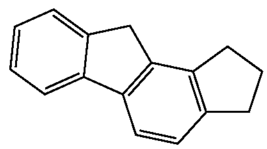

(TEMP-8)

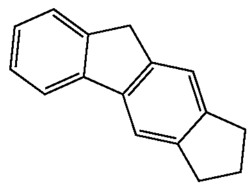

(TEMP-9)

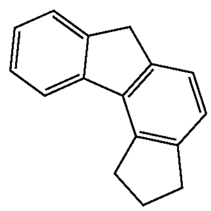

[Formula 6]

(TEMP-10)

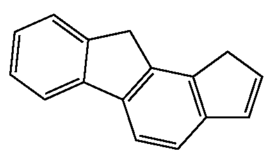

(TEMP-11)

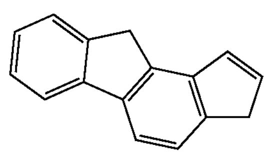

(TEMP-12)

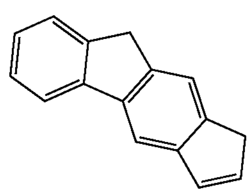

(TEMP-13)

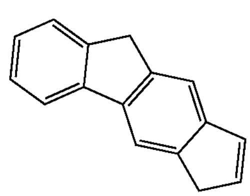

-continued (TEMP-14)

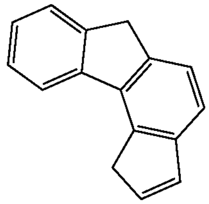

(TEMP-15)

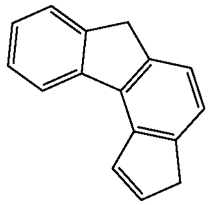

The monovalent aryl groups derived from the cyclic structures represented by the formulae (TEMP-1) to (TEMP-15) represent groups derived by removing one hydrogen atom from the cyclic structures represented by the formulae (TEMP-1) to (TEMP-15).

Substituted Aryl Group (Specific Example Group G1B):

o-tolyl group, m-tolyl group, p-tolyl group, para-xylyl group, meta-xylyl group, ortho-xylyl group, para-isopropylphenyl group, meta-isopropylphenyl group, ortho-isopropylphenyl group, para-t-butylphenyl group, meta-t-butylphenyl group, ortho-t-butylphenyl group, 3,4,5-trimethylphenyl group, 9,9-dimethylfluorenyl group, 9,9-diphenylfluorenyl group, 9,9-di(4-methylphenyl)fluorenyl group, 9,9-di(4-isopropylphenyl)fluorenyl group, 9,9-di(4-t-butylphenyl)fluorenyl group, cyanophenyl group, triphenylsilylphenyl group, trimethylsilylphenyl group, phenylnaphthyl group, naphthylphenyl group, and a group derived by substituting at least one hydrogen atom of a monovalent group derived from the cyclic structures represented by the formulae (TEMP-1) to (TEMP-15) with a substituent.

Substituted or Unsubstituted Heterocyclic Group

The "heterocyclic group" mentioned herein refers to a cyclic group having at least one hetero atom in the ring atoms. Specific examples of the hetero atom include a nitrogen atom, oxygen atom, sulfur atom, silicon atom, phosphorus atom, and boron atom.

The "heterocyclic group" mentioned herein is a monocyclic group or a fused-ring group.

The "heterocyclic group" mentioned herein is an aromatic heterocyclic group or a non-aromatic heterocyclic group.

Specific examples (specific example group G2) of the "substituted or unsubstituted heterocyclic group" mentioned herein include unsubstituted heterocyclic groups (specific example group G2A) and substituted heterocyclic groups (specific example group G2B). (Herein, an unsubstituted heterocyclic group refers to an "unsubstituted heterocyclic group" in a "substituted or unsubstituted heterocyclic group," and a substituted heterocyclic group refers to a "substituted heterocyclic group" in a "substituted or unsubstituted heterocyclic group.") A simply termed "heterocyclic group" herein includes both of "unsubstituted heterocyclic group" and "substituted heterocyclic group."

The "substituted heterocyclic group" refers to a group derived by substituting at least one hydrogen atom in an "unsubstituted heterocyclic group" with a substituent. Specific examples of the "substituted heterocyclic group" include a group derived by substituting at least one hydrogen atom in the "unsubstituted heterocyclic group" in the specific example group G2A below with a substituent, and examples of the substituted heterocyclic group in the specific example group G2B below. It should be noted that the examples of the "unsubstituted heterocyclic group" and the "substituted heterocyclic group" mentioned herein are merely exemplary, and the "substituted heterocyclic group" mentioned herein includes a group derived by substituting a hydrogen atom bonded to a ring atom of a skeleton of a "substituted heterocyclic group", and a group derived by substituting a hydrogen atom of a substituent of the "substituted heterocyclic group".

The specific example group G2A includes, for instance, unsubstituted heterocyclic groups including a nitrogen atom (specific example group G2A1) below, unsubstituted heterocyclic groups including an oxygen atom (specific example group G2A2) below, unsubstituted heterocyclic groups including a sulfur atom (specific example group G2A3) below, and monovalent heterocyclic groups (specific example group G2A4) derived from cyclic structures represented by formulae (TEMP-16) to (TEMP-33) below.

The specific example group G2B includes, for instance, substituted heterocyclic groups including a nitrogen atom (specific example group G2B1) below, substituted heterocyclic groups including an oxygen atom (specific example group G2B2) below, substituted heterocyclic groups including a sulfur atom (specific example group G2B3) below, and groups derived by substituting at least one hydrogen atom of the monovalent heterocyclic groups (specific example group G2B4) derived from the cyclic structures represented by formulae (TEMP-16) to (TEMP-33) below.

Unsubstituted Heterocyclic Groups Including Nitrogen Atom (Specific Example Group G2A1):

a pyrrolyl group, imidazolyl group, pyrazolyl group, triazolyl group, tetrazolyl group, oxazolyl group, isoxazolyl group, oxadiazolyl group, thiazolyl group, isothiazolyl group, thiadiazolyl group, pyridyl group, pyridazynyl group, pyrimidinyl group, pyrazinyl group, triazinyl group, indolyl group, isoindolyl group, indolizinyl group, quinolizinyl group, quinolyl group, isoquinolyl group, cinnolyl group, phthalazinyl group, quinazolinyl group, quinoxalinyl group, benzimidazolyl group, indazolyl group, phenanthrolinyl group, phenanthridinyl group, acridinyl group, phenazinyl group, carbazolyl group, benzocarbazolyl group, morpholino group, phenoxazinyl group, phenothiazinyl group, azacarbazolyl group, and diazacarbazolyl group.

Unsubstituted Heterocyclic Groups Including Oxygen Atom (Specific Example Group G2A2):

a furyl group, oxazolyl group, isoxazolyl group, oxadiazolyl group, xanthenyl group, benzofuranyl group, isobenzofuranyl group, dibenzofuranyl group, naphthobenzofuranyl group, benzoxazolyl group, benzisoxazolyl group, phenoxazinyl group, morpholino group, dinaphthofuranyl group, azadibenzofuranyl group, diazadibenzofuranyl group, azanaphthobenzofuranyl group, and diazanaphthobenzofuranyl group.

Unsubstituted Heterocyclic Groups Including Sulfur Atom (Specific Example Group G2A3):

a thienyl group, thiazolyl group, isothiazolyl group, thiadiazolyl group, benzothiophenyl group, isobenzothiophenyl group, dibenzothiophenyl group, naphthobenzothiophenyl group, benzothiazolyl group, benzisothiazolyl group, phenothiazinyl group, dinaphthothiophenyl group, azadibenzothiophenyl group, diazadibenzothiophenyl group, azanaphthobenzothiophenyl group, and diazanaphthobenzothiophenyl group.

Monovalent Heterocyclic Groups Derived from Cyclic Structures Represented by Formulae (TEMP-16) to (TEMP-33) below (Specific Example Group G2A4):
[Formula 7]
(TEMP-16)
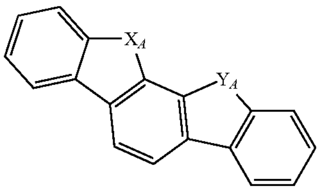
(TEMP-17)
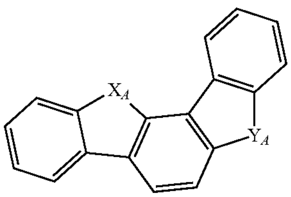
(TEMP-18)
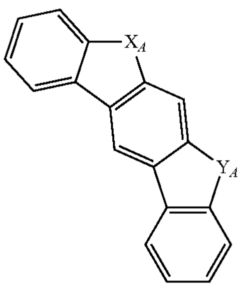
(TEMP-19)
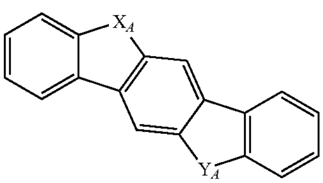
(TEMP-20)
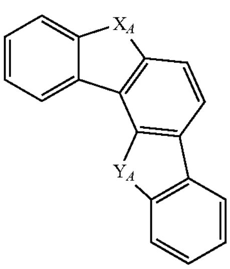
(TEMP-21)
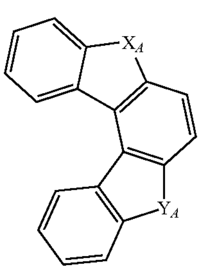
-continued
(TEMP-22)
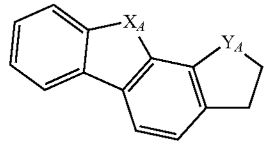
(TEMP-23)
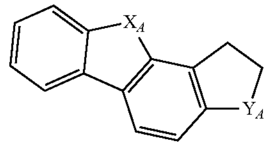
(TEMP-24)
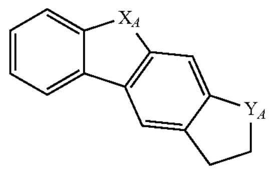
[Formula 8]
(TEMP-25)
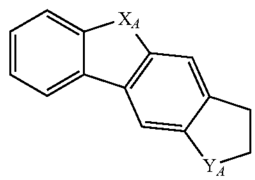
(TEMP-26)
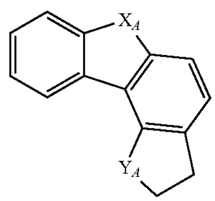
(TEMP-27)
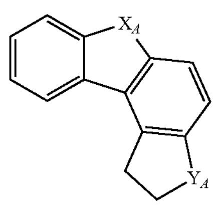
(TEMP-28)
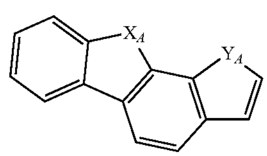
(TEMP-29)
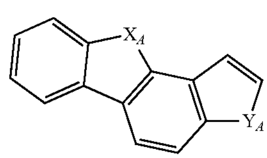
(TEMP-30)
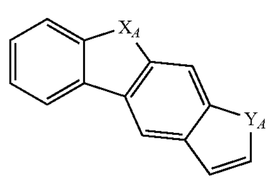

-continued (TEMP-31)

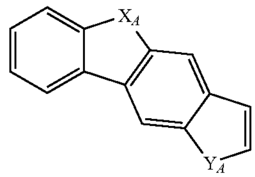

(TEMP-32)

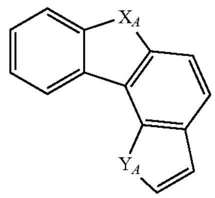

(TEMP-33)

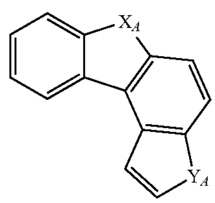

In the formulae (TEMP-16) to (TEMP-33), $X_A$ and $Y_A$ are each independently an oxygen atom, a sulfur atom, NH, or $CH_2$. However, at least one of $X_A$ and $Y_A$ is an oxygen atom, a sulfur atom, or NH.

The monovalent heterocyclic groups (specific example group G2A4) derived from the cyclic structures represented by the formulae (TEMP-16) to (TEMP-33) represent groups derived by removing one hydrogen atom from the cyclic structures represented by the formulae (TEMP-16) to (TEMP-33). When at least one of $X_A$ and $Y_A$ in the formulae (TEMP-16) to (TEMP-33) is NH or $CH_2$, the monovalent heterocyclic groups derived from the cyclic structures represented by the formulae (TEMP-16) to (TEMP-33) include a group derived by removing one hydrogen atom from NH or $CH_2$.

Substituted Heterocyclic Groups Including Nitrogen Atom (Specific Example Group G2B1):

a (9-phenyl)carbazolyl group, (9-biphenylyl)carbazolyl group, (9-phenyl)phenylcarbazolyl group, (9-naphthyl)carbazolyl group, diphenylcarbazole-9-yl group, phenylcarbazole-9-yl group, methylbenzimidazolyl group, ethylbenzimidazolyl group, phenyltriazinyl group, biphenylyltriazinyl group, diphenyltriazinyl group, phenylquinazolinyl group, and biphenylylquinazolinyl group.

Substituted Heterocyclic Groups Including Oxygen Atom (Specific Example Group G2B2):

a phenyldibenzofuranyl group, methyldibenzofuranyl group, t-butyldibenzofuranyl group, and monovalent residue of spiro[9H-xanthene-9,9'-[9H]fluorene].

Substituted Heterocyclic Groups Including Sulfur Atom (Specific Example Group G2B3):

a phenyldibenzothiophenyl group, methyldibenzothiophenyl group, t-butyldibenzothiophenyl group, and monovalent residue of spiro[9H-thioxanthene-9,9'-[9H]fluorene].

Groups Derived by Substituting at Least One Hydrogen Atom of Monovalent Heterocyclic Group Derived from Cyclic Structures Represented by Formulae (TEMP-16) to (TEMP-33) with Substituent (Specific Example Group G2B4)

The groups derived by substituting at least one hydrogen atom of the monovalent heterocyclic group derived from the cyclic structures represented by the formulae (TEMP-16) to (TEMP-33) are groups derived by substituting at least one hydrogen atom bonded to a carbon atom of a skeleton of the cyclic structures represented by the formulae (TEMP-16) to (TEMP-33), or a group derived by substituting at least one hydrogen atom of at least one of $X_A$ or $Y_A$ in a form of NH or $CH_2$ with a substituent.

Substituted or Unsubstituted Alkyl Group

Specific examples (specific example group G3) of the "substituted or unsubstituted alkyl group" mentioned herein include unsubstituted alkyl groups (specific example group G3A) and substituted alkyl groups (specific example group G3B below). (Herein, an unsubstituted alkyl group refers to an "unsubstituted alkyl group" in a "substituted or unsubstituted alkyl group," and a substituted alkyl group refers to a "substituted alkyl group" in a "substituted or unsubstituted alkyl group.") A simply termed "alkyl group" herein includes both of "unsubstituted alkyl group" and "substituted alkyl group."

The "substituted alkyl group" refers to a group derived by substituting at least one hydrogen atom in an "unsubstituted alkyl group" with a substituent. Specific examples of the "substituted alkyl group" include a group derived by substituting at least one hydrogen atom of an "unsubstituted alkyl group" (specific example group G3A) below with a substituent, and examples of the substituted alkyl group (specific example group G3B) below. Herein, the alkyl group for the "unsubstituted alkyl group" refers to a chain alkyl group. Accordingly, the "unsubstituted alkyl group" include linear "unsubstituted alkyl group" and branched "unsubstituted alkyl group." It should be noted that the examples of the "unsubstituted alkyl group" and the "substituted alkyl group" mentioned herein are merely exemplary, and the "substituted alkyl group" mentioned herein includes a group derived by substituting a hydrogen atom bonded to a carbon atom of a skeleton of the "substituted alkyl group", and a group derived by substituting a hydrogen atom of a substituent of the "substituted alkyl group".

Unsubstituted Alkyl Group (Specific Example Group G3A):

a methyl group, ethyl group, n-propyl group, isopropyl group, n-butyl group, isobutyl group, s-butyl group, and t-butyl group.

Substituted Alkyl Group (Specific Example Group G3B):

a heptafluoropropyl group (including isomer thereof), pentafluoroethyl group, 2,2,2-trifluoroethyl group, and trifluoromethyl group.

Substituted or Unsubstituted Alkenyl Group

Specific examples (specific example group G4) of the "substituted or unsubstituted alkenyl group" mentioned herein include unsubstituted alkenyl groups (specific example group G4A) and substituted alkenyl groups (specific example group G4B). (Herein, an unsubstituted alkenyl group refers to an "unsubstituted alkenyl group" in a "substituted or unsubstituted alkenyl group," and a substituted alkenyl group refers to a "substituted alkenyl group" in a "substituted or unsubstituted alkenyl group.") A simply termed "alkenyl group" herein includes both of "unsubstituted alkenyl group" and "substituted alkenyl group."

The "substituted alkenyl group" refers to a group derived by substituting at least one hydrogen atom in an "unsubstituted alkenyl group" with a substituent. Specific examples of the "substituted alkenyl group" include an "unsubstituted alkenyl group" (specific example group G4A) substituted by a substituent, and examples of the substituted alkenyl group (specific example group G4B) below. It should be noted that the examples of the "unsubstituted alkenyl group" and the "substituted alkenyl group" mentioned herein are merely exemplary, and the "substituted alkenyl group" mentioned herein includes a group derived by substituting a hydrogen atom bonded to a carbon atom of a skeleton of the "substituted alkenyl group", and a group derived by substituting a hydrogen atom of a substituent of the "substituted alkenyl group".

Unsubstituted Alkenyl Group (Specific Example Group G4A):

a vinyl group, allyl group, 1-butenyl group, 2-butenyl group, and 3-butenyl group.

Substituted Alkenyl Group (Specific Example Group G4B):

a 1,3-butanedienyl group, 1-methylvinyl group, 1-methylallyl group, 1,1-dimethylallyl group, 2-methylallyl group, and 1,2-dimethylallyl group.

Substituted or Unsubstituted Alkynyl Group

Specific examples (specific example group G5) of the "substituted or unsubstituted alkynyl group" mentioned herein include unsubstituted alkynyl groups (specific example group G5A) below (Herein, an unsubstituted alkynyl group refers to an "unsubstituted alkynyl group" in the "substituted or unsubstituted alkynyl group.") A simply termed "alkynyl group" herein includes both of "unsubstituted alkynyl group" and "substituted alkynyl group."

The "substituted alkynyl group" refers to a group derived by substituting at least one hydrogen atom in an "unsubstituted alkynyl group" with a substituent. Specific examples of the "substituted alkynyl group" include a group derived by substituting at least one hydrogen atom of the "unsubstituted alkynyl group" (specific example group G5A) below with a substituent.

Unsubstituted Alkynyl Group (Specific Example Group G5A):

an ethynyl group

Substituted or Unsubstituted Cycloalkyl Group

Specific examples (specific example group G6) of the "substituted or unsubstituted cycloalkyl group" mentioned herein include unsubstituted cycloalkyl groups (specific example group G6A) and substituted cycloalkyl groups (specific example group G6B). (Herein, an unsubstituted cycloalkyl group refers to an "unsubstituted cycloalkyl group" in the "substituted or unsubstituted cycloalkyl group," and a substituted cycloalkyl group refers to the "substituted cycloalkyl group" in a "substituted or unsubstituted cycloalkyl group.") A simply termed "cycloalkyl group" herein includes both of "unsubstituted cycloalkyl group" and "substituted cycloalkyl group."

The "substituted cycloalkyl group" refers to a group derived by substituting at least one hydrogen atom of an "unsubstituted cycloalkyl group" with a substituent. Specific examples of the "substituted cycloalkyl group" include a group derived by substituting at least one hydrogen atom of the "unsubstituted cycloalkyl group" (specific example group G6A) below with a substituent, and examples of the substituted cycloalkyl group (specific example group G6B) below. It should be noted that the examples of the "unsubstituted cycloalkyl group" and the "substituted cycloalkyl group" mentioned herein are merely exemplary, and the "substituted cycloalkyl group" mentioned herein includes a group derived by substituting at least one hydrogen atom bonded to a carbon atom of a skeleton of a cycloalkyl group of the "substituted cycloalkyl group" with a substituent, and a group derived by substituting a hydrogen atom of a substituent of the "substituted cycloalkyl group" with a substituent.

Unsubstituted Cycloalkyl Group (Specific Example Group G6A):

a cyclopropyl group, cyclobutyl group, cyclopentyl group, cyclohexyl group, 1-adamantyl group, 2-adamantyl group, 1-norbornyl group, and 2-norbornyl group.

Substituted Cycloalkyl Group (Specific Example Group G6B):

a 4-methylcyclohexyl group.

Group Represented by "—Si($R_{901}$)($R_{902}$)($R_{903}$)"

Specific examples (specific example group G7) of the group represented herein by —Si($R_{901}$)($R_{902}$)($R_{903}$) include: —Si(G1)(G1)(G1); —Si(G1)(G2)(G2); —Si(G1)(G1)(G2); —Si(G2)(G2)(G2); —Si(G3)(G3)(G3); and —Si(G6)(G6)(G6).

Herein:

G1 represents an "aryl group" in the specific example group G1; G2 represents a "heterocyclic group" in the specific example group G2; G3 represents an "alkyl group" in the specific example group G3; and G6 represents a "cycloalkyl group" in the specific example group G6.

A plurality of G1 in —Si(G1)(G1)(G1) are mutually the same or different.

A plurality of G2 in —Si(G1)(G2)(G2) are mutually the same or different.

A plurality of G1 in —Si(G1)(G1)(G2) are mutually the same or different.

A plurality of G2 in —Si(G2)(G2)(G2) are mutually the same or different.

The plurality of G3 in —Si(G3)(G3)(G3) are mutually the same or different.

A plurality of G6 in —Si(G6)(G6)(G6) are mutually the same or different.

Group Represented by "—O—($R_{904}$)"

Specific examples (specific example group G8) of a group represented by —O—($R_{904}$) herein include —O(G1); —O(G2); —O(G3); and —O(G6).

Herein:

G1 represents an "aryl group" in the specific example group G1; G2 represents a "heterocyclic group" in the specific example group G2; G3 represents an "alkyl group" in the specific example group G3; and G6 represents a "cycloalkyl group" in the specific example group G6.

Group Represented by "—S—($R_{905}$)"

Specific examples (specific example group G9) of a group represented herein by —S—($R_{905}$) include: —S(G1); —S(G2); —S(G3); and —S(G6).

Herein:

G1 represents an "aryl group" in the specific example group G1; G2 represents a "heterocyclic group" in the specific example group G2; G3 represents an "alkyl group" in the specific example group G3; and G6 represents a "cycloalkyl group" in the specific example group G6.

Group Represented by "—N($R_{906}$)($R_{907}$)"

Specific examples (specific example group G10) of a group represented herein by —N($R_{906}$)($R_{907}$) include: —N(G1)(G1); —N(G2)(G2); —N(G1)(G2); —N(G3)(G3); and —N(G6)(G6).

Herein:

G1 represents an "aryl group" in the specific example group G1; G2 represents a "heterocyclic group" in the specific example group G2; G3 represents an "alkyl group" in the specific example group G3; and G6 represents a "cycloalkyl group" in the specific example group G6.

A plurality of G1 in —N(G1)(G1) are mutually the same or different.

A plurality of G2 in —N(G2)(G2) are mutually the same or different.

A plurality of G3 in —N(G3)(G3) are mutually the same or different.

A plurality of G6 in —N(G6)(G6) are mutually the same or different.

Halogen Atom

Specific examples (specific example group G11) of "halogen atom" mentioned herein include a fluorine atom, chlorine atom, bromine atom, and iodine atom.

Substituted or Unsubstituted Fluoroalkyl Group

The "substituted or unsubstituted fluoroalkyl group" mentioned herein refers to a group derived by substituting at least one hydrogen atom of the "substituted or unsubstituted alkyl group" with a fluorine atom. It refers to a group (perfluoro group) derived by substituting all hydrogen atoms of the "substituted or unsubstituted alkyl group" with fluorine atoms. An "unsubstituted fluoroalkyl group" has, unless otherwise specified herein, 1 to 50, preferably 1 to 30, more preferably 1 to 18 carbon atoms. The "substituted fluoroalkyl group" refers to a group derived by substituting at least one hydrogen atom in a "fluoroalkyl group" with a substituent. It should be noted that the examples of the "substituted fluoroalkyl group" mentioned herein includes a group derived by substituting at least one hydrogen atom bonded to a carbon atom of an alkyl chain of a "substituted fluoroalkyl group" with a substituent, and a group derived by substituting at least one hydrogen atom of a substituent of the "substituted fluoroalkyl group" with a substituent. Specific examples of the "substituted fluoroalkyl group" include a group derived by substituting at least one hydrogen atom of the "alkyl group" (specific example group G3) with a fluorine atom.

Substituted or Unsubstituted Haloalkyl Group

The "substituted or unsubstituted haloalkyl group" mentioned herein refers to a group derived by substituting at least one hydrogen atom of the "substituted or unsubstituted alkyl group" with a halogen atom. It refers to a group derived by substituting all hydrogen atoms of the "substituted or unsubstituted alkyl group" with halogen atoms. An "unsubstituted haloalkyl group" has, unless otherwise specified herein, 1 to 50, preferably 1 to 30, more preferably 1 to 18 carbon atoms. The "substituted haloalkyl group" refers to a group derived by substituting at least one hydrogen atom in a "haloalkyl group" with a substituent. It should be noted that the examples of the "substituted haloalkyl group" mentioned herein includes a group derived by substituting at least one hydrogen atom bonded to a carbon atom of an alkyl chain of a "substituted haloalkyl group" with a substituent, and a group derived by substituting at least one hydrogen atom of a substituent of the "substituted haloalkyl group" with a substituent. Specific examples of the "substituted haloalkyl group" include a group derived by substituting at least one hydrogen atom of the "alkyl group" (specific example group G3) with a halogen atom. The haloalkyl group is sometimes referred to as a halogenated alkyl group.

Alkoxy Group

Specific examples of an "alkoxy group" mentioned herein include a group represented by —O(G3), G3 being the "alkyl group" in the specific example group G3. An "unsubstituted alkoxy group" has, unless otherwise specified herein, 1 to 50, preferably 1 to 30, more preferably 1 to 18 carbon atoms.

Alkylthio Group

Specific examples of an "alkylthio group" mentioned herein include a group represented by —S(G3), G3 being the "alkyl group" in the specific example group G3. An "unsubstituted alkylthio group" has, unless otherwise specified herein, 1 to 50, preferably 1 to 30, more preferably 1 to 18 carbon atoms.

Aryloxy Group

Specific examples of an "aryloxy group" mentioned herein include a group represented by —O(G1), G1 being the "aryl group" in the specific example group G1. An "unsubstituted aryloxy group" has, unless otherwise specified herein, 6 to 50, preferably 6 to 30, more preferably 6 to 18 ring carbon atoms.

Arylthio Group

Specific examples of an "arylthio group" mentioned herein include a group represented by —S(G1), G1 being the "aryl group" in the specific example group G1. An "unsubstituted arylthio group" has, unless otherwise specified herein, 6 to 50, preferably 6 to 30, more preferably 6 to 18 ring carbon atoms.

Trialkylsilyl Group

Specific examples of a "trialkylsilyl group" mentioned herein include a group represented by —Si(G3)(G3)(G3), G3 being the "alkyl group" in the specific example group G3. The plurality of G3 in —Si(G3)(G3)(G3) are mutually the same or different. Each of the alkyl groups in the "trialkylsilyl group" has, unless otherwise specified herein, 1 to 50, preferably 1 to 20, more preferably 1 to 6 carbon atoms.

Aralkyl Group

Specific examples of a "substituted or unsubstituted aralkyl group" mentioned herein include a group represented by (G3)-(G1), G3 being the "alkyl group" in the specific example group G3, G1 being the "aryl group" in the specific example group G1. Accordingly, the "aralkyl group" is a group derived by substituting a hydrogen atom of the "alkyl group" with a substituent in a form of the "aryl group," which is an example of the "substituted alkyl group." An "unsubstituted aralkyl group," which is an "unsubstituted alkyl group" substituted by an "unsubstituted aryl group," has, unless otherwise specified herein, 7 to 50 carbon atoms, preferably 7 to 30 carbon atoms, more preferably 7 to 18 carbon atoms.

Specific examples of the "aralkyl group" include a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

Preferable examples of the substituted or unsubstituted aryl group mentioned herein include, unless otherwise specified herein, a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, phenanthryl group, pyrenyl group, chrysenyl group, triphenylenyl group, fluorenyl group, 9,9'-spirobifluorenyl group, 9,9-dimethylfluorenyl group, and 9,9-diphenylfluorenyl group.

Preferable examples of the substituted or unsubstituted heterocyclic group mentioned herein include, unless otherwise specified herein, a pyridyl group, pyrimidinyl group, triazinyl group, quinolyl group, isoquinolyl group, quinazolinyl group, benzimidazolyl group, phenanthrolinyl group, carbazolyl group (1-carbazolyl group, 2-carbazolyl group, 3-carbazolyl group, 4-carbazolyl group, or 9-carbazolyl group), benzocarbazolyl group, azacarbazolyl group, diazacarbazolyl group, dibenzofuranyl group, naphthobenzofuranyl group, azadibenzofuranyl group, diazadibenzofuranyl group, dibenzothiophenyl group, naphthobenzothiophenyl group, azadibenzothiophenyl group, diazadibenzothiophenyl group, (9-phenyl)carbazolyl group ((9-phenyl)carbazole-1-yl group, (9-phenyl)carbazole-2-yl group, (9-phenyl)carbazole-3-yl group, or (9-phenyl)carbazole-4-yl group), (9-biphenylyl)carbazolyl group, (9-phenyl)phenylcarbazolyl group, diphenylcarbazole-9-yl group, phenylcarbazole-9-yl group, phenyltriazinyl group, biphenylyltriazinyl group, diphenyltriazinyl group, phenyldibenzofuranyl group, and phenyldibenzothiophenyl group.

The carbazolyl group mentioned herein is, unless otherwise specified herein, specifically a group represented by one of formulae below.

[Formula 9]

(TEMP-Cz1)

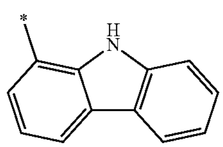

(TEMP-Cz2)

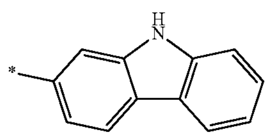

(TEMP-Cz3)

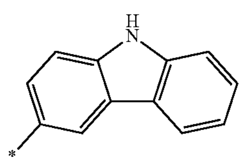

(TEMP-Cz4)

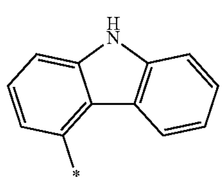

(TEMP-Cz5)

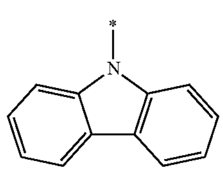

The (9-phenyl)carbazolyl group mentioned herein is, unless otherwise specified herein, specifically a group represented by one of formulae below.

[Formula 10]

(TEMP-Cz6)

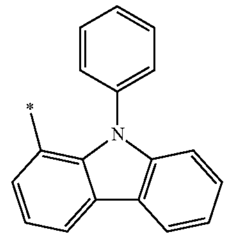

(TEMP-Cz7)

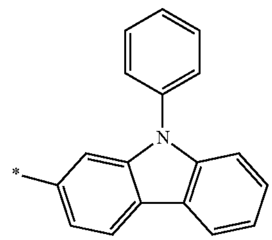

(TEMP-Cz8)

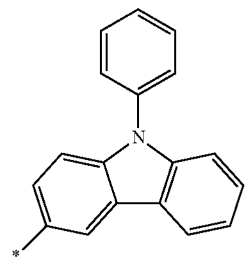

(TEMP-Cz9)

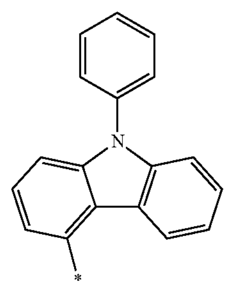

In the formulae (TEMP-Cz1) to (TEMP-Cz9), * represents a bonding position.

The dibenzofuranyl group and dibenzothiophenyl group mentioned herein are, unless otherwise specified herein, each specifically represented by one of formulae below.

[Formula 11]

(TEMP-34)

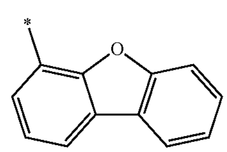

(TEMP-35)

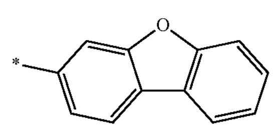

-continued (TEMP-36)

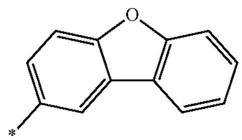

(TEMP-37)

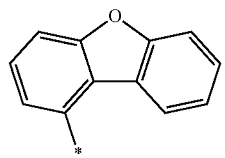

(TEMP-38)

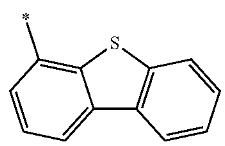

(TEMP-39)

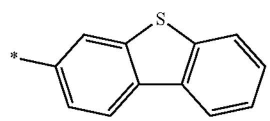

(TEMP-40)

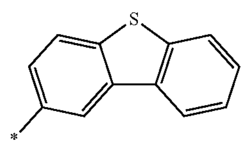

(TEMP-41)

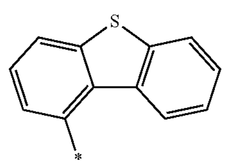

In the formulae (TEMP-34) to (TEMP-41), * represents a bonding position.

Preferable examples of the substituted or unsubstituted alkyl group mentioned herein include, unless otherwise specified herein, a methyl group, ethyl group, propyl group, isopropyl group, n-butyl group, isobutyl group, and t-butyl group.

Substituted or Unsubstituted Arylene Group

A "substituted or unsubstituted arylene group" mentioned herein is, unless otherwise specified herein, a divalent group derived from the above-mentioned "aryl group." Specific examples (specific example group G12) of the "substituted or unsubstituted arylene group" mentioned herein include a divalent group derived from the "aryl group" in the specific example group G1.

Substituted or Unsubstituted Divalent Heterocyclic Group

A "substituted or unsubstituted divalent heterocyclic group" mentioned herein is, unless otherwise specified herein, a divalent group derived from the above-mentioned "heterocyclic group." Specific examples (specific example group G13) of the "substituted or unsubstituted divalent heterocyclic group" mentioned herein include a divalent group derived from the "heterocyclic group" in the specific example group G2.

Substituted or Unsubstituted Alkylene Group A "substituted or unsubstituted alkylene group" mentioned herein is, unless otherwise specified herein, a divalent group derived from the above-mentioned "alkyl group." Specific examples (specific example group G14) of the "substituted or unsubstituted alkylene group" mentioned herein include a divalent group derived from the "alkyl group" in the specific example group G3.

The substituted or unsubstituted arylene group mentioned herein is, unless otherwise specified herein, preferably any one of groups represented by formulae (TEMP-42) to (TEMP-67) below.

[Formula 12]

(TEMP-42)

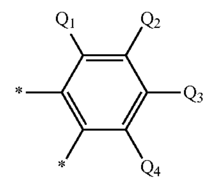

(TEMP-43)

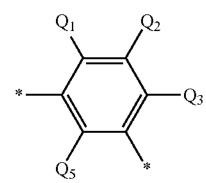

(TEMP-44)

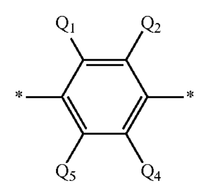

(TEMP-45)

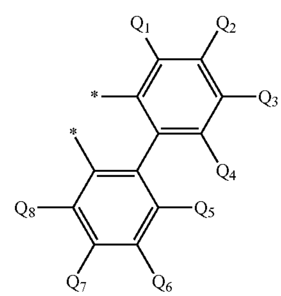

(TEMP-46)

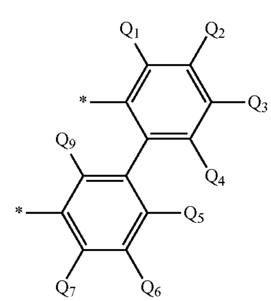

(TEMP-47)
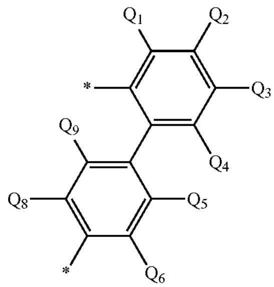
[Formula 13]
(TEMP-48)
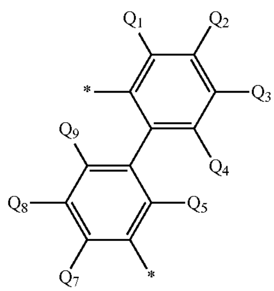
(TEMP-49)
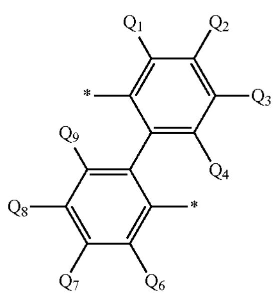
(TEMP-50)
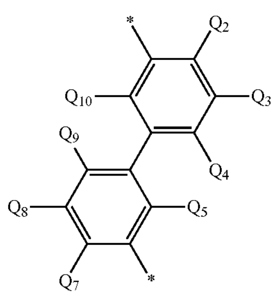
(TEMP-51)
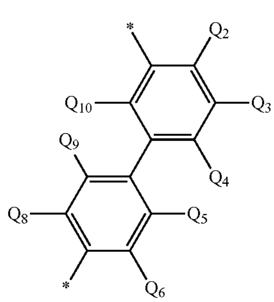
(TEMP-52)
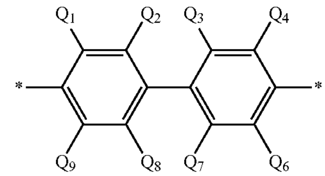
In the formulae (TEMP-42) to (TEMP-52), $Q_1$ to $Q_{10}$ each independently are a hydrogen atom or a substituent.
In the formulae (TEMP-42) to (TEMP-52), * represents a bonding position.
[Formula 14]
(TEMP-53)
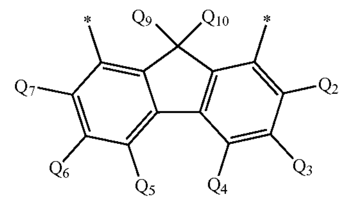
(TEMP-54)
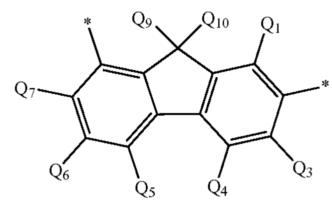
(TEMP-55)
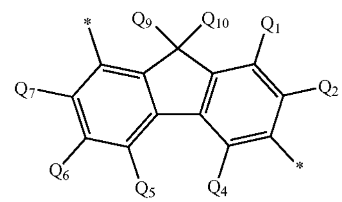
(TEMP-56)
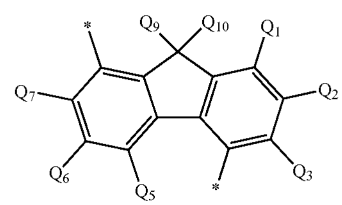
(TEMP-57)
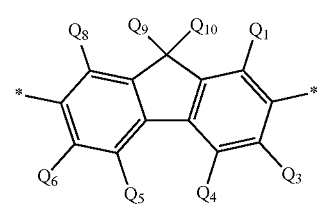
(TEMP-58)
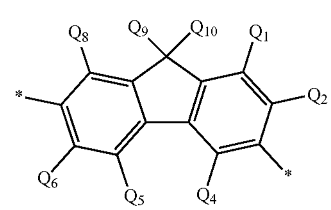

-continued (TEMP-59)

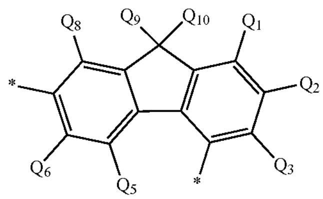

(TEMP-60)

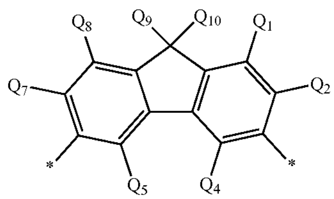

(TEMP-61)

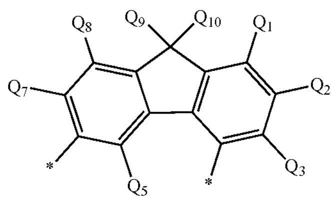

(TEMP-62)

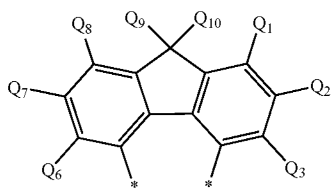

In the formulae (TEMP-53) to (TEMP-62), $Q_1$ to $Q_{10}$ each independently are a hydrogen atom or a substituent.

In the formulae, $Q_9$ and $Q_{10}$ may be mutually bonded through a single bond to form a ring.

In the formulae (TEMP-53) to (TEMP-62), * represents a bonding position.

[Formula 15]

(TEMP-63)

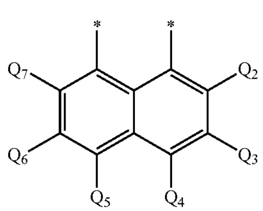

(TEMP-64)

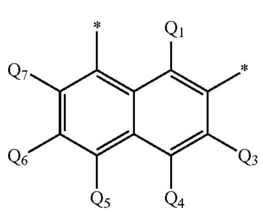

-continued (TEMP-65)

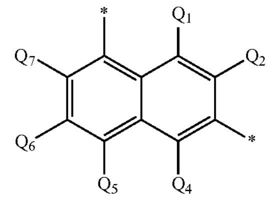

(TEMP-66)

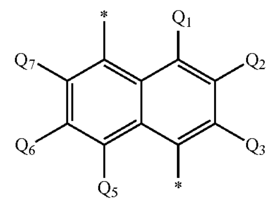

(TEMP-67)

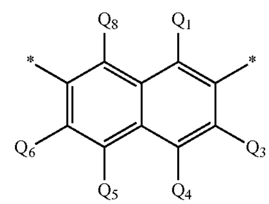

(TEMP-68)

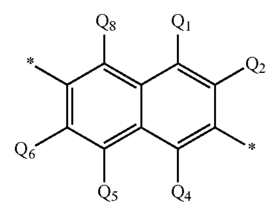

In the formulae (TEMP-63) to (TEMP-68), $Q_1$ to $Q_8$ each independently are a hydrogen atom or a substituent.

In the formulae (TEMP-63) to (TEMP-68), * represents a bonding position.

The substituted or unsubstituted divalent heterocyclic group mentioned herein is, unless otherwise specified herein, preferably a group represented by any one of formulae (TEMP-69) to (TEMP-102) below.

[Formula 16]

(TEMP-69)

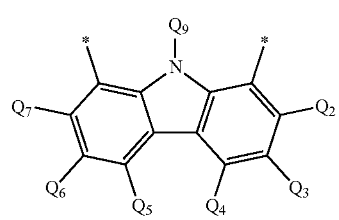

(TEMP-70)

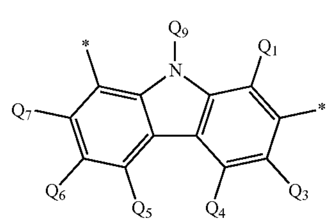

-continued
(TEMP-71)
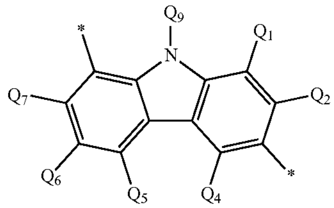
(TEMP-72)
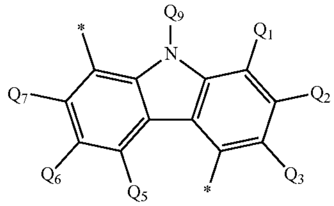
(TEMP-73)
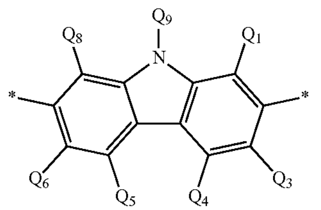
(TEMP-74)
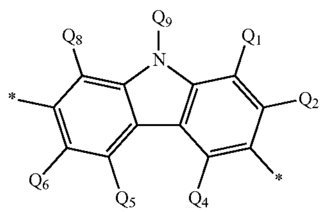
[Formula 17]
(TEMP-75)
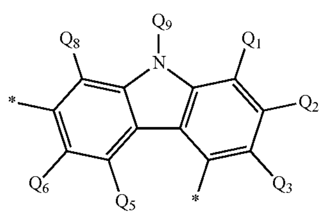
(TEMP-76)
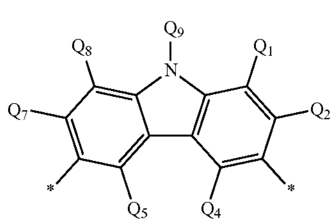
(TEMP-77)
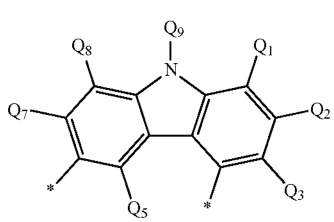
-continued
(TEMP-78)
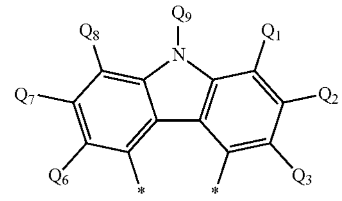
(TEMP-79)
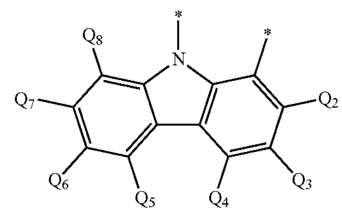
(TEMP-80)
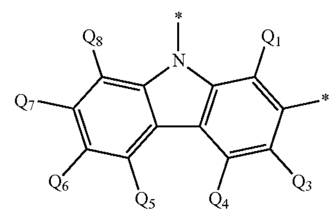
[Formula 18]
(TEMP-81)
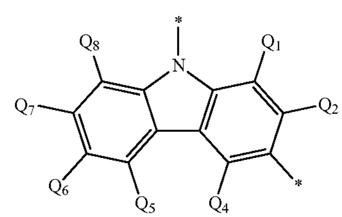
(TEMP-82)
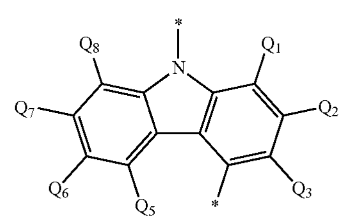
In the formulae (TEMP-69) to (TEMP-82), $Q_1$ to $Q_9$ each independently are a hydrogen atom or a substituent.
[Formula 19]
(TEMP-83)
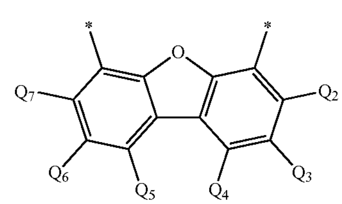

-continued
(TEMP-84)
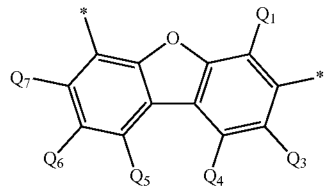
(TEMP-85)
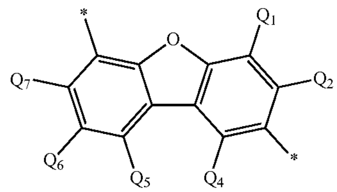
(TEMP-86)
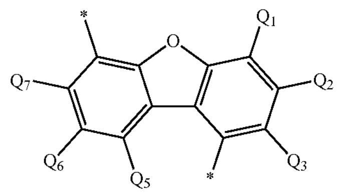
(TEMP-87)
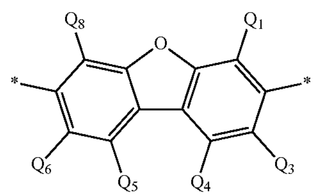
(TEMP-88)
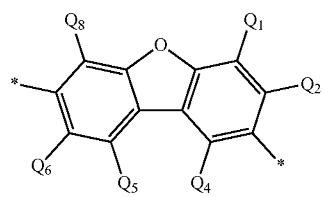
[Formula 20]
(TEMP-89)
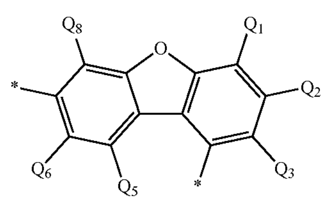
(TEMP-90)
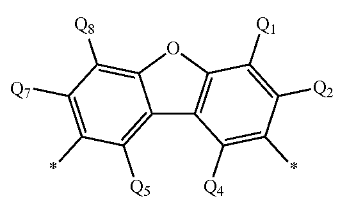
(TEMP-91)
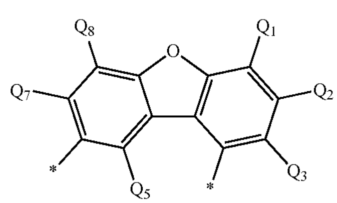
-continued
(TEMP-92)
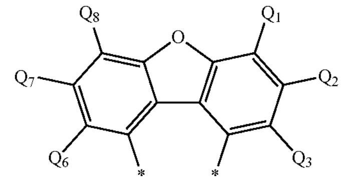
[Formula 21]
(TEMP-93)
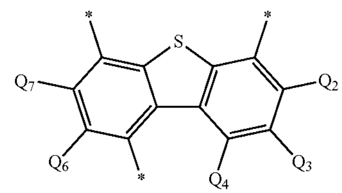
(TEMP-94)
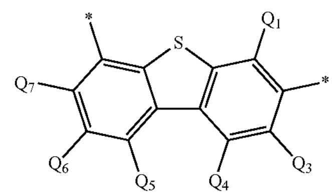
(TEMP-95)
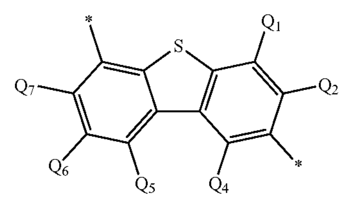
(TEMP-96)
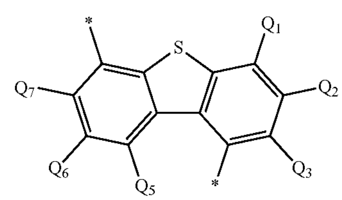
(TEMP-97)
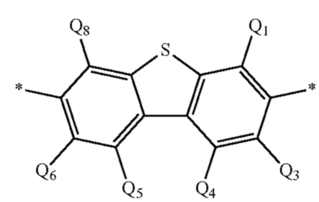
(TEMP-98)
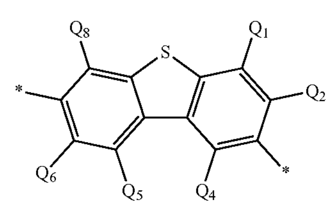

-continued

[Formula 22]

(TEMP-99)

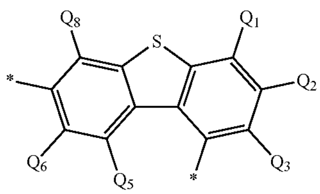

(TEMP-100)

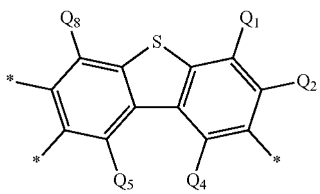

(TEMP-101)

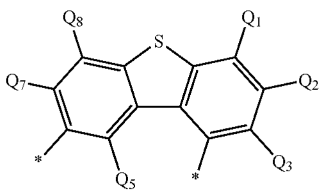

(TEMP-102)

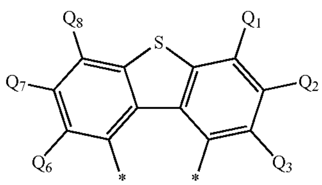

In the formulae (TEMP-83) to (TEMP-102), $Q_1$ to $Q_8$ each independently are a hydrogen atom or a substituent.

The substituent mentioned herein has been described above.

Instance "Bonded to Form a Ring"

Instances where "at least one combination of adjacent two or more (of . . . ) are mutually bonded to form a substituted or unsubstituted monocyclic ring, mutually bonded to form a substituted or unsubstituted fused ring, or not mutually bonded" mentioned herein refer to instances where "at least one combination of adjacent two or more (of . . . ) are mutually bonded to form a substituted or unsubstituted monocyclic ring," at least one combination of adjacent two or more (of . . . ) are mutually bonded to form a substituted or unsubstituted fused ring," and "at least one combination of adjacent two or more (of . . . ) are not mutually bonded."

Instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (these instances will be sometimes collectively referred to as an instance "bonded to form a ring" hereinafter) will be described below. An anthracene compound having a basic skeleton in a form of an anthracene ring and represented by a formula (TEMP-103) below will be used as an example for the description.

[Formula 23]

(TEMP-103)

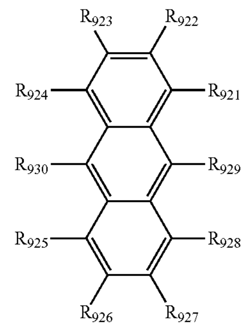

For instance, when "at least one combination of adjacent two or more of" $R_{921}$ to $R_{930}$ "are mutually bonded to form a ring," the pair of adjacent ones of $R_{921}$ to $R_{930}$ (i.e. the combination at issue) is a pair of $R_{921}$ and a pair of $R_{922}$, $R_{922}$ and $R_{923}$, a pair of $R_{923}$ and $R_{924}$, a pair of $R_{924}$ and $R_{930}$, a pair of $R_{930}$ and $R_{925}$, a pair of $R_{925}$ and $R_{926}$, a pair of $R_{926}$ and $R_{927}$, a pair of $R_{927}$ and $R_{928}$, a pair of $R_{928}$ and $R_{929}$, or a pair of $R_{929}$ and $R_{921}$.

The term "at least one combination" means that two or more of the above combinations of adjacent two or more of $R_{921}$ to $R_{930}$ may simultaneously form rings. For instance, when $R_{921}$ and $R_{922}$ are mutually bonded to form a ring $Q_A$ and $R_{925}$ and $R_{926}$ are simultaneously mutually bonded to form a ring $Q_B$, the anthracene compound represented by the formula (TEMP-103) is represented by a formula (TEMP-104) below.

[Formula 24]

(TEMP-104)

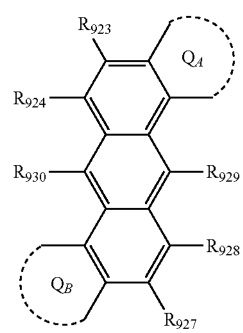

The instance where the "combination of adjacent two or more" form a ring means not only an instance where the "two" adjacent components are bonded but also an instance where adjacent "three or more" are bonded. For instance, $R_{921}$ and $R_{922}$ are mutually bonded to form a ring $Q_A$ and $R_{922}$, $R_{923}$ are mutually bonded to form a ring $Q_C$, and mutually adjacent three components ($R_{921}$, $R_{922}$ and $R_{923}$) are mutually bonded to form a ring fused to the anthracene basic skeleton. In this case, the anthracene compound represented by the formula (TEMP-103) is represented by a formula (TEMP-105) below. In the formula (TEMP-105) below, the ring $Q_A$ and the ring $Q_C$ share $R_{922}$.

[Formula 25]

(TEMP-105)

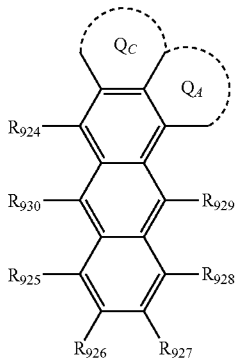

The formed "monocyclic ring" or "fused ring" may be, in terms of the formed ring in itself, a saturated ring or an unsaturated ring. When the "combination of adjacent two" form a "monocyclic ring" or a "fused ring," the "monocyclic ring" or "fused ring" may be a saturated ring or an unsaturated ring. For instance, the ring $Q_A$ and the ring $Q_B$ formed in the formulae (TEMP-104) and (TEMP-105) are each independently a "monocyclic ring" or a "fused ring." Further, the ring $Q_A$ and the ring $Q_C$ formed in the formula (TEMP-105) are each a "fused ring." The ring $Q_A$ and the ring $Q_C$ in the formula (TEMP-105) are fused to form a fused ring. When the ring $Q_A$ in the formula (TMEP-104) is a benzene ring, the ring $Q_A$ is a monocyclic ring. When the ring $Q_A$ in the formula (TMEP-104) is a naphthalene ring, the ring $Q_A$ is a fused ring.

The "unsaturated ring" represents an aromatic hydrocarbon ring or an aromatic heterocycle. The "saturated ring" represents an aliphatic hydrocarbon ring or a non-aromatic heterocycle.

Specific examples of the aromatic hydrocarbon ring include a ring formed by bonding a hydrogen atom to an end of a bond of a group in the specific example of the specific example group G1.

Specific examples of the aromatic heterocycle include a ring formed by bonding a hydrogen atom to an end of a bond of an aromatic heterocyclic group in the specific example of the specific example group G2.

Specific examples of the aliphatic hydrocarbon ring include a ring formed by bonding a hydrogen atom to an end of a bond of a group in the specific example of the specific example group G6.

The phrase "to form a ring" herein means that a ring is formed only by a plurality of atoms of a basic skeleton, or by a combination of a plurality of atoms of the basic skeleton and one or more optional atoms. For instance, the ring $Q_A$ formed by mutually bonding $R_{921}$ and 8922 shown in the formula (TEMP-104) is a ring formed by a carbon atom of the anthracene skeleton bonded with $R_{921}$, a carbon atom of the anthracene skeleton bonded with $R_{922}$, and one or more optional atoms. Specifically, when the ring $Q_A$ is an unsaturated ring formed by $R_{921}$ and $R_{922}$, the ring formed by a carbon atom of the anthracene skeleton bonded with $R_{921}$, a carbon atom of the anthracene skeleton bonded with $R_{922}$, and four carbon atoms, the unsaturated ring formed by $R_{921}$ and $R_{922}$ is a benzene ring.

The "optional atom" is, unless otherwise specified herein, preferably at least one atom selected from the group consisting of a carbon atom, nitrogen atom, oxygen atom, and sulfur atom. A bond of the optional atom (e.g. carbon atom and nitrogen atom) not forming a ring may be terminated by a hydrogen atom or the like or may be substituted by an "optional substituent" described later. When the ring includes an optional element other than carbon atom, the resultant ring is a heterocycle.

The number of "one or more optional atom" forming the saturated ring or unsaturated ring is, unless otherwise specified herein, preferably in a range from 2 to 15, more preferably in a range from 3 to 12, further preferably in a range from 3 to 5.

Unless otherwise specified herein, the ring, which may be a "saturated ring" or "unsaturated ring," is preferably an "unsaturated ring."

Unless otherwise specified herein, the "unsaturated ring" is preferably a benzene ring.

When "at least one combination of adjacent two or more" (of . . . ) are "mutually bonded to form a substituted or unsubstituted monocyclic ring" or "mutually bonded to form a substituted or unsubstituted fused ring," unless otherwise specified herein, at least one combination of adjacent two or more of components are preferably mutually bonded to form a substituted or unsubstituted "unsaturated ring" formed of a plurality of atoms of the basic skeleton, and 1 to 15 atoms of at least one element selected from the group consisting of carbon, nitrogen, oxygen and sulfur.

When the "monocyclic ring" or the "fused ring" has a substituent, the substituent is the substituent described in the above under the subtitle "Substituent Mentioned Herein."

When the "saturated ring" or the "unsaturated ring" has a substituent, the substituent is the substituent described in the above under the subtitle "Substituent Mentioned Herein."

In an exemplary embodiment herein, the substituent meant by the phrase "substituted or unsubstituted" (sometimes referred to as an "optional substituent" hereinafter) is, for instance, a group selected from the group consisting of an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, —Si($R_{901}$)($R_{902}$)($R_{903}$), —O—($R_{904}$), —S—($R_{905}$), —N($R_{906}$)($R_{907}$), a halogen atom, a cyano group, a nitro group, an unsubstituted aryl group having 6 to 50 ring carbon atoms, and an unsubstituted heterocyclic group having 5 to 50 ring atoms.

Herein: $R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

When two or more $R_{901}$ are present, the two or more $R_{901}$ are mutually the same or different.

When two or more $R_{902}$ are present, the two or more $R_{902}$ are mutually the same or different.

When two or more $R_{903}$ are present, the two or more $R_{903}$ are mutually the same or different.

When two or more $R_{904}$ are present, the two or more $R_{904}$ are mutually the same or different;

When two or more $R_{905}$ are present, the two or more 8905 are mutually the same or different.

When two or more $R_{906}$ are present, the two or more 8906 are mutually the same or different; and When two or more $R_{907}$ are present, the two or more $R_{907}$ are mutually the same or different.

In an exemplary embodiment, the substituent meant by "substituted or unsubstituted" is selected from the group consisting of an alkyl group having 1 to 50 carbon atoms, an aryl group having 6 to 50 ring carbon atoms, and a heterocyclic group having 5 to 50 ring atoms.

In an exemplary embodiment, the substituent meant by "substituted or unsubstituted" is selected from the group consisting of an alkyl group having 1 to 18 carbon atoms, an aryl group having 6 to 18 ring carbon atoms, and a heterocyclic group having 5 to 18 ring atoms.

Specific examples of the above optional substituent are the same as the specific examples of the substituent described in the above under the subtitle "Substituent Mentioned Herein."

Unless otherwise specified herein, adjacent ones of the optional substituents may form a "saturated ring" or an "unsaturated ring," preferably a substituted or unsubstituted saturated five-membered ring, a substituted or unsubstituted saturated six-membered ring, a substituted or unsubstituted saturated five-membered ring, or a substituted or unsubstituted unsaturated six-membered ring, more preferably a benzene ring.

Unless otherwise specified herein, the optional substituent may further include a substituent. Examples of the substituent for the optional substituent are the same as the examples of the optional substituent.

The above is the description for the instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (sometimes referred to as an instance "bonded to form a ring".

Herein, numerical ranges represented by "x to y" represents a range whose lower limit is the value (x) recited before "to" and whose upper limit is the value (y) recited after "to."

First Exemplary Embodiment

Mixture

A mixture according to a present exemplary embodiment contains a first compound and a second compound.

In the mixture according to the present exemplary embodiment, a total mass $M_T$ of the first compound and the second compound and a mass $M_2$ of the second compound satisfy a relationship represented by the following numeral formula (Numeral Formula 1).

$$0.1 \leq (M_2/M_T) \times 100 \quad \text{(Numerical Formula 1)}$$

In the mixture according to the present exemplary embodiment, the total mass $M_T$ of the first compound and the second compound is a sum of mass $M_1$ of the first compound and the mass $M_2$ of the second compound.

In the mixture according to the present exemplary embodiment, the total mass $M_T$ of the first compound and the second compound and the mass $M_2$ of the second compound preferably satisfy a relationship represented by the following numeral formula (Numeral Formula 1A).

$$0.1 \leq (M_2/M_T) \times 100 \leq 20.0 \quad \text{(Numerical Formula 1A)}$$

In the mixture according to the present exemplary embodiment, the total mass $M_T$ of the first compound and the second compound and the mass $M_2$ of the second compound preferably satisfy a relationship represented by the following numeral formula (Numeral Formula 1B).

$$0.1 \leq (M_2/M_T) \times 100 \leq 10.0 \quad \text{(Numerical Formula 1B)}$$

In the mixture according to the present exemplary embodiment, the total mass $M_T$ of the first compound and the second compound and the mass $M_2$ of the second compound preferably satisfy a relationship represented by the following numeral formula (Numeral Formula 1C).

$$0.5 \leq (M_2/M_T) \times 100 \leq 10.0 \quad \text{(Numerical Formula 1C)}$$

It has been found that the mixture according to the present exemplary embodiment prevents blockage phenomenon by containing the first compound and the second compound so as to satisfy the relationship of the numeral formula (Numeral Formula 1).

When the first compound according to the present exemplary embodiment is used to form a film through dry film-forming such as a vacuum deposition method, a decrease or a change in a vapor-deposition speed tends to easily occur over time. This is considered to be because the first compound of the present exemplary embodiment tends to adhere on a contamination prevention plate, a crucible end or the like to grow into crystal during the film formation through the vacuum deposition method, and the resultant bulky film of the first compound formed by the crystal growth blocks a vaporized beam from a vapor deposition source.

As a result of dedicated studies, the inventors have found that blockage phenomenon is inhibited by mixing an appropriate amount of the second compound with the first compound. It is considered that the mixing of the appropriate amount of the second compound with the first compound inhibits crystal growth, which tends to occur when the first compound alone is formed into a film, resulting in inhibition of occurrence of a bulky adhering substance. If the second compound is highly amorphous compound, it is considered that occurrence of a bulky adhering substance can be inhibited by mixing a small amount of the second compound with the first compound.

According to the mixture of the present exemplary embodiment, the formation of a bulky adhering film can be inhibited when forming an organic layer of an organic EL device through dry film-forming.

First Compound

The first compound includes at least one of a first cyclic structure represented by a formula (11) below and a second cyclic structure represented by a formula (12) below.

It should be noted that the mixture according to the present exemplary embodiment may contain a single kind of the first compound or a plurality of kinds of the first compound.

[Formula 26]

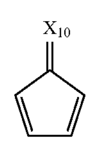

(11)

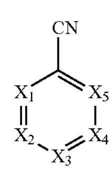

(12)

The first cyclic structure represented by the formula (11) is fused to at least one cyclic structure of a substituted or unsubstituted aromatic hydrocarbon ring having 6 to 50 ring carbon atoms or a substituted or unsubstituted heterocycle having 5 to 50 ring atoms in a molecule of the first compound.

A structure represented by $=X_{10}$ is represented by a formula (11a), (11b), (11c), (11d), (11e), (11f), (11g), (11h), (11i), (11j), (11k) or (11m).

[Formula 27]

(11a)

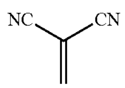

(11b)

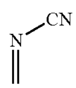

(11c)

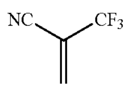

(11d)

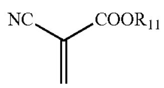

(11e)

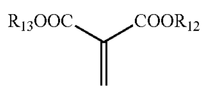

(11f)

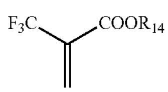

[Formula 28]

(11g)

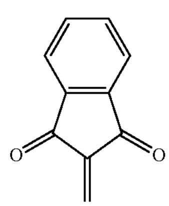

(11h)

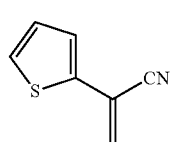

(11i)

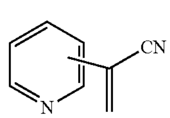

(11j)

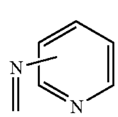

-continued (11k)

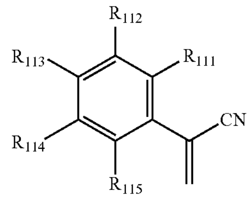

(11m)

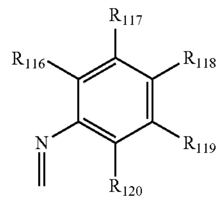

In the formula (11a), (11b), (11c), (11d), (11e), (11f), (11g), (11h), (11i), (11j), (11k) or (11m), $R_{11}$ to $R_{14}$ and $R_{111}$ to $R_{120}$ are each independently a hydrogen atom, a halogen atom, hydroxy group, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aryl group having 6 to 50 ring carbon atoms, or a substituted or unsubstituted heterocyclic group having 5 to 50 ring atoms.

In the first compound and the second compound according to the present exemplary embodiment, $R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

When a plurality of $R_{901}$ are present, the plurality of $R_{901}$ are mutually the same or different.

When a plurality of $R_{902}$ are present, the plurality of $R_{902}$ are mutually the same or different.

When a plurality of $R_{903}$ are present, the plurality of $R_{903}$ are mutually the same or different.

When a plurality of $R_{904}$ are present, the plurality of $R_{904}$ are mutually the same or different.

When a plurality of $R_{905}$ are present, the plurality of $R_{905}$ are mutually the same or different.

When a plurality of $R_{906}$ are present, the plurality of $R_{906}$ are mutually the same or different.

When a plurality of $R_{907}$ are present, the plurality of $R_{907}$ are mutually the same or different.

In the formula (12), $X_1$ to $X_5$ are each independently a nitrogen atom, a carbon atom to be bonded to $R_{15}$, or a carbon atom to be bonded to another atom in the molecule of the first compound.

At least one of $X_1$ to $X_5$ is a carbon atom to be bonded to another atom in the molecule of the first compound.

$R_{15}$ is selected from the group consisting of a hydrogen atom, a halogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a substituted or unsubstituted aryl group having 6 to 50 ring carbon atoms, a substituted or unsubstituted heterocyclic group having 5 to 50 ring atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted alkenyl group having 2 to 50 carbon atoms, a substituted or unsubstituted aralkyl group having 7 to 50 carbon atoms, a carboxy group, a substituted or unsubstituted ester group, a substituted or unsubstituted carbamoyl group, a nitro group, and a substituted or unsubstituted siloxanyl group.

When a plurality of $R_{15}$ are present, the plurality of $R_{15}$ are mutually the same or different.

An ester group herein is at least one group selected from the group consisting of an alkyl ester group and an aryl ester group.

An alkyl ester group herein is represented, for instance, by —C(=O)$OR^E$. $R^E$ is exemplified by a substituted or unsubstituted alkyl group having 1 to 50 carbon atoms (preferably 1 to 10 carbon atoms).

An aryl ester group herein is represented, for instance, by —C(=O)$OR^{Ar}$. $R^{Ar}$ is exemplified by a substituted or unsubstituted aryl group having 6 to 30 ring carbon atoms.

A siloxanyl group herein, which is a silicon compound group through an ether bond, is exemplified by a trimethylsiloxanyl group.

A carbamoyl group herein is represented by —$CONH_2$.

A substituted carbamoyl group herein is represented, for instance, by —CONH—$Ar^C$ or —CONH—$R^C$. $Ar^C$ is, for instance, at least one group selected from the group consisting of a substituted or unsubstituted aryl group having 6 to 50 ring carbon atoms (preferably 6 to 10 ring carbon atoms) and a heterocyclic group having 5 to 50 ring atoms (preferably 5 to 14 ring atoms). $Ar^C$ may be a group in which a substituted or unsubstituted aryl group having 6 to 50 ring carbon atoms is bonded to a substituted or unsubstituted heterocyclic group having 5 to 50 ring atoms.

$R^C$ is exemplified by a substituted or unsubstituted alkyl group having 1 to 50 carbon atoms (preferably 1 to 6 carbon atoms).

In the mixture according to the present exemplary embodiment, the first compound is preferably a fused compound formed by fusing two or three structures represented by a formula (13) to a third cyclic structure selected from a substituted or unsubstituted aromatic hydrocarbon ring having 6 to 50 ring carbon atoms and a substituted or unsubstituted heterocycle having 5 to 50 ring atoms.

[Formula 29]

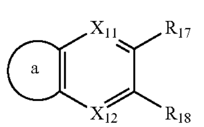

(13)

In the formula (13): a, which is a cyclic structure fused to the third cyclic structure, is represented by the formula (11).

$X_{11}$ and $X_{12}$ are each independently C($R_{16}$) or a nitrogen atom. A plurality of $R_{16}$ are mutually the same or different.

$R_{16}$, $R_{17}$ and $R_{18}$ are each independently a hydrogen atom, a halogen atom, hydroxy group, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aryl group having 6 to 50 ring carbon atoms, or a substituted or unsubstituted heterocyclic group having 5 to 50 ring atoms.

In the mixture of the present exemplary embodiment, the first compound is preferably a compound represented by a formula (14) or (15) below.

[Formula 30]

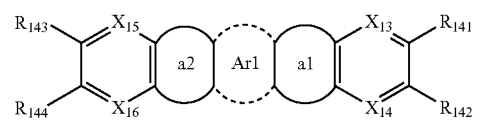

(14)

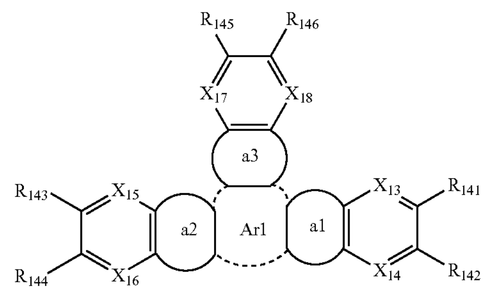

(15)

In the formulae (14) and (15): Ar1 is a substituted or unsubstituted aromatic hydrocarbon ring having 6 to 50 ring carbon atoms or a substituted or unsubstituted heterocycle having 5 to 50 ring atoms; a1, a2 and a3 are each independently the cyclic structure represented by the formula (11); $X_{13}$ to $X_{18}$ each independently represent the same as $X_{11}$ and $X_{12}$ of the formula (13); and $R_{141}$ to $R_{146}$ each independently represent the same as $R_{17}$ and $R_{18}$ of the formula (13).

In the mixture according to the present exemplary embodiment, Ar1 in the formulae (14) and (15) is preferably a substituted or unsubstituted benzene ring or a substituted or unsubstituted heterocycle having 6 ring atoms.

In the mixture of the present exemplary embodiment, the first compound is preferably represented by a formula (14A) or (15A) below.

[Formula 31]

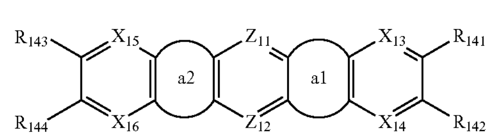

(14A)

-continued (15A)

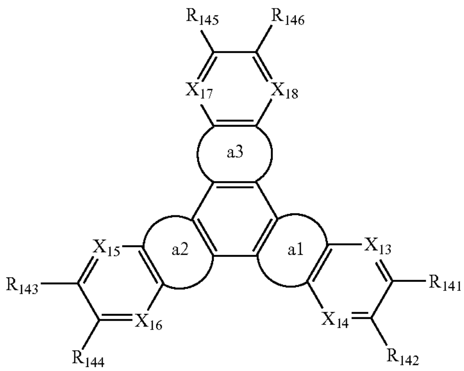

In the formulae (14A) and (15A): a1, a2 and a3 each independently represent the cyclic structure represented by the formula (11); $X_{13}$ to $X_{18}$ each independently represent the same as $X_{11}$ and $X_{12}$ of the formula (13); and $R_{141}$ to $R_{146}$ each independently represent the same as $R_{17}$ and $R_{18}$ of the formula (13).

In the formula (14A), $Z_{11}$ and $Z_{12}$ are each independently CH or a nitrogen atom.

In the mixture of the present exemplary embodiment, at least one of $R_{17}$ and $R_{18}$ in the formula (13) is preferably a fluorine atom, a fluoroalkyl group, a fluoroalkoxy group, or a cyano group.

The structure represented by $=X_{10}$ in the formula (11) is preferably represented by the formula (11a).

In other words, in the mixture of the present exemplary embodiment, the first cyclic structure represented by the formula (11) is preferably a cyclic structure represented by a formula (11A) below.

[Formula 32]

(11A)

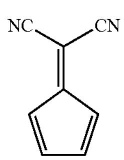

A dicyanomethylene group represented by the formula (11a) has a strong electron-withdrawing property and a low molecular symmetry, so that dipole moment in the molecule increases. Consequently, the compound having the cyclic structure represented by the formula (11A) has a large electron affinity and is suitably usable as a material for the hole injecting layer.

In the mixture of the present exemplary embodiment, the first compound is preferably a compound represented by one of formulae (141) to (144) and (151) below.

[Formula 33]

(141)

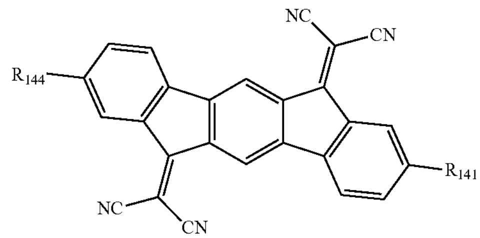

(142)

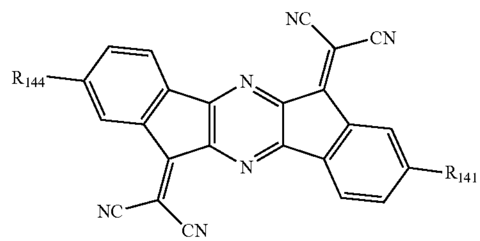

(143)

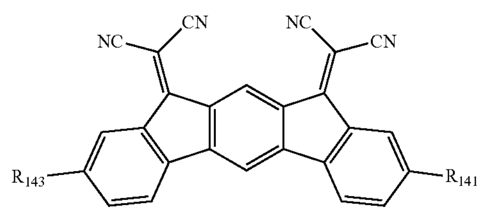

(144)

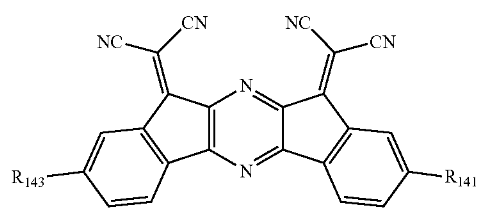

[Formula 34]

(151)

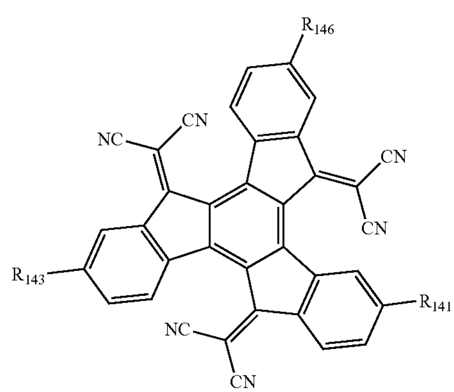

In the formulae (141) to (144) and (151), $R_{141}$, $R_{143}$, $R_{144}$ and $R_{146}$ are each independently a fluorine atom, a fluoroalkyl group, a fluoroalkoxy group, or a cyano group.

In the mixture of the present exemplary embodiment, the first compound is also preferably a compound represented by the formula (143).

In the mixture of the present exemplary embodiment, the first compound is also preferably a compound represented by one of formulae (145) to (148) and (152) below.

[Formula 35]

(145)

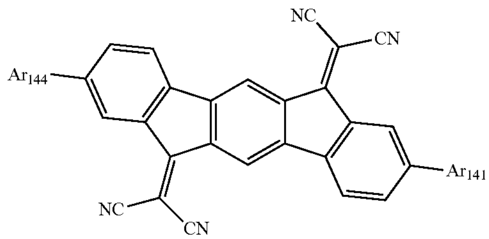

(146)

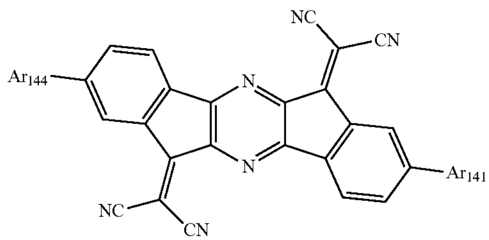

(147)

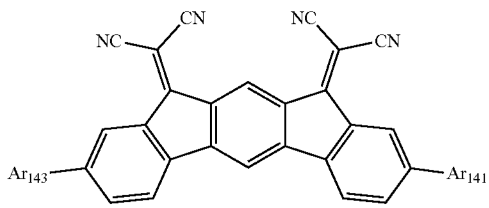

(148)

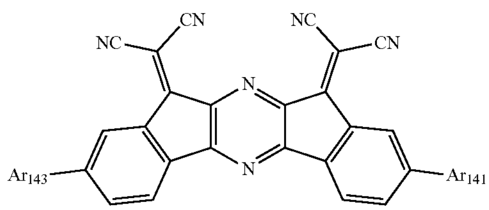

[Formula 36]

(152)

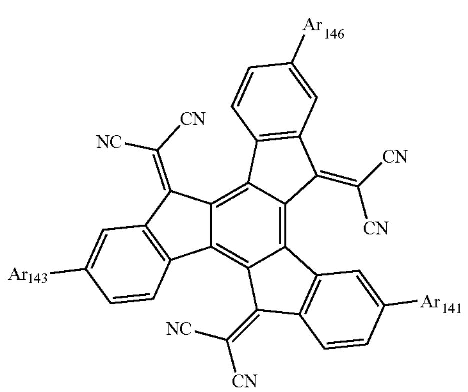

In the formulae (145) to (148) and (152), $Ar_{141}$, $Ar_{143}$, $Ar_{144}$ and $Ar_{146}$ are each independently an aromatic hydrocarbon group having 6 to 30 ring carbon atoms and having at least one substituent selected from the group consisting of a fluorine atom, a fluoroalkyl group, a fluoroalkoxy group and a cyano group, or a heterocyclic group having 5 to 30 ring atoms and having at least one substituent selected from the group consisting of a fluorine atom, a fluoroalkyl group, a fluoroalkoxy group and a cyano group.

In the mixture of the present exemplary embodiment, the first compound is also preferably a compound represented by one of formulae (1451), (1461), (1471) and (1481) below.

[Formula 37]

(1451)

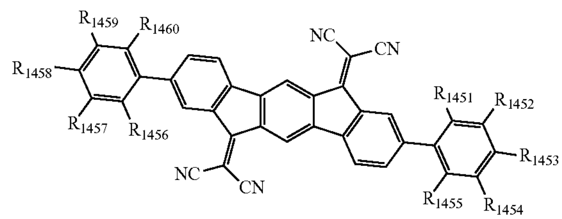

(1461)

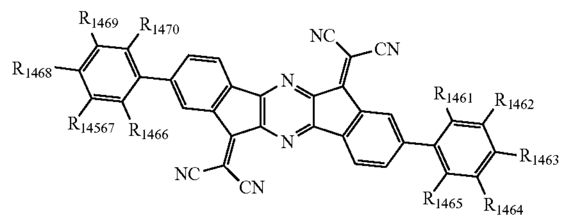

(1471)

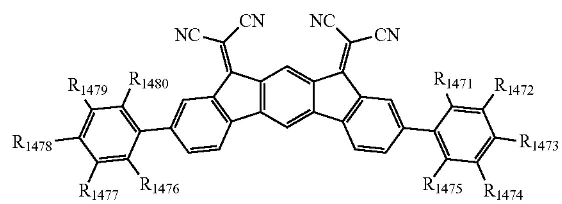

(1481)

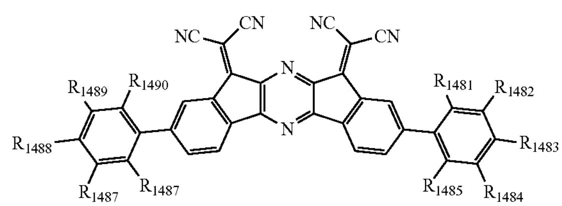

$R_{1451}$ to $R_{1460}$ in the formula (1451), $R_{1451}$ to $R_{1460}$ in the formula (1461), $R_{1471}$ to $R_{1480}$ in the formula (1471), and $R_{1481}$ to $R_{1490}$ in the formula (1481) are each independently a hydrogen atom, fluorine atom, fluoroalkyl group, fluoroalkoxy group, or cyano group.

At least one of $R_{1451}$ to $R_{1460}$ is a fluorine atom, fluoroalkyl group, fluoroalkoxy group, or cyano group.

At least one of $R_{1461}$ to $R_{1470}$ is a fluorine atom, fluoroalkyl group, fluoroalkoxy group, or cyano group.

At least one of $R_{1471}$ to $R_{1480}$ is a fluorine atom, fluoroalkyl group, fluoroalkoxy group, or cyano group.

At least one of $R_{1481}$ to $R_{1490}$ is a fluorine atom, fluoroalkyl group, fluoroalkoxy group, or cyano group.

In the mixture of the present exemplary embodiment, the first compound is also preferably a compound represented by the formula (1451).

In the mixture of the present exemplary embodiment, the first compound is also preferably a compound represented by the formula (1461).

In the mixture of the present exemplary embodiment, the first compound is also preferably a compound represented by a formula (16) or (17) below.

[Formula 38]

(16)

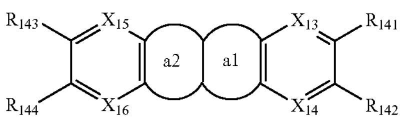

(17)

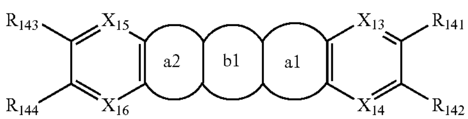

In the formulae (16) and (17): $X_{13}$ to $X_{16}$ each independently represent the same as $X_{11}$ and $X_{12}$ of the formula (13); $R_{141}$ to $R_{144}$ each independently represent the same as $R_{17}$ and $R_{18}$ of the formula (13); a1 and a2 each independently represent the cyclic structure represented by the formula (11); and b1 is a cyclic structure represented by a formula (171).

[Formula 39]

(171)

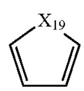

In the formula (171), $X_{19}$ is a sulfur atom or an oxygen atom.

In the mixture of the present exemplary embodiment, a1 and a2 in the formulae (16) and (17) is preferably the cyclic structure represented by the formula (11A).

The compound represented by the formula (16) is preferably represented by a formula (161).

The compound represented by the formula (17) is preferably represented by the formula (171).

[Formula 40]

(161)

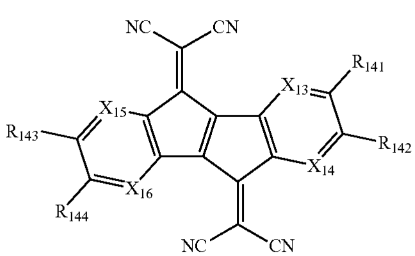

-continued (171)

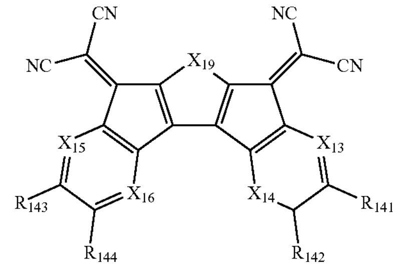

In the formulae (161) and (171): $X_{13}$ to $X_{16}$ each independently represent the same as $X_{11}$ and $X_{12}$ of the formula (13); $R_{141}$ to $R_{144}$ each independently represent the same as $R_{17}$ to $R_{18}$ of the formula (13); and $X_{19}$ is a sulfur atom or an oxygen atom.

In the mixture of the present exemplary embodiment, it is preferable that at least one of $R_{141}$ to $R_{144}$ in the formulae (16), (161), (17) and (171) is a fluorine atom, a fluoroalkyl group, a fluoroalkoxy group, a cyano group, an aromatic hydrocarbon group having 6 to 30 ring carbon atoms and having at least one substituent selected from the group consisting of a fluorine atom, a fluoroalkyl group, a fluoroalkoxy group and a cyano group, or a heterocyclic group having 5 to 30 ring atoms and having at least one substituent selected from the group consisting of a fluorine atom, a fluoroalkyl group, a fluoroalkoxy group and a cyano group.

In the mixture of the present exemplary embodiment, two or three structures represented by the formula (13) in the first compound are preferably mutually the same.

The second cyclic structure represented by the formula (12) is preferably a cyclic structure represented by a formula (121) or (122).

[Formula 41]

(121)

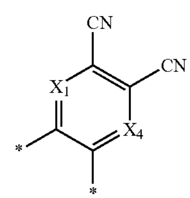

(122)

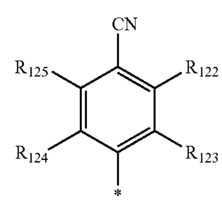

$X_1$ and $X_4$ in the formula (121) are each independently a nitrogen atom or a carbon atom bonded to $R_{121}$.

$R_{121}$ in the formula (121) and $R_{122}$ to $R_{125}$ in the formula (122) each independently represent the same $R_{15}$ in the formula (12). A plurality of $R_{121}$ are mutually the same or different.

* in the formulae (121) and (122) each independently represents a bonding position to another atom in a molecule of the first compound.

In the mixture of the present exemplary embodiment, the first compound is also preferably a compound represented by a formula (121A) below.

[Formula 42]

(121A)

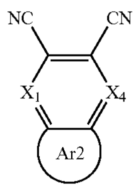

In the formula (121A): Ar2 is a substituted or unsubstituted aromatic hydrocarbon ring having 6 to 50 ring carbon atoms or a substituted or unsubstituted heterocycle having 5 to 50 ring atoms; $X_1$ and $X_4$ are each independently a nitrogen atom or a carbon atom bonded to $R_{121}$, in which $R_{121}$ each independently represents the same as $R_{15}$ in the formula (12), and a plurality of $R_{121}$ are mutually the same or different.

In the mixture of the present exemplary embodiment, the first compound is also preferably a compound represented by a formula (121B) below.

[Formula 43]

(121B)

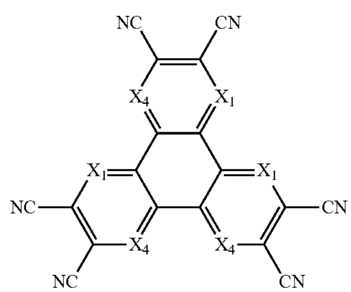

In the formula (121B): $X_1$ and $X_4$ are each independently a nitrogen atom or a carbon atom bonded to $R_{121}$, in which a plurality of $X_1$ are mutually the same or different and a plurality of $X_4$ are mutually the same or different; and $R_{121}$ each independently represents the same as $R_{15}$ in the formula (12), and a plurality of $R_{121}$ are mutually the same or different.

The second cyclic structure represented by the formula (12) is also preferably included in the first compound as a group represented by a formula (122B) below.

[Formula 44]

(122B)

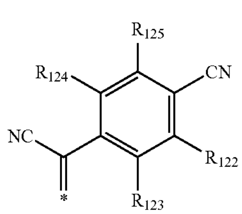

In the formula (122B), $R_{122}$ to $R_{125}$ each independently represent the same as $R_{15}$ in the formula (12). * in the formula (122B) represents a bonding position to another atom in the molecule of the first compound.

In the mixture of the present exemplary embodiment, the first compound is also preferably a compound represented by a formula (122C) below.

[Formula 45]

(122C)

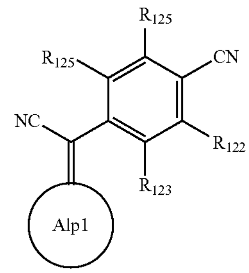

In the formula (122C), $R_{122}$ to $R_{125}$ each independently represent the same as $R_{15}$ in the formula (12), in which Alp1 is a substituted or unsubstituted aliphatic ring having 3 to 6 ring carbon atoms.

In the mixture of the present exemplary embodiment, the first compound is also preferably a compound represented by a formula (122D) below.

[Formula 46]

(122D)

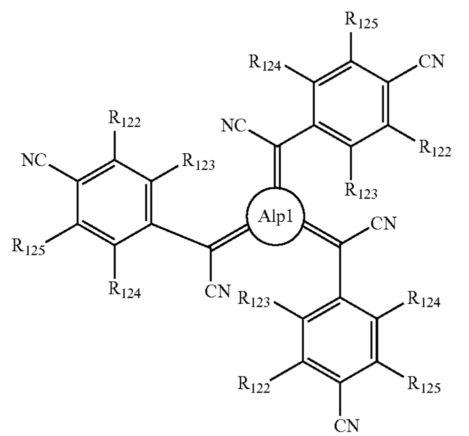

In the formula (122D): $R_{122}$ to $R_{125}$ each independently represent the same as $R_{15}$ in the formula (12); a plurality of $R_{122}$ are mutually the same or different; a plurality of $R_{123}$ are mutually the same or different; a plurality of $R_{124}$ are mutually the same or different; a plurality of $R_{125}$ are mutually the same or different; and Alp1 is a substituted or unsubstituted aliphatic ring having 3 to 6 ring carbon atoms.

In the mixture of the present exemplary embodiment, the first compound is also preferably a compound represented by a formula (122E) below.

[Formula 47]

(122E)

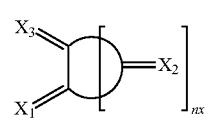

In the formula (122E): nx is 1, 2, 3 or 4; and Structures represented by $=X_1$, $=X_2$ and $=X_3$ are each independently represented by a formula (E1), formula (E2), formula (E3) or formula (E4).

[Formula 48]

(E1)

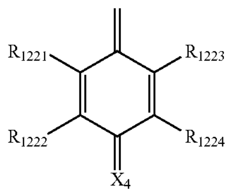

(E2)

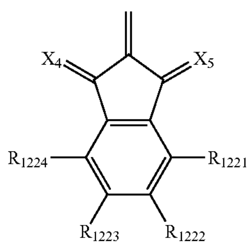

(E3)

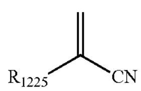

(E4)

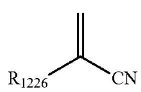

In the formulae (E1), (E2), (E3) and (E4): $=X_4$ and $=X_5$ are each independently selected from oxo (=O) and dicyanomethylidene ($=C(CN)_2$); $R_{1225}$ is a substituted or unsubstituted aryl group having 6 to 50 ring carbon atoms; $R_{1226}$ is a substituted or unsubstituted heterocyclic group having 5 to 50 ring atoms; and $R_{1221}$ to $R_{1224}$ are each independently a hydrogen atom, a halogen atom, a cyano group, a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

The formula (122E) in which nx is 1 is represented by a formula (1221E). The formula (122E) in which nx is 2 is represented by a formula (1222E). The formula (122E) in which nx is 3 is represented by a formula (1223E). The formula (122E) in which nx is 4 is represented by a formula (1224E).

[Formula 49]

(1221E)

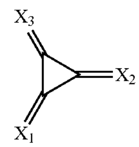

(1222E)

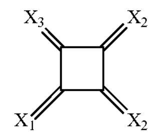

(1223E)

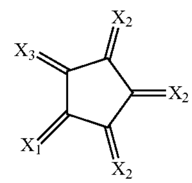

(1224E)

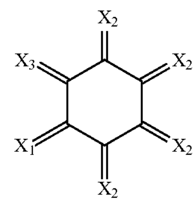

In the formulae (1221E), (1222E), (1223E) and (1224E): Structures represented by $=X_1$, $=X_2$ and $=X_3$ are each independently represented by the formula (E1), formula (E2), formula (E3) or formula (E4).

A plurality of structures represented by $=X_2$ are mutually the same or different.

$=X_1$, $=X_2$ and $=X_3$ are preferably the structure represented by the formula (E3).

The structure represented by the formula (E3) is preferably the structure represented by the formula (11k).

In the formula (11k), $R_{111}$ to $R_{115}$ are preferably each independently a halogen atom or a cyano group.

In the formula (11k), it is preferable that four of $R_{111}$ to $R_{115}$ are each independently a halogen atom and one of $R_{111}$ to $R_{115}$ is a cyano group.

In the formula (11k), it is preferable that $R_{111}$, $R_{112}$, $R_{114}$ and $R_{115}$ are halogen atoms and $R_{113}$ is a cyano group.

In $R_{111}$ to $R_{115}$ in the formula (11k), a halogen atom is preferably a fluorine atom.

Method of Preparing First Compound

The first compound according to the present exemplary embodiment can be manufactured by a known method or through a known alternative reaction using a known material(s) tailored for the target compound in accordance with the known method.

Specific Examples of First Compound

Specific examples of the first compound according to the present exemplary embodiment is exemplified by compounds below. However, the invention is not limited to these specific examples.

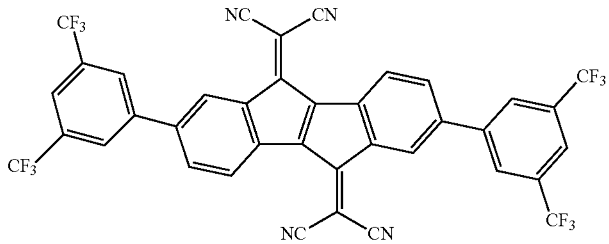
[Formula 50]
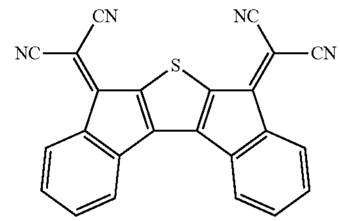
[Formula 51]
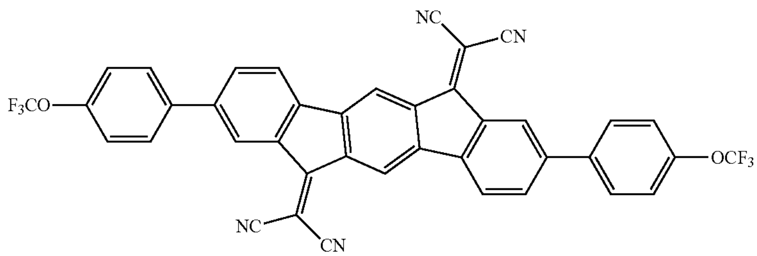
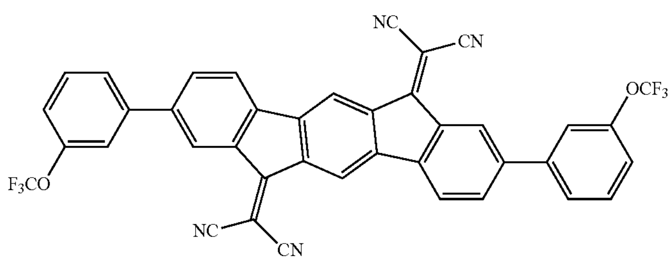
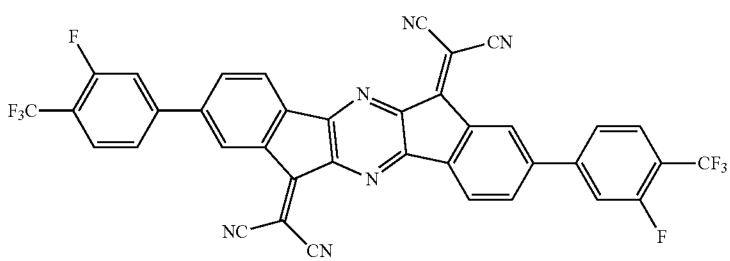
[Formula 52]
(A-1)
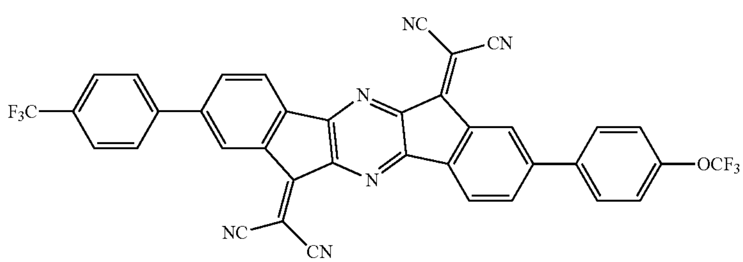
(A-2)
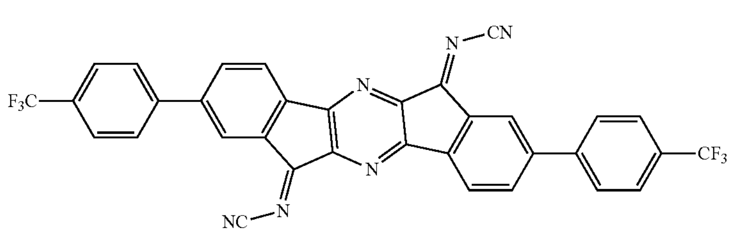

-continued
(A-3)
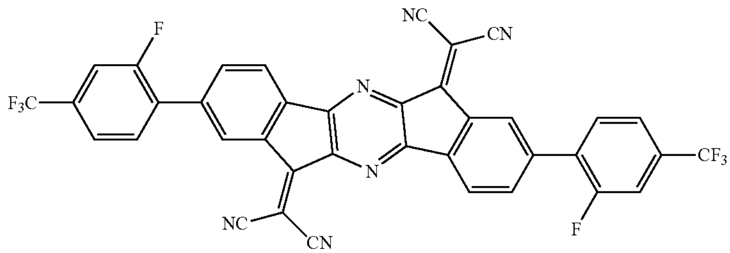
(A-4)
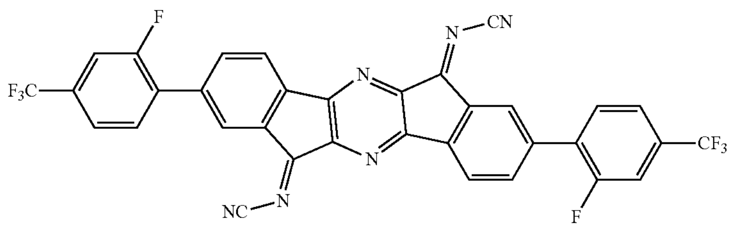
[Formula 53]
(A-5)
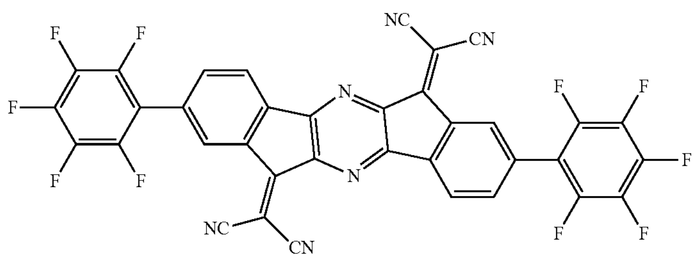
(A-6)
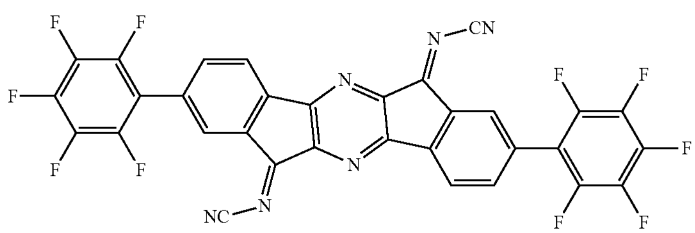
(A-7)
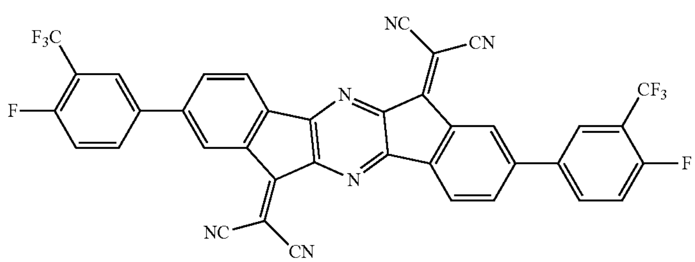
(A-8)
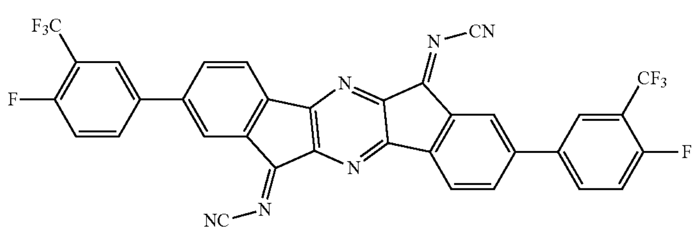

-continued
[Formula 54]
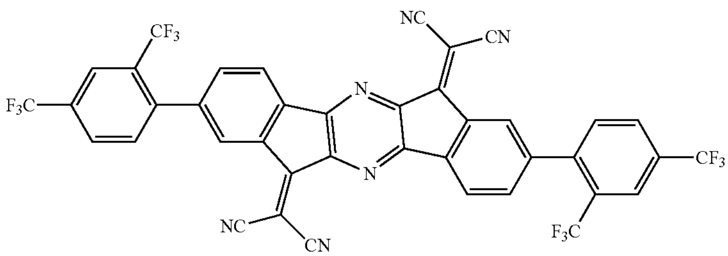
(A-9)
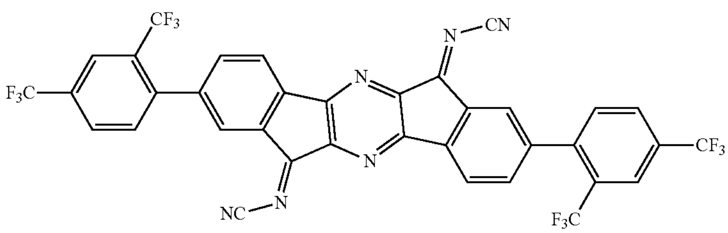
(A-10)
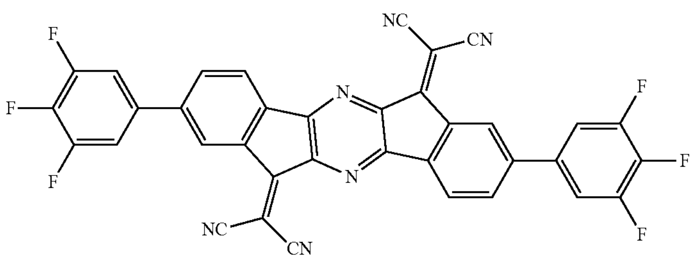
(A-11)
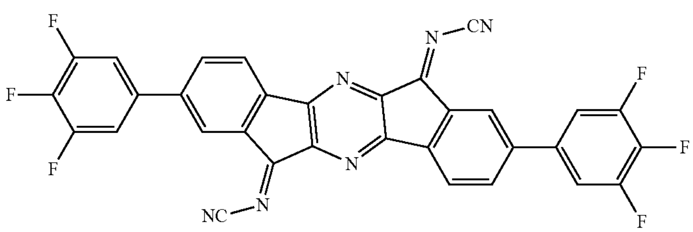
(A-12)
[Formula 55]
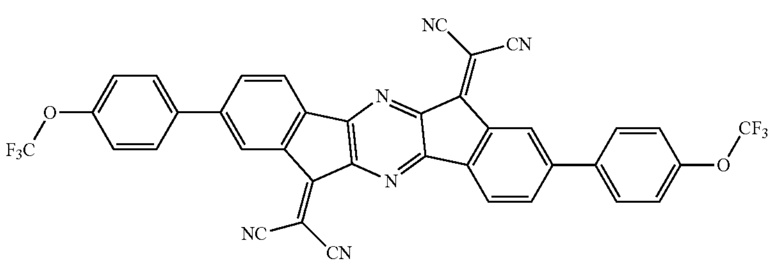
(A-13)
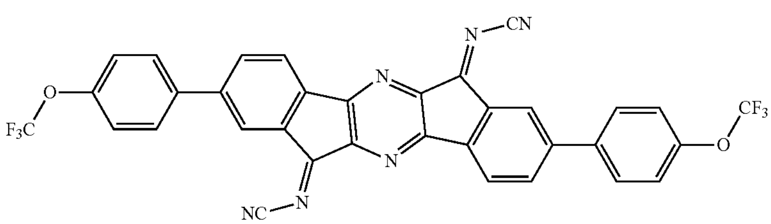
(A-14)

-continued
(A-15)
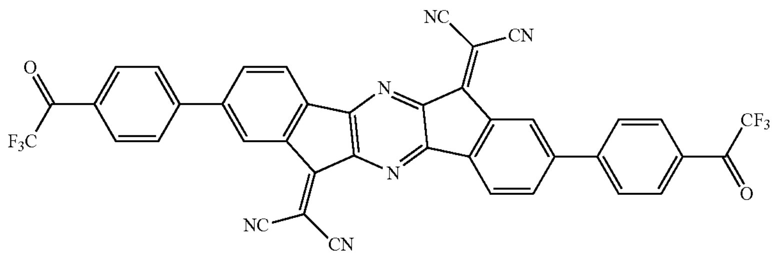
(A-16)
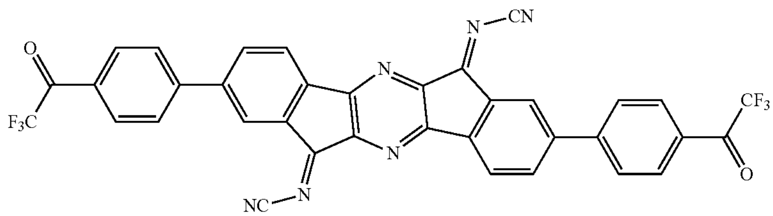
[Formula 56]
(A-17)
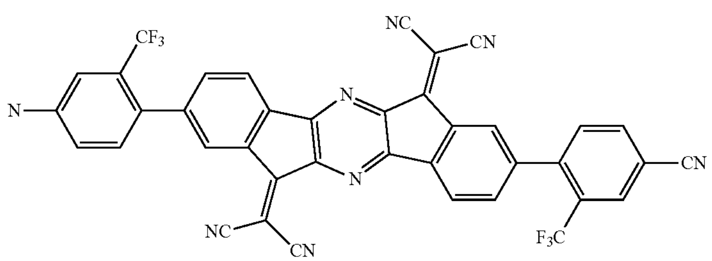
(A-18)
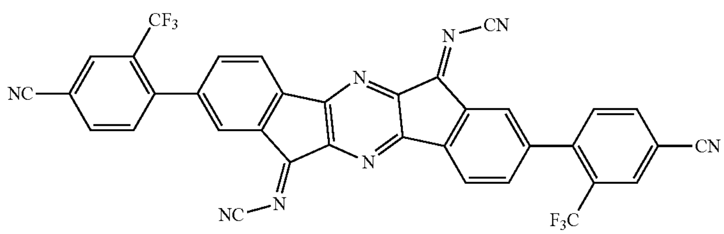
(A-19)
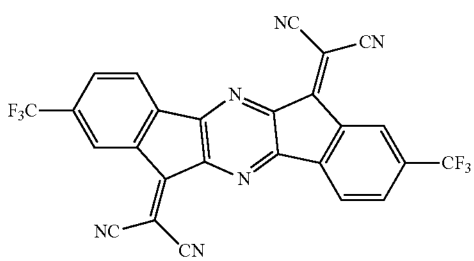
(A-20)
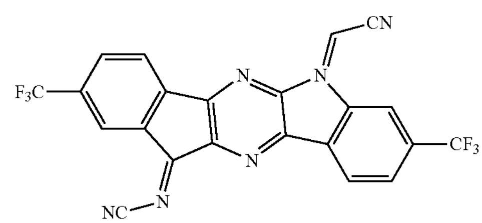
[Formula 57]
(A-21)
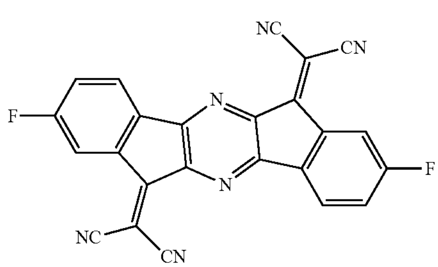
(A-22)
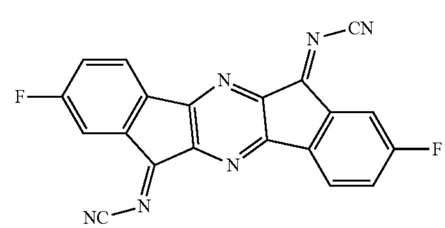

-continued
(A-23)
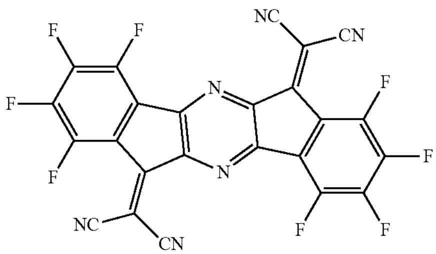
(A-24)
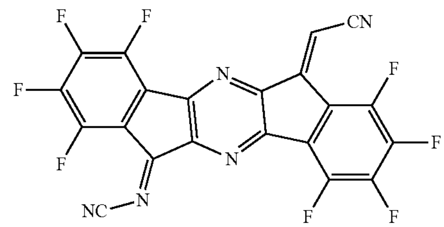
(A-25)
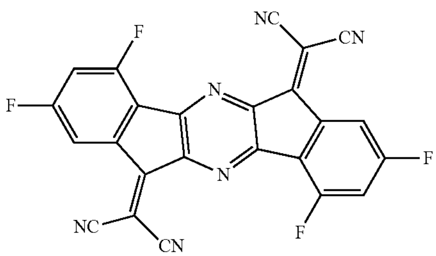
(A-26)
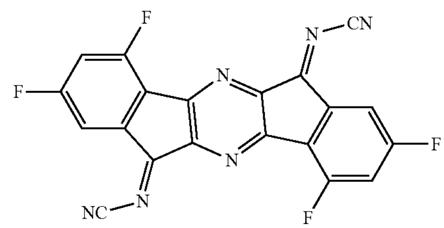
[Formula 58]
(A-27)
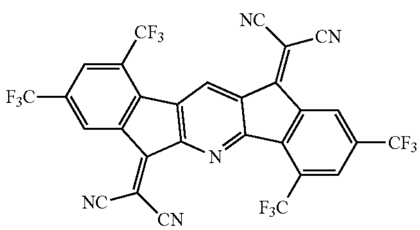
(A-28)
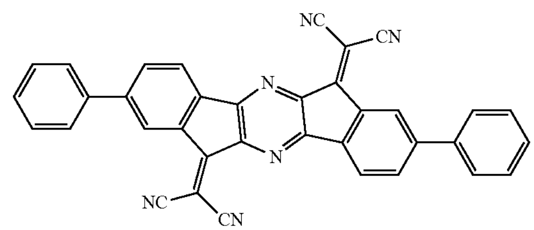
(A-29)
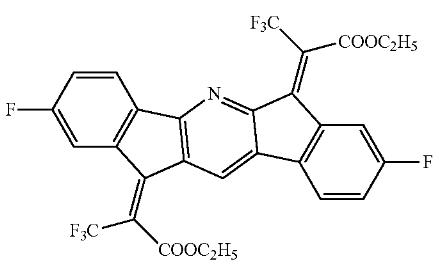
(A-30)
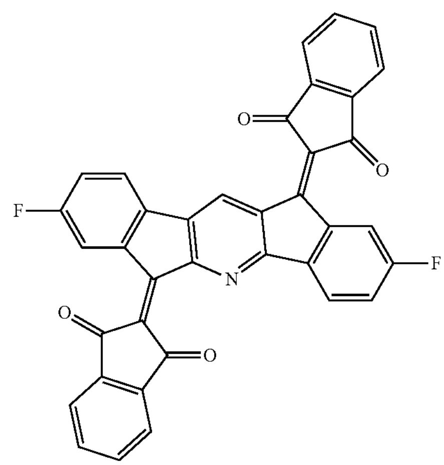
[Formula 59]
(A-31)
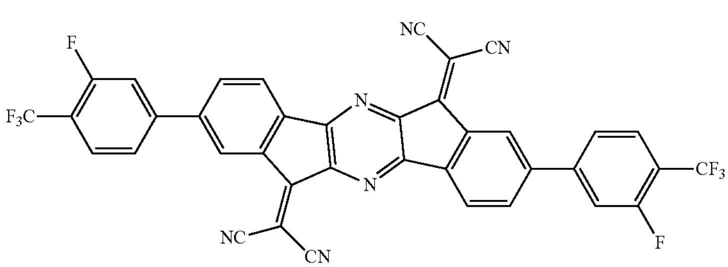

-continued
(A-32)
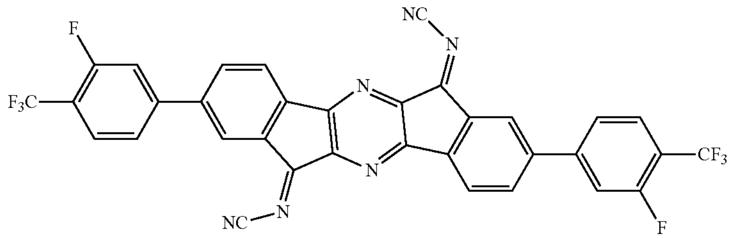
(A-33)
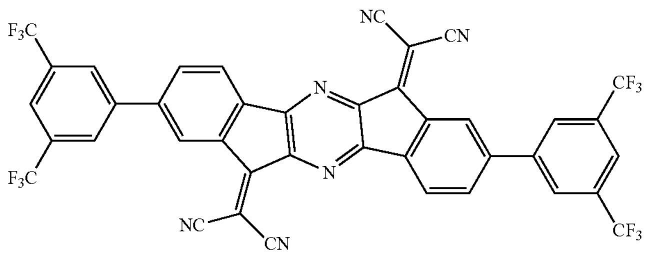
(A-34)
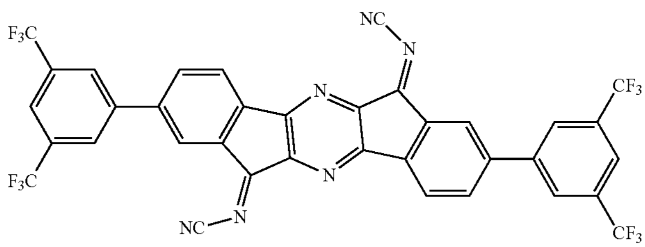
[Formula 60]
(A-35)
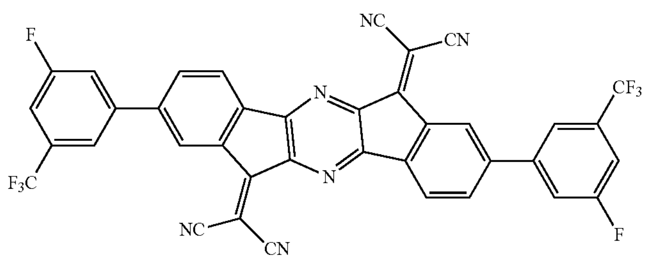
(A-36)
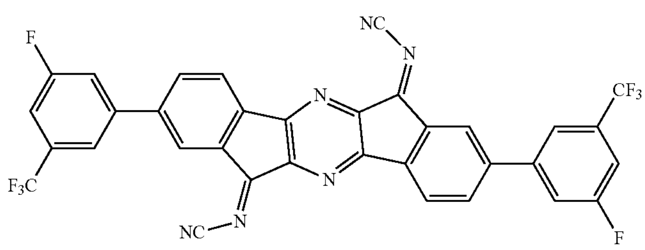
(A-37)
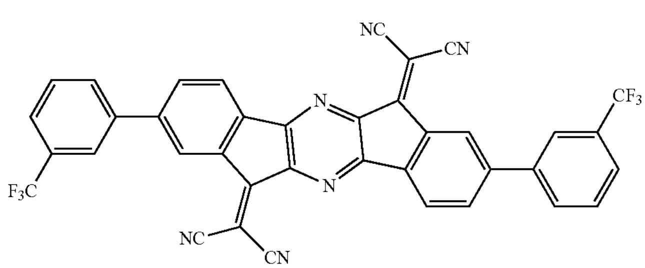

-continued
(A-38)
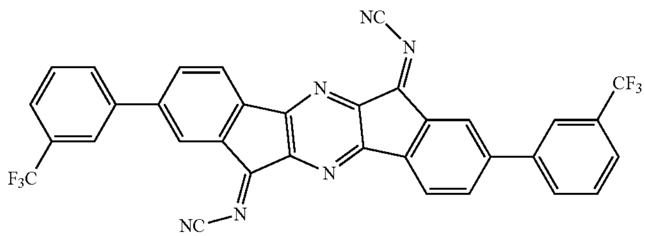
[Formula 61]
(A-39)
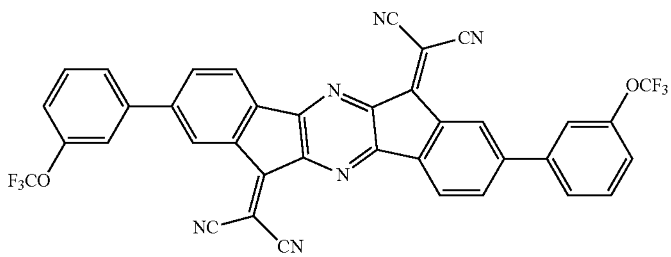
(A-40)
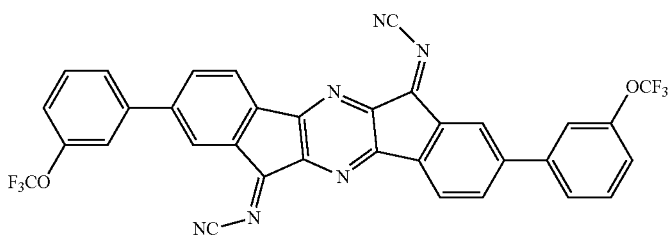
(A-41)
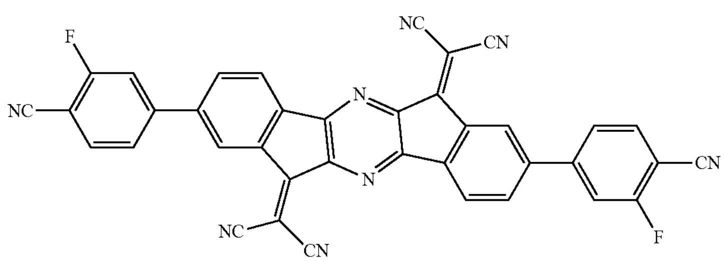
(A-42)
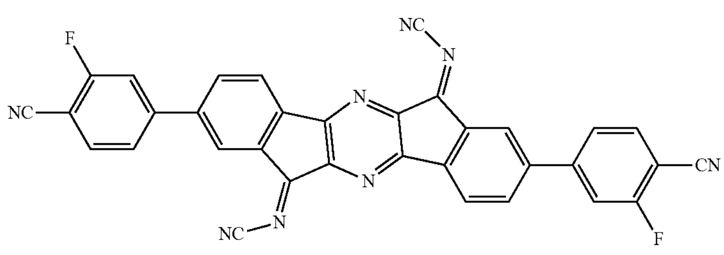
[Formula 62]
(A-43)
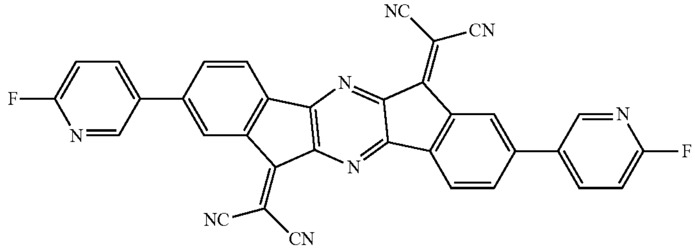

-continued
(A-44)
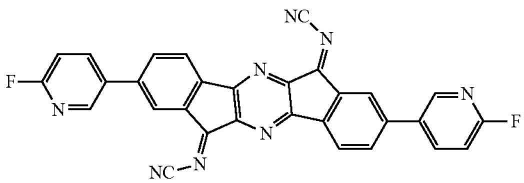
(A-45)
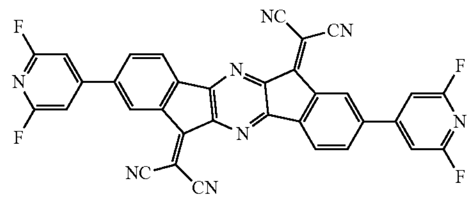
(A-46)
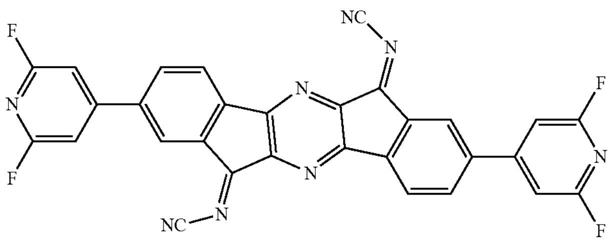
[Formula 63]
(A-47)
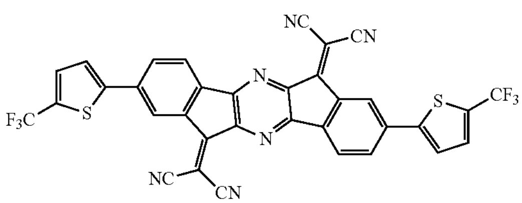
(A-48)
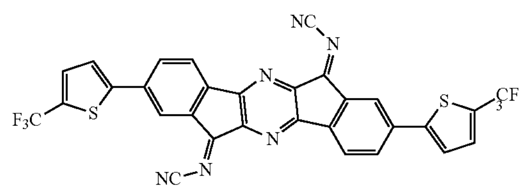
(A-49)
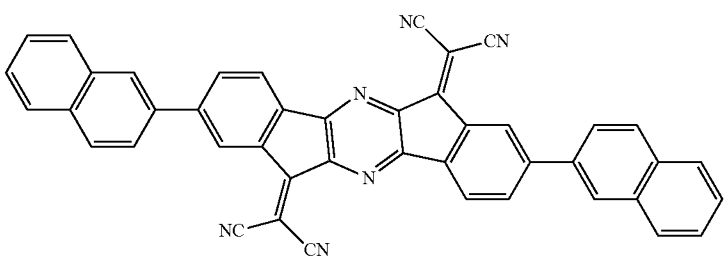
(A-50)
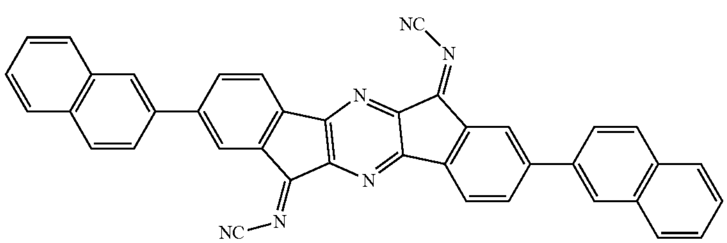
[Formula 64]
(A-51)
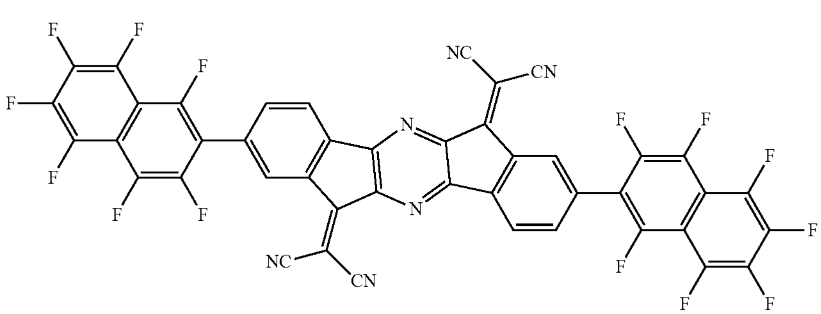

-continued
(A-52)
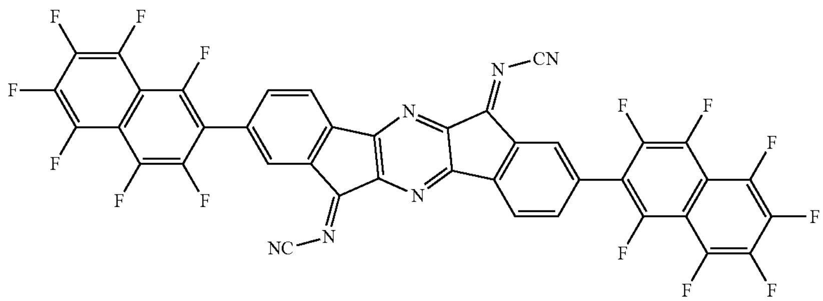
(A-53)
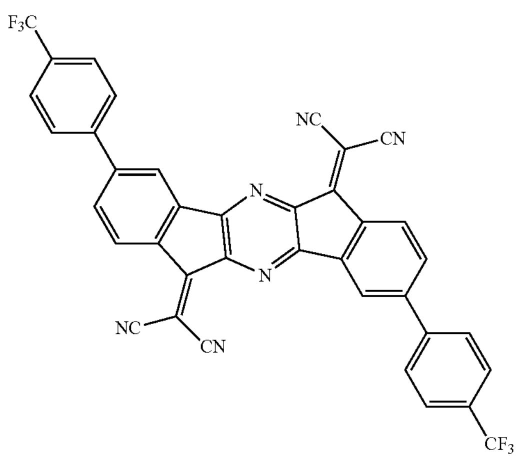
(A-54)
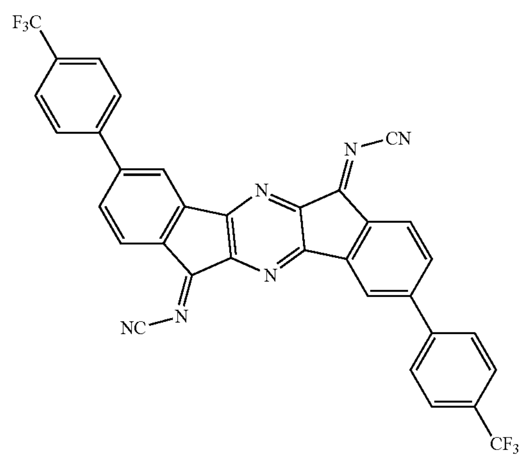
[Formula 65]
(A-55)
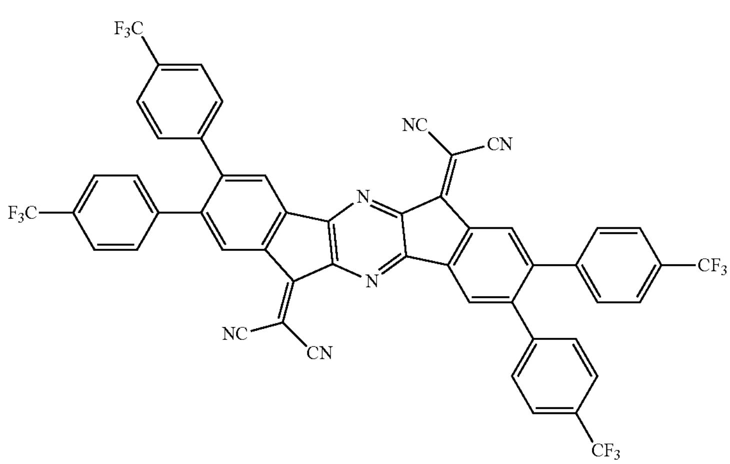

-continued
(A-56)
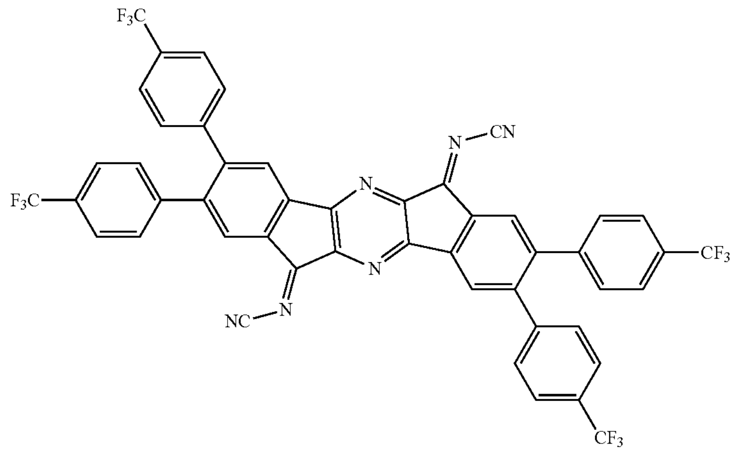
(A-57)
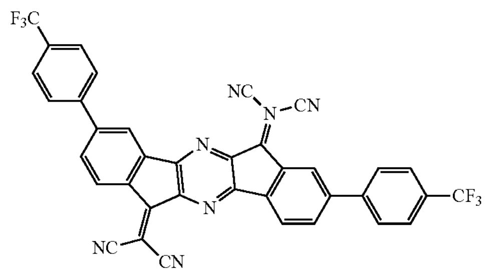
(A-58)
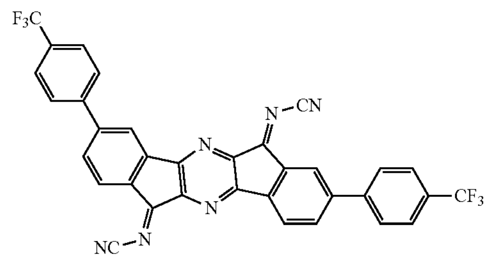
(A-59)
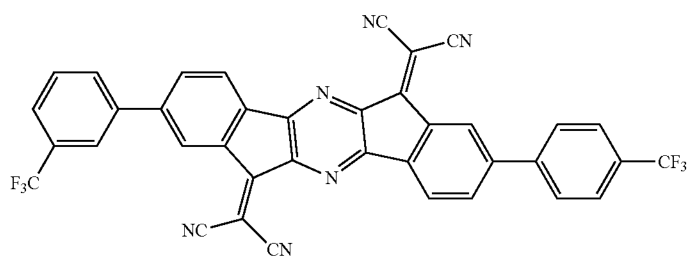
(A-60)
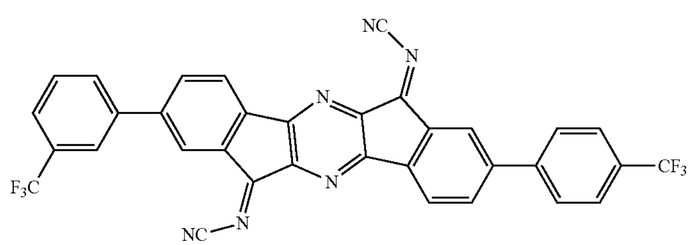
[Formula 66]
(A-61)
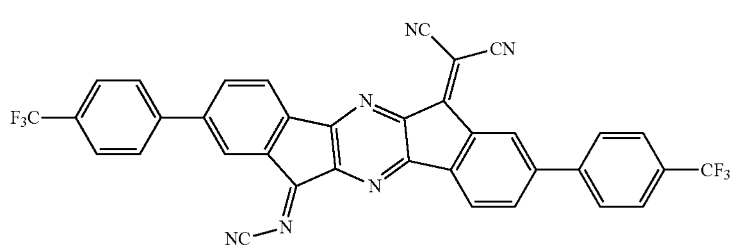

-continued
[Formula 67]
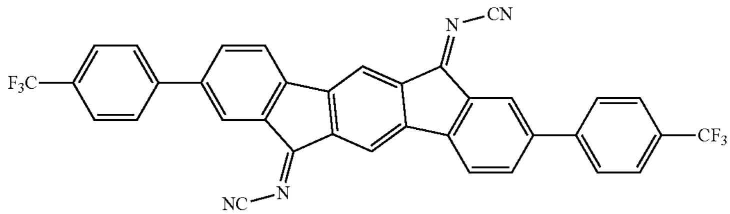
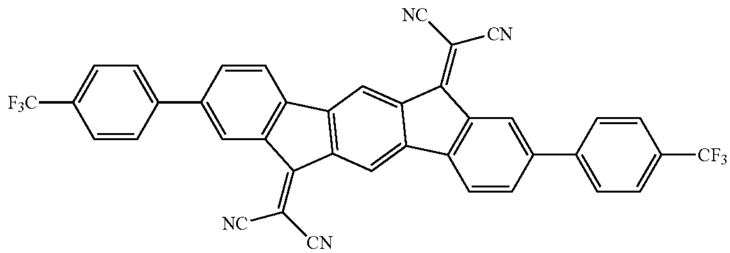
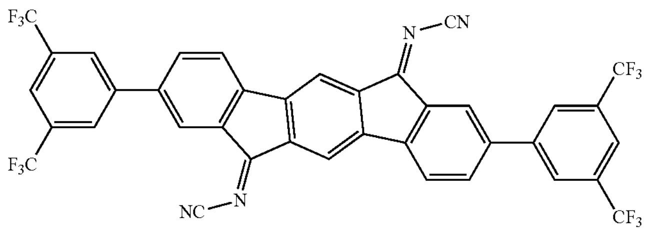
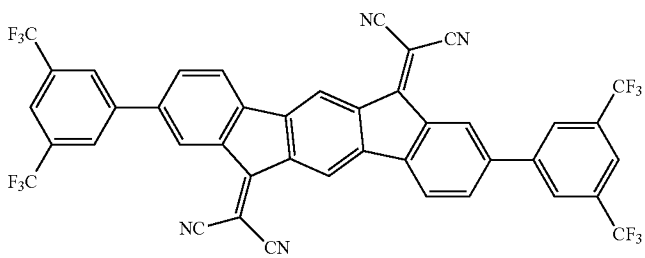
[Formula 68]
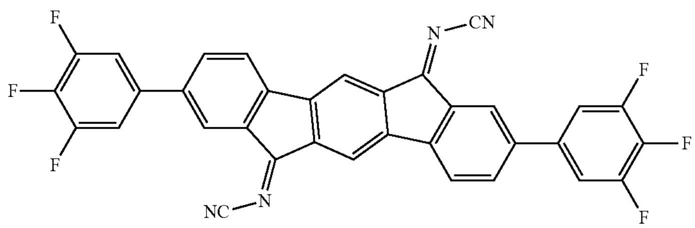
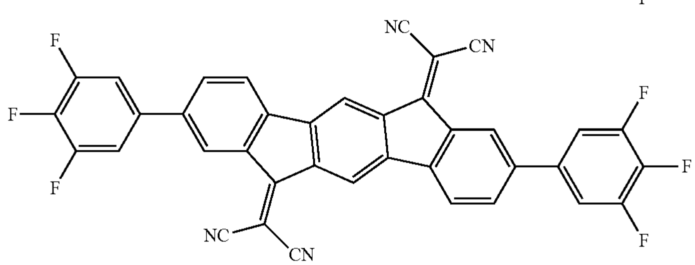
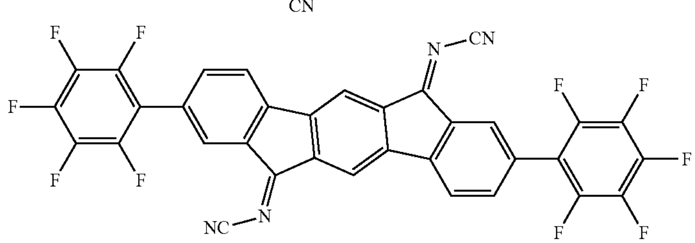

-continued
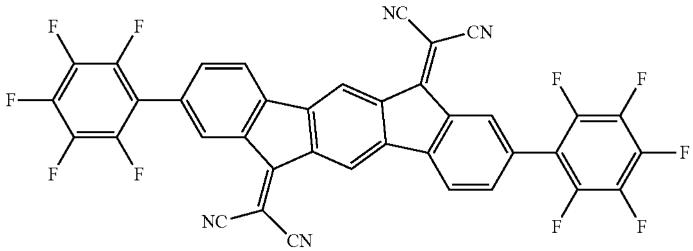
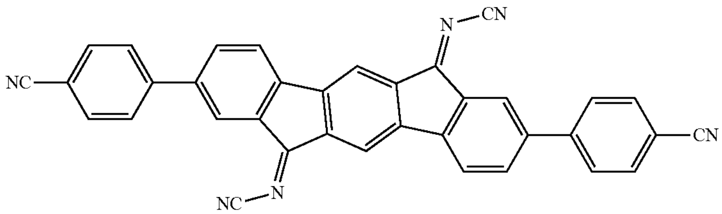
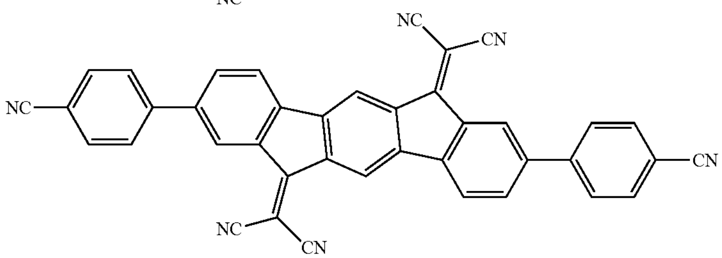
[Formula 69]
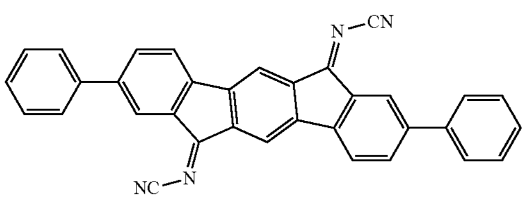
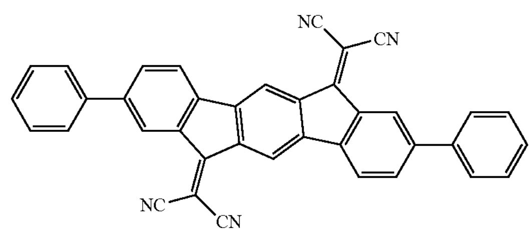
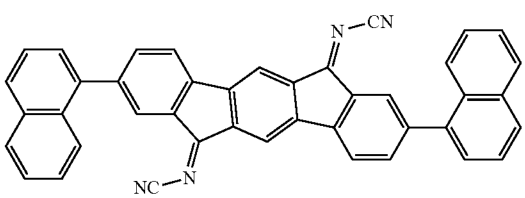
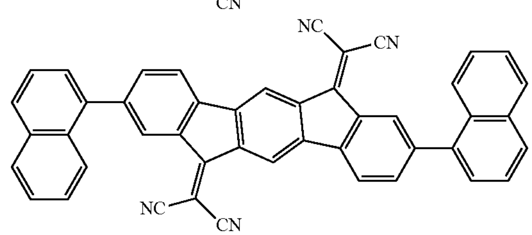
[Formula 70]
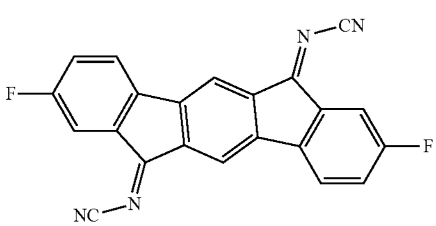
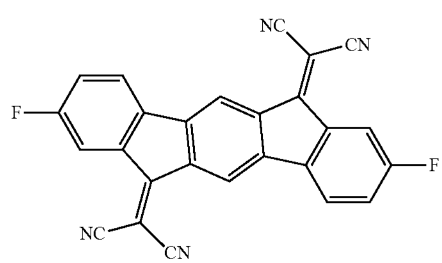
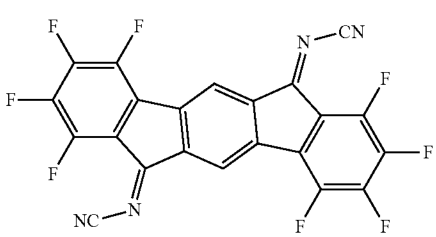
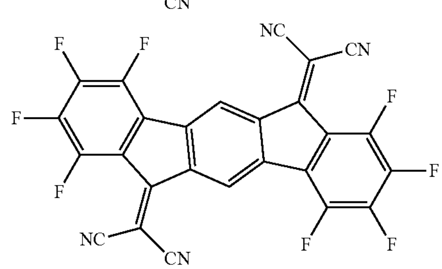

-continued
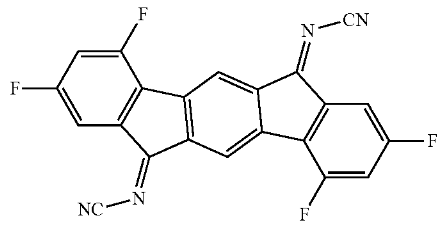
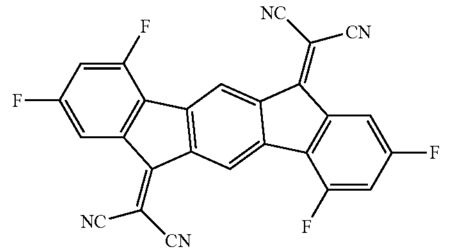
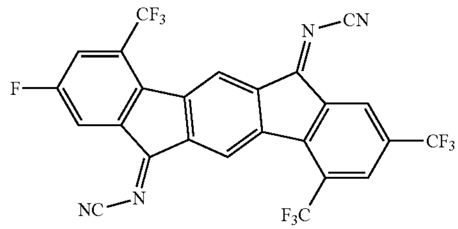
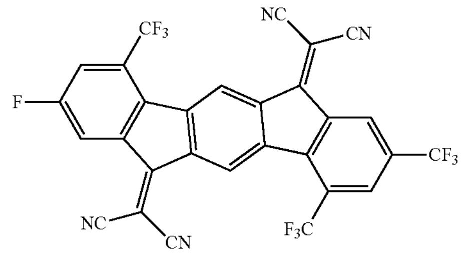
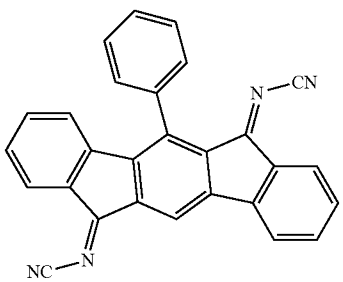
[Formula 71]
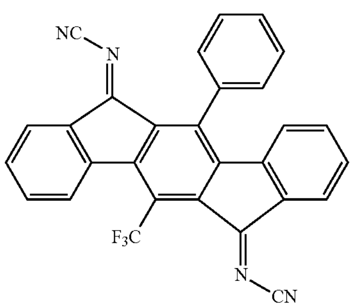
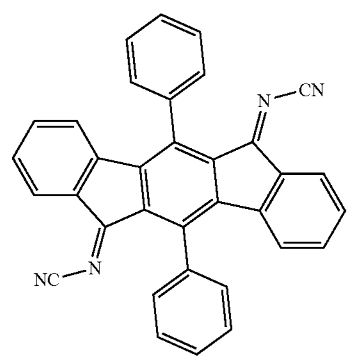
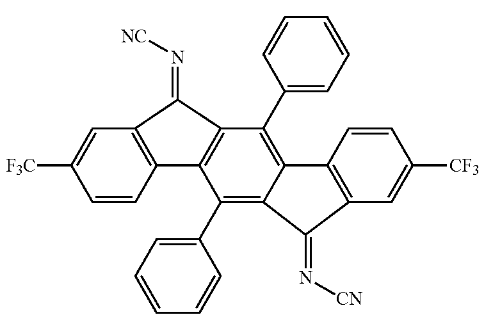
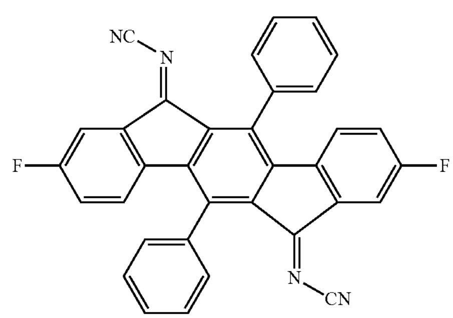

-continued
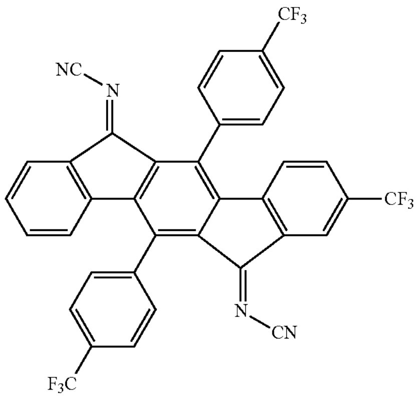
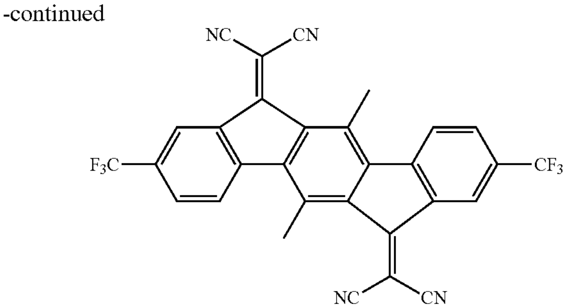
[Formula 72]
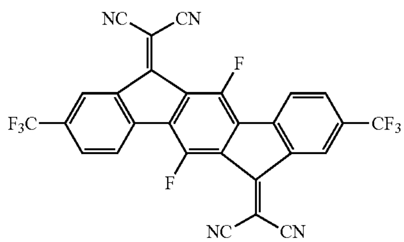
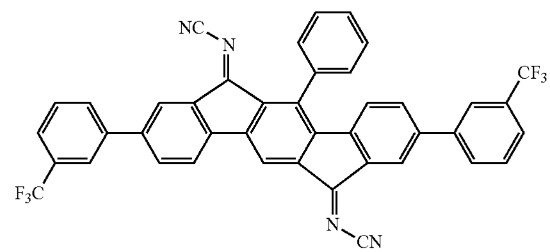
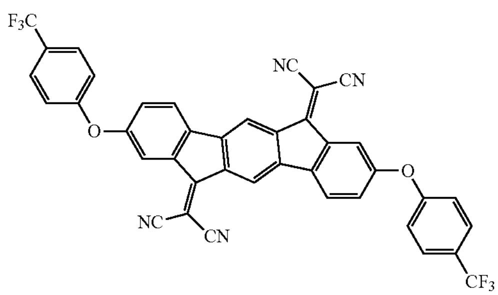
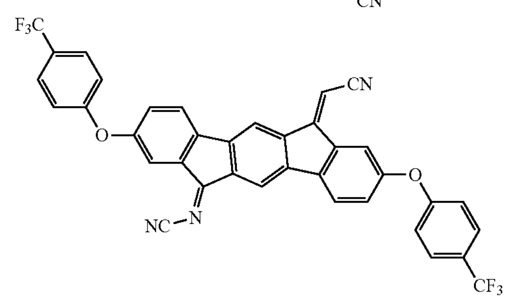
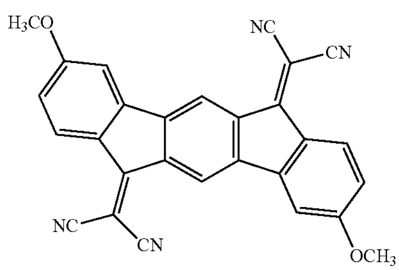
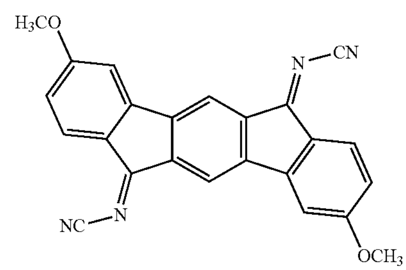
[Formula 73]
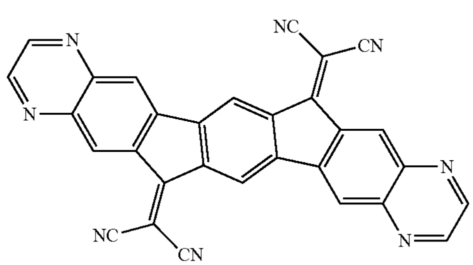
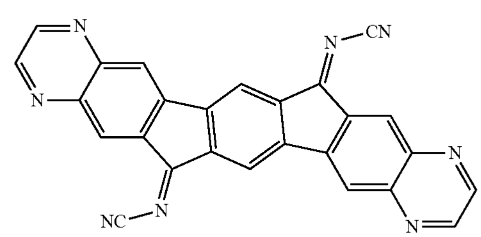
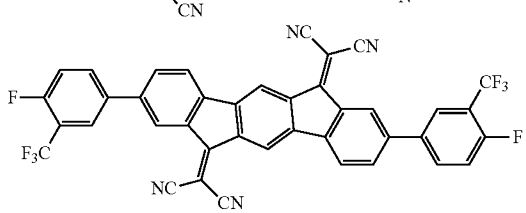
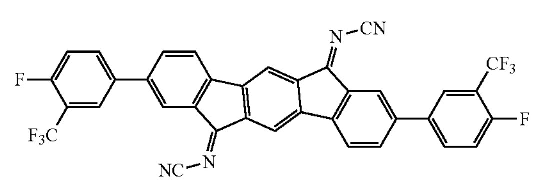

-continued
[Formula 74]
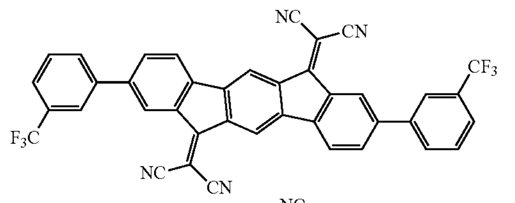
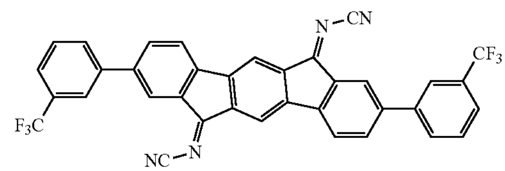
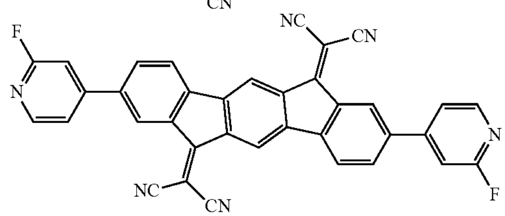
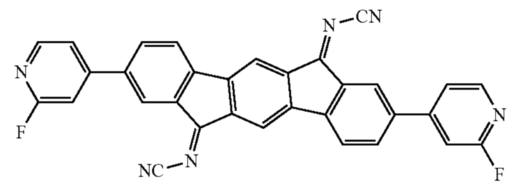
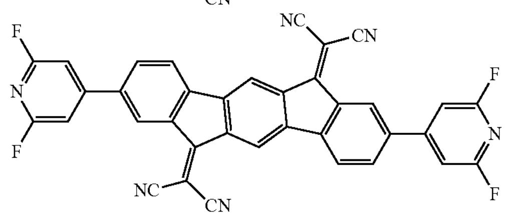
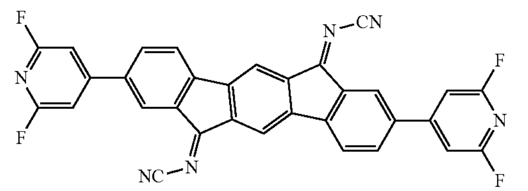
[Formula 75]
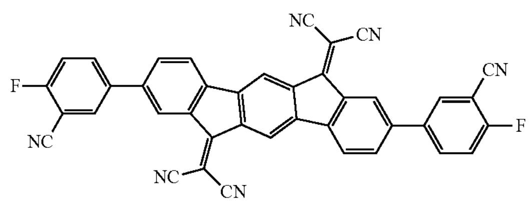
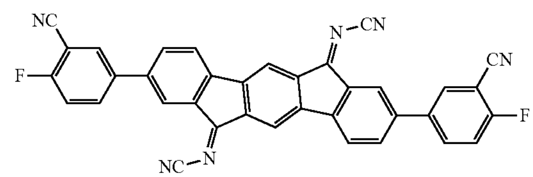
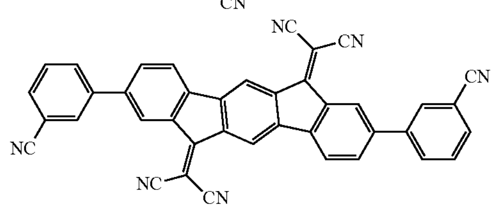
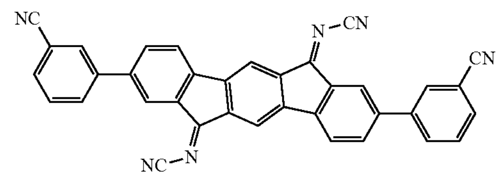
[Formula 76]
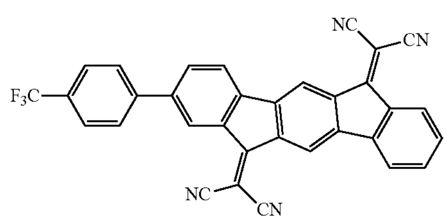
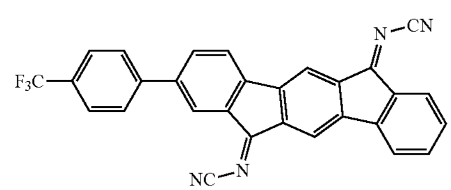
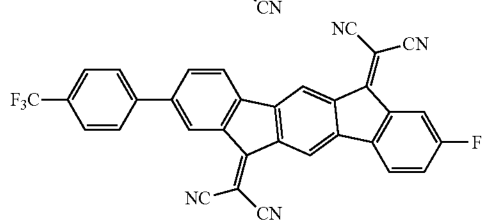
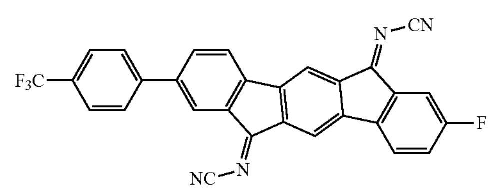
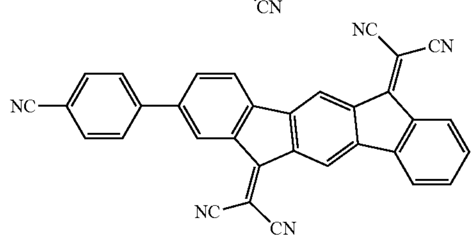
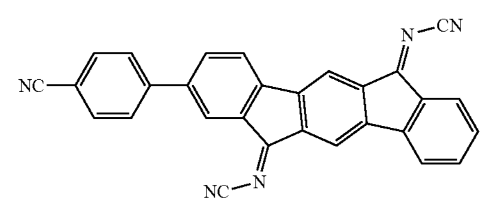

-continued
[Formula 77]
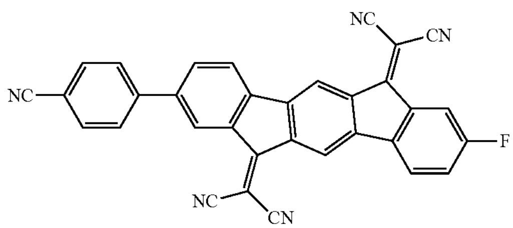
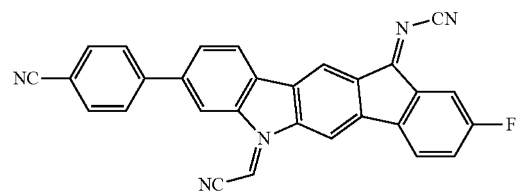
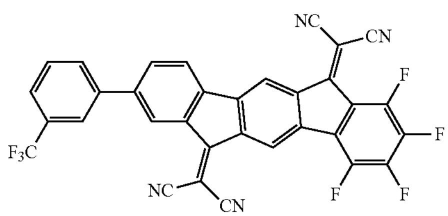
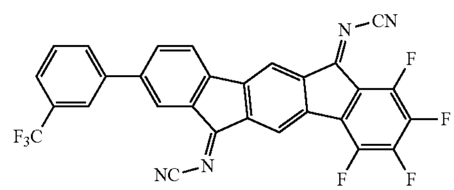
[Formula 78]
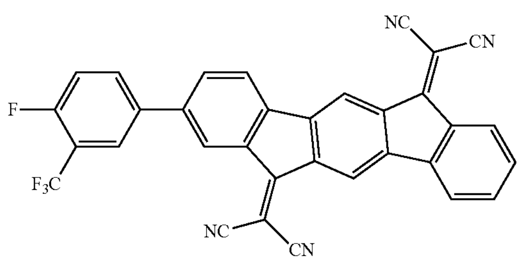
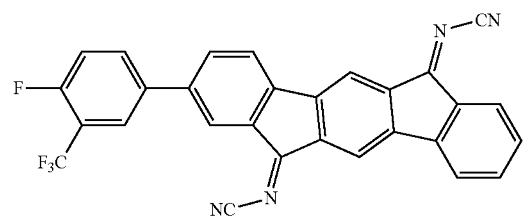
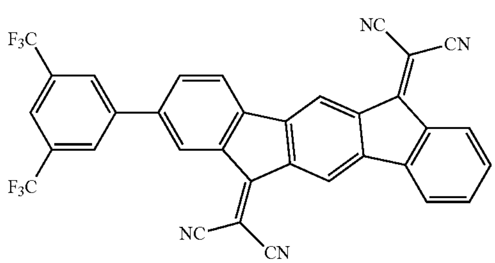
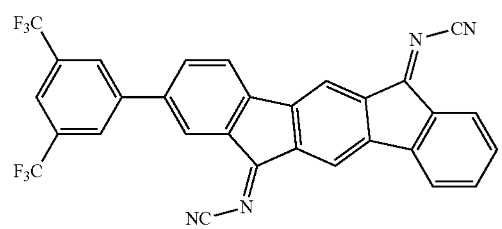
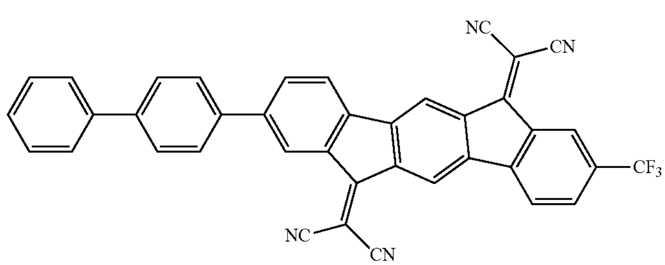
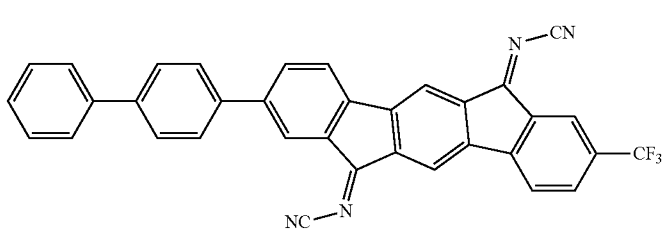

-continued
[Formula 79]
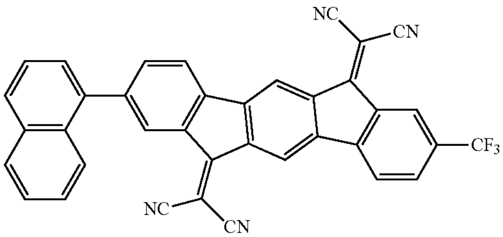
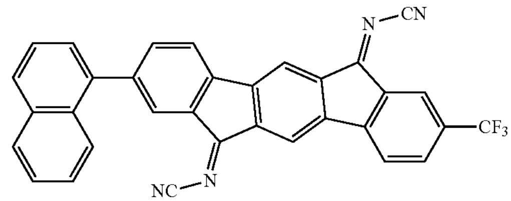
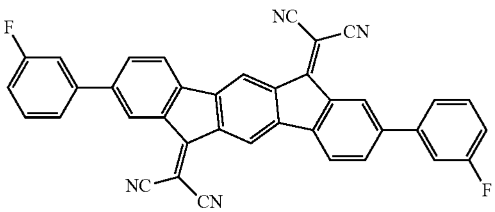
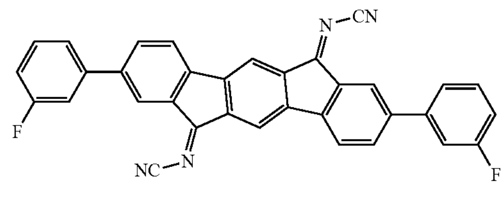
[Formula 80]
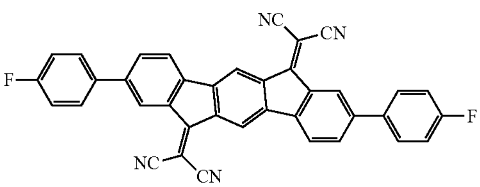
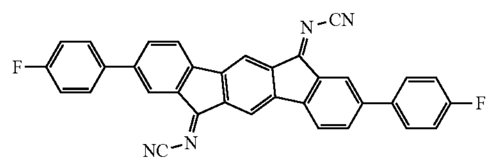
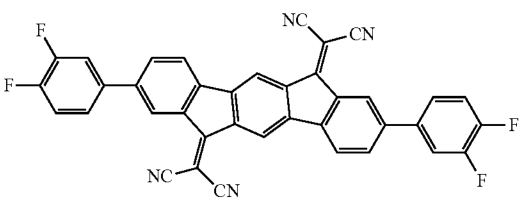
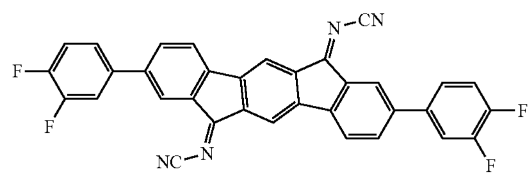
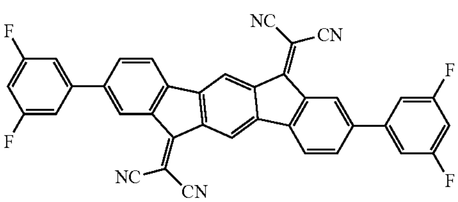
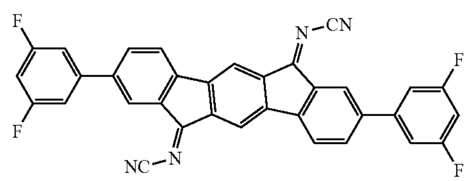
[Formula 81]
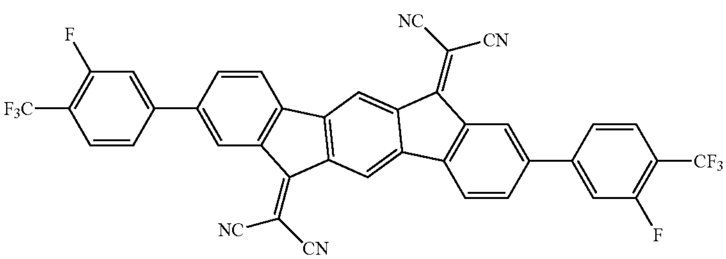
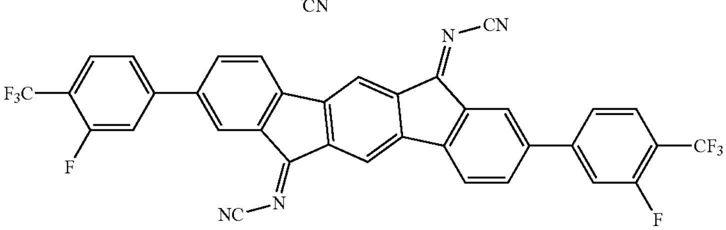

-continued
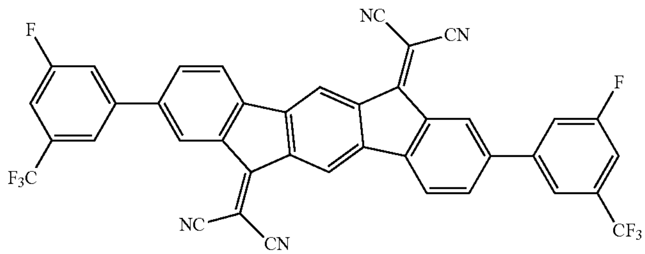
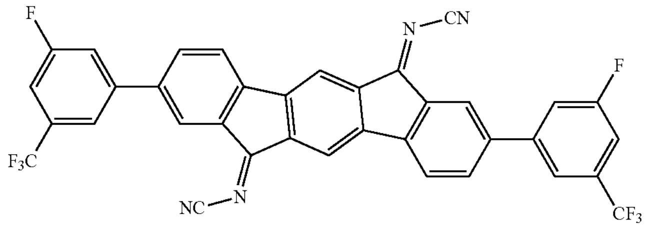
[Formula 82]
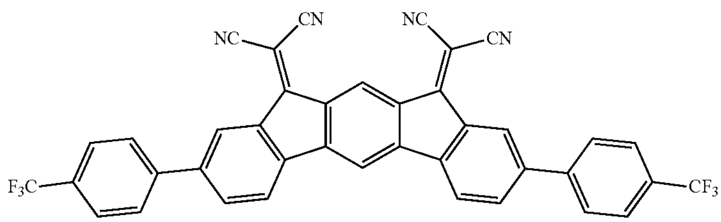
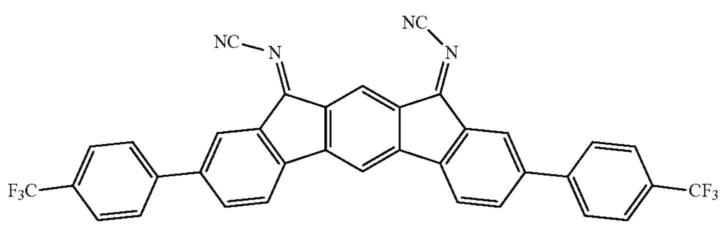
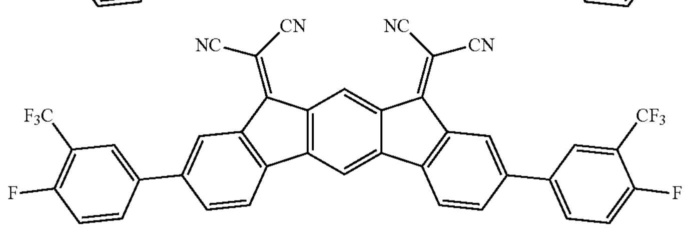
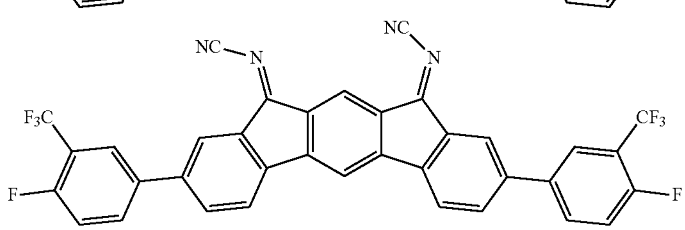
[Formula 83]
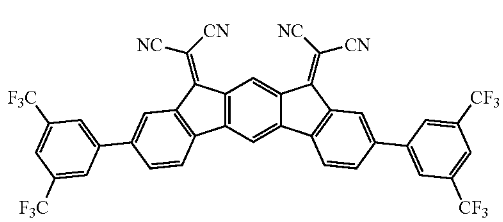
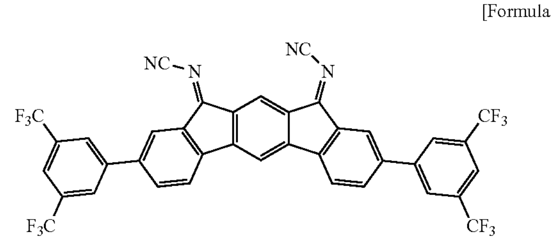

-continued
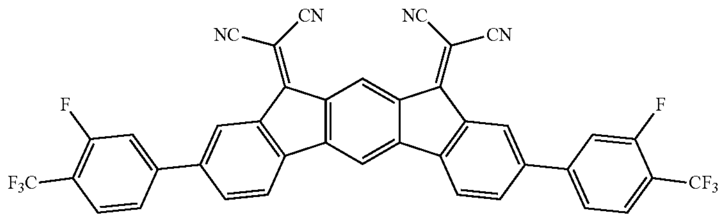
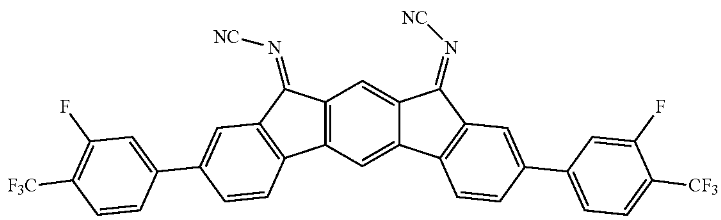
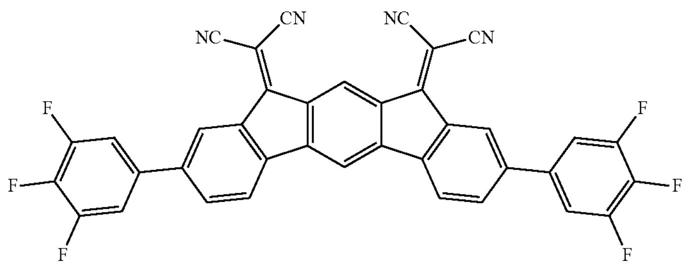
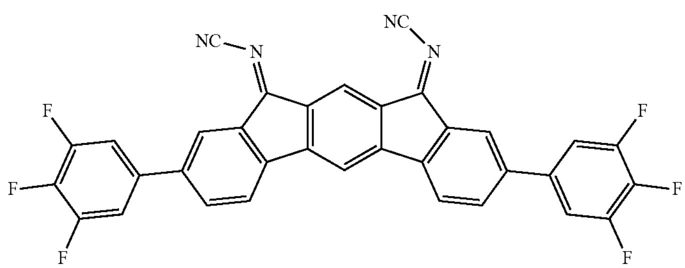
[Formula 84]
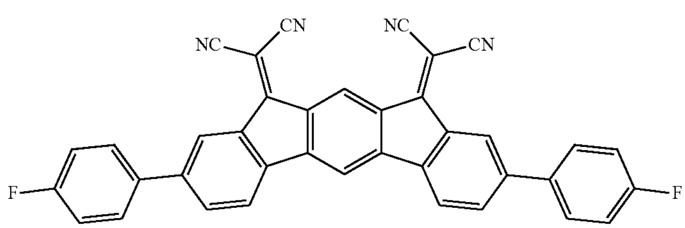
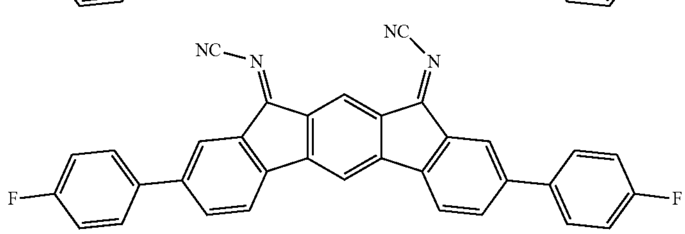
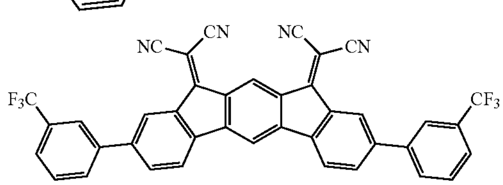
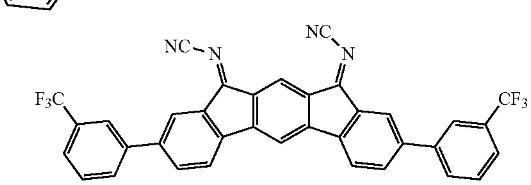

-continued
[Formula 85]
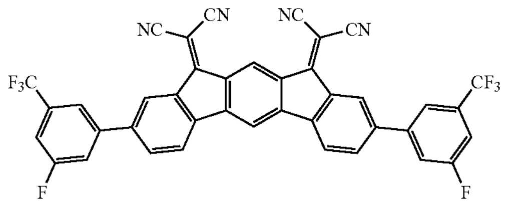
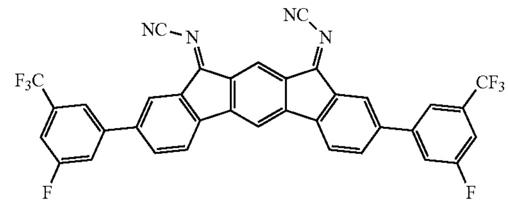
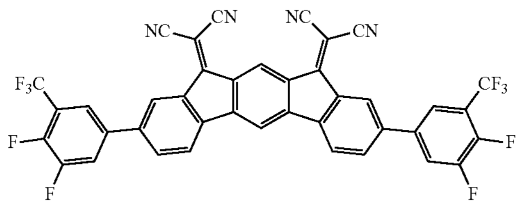
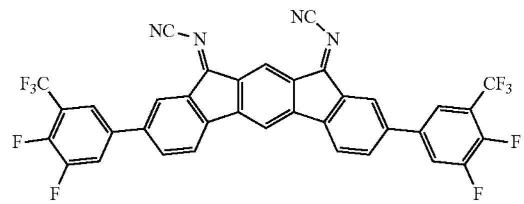
[Formula 86]
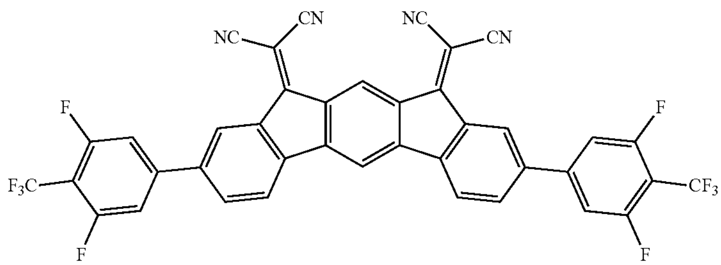
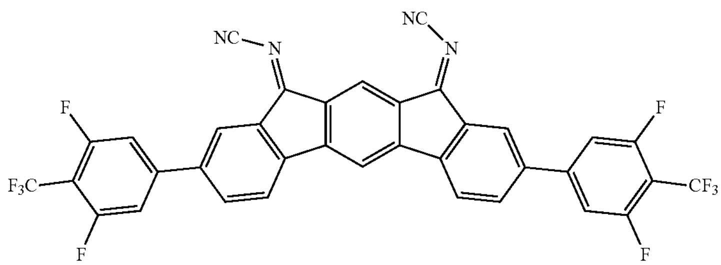
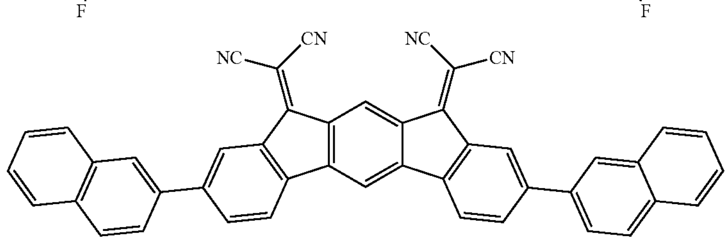
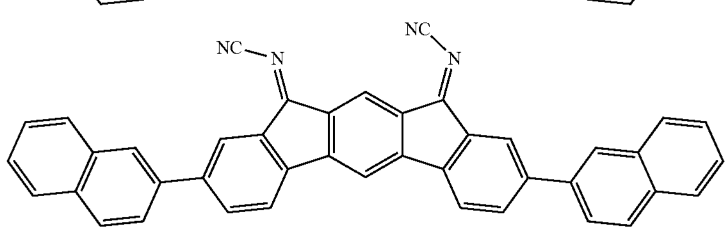
[Formula 87]
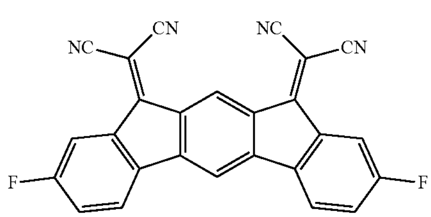
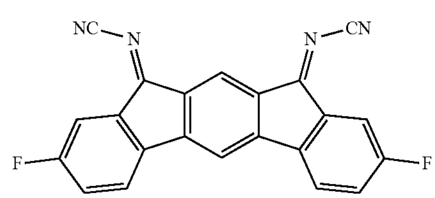

-continued
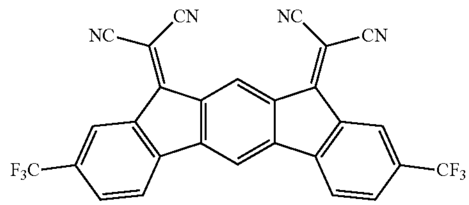
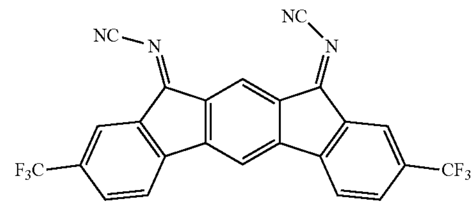
[Formula 88]
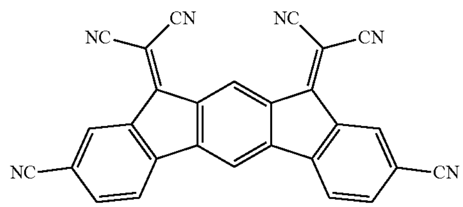
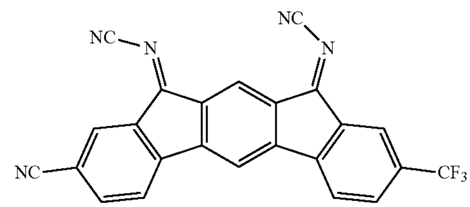
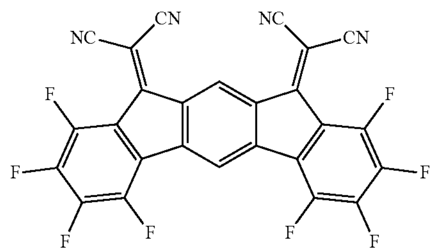
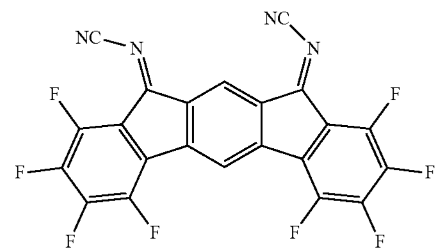
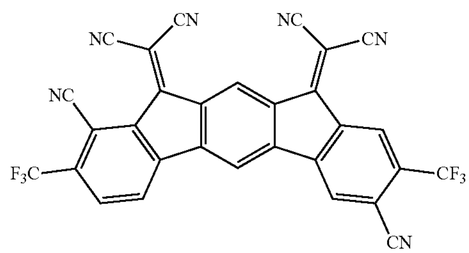
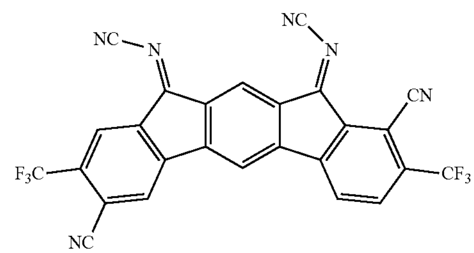
[Formula 89]
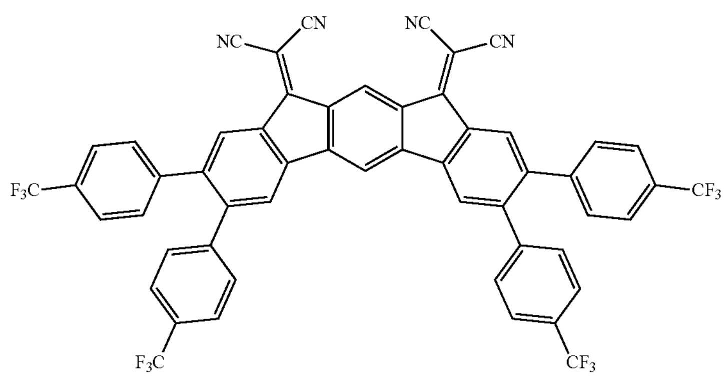
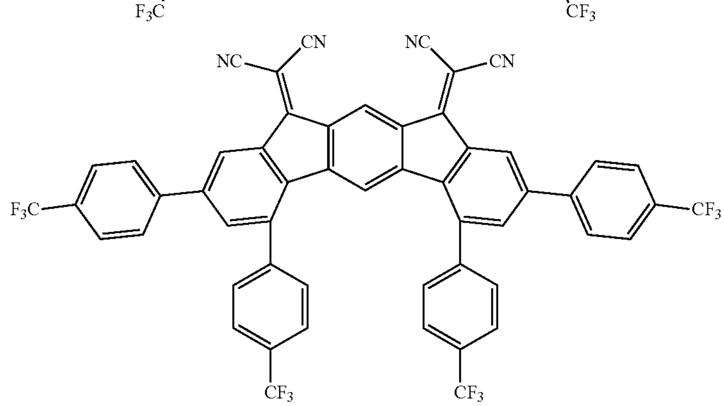

-continued
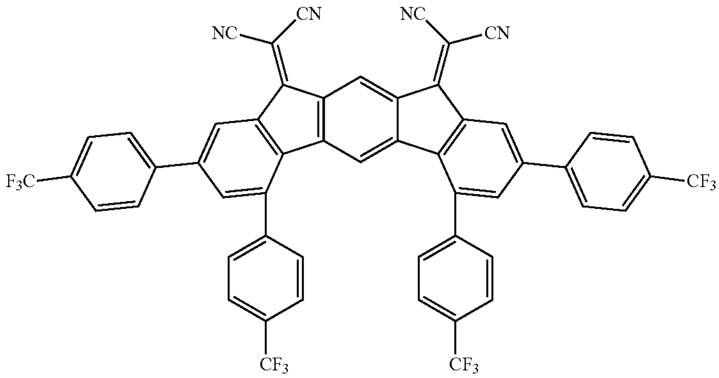
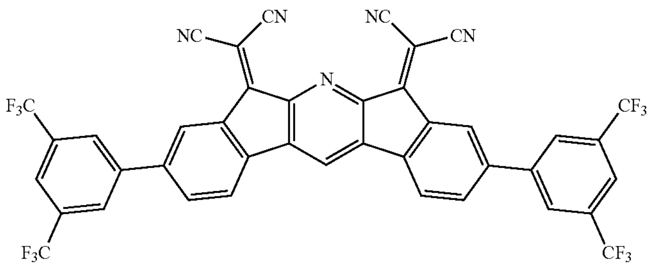
[Formula 90]
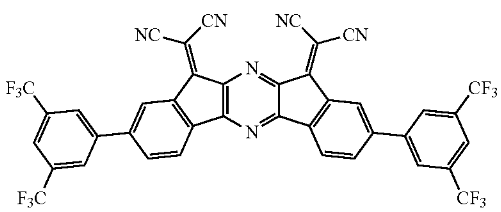
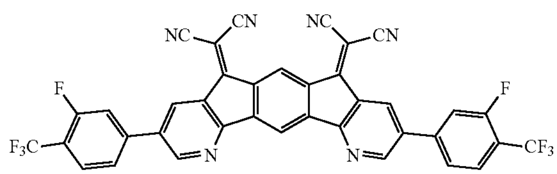
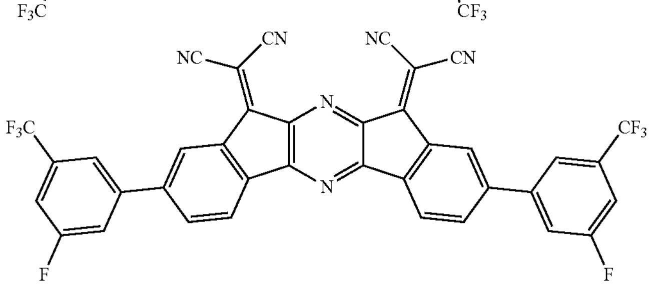
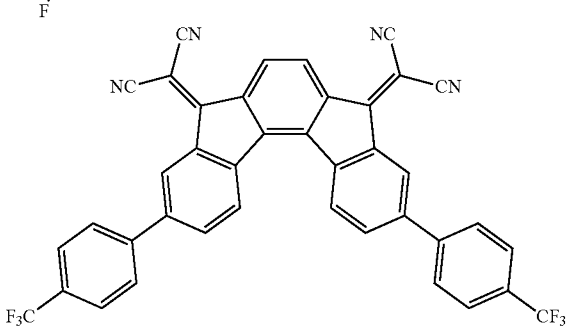
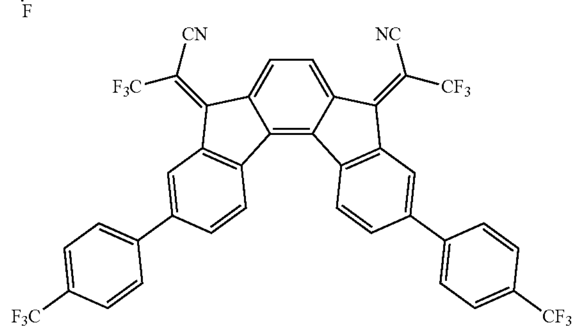
[Formula 91]
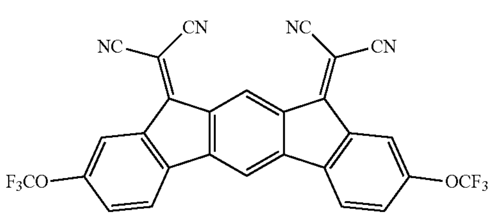
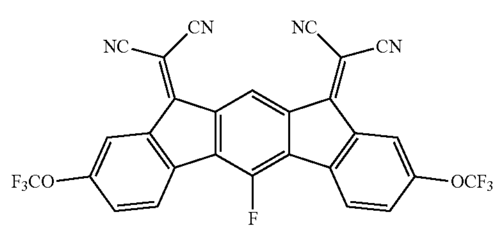

-continued
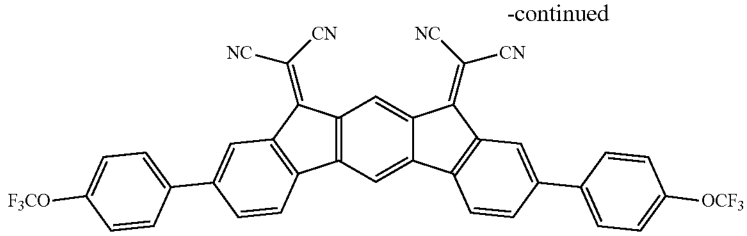
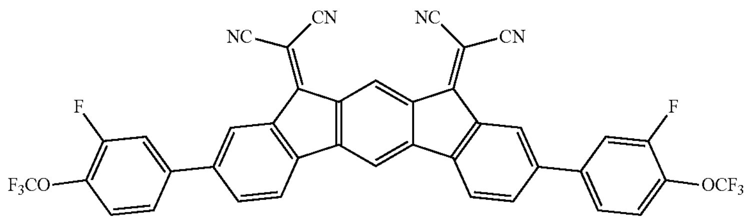
[Formula 92]
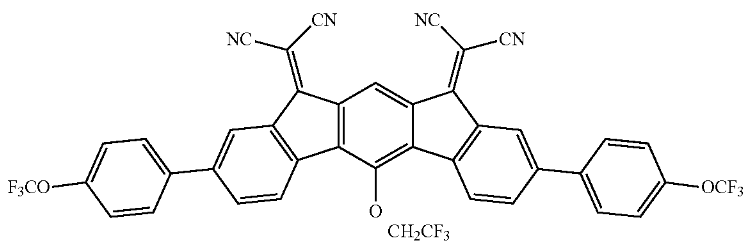
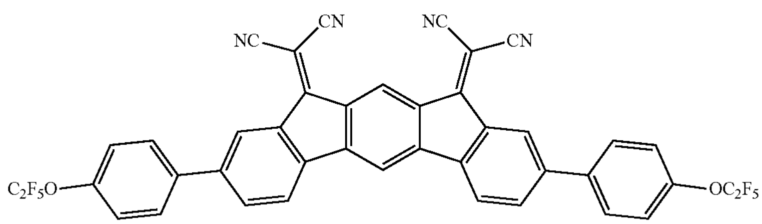
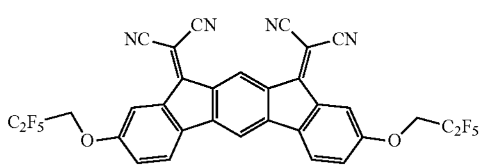
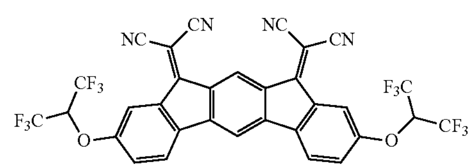
[Formula 93]
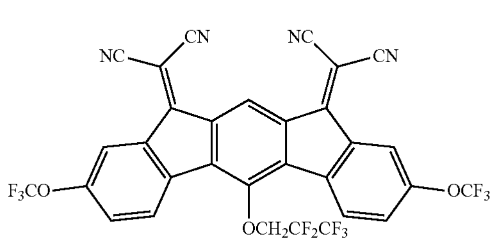
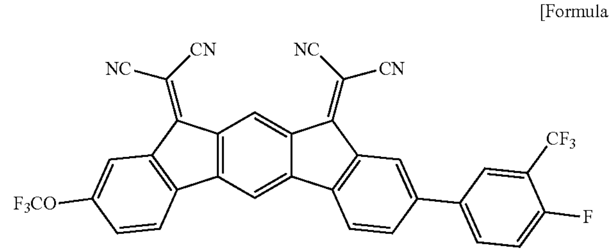
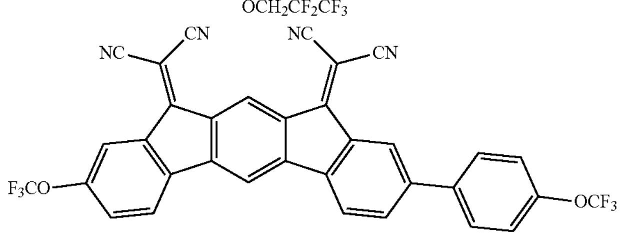
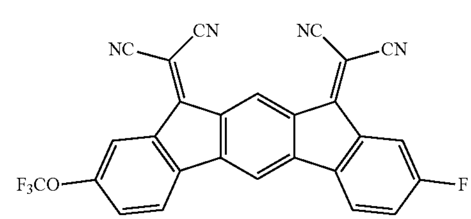

-continued
[Formula 94]
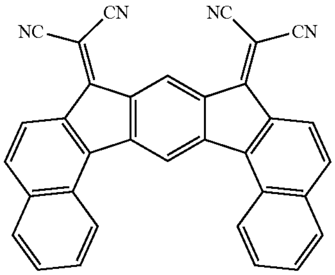
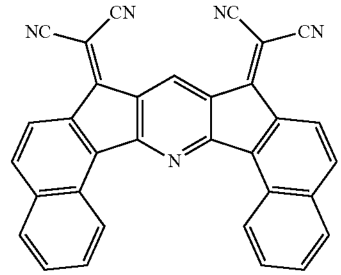
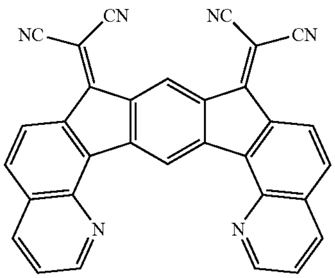
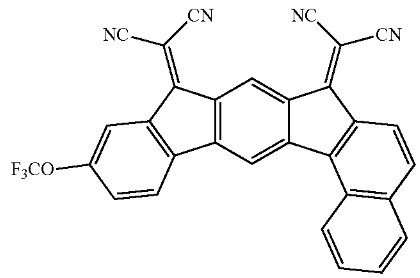
[Formula 95]
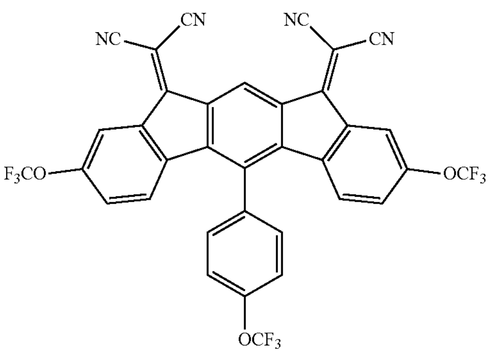
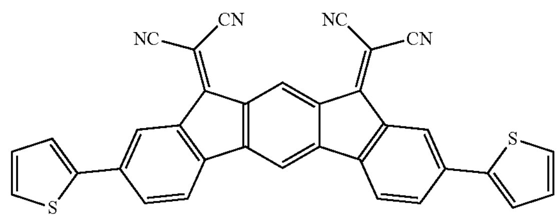
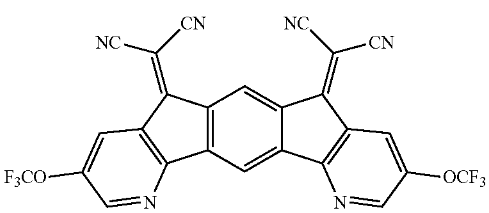
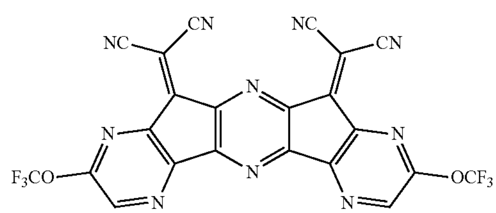
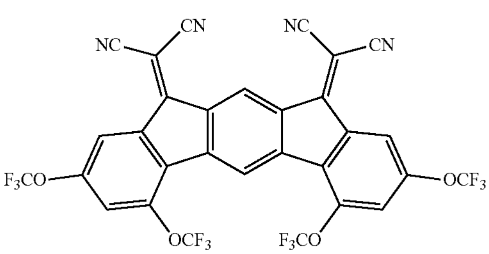
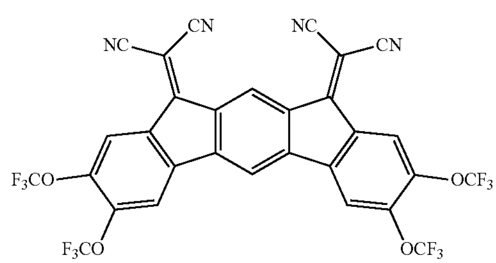

-continued

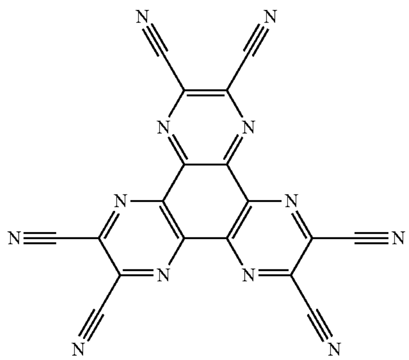

[Formula 95]

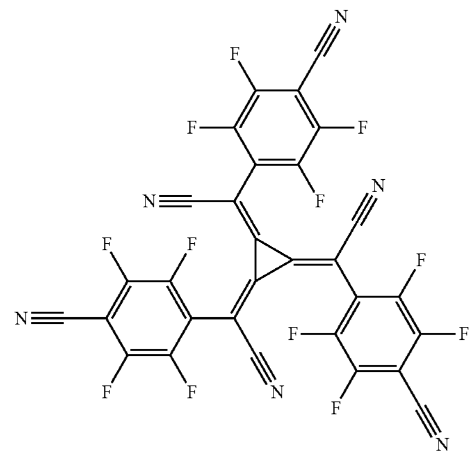

Second Compound

The second compound is a compound represented by a formula (21) and a compound represented by a formula (22). It should be noted that the mixture according to the present exemplary embodiment may contain a single kind of the second compound or a plurality of kinds of the second compound.

[Formula 97]

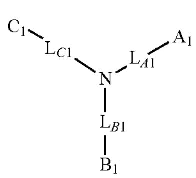

(21)

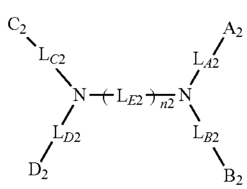

(22)

In the formulae (21) and (22), $L_{A1}$, $L_{B1}$, $L_{C1}$, $L_{A2}$, $L_{B2}$, $L_{C2}$ and $L_{D2}$ are each independently a single bond, a substituted or unsubstituted arylene group having 6 to 50 ring carbon atoms, or a substituted or unsubstituted divalent heterocyclic group having 5 to 50 ring atoms.

n2 is 1, 2, 3 or 4.

When n2 is 1, $L_{E2}$ represents a substituted or unsubstituted arylene group having 6 to 50 ring carbon atoms, or a substituted or unsubstituted divalent heterocyclic group having 5 to 50 ring atoms.

When n2 is 2, 3 or 4, a plurality of $L_{E2}$ are mutually the same or different.

When n2 is 2, 3 or 4, the plurality of $L_{E2}$ are mutually bonded to form a substituted or unsubstituted monocyclic ring, mutually bonded to form a substituted or unsubstituted fused ring, or not mutually bonded.

$L_{E2}$ forming neither the monocyclic ring nor the fused ring represents a substituted or unsubstituted arylene group having 6 to 50 ring carbon atoms, or a substituted or unsubstituted divalent heterocyclic group having 5 to 50 ring atoms.

$A_1$, $B_1$, $C_1$, $A_2$, $B_2$, $C_2$ and $D_2$ are each independently a substituted or unsubstituted aryl group having 6 to 50 ring carbon atoms, a substituted or unsubstituted heterocyclic group having 5 to 50 ring atoms, or —Si($R'_{901}$)($R'_{902}$)($R'_{903}$).

$R'_{901}$, $R'_{902}$ and $R'_{903}$ are each independently a substituted or unsubstituted aryl group having 6 to 50 ring carbon atoms.

When a plurality of $R'_{901}$ are present, the plurality of $R'_{901}$ are mutually the same or different.

When a plurality of $R'_{902}$ are present, the plurality of $R'_{902}$ are mutually the same or different.

When a plurality of $R'_{903}$ are present, the plurality of $R'_{903}$ are mutually the same or different.

In the mixture according to the present exemplary embodiment, a first amino group represented by a formula (22A) and a second amino represented by a formula (22B) in the formula (22) are preferably mutually different groups.

[Formula 98]

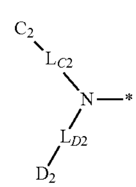

(22A)

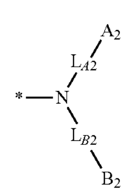

(22B)

In the formulae (22A) and (22B), $L_{A2}$, $L_{B2}$, $L_{C2}$ and $L_{D2}$ each independently represent the same as $L_{A2}$, $L_{B2}$, $L_{C2}$ and $L_{D2}$ in the formula (22).

$A_2$, $B_2$, $C_2$ and $D_2$ each independently represent the same as $A_2$, $B_2$, $C_2$ and $D_2$ in the formula (22).

* each represents a bonding position to $L_{E2}$.

In the second compound according to the present exemplary embodiment, at least one of $A_1$, $B_1$ and $C_1$ is preferably a group selected from the group consisting of groups represented by formulae (21a), (21b), (21c) and (21d).

In the second compound according to the present exemplary embodiment, at least one of $A_2$, $B_2$, $C_2$ and $D_2$ is also preferably a group selected from the group consisting of groups represented by the formulae (21a), (21b), (21c) and (21d).

[Formula 99]

(21a)

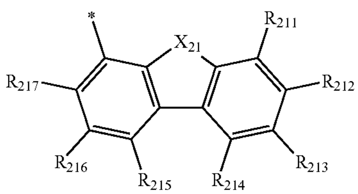

(21b)

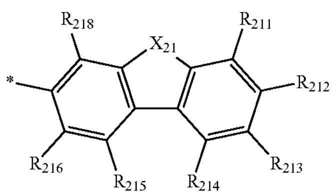

(21c)

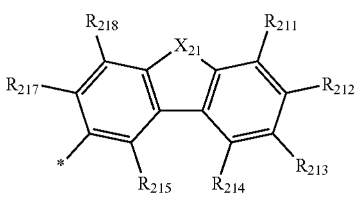

(21d)

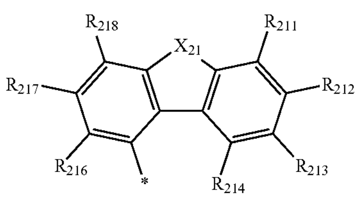

In the formulae (21a), (21b), (21c) and (21d); $X_{21}$ is $NR_{21}$, $CR_{22}R_{23}$, an oxygen atom or a sulfur atom; when a plurality of $X_{21}$ are present, the plurality of $X_{21}$ are mutually the same or different; when $X_{21}$ is $CR_{22}R_{23}$, a combination of $R_{22}$ and $R_{23}$ is mutually bonded to form a substituted or unsubstituted monocyclic ring, mutually bonded to form a substituted or unsubstituted fused ring, or not mutually bonded;

$R_{21}$, and $R_{22}$ and $R_{23}$ not forming the monocyclic ring and not forming the fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms.

At least one combination of adjacent two or more of $R_{211}$ to $R_{218}$ are mutually bonded to form a substituted or unsubstituted monocyclic ring, mutually bonded to form a substituted or unsubstituted fused ring; or not mutually bonded.

$R_{211}$ to $R_{218}$ not forming the monocyclic ring and not forming the fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms.

* in the formula (21a), (21b), (21c), and (21d) each independently are a bonding position to $L_{A1}$, $L_{B1}$, $L_{C1}$, $L_{A2}$, $L_{B2}$, $L_{C2}$, $L_{D2}$, or $L_{E2}$.

In the second compound of the present exemplary embodiment, a combination of adjacent two or more of $R_{211}$ to $R_{218}$ are not mutually bonded.

$R_{211}$ to $R_{218}$ are preferably each independently a hydrogen atom, a substituted or unsubstituted alkyl group having 1 to 30 carbon atoms, a substituted or unsubstituted cycloalkyl group having 3 to 30 ring carbon atoms, a substituted or unsubstituted aryl group having 6 to 30 ring carbon atoms, or a substituted or unsubstituted heterocyclic group having 5 to 30 ring atoms.

More preferably, $R_{211}$ to $R_{218}$ are hydrogen atoms.

The second compound is preferably a compound represented by a formula (211).

[Formula 100]

(211)

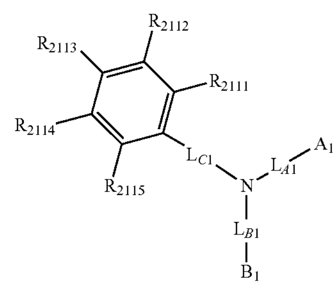

In the formula (211): $L_{A1}$, $L_{B1}$ and $L_{C1}$ are each independently a single bond, a substituted or unsubstituted arylene group having 6 to 50 ring carbon atoms, or a substituted or unsubstituted divalent heterocyclic group having 5 to 50 ring atoms.

$A_1$ and $B_1$ are each independently a substituted or unsubstituted aryl group having 6 to 50 ring carbon atoms, a substituted or unsubstituted heterocyclic group having 5 to 50 ring atoms, or —Si($R'_{901}$)($R'_{902}$)($R'_{903}$).

$R'_{901}$, $R'_{902}$ and $R'_{903}$ represent the same as $R'_{901}$, $R'_{902}$ and $R'_{903}$ in the formula (21).

At least one combination of adjacent two or more of $R_{2111}$ to $R_{2115}$ is mutually bonded to form a substituted or unsubstituted monocyclic ring, mutually bonded to form a substituted or unsubstituted fused ring; or not mutually bonded.

$R_{2111}$ to $R_{2115}$ not forming the monocyclic ring and not forming the fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —N($R_{906}$)($R_{907}$), a substituted or unsubstituted aryl group having 6 to 50 ring carbon atoms, or a substituted or unsubstituted heterocyclic group having 5 to 50 ring atoms.

In the second compound of the present exemplary embodiment, $A_1$ and $B_1$ are preferably each independently selected from the group consisting of the groups represented by the formulae (21a), (21b), (21c) and (21d).

In the second compound of the present exemplary embodiment, $L_{A1}$, $L_{B1}$ and $L_{C1}$ are preferably each independently a single bond, a substituted or unsubstituted arylene group having 6 to 30 ring carbon atoms, or a substituted or unsubstituted divalent heterocyclic group having 5 to 30 ring atoms.

The second compound of the present exemplary embodiment is also preferably a compound represented by a formula (221).

[Formula 101]

(221)

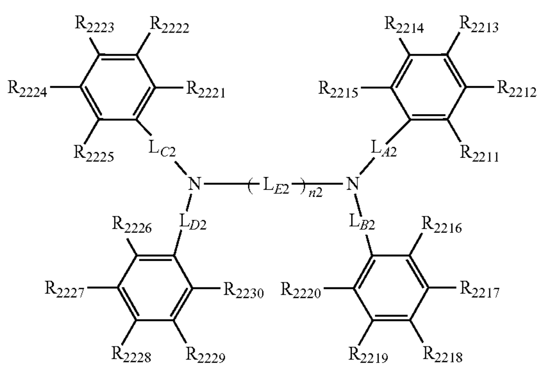

In the formula (221): $L_{A2}$, $L_{B2}$, $L_{C2}$, $L_{D2}$ and $L_{E2}$ are each independently a single bond, a substituted or unsubstituted arylene group having 6 to 50 ring carbon atoms, or a substituted or unsubstituted divalent heterocyclic group having 5 to 50 ring atoms.

n2 is 1, 2, 3 or 4.

When n2 is 2, 3 or 4, a plurality of $L_{E2}$ are mutually the same or different. At least one combination of adjacent two or more of $R_{2211}$ to $R_{2230}$ is mutually bonded to form a substituted or unsubstituted monocyclic ring, mutually bonded to form a substituted or unsubstituted fused ring; or not mutually bonded.

$R_{2211}$ to $R_{2230}$ not forming the monocyclic ring and not forming the fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —N($R_{906}$)($R_{907}$), a substituted or unsubstituted aryl group having 6 to 50 ring carbon atoms, or a substituted or unsubstituted heterocyclic group having 5 to 50 ring atoms.

In the mixture of the present exemplary embodiment, a first amino group represented by a formula (221A) and a second amino group represented by a formula (221B) in the formula (221) are preferably mutually different groups.

[Formula 102]

(221A)

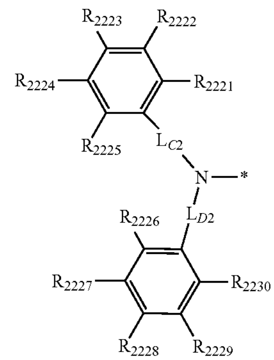

(221B)

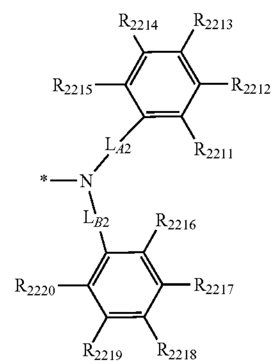

In the formulae (221A) and (221B): $R_{2211}$ to $R_{2230}$ each independently represent the same as $R_{2211}$ to $R_{2230}$ in the formula (221); $L_{A2}$, $L_{B2}$, $L_{C2}$ and $L_{D2}$ each independently represent the same as $L_{A2}$, $L_{B2}$, $L_{C2}$ and $L_{D2}$ in the formula (22); and * each represents a bonding position to $L_{E2}$.

In the mixture of the present exemplary embodiment, it is also preferable that the second compound has at least one substituted or unsubstituted biphenyl group in a molecule.

It is also preferable that the mixture of the present exemplary embodiment does not contain a compound represented by a formula (2210) and a compound represented by a formula (2211).

[Formula 103]

(2210)

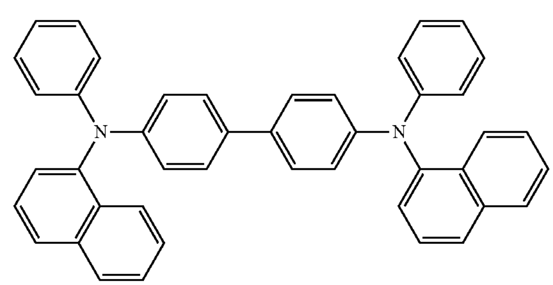

-continued (2211)

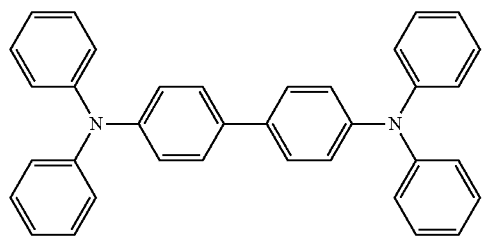

In the second compound of the present exemplary embodiment, it is preferable that $L_{A2}$, $L_{B2}$, $L_{C2}$ and $L_{D2}$ are each independently a single bond, a substituted or unsubstituted arylene group having 6 to 30 ring carbon atoms, or a substituted or unsubstituted divalent heterocyclic group having 5 to 30 ring atoms.

In the second compound of the present exemplary embodiment, it is preferable that $L_{E2}$ is a substituted or unsubstituted arylene group having 6 to 30 ring carbon atoms, or a substituted or unsubstituted divalent heterocyclic group having 5 to 30 ring atoms.

In the second compound of the present exemplary embodiment, a combination of adjacent two or more of $R_{2211}$ to $R_{2230}$ are not mutually bonded.

$R_{2211}$ to $R_{2230}$ are preferably each independently a hydrogen atom, a substituted or unsubstituted alkyl group having 1 to 30 carbon atoms, a substituted or unsubstituted cycloalkyl group having 3 to 30 ring carbon atoms, a substituted or unsubstituted aryl group having 6 to 30 ring carbon atoms, or a substituted or unsubstituted heterocyclic group having 5 to 30 ring atoms.

More preferably, $R_{2211}$ to $R_{2230}$ are hydrogen atoms.

In an exemplary embodiment, the compound represented by the formula (21) is a compound represented by a formula (212).

[Formula 104]

(212)

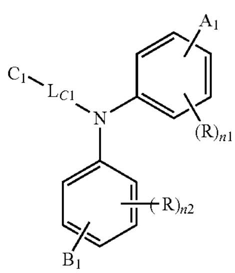

In the formula (212): $L_{C1}$, $A_1$, $B_1$ and $C_1$ each represent the same as those in the formula (21).

n1 and n2 are each independently 0, 1, 2, 3 or 4.

When a plurality of R are present, the plurality of R are mutually the same or different.

When a plurality of R are present, at least one combination of adjacent two or more of the plurality of R is mutually bonded to form a substituted or unsubstituted monocyclic ring, mutually bonded to form a substituted or unsubstituted fused ring, or not mutually bonded.

R not forming the monocyclic ring and not forming the fused ring is a cyano group, a substituted or unsubstituted alkyl group having 1 to 50 carbon atoms, a substituted or unsubstituted cycloalkyl group having 3 to 50 ring carbon atoms, —$Si(R_{901})(R_{902})(R_{903})$, —O—$(R_{904})$, a substituted or unsubstituted aryl group having 6 to 50 ring carbon atoms, or a substituted or unsubstituted heterocyclic group having 5 to 50 ring atoms.

In an exemplary embodiment, two of $A_1$, $B_1$ and $C_1$ in the formula (21) or (212) are groups represented by a formula (Y). The two groups represented by the formula (Y) are mutually the same or different.

[Formula 105]

(Y)

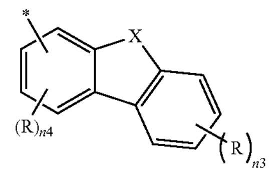

In the formula (Y): X is $NR_{51}$, $CR_{52}R_{53}$, an oxygen atom, or a sulfur atom.

When X is $CR_{52}R_{53}$, a combination of $R_{52}$ and $R_{53}$ is mutually bonded to form a substituted or unsubstituted monocyclic ring, mutually bonded to form a substituted or unsubstituted fused ring, or not mutually bonded.

$R_{51}$, and $R_{52}$ and $R_{53}$ not forming the monocyclic ring and not forming the fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, —$Si(R_{901})(R_{902})(R_{903})$, —O—$(R_{904})$, a substituted or unsubstituted aryl group having 6 to 50 ring carbon atoms, or a substituted or unsubstituted heterocyclic group having 5 to 50 ring atoms.

n3 is 0, 1, 2, 3 or 4.

n4 is 0, 1, 2 or 3.

When a plurality of R are present, the plurality of R are mutually the same or different.

When a plurality of R are present, at least one combination of adjacent two or more of the plurality of R is mutually bonded to form a substituted or unsubstituted monocyclic ring, mutually bonded to form a substituted or unsubstituted fused ring, or not mutually bonded.

R not forming the monocyclic ring and not forming the fused ring is a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, —$Si(R_{901})(R_{902})(R_{903})$, —O—$(R_{904})$, a substituted or unsubstituted aryl group having 6 to 50 ring carbon atoms, or a substituted or unsubstituted heterocyclic group having 5 to 50 ring atoms.

* each independently represents a bonding position to $L_{A1}$, $L_{B1}$ or $L_{C1}$.

In an exemplary embodiment, the compound represented by the formula (21) is a compound represented by a formula (213), (214), (215) or (216).

[Formula 106]

(213)

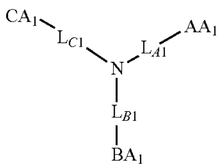

(214)

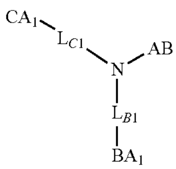

(215)

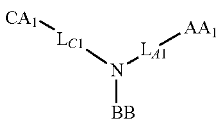

(216)

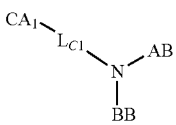

In the formulae (213) to (216), $L_{A1}$, $L_{B1}$ and $L_{C1}$ represent the same as those in the formula (21).

$CA_1$ is the group represented by the formula (Y) or a group represented by a formula (YA).

$AA_1$ and $BA_1$ are each independently groups represented by a formula (YB).

AB and BB are each independently the group represented by the formula (Y).

[Formula 107]

(YA)

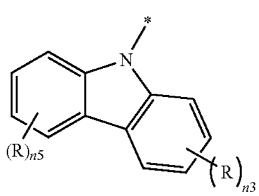

(YB)

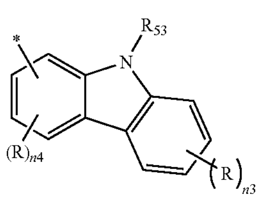

In the formulae (YA) and (YB), n3 is 0, 1, 2, 3 or 4; n4 is 0, 1, 2 or 3; n5 is 0, 1, 2, 3 or 4; when a plurality of R are present, the plurality of R are mutually the same or different; when a plurality of R are present, at least one combination of adjacent two or more of the plurality of R is mutually bonded to form a substituted or unsubstituted monocyclic ring, mutually bonded to form a substituted or unsubstituted fused ring, or not mutually bonded;

R not forming the monocyclic ring and not forming the fused ring is each independently a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, —Si($R_{901}$)($R_{902}$)($R_{903}$), —O—($R_{904}$), a substituted or unsubstituted aryl group having 6 to 50 ring carbon atoms, or a substituted or unsubstituted heterocyclic group having 5 to 50 ring atoms.

$R_{53}$ is a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, —Si($R_{901}$)($R_{902}$)($R_{903}$), —O—($R_{904}$), a substituted or unsubstituted aryl group having 6 to 50 ring carbon atoms, or a substituted or unsubstituted heterocyclic group having 5 to 50 ring atoms.

* each independently represents a bonding position to $L_{A1}$, $L_{B1}$, $L_{C1}$ or a nitrogen atom in an amino group in the formulae (214) to (216).

In an exemplary embodiment, the compound represented by the formula (21) is a compound represented by a formula (217) or (218).

[Formula 108]

(217)

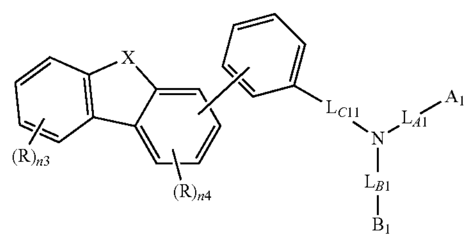

(218)

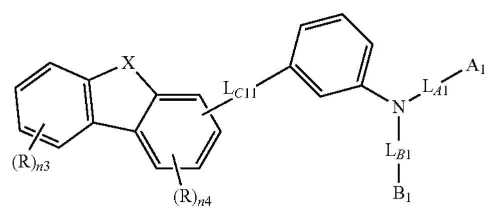

In the formulae (217) and (218): $L_{A1}$, $L_{B1}$, $A_1$ and $B_1$ each represent the same as those in the formula (21); $L_{C11}$ is a substituted or unsubstituted arylene group having 6 to 12 ring carbon atoms; X is $NR_{51}$, $CR_{52}R_{53}$, an oxygen atom, or a sulfur atom.

When X is $CR_{52}R_{53}$, a combination of $R_{52}$ and $R_{53}$ is mutually bonded to form a substituted or unsubstituted monocyclic ring, mutually bonded to form a substituted or unsubstituted fused ring, or not mutually bonded.

$R_{51}$, and $R_{52}$ and $R_{53}$ not forming the monocyclic ring and not forming the fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, —Si($R_{901}$)($R_{902}$)($R_{903}$), —O—($R_{904}$), a substituted or unsubstituted aryl group having 6 to 50 ring carbon atoms, or a substituted or unsubstituted heterocyclic group having 5 to 50 ring atoms.

n3 is 0, 1, 2, 3 or 4. n4 is 0, 1, 2 or 3.

When a plurality of R are present, the plurality of R are mutually the same or different.

When a plurality of R are present, at least one combination of adjacent two or more of the plurality of R is mutually bonded to form a substituted or unsubstituted monocyclic ring, mutually bonded to form a substituted or unsubstituted fused ring, or not mutually bonded.

R not forming the monocyclic ring and not forming the fused ring is each independently a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, —Si($R_{901}$)($R_{902}$)($R_{903}$), —O—($R_{904}$), a substituted or unsubstituted aryl group having 6 to 50 ring carbon atoms, or a substituted or unsubstituted heterocyclic group having 5 to 50 ring atoms.

In an exemplary embodiment, the compound represented by the formula (21) is a compound represented by a formula (219) or (220).

[Formula 109]

(219)

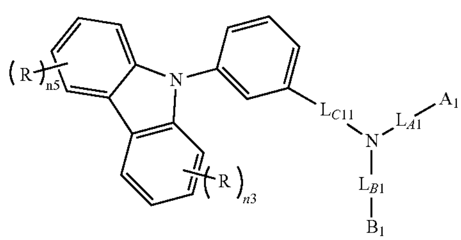

(220)

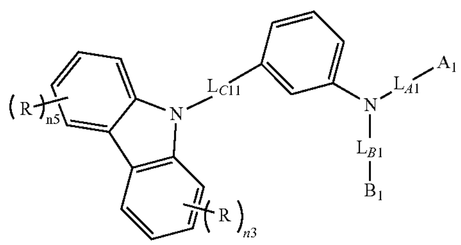

In the formulae (219) and (220): $L_{A1}$, $L_{B1}$, $A_1$ and $B_1$ each represent the same as those in the formula (21); $L_{C11}$ is a substituted or unsubstituted arylene group having 6 to 12 ring carbon atoms; n3 is 0, 1, 2, 3 or 4; and n5 is 0, 1, 2, 3 or 4.

When a plurality of R are present, the plurality of R are mutually the same or different.

When a plurality of R are present, at least one combination of adjacent two or more of the plurality of R is mutually bonded to form a substituted or unsubstituted monocyclic ring, mutually bonded to form a substituted or unsubstituted fused ring, or not mutually bonded.

R not forming the monocyclic ring and not forming the fused ring is each independently a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, —Si($R_{901}$)($R_{902}$)($R_{903}$), —O—($R_{904}$), a substituted or unsubstituted aryl group having 6 to 50 ring carbon atoms, or a substituted or unsubstituted heterocyclic group having 5 to 50 ring atoms.

In an exemplary embodiment, the compound represented by the formula (21) is a compound represented by a formula (221) or (222).

[Formula 110]

(221)

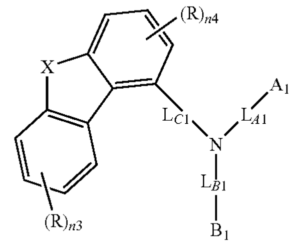

(222)

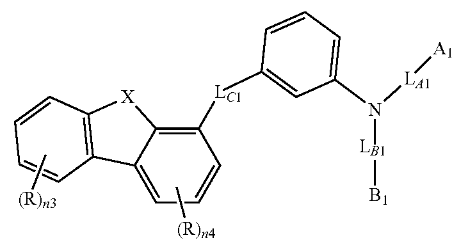

In the formulae (221) and (222): $L_{A1}$, $L_{B1}$, $L_{C1}$, $A_1$ and $B_1$ each represent the same as those in the formula (21); X is $NR_{51}$, $CR_{52}R_{53}$, an oxygen atom, or a sulfur atom.

When X is $CR_{52}R_{53}$, a combination of $R_{52}$ and $R_{53}$ is mutually bonded to form a substituted or unsubstituted monocyclic ring, mutually bonded to form a substituted or unsubstituted fused ring, or not mutually bonded.

$R_{51}$, and $R_{52}$ and $R_{53}$ not forming the monocyclic ring and not forming the fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, —Si($R_{901}$)($R_{902}$)($R_{903}$), —O—($R_{904}$), a substituted or unsubstituted aryl group having 6 to 50 ring carbon atoms, or a substituted or unsubstituted heterocyclic group having 5 to 50 ring atoms;

n3 is 0, 1, 2, 3 or 4; and n4 is 0, 1, 2 or 3.

When a plurality of R are present, the plurality of R are mutually the same or different.

When a plurality of R are present, at least one combination of adjacent two or more of the plurality of R is mutually bonded to form a substituted or unsubstituted monocyclic ring, mutually bonded to form a substituted or unsubstituted fused ring, or not mutually bonded.

R not forming the monocyclic ring and not forming the fused ring is each independently a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, —Si($R_{901}$)($R_{902}$)($R_{903}$), —O—($R_{904}$), a substituted or unsubstituted aryl group having 6 to 50 ring carbon atoms, or a substituted or unsubstituted heterocyclic group having 5 to 50 ring atoms.

In an exemplary embodiment, the compound represented by the formula (21) is represented by a formula (223) below.

[Formula 111]

(223)

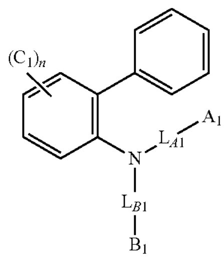

In the formula (223): $L_{A1}$, $L_{B1}$, $A_1$, $B_1$ and $C_1$ each represent the same as those in the formula (21).

$C_1$ is a substituted or unsubstituted aryl group having 6 to 50 ring carbon atoms, or a substituted or unsubstituted heterocyclic group having 5 to 50 ring atoms.

n is 0, 1 or 2.

When n is 2, two $C_1$ are mutually the same or different.

In an exemplary embodiment, the compound represented by the formula (21) is a compound represented by a formula (224).

[Formula 112]

(224)

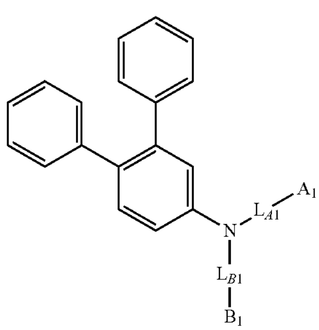

In the formula (224), $L_{A1}$, $L_{B1}$, $A_1$ and $B_1$ each represent the same as those in the formula (21).

In an exemplary embodiment, the compound represented by the formula (21) is a compound represented by a formula (225).

[Formula 113]

(225)

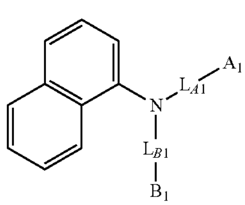

In the formula (225), $L_{A1}$, $L_{B1}$, $A_1$ and $B_1$ represents the same as those in the formula (21).

In an exemplary embodiment, $L_{A1}$, $L_{B1}$ and $L_{C1}$ are each independently an aromatic hydrocarbon ring group represented by a formula (L1) or a formula (L2).

[Formula 114]

(L1)

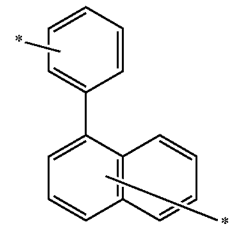

(L2)

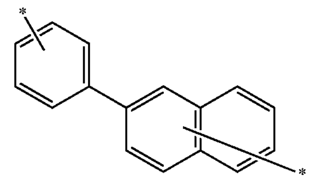

In the formulae (L1) and (L2), one of two * is a bond bonded to a nitrogen atom of an amino group in the formula (21) and the other of the two * is a bond bonded to one of $A_1$, $B_1$ and $C_1$ in the formula (21).

In an exemplary embodiment, $L_{A1}$, $L_{B1}$ and $L_{C1}$ are each independently a single bond or a substituted or unsubstituted arylene having 6 to 12 ring carbon atoms.

In an exemplary embodiment, $L_{A2}$, $L_{B2}$, $L_{C2}$ and $L_{D2}$ are each independently a single bond or a substituted or unsubstituted arylene having 6 to 12 ring carbon atoms.

In an exemplary embodiment, $L_{C1}$ is a single bond.

In an exemplary embodiment, $L_{C11}$ is a single bond.

In an exemplary embodiment, $L_{C1}$ is a phenylene group.

In an exemplary embodiment, $A_1$ and $A_2$ are a substituted or unsubstituted aryl group having 6 to 12 ring carbon atoms.

In an exemplary embodiment, $A_1$ and $A_2$ are a substituted or unsubstituted phenyl group, a substituted or unsubstituted biphenyl group, or a substituted or unsubstituted naphthyl group.

In an exemplary embodiment, $A_1$ and $A_2$ are an unsubstituted phenyl group, an unsubstituted biphenyl group, or an unsubstituted naphthyl group.

In an exemplary embodiment, $B_1$ and $B_2$ are a substituted or unsubstituted aryl group having 6 to 12 ring carbon atoms.

In an exemplary embodiment, $B_1$ and $B_2$ are a substituted or unsubstituted phenyl group, a substituted or unsubstituted biphenyl group, or a substituted or unsubstituted naphthyl group.

In an exemplary embodiment, $B_1$ and $B_2$ are an unsubstituted phenyl group, an unsubstituted biphenyl group, or an unsubstituted naphthyl group.

Method of Preparing Second Compound

The second compound according to the present exemplary embodiment can be manufactured by a known method or through a known alternative reaction using a known material(s) tailored for the target compound in accordance with the known method.

Specific Examples of Second Compound

Specific examples of the second compound according to the present exemplary embodiment is exemplified by compounds below. However, the invention is not limited to these specific examples.

[Formula 115]
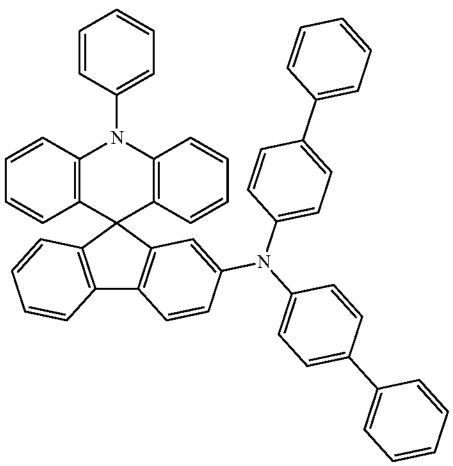
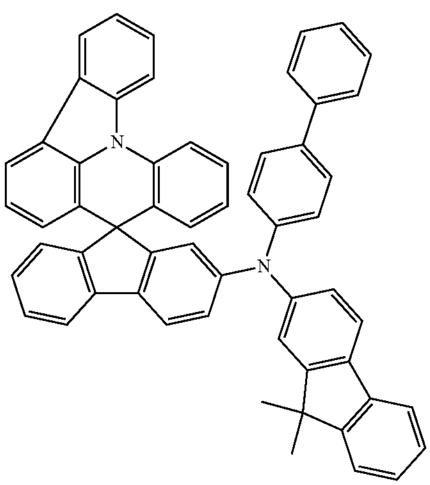
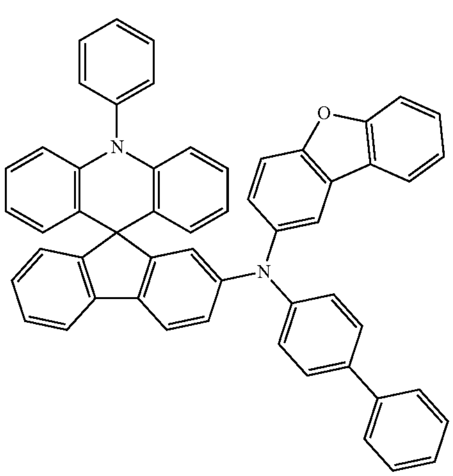
-continued
[Formula 116]
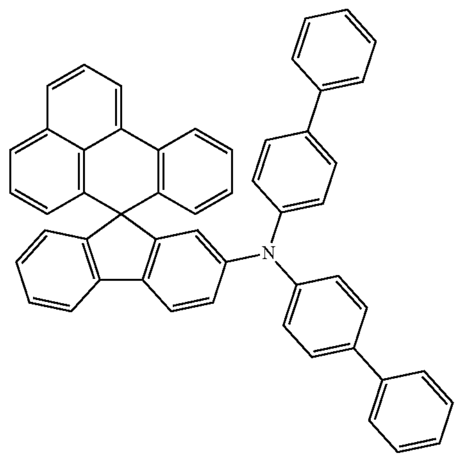
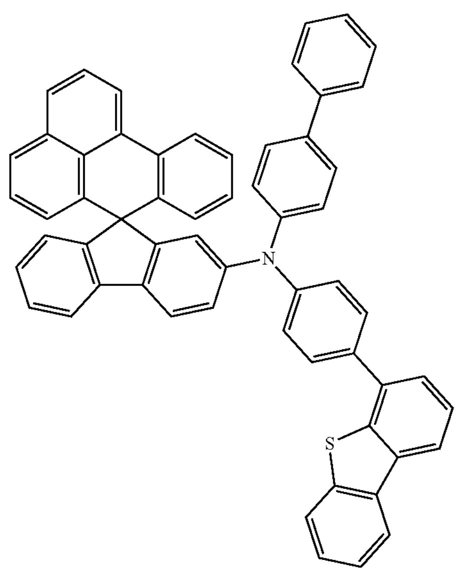
[Formula 117]
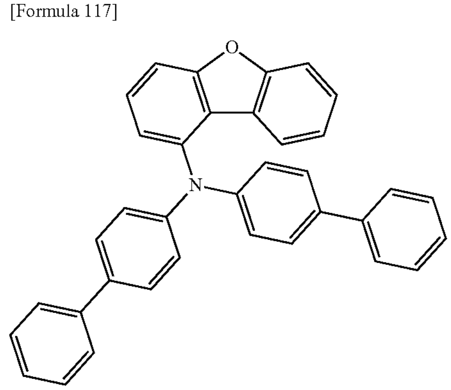

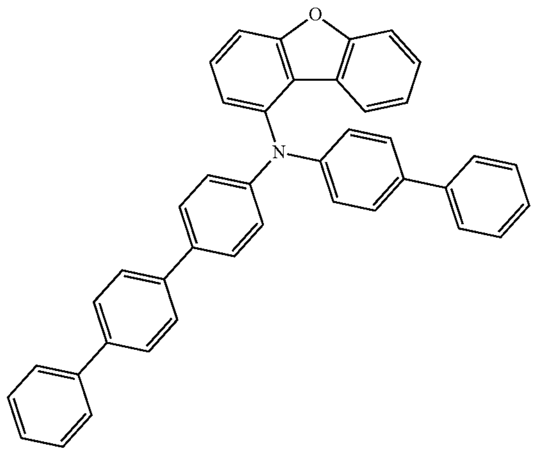
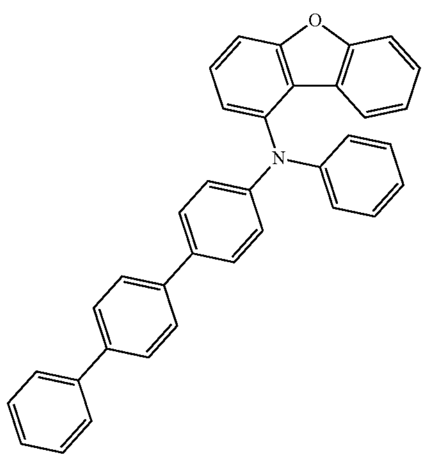
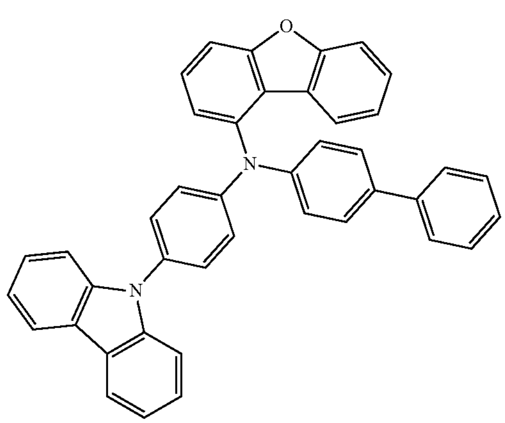
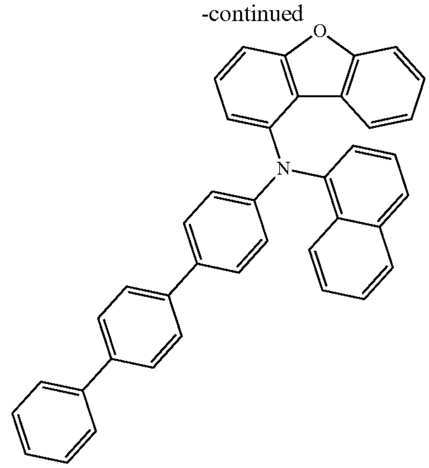
[Formula 118]
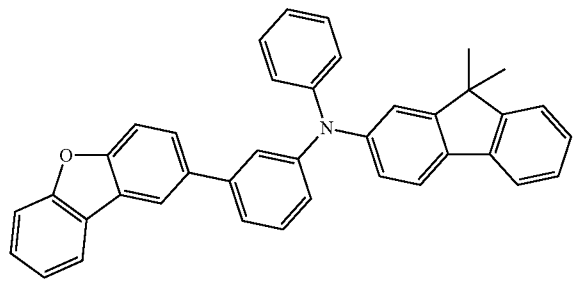
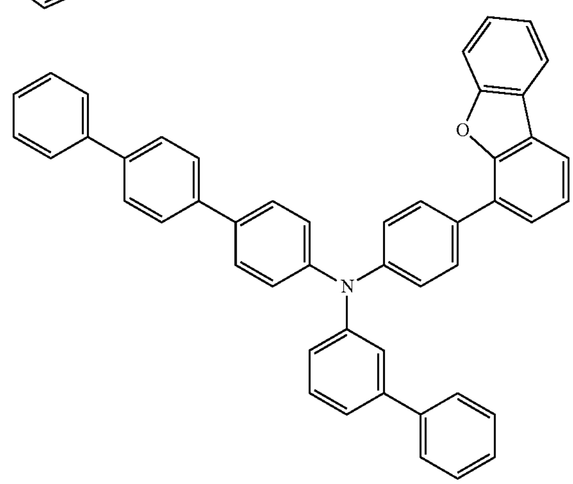
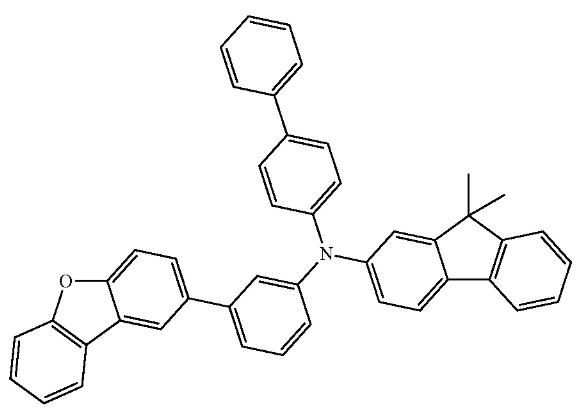

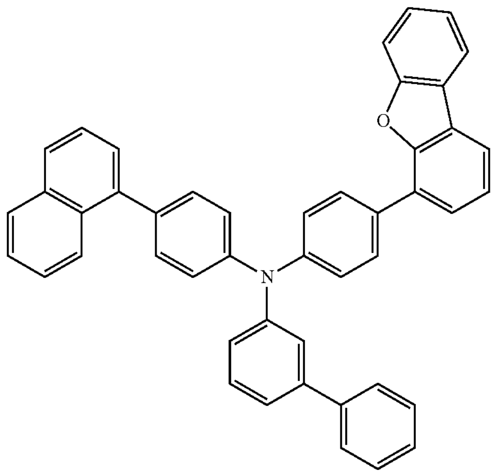
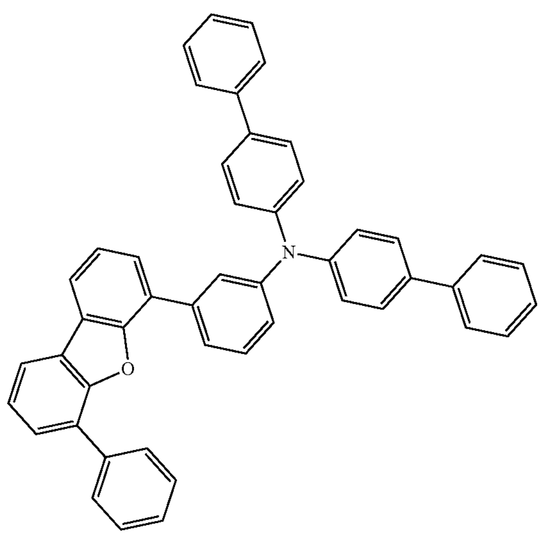
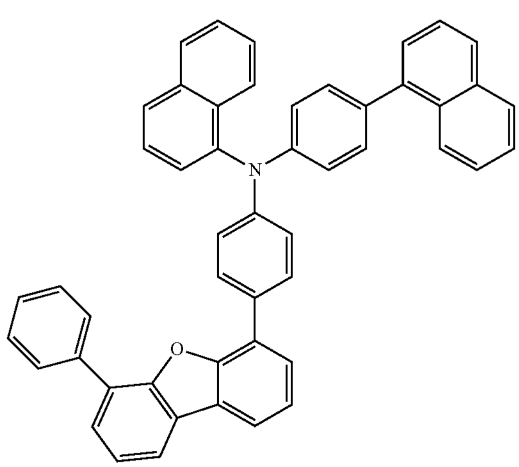
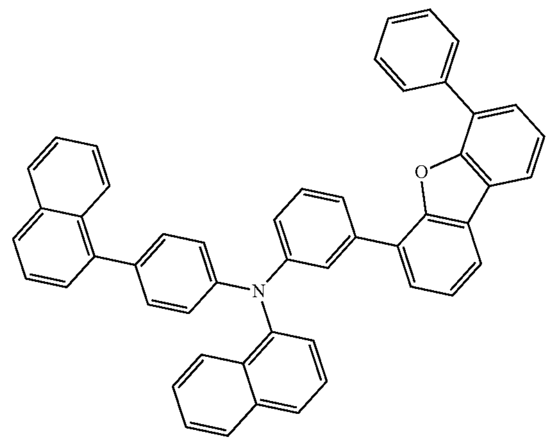
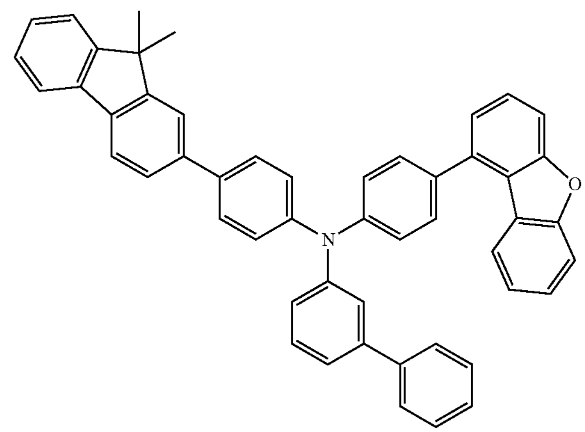
[Formula 119]
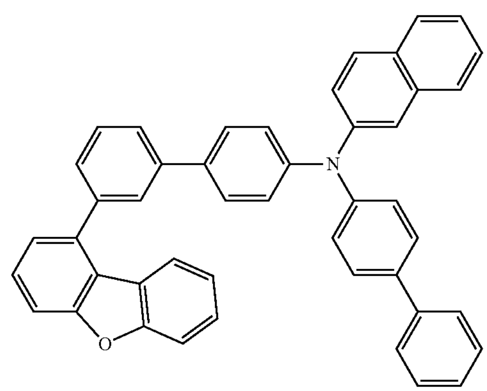
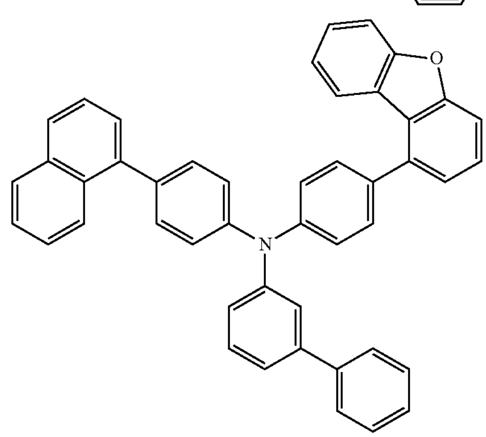

-continued
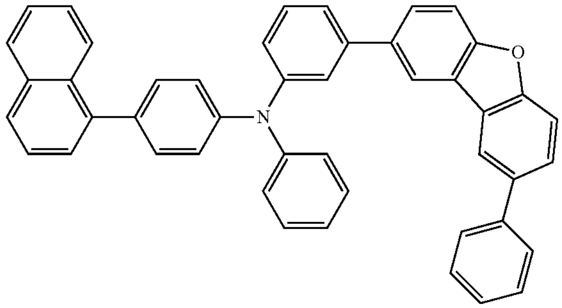
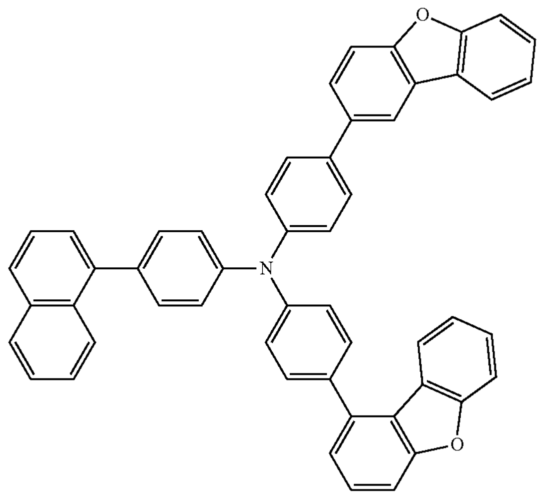
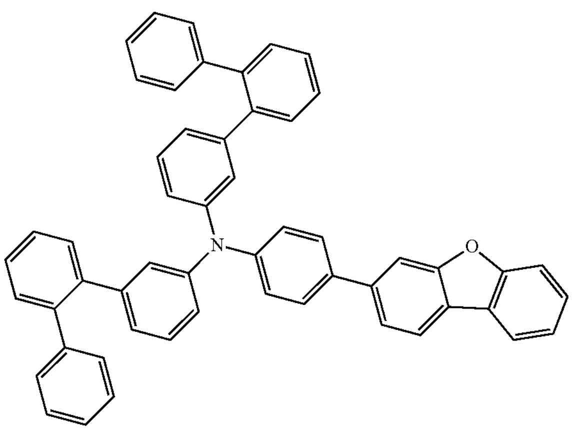
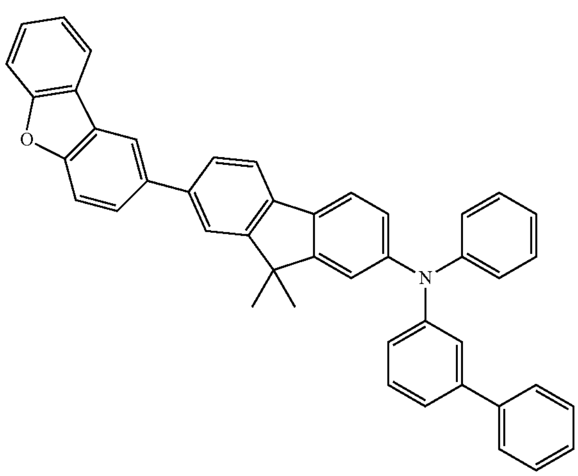
-continued
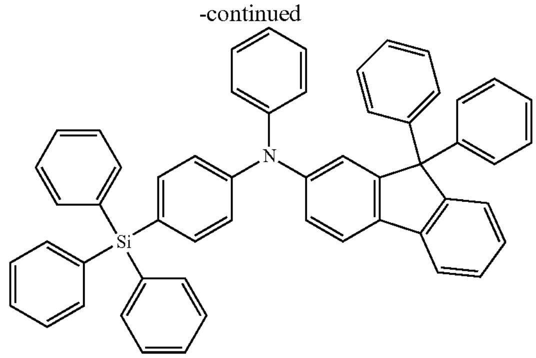
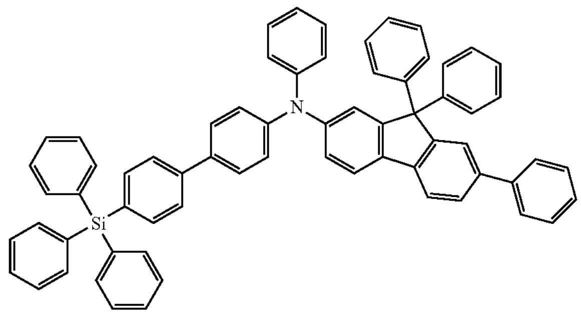
[Formula 120]
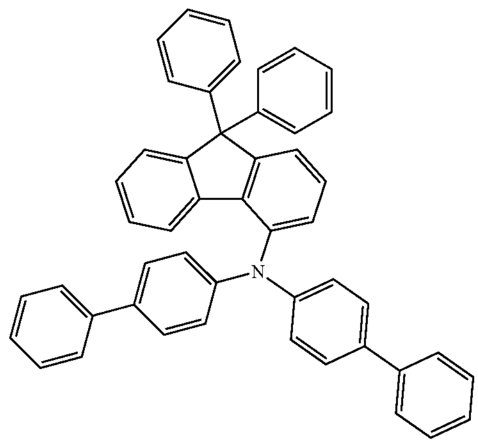
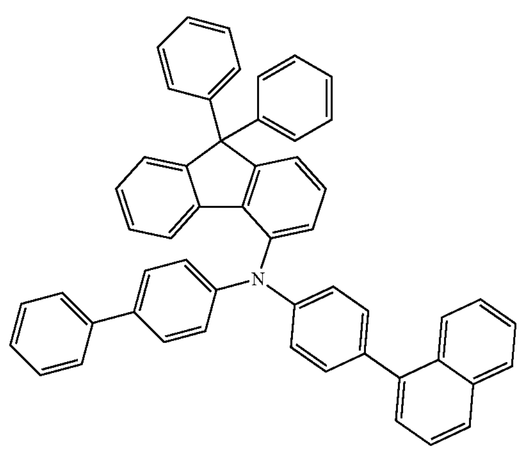

-continued
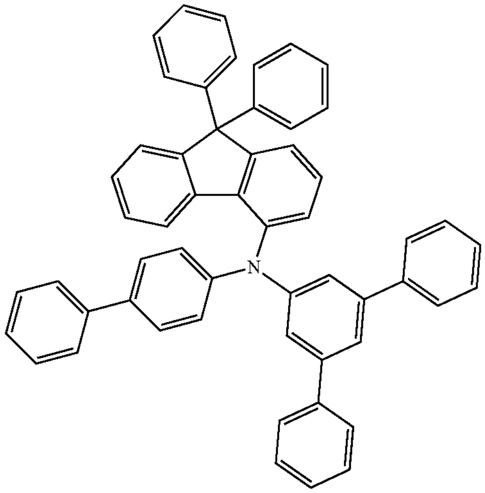
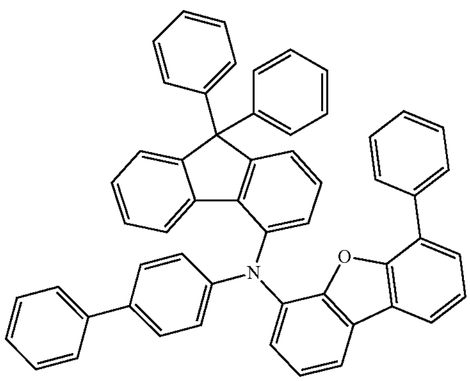
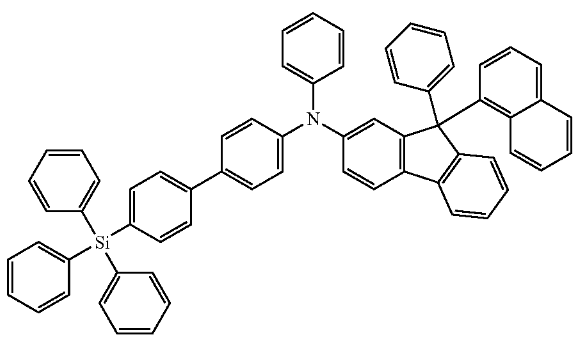
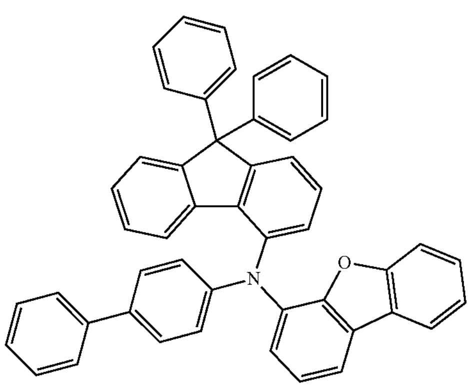
-continued
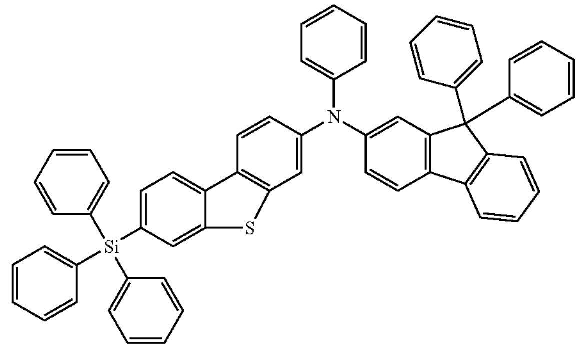
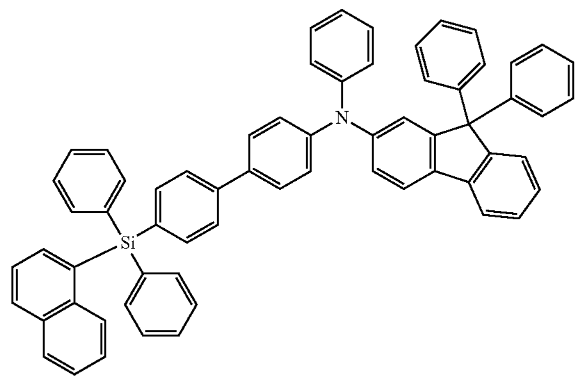
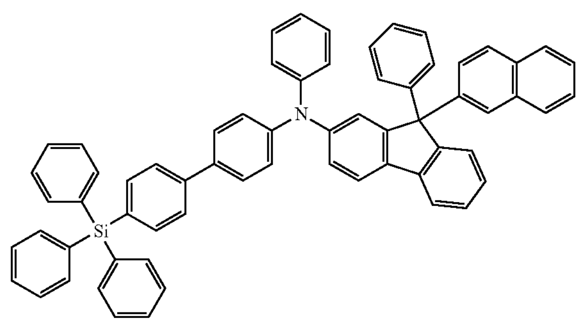
[Formula 121]
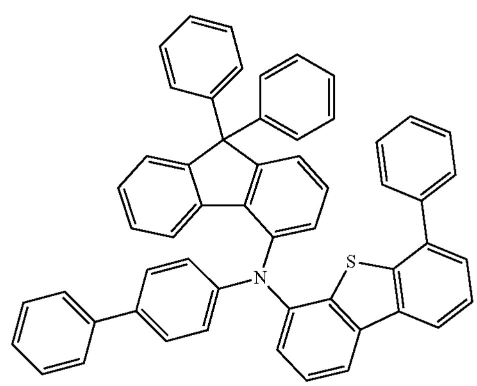

-continued
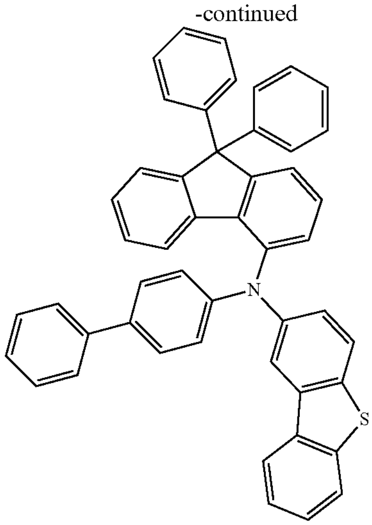
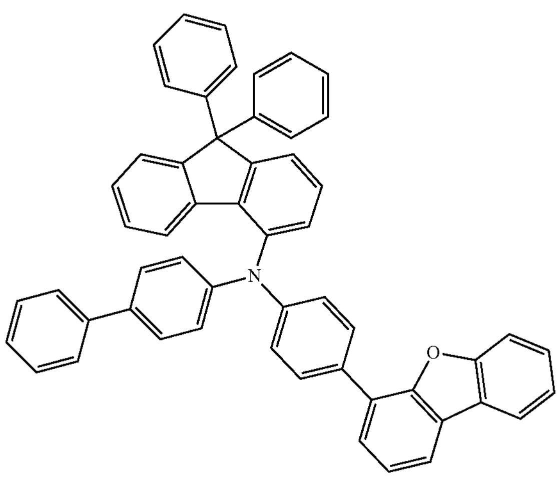
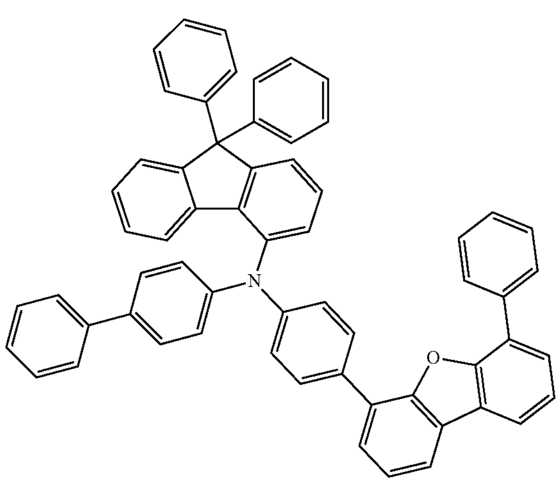
-continued
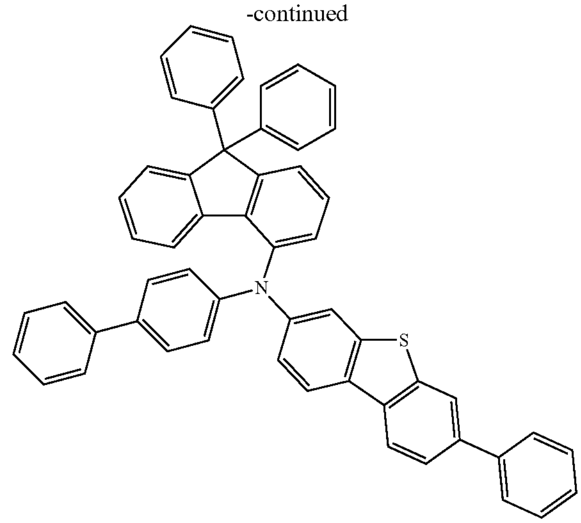
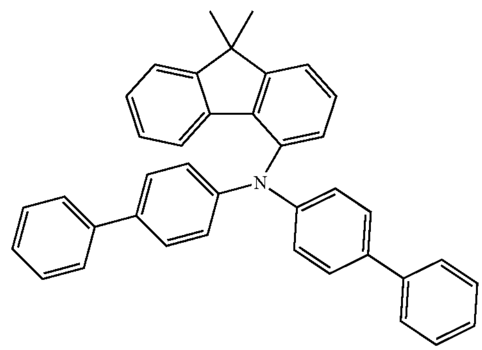
[Formula 122]
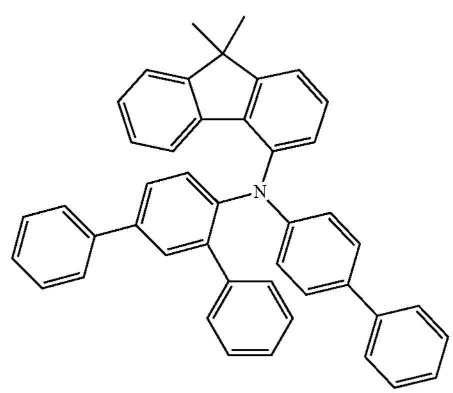
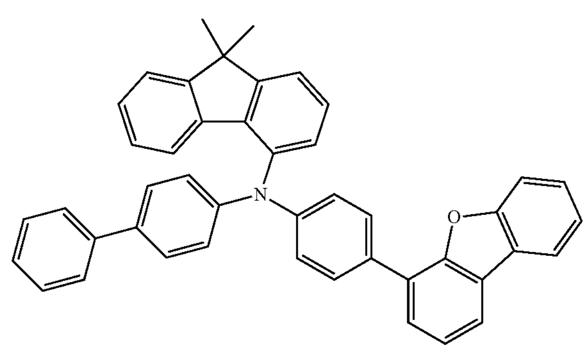

-continued
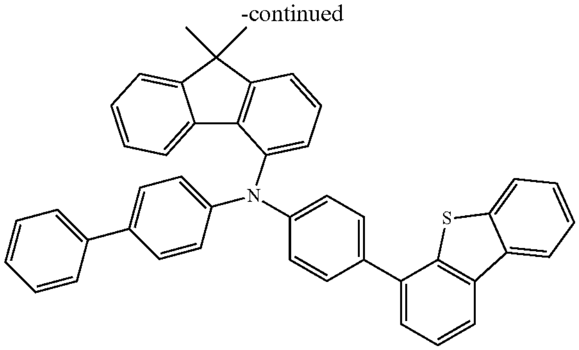
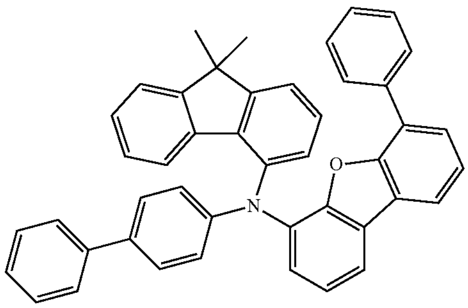
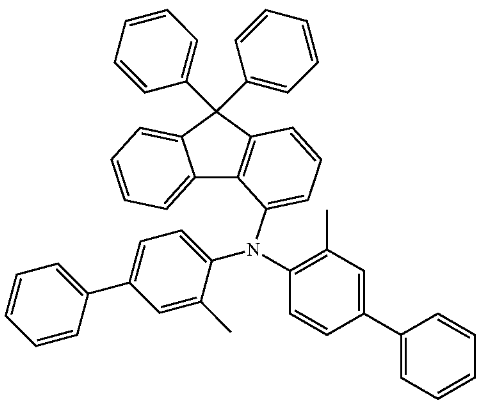
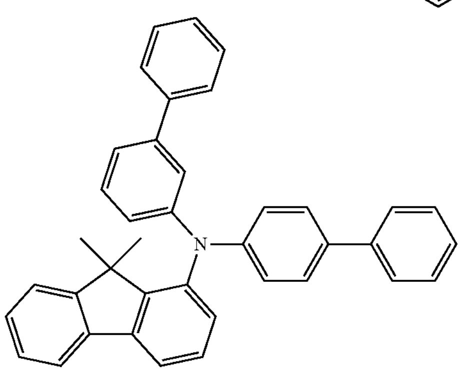
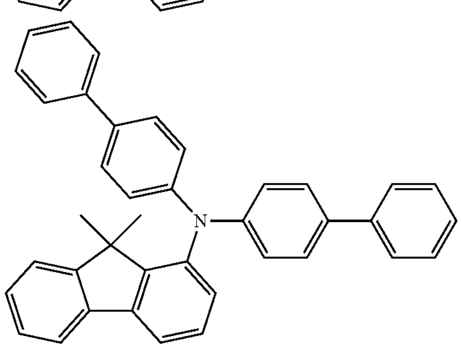
-continued
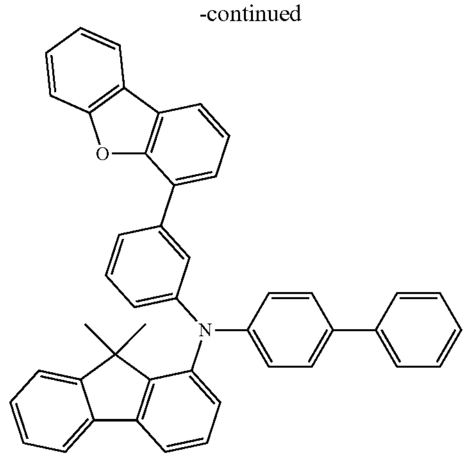
[Formula 123]
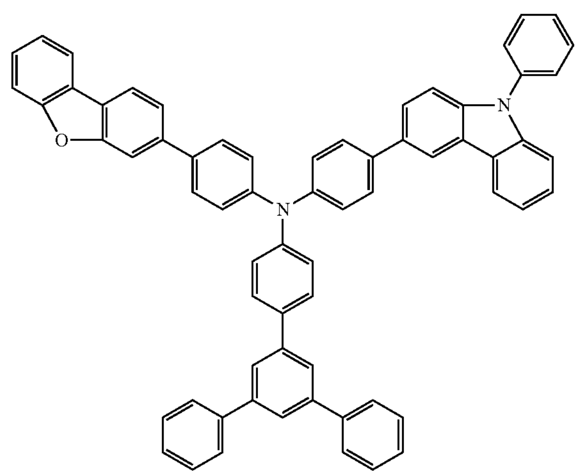
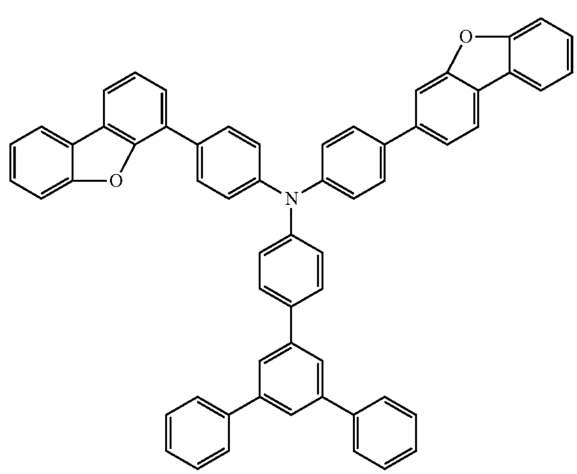

-continued
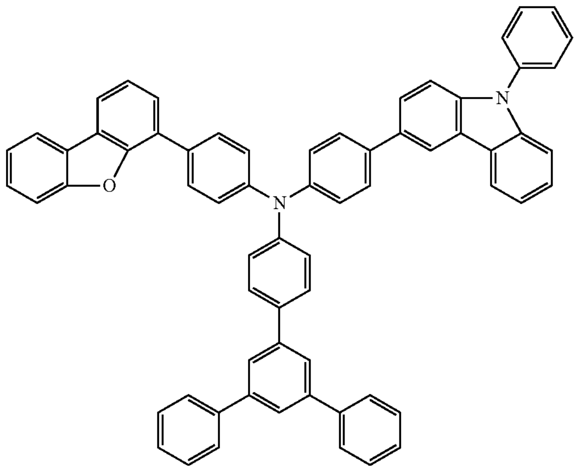
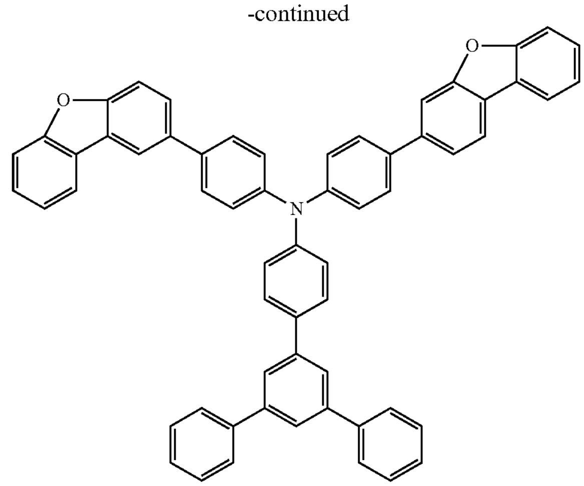
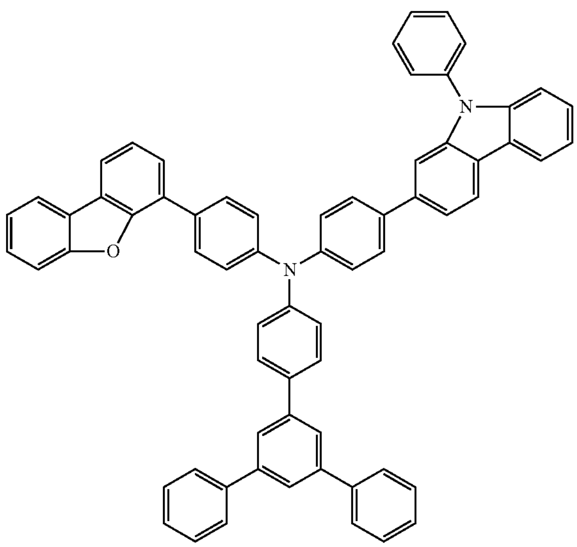
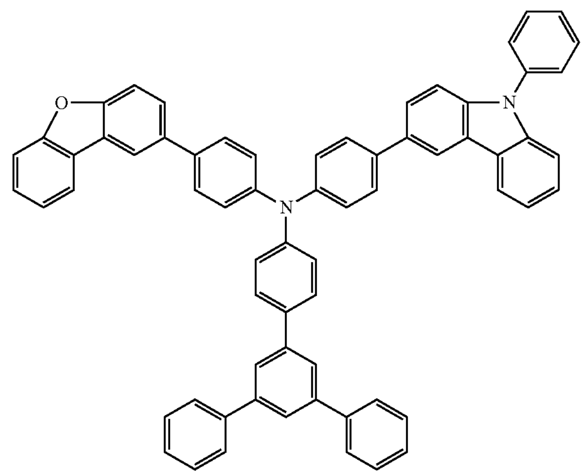
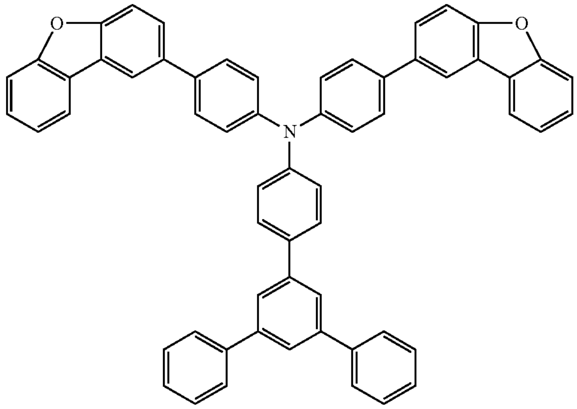
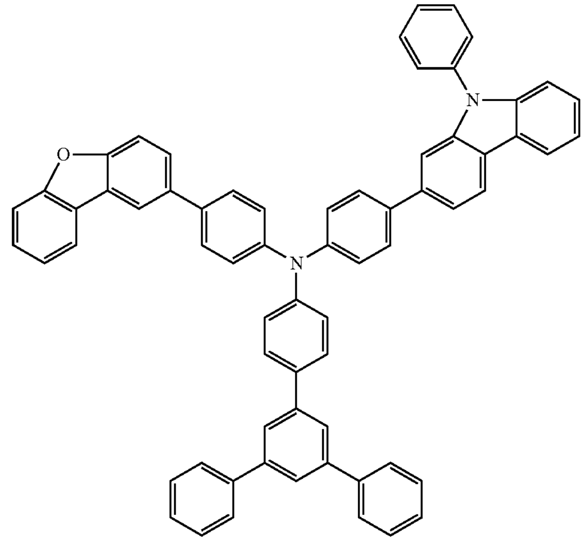
-continued -continued
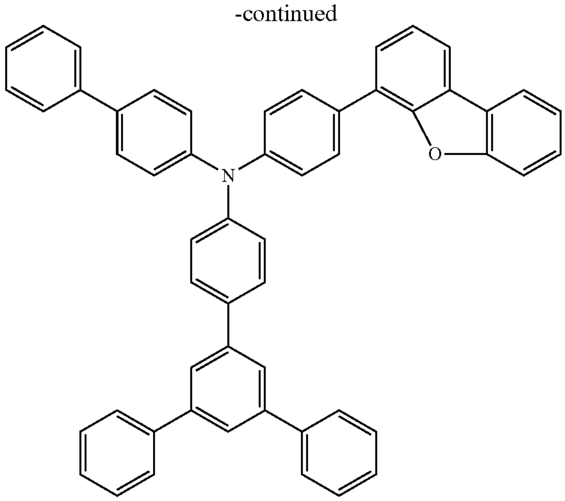
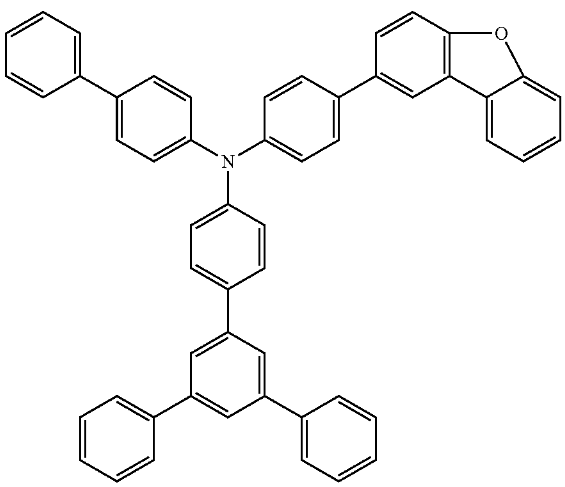
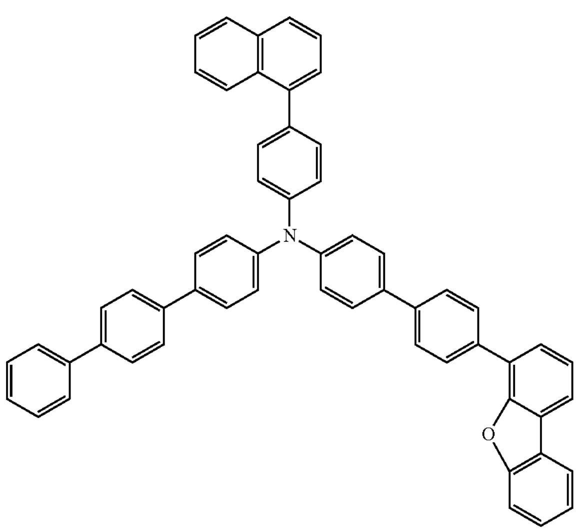
-continued
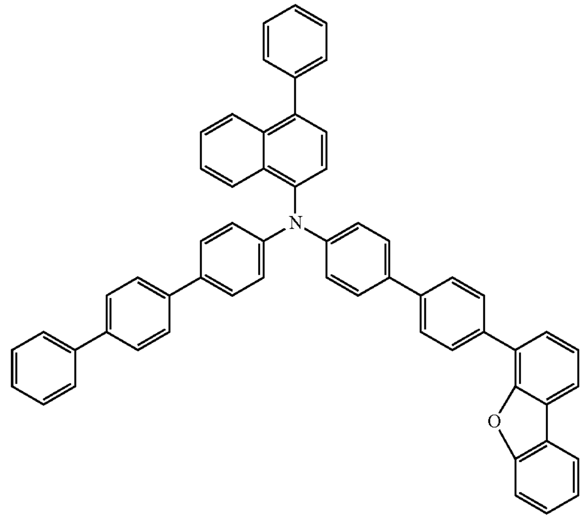
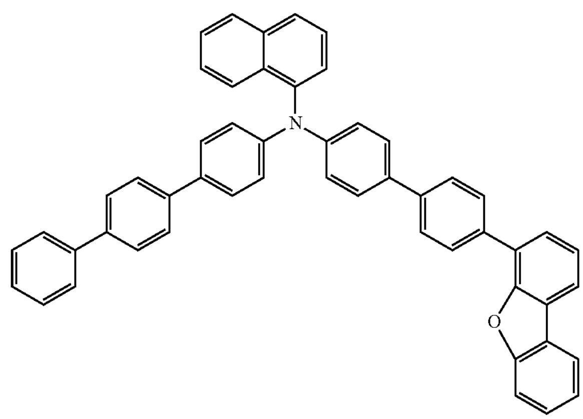
[Formula 124]
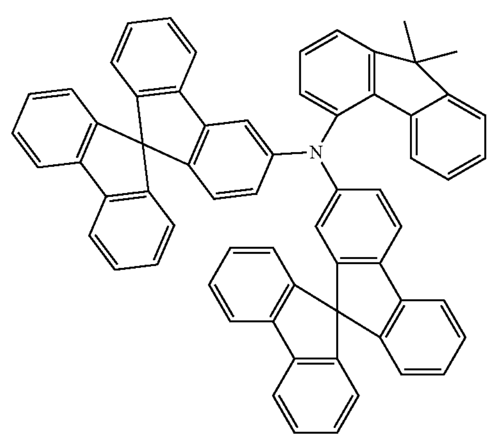

-continued
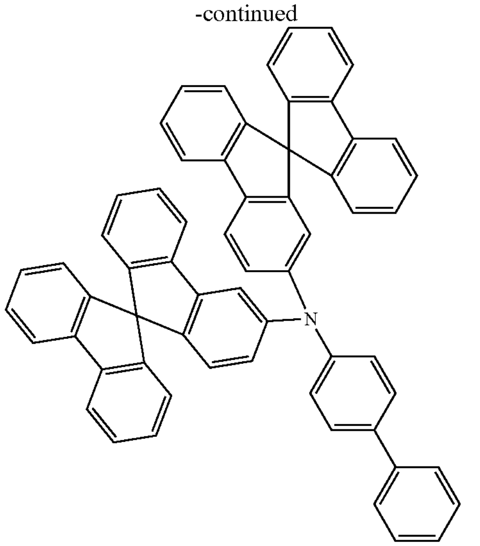
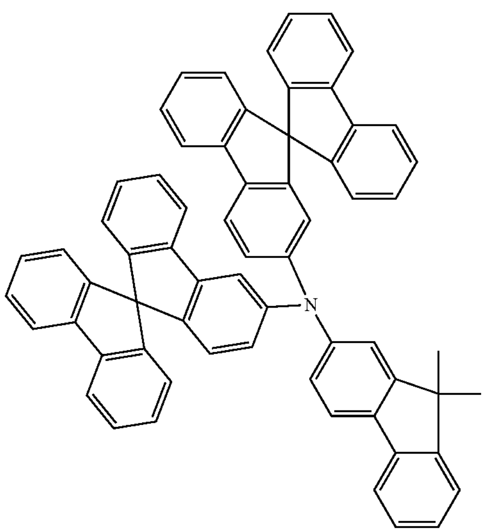
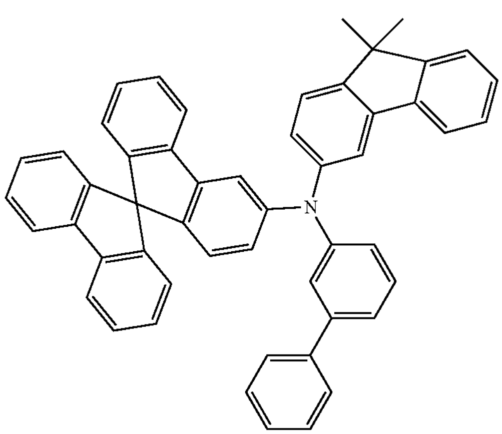
-continued
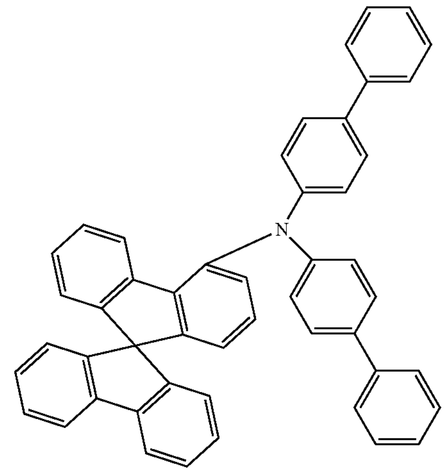
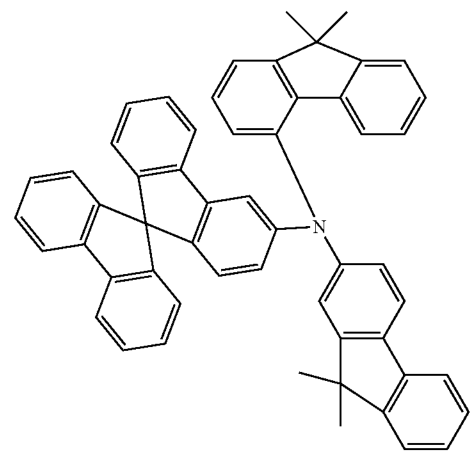
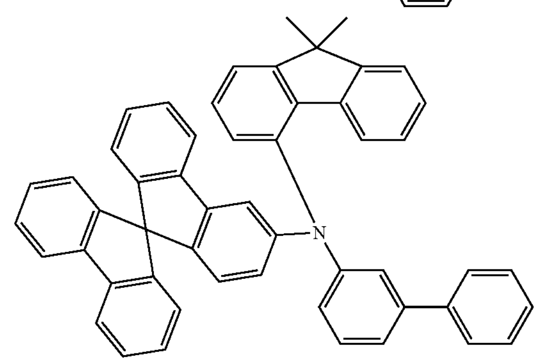
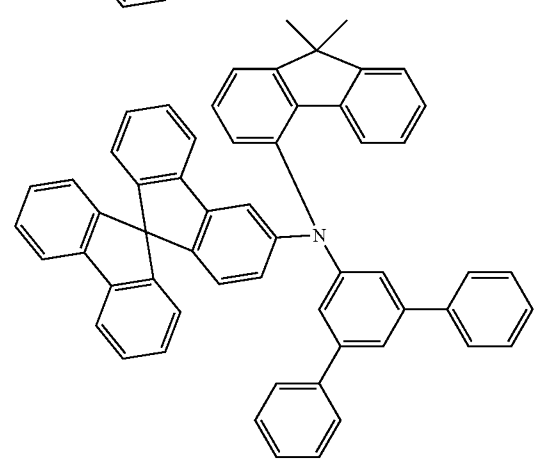

-continued
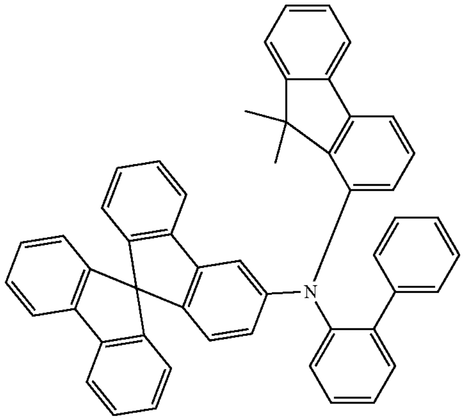
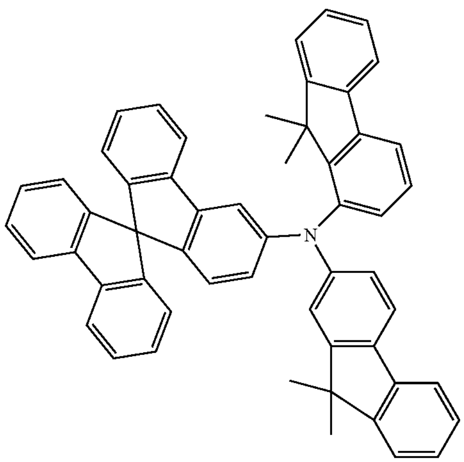
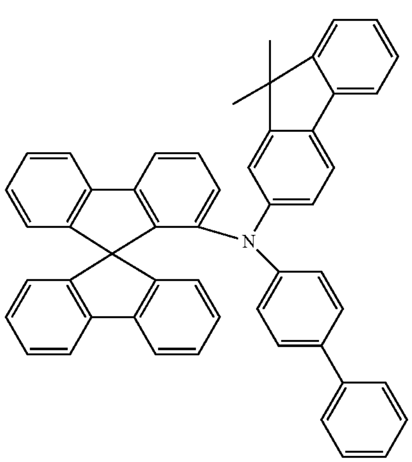
-continued
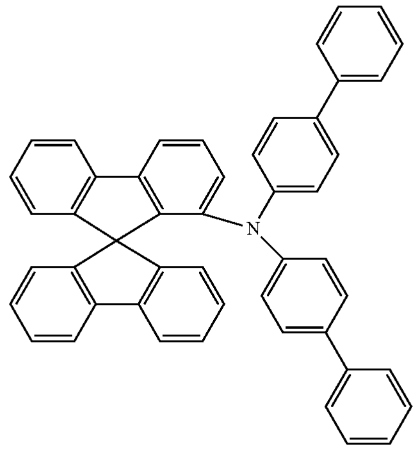
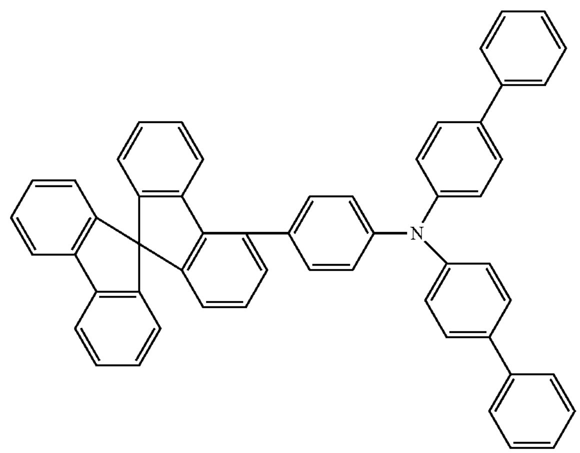
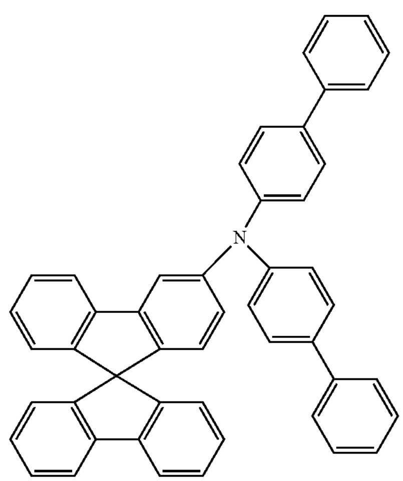

-continued
[Formula 125]
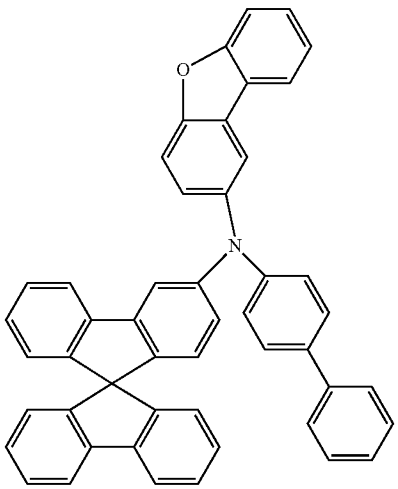
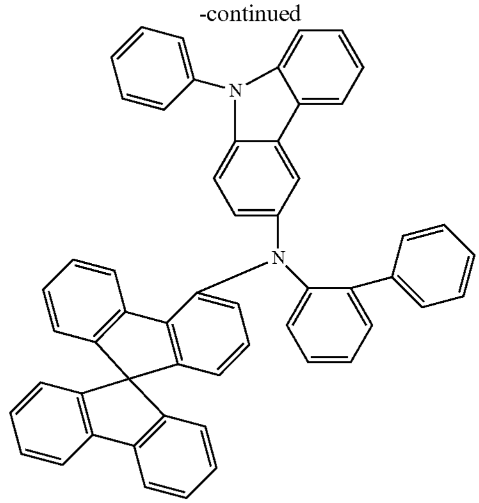
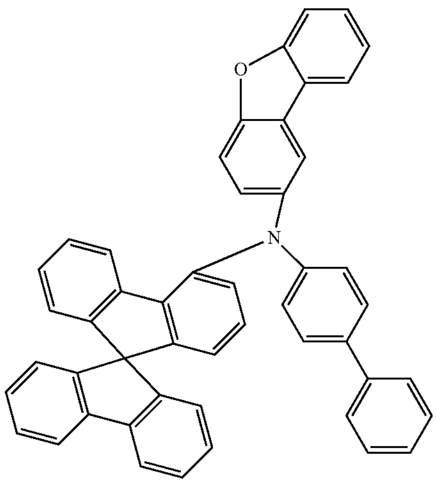
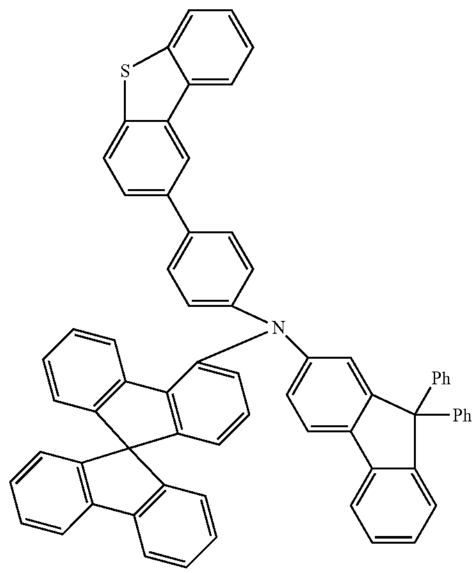
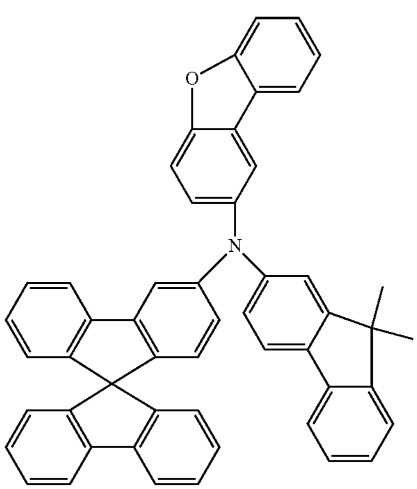
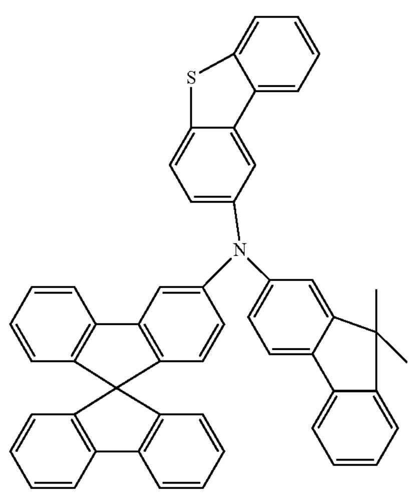

-continued
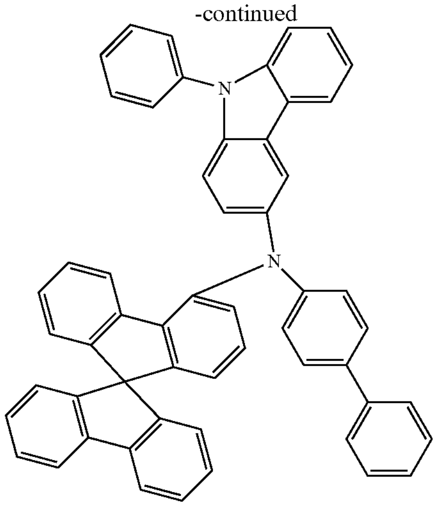
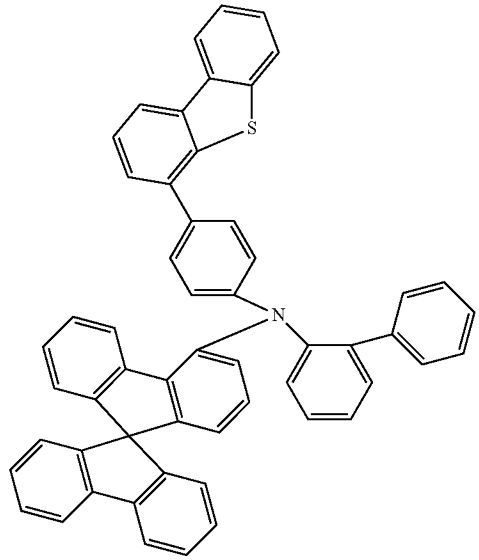
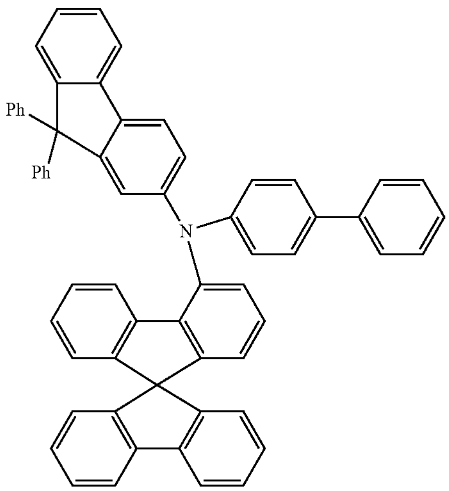
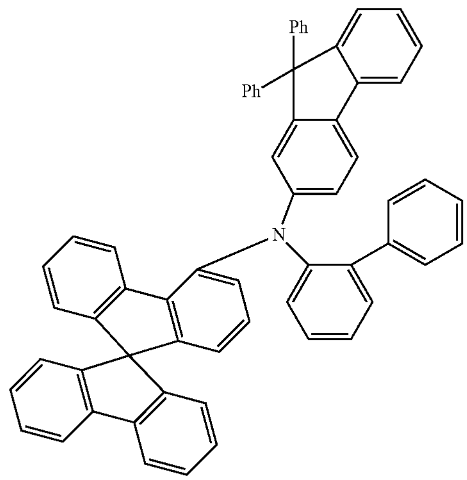
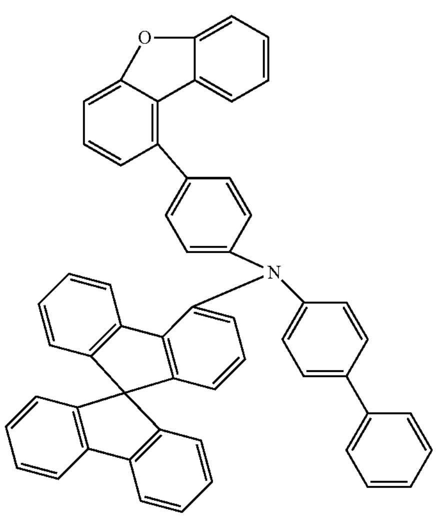
[Formula 126]
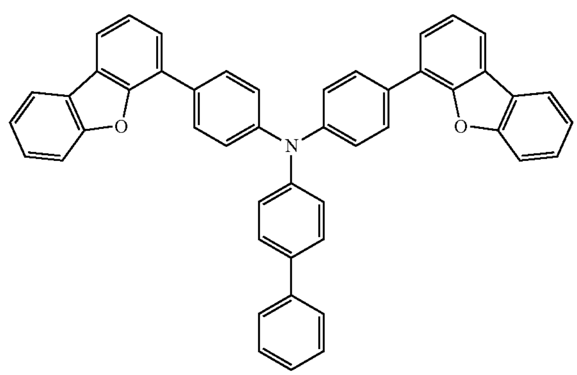

-continued
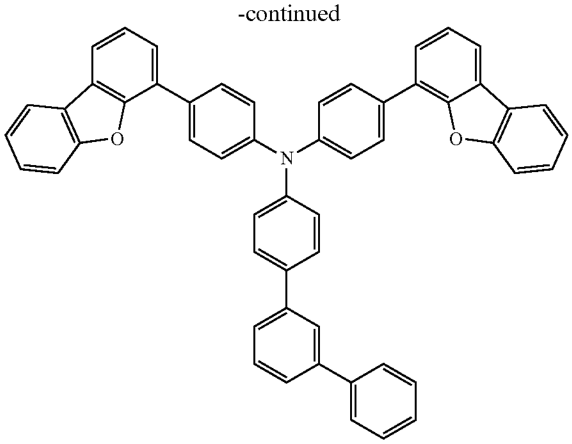
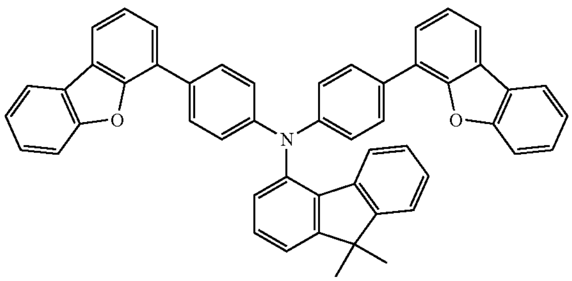
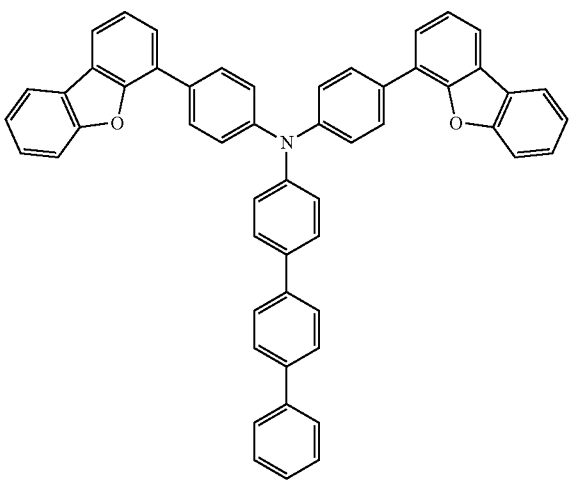
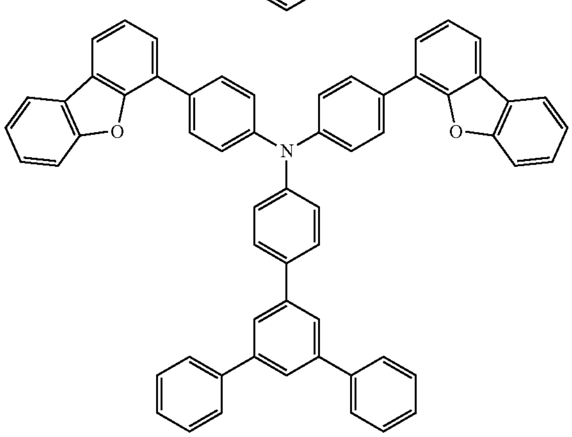
-continued
[Formula 127]
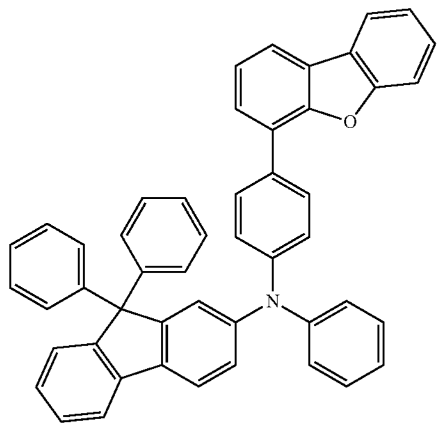
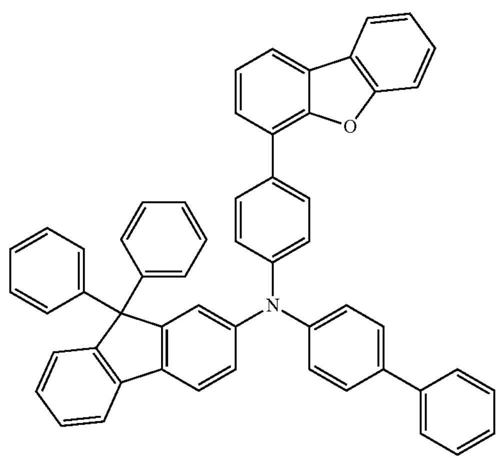
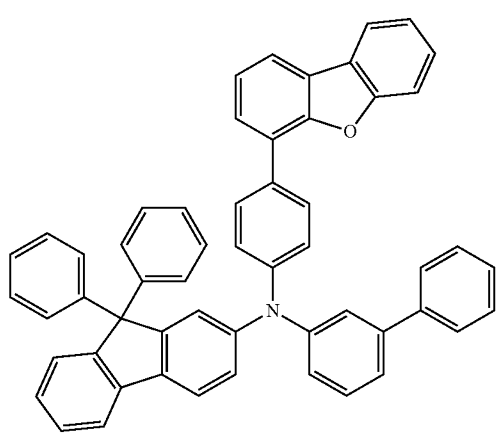

-continued
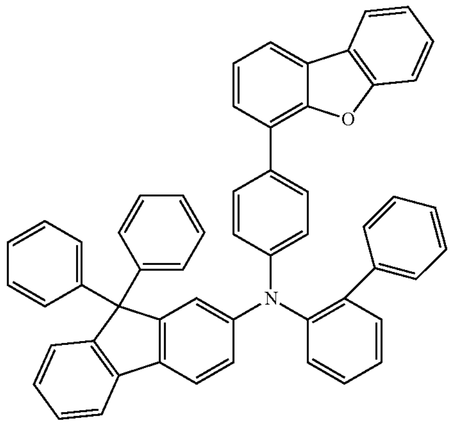
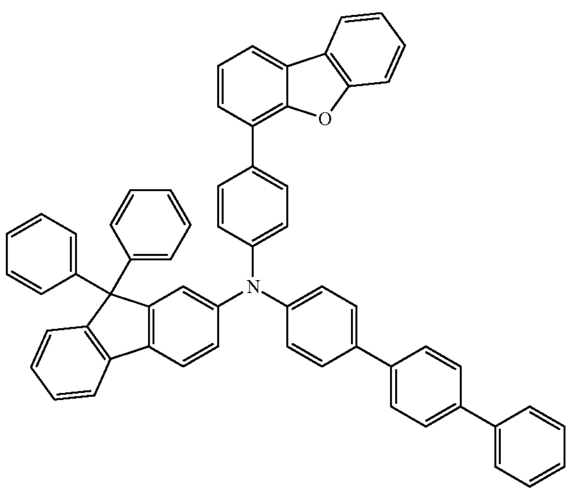
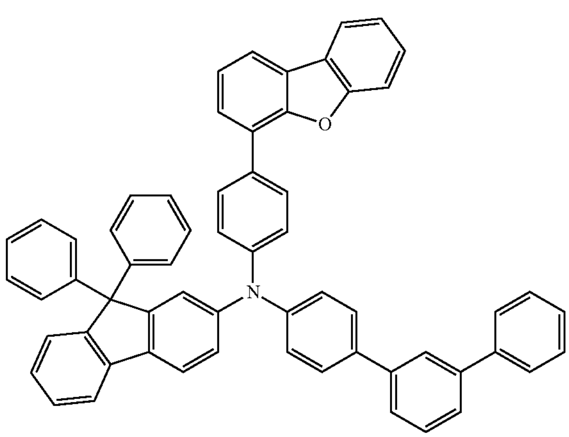
-continued
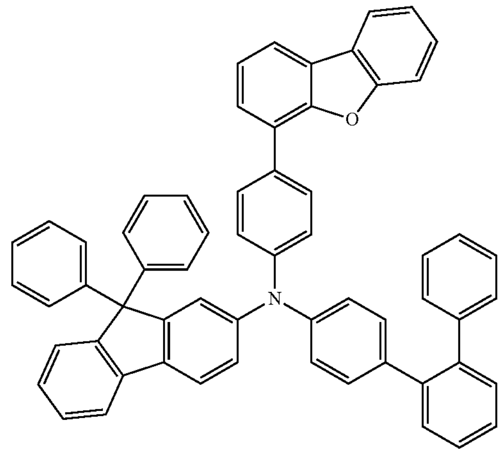
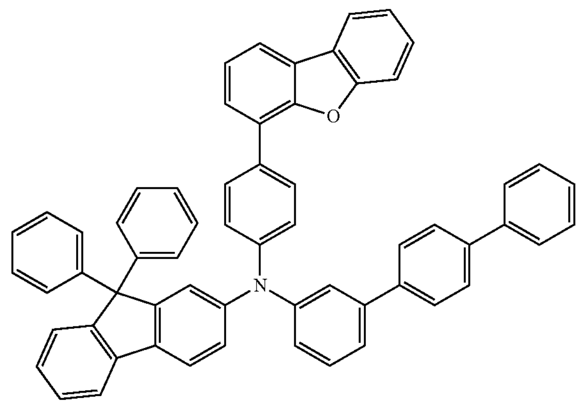
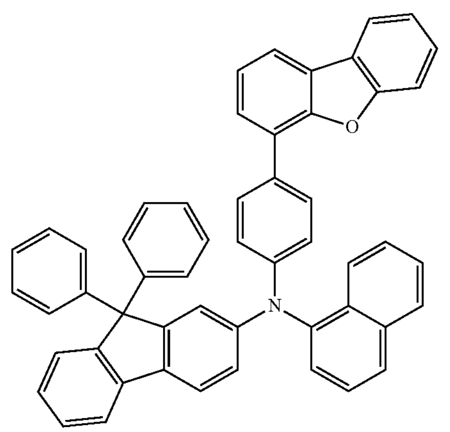
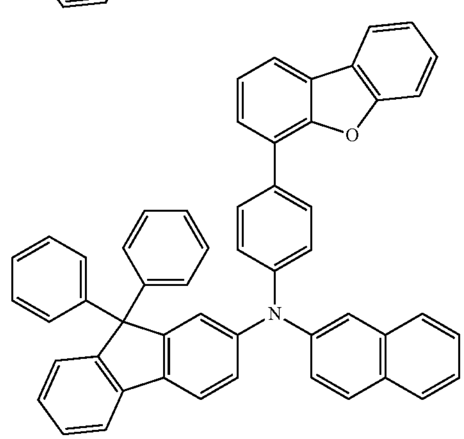

-continued
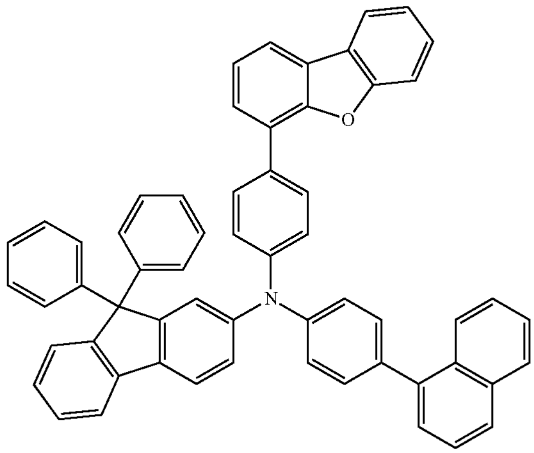
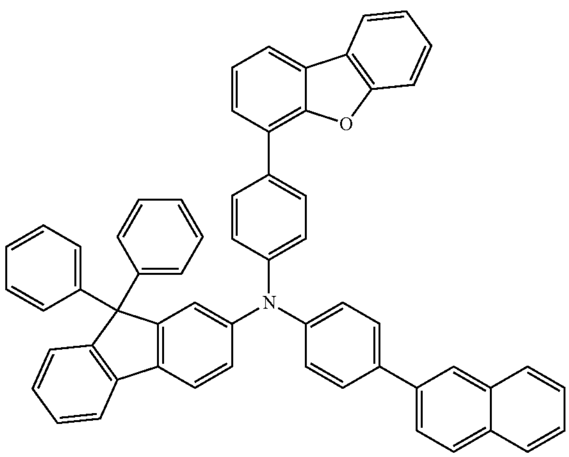
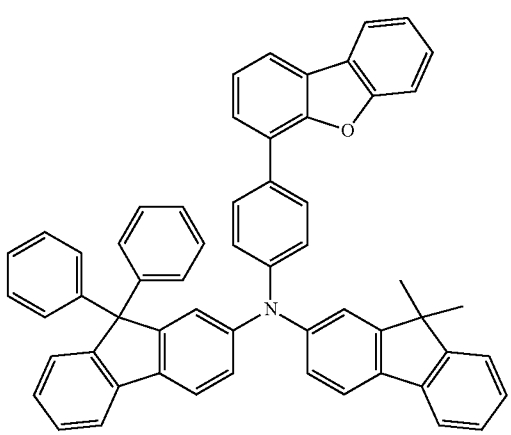
-continued
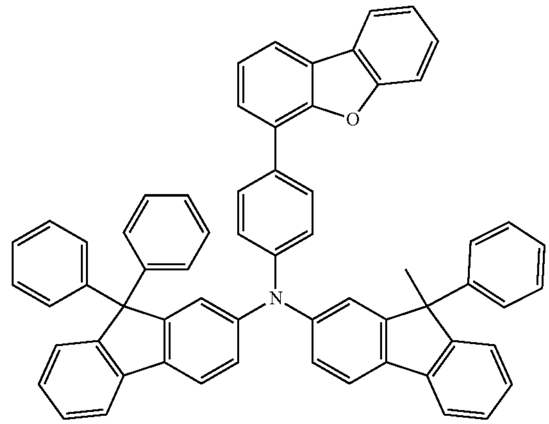
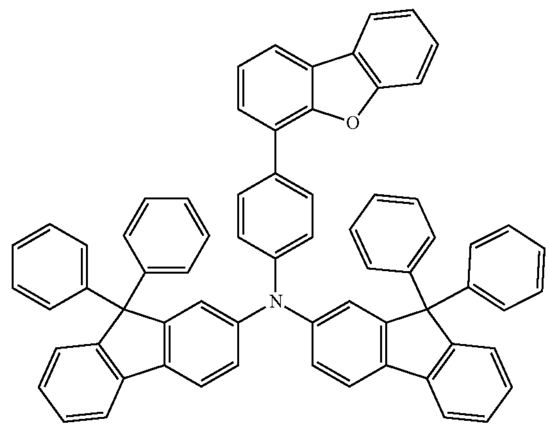
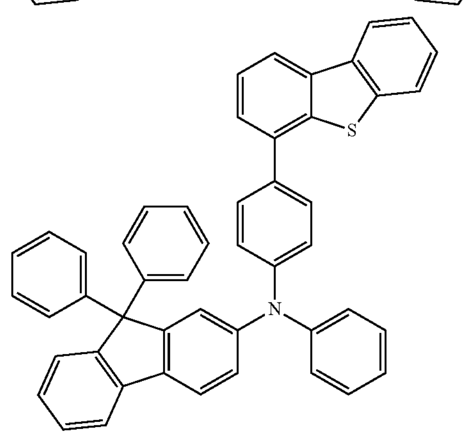
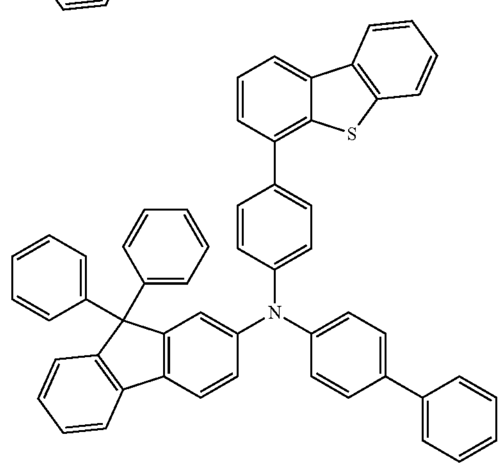

-continued
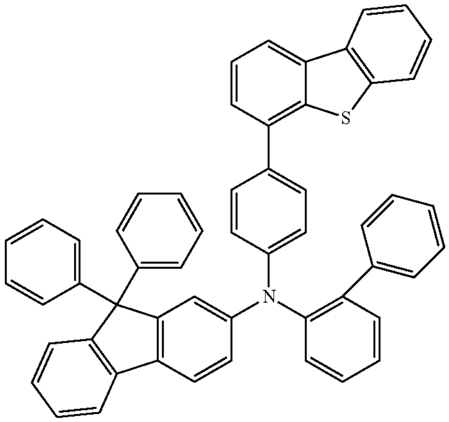
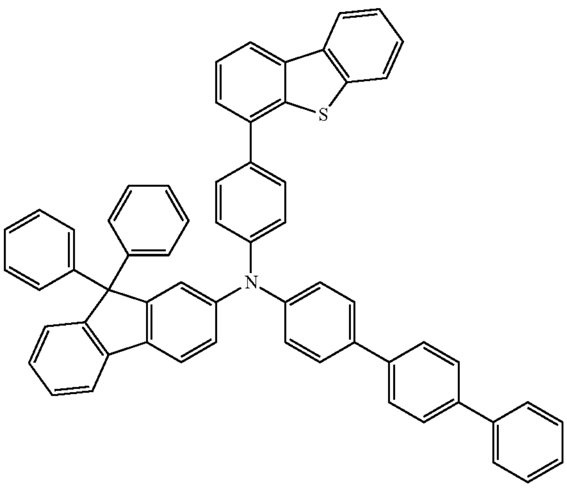
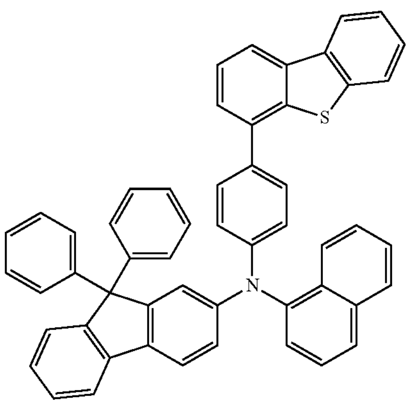
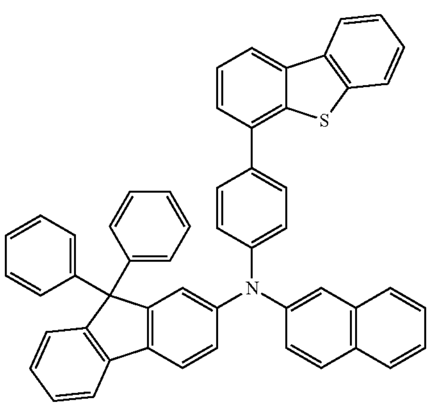
-continued
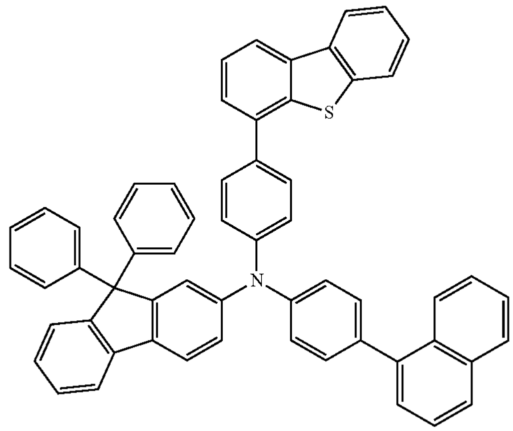
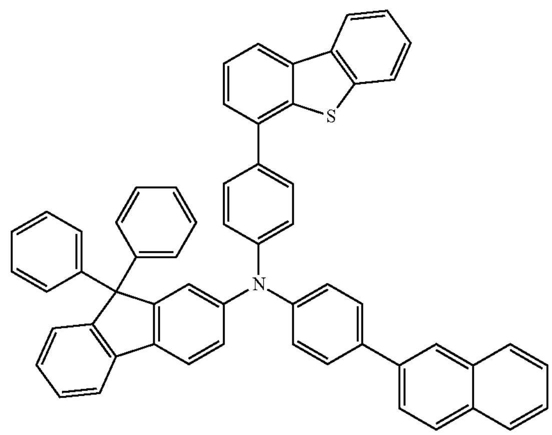 [SMILES: c1ccc(C2(c3ccccc3)c3ccccc3-c3ccc(N(c4ccc(-c5ccc6ccccc6c5)cc4)c4ccc(-c5cccc6c5sc5ccccc56)cc4)cc32)cc1]
[Formula 128]
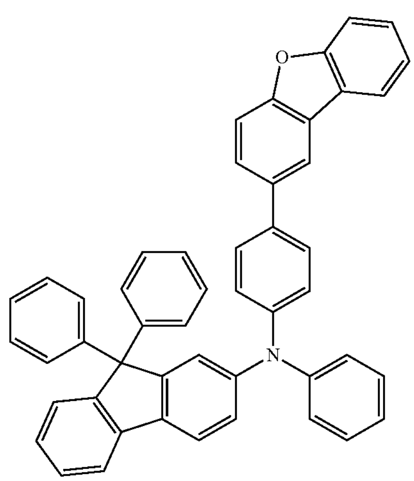

-continued
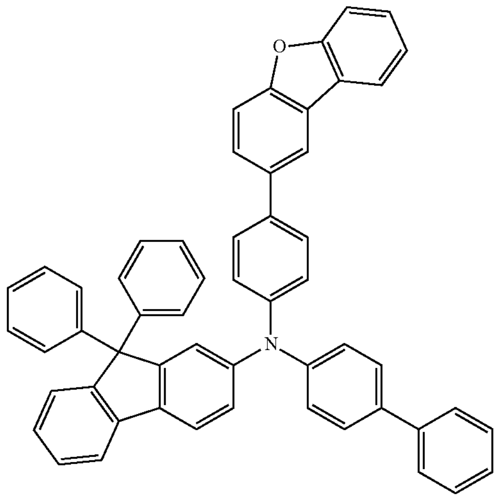
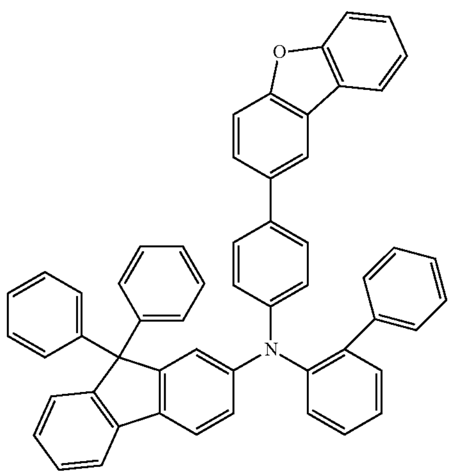
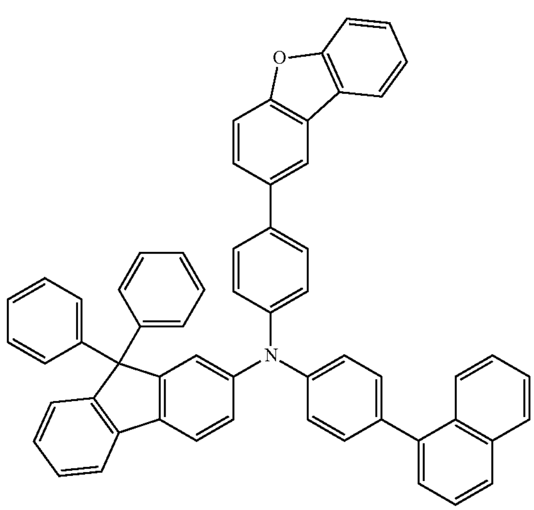
-continued
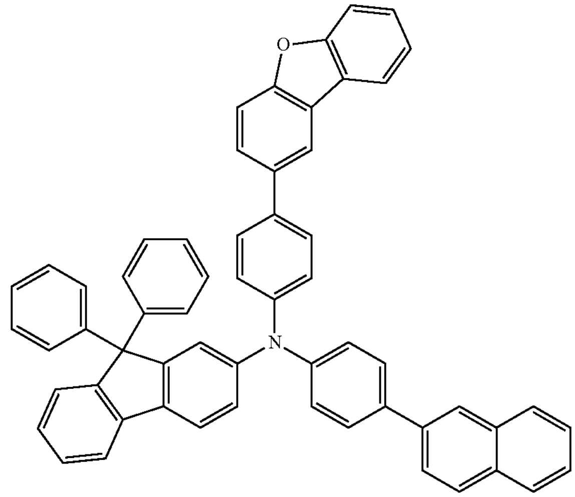
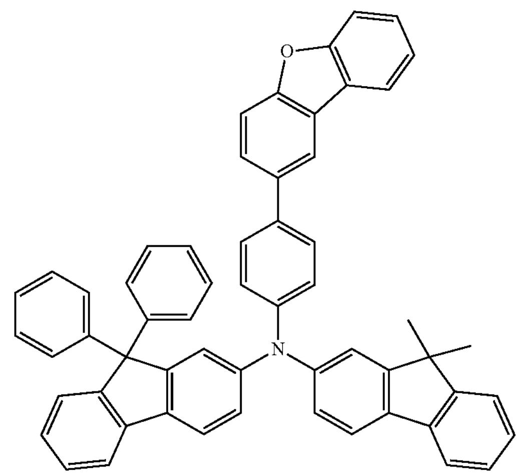 [SMILES: CC1(C)c2ccccc2-c2ccc(N(c3ccc(-c4ccc5oc6ccccc6c5c4)cc3)c3ccc4c(c3)C(c3ccccc3)(c3ccccc3)c3ccccc3-4)cc21]
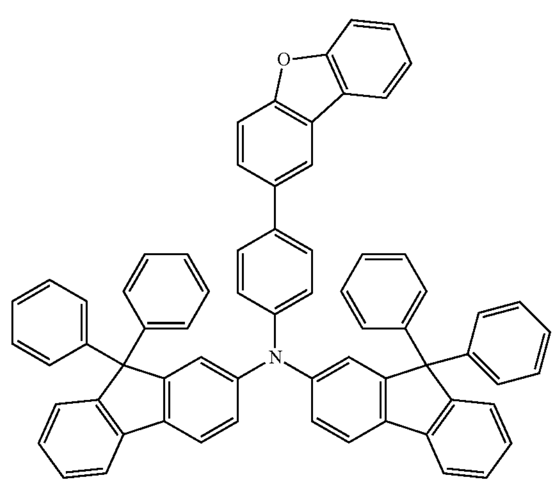

-continued
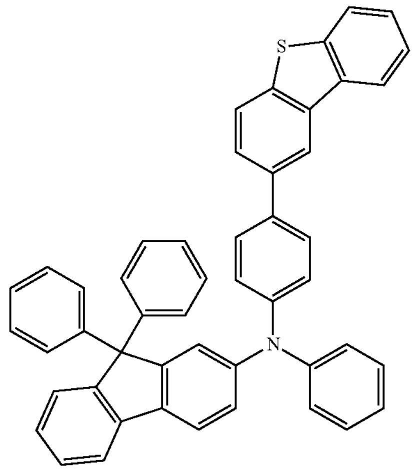
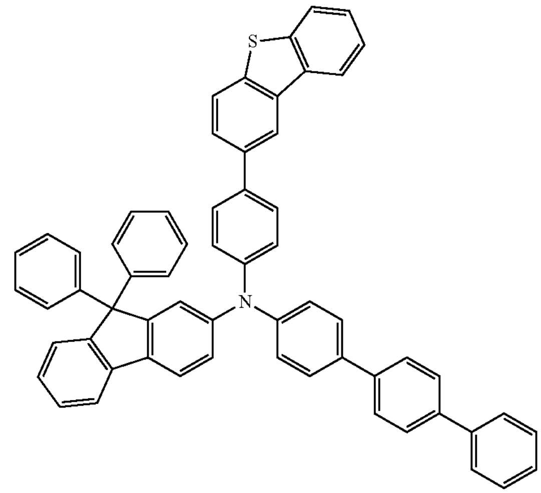
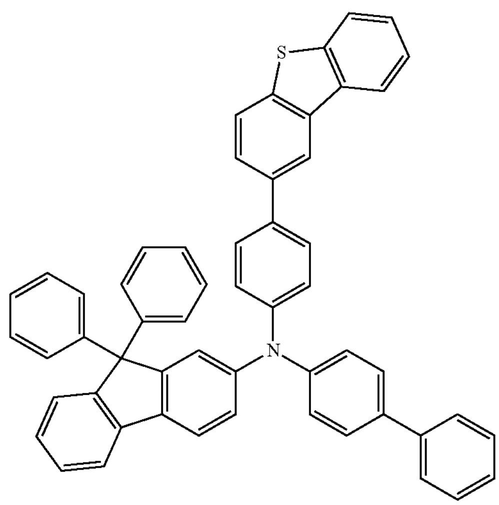
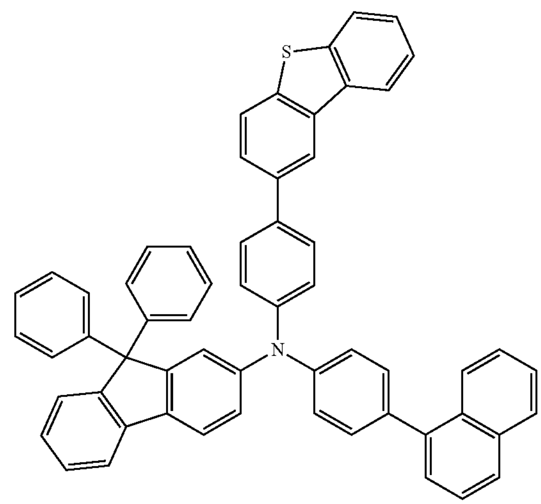
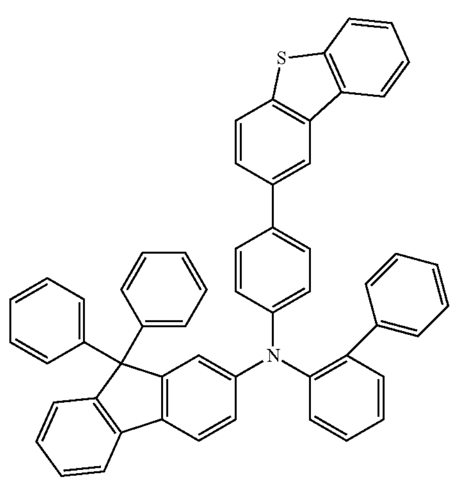
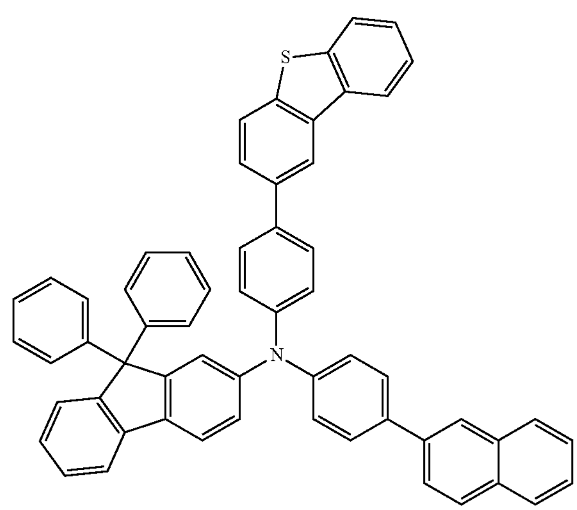

-continued
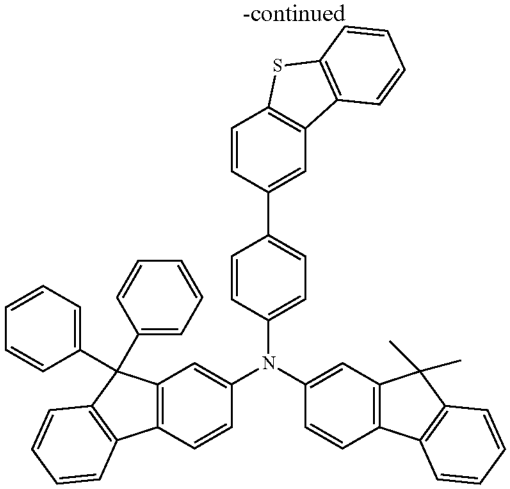
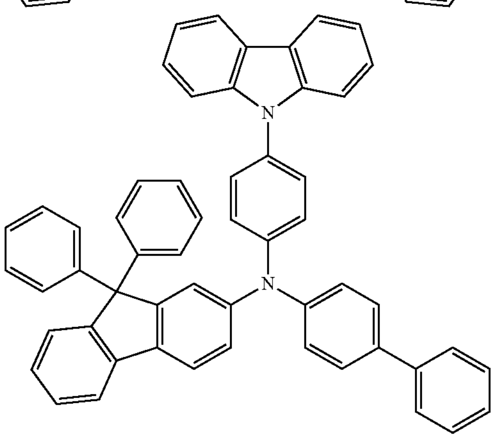
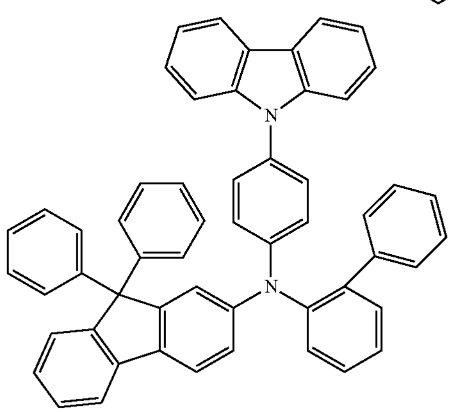
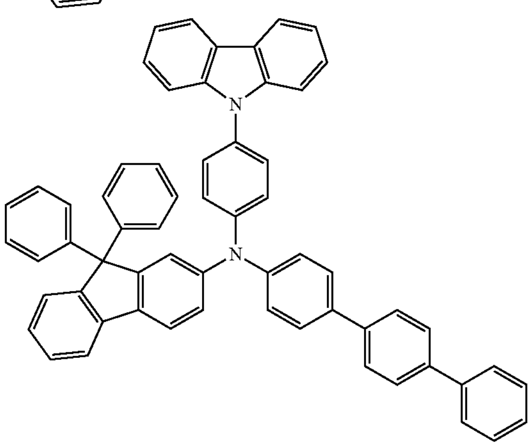
-continued
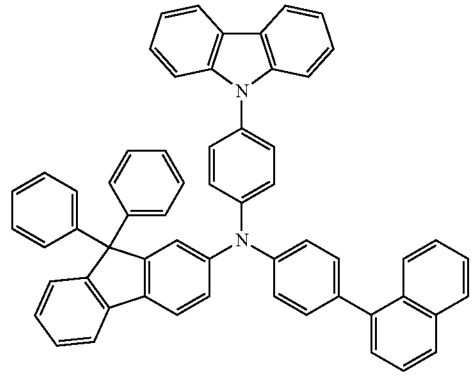
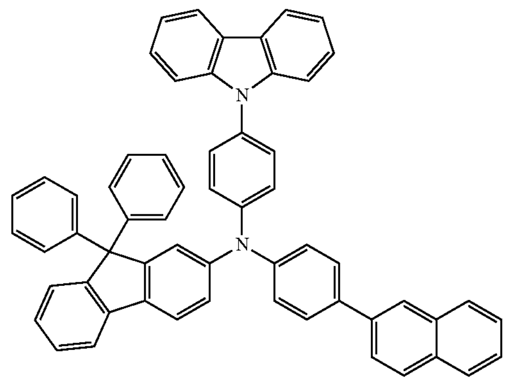
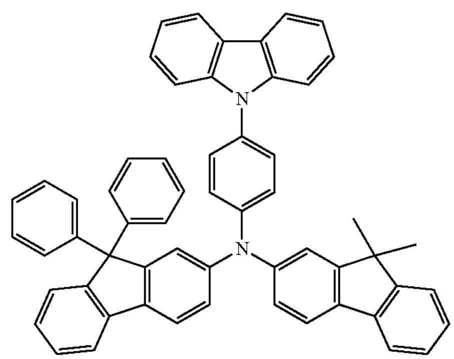
[Formula 129]
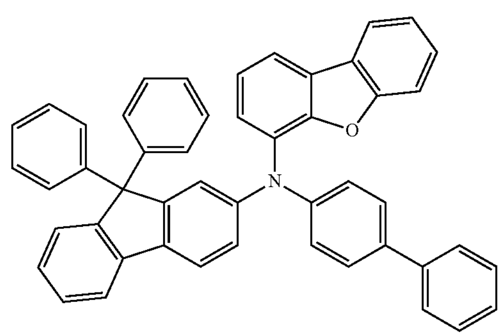

-continued
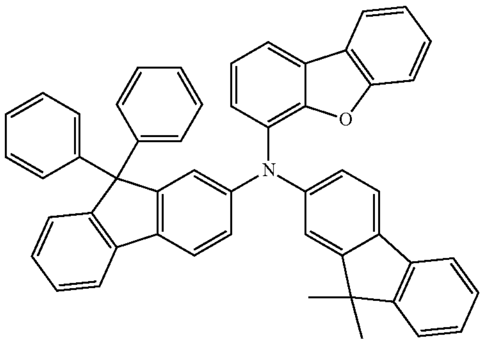
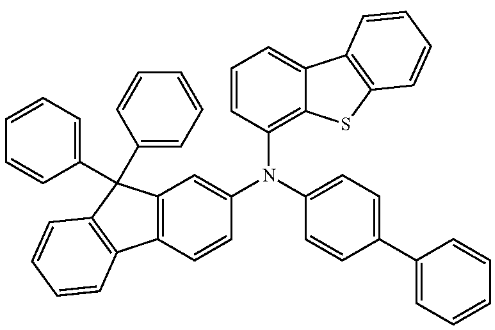
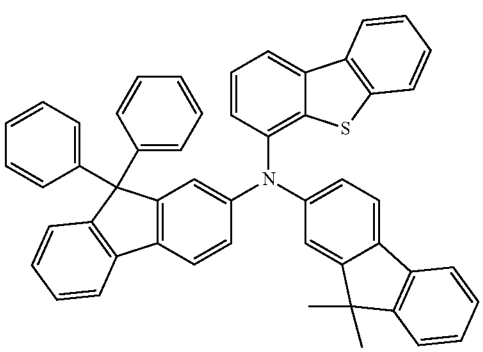
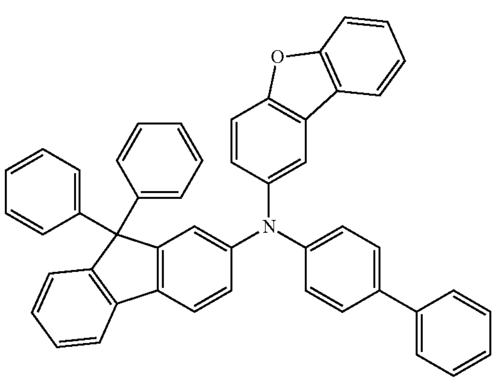
-continued
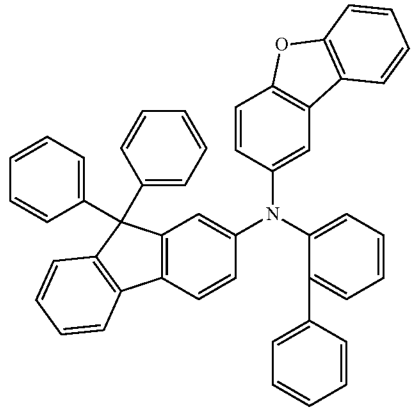
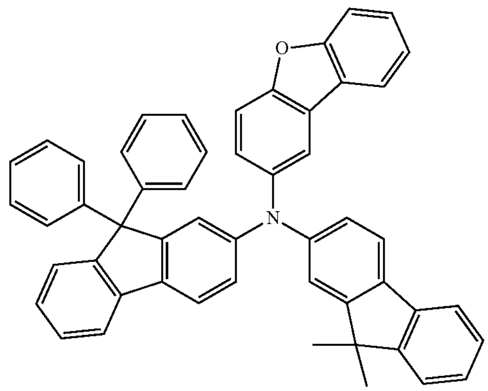
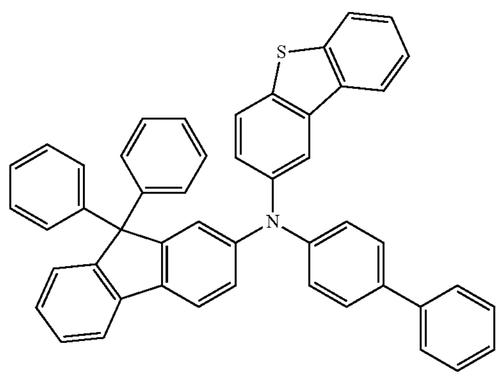
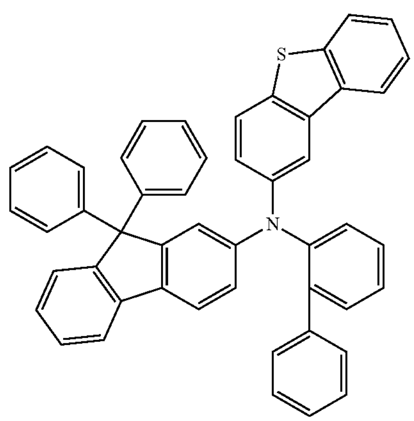

-continued
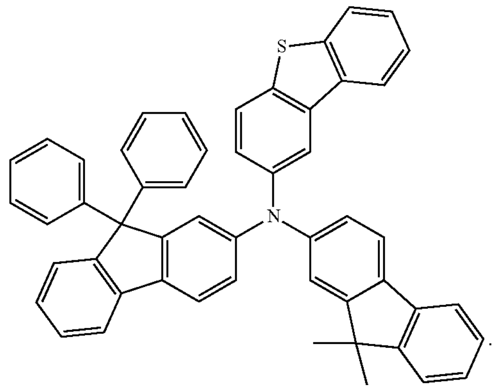
-continued
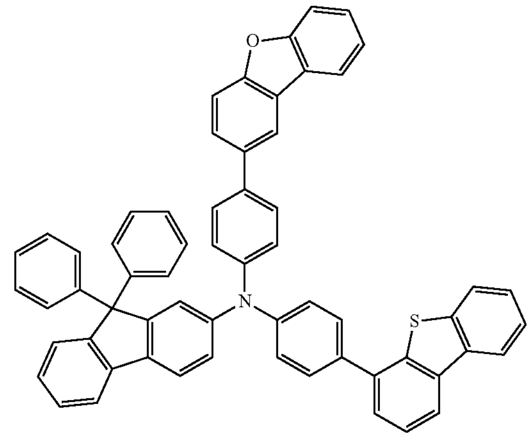
[Formula 130]
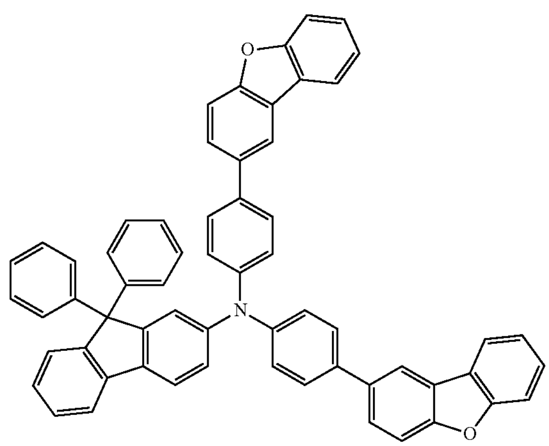
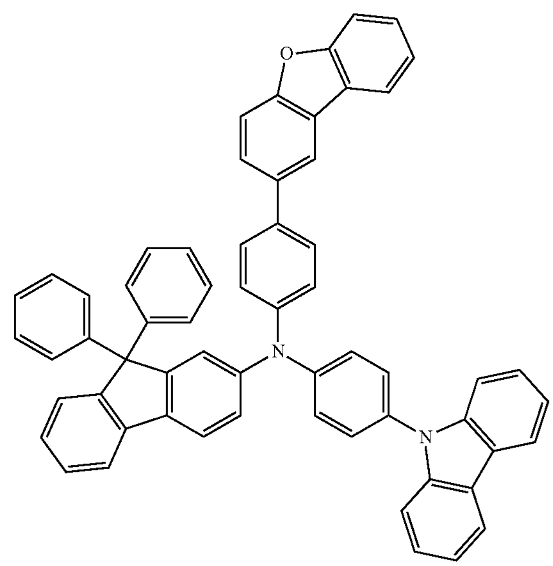
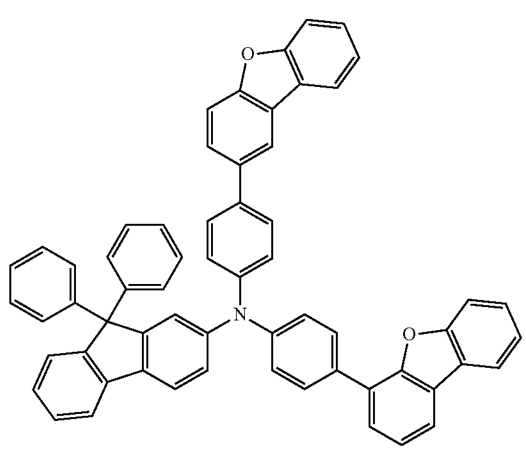
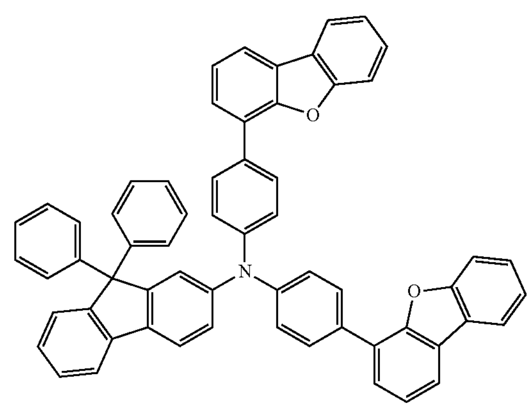

-continued
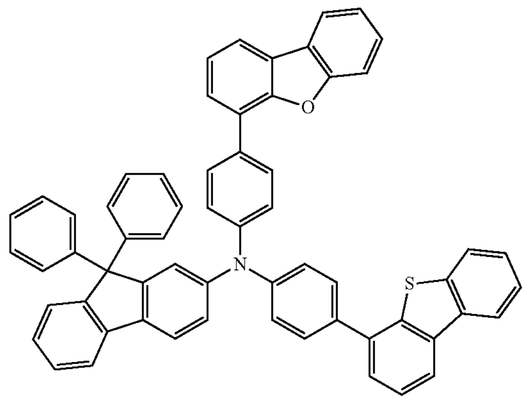
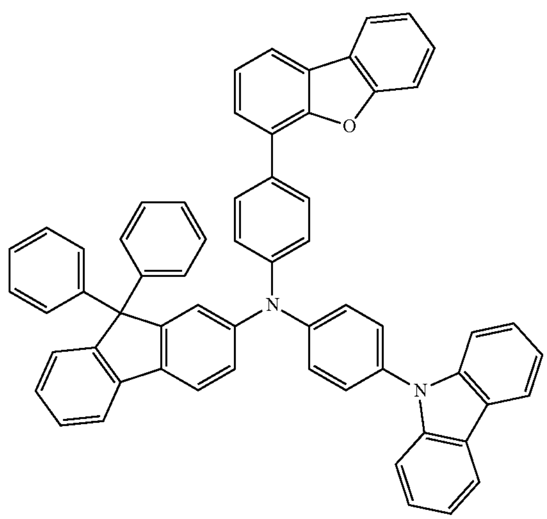
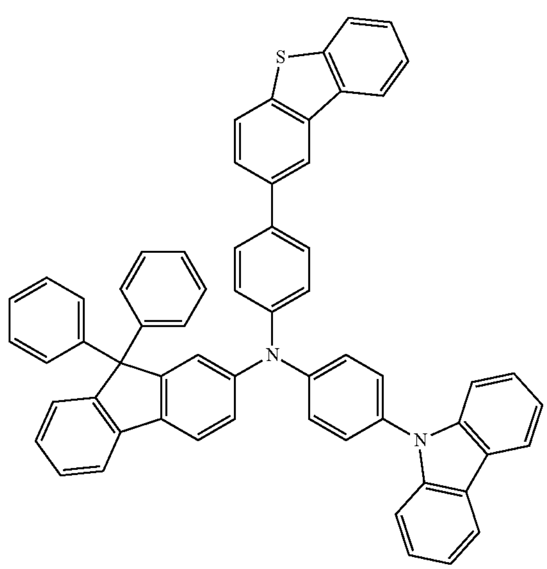
-continued
[Formula 131]
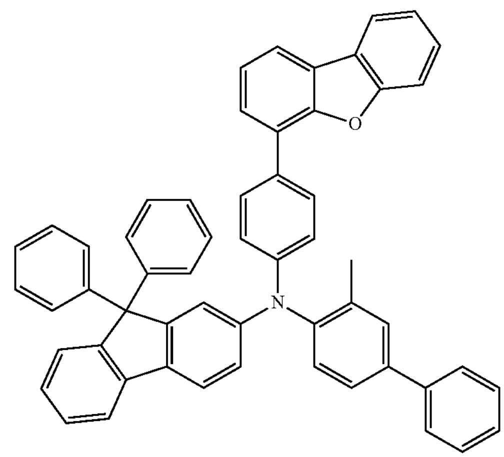
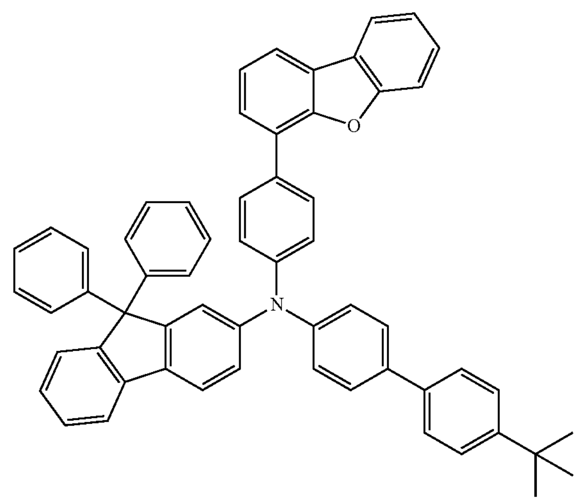
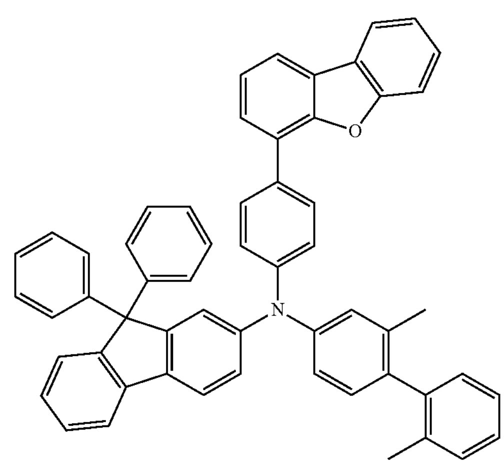

-continued
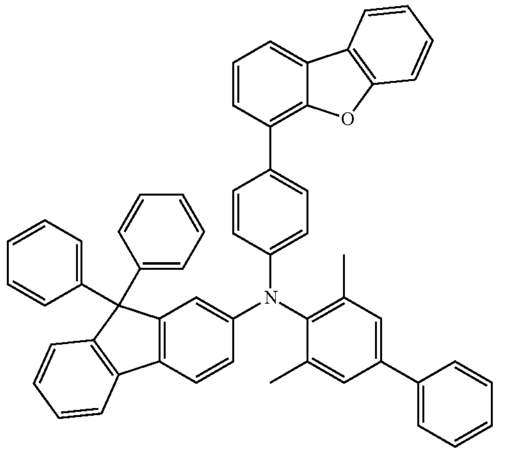
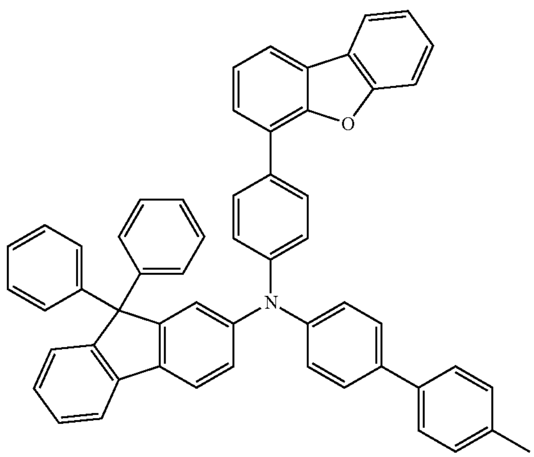
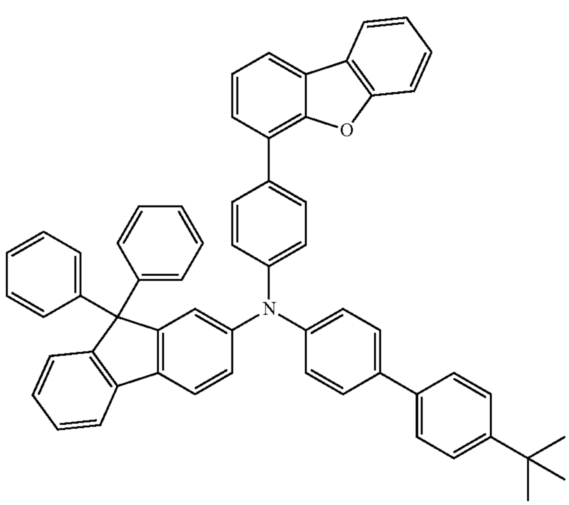
-continued
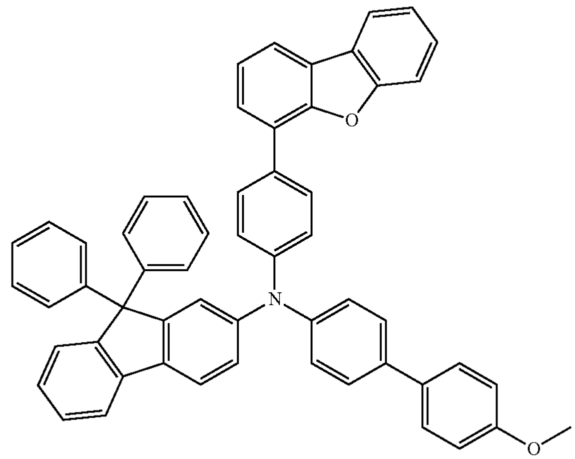
[Formula 132]
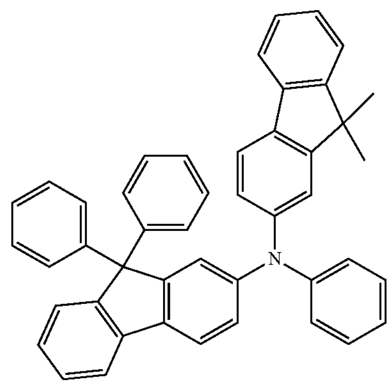
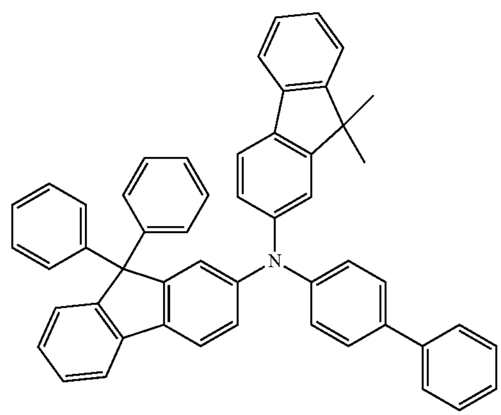
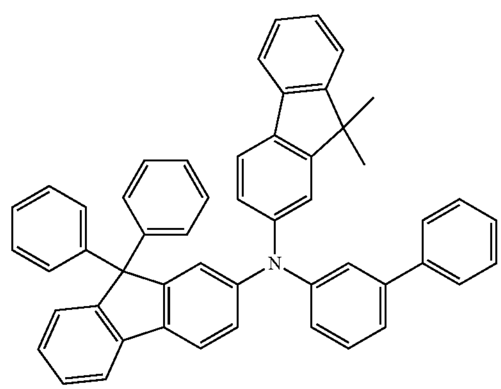

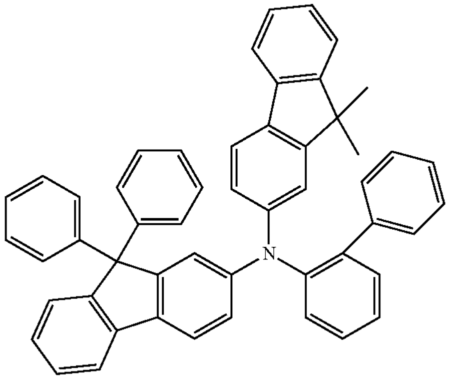
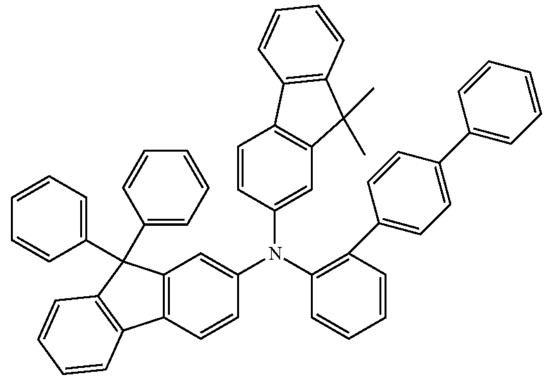
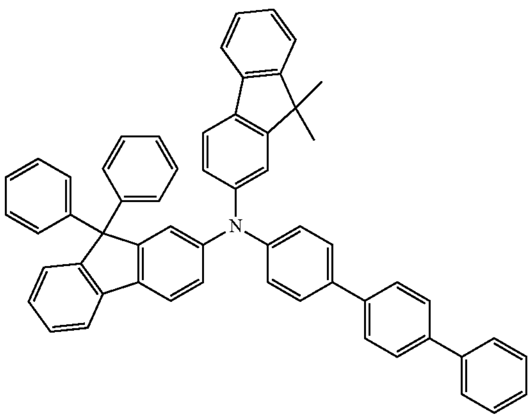
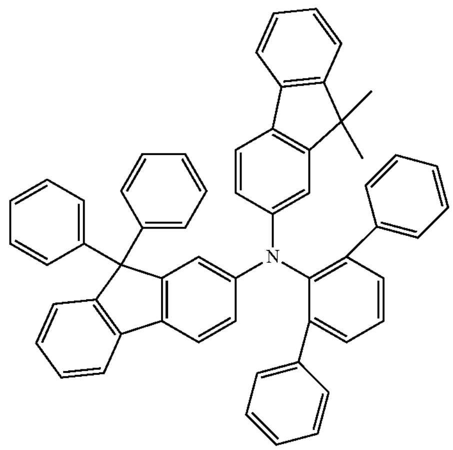
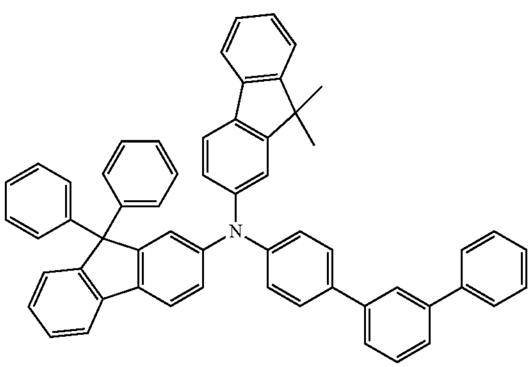
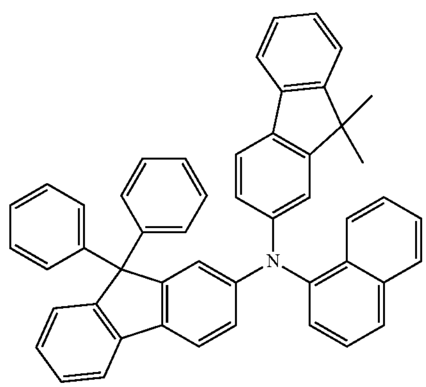
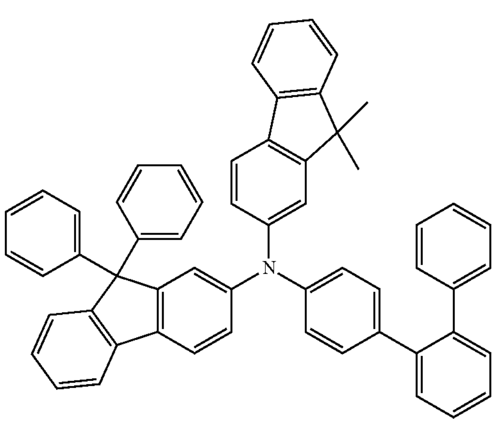
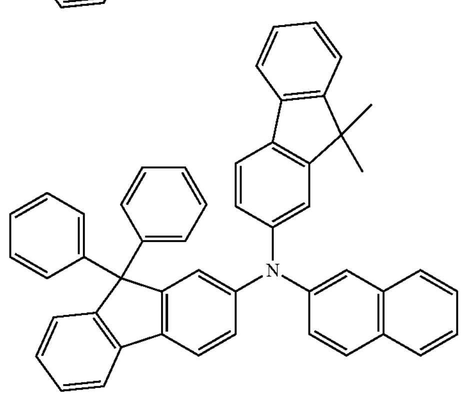

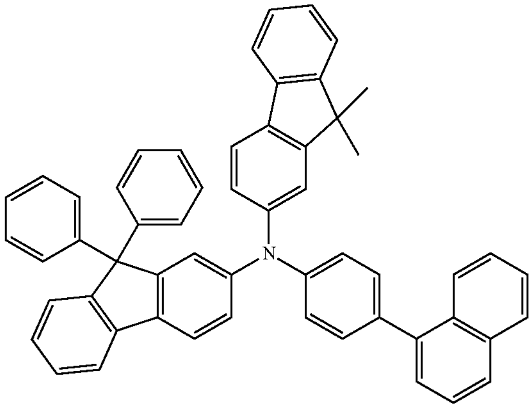
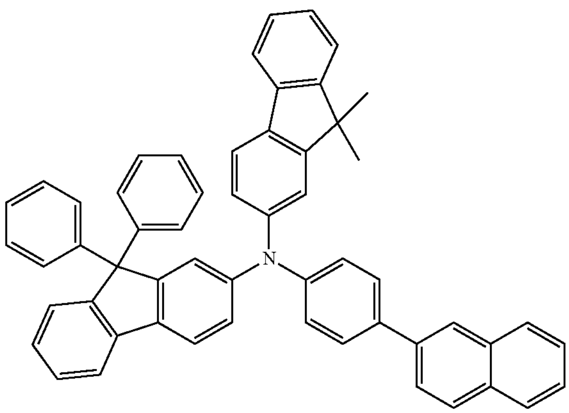
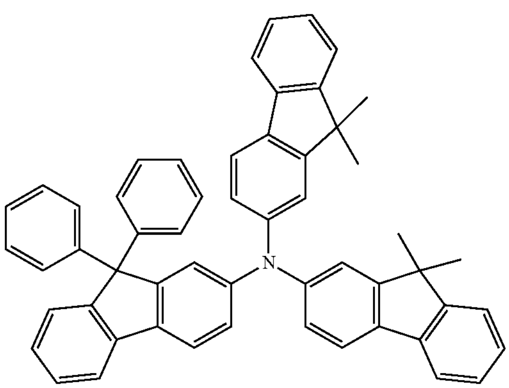
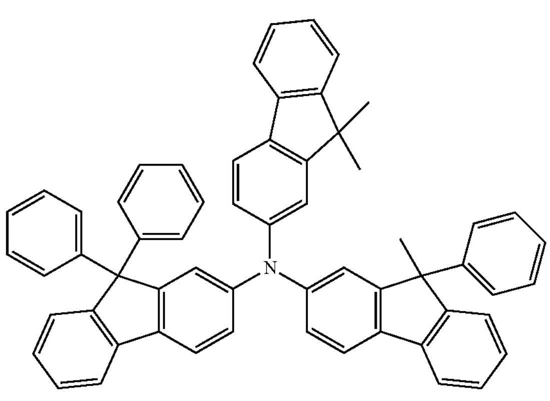
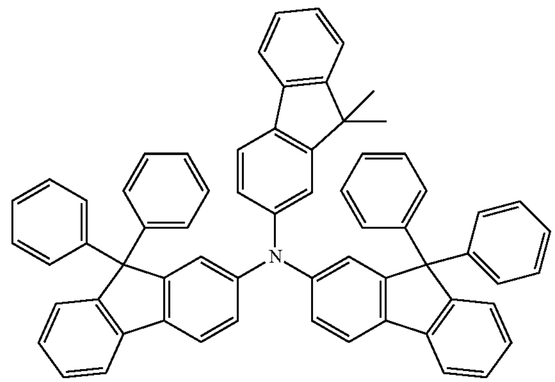
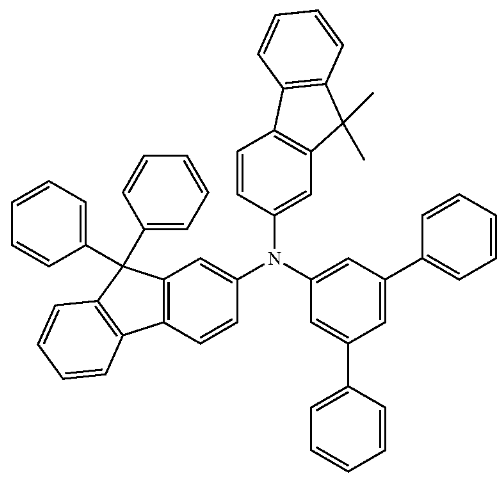
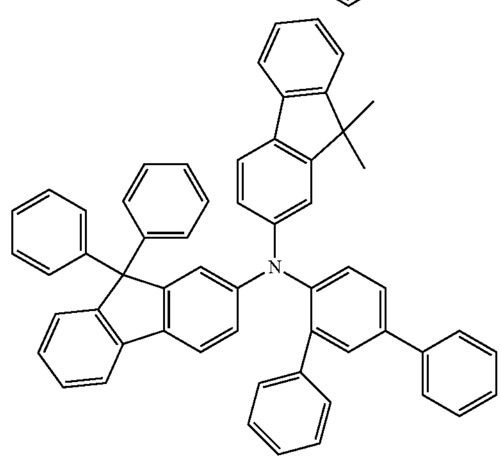
[Formula 133]
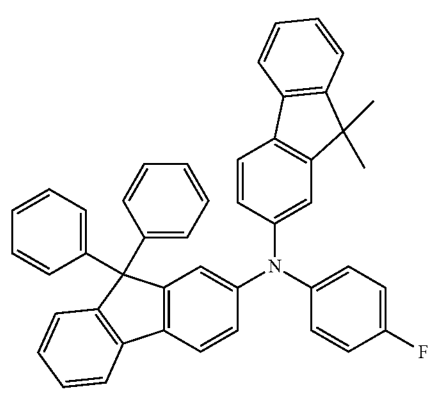

-continued
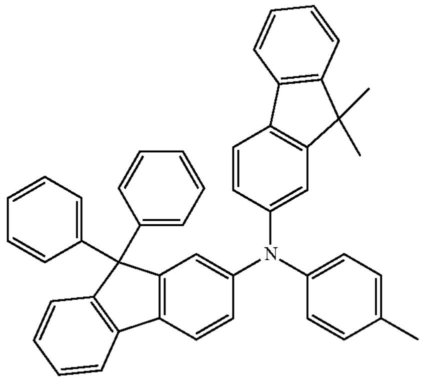
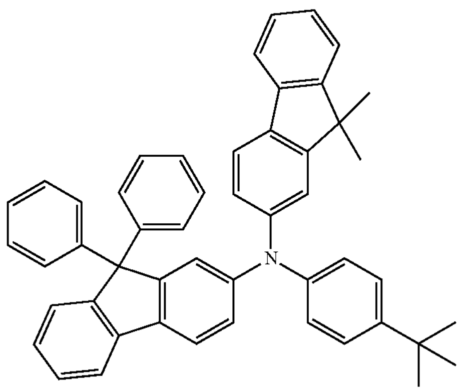
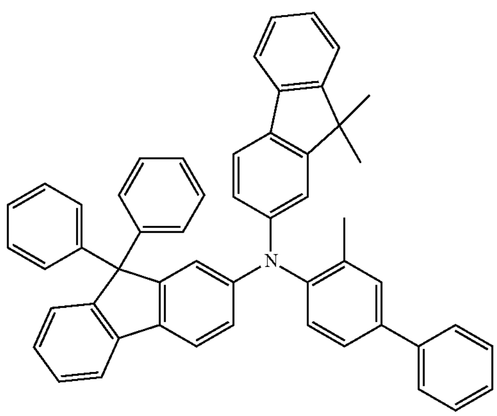
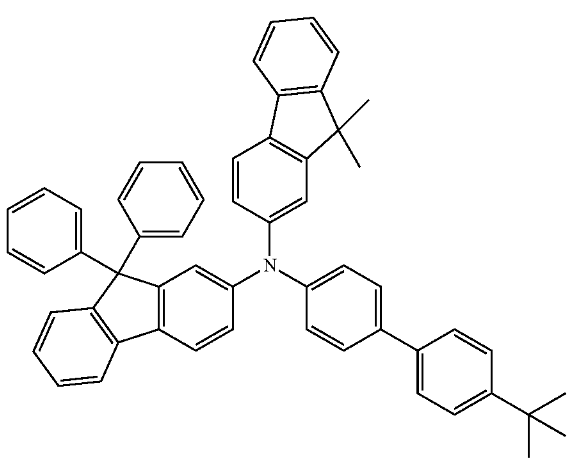
-continued
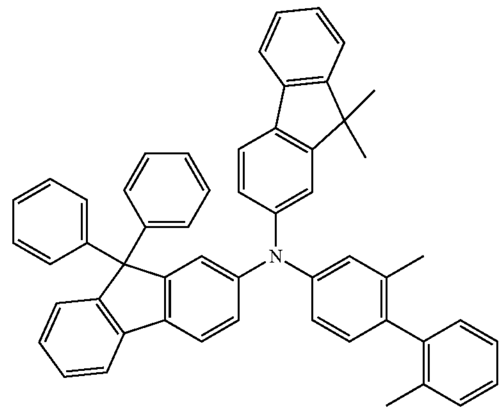
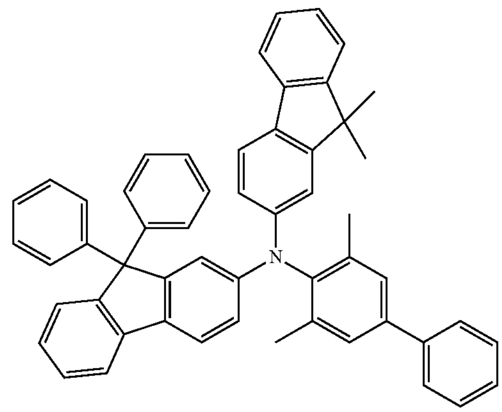
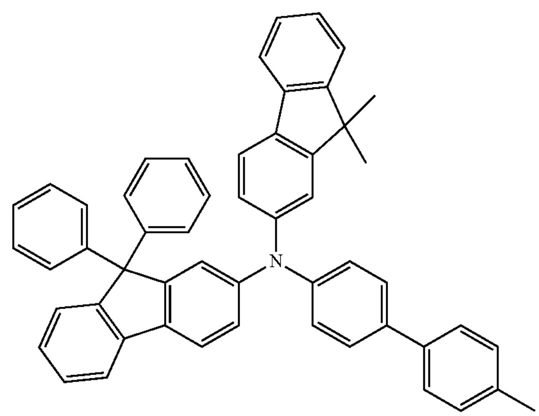
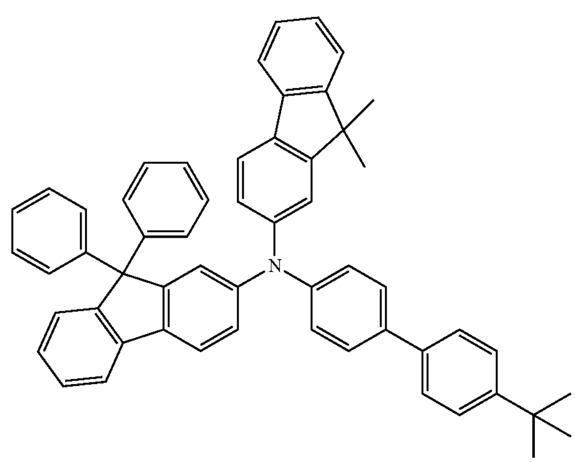

-continued
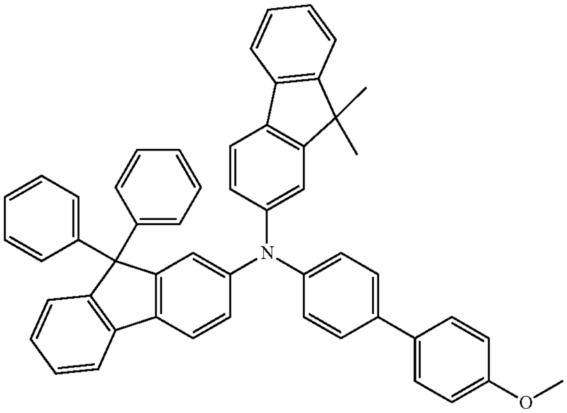
[Formula 134]
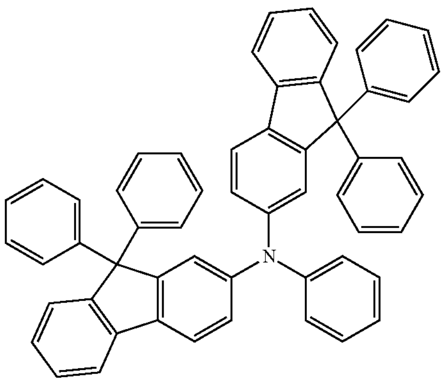
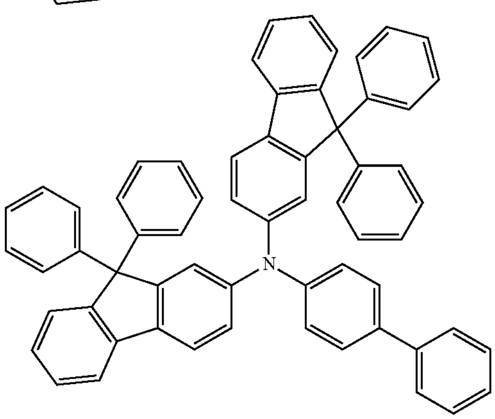
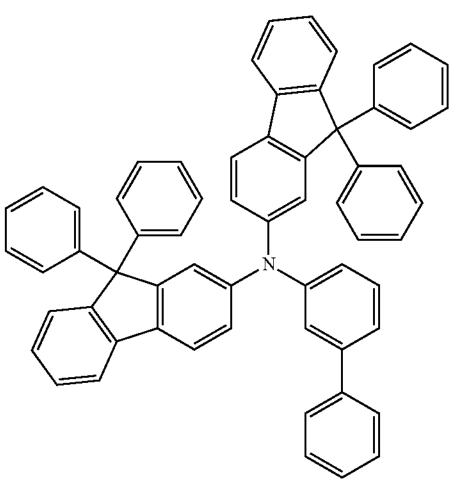
-continued
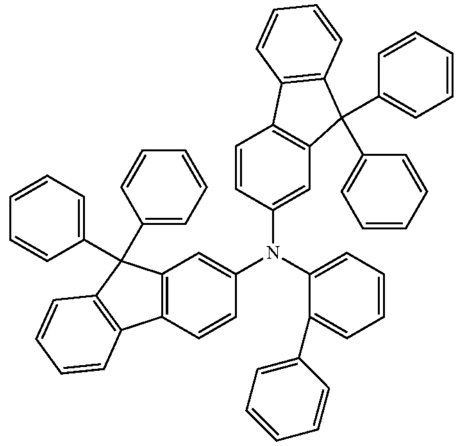
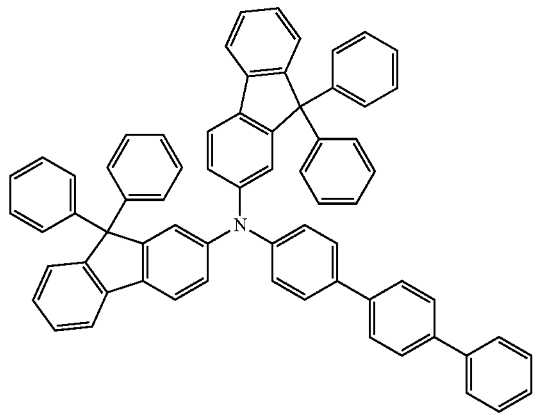
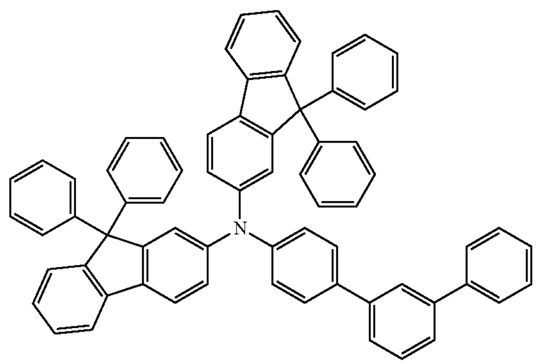
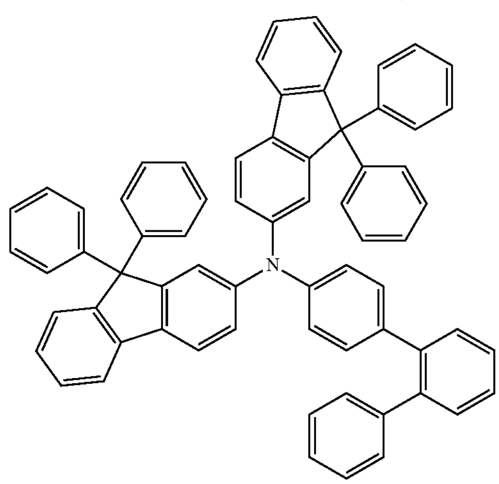

-continued
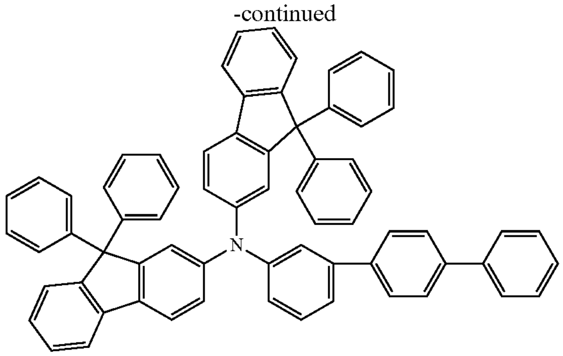
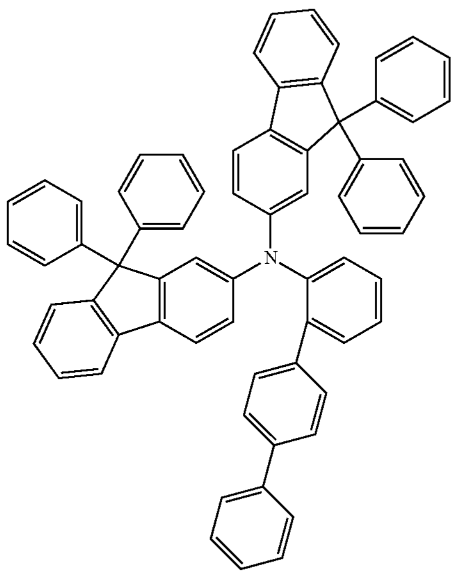
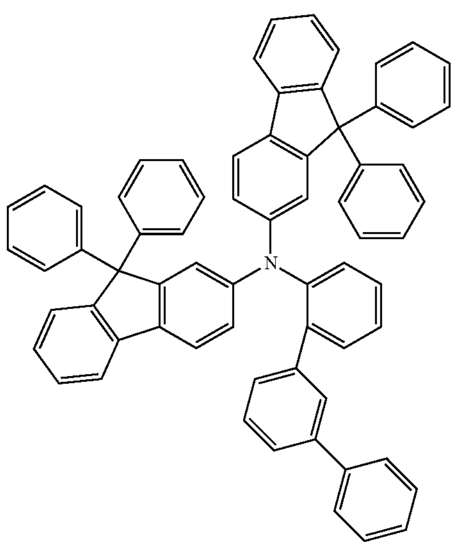
-continued
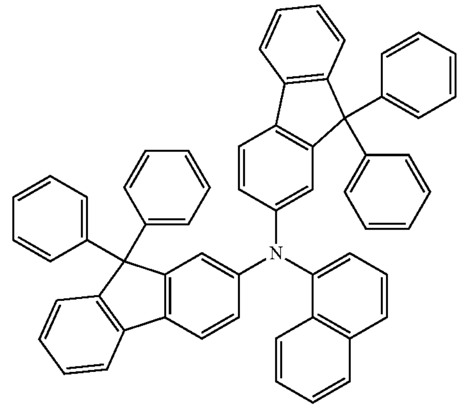
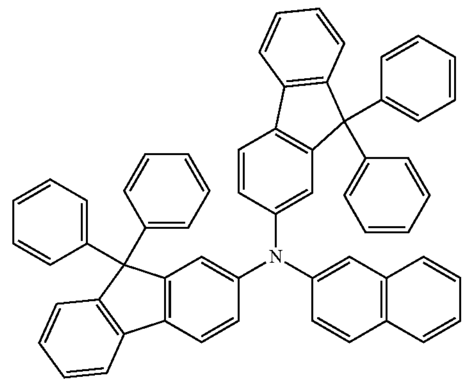
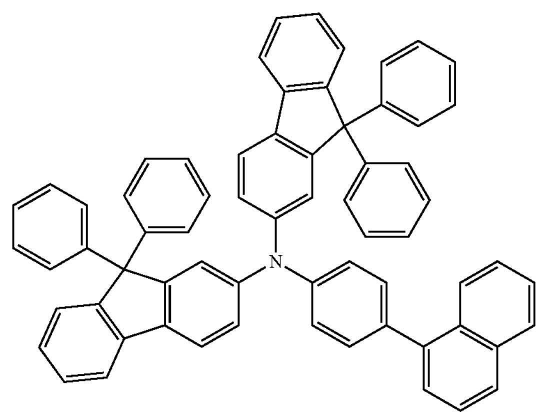
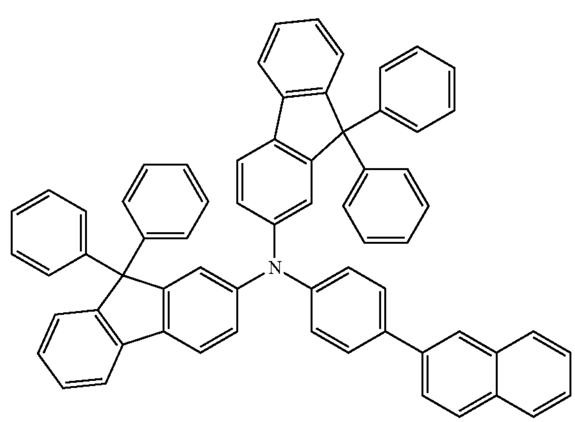

-continued
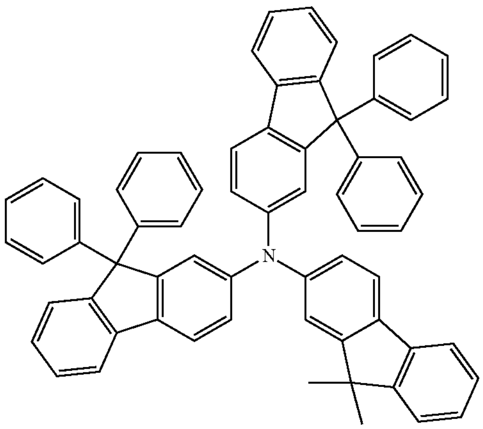
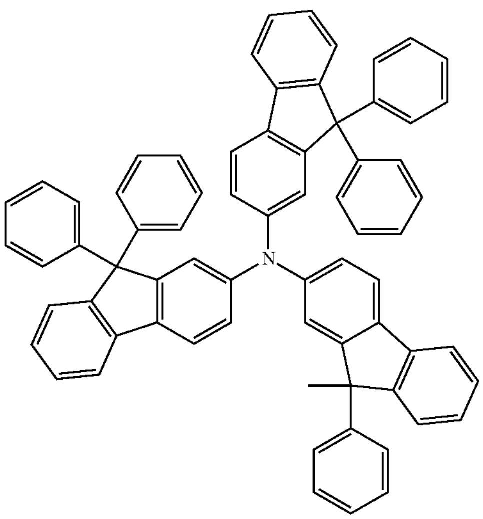
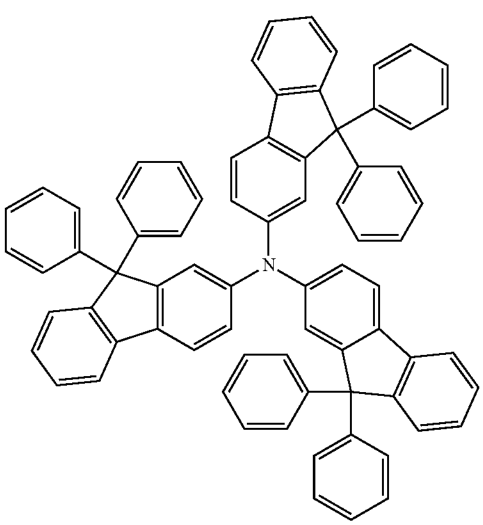
-continued
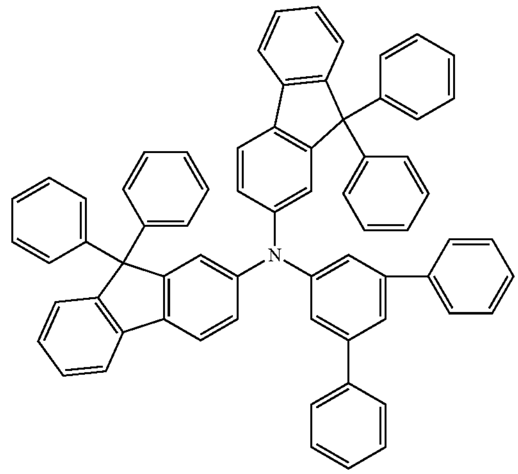
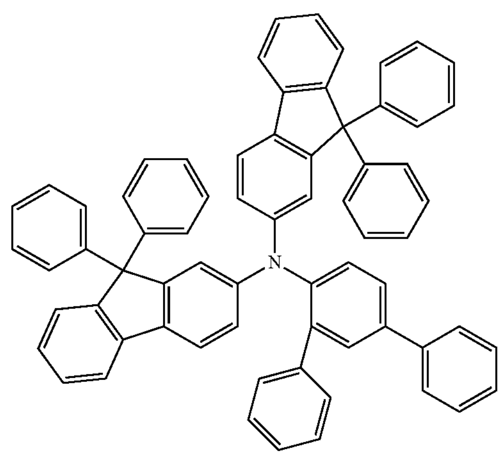
[Formula 135]
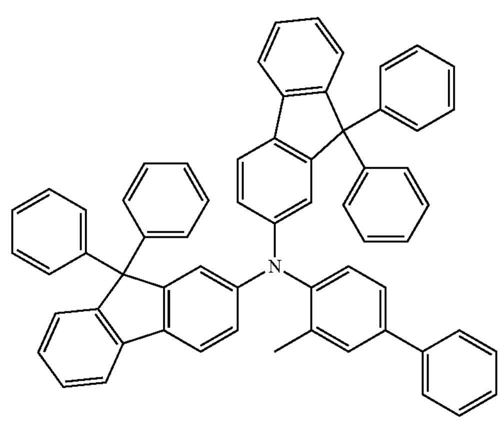

-continued
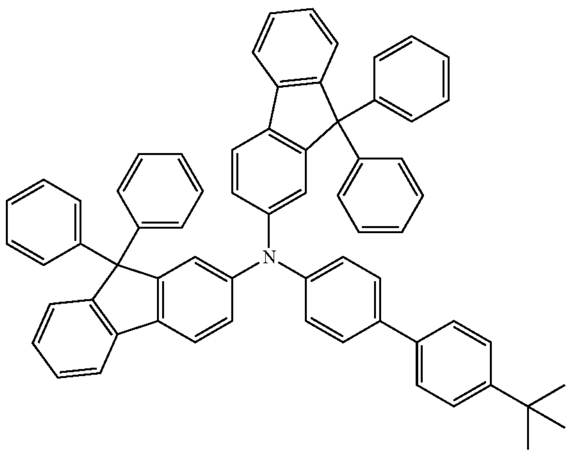
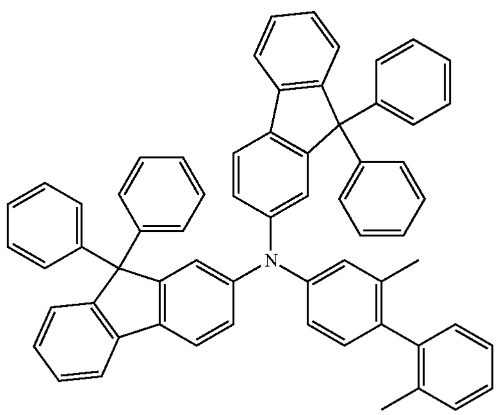
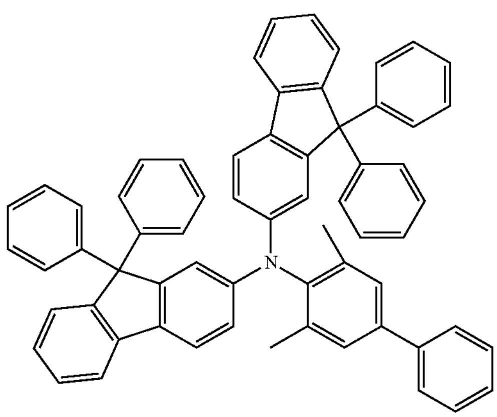
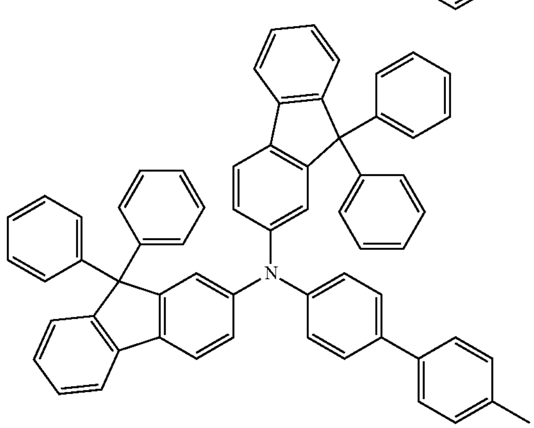
-continued
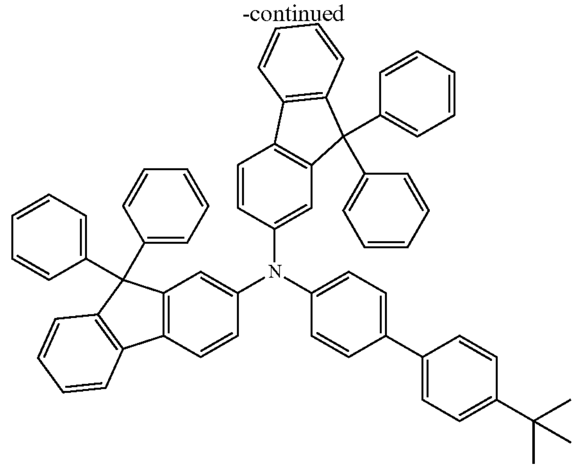
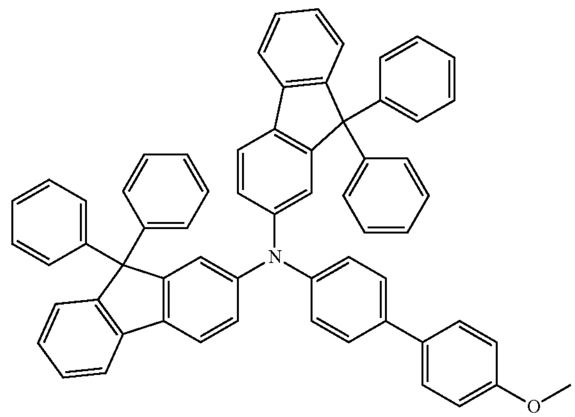
[Formula 136]
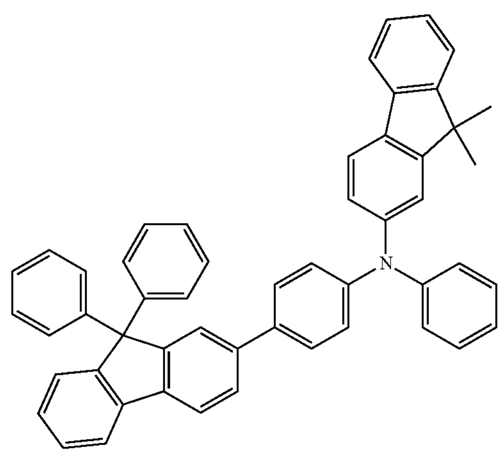
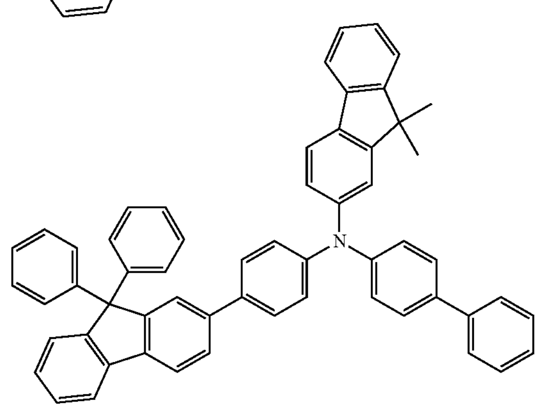

-continued
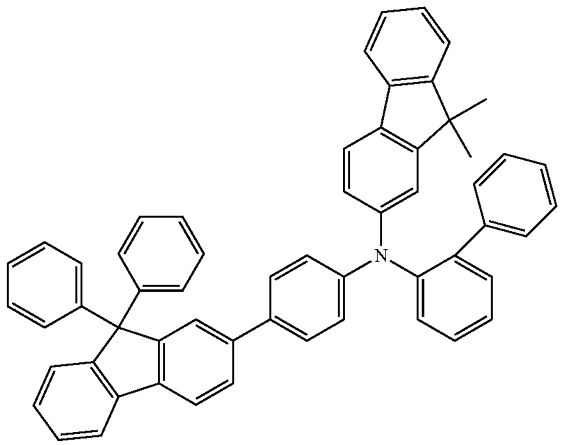
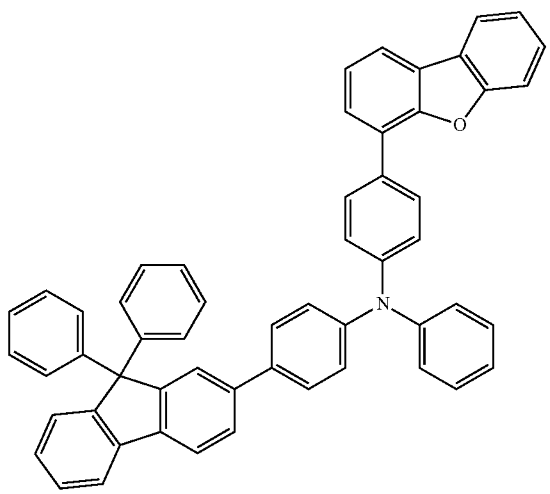
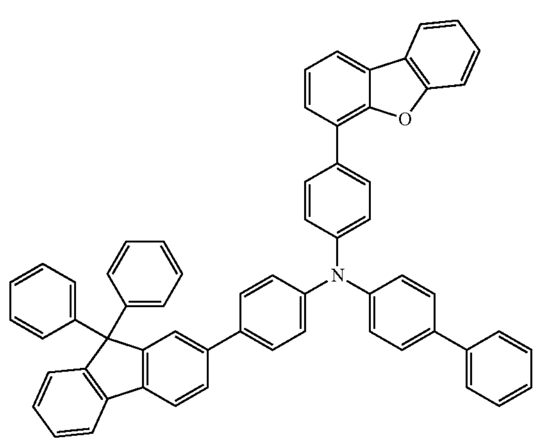
-continued
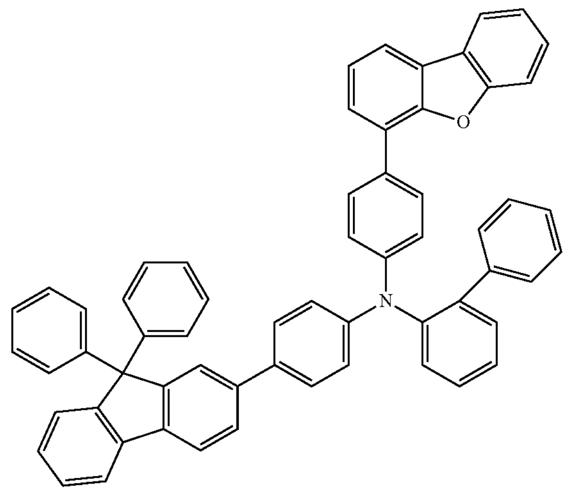
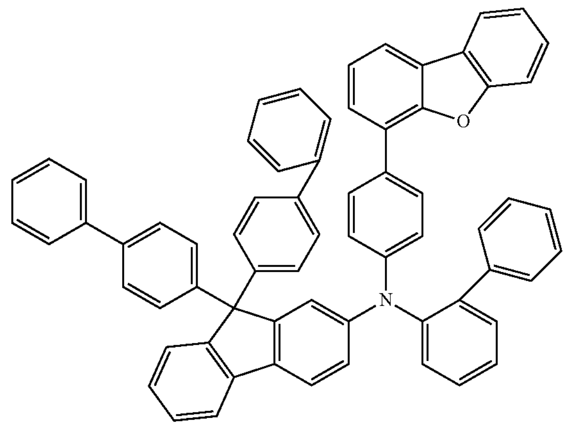
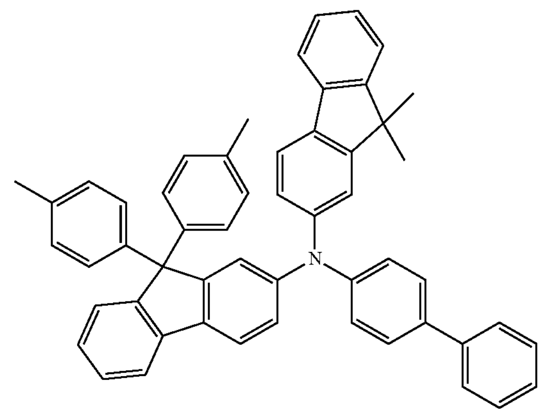
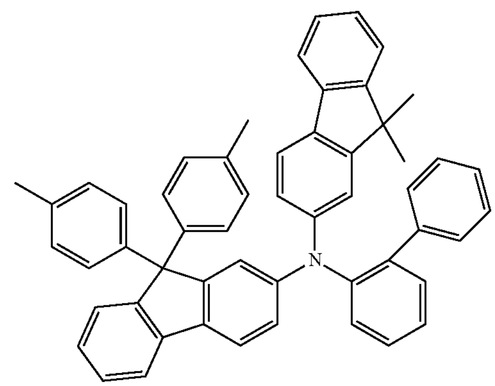

-continued
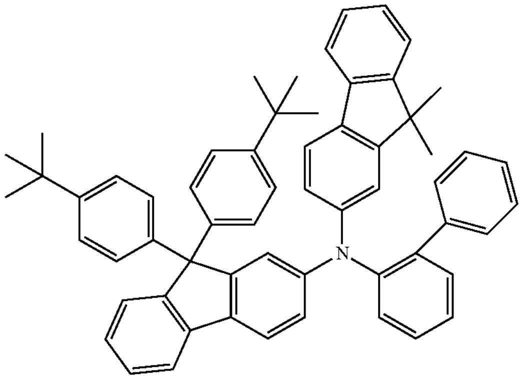
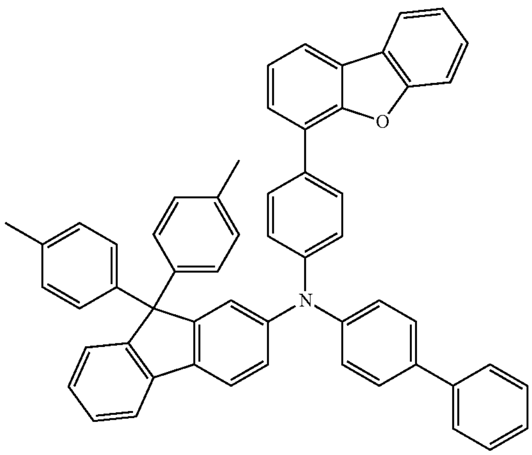
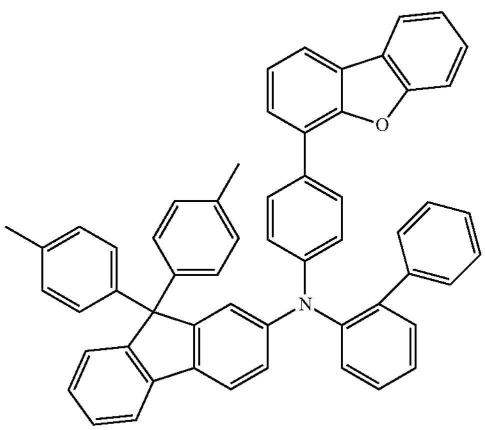
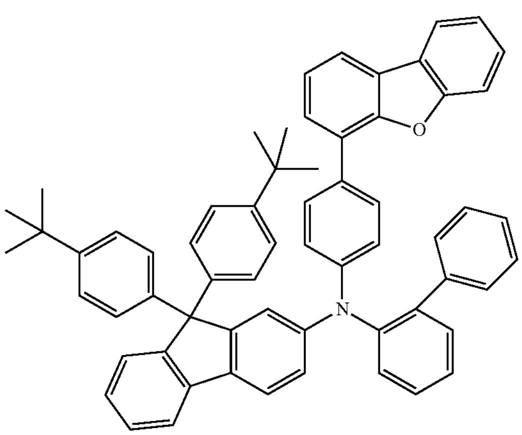
-continued
[Formula 137]
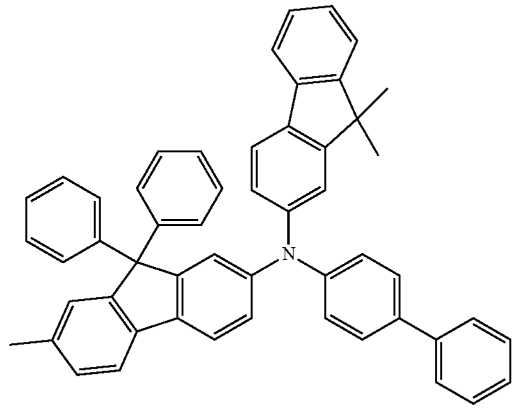
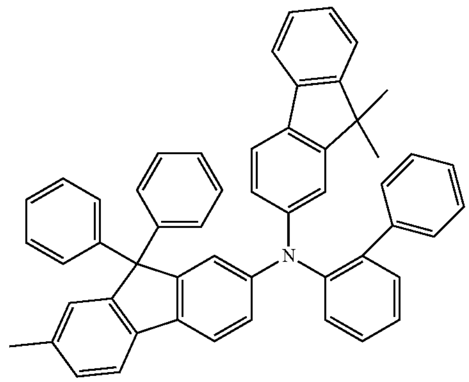
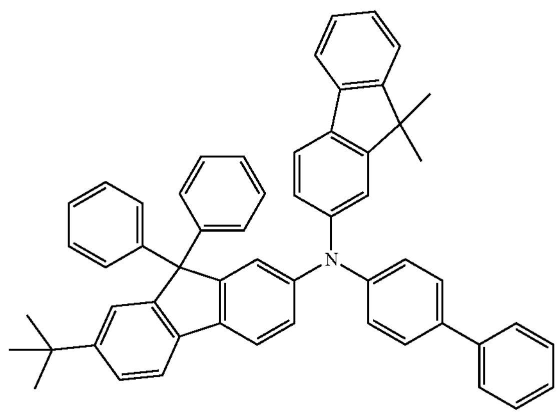
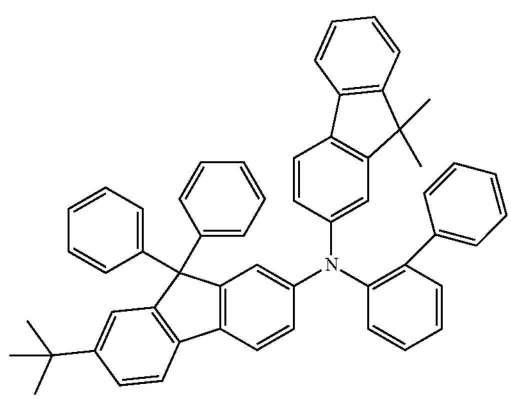

-continued
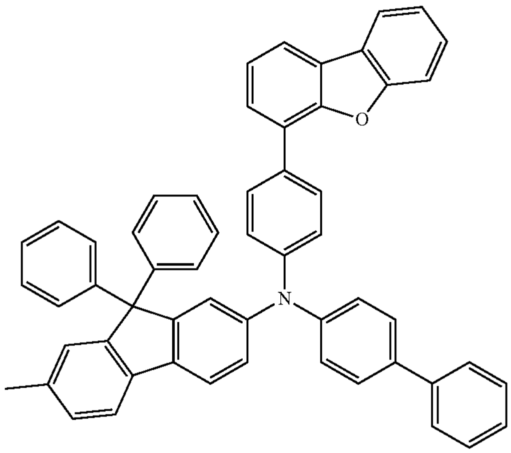
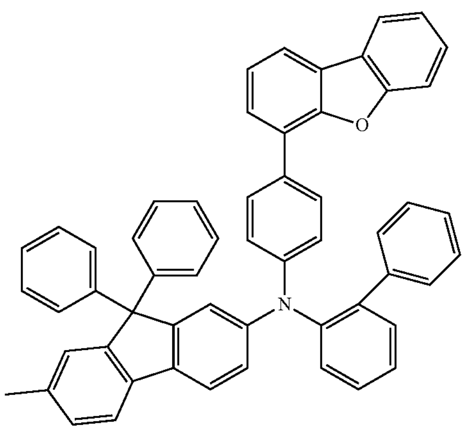
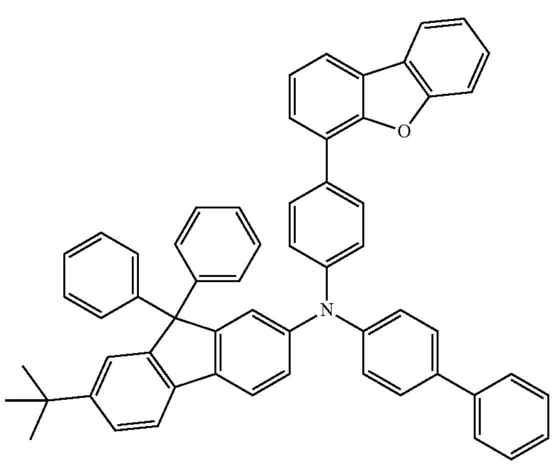
-continued
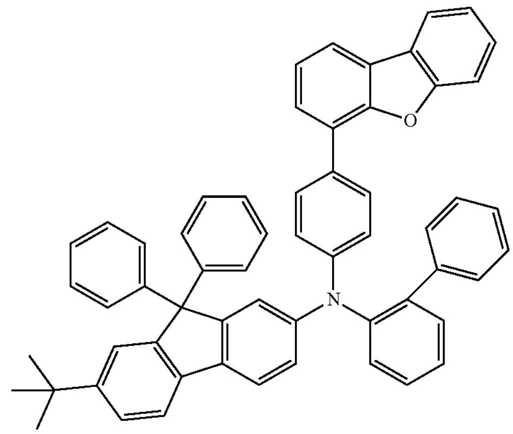
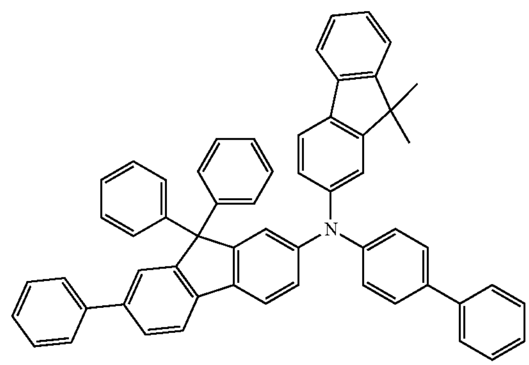
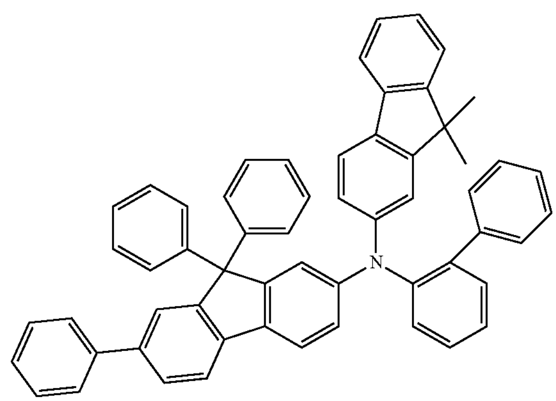
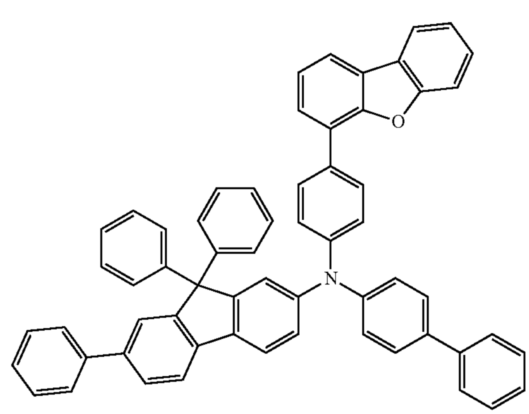

-continued
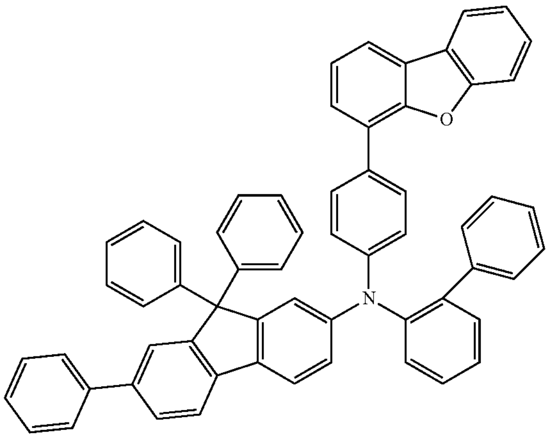
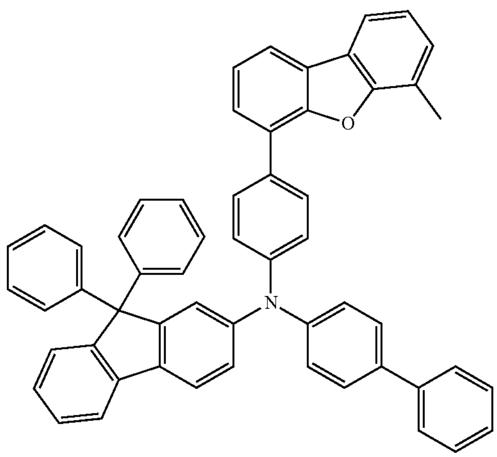
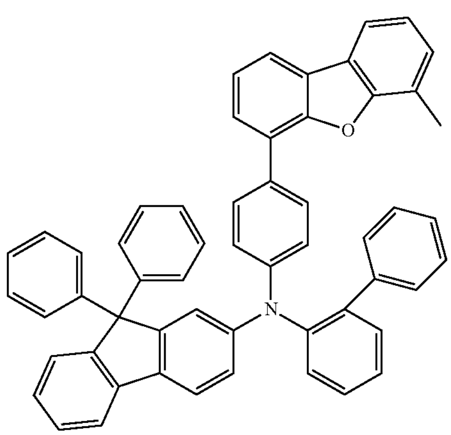
-continued
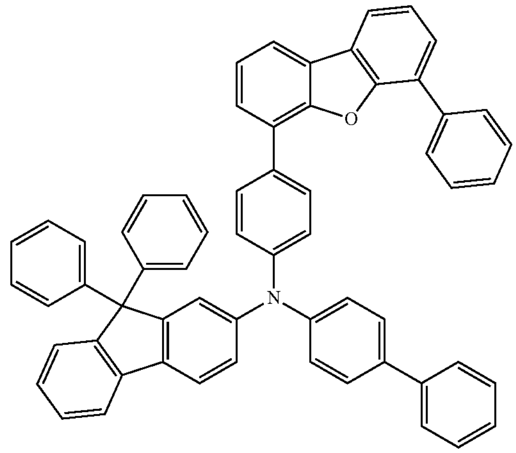
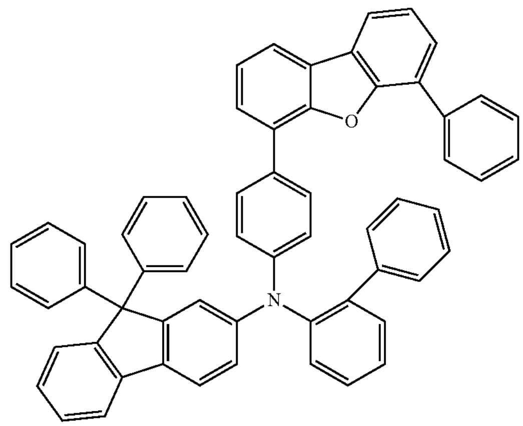
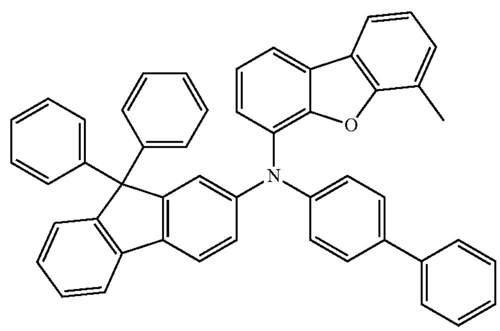
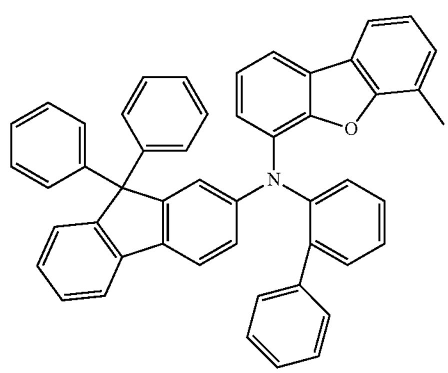

-continued
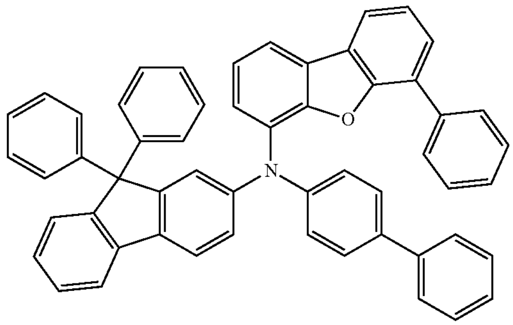
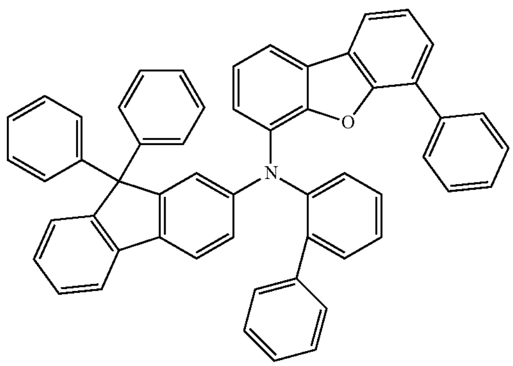
[Formula 138]
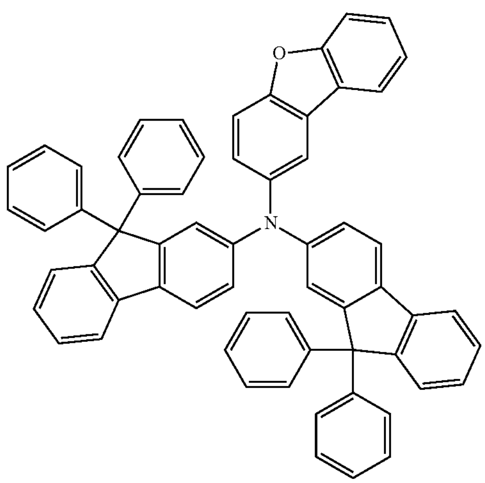
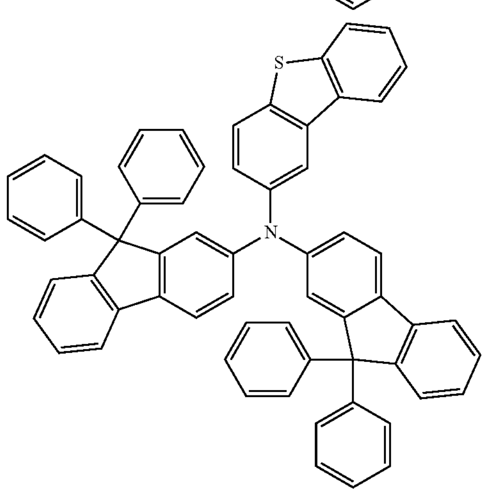
-continued
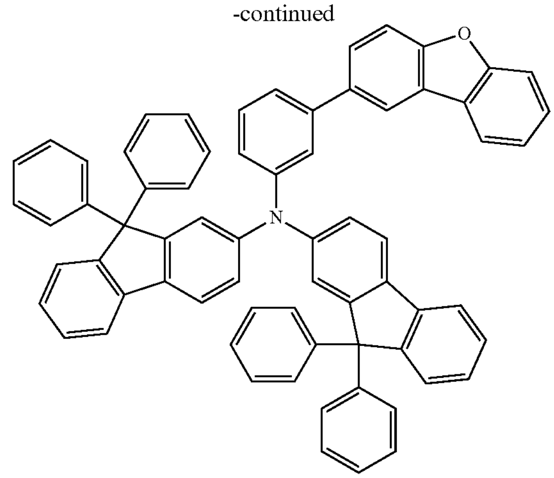
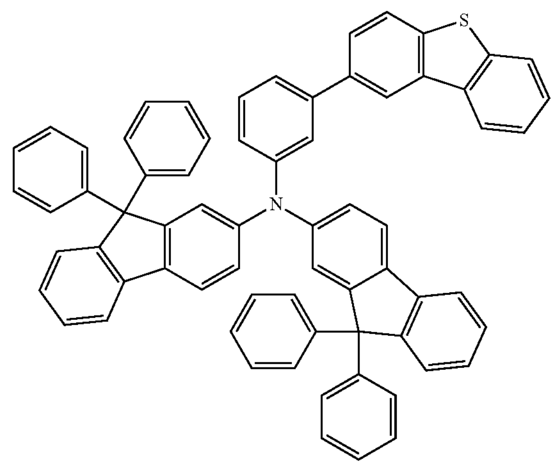
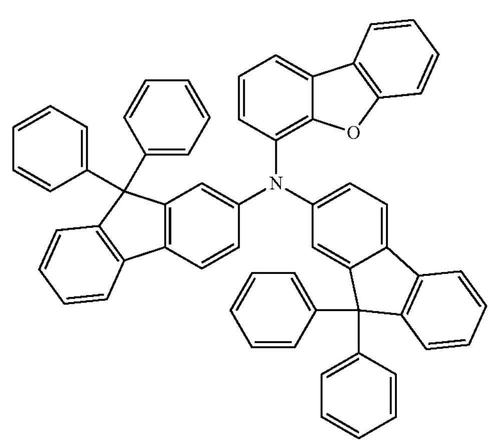

-continued
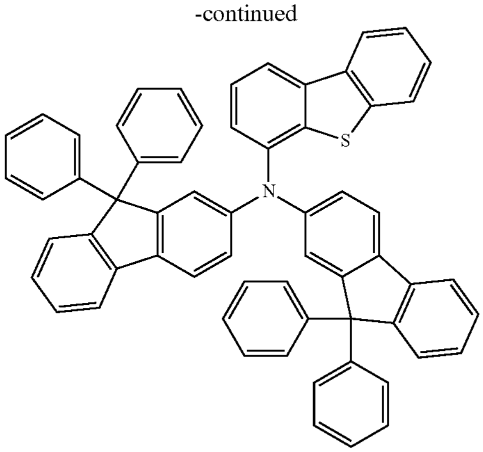
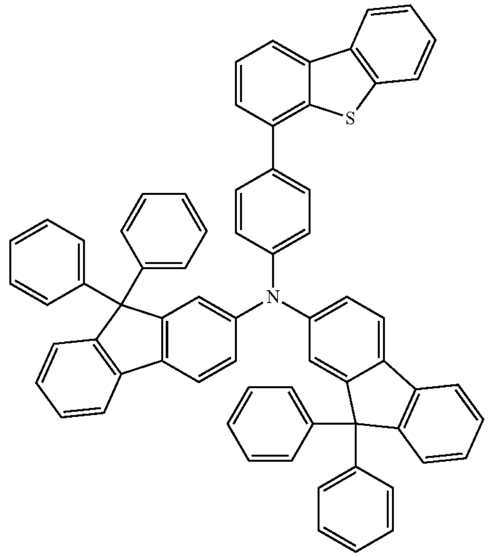
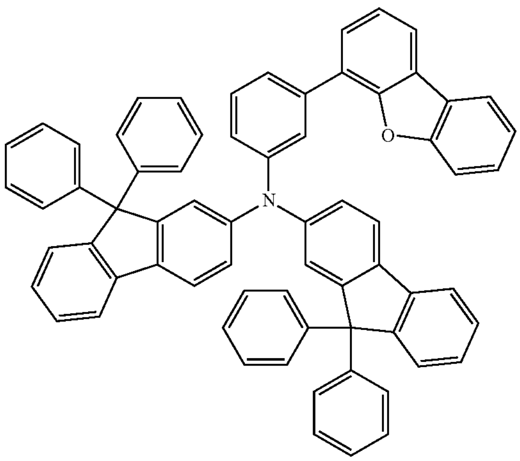
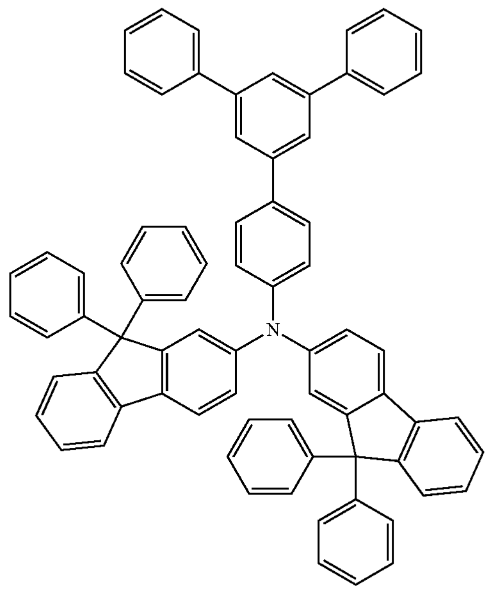
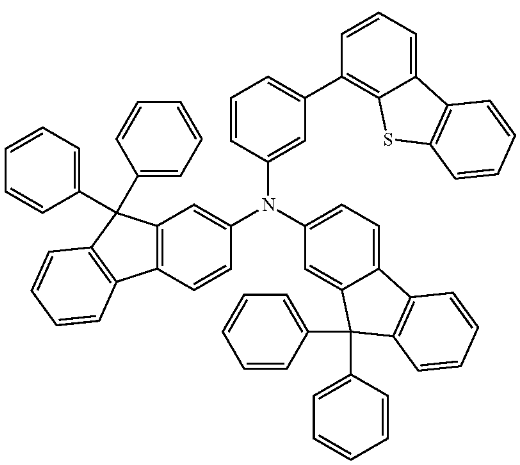
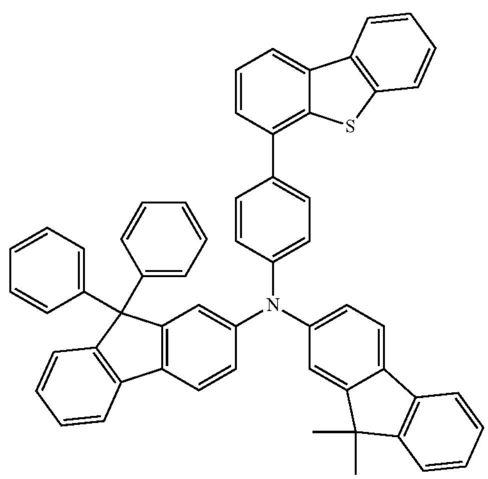

-continued
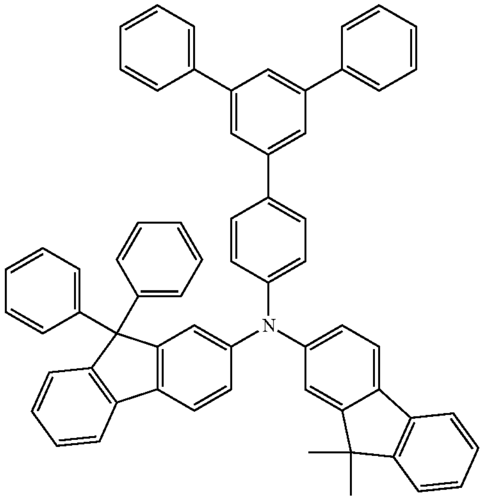
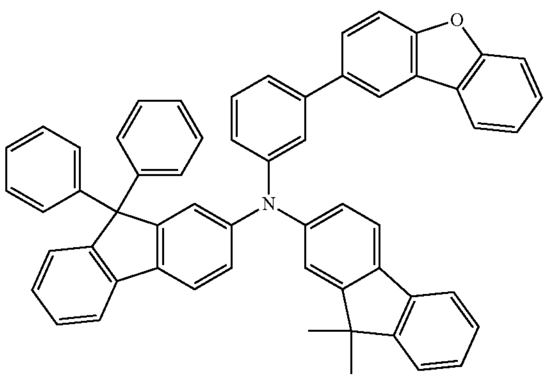
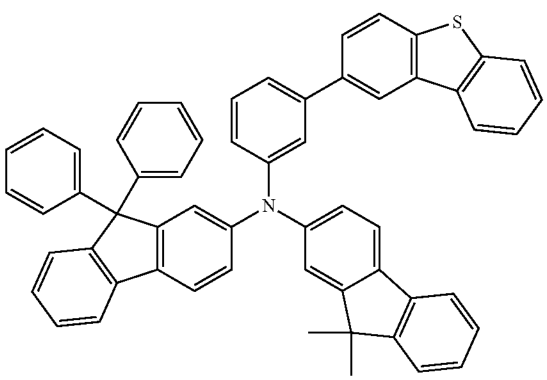
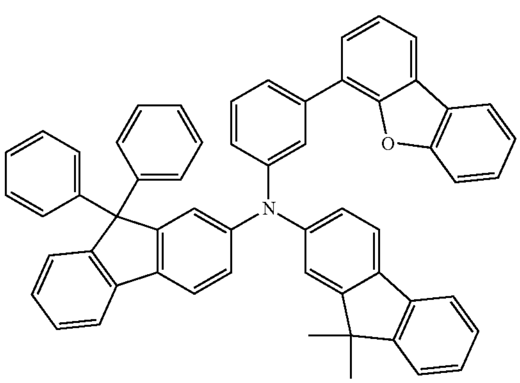
-continued
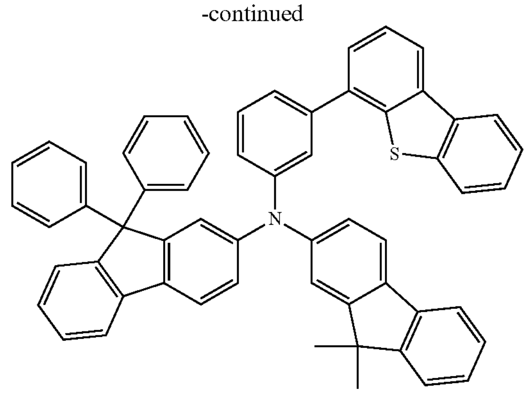
[Formula 139]
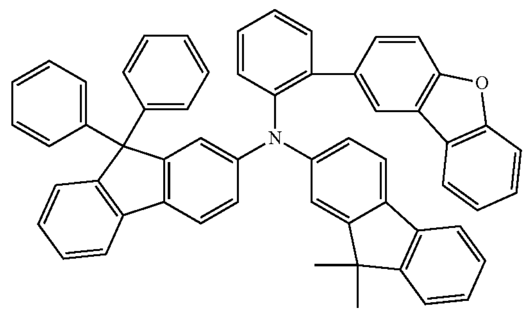
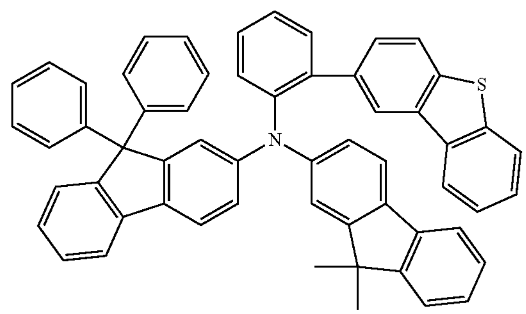
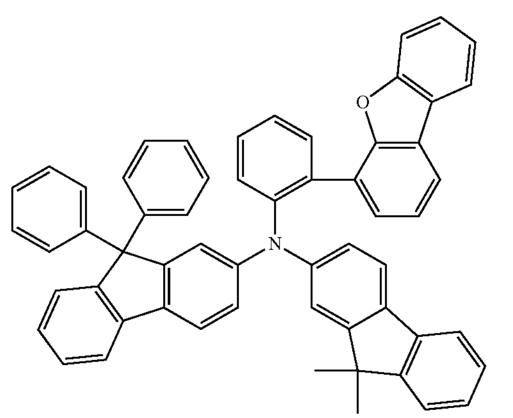

-continued
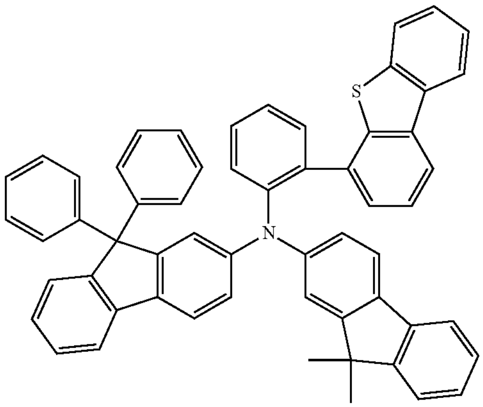
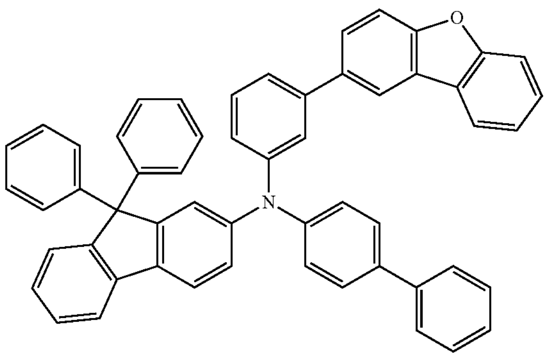
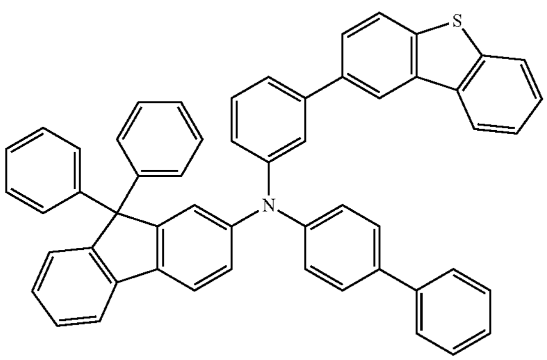
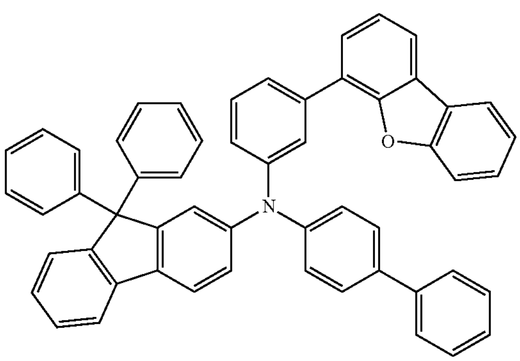
-continued
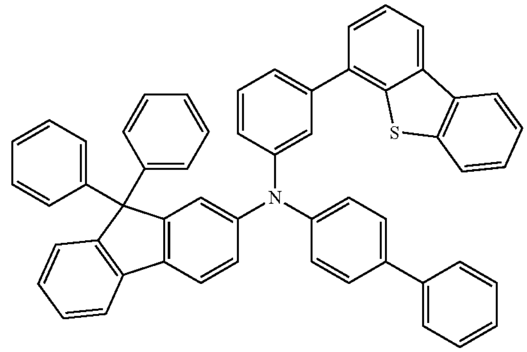
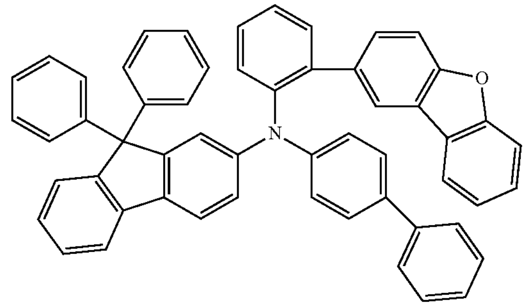
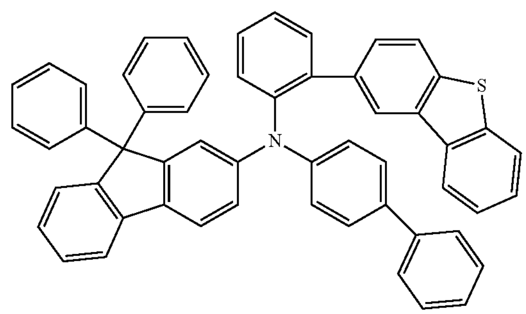
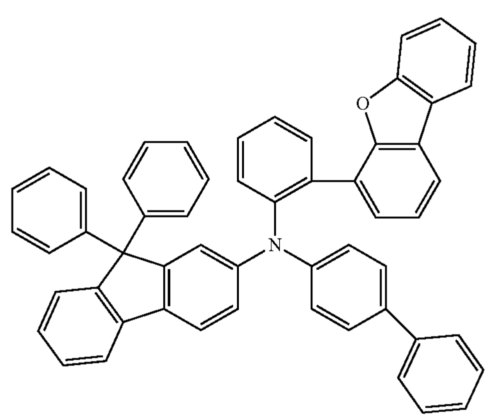

-continued
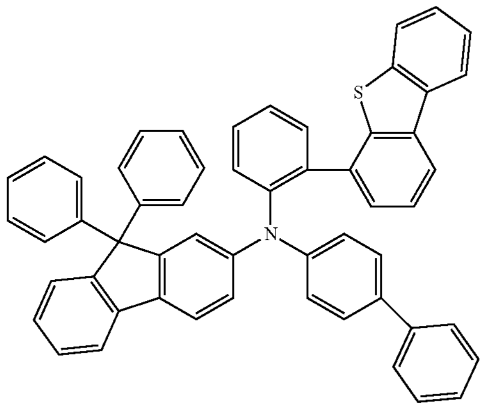
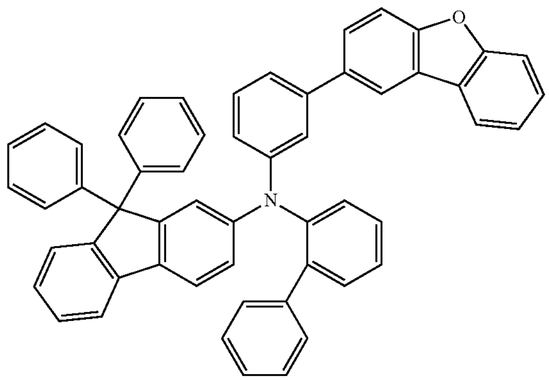
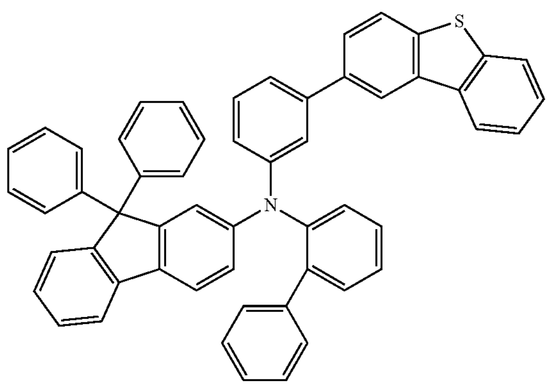
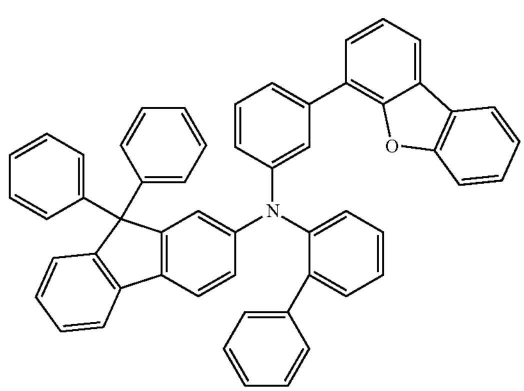
-continued
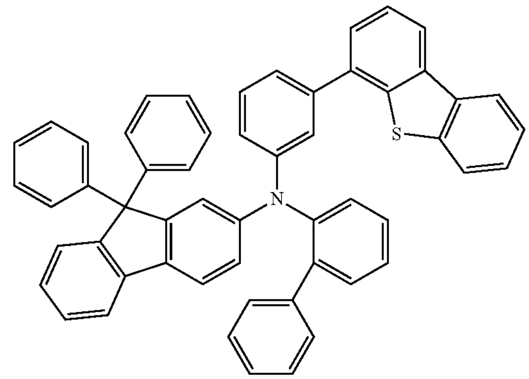
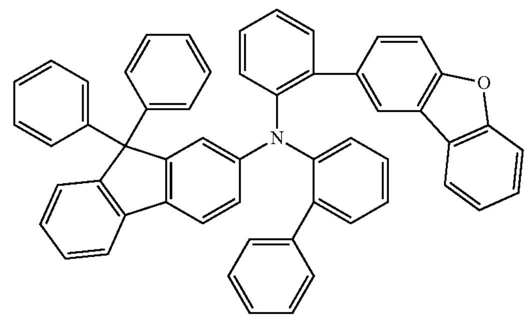
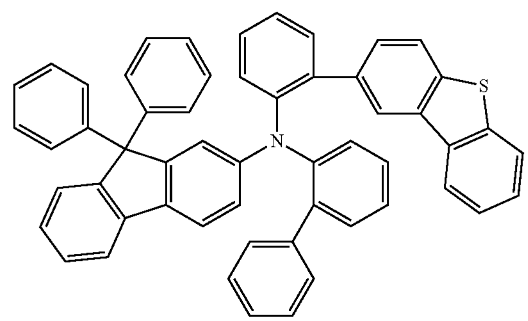
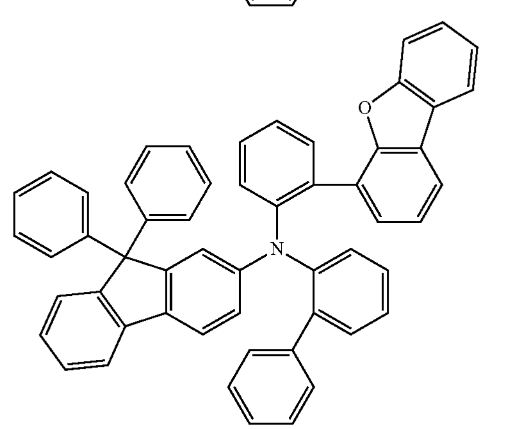

-continued
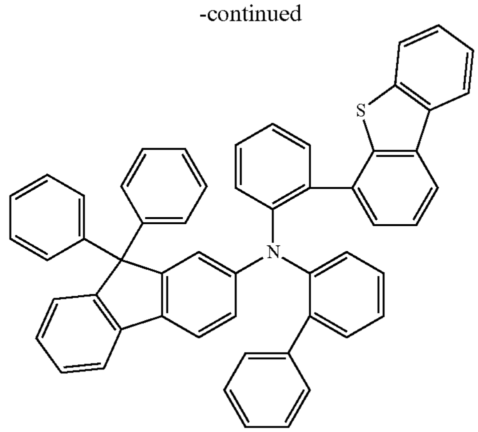
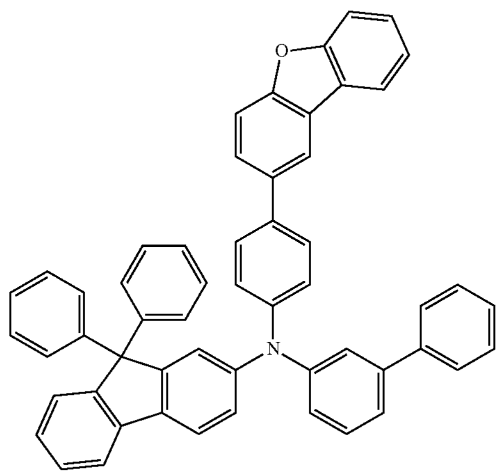
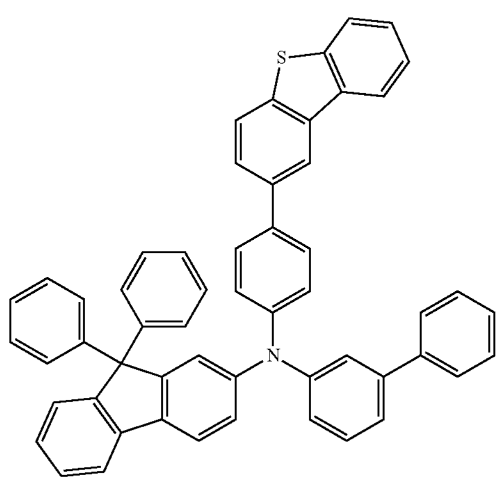
-continued
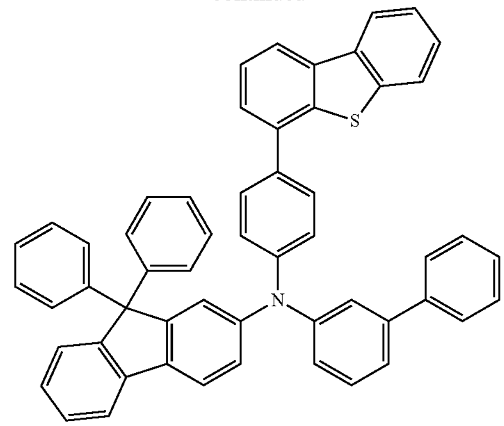
[Formula 140]
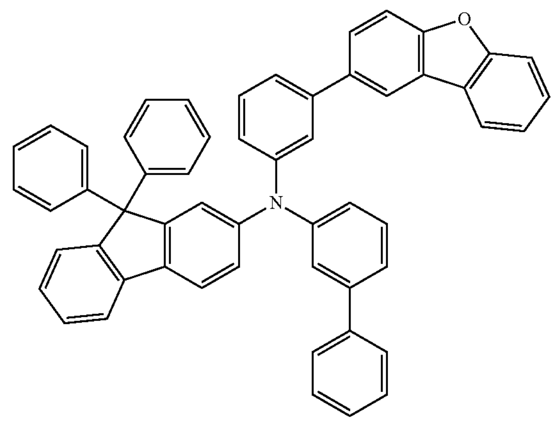
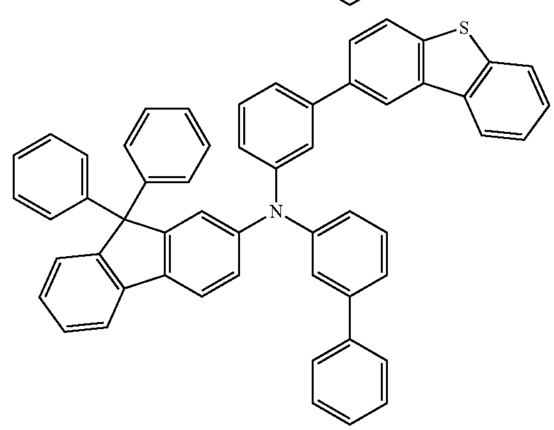
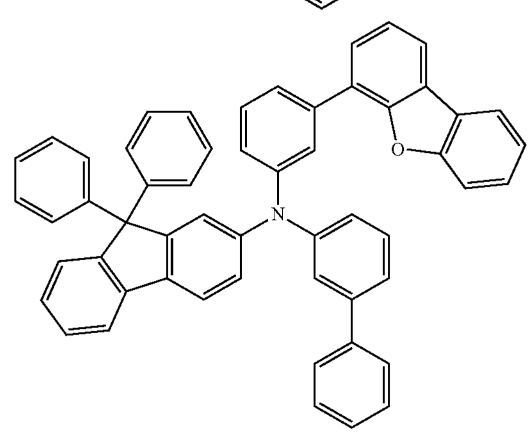

-continued
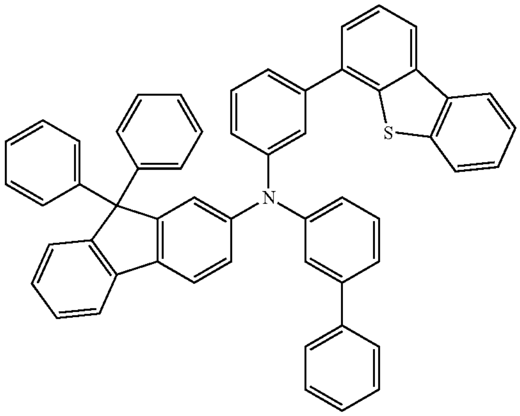
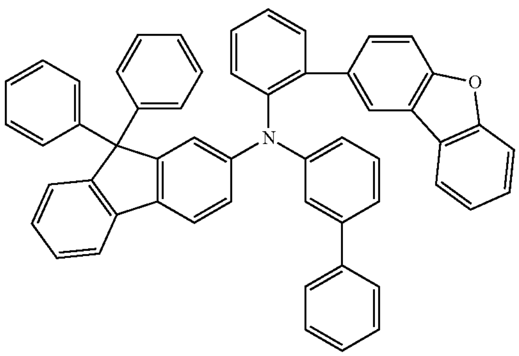
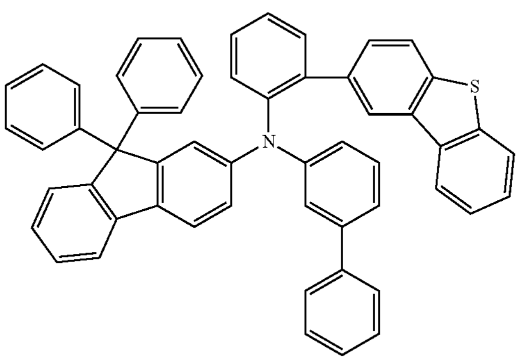
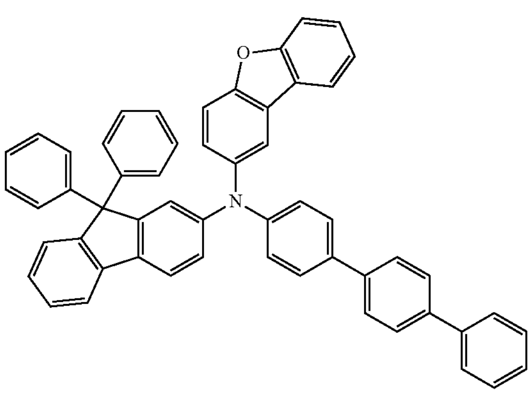
-continued
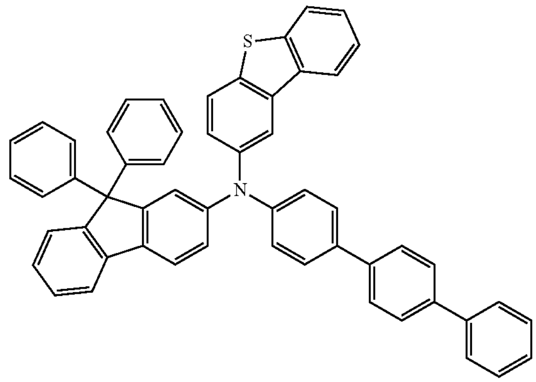
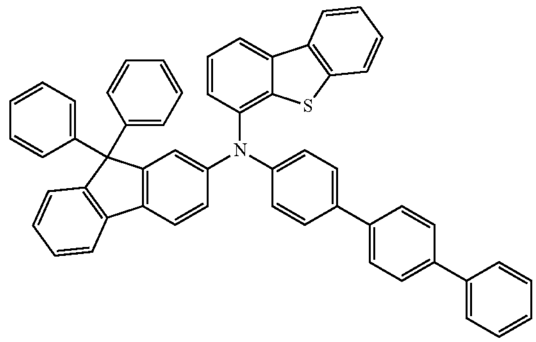
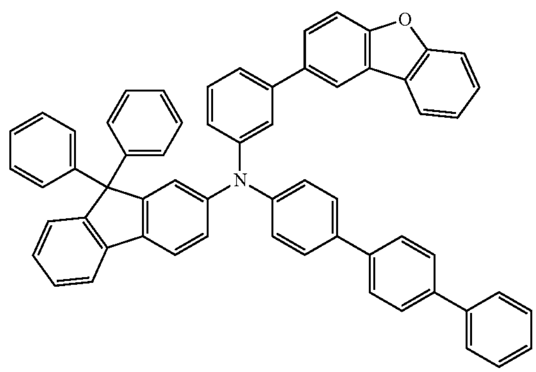
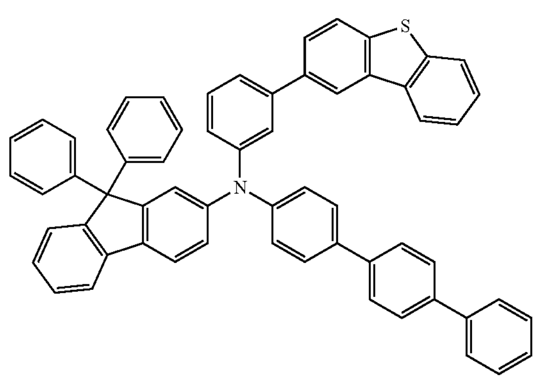

-continued
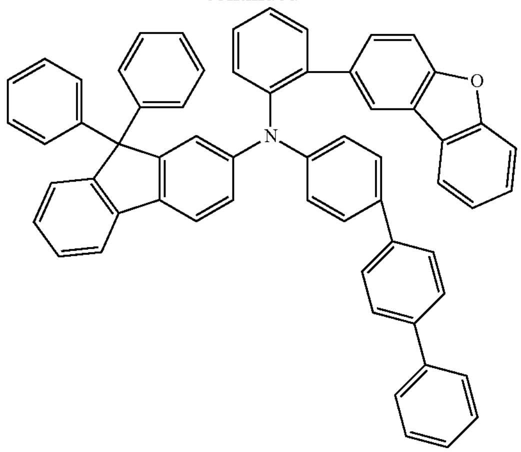
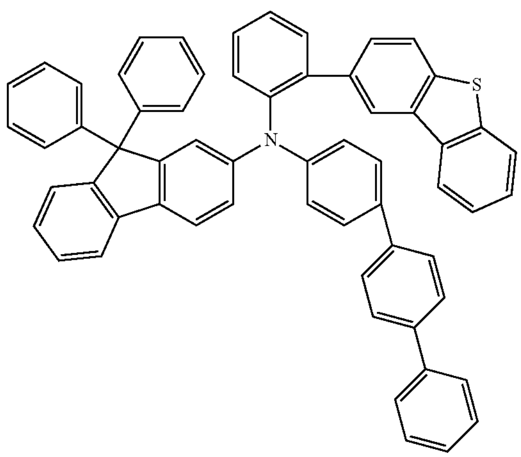
[Formula 141]
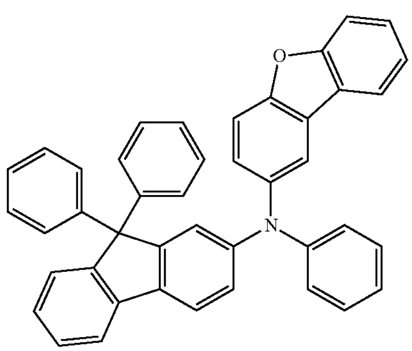
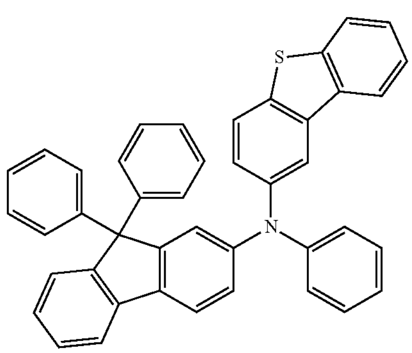
-continued
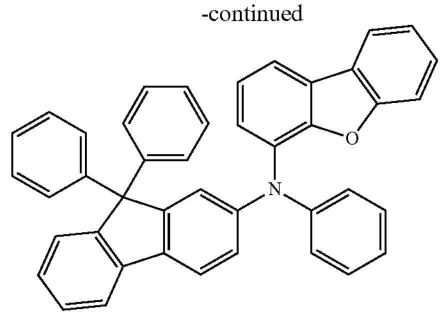
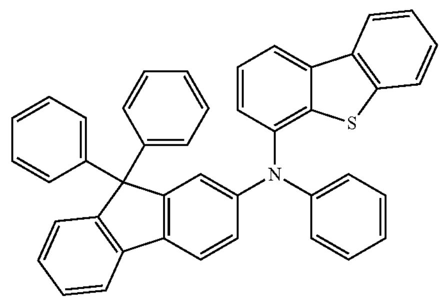
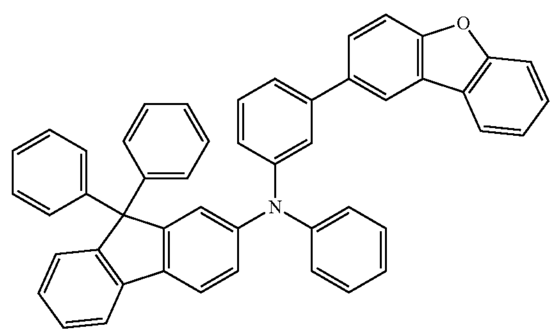
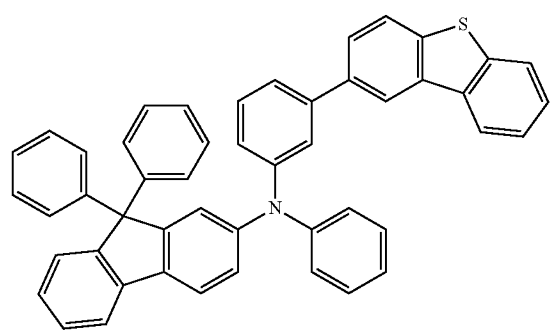
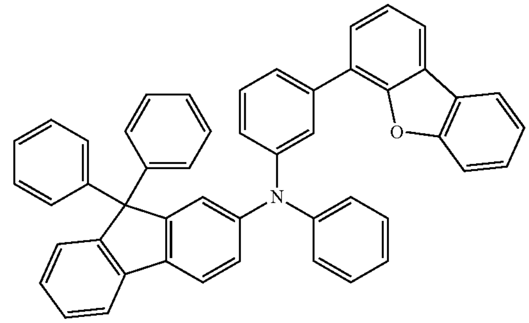

-continued
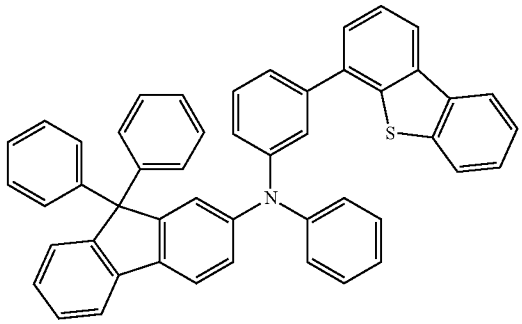
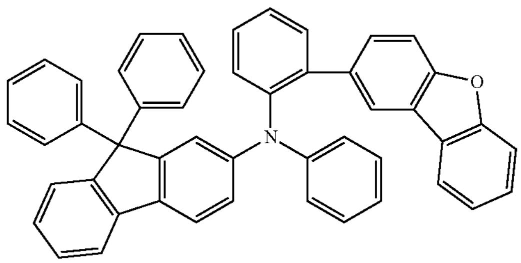
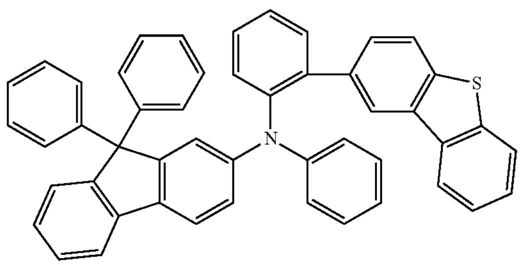
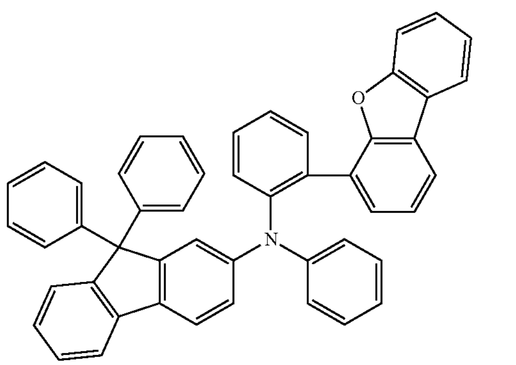
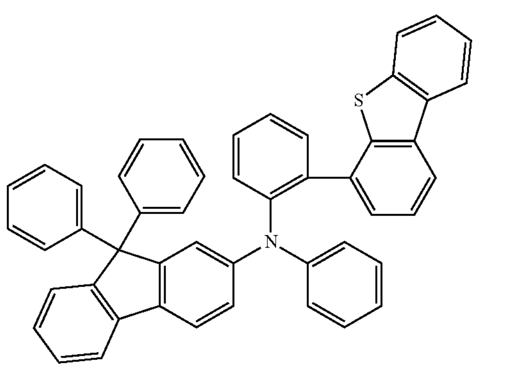
-continued
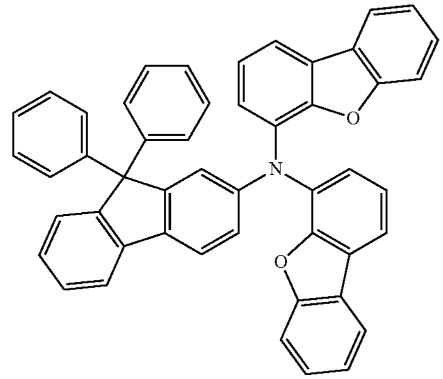
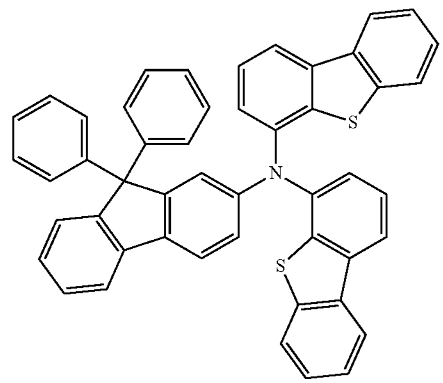
[Formula 142]
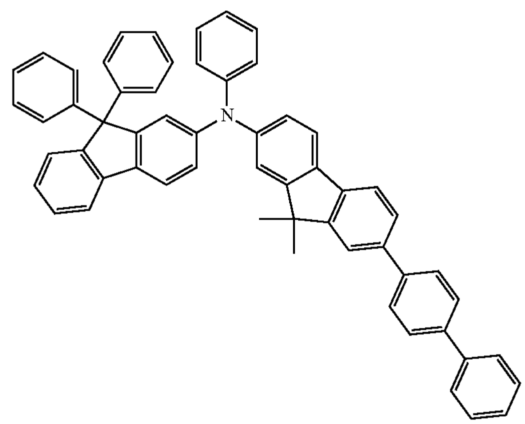
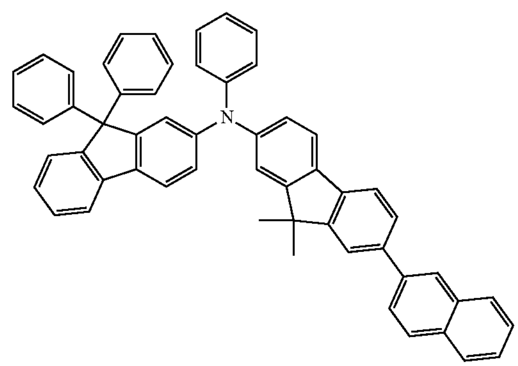

-continued
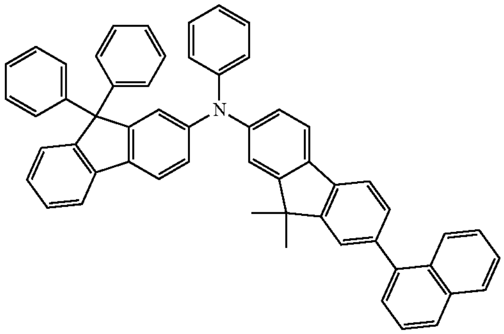
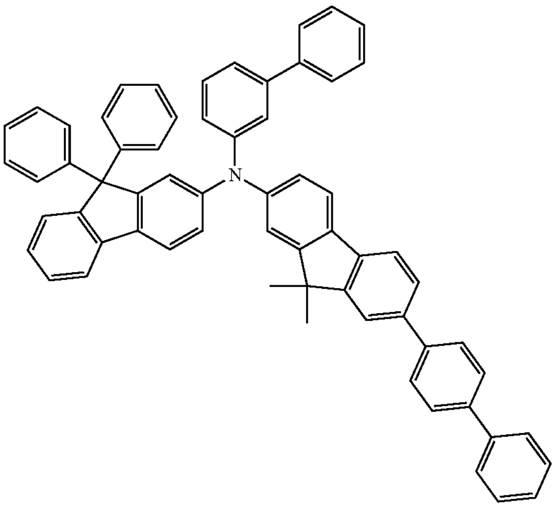
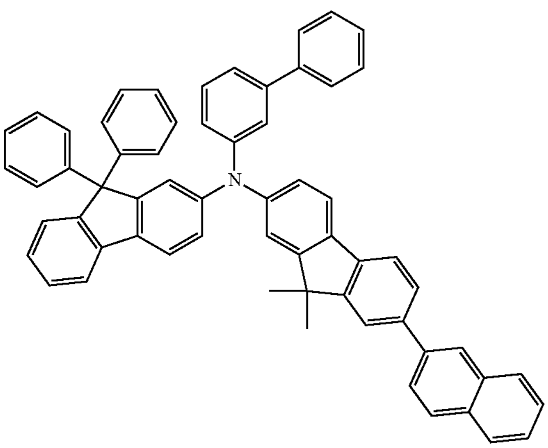
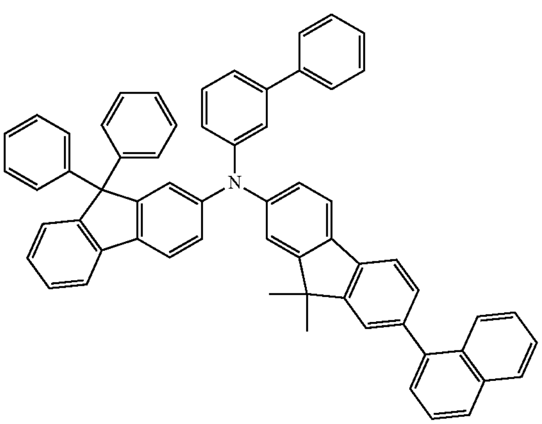
-continued
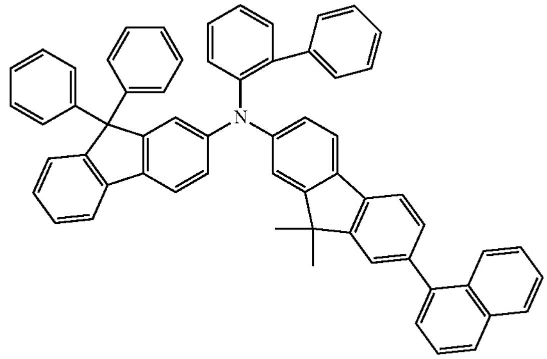
[Formula 143]
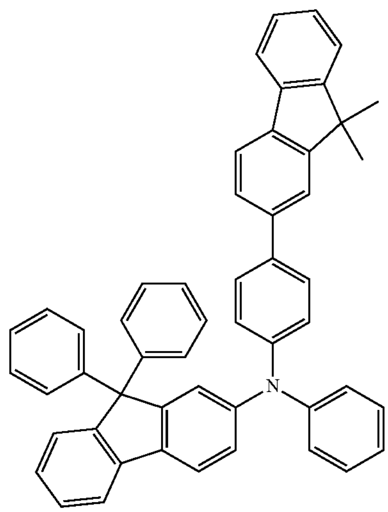
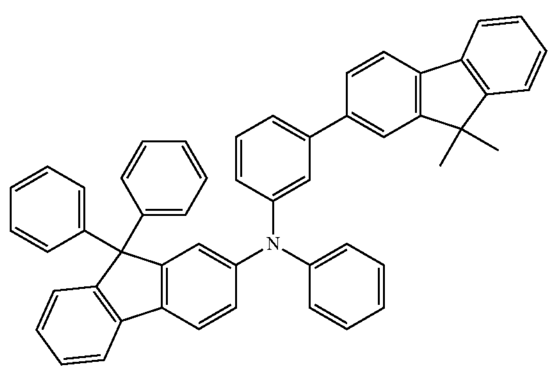

-continued
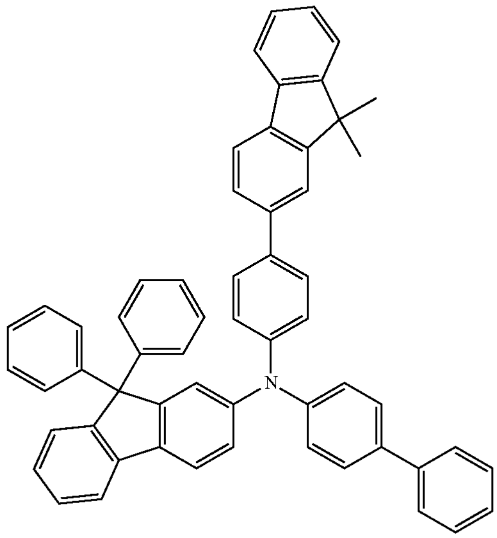
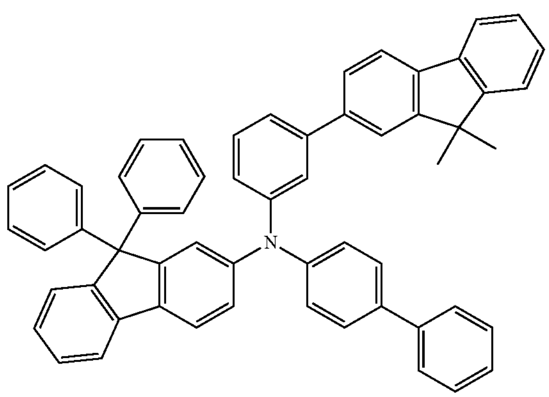
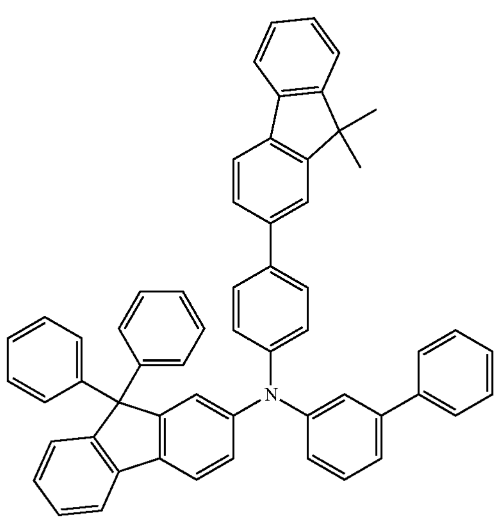
-continued
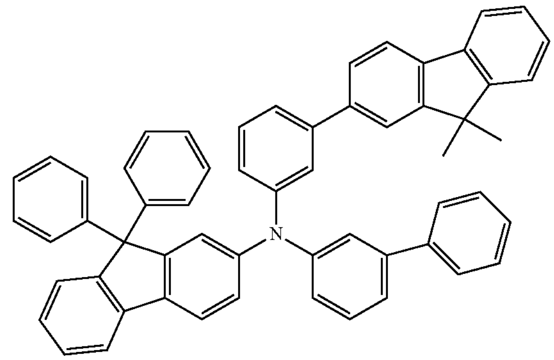
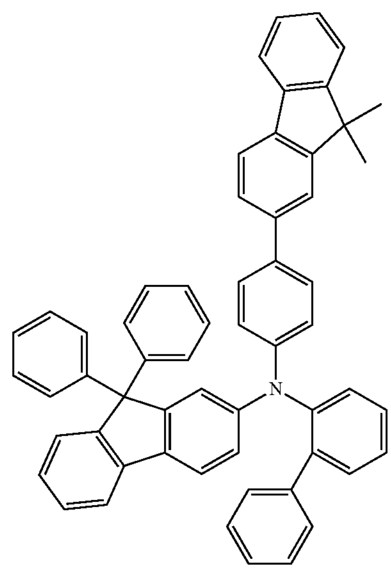
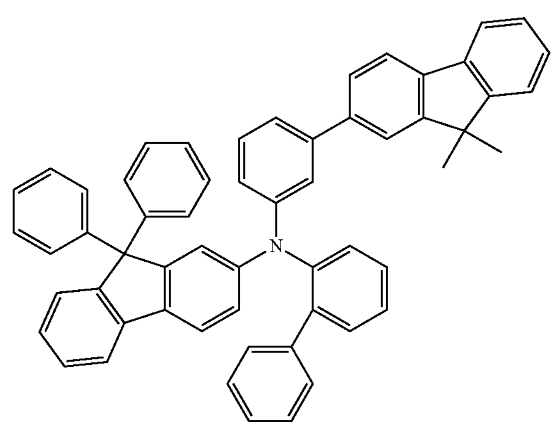

-continued
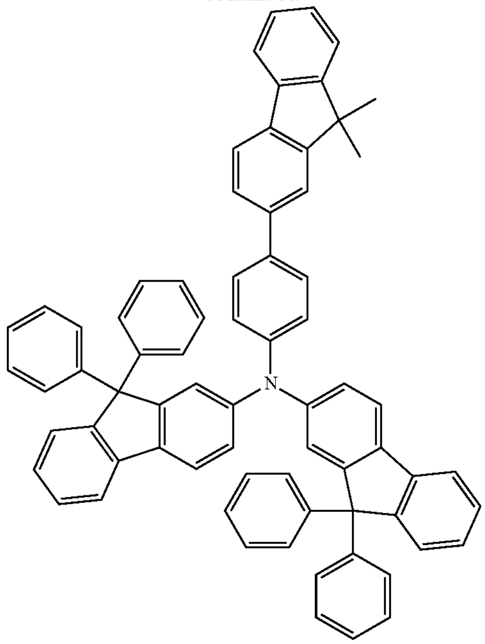
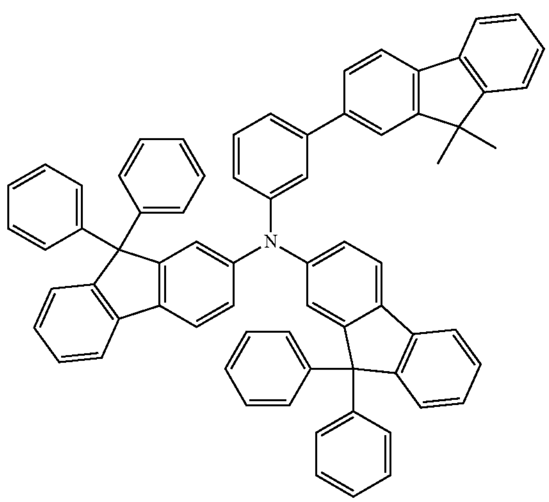
[Formula 144]
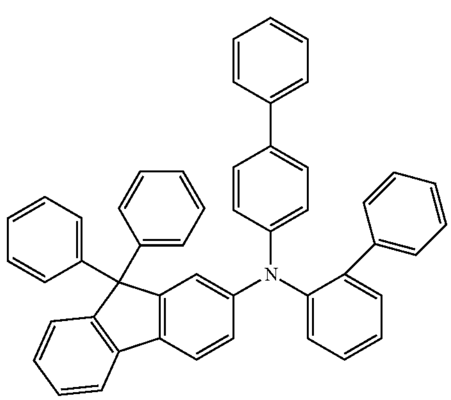
-continued
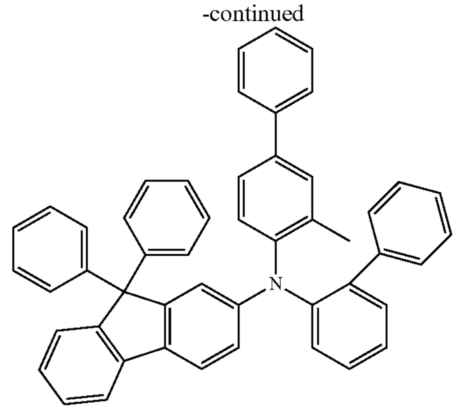
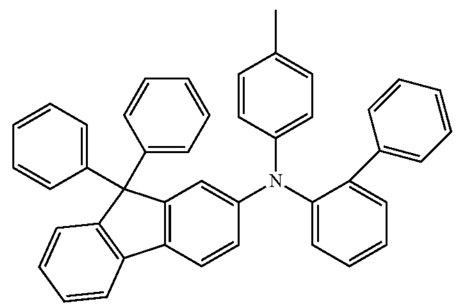
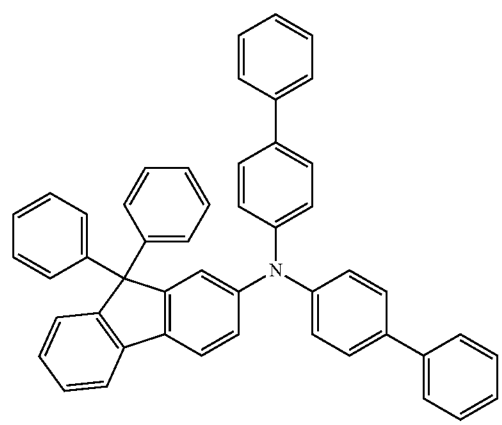
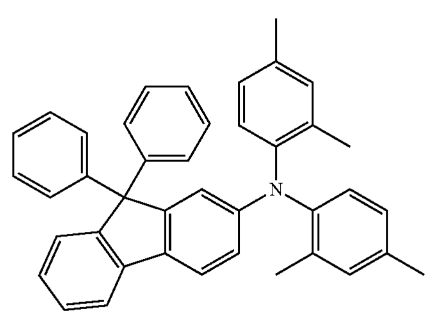

-continued
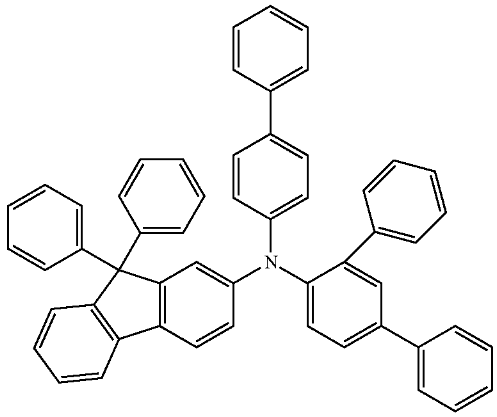
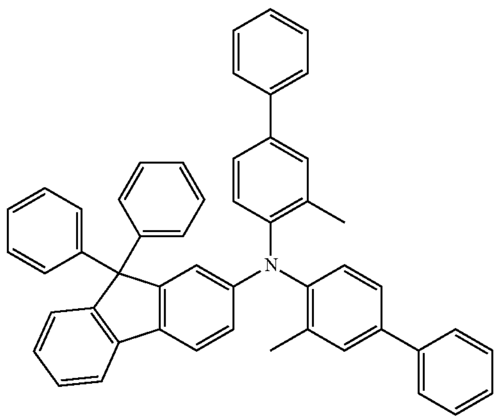
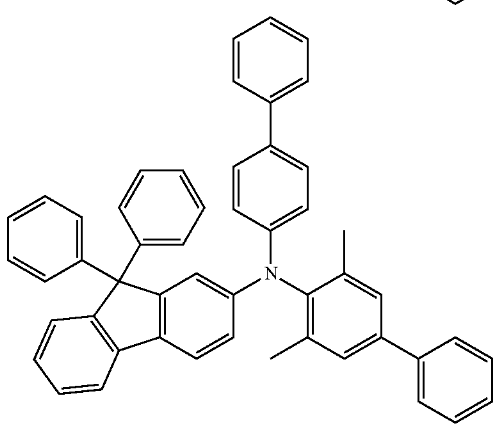
[Formula 145]
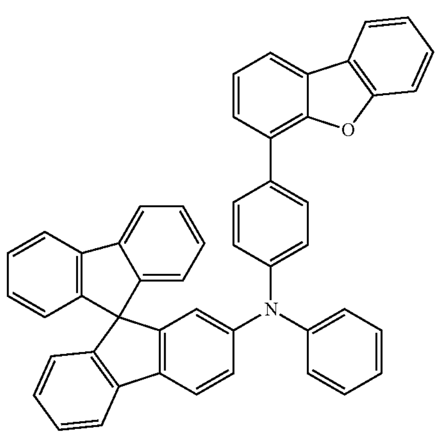
-continued
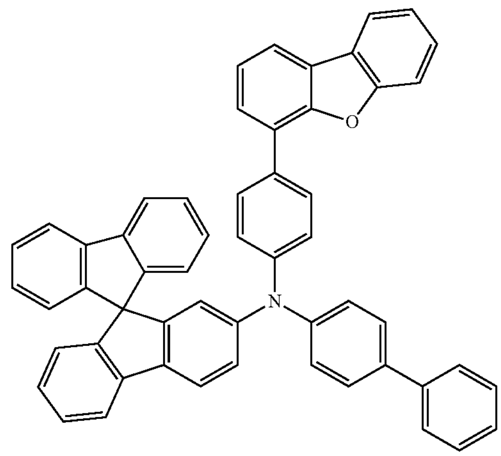
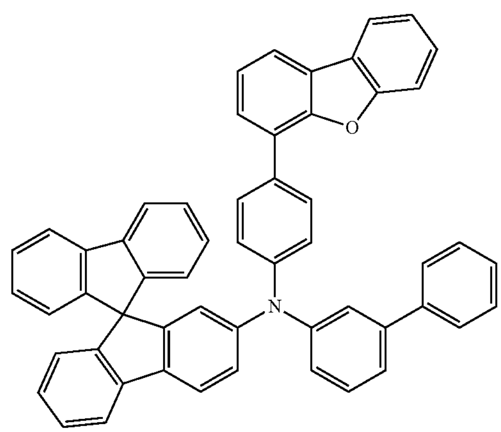
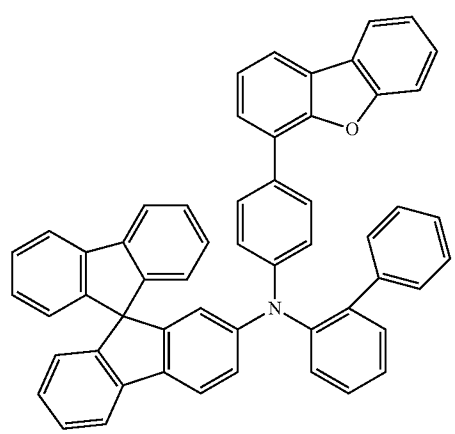

-continued
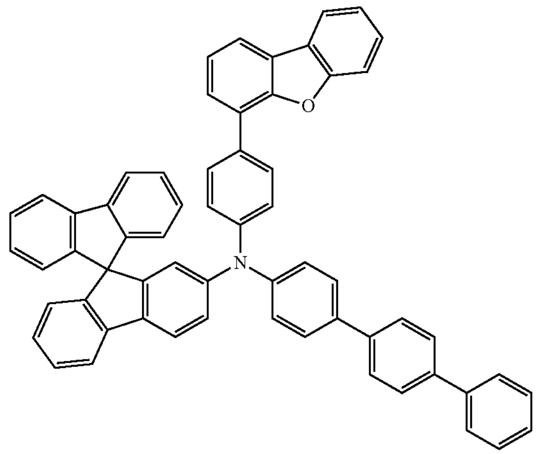
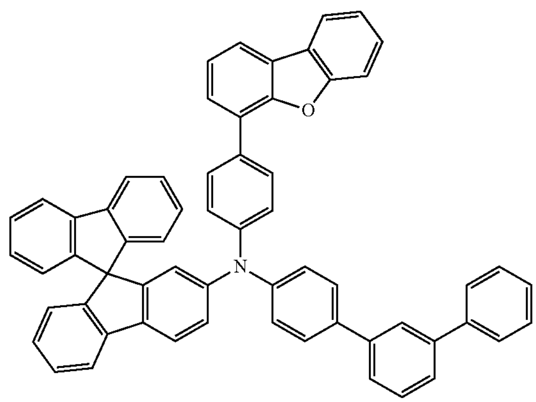
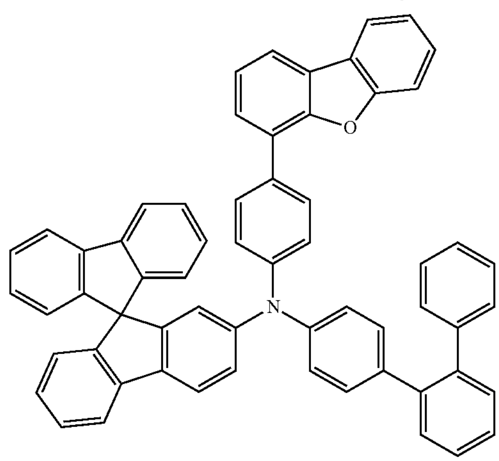
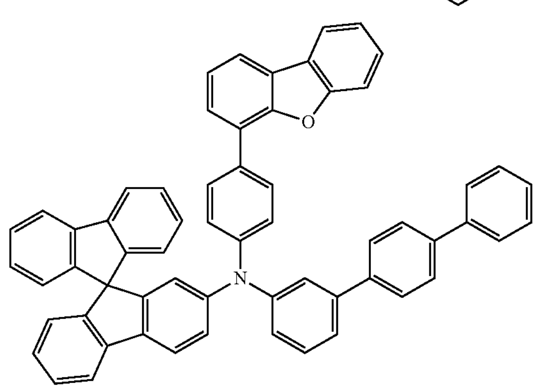
-continued
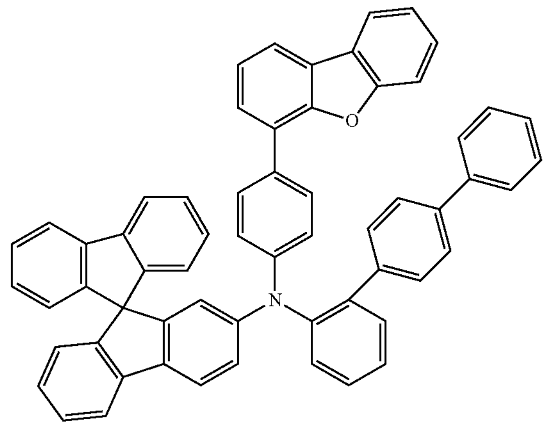
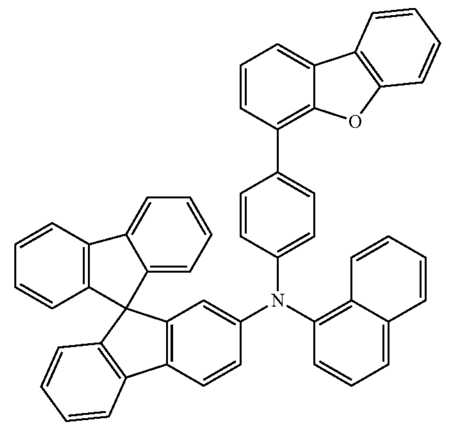
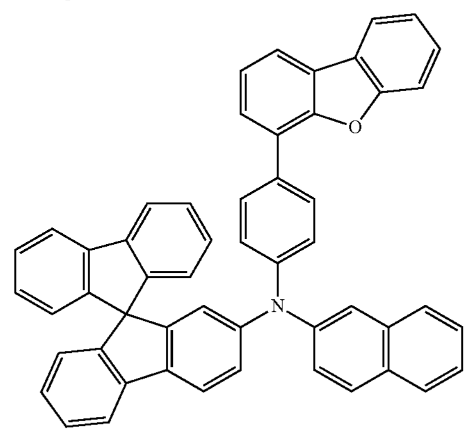
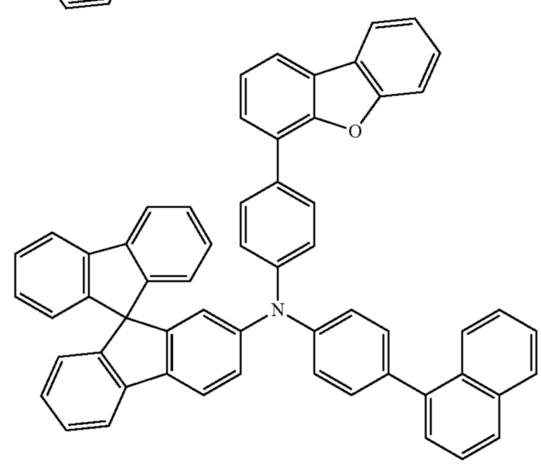

-continued
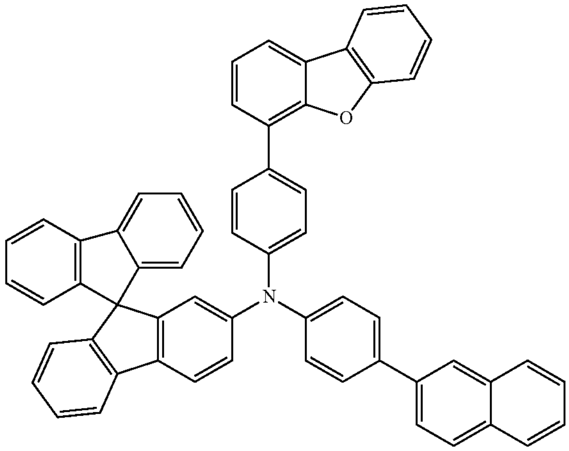
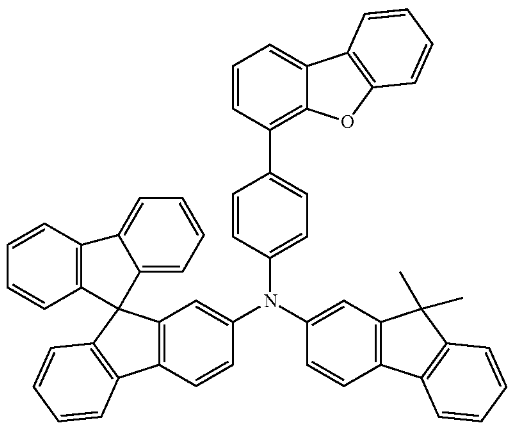
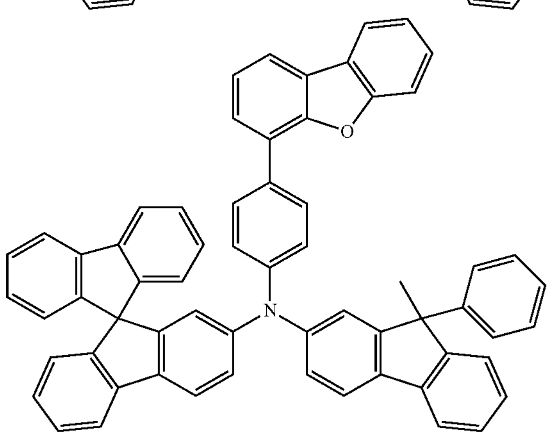
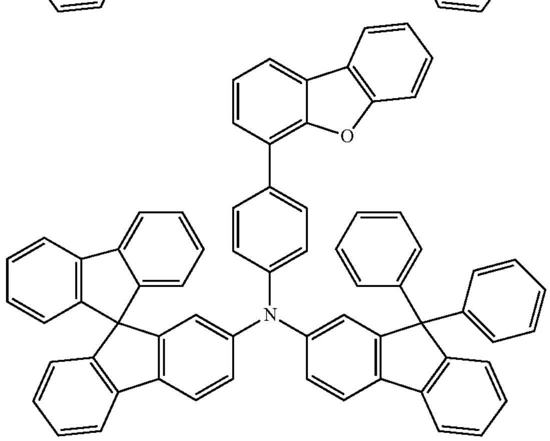
-continued
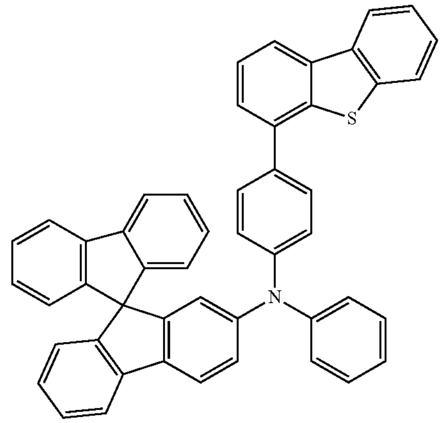
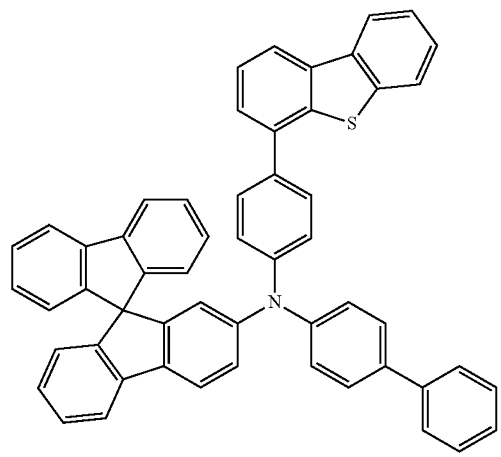
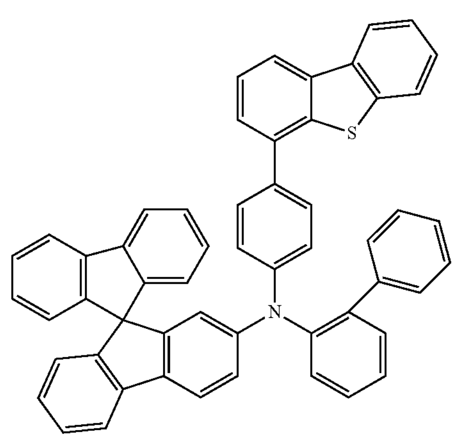

-continued
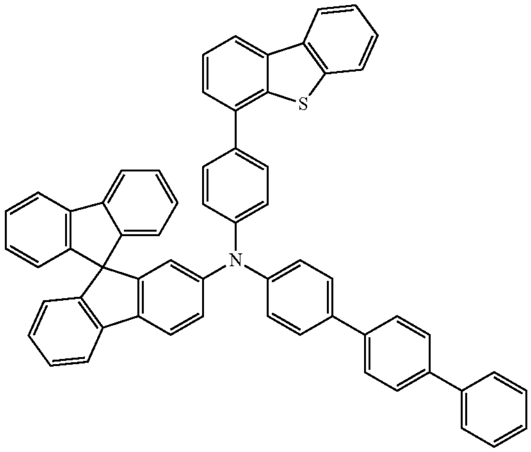
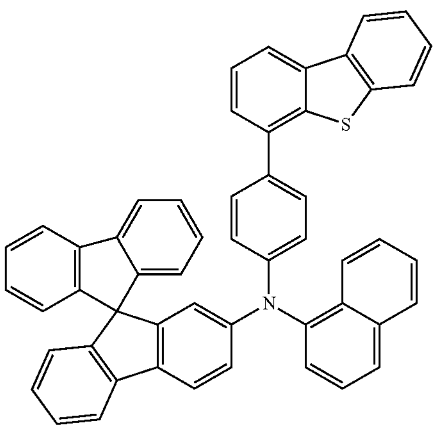
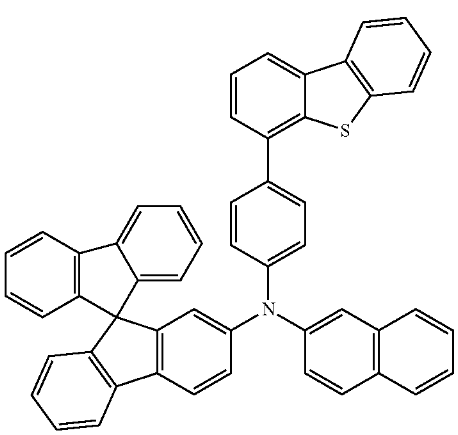
-continued
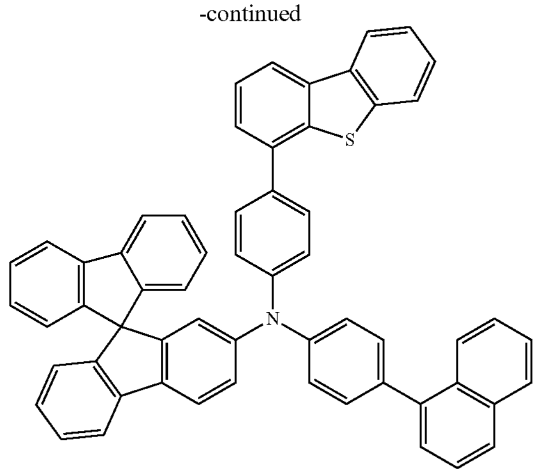
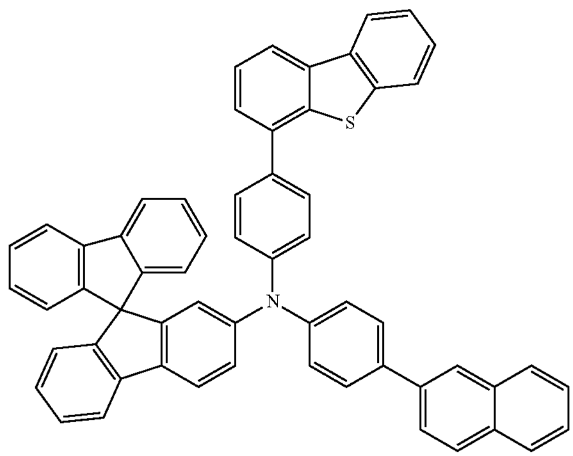
[Formula 146]
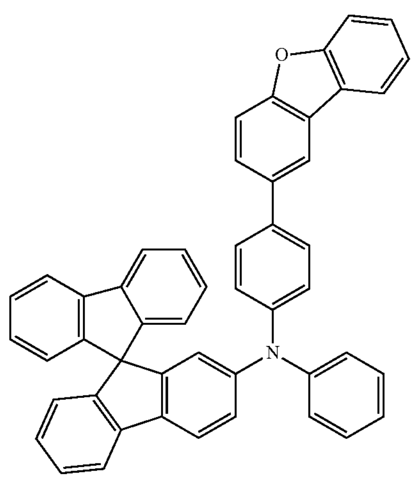

-continued
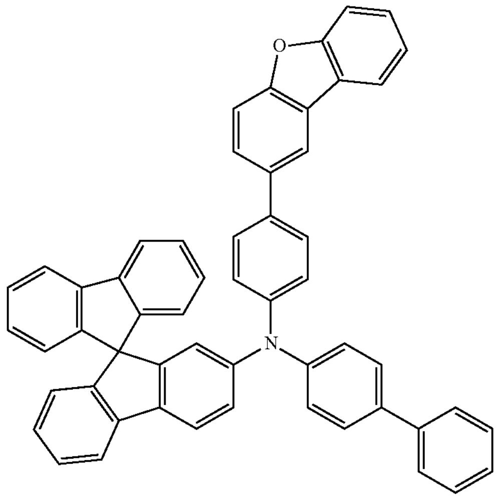
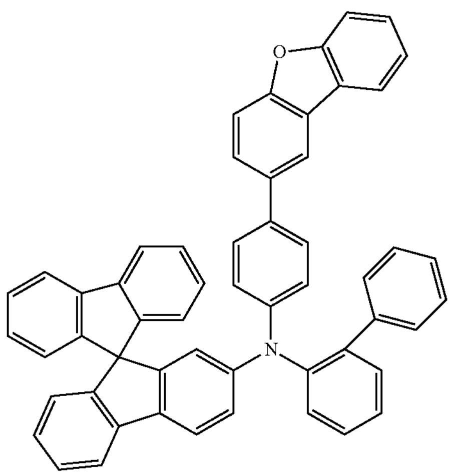
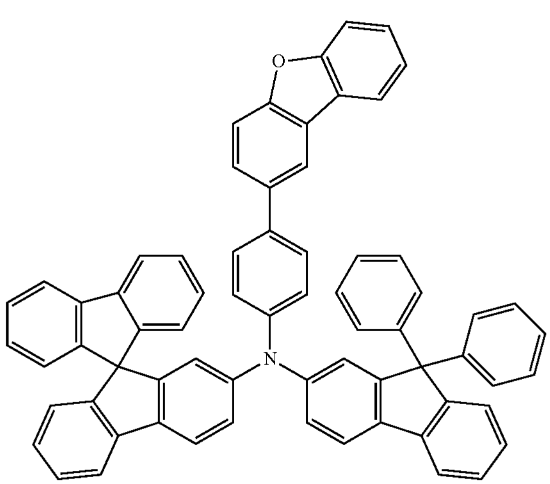
-continued
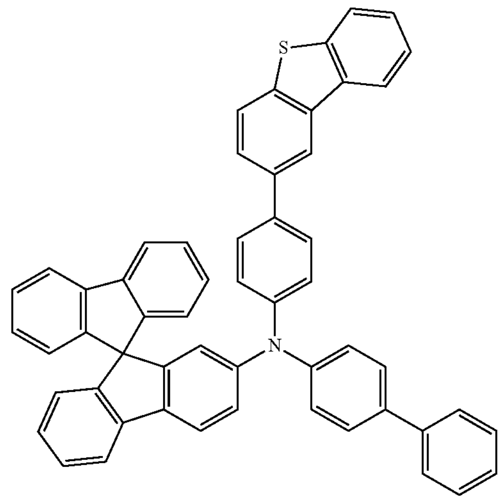
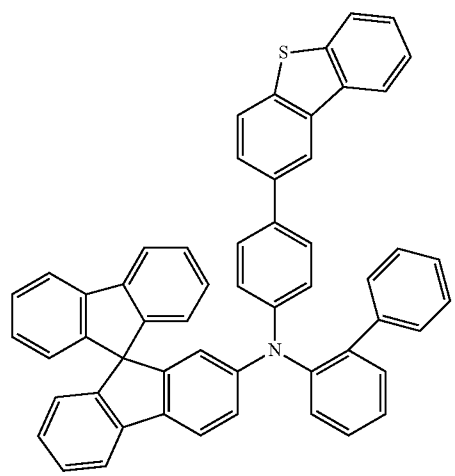
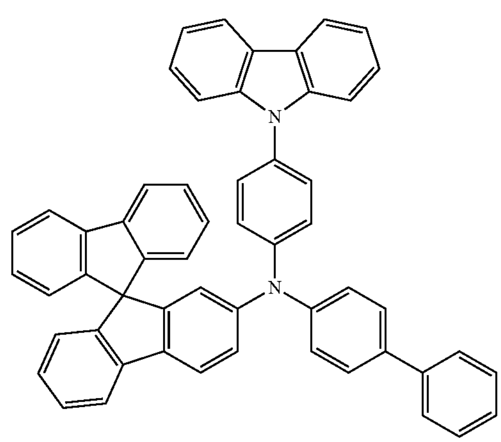

-continued
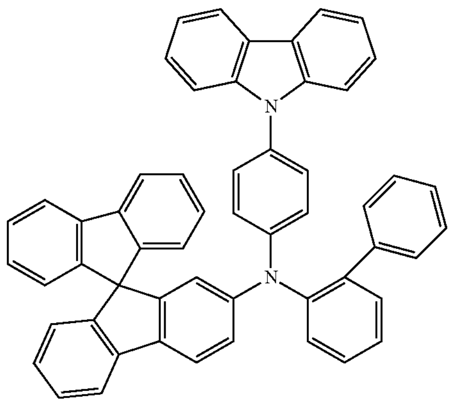 [SMILES: c1ccc(-c2ccccc2N(c2ccc(-n3c4ccccc4c4ccccc43)cc2)c2ccc3c(c2)C2(c4ccccc4-c4ccccc42)c2ccccc2-3)cc1]
[Formula 147]
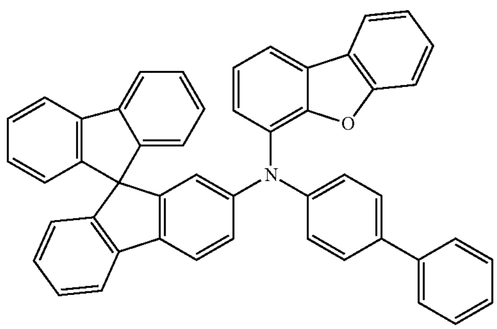
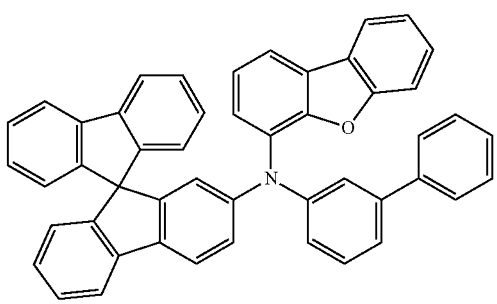
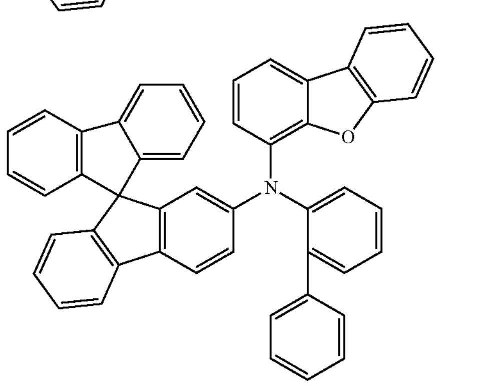
-continued
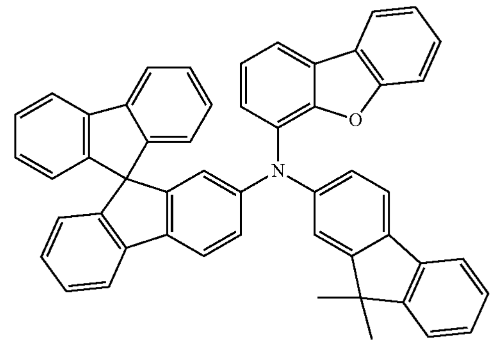
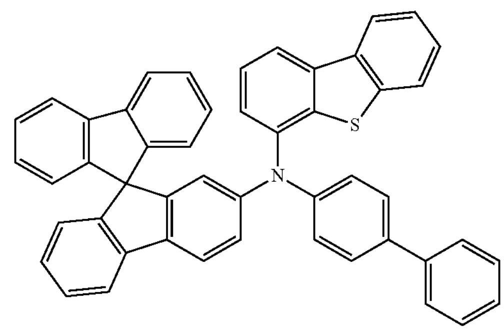
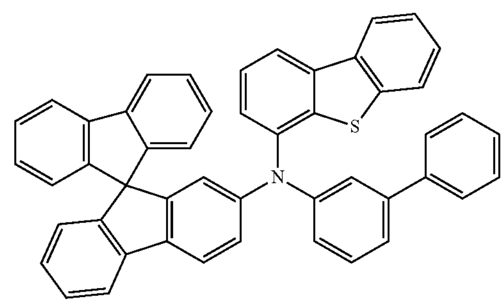
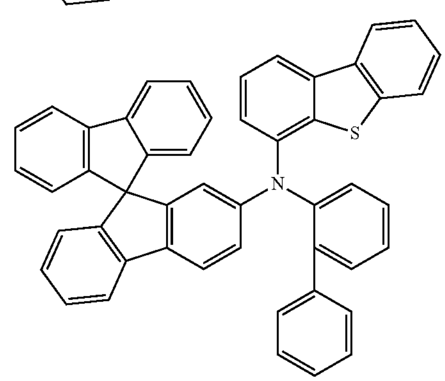
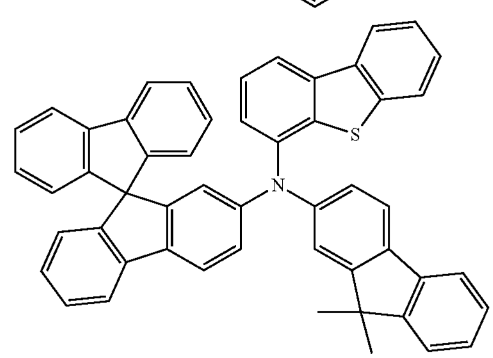

-continued
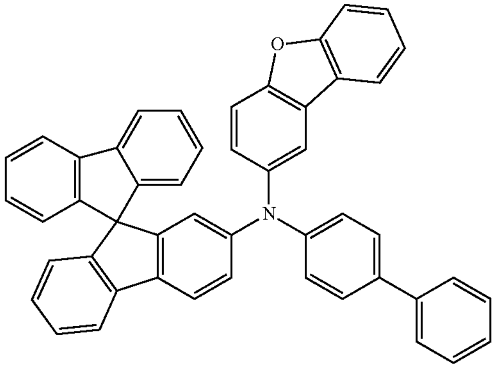
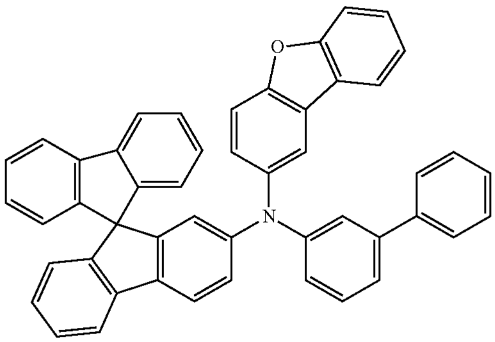
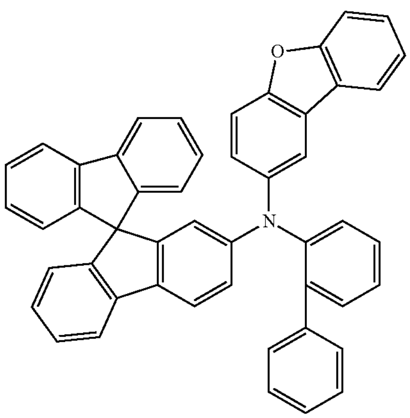
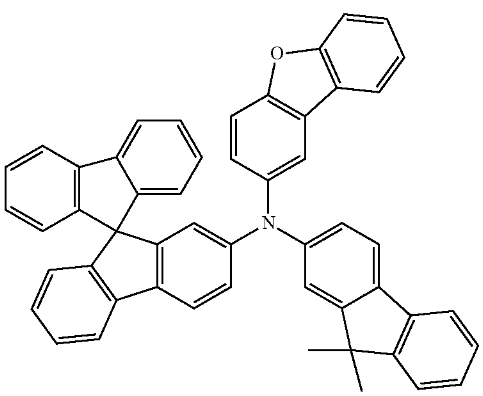
-continued
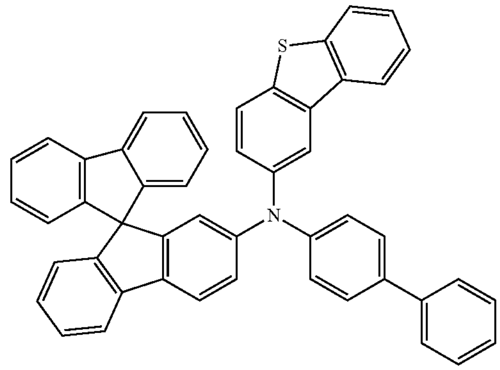
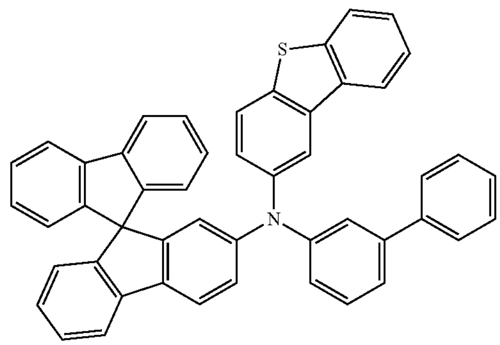
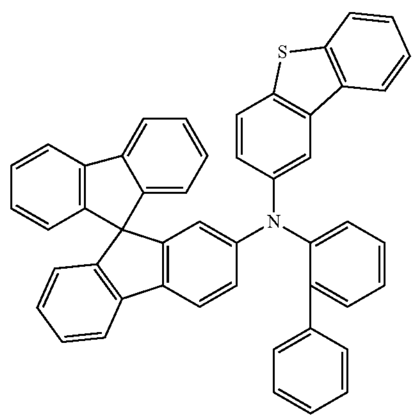
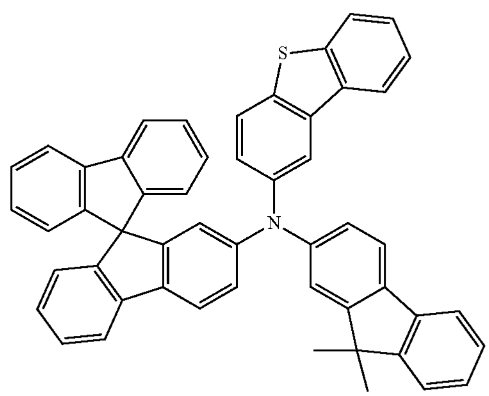

[Formula 148]
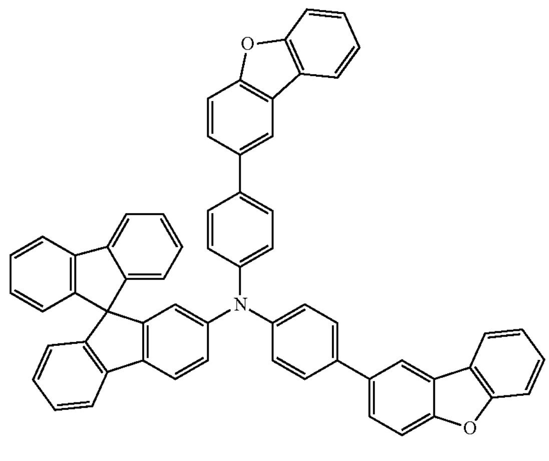
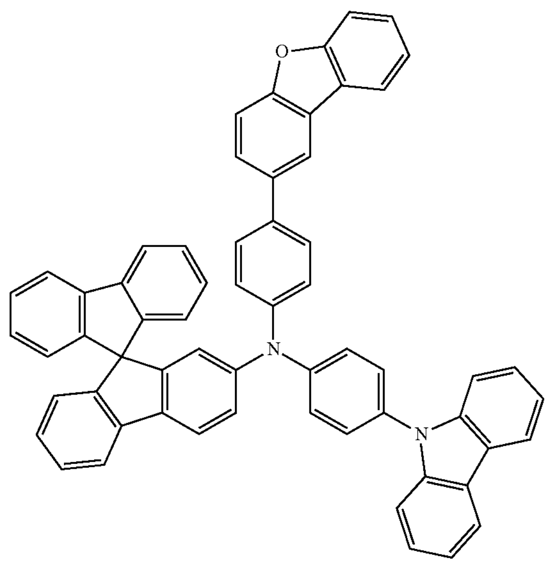
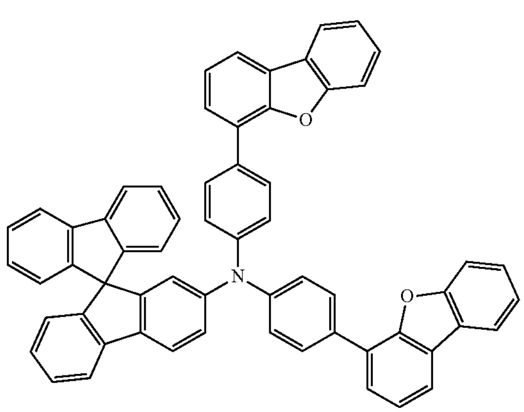
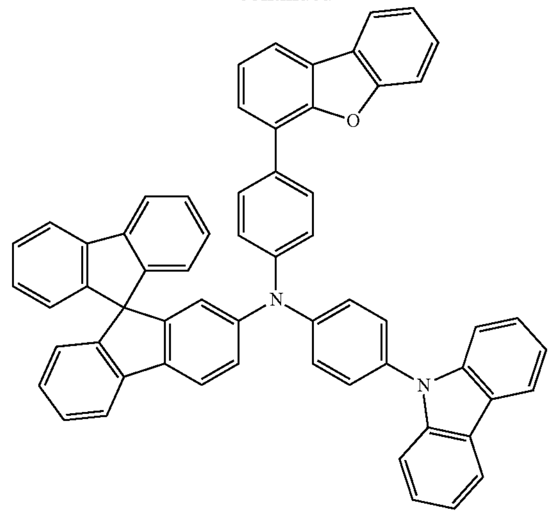
[Formula 149]
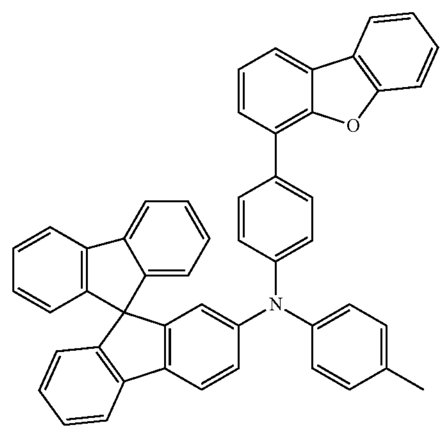
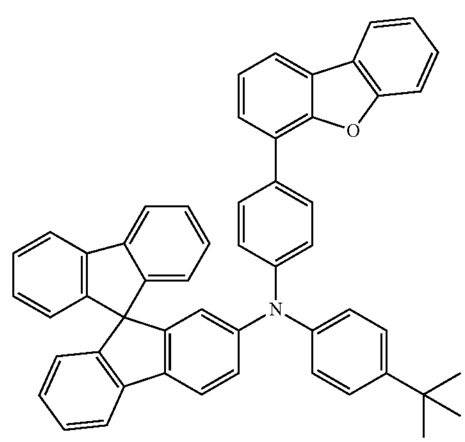

-continued
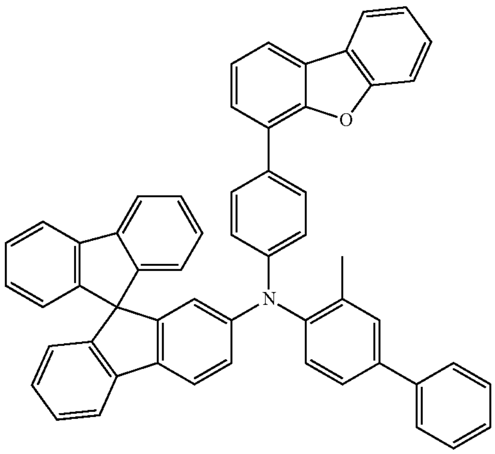
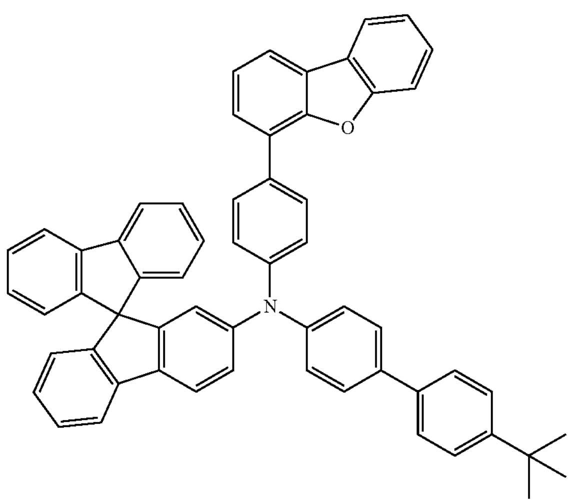
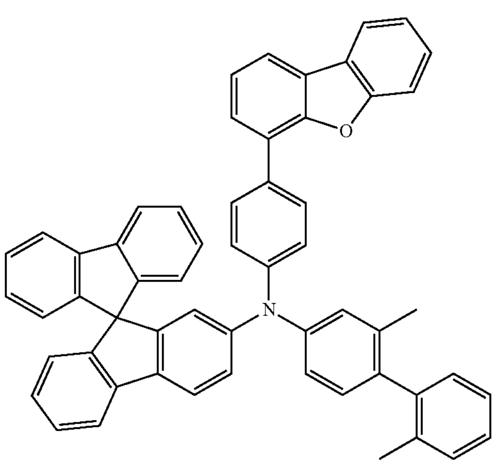
-continued
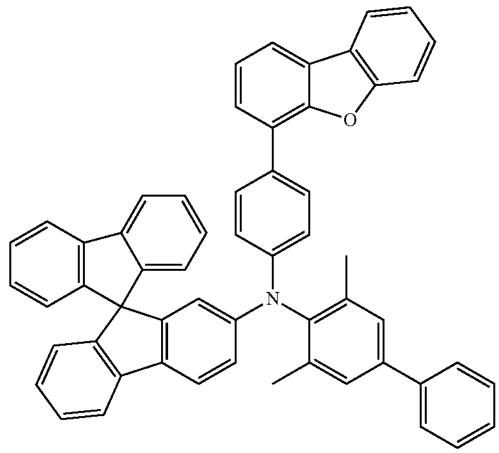
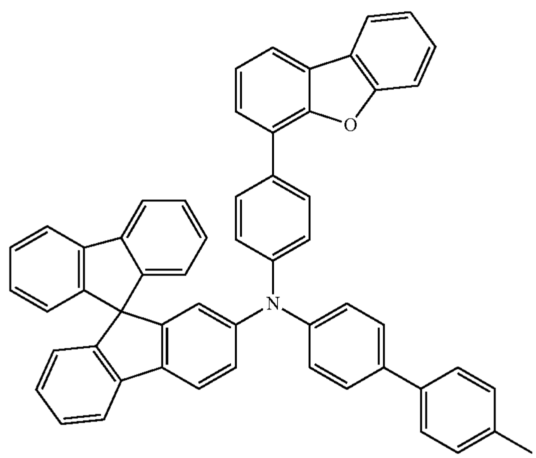
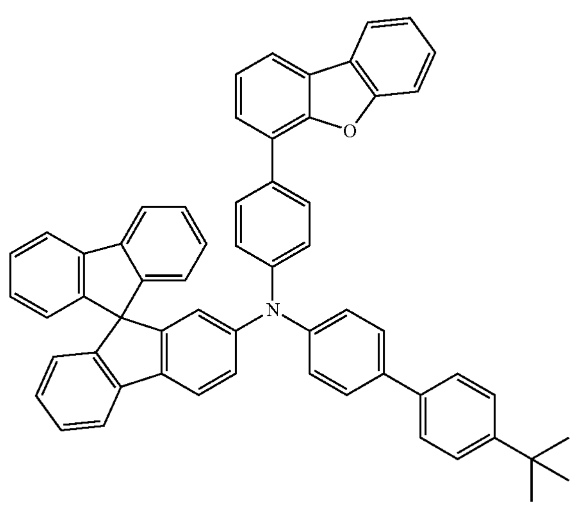

[Formula 150]
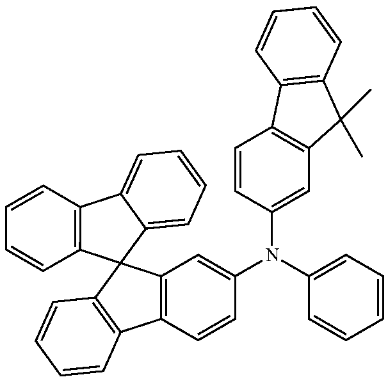
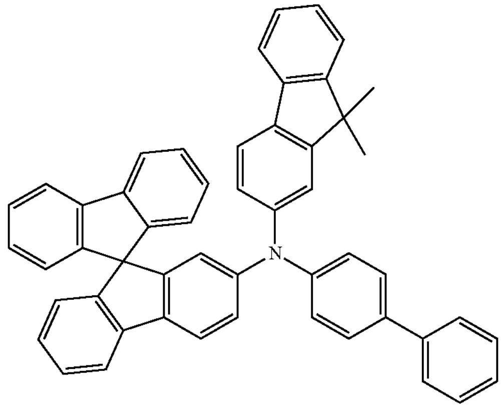
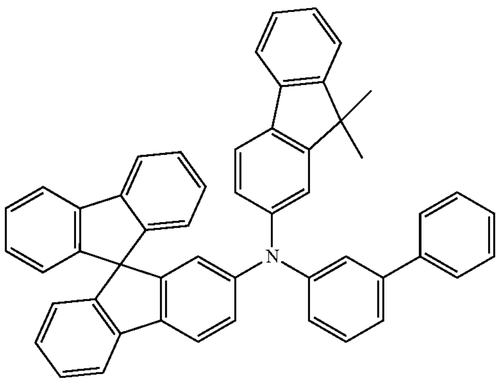
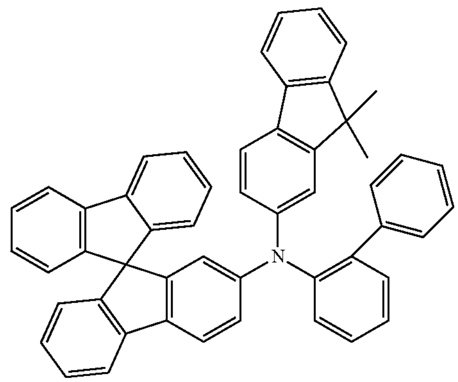
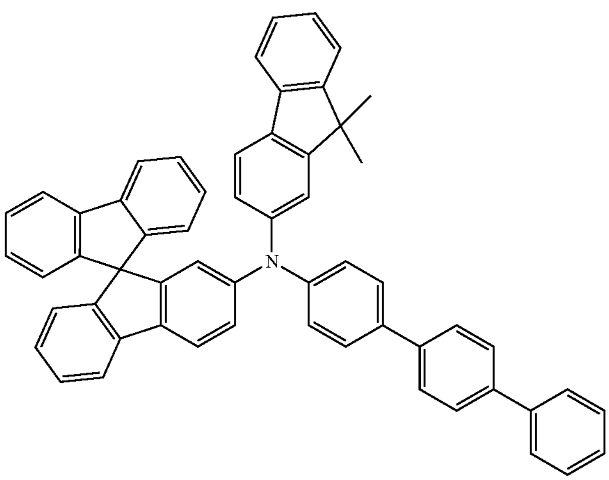
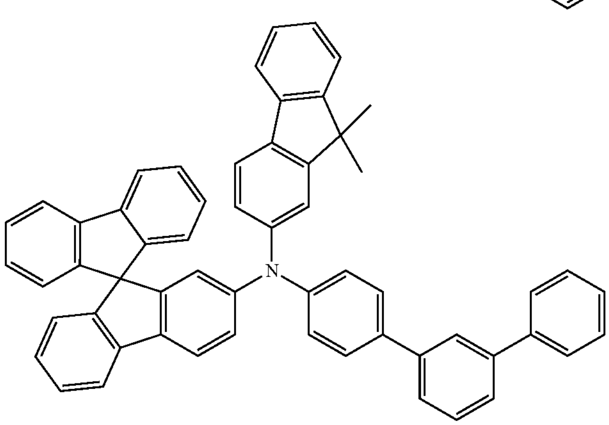
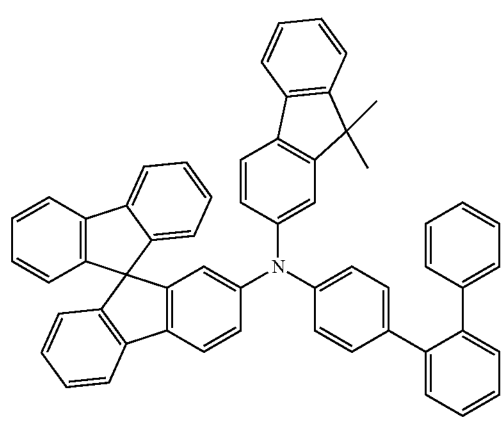

-continued
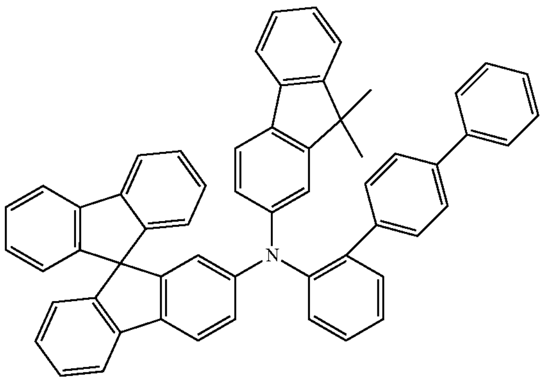
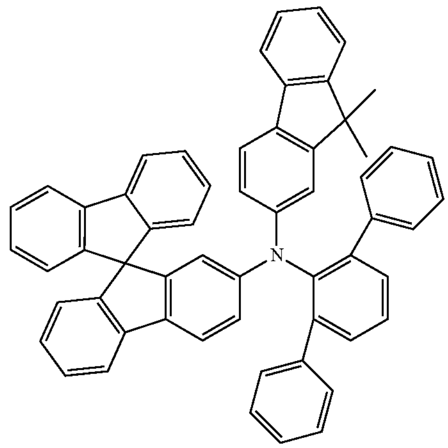
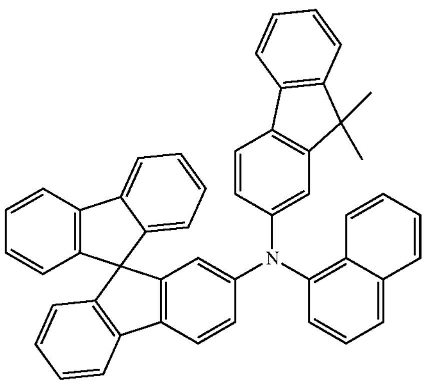
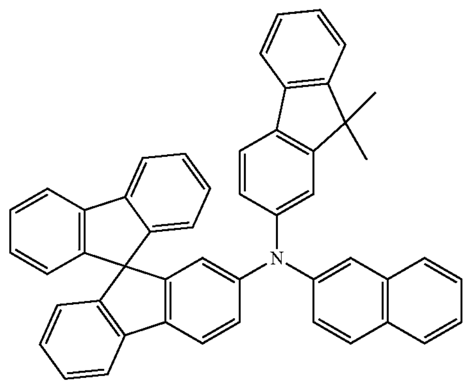
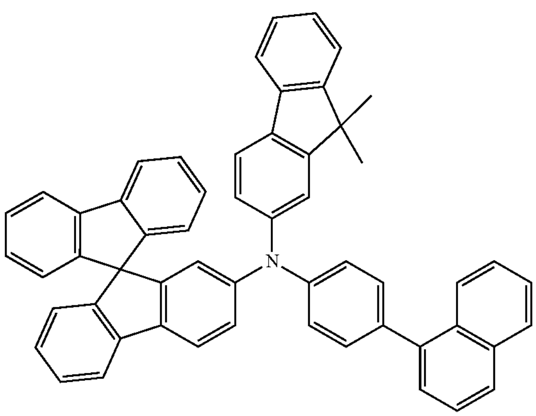
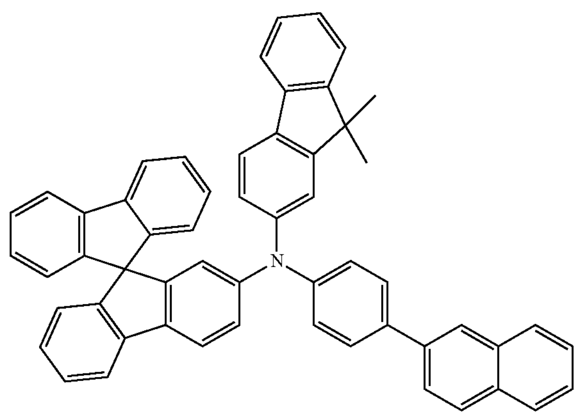
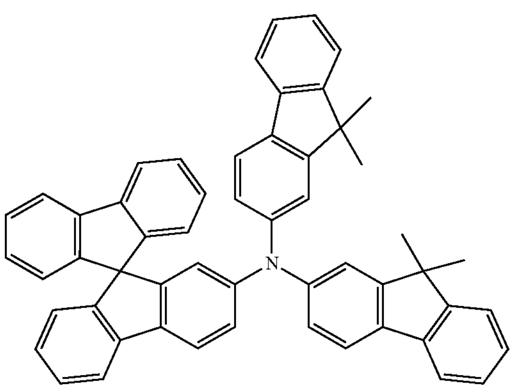
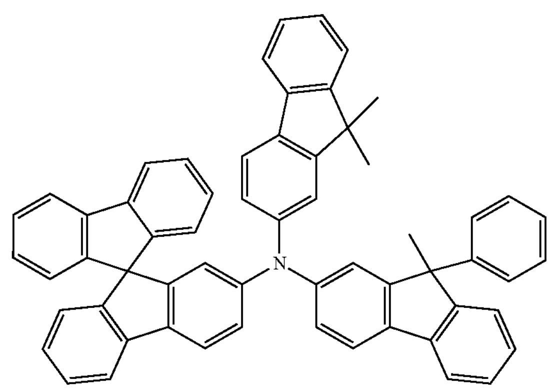

-continued
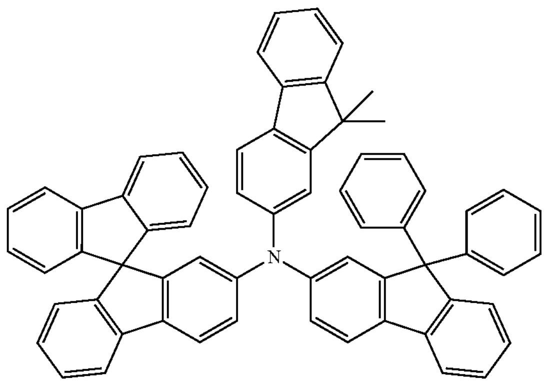
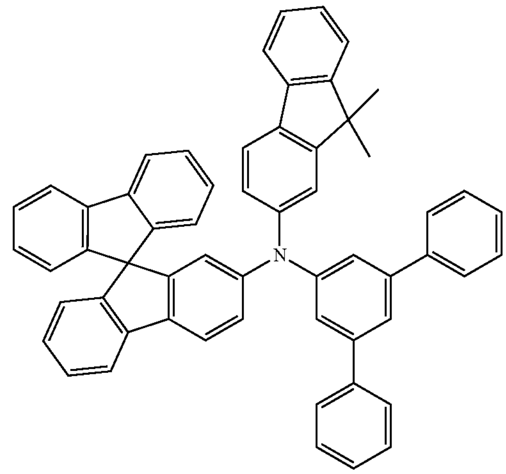
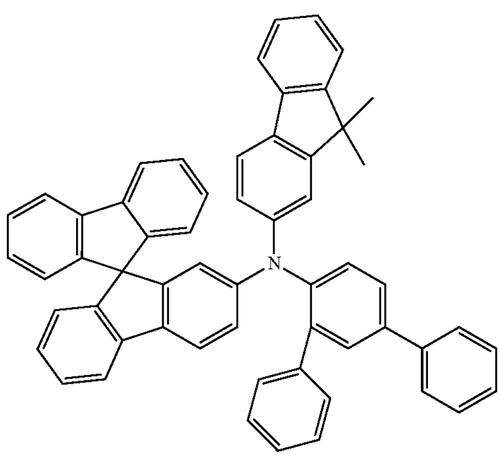
[Formula 151]
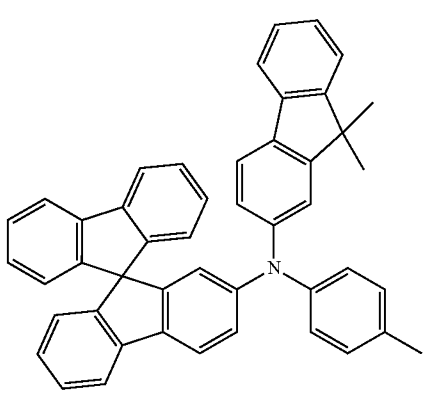
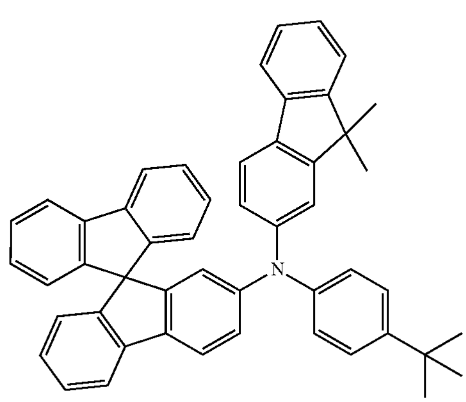

-continued
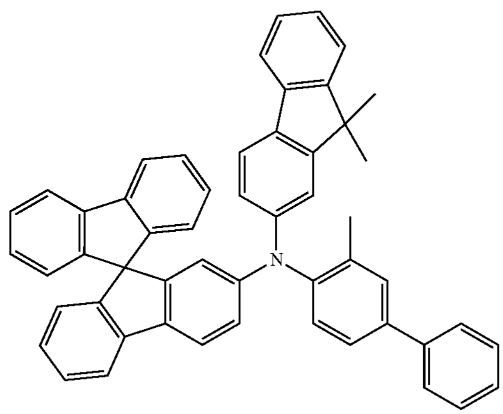
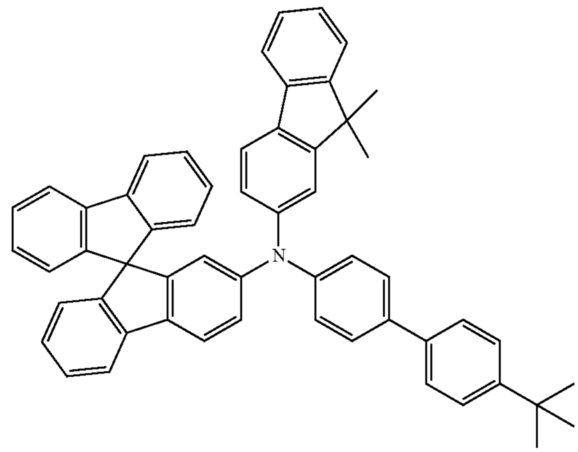
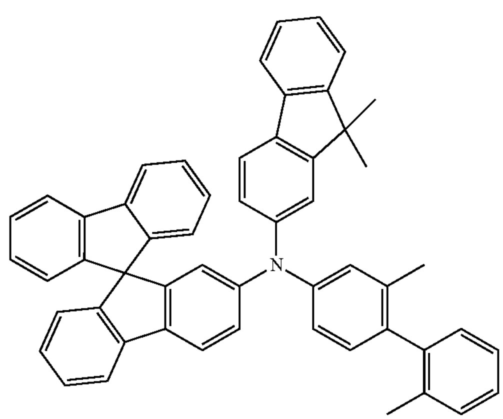
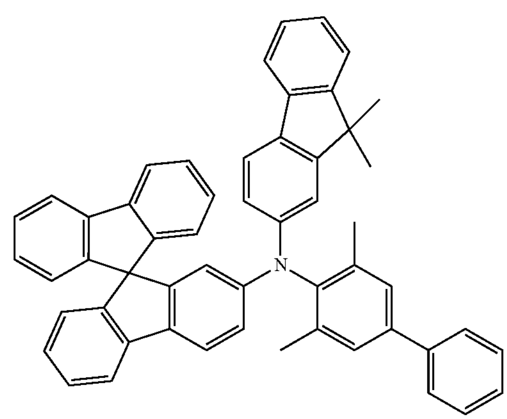
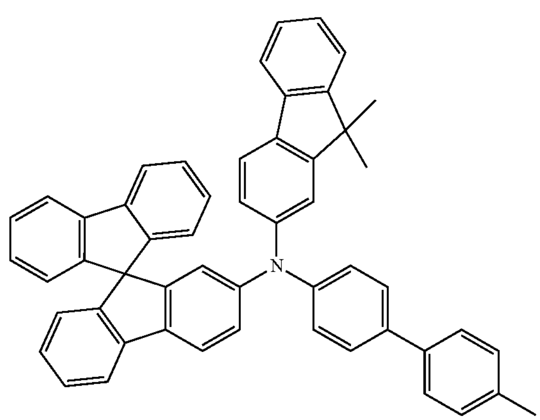
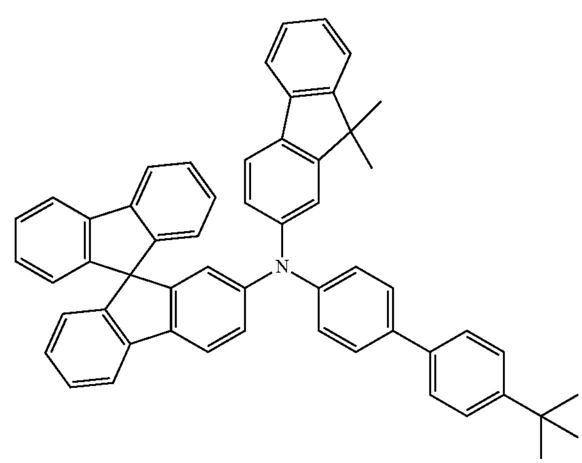

-continued
[Formula 152]
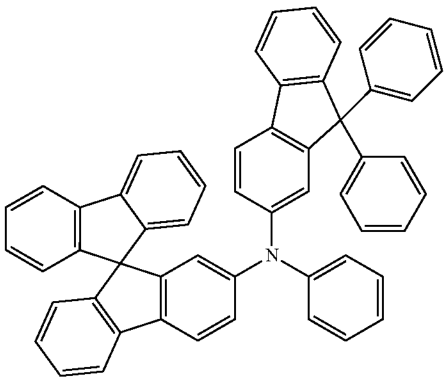
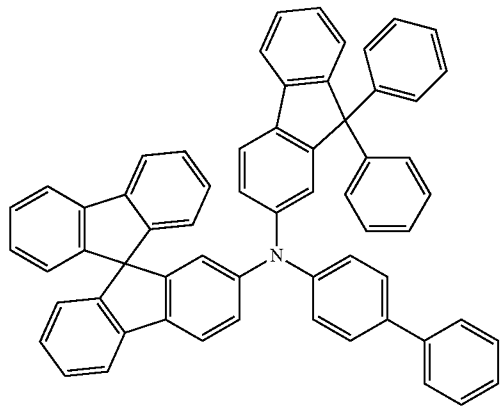
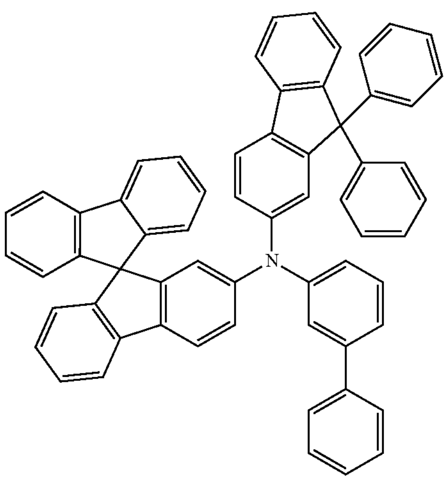
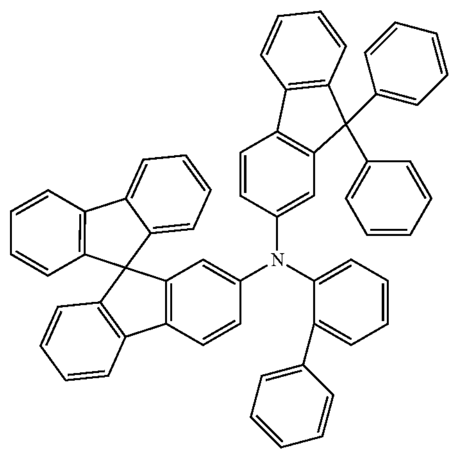
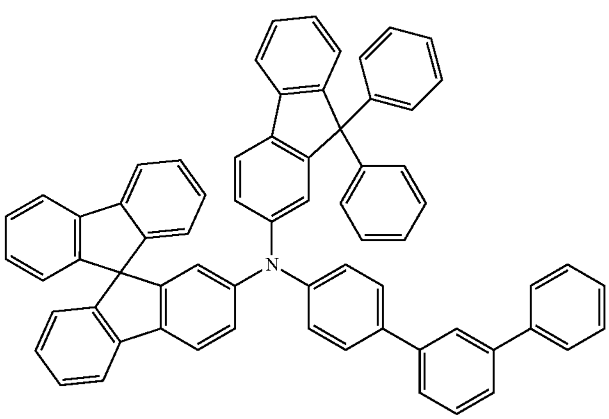
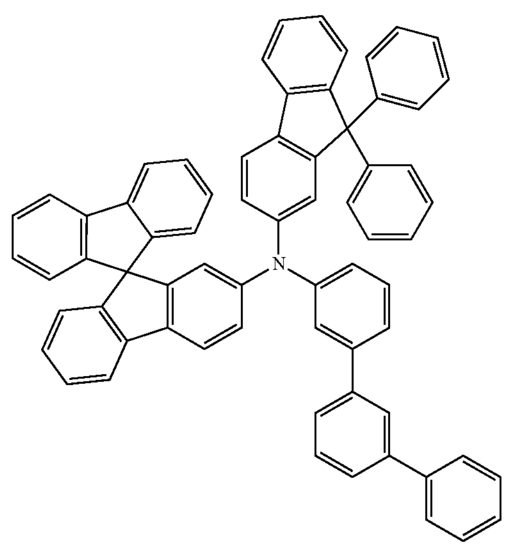

-continued
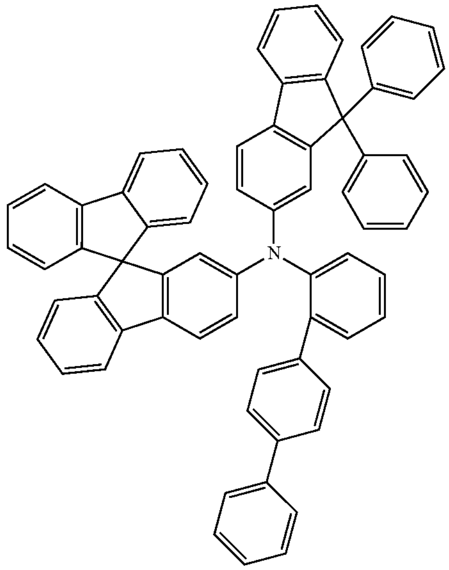
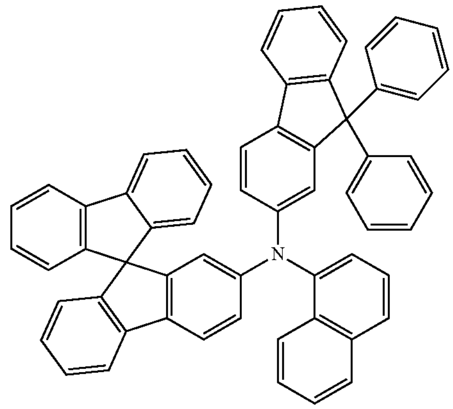
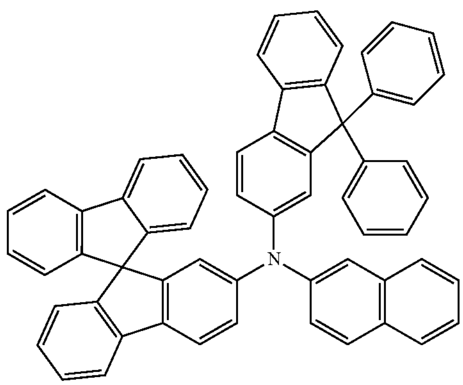
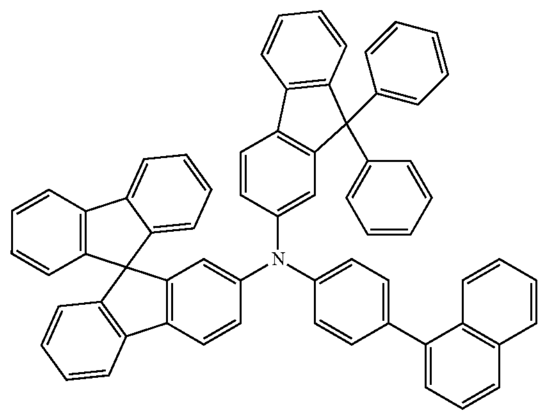
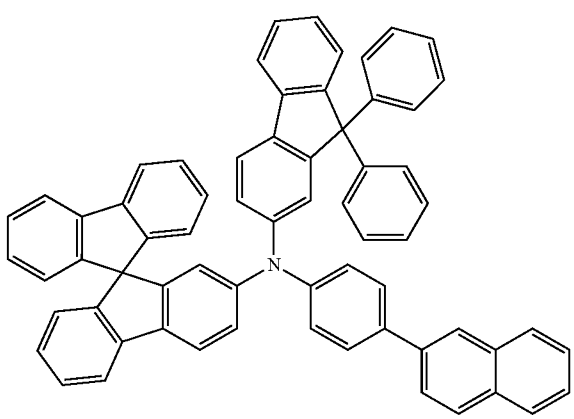
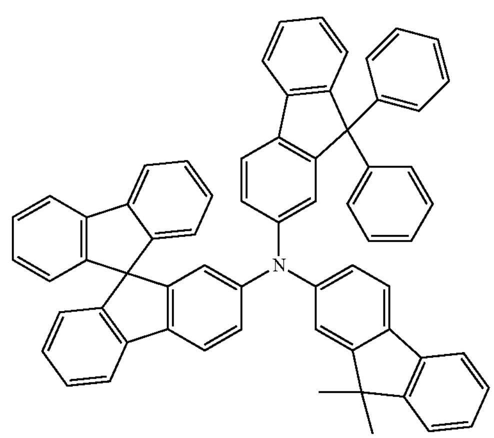

-continued
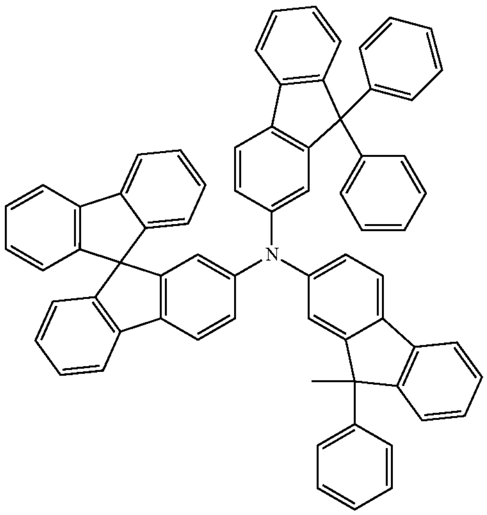
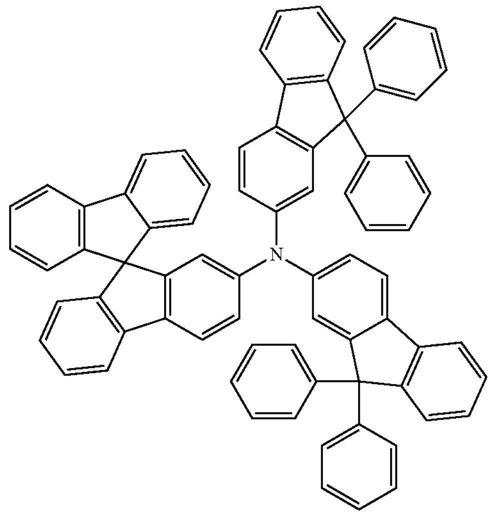
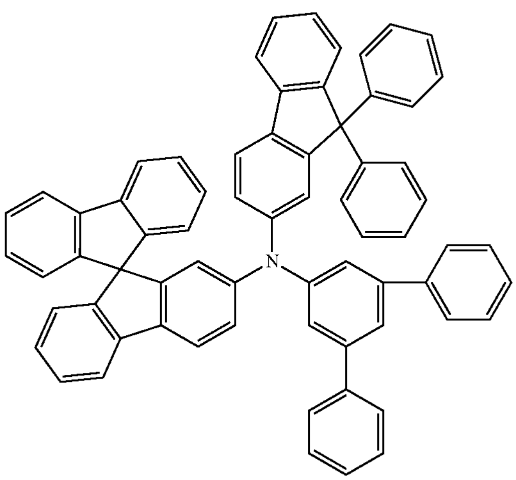
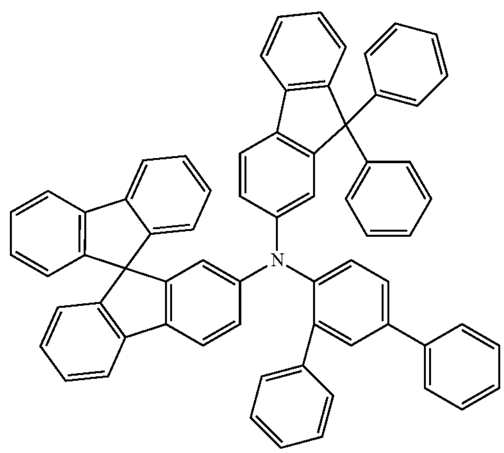
[Formula 153]
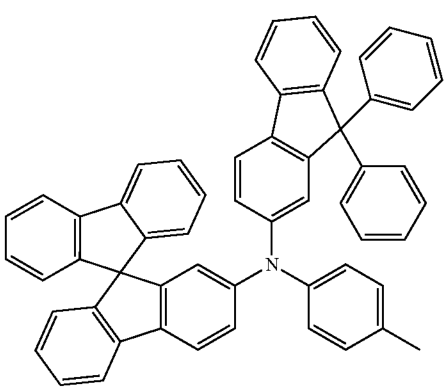
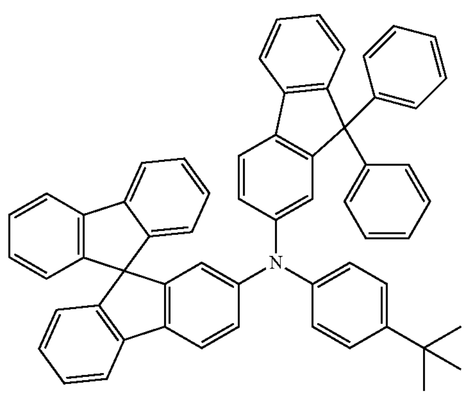

-continued
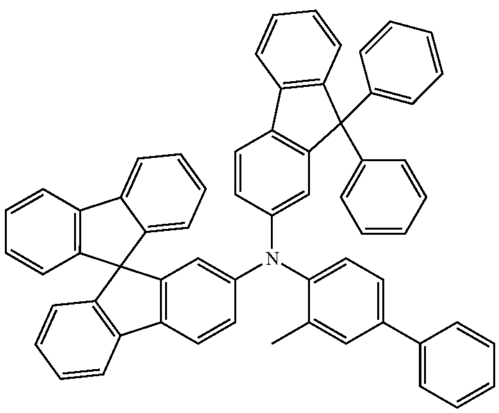
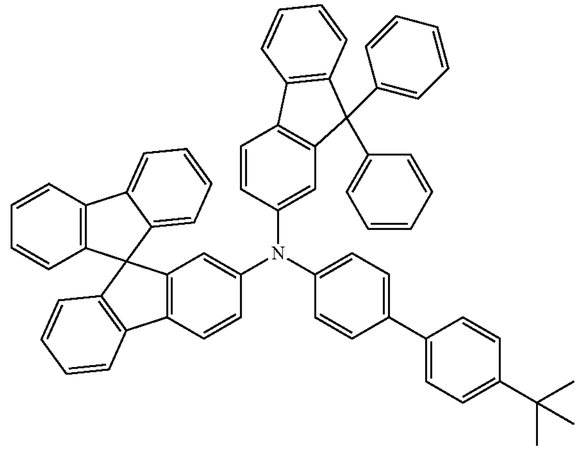
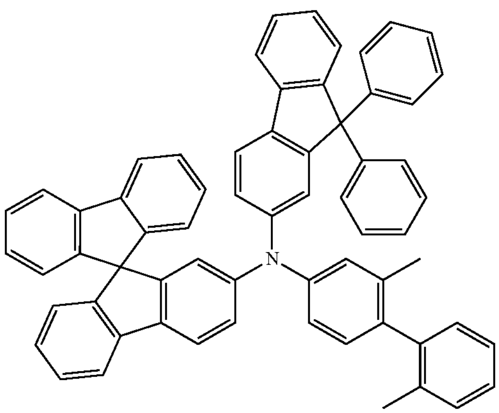
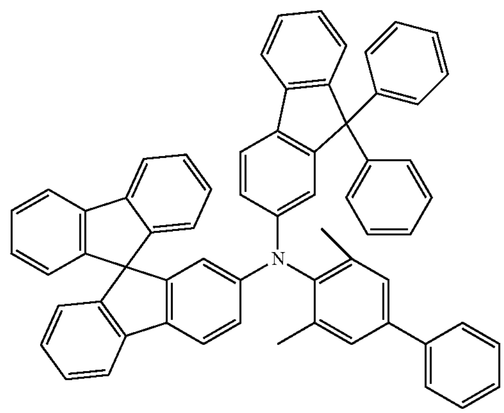
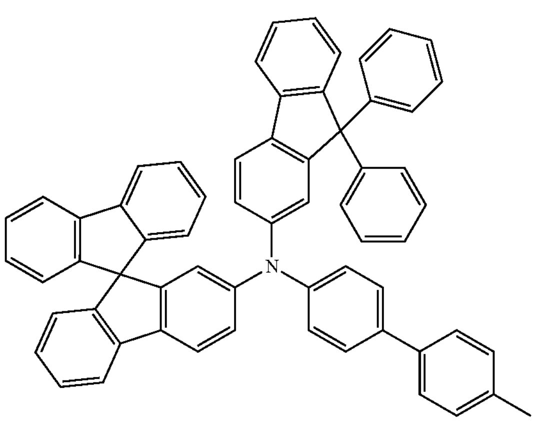
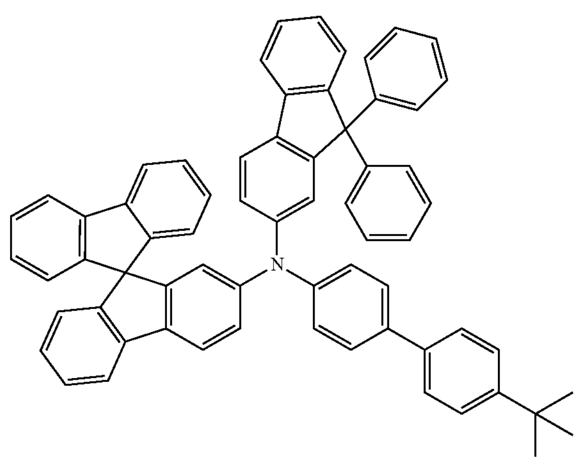

-continued
[Formula 154]
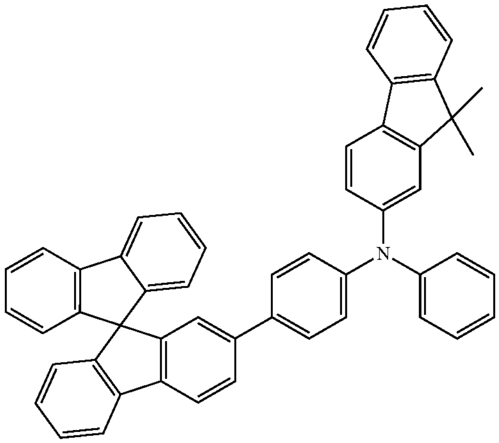
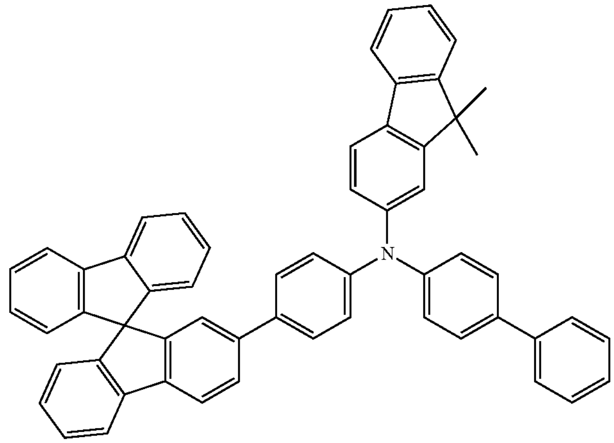
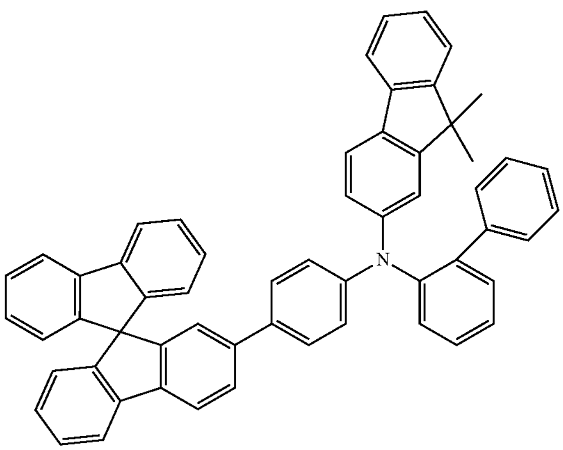
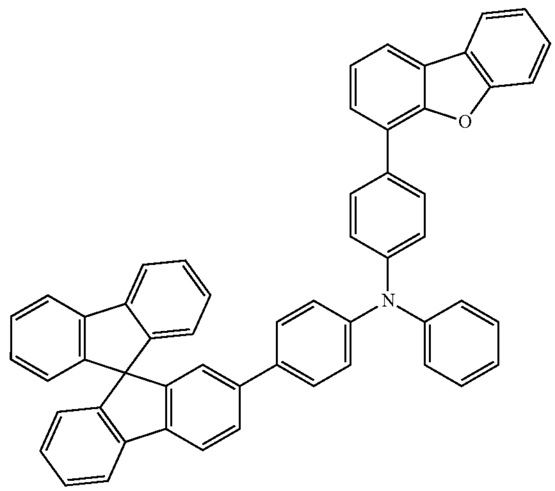
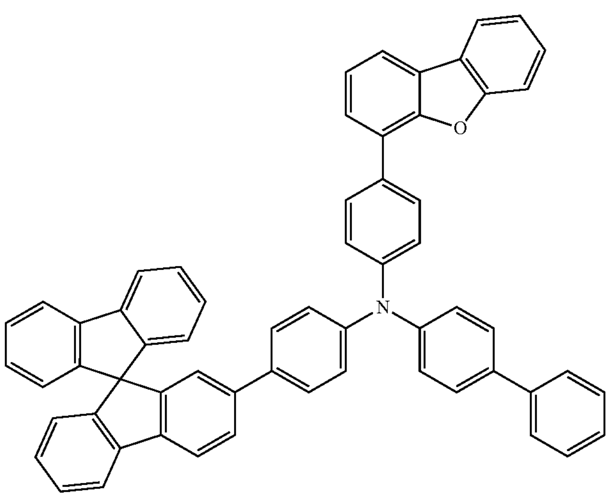

-continued
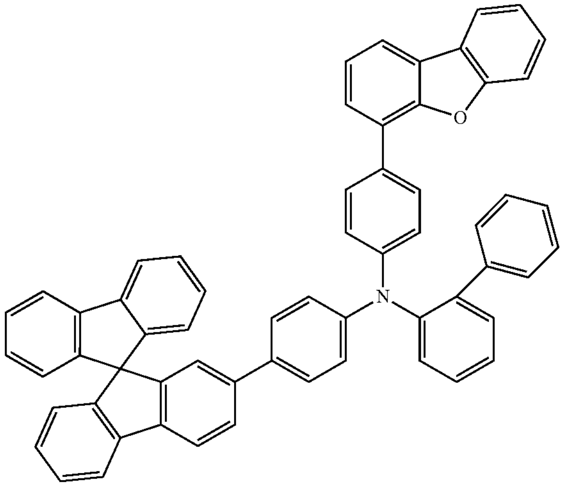
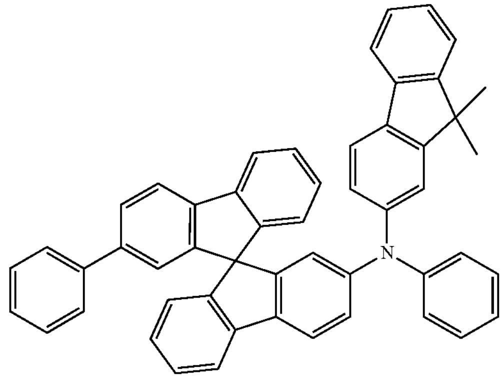
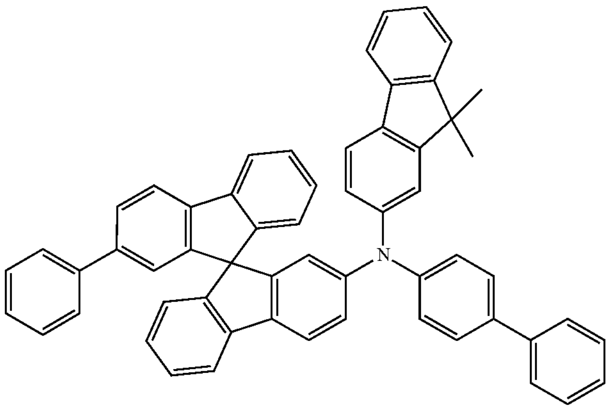
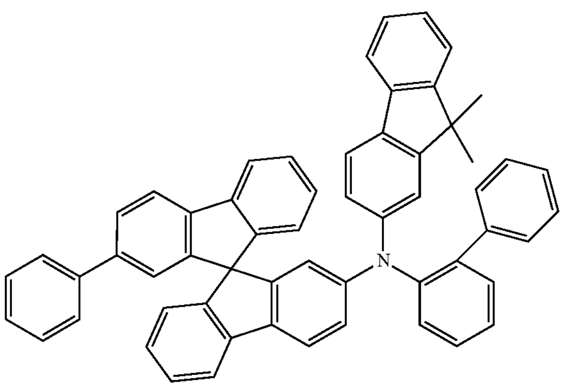
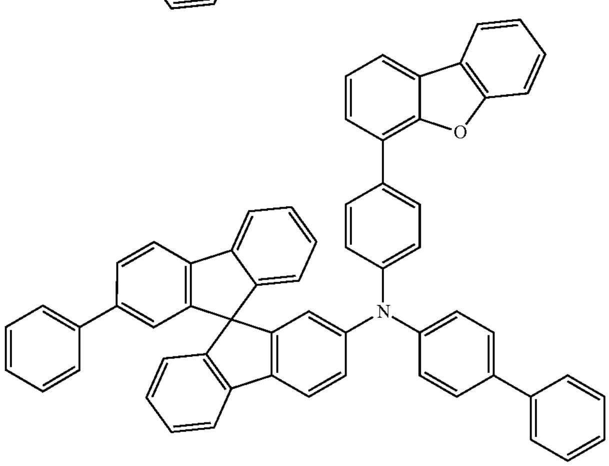

-continued
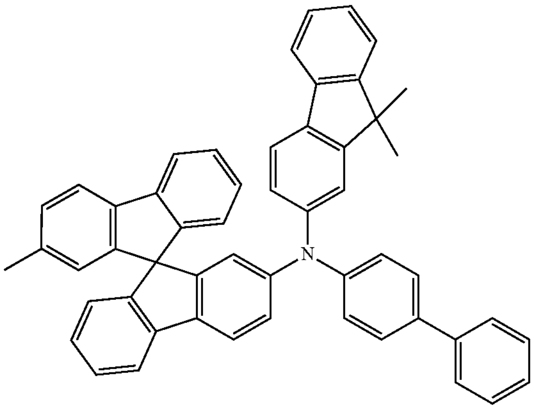
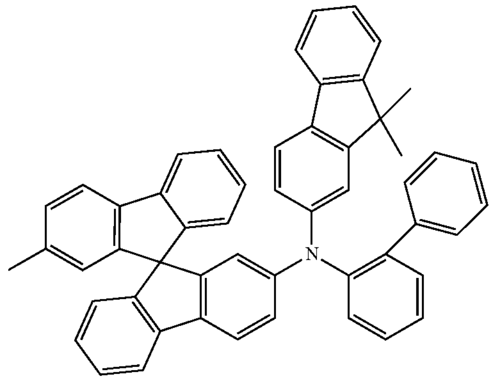
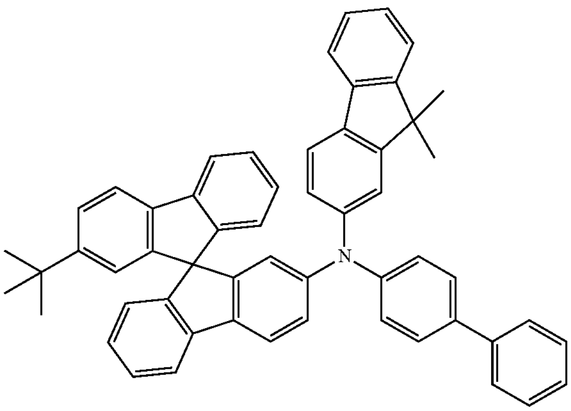
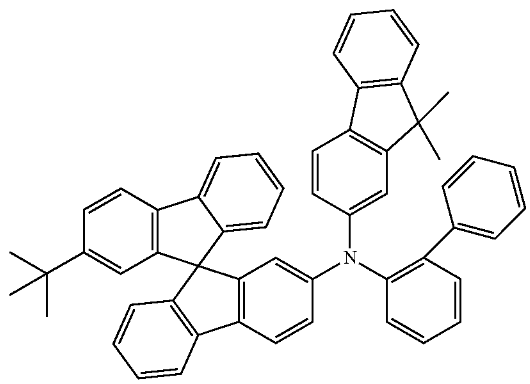
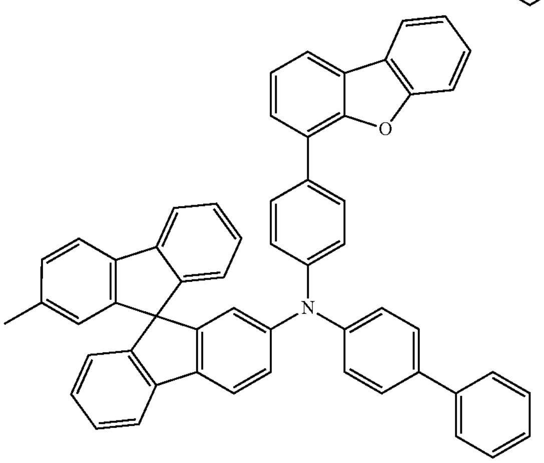
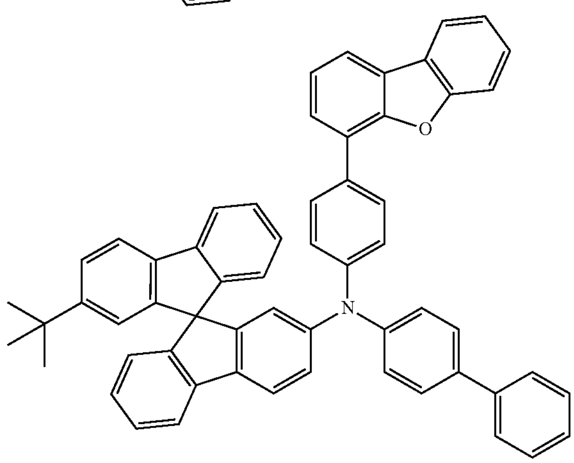
[Formula 155]
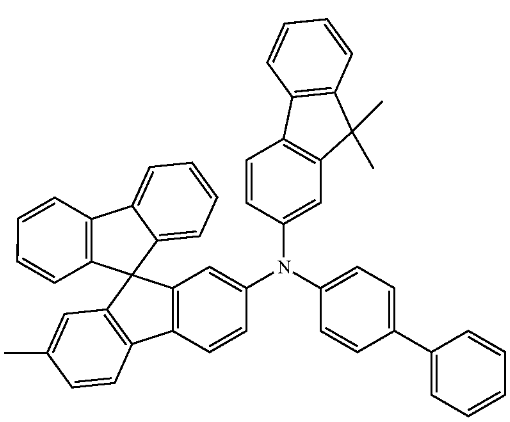
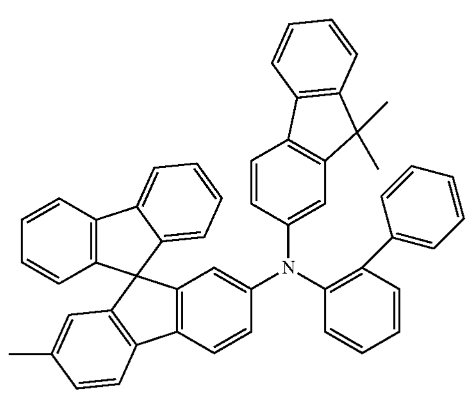

-continued
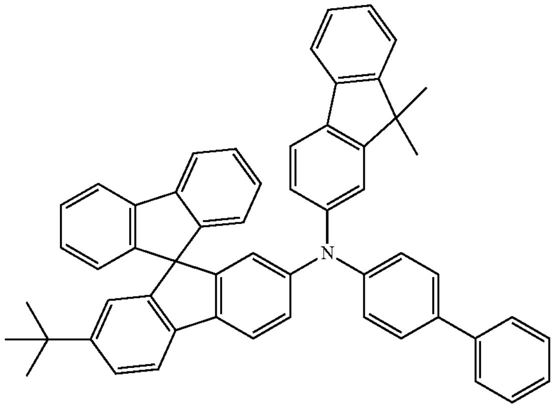
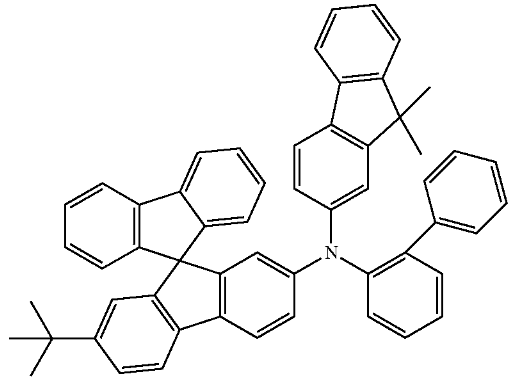
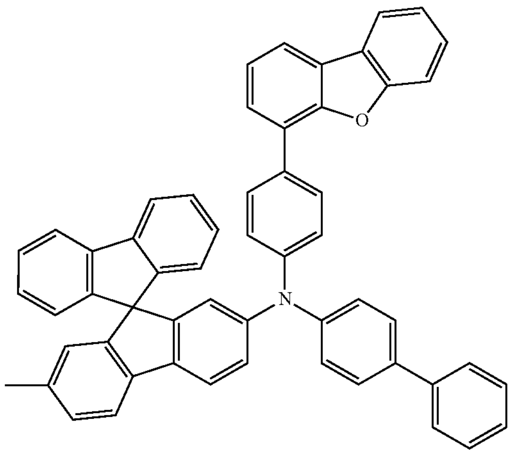
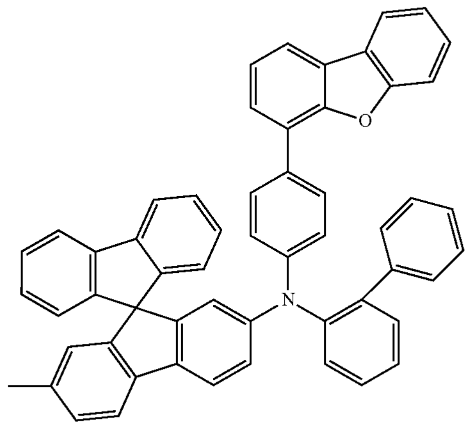
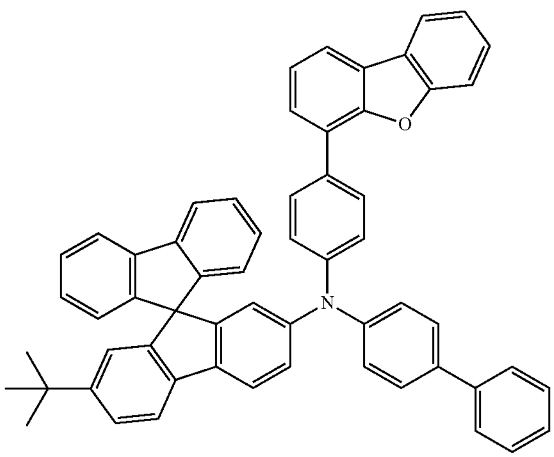
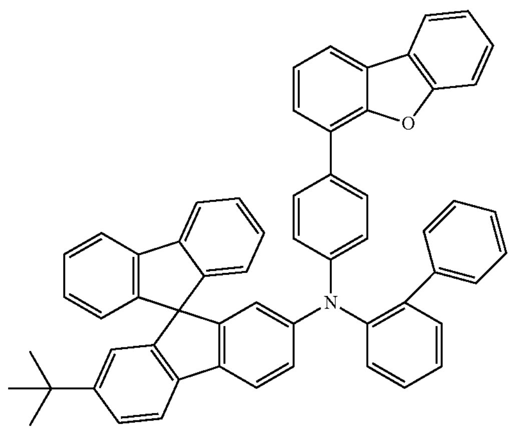
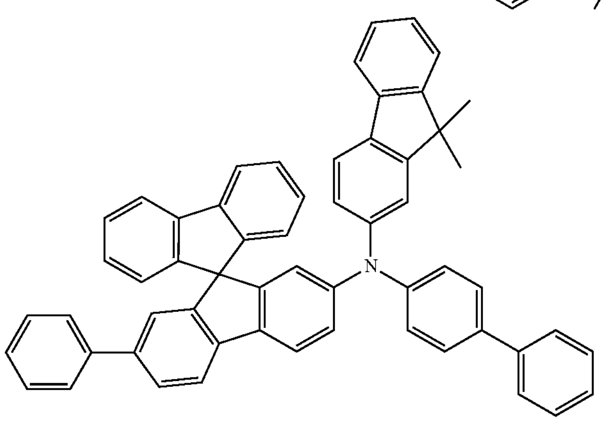

-continued
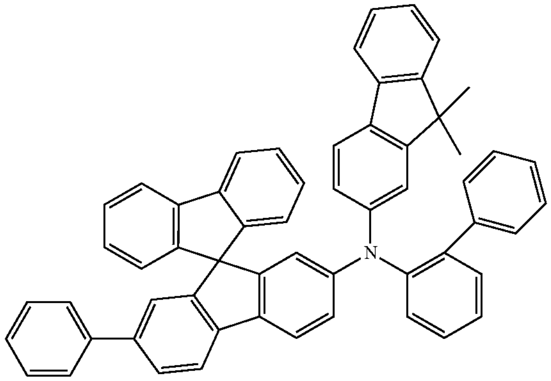
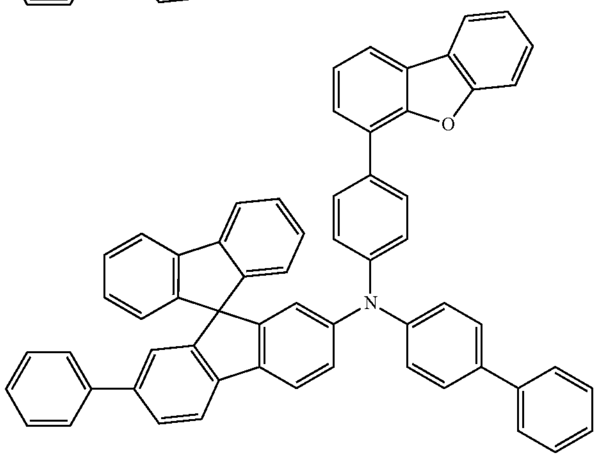
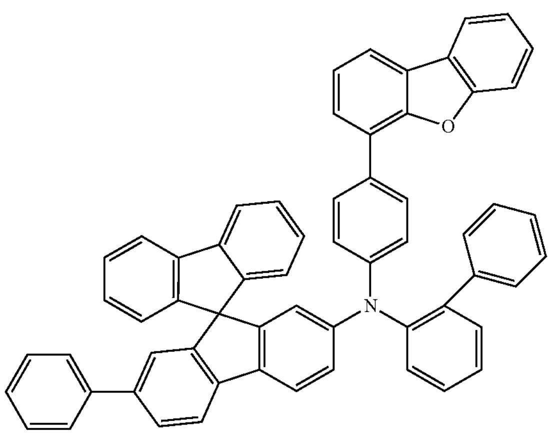
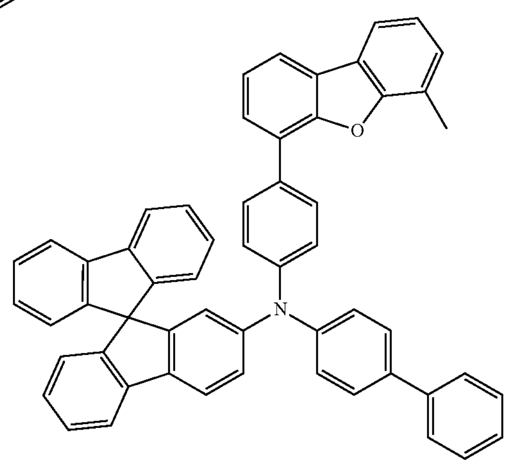
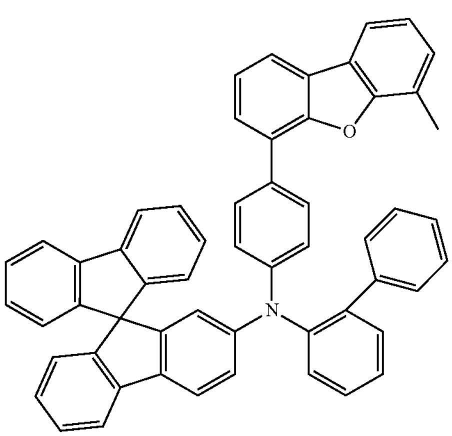
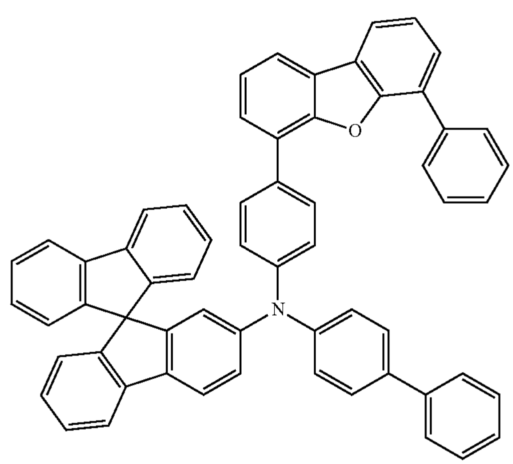

-continued
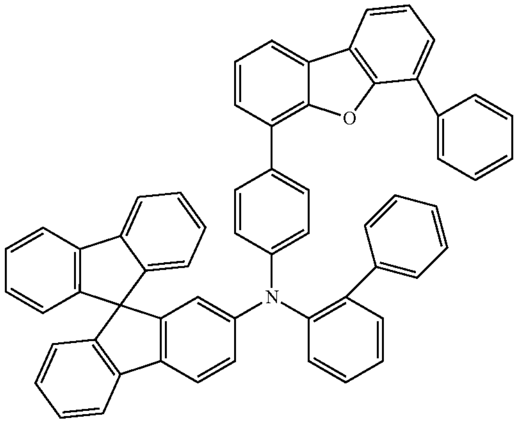
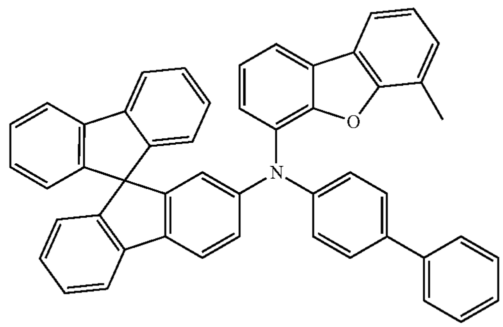
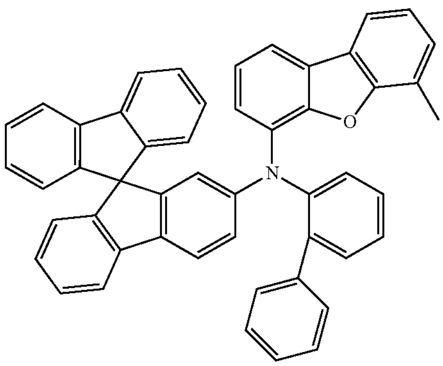
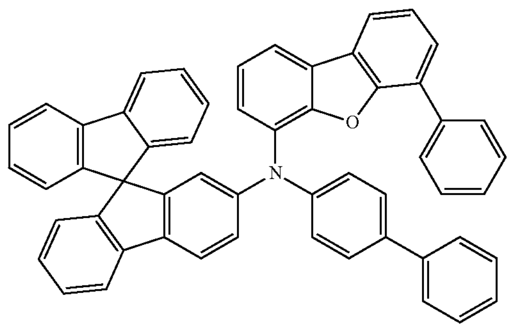
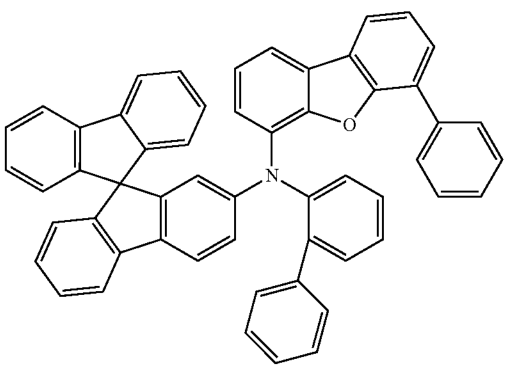
[Formula 156]
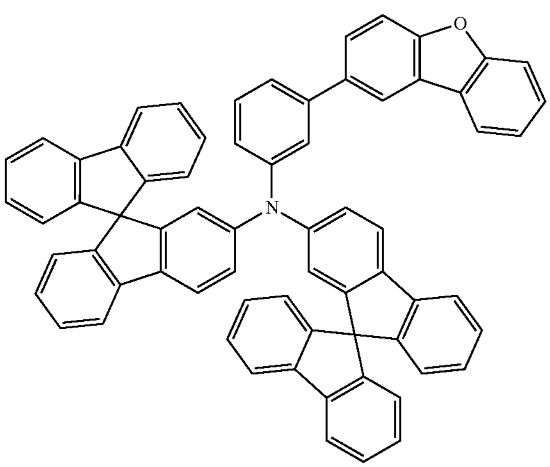
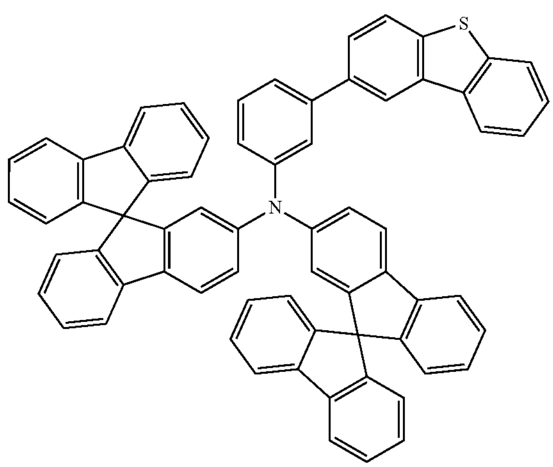

-continued
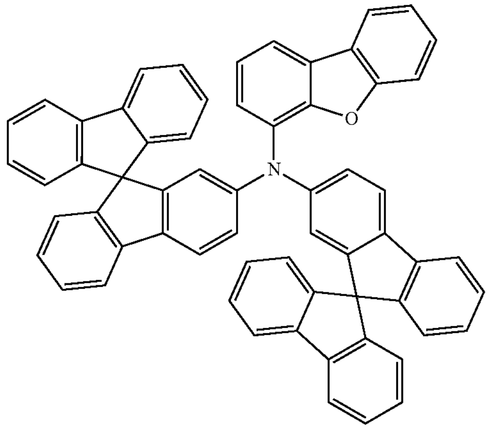
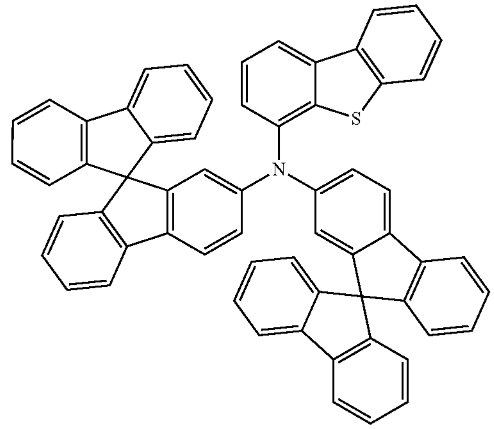
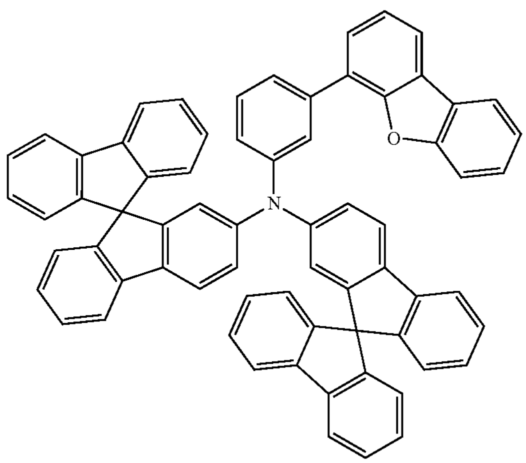
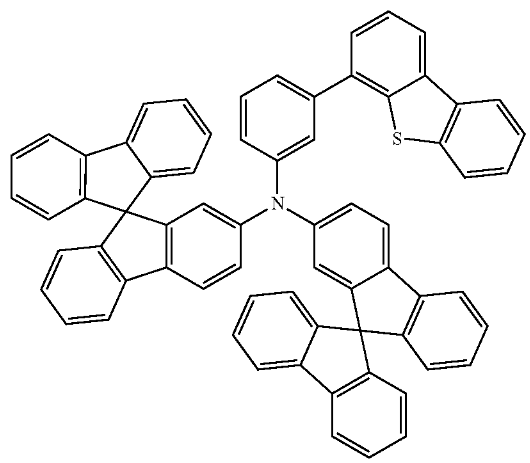
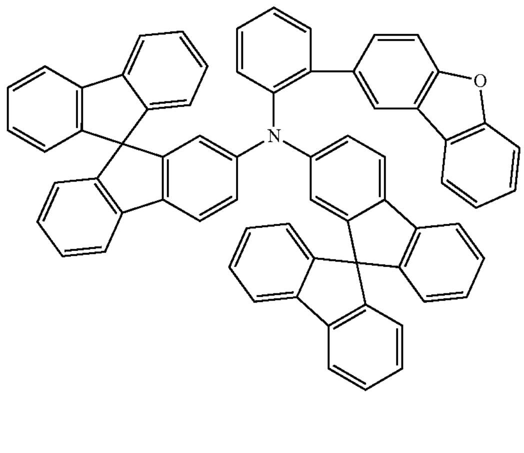
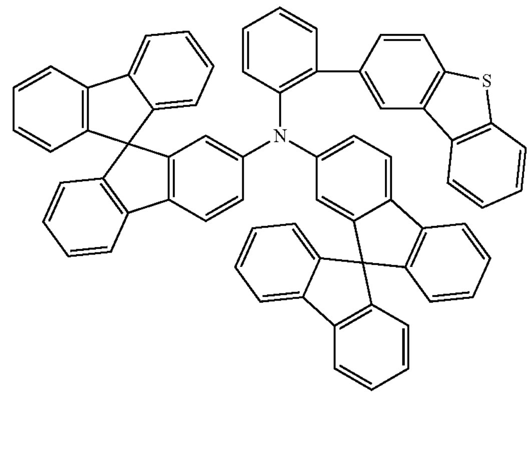

-continued
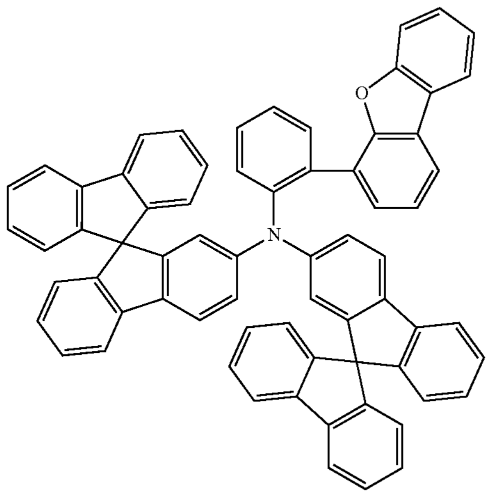
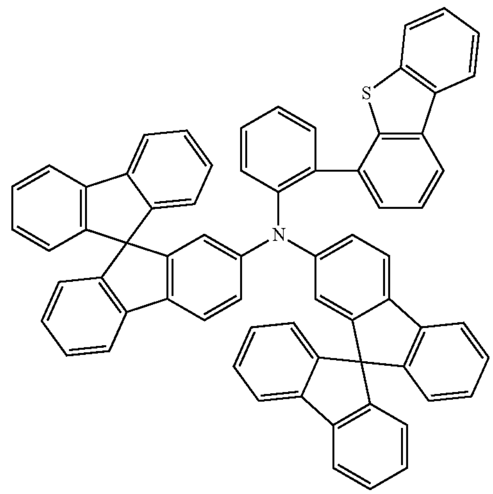
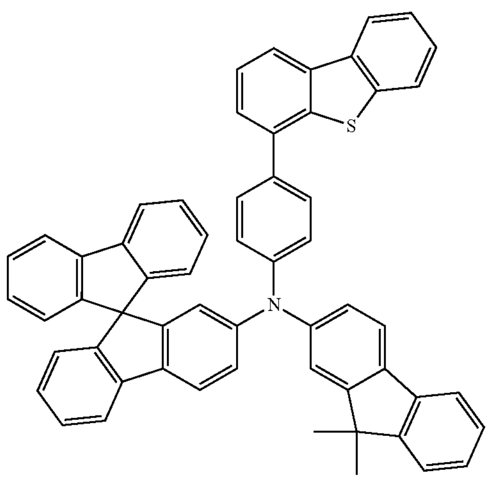
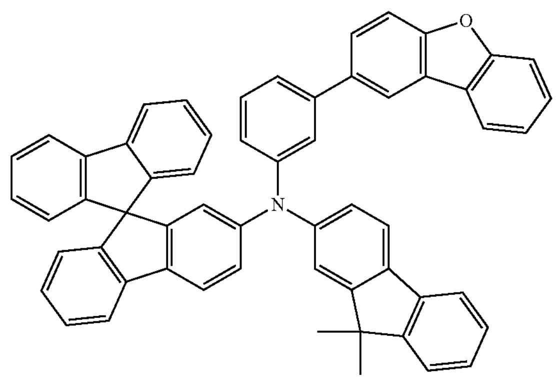
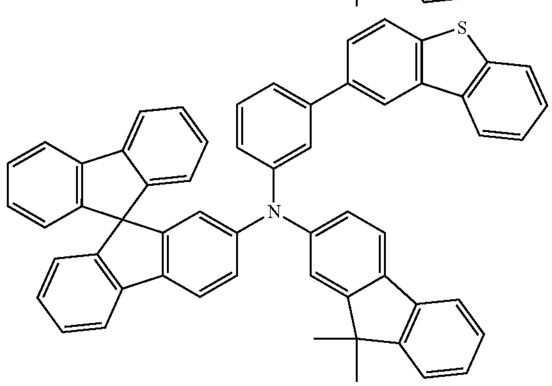
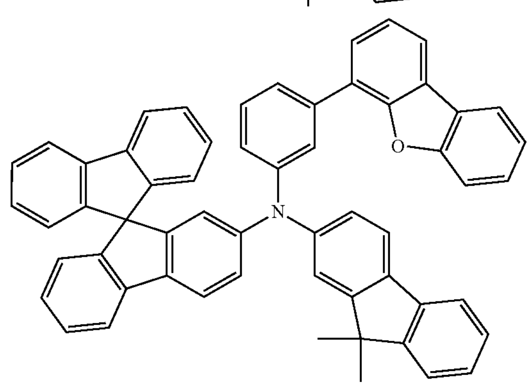
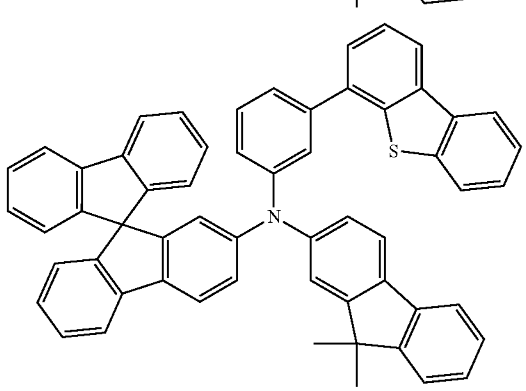

-continued
[Formula 157]
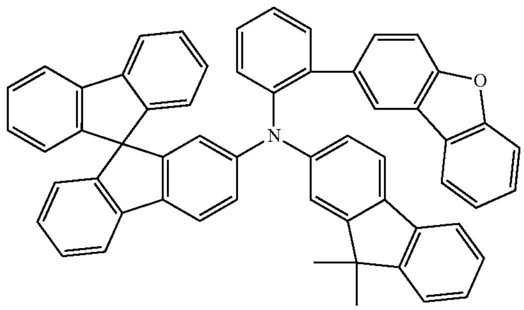
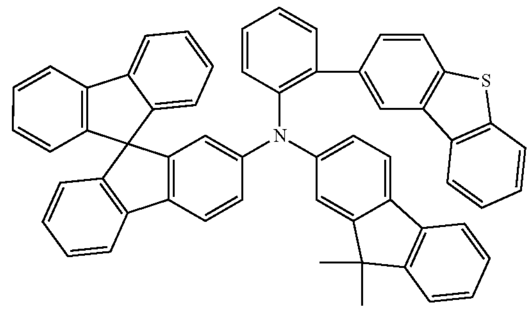
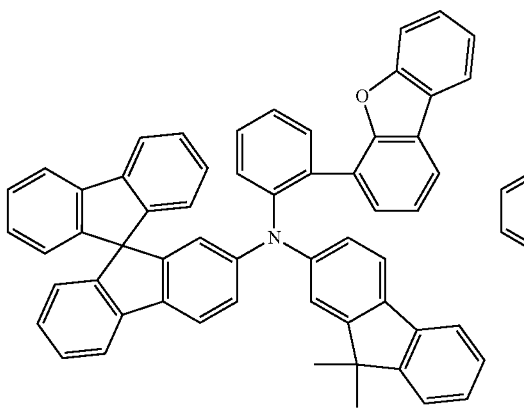
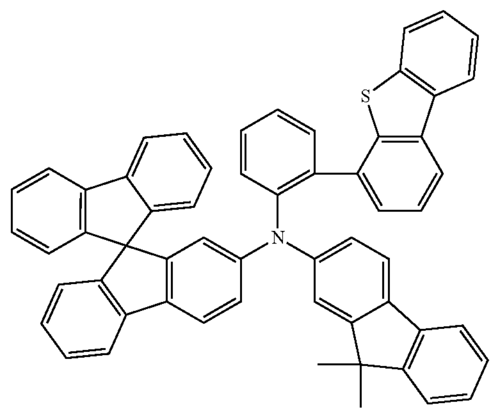
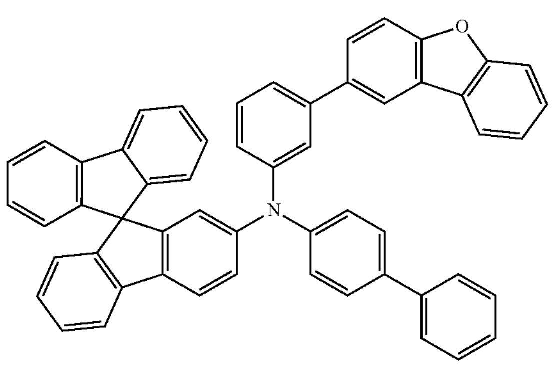
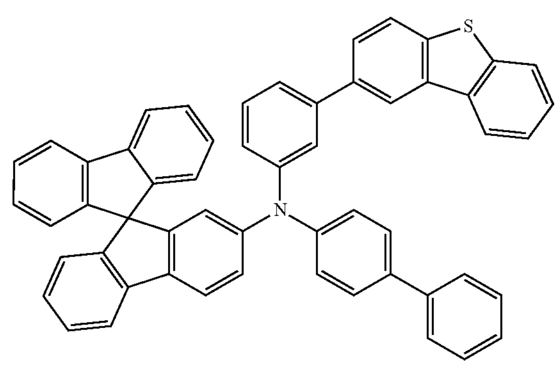
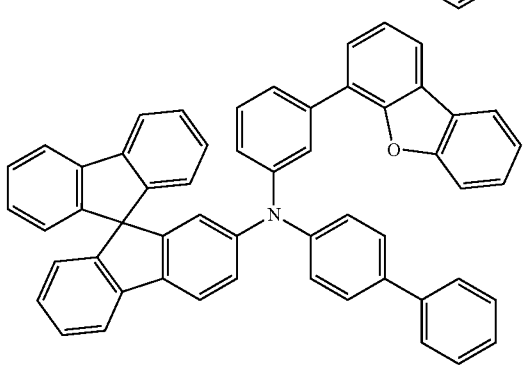
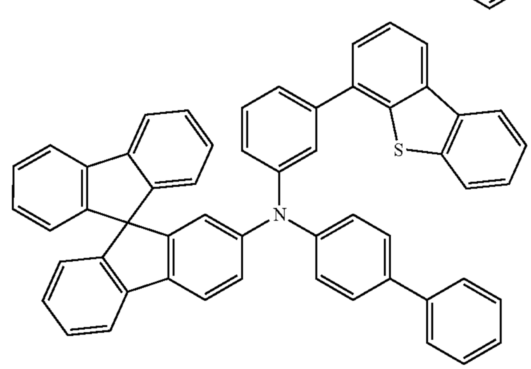

-continued
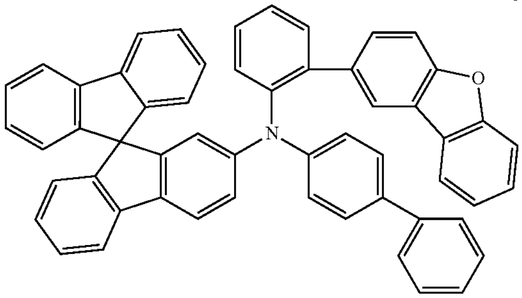
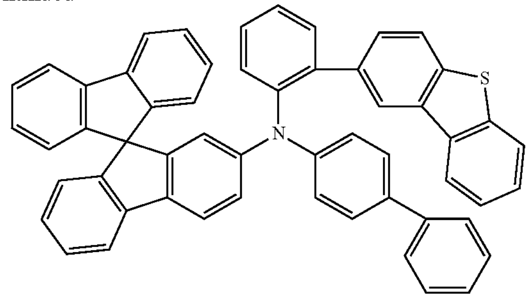
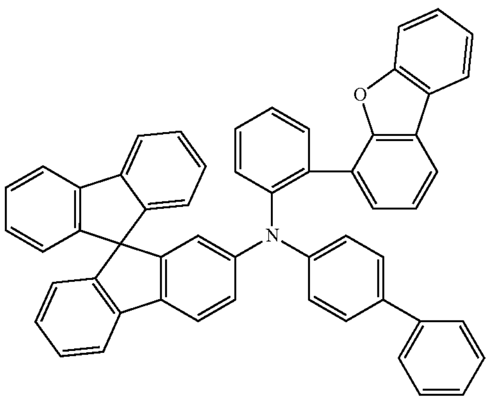
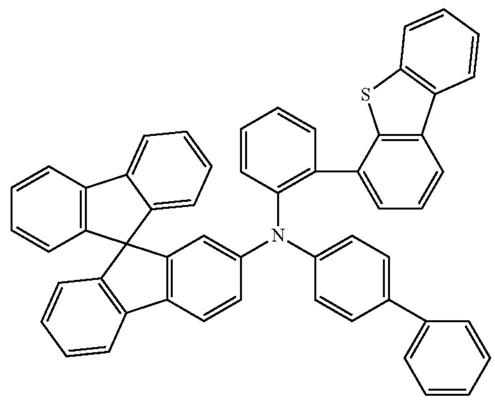
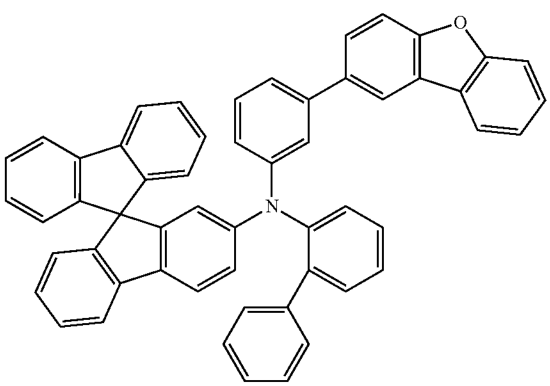
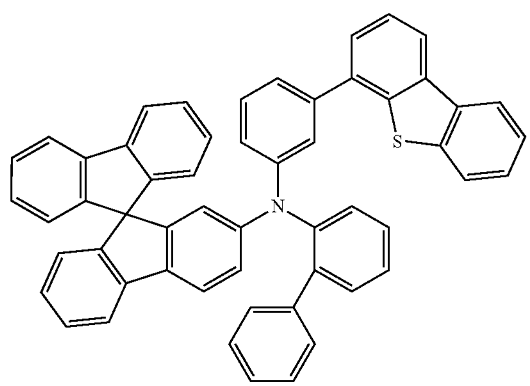
[Formula 158]
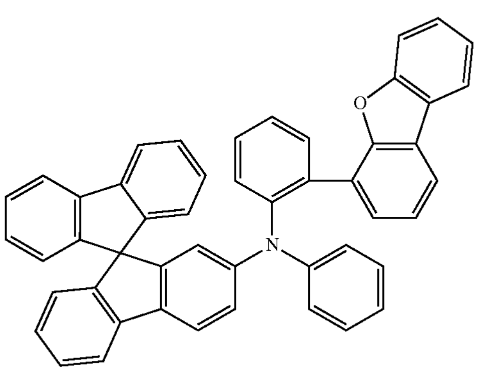
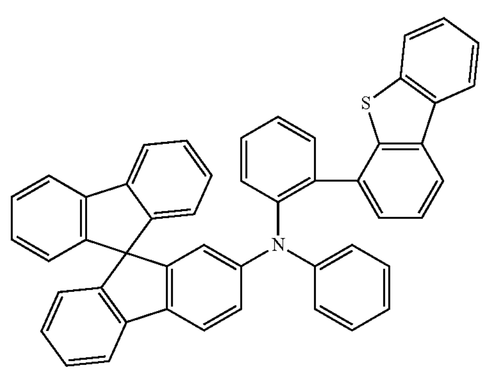

-continued
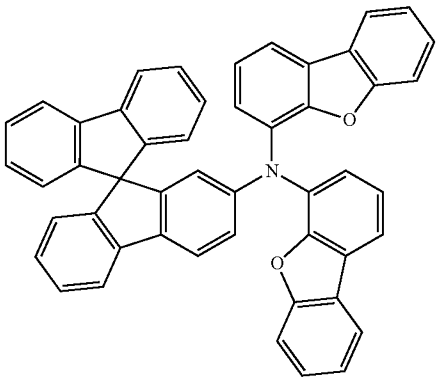
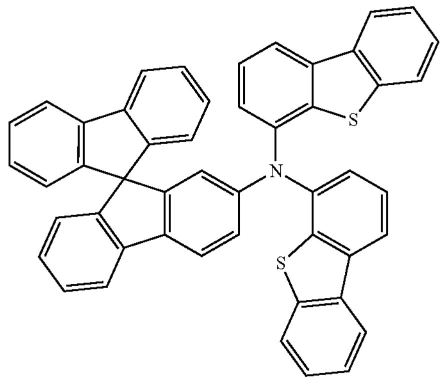
[Formula 159]
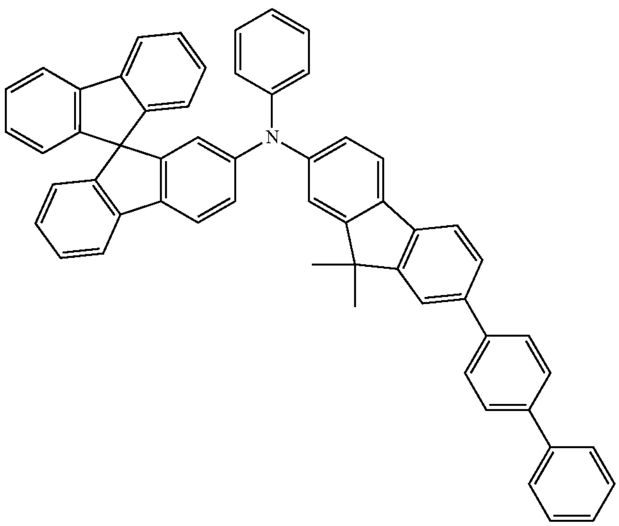
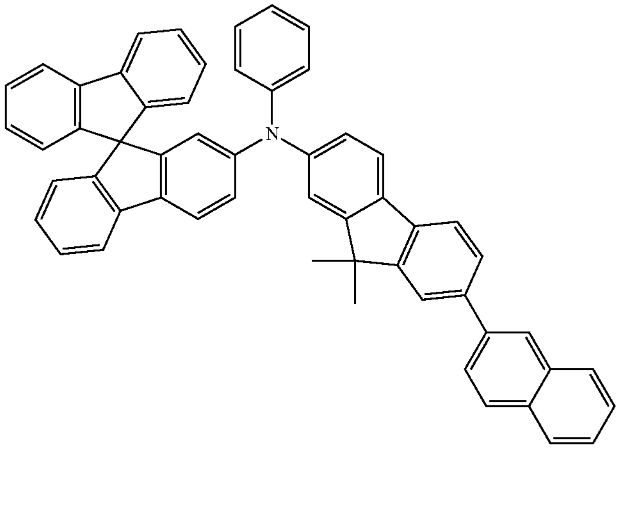

-continued
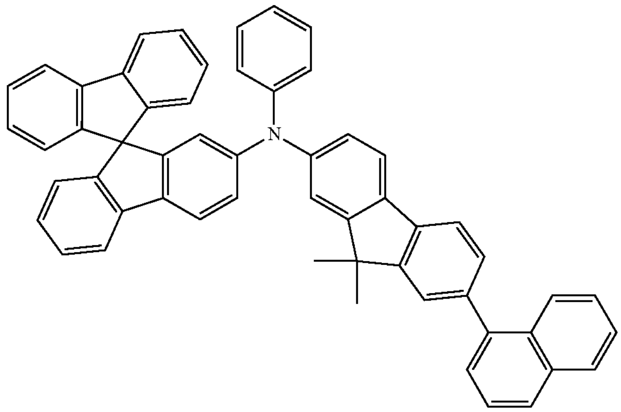
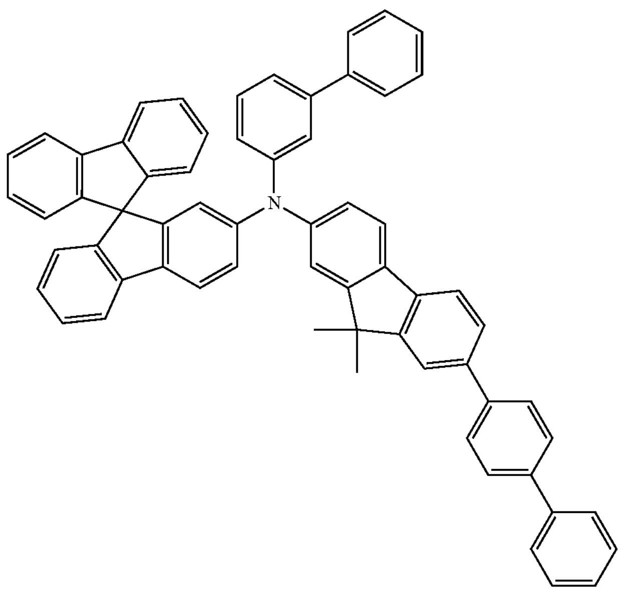
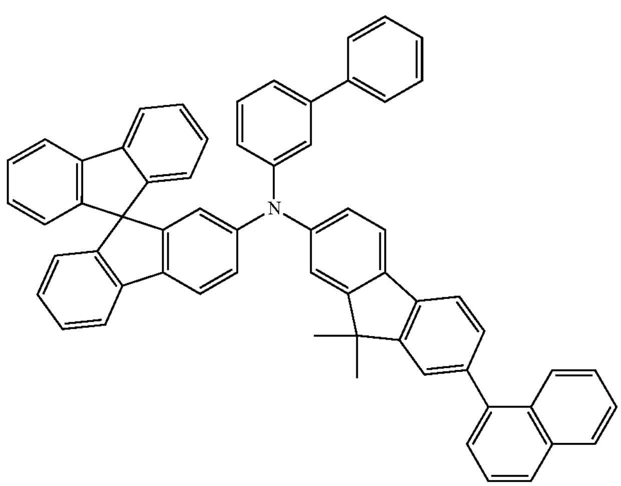

-continued
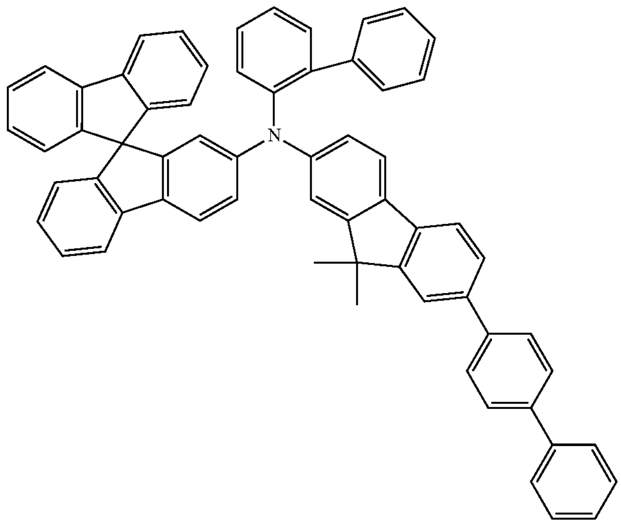
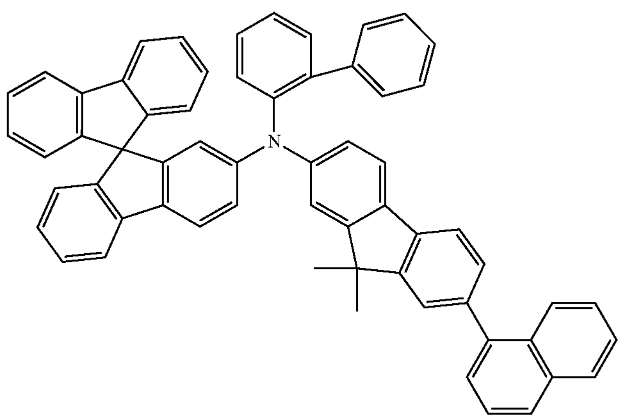
[Formula 160]
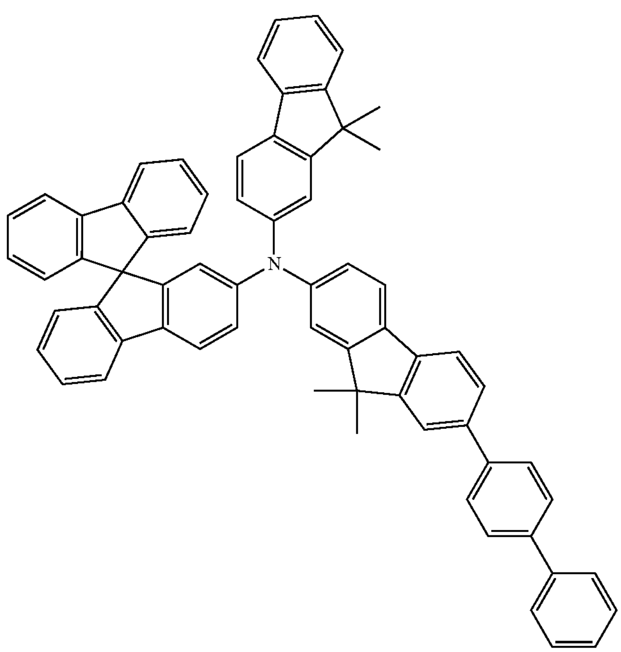

-continued
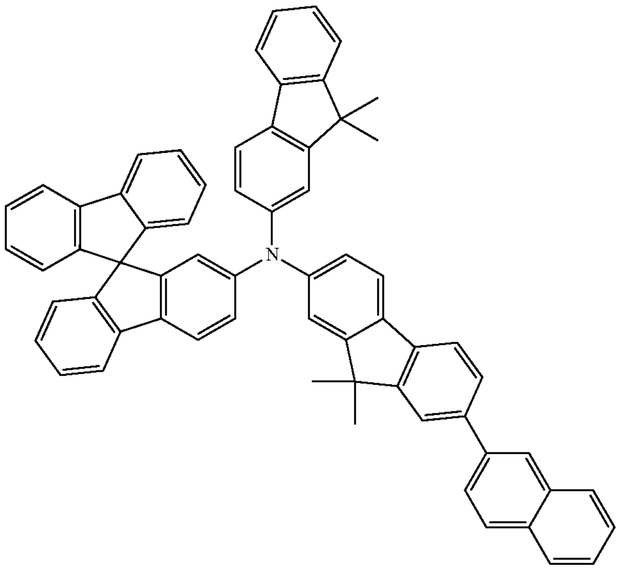
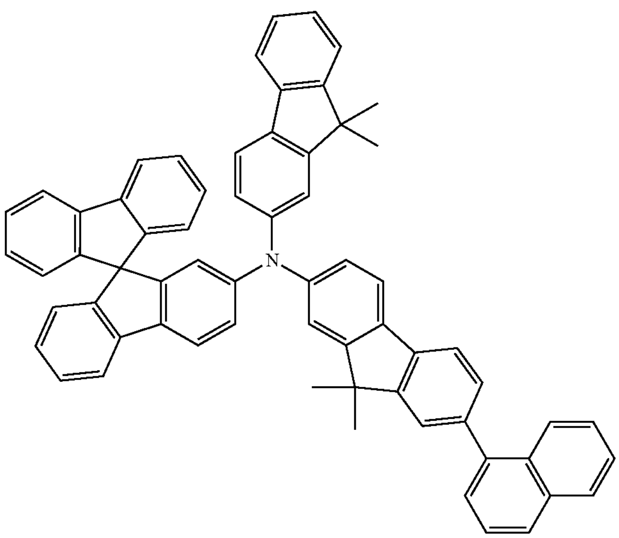
[Formula 161]
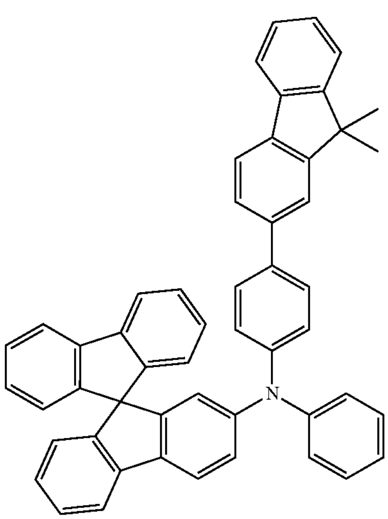
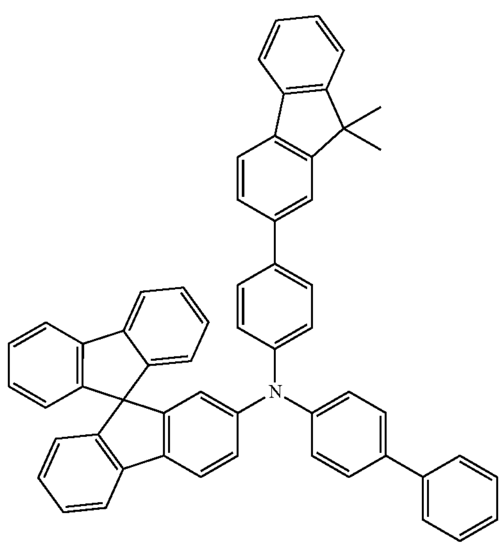

-continued
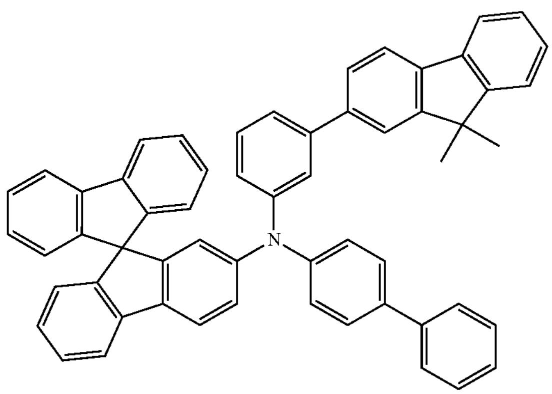
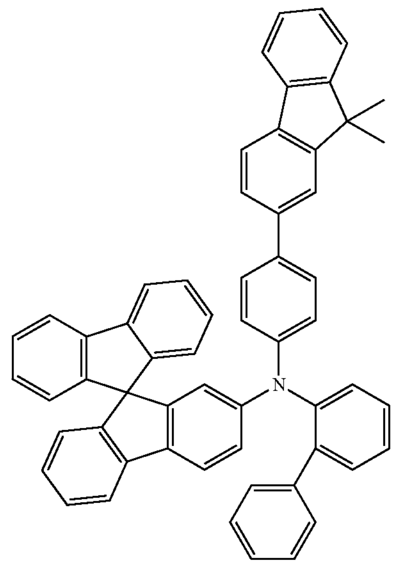
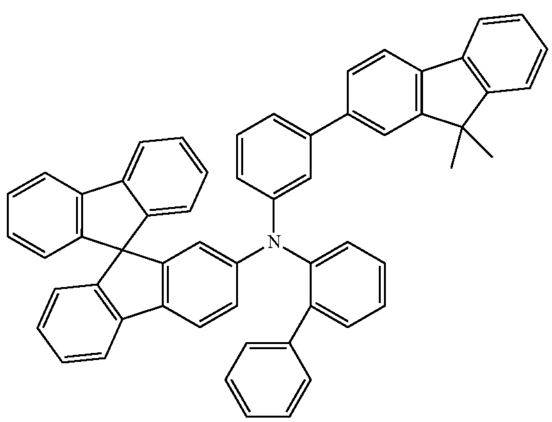
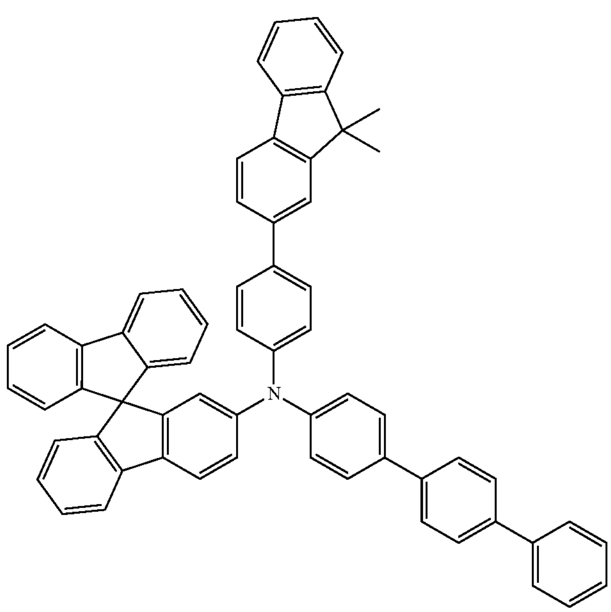

-continued
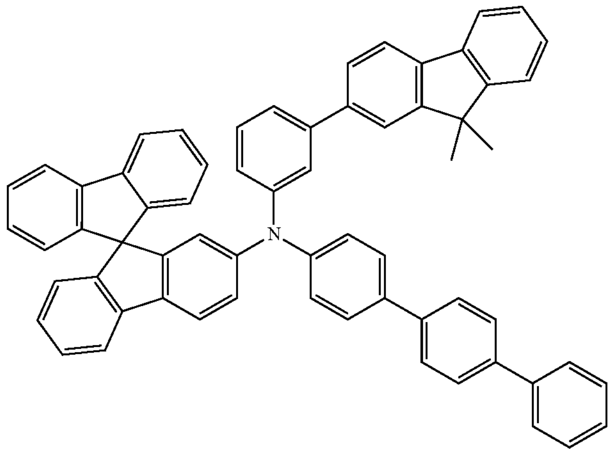
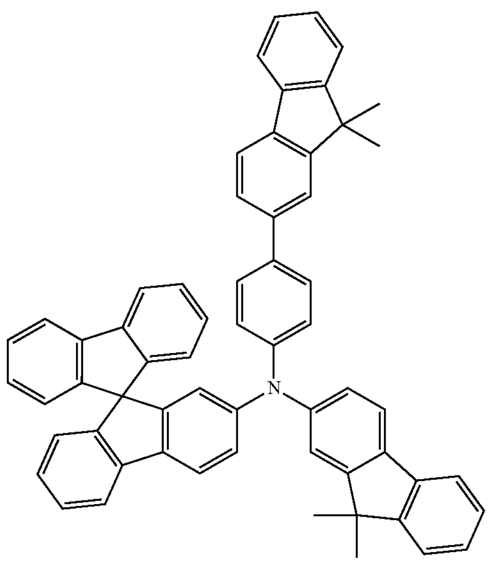
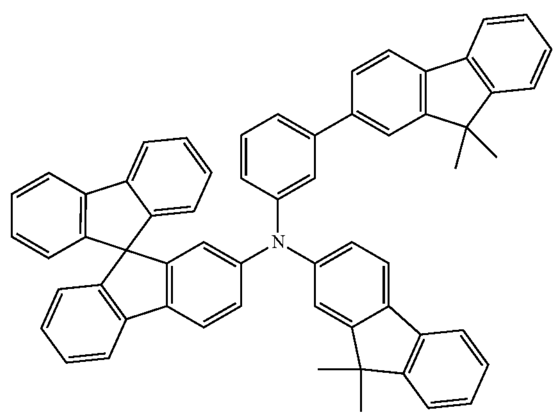
[Formula 162]
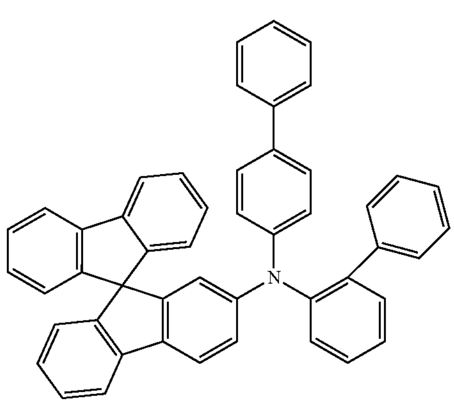
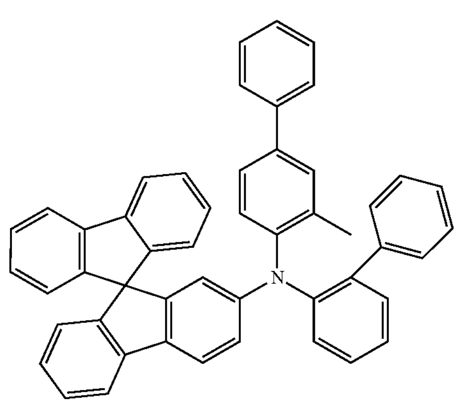

-continued
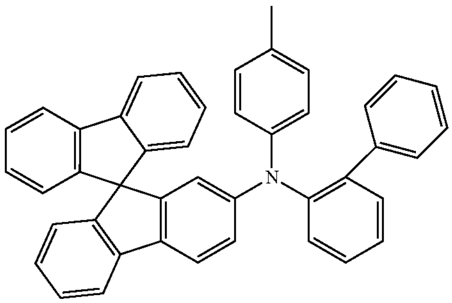
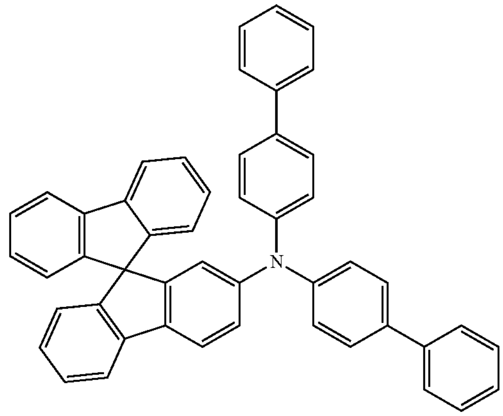
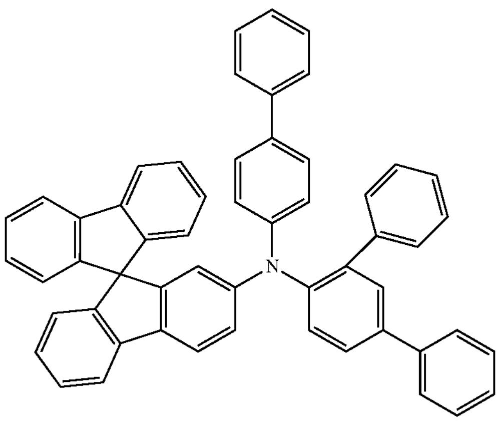
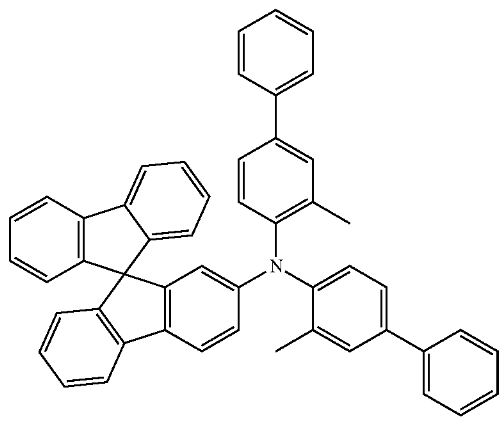
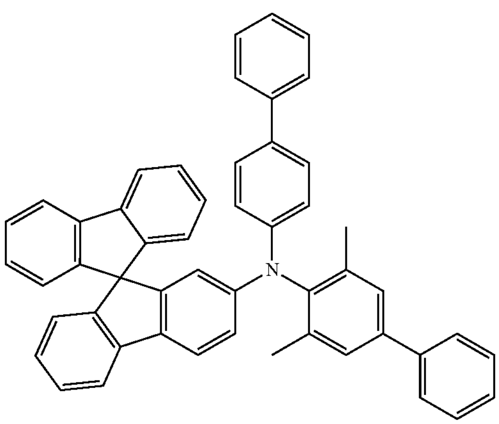
[Formula 163]
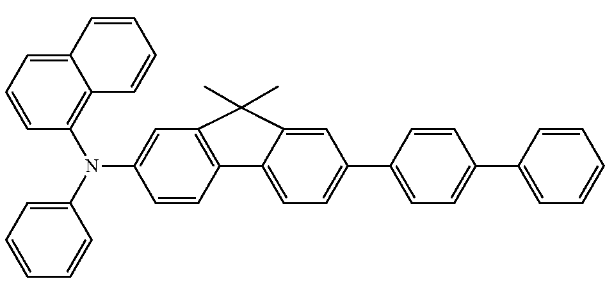

-continued
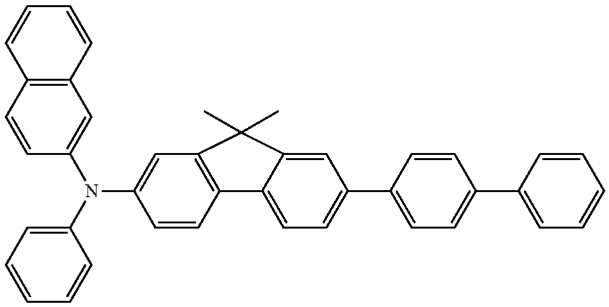
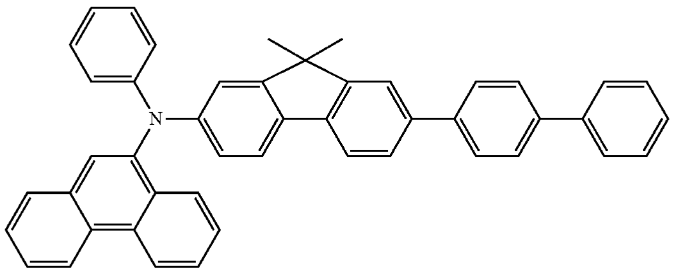
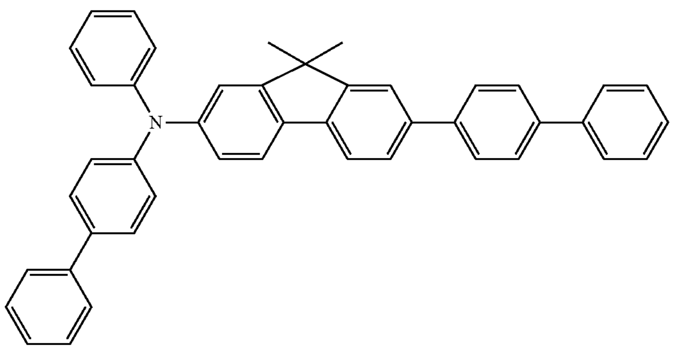
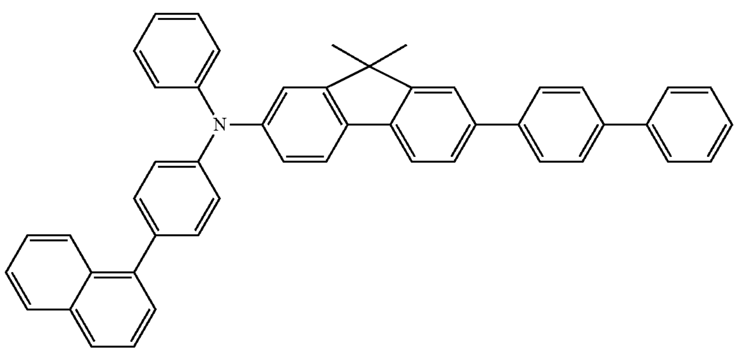
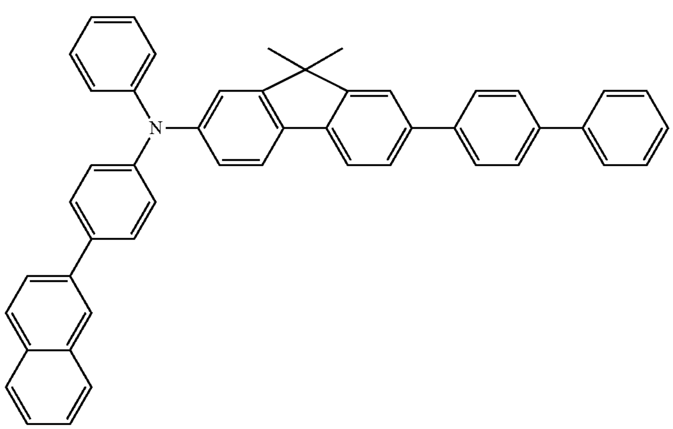

-continued
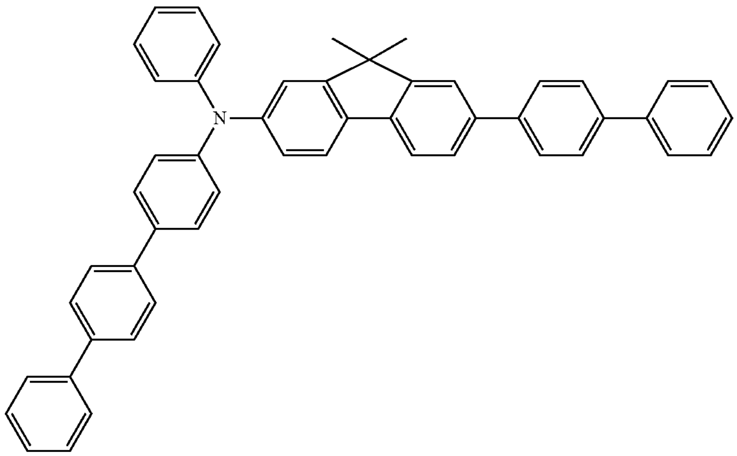
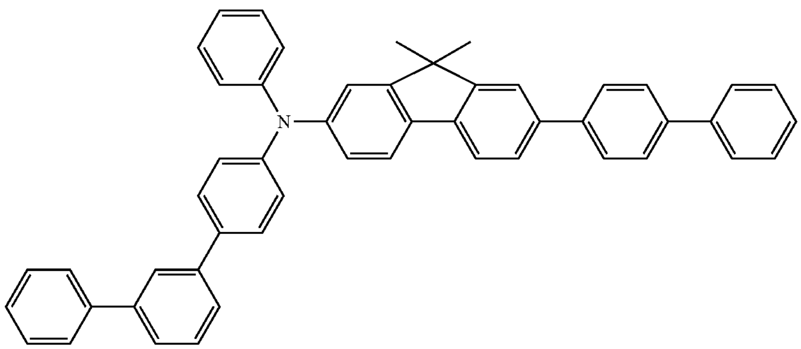
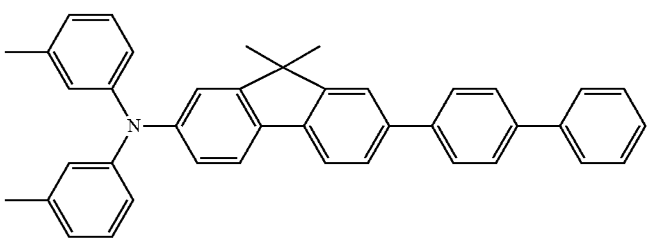
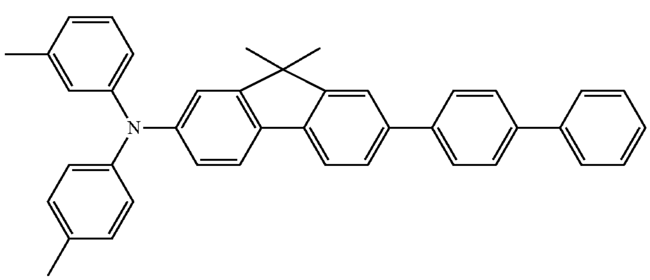
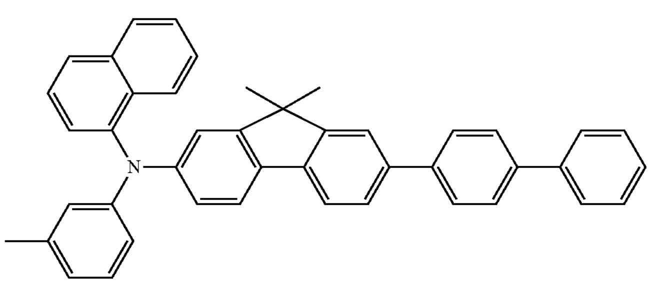

-continued
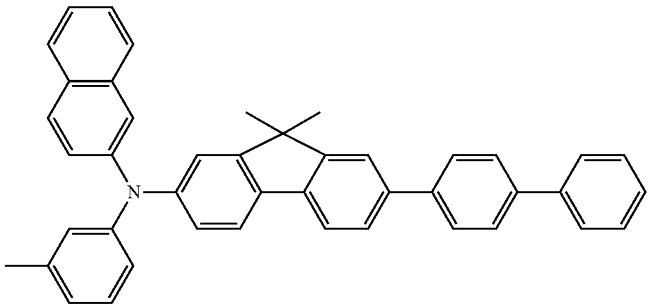
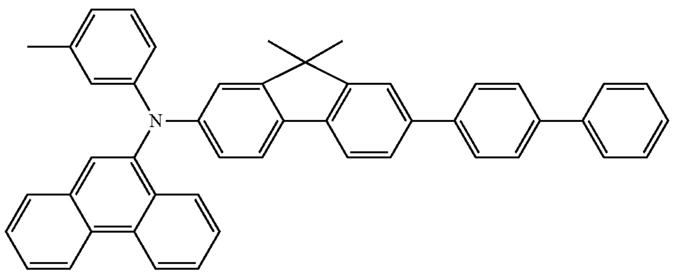
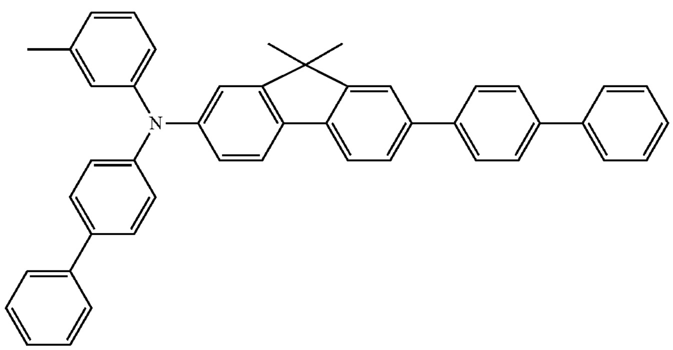
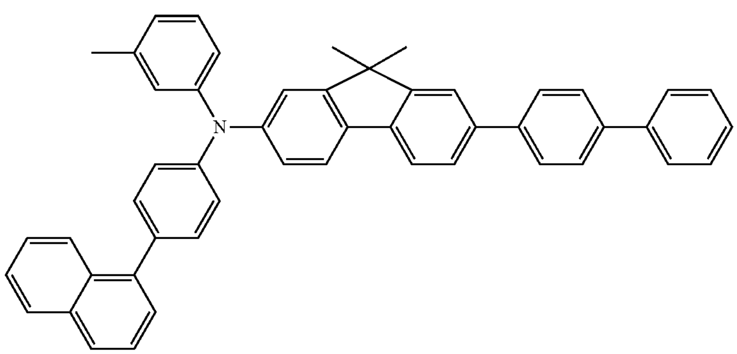
[Formula 164]
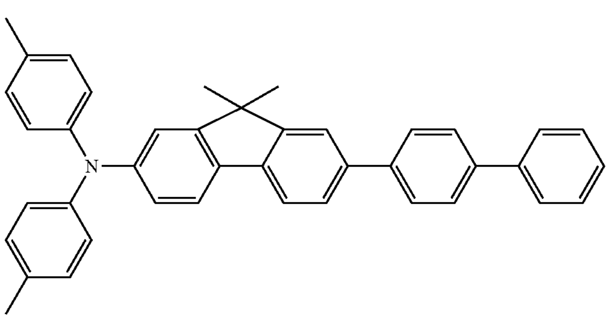

-continued
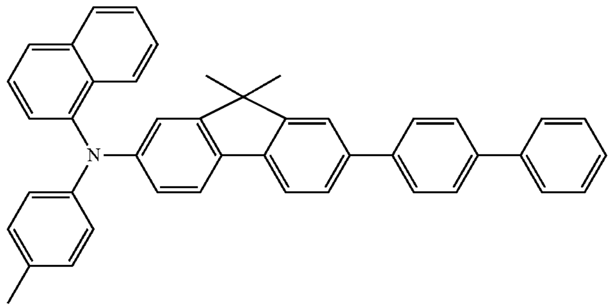
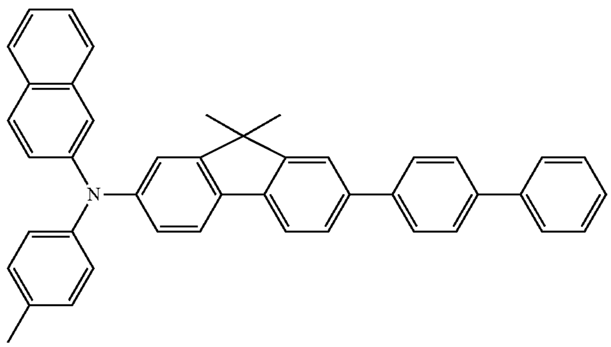
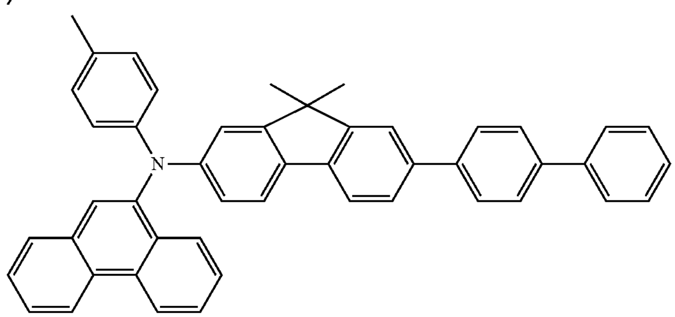
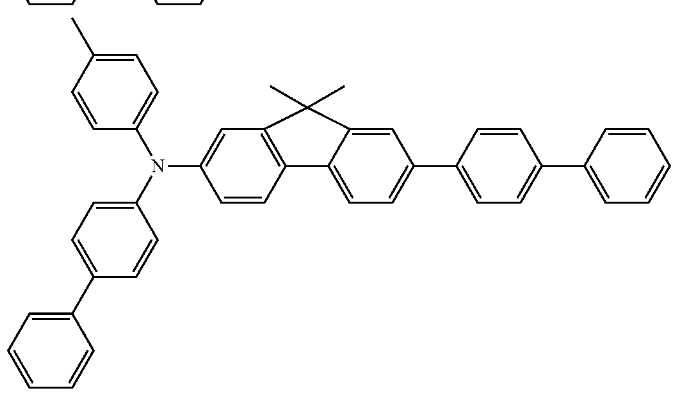
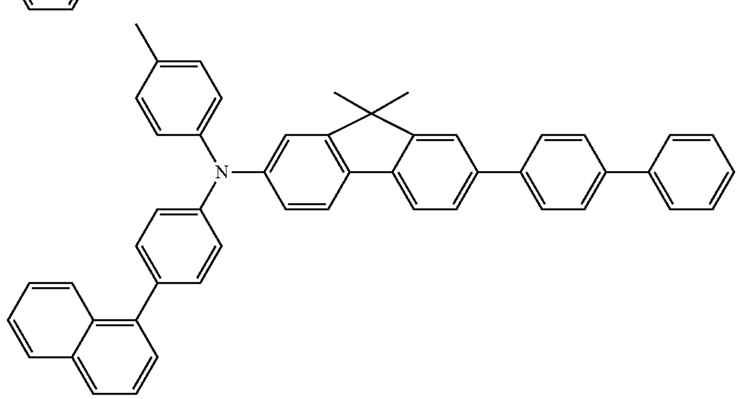

-continued
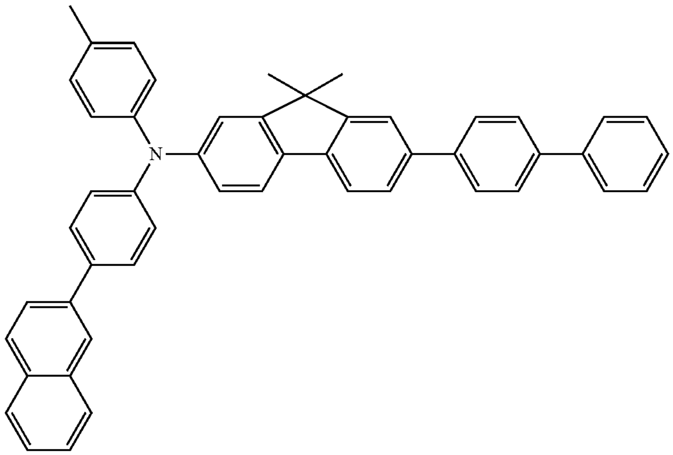
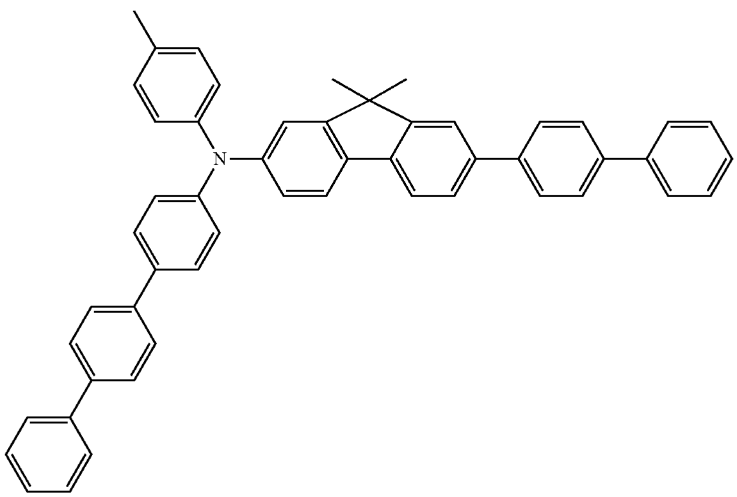
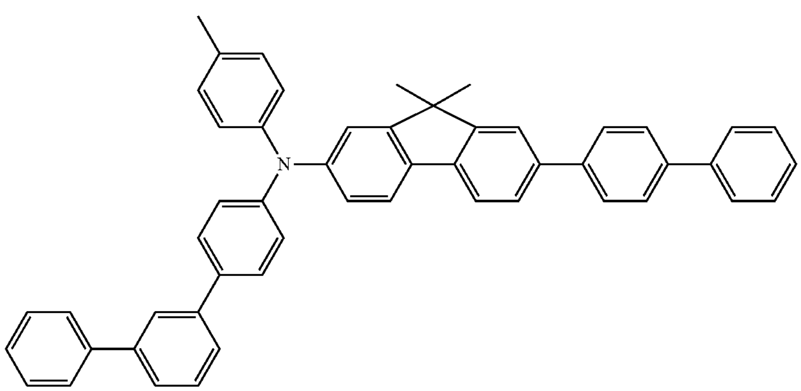
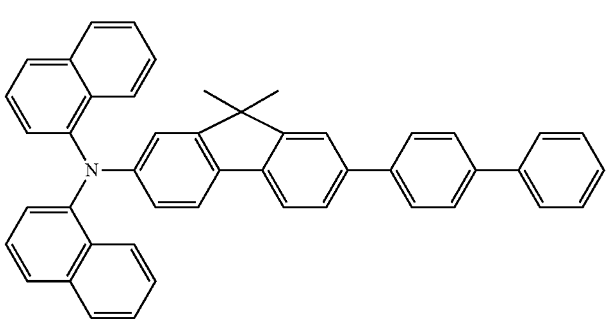

-continued
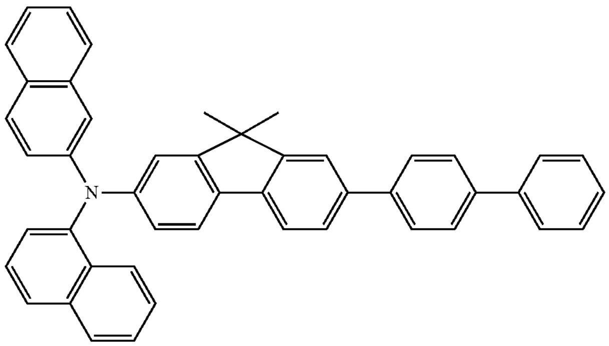
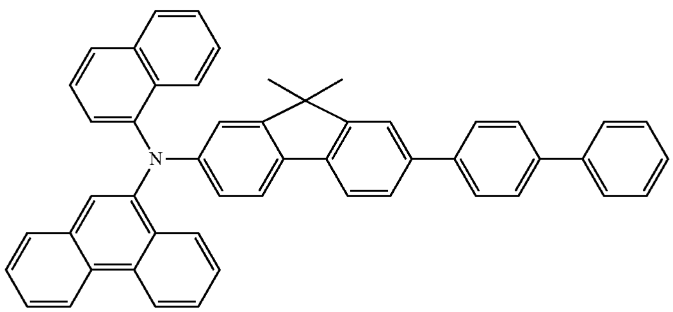
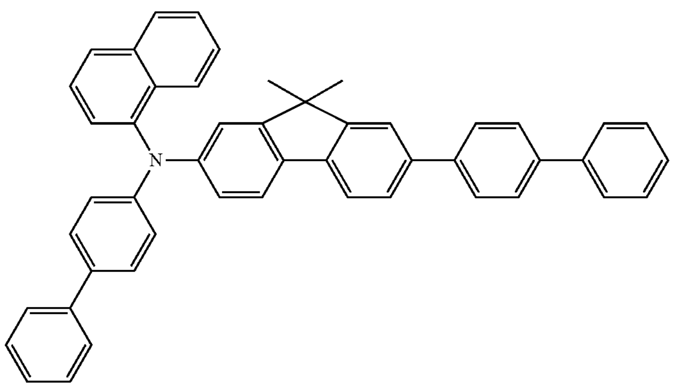
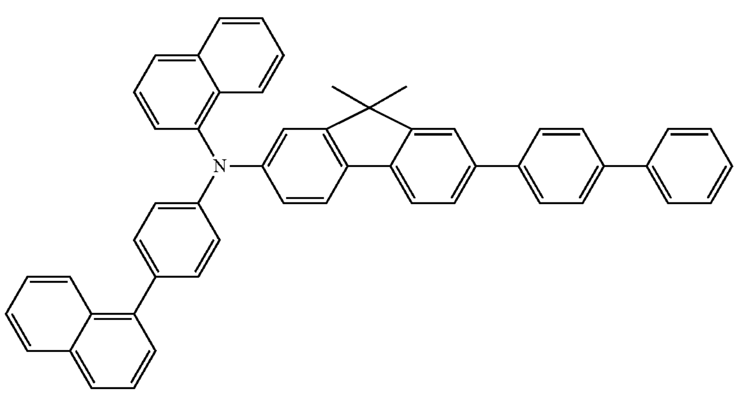

-continued
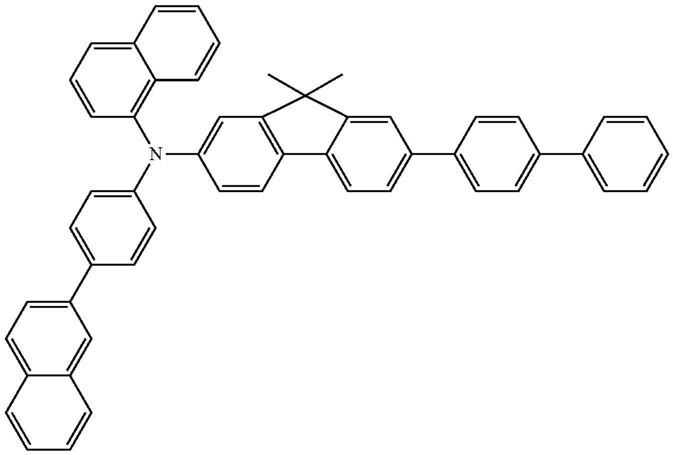
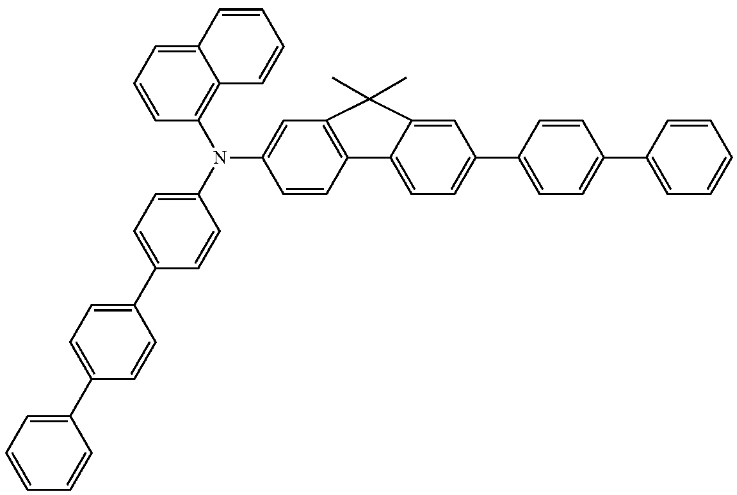
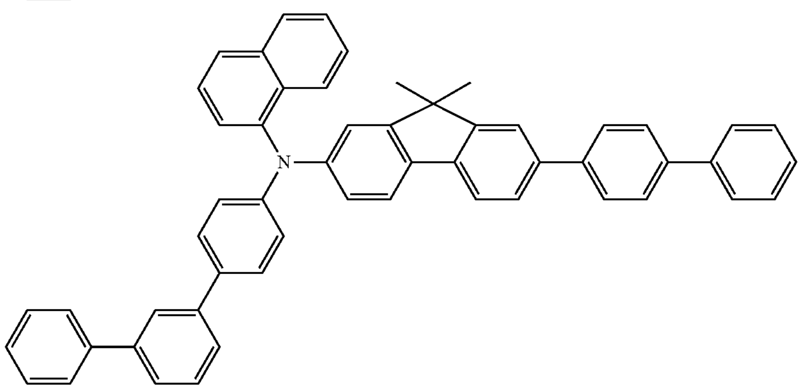
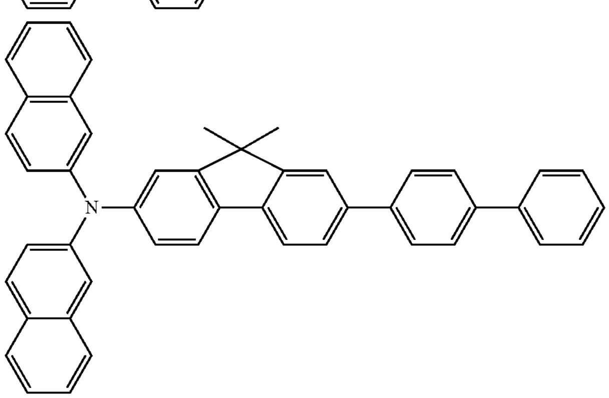

-continued
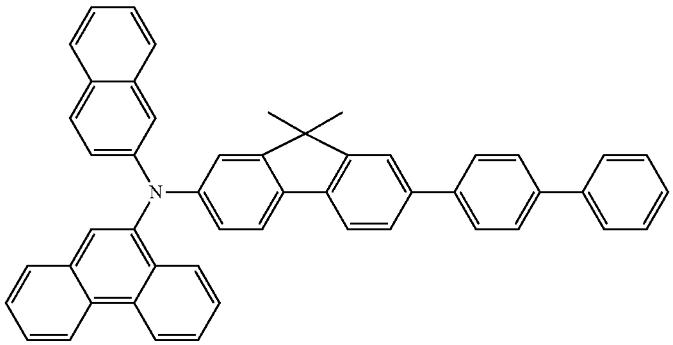
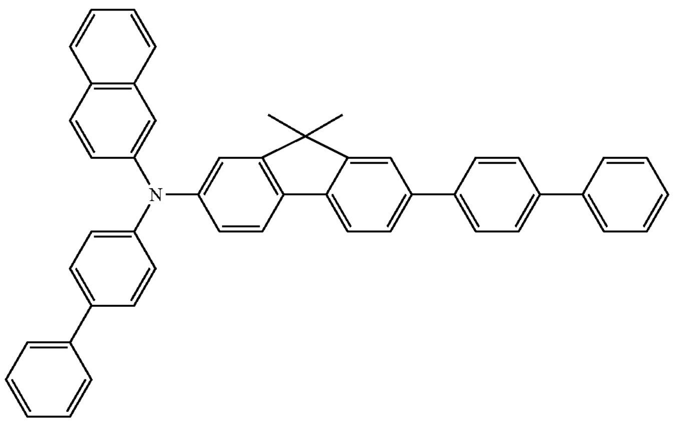
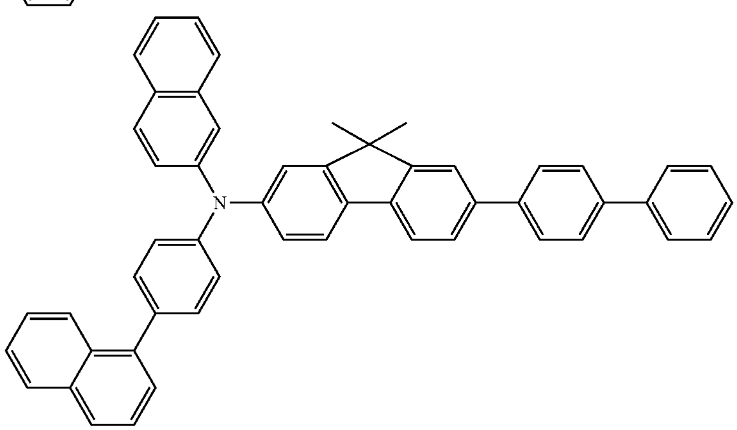
[Formula 165]
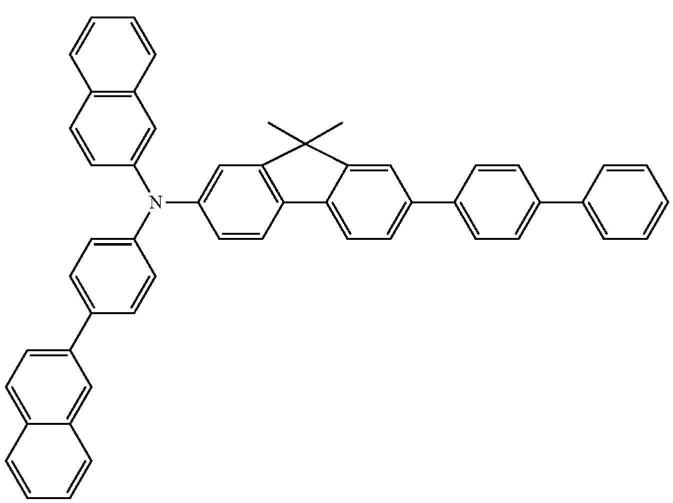

-continued
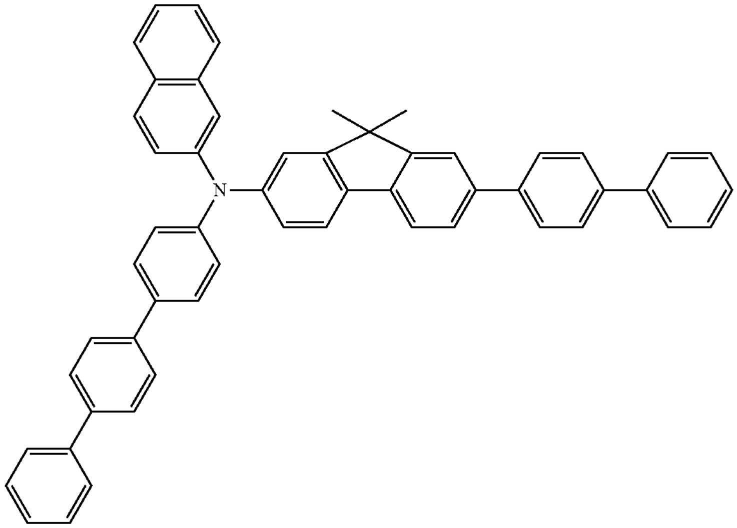
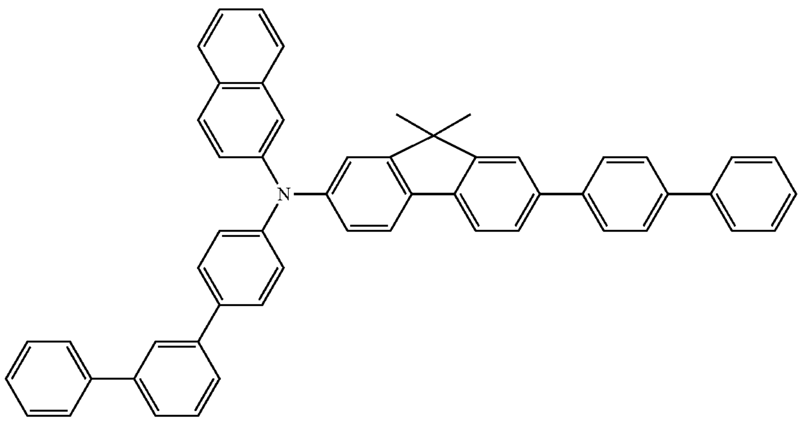
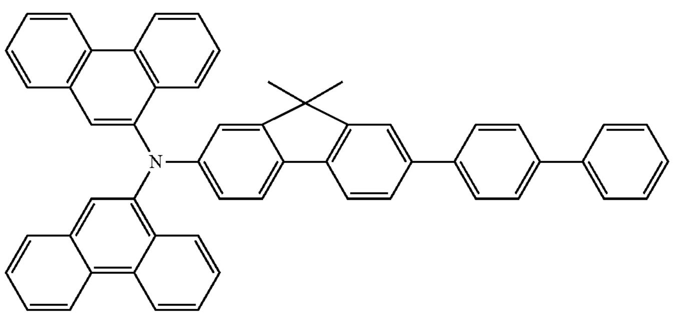
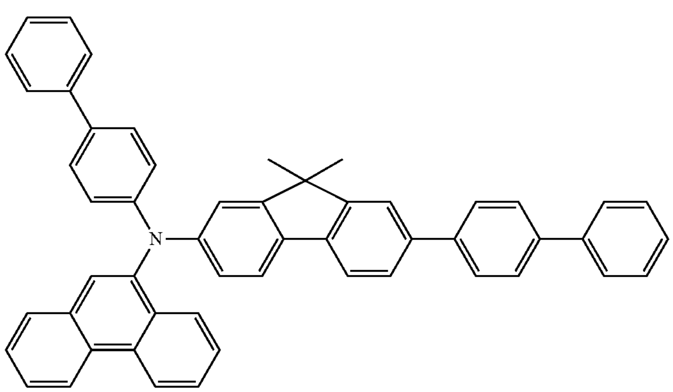

-continued
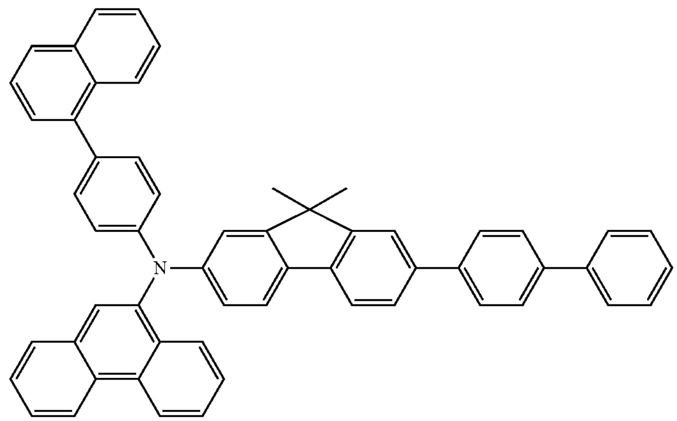
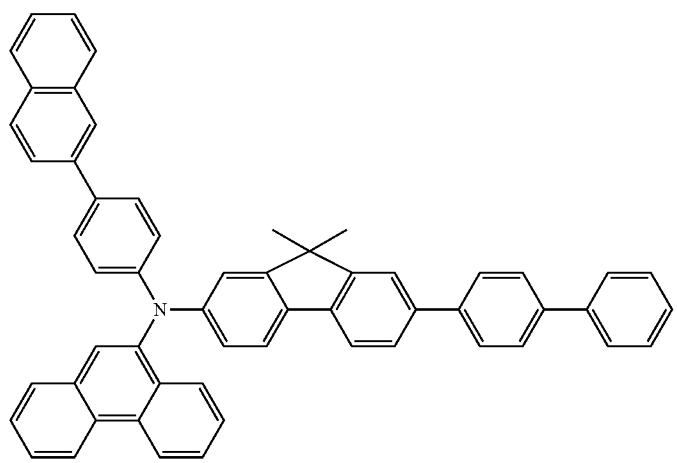
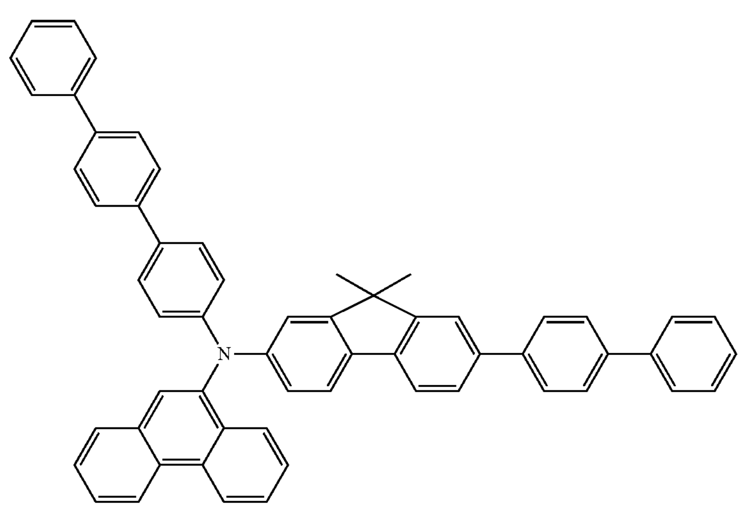

-continued
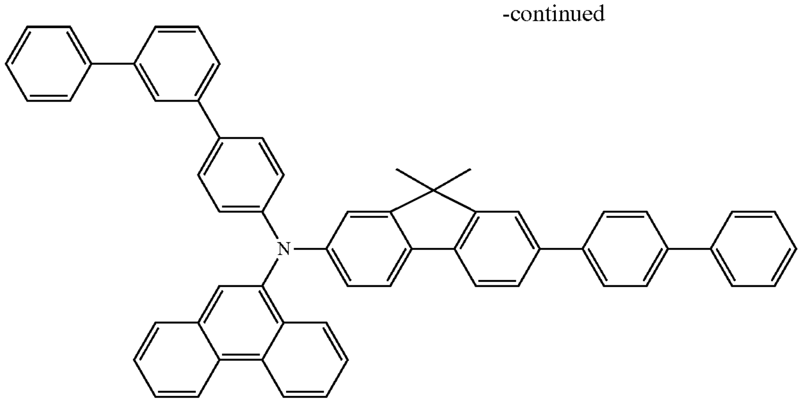
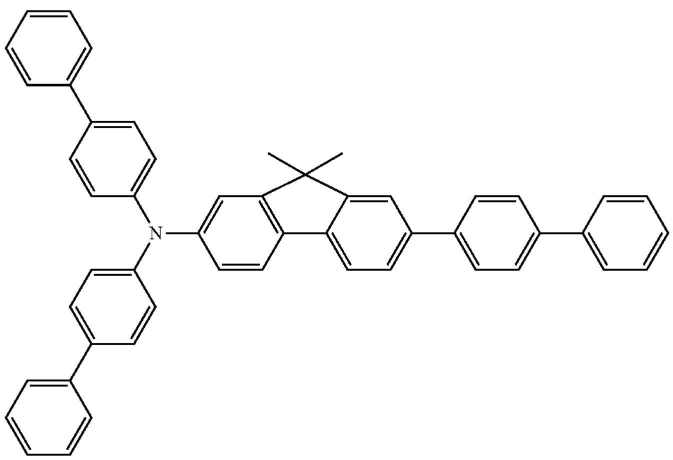
[Formula 166]
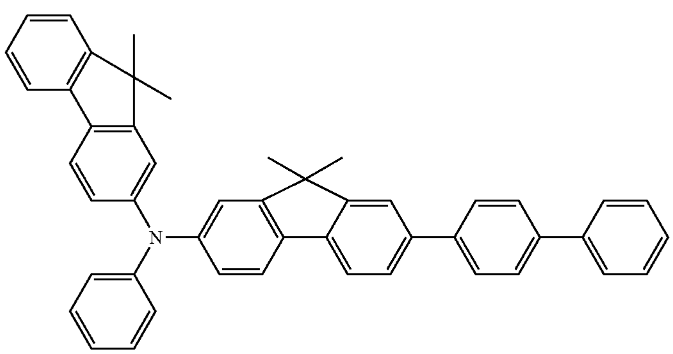
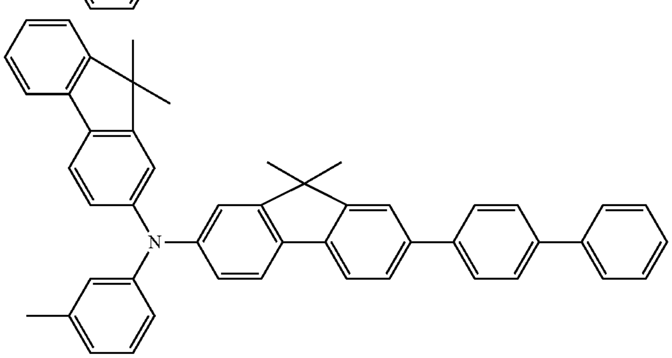

-continued
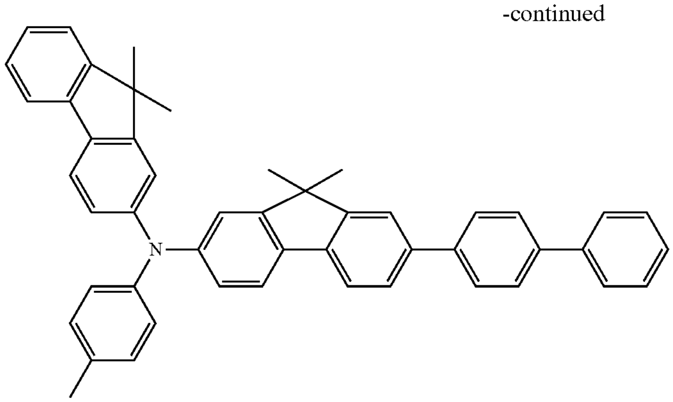
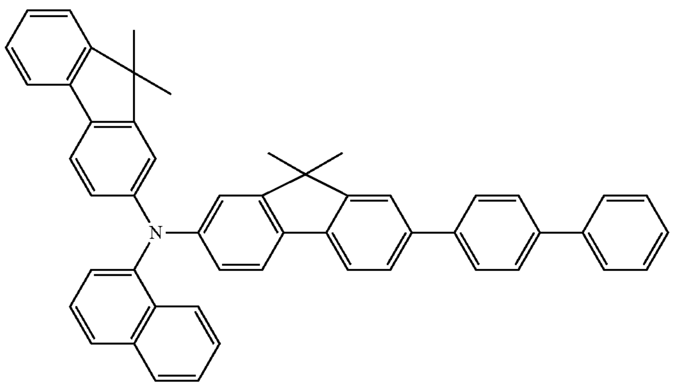
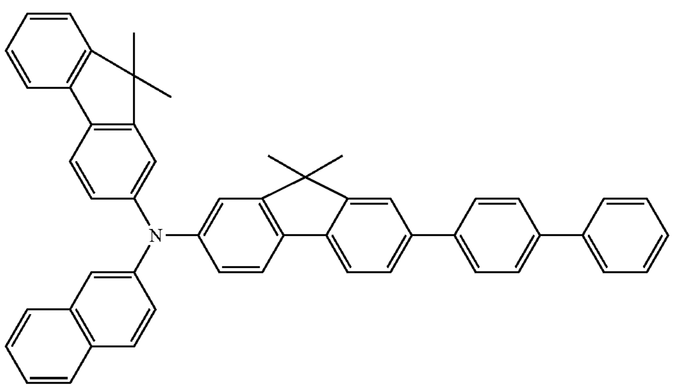
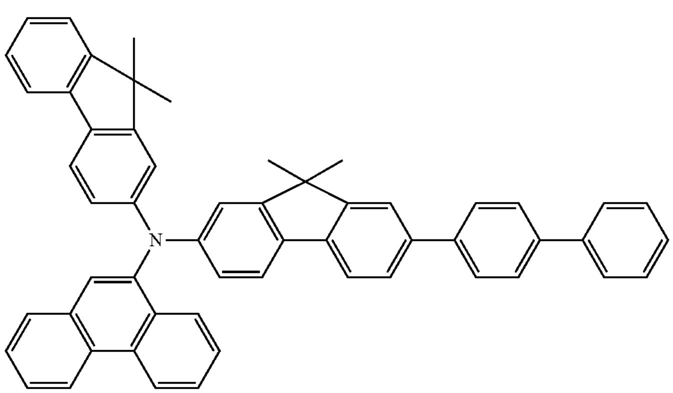

-continued
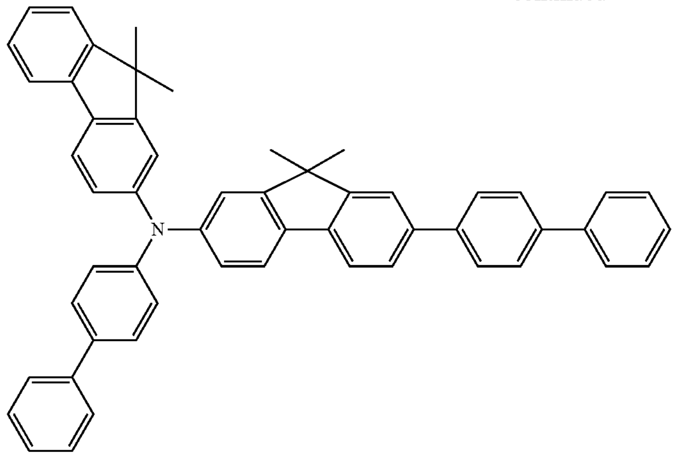
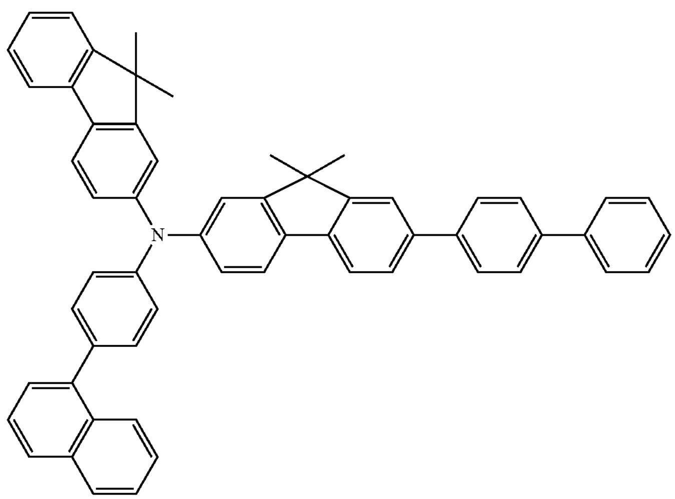
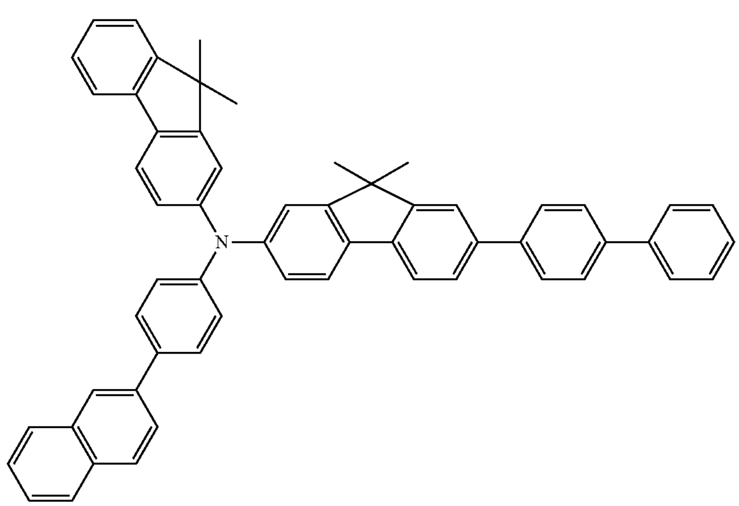

-continued
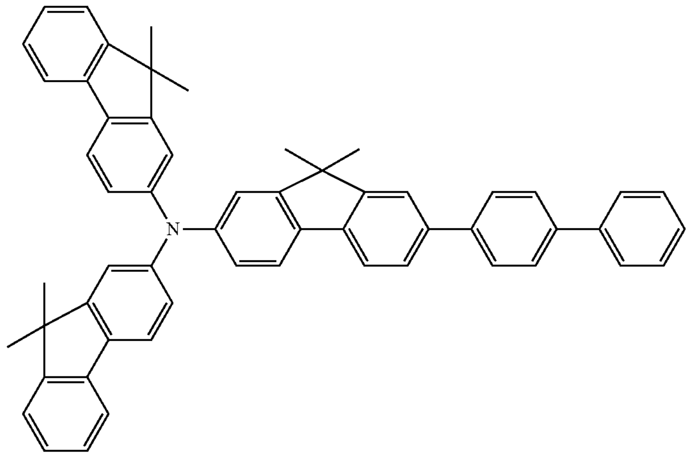
[Formula 167]
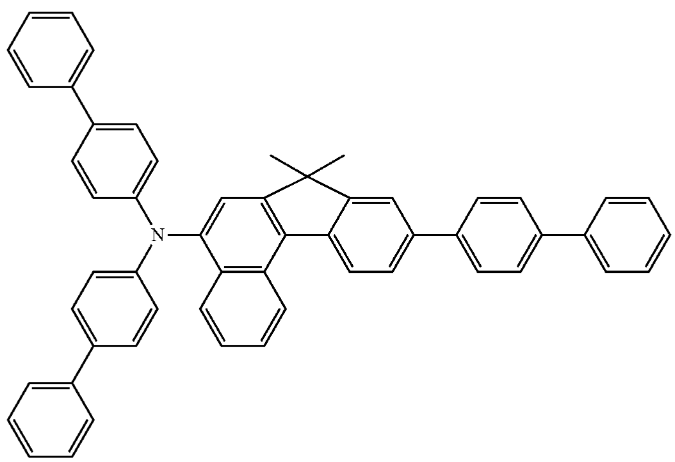
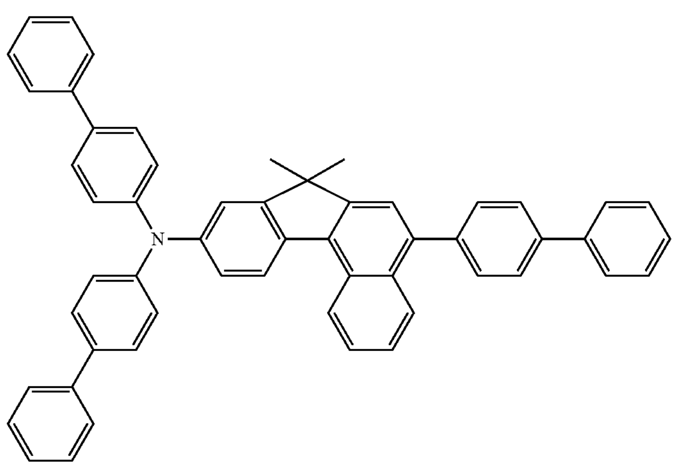

-continued
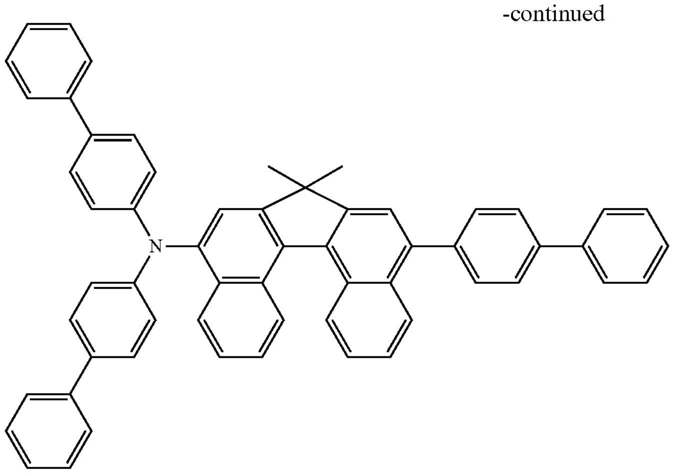
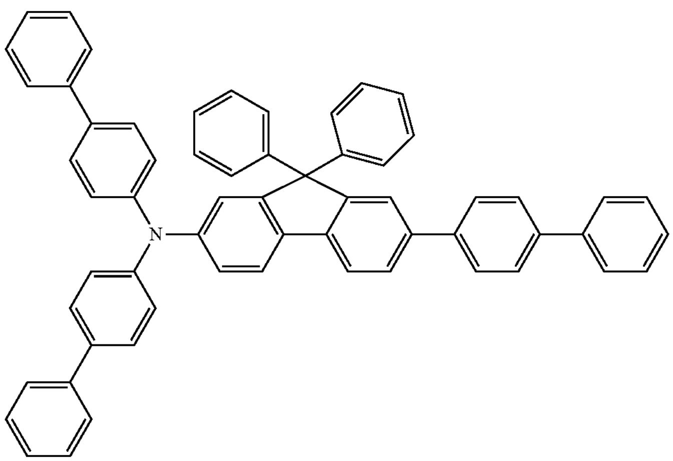
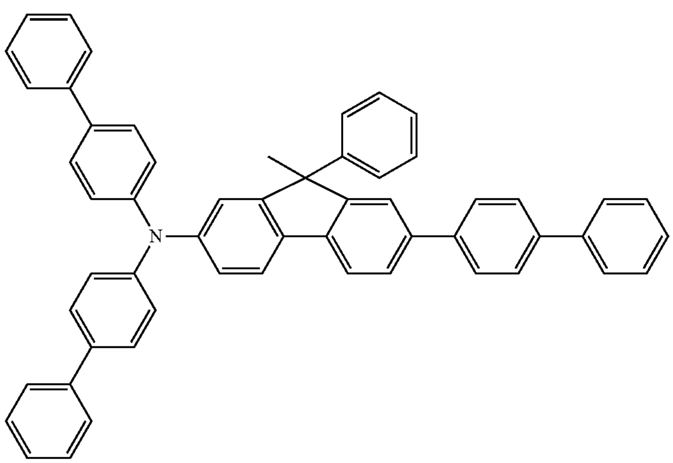
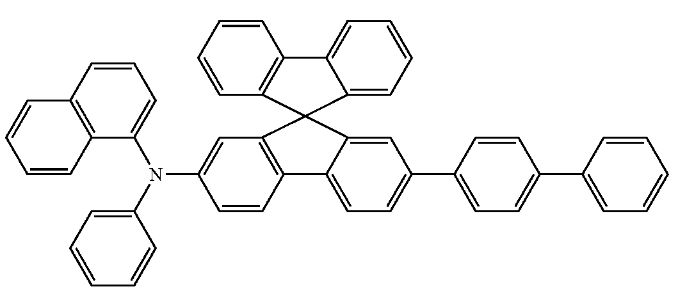

-continued
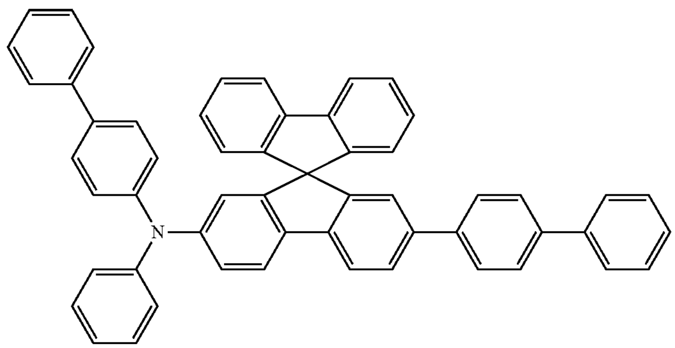
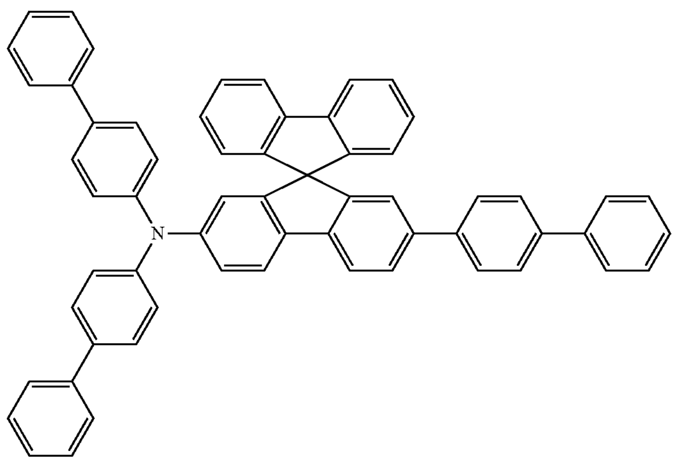
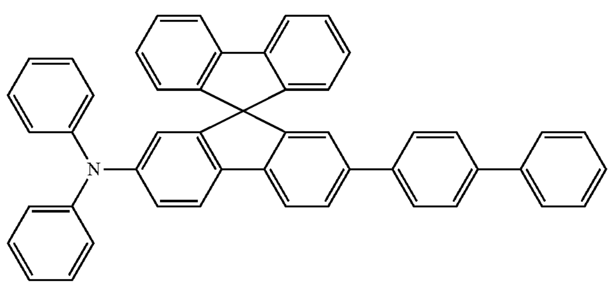
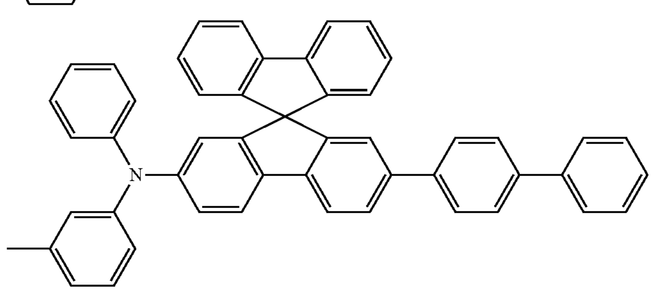
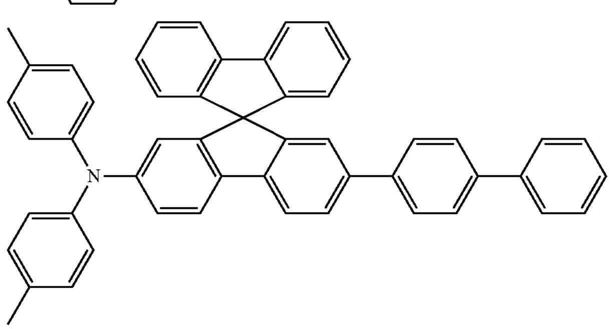

-continued
[Formula 168]
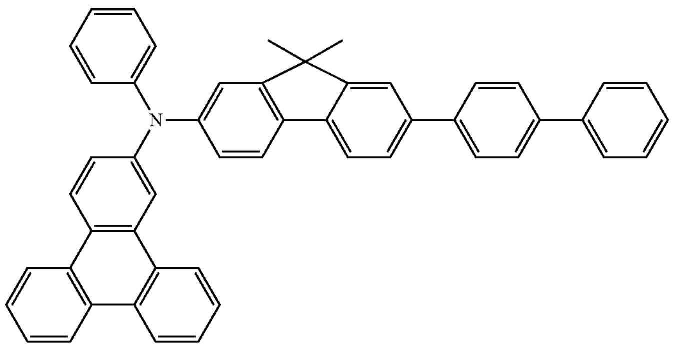
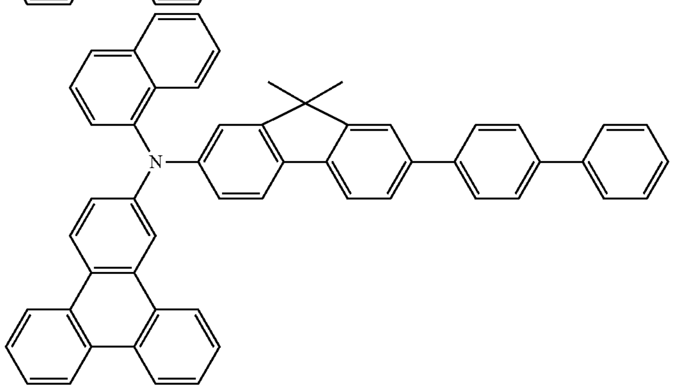
[Formula 169]
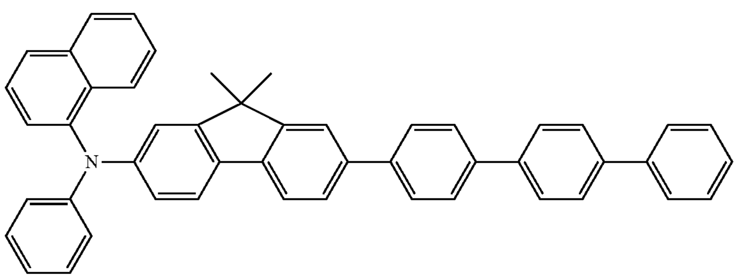
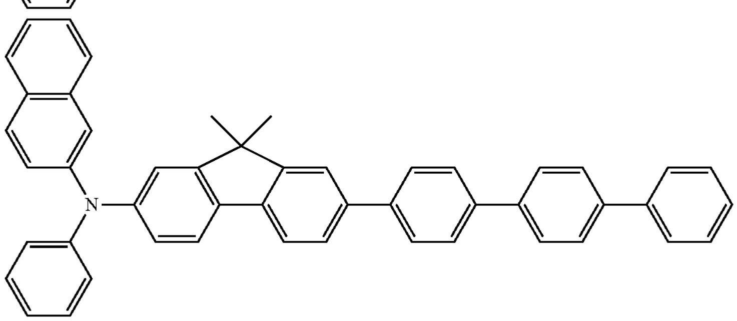
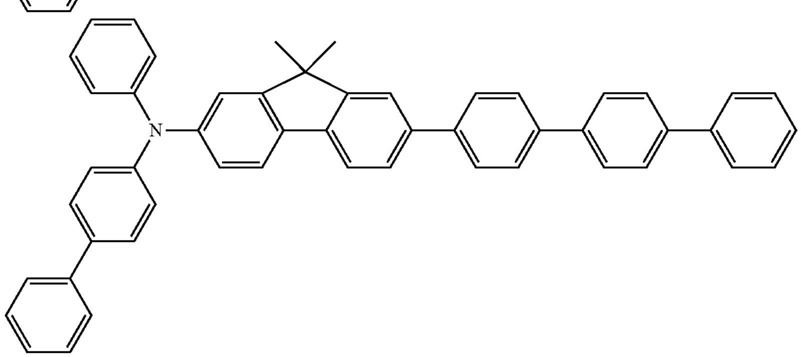

-continued
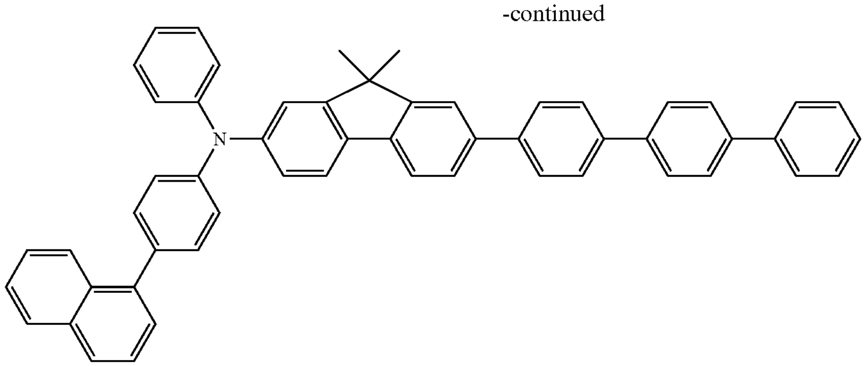
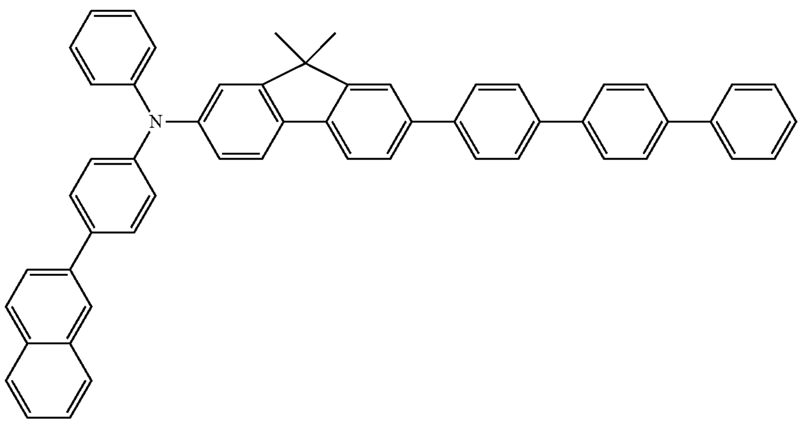
[Formula 170]
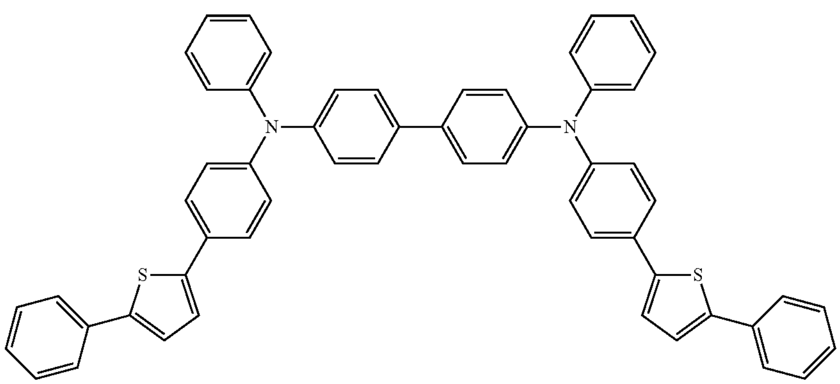
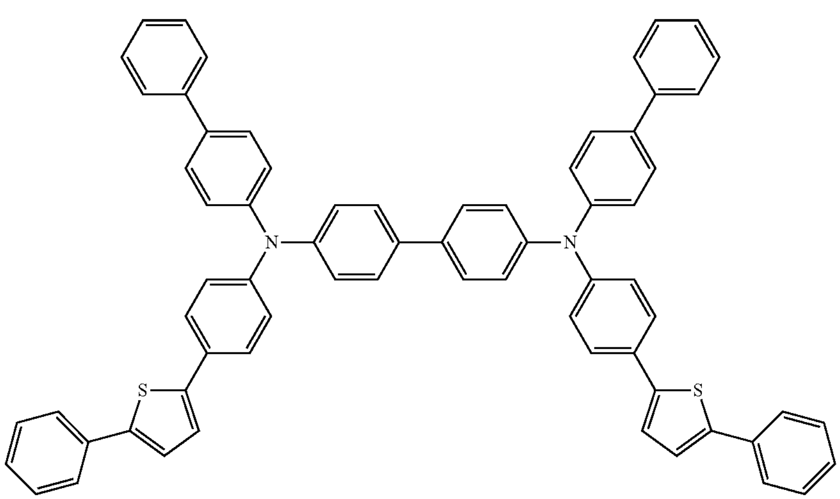

-continued
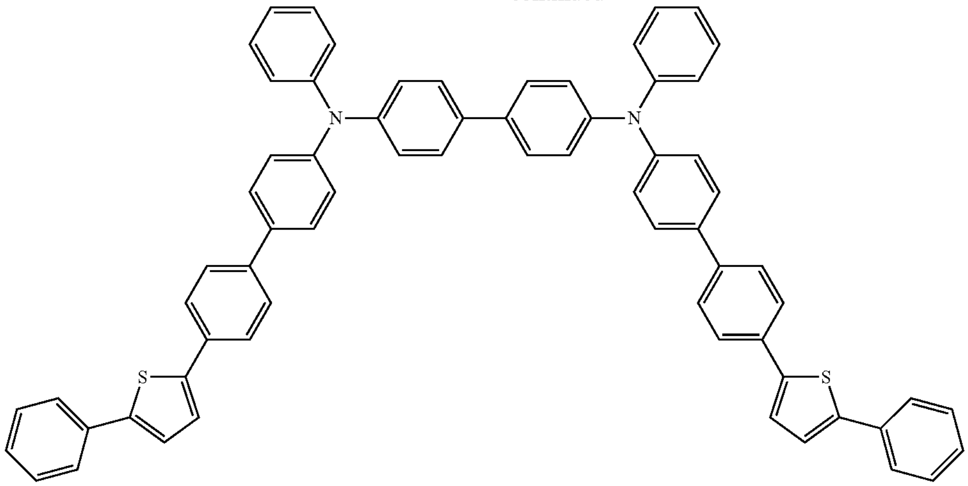
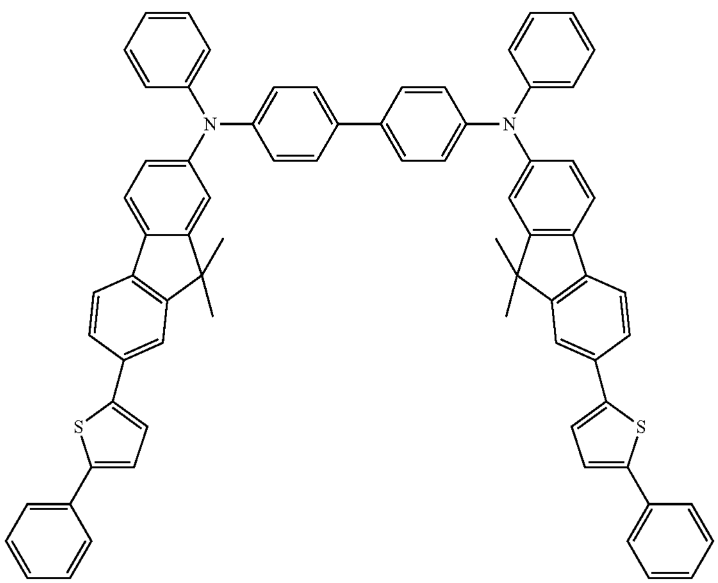
[Formula 171]
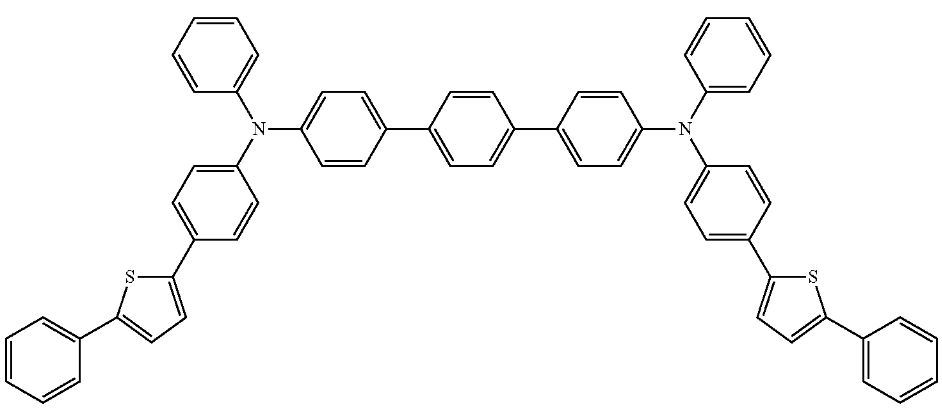

-continued
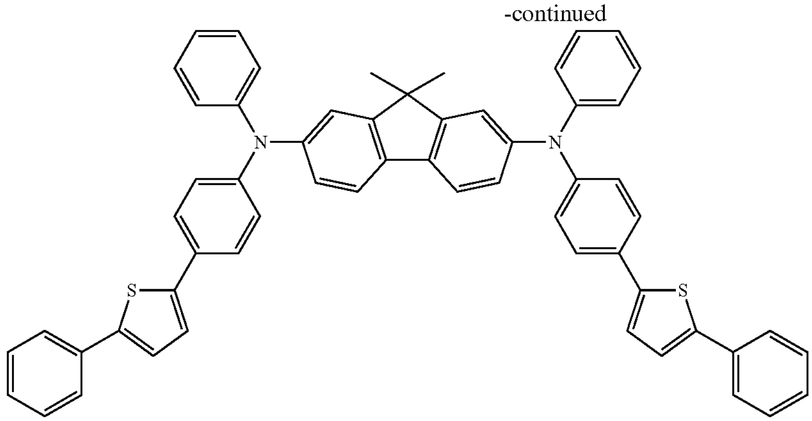
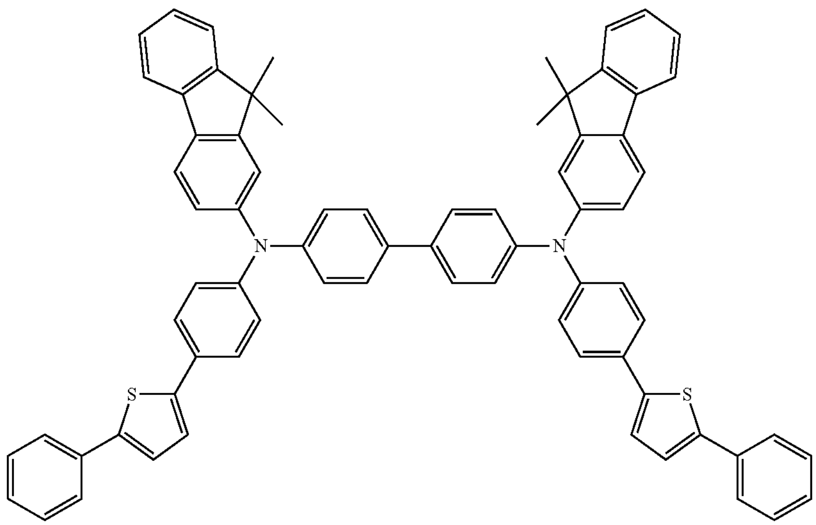
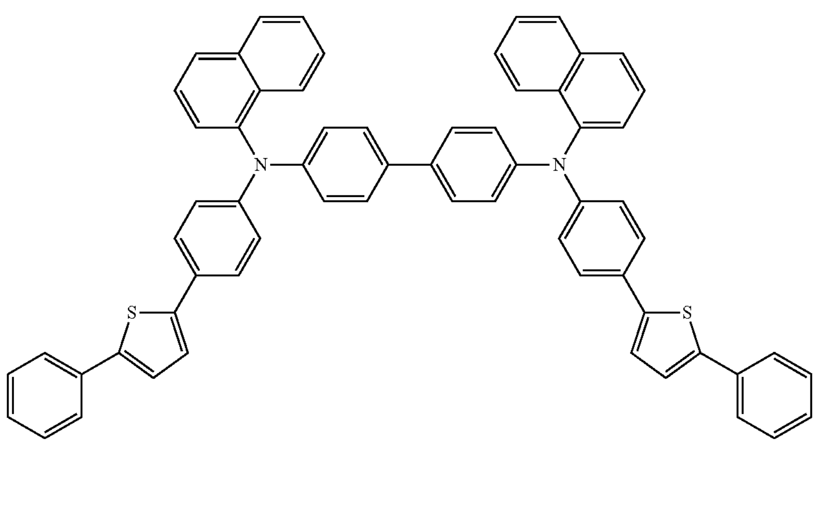

-continued
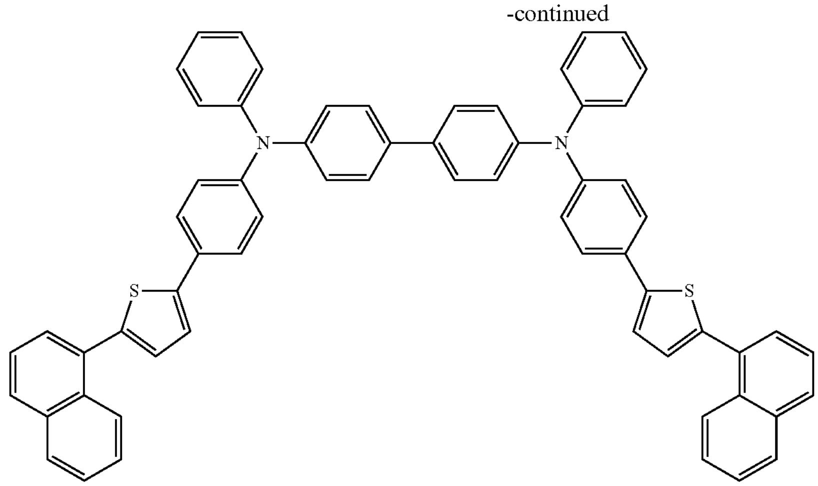
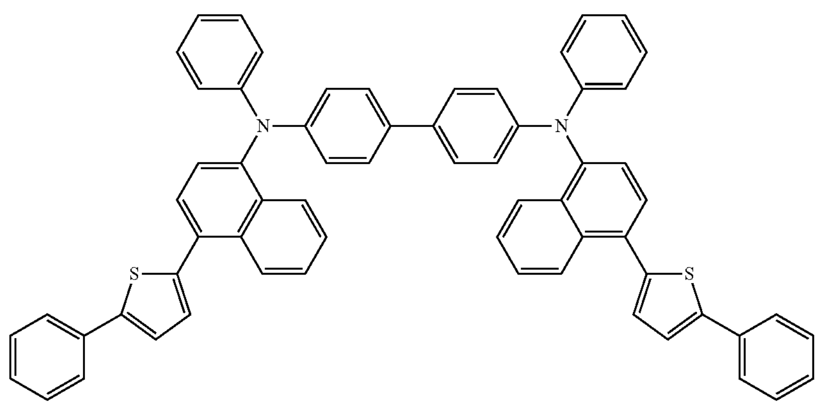
[Formula 173]
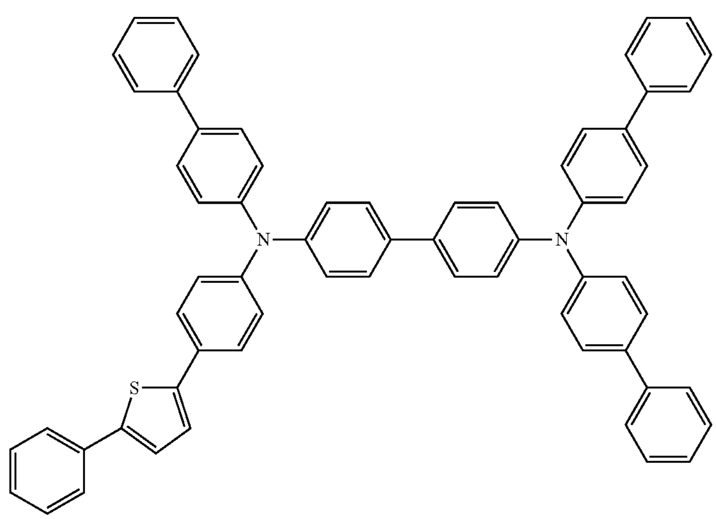

-continued
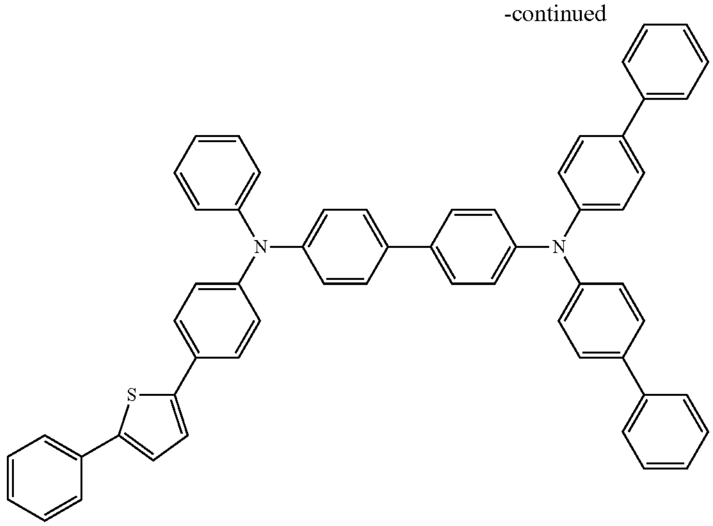
[Formula 174]
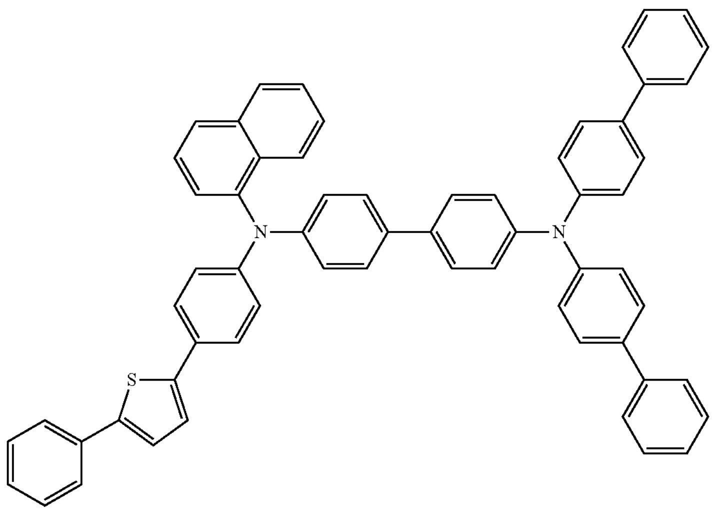
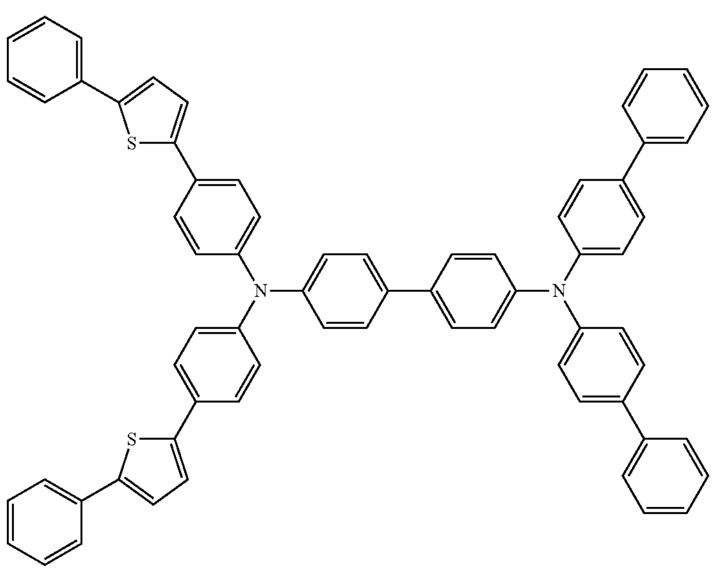

-continued
[Formula 175]
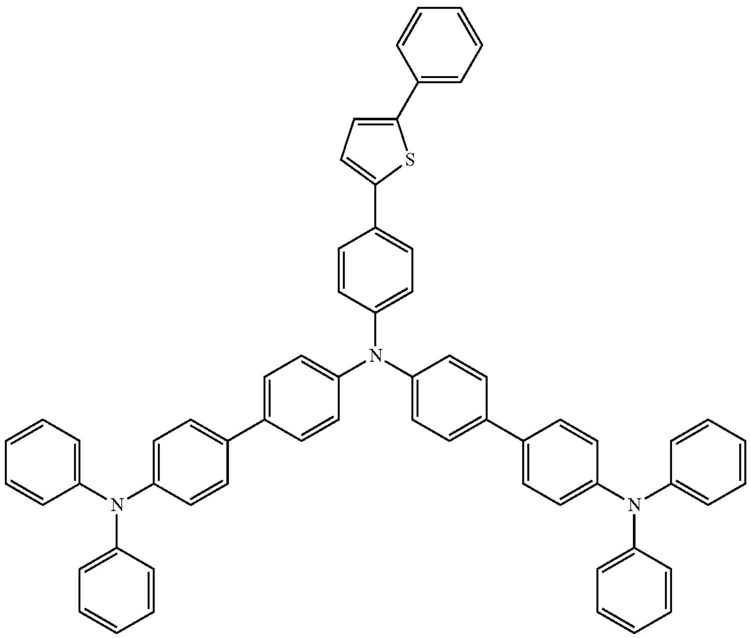
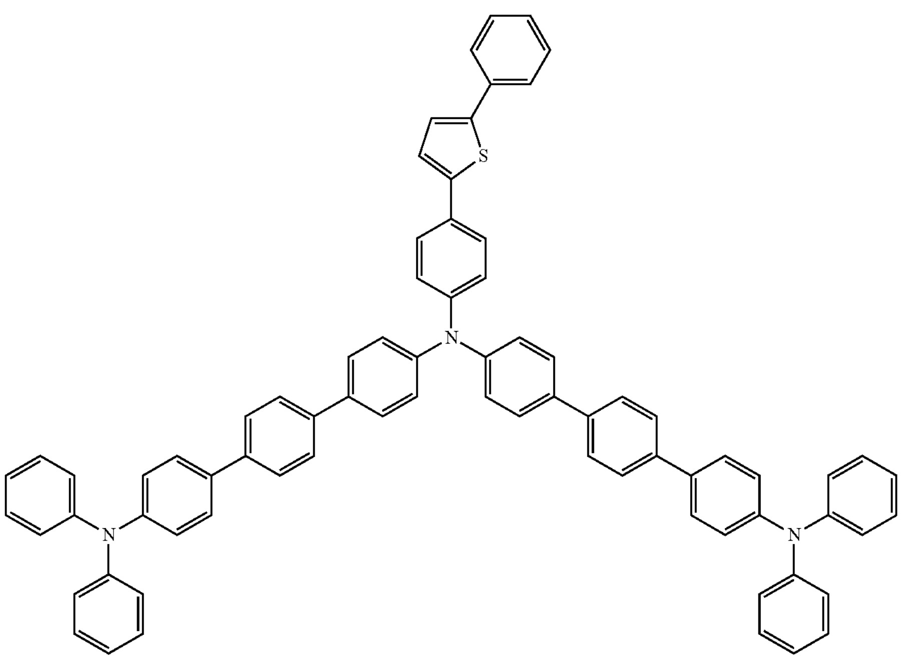

-continued
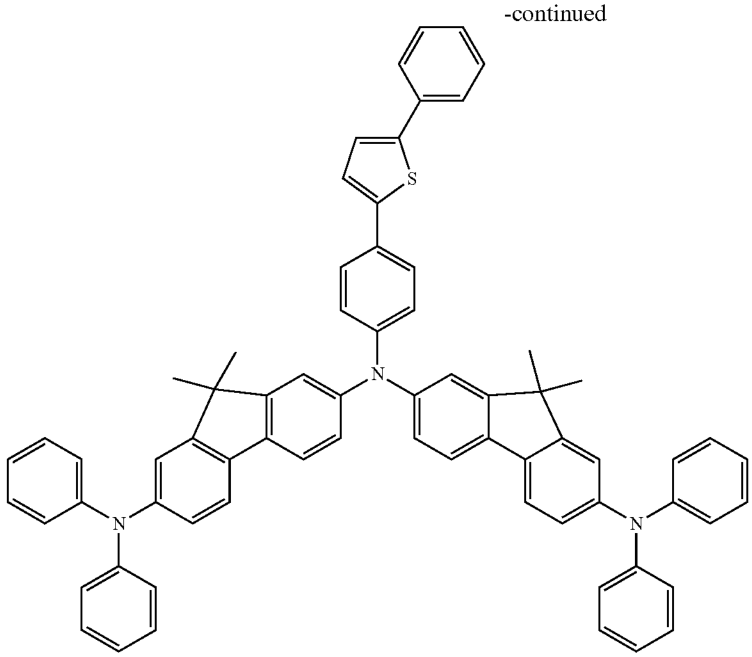
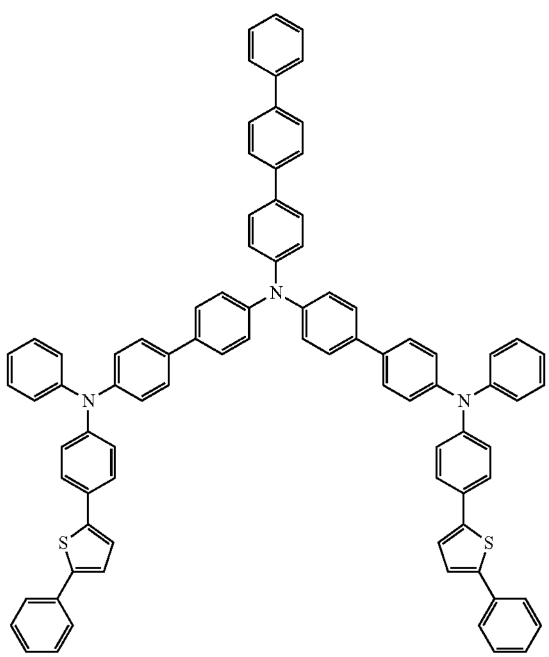

-continued
[Formula 176]
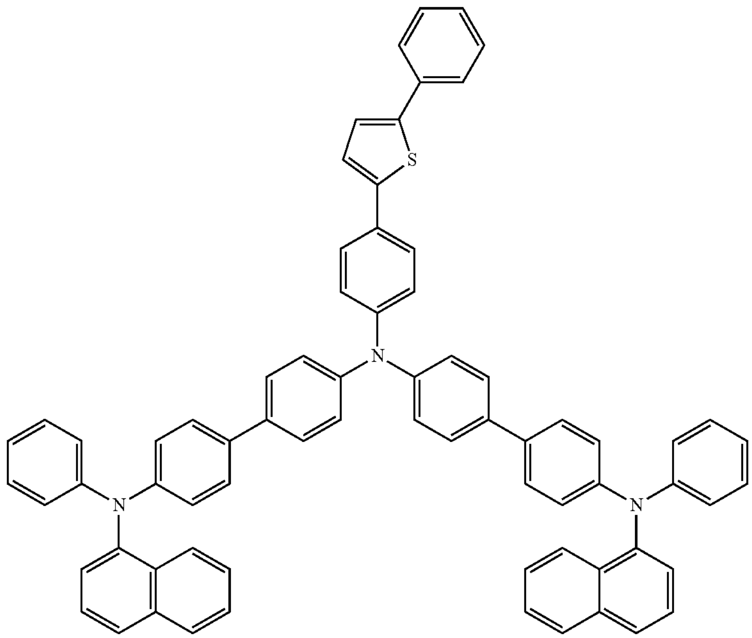
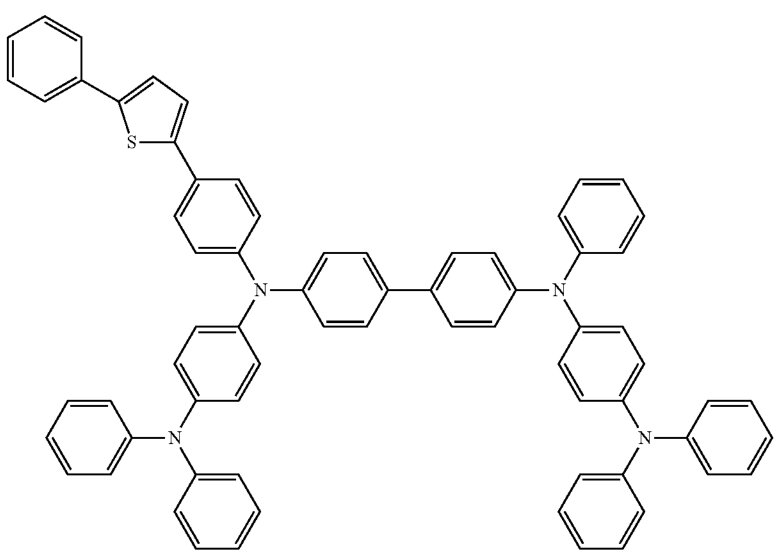

-continued
[Formula 177]
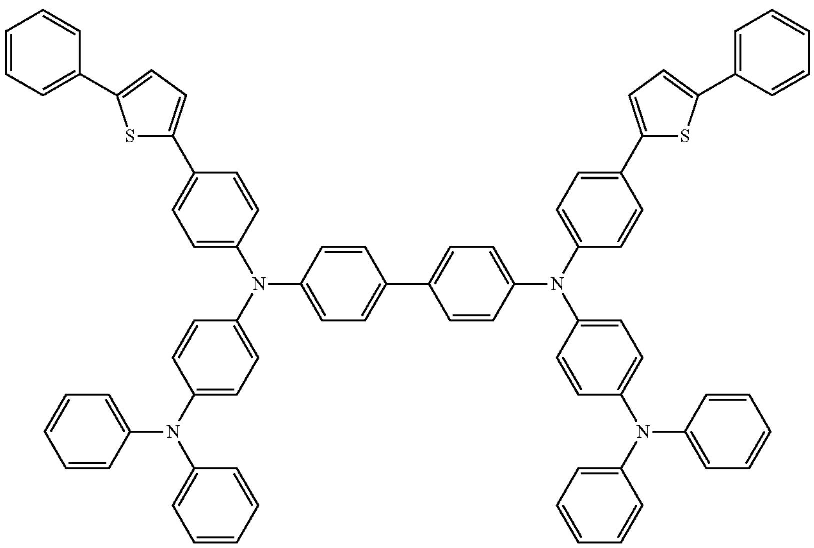
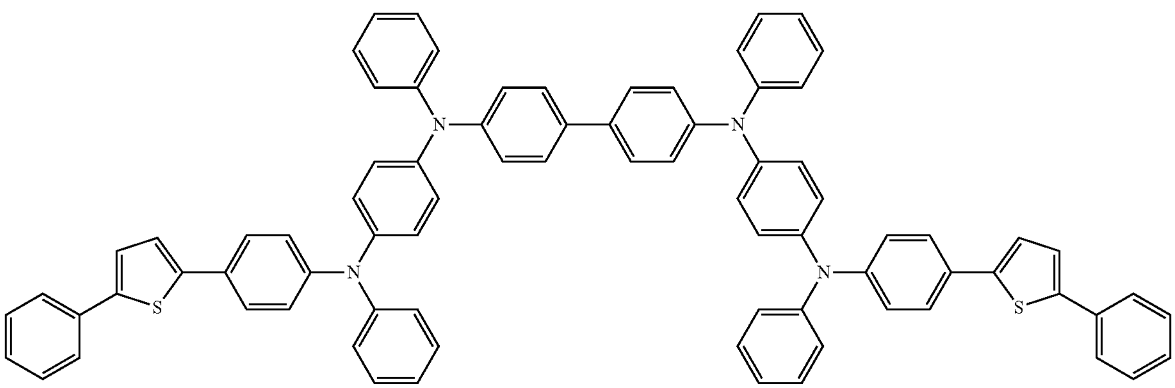
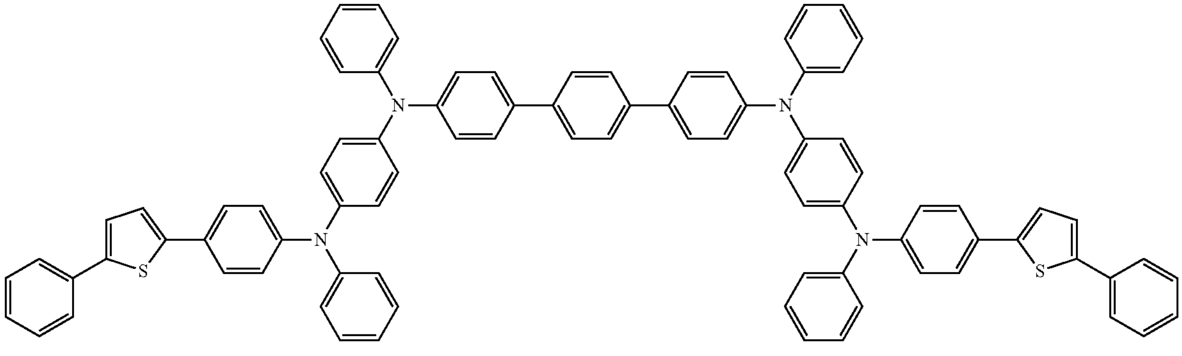 [SMILES: c1ccc(-c2ccc(-c3ccc(N(c4ccccc4)c4ccc(N(c5ccccc5)c5ccc(-c6ccc(-c7ccc(N(c8ccccc8)c8ccc(N(c9ccccc9)c9ccc(-c%10ccc(-c%11ccccc%11)s%10)cc9)cc8)cc7)cc6)cc5)cc4)cc3)s2)cc1]

[Formula 178]
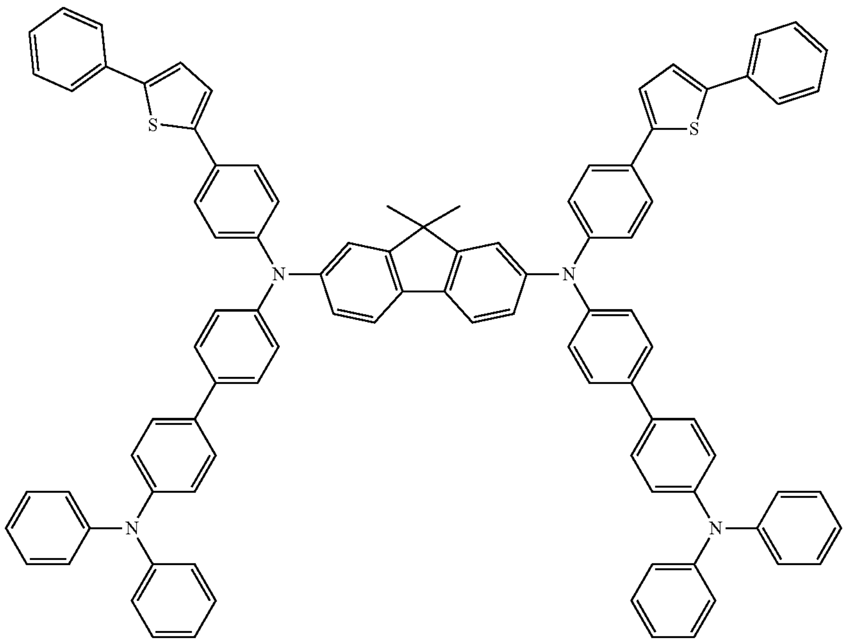
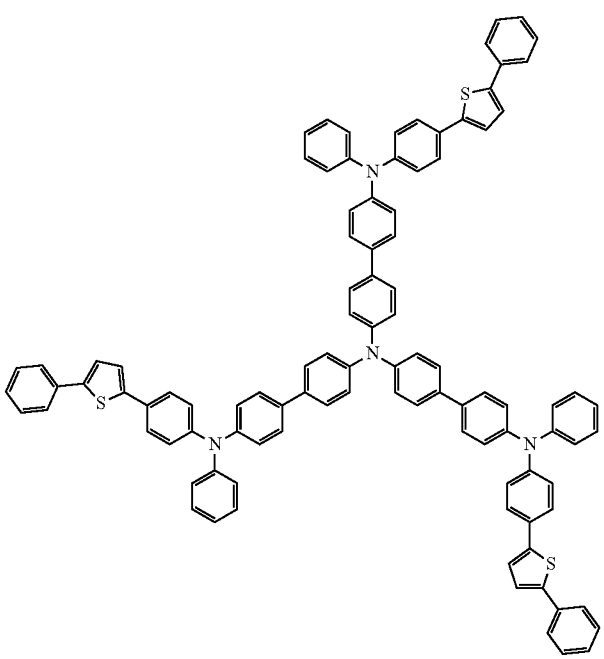

-continued
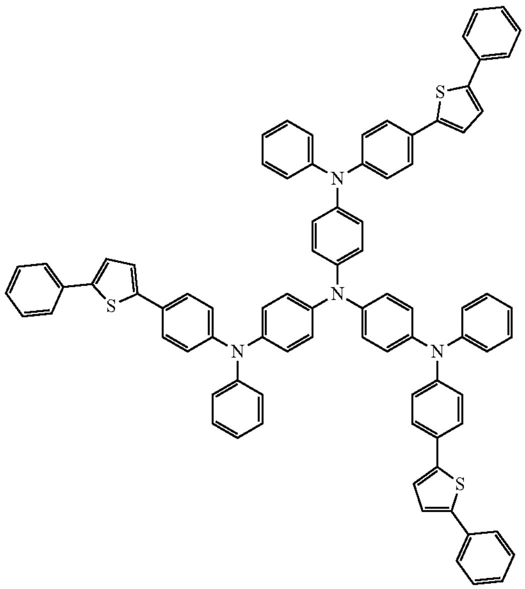
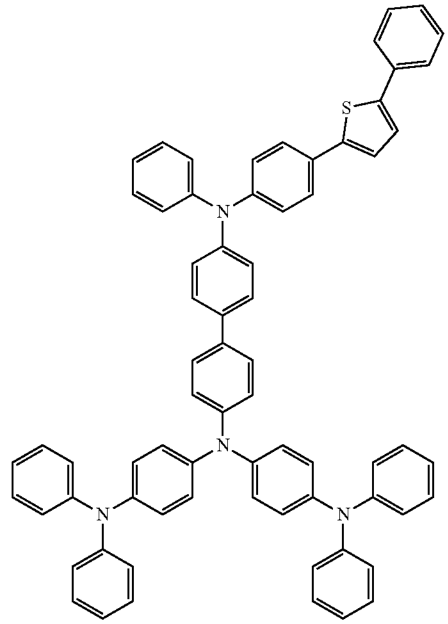
[Formula 179]
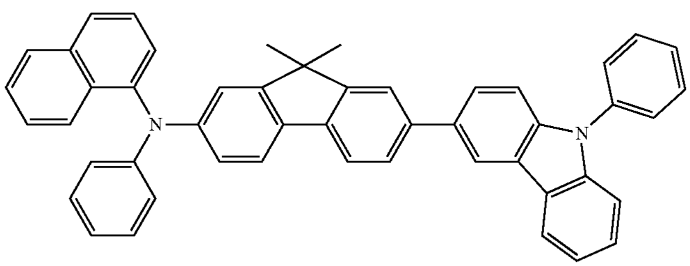
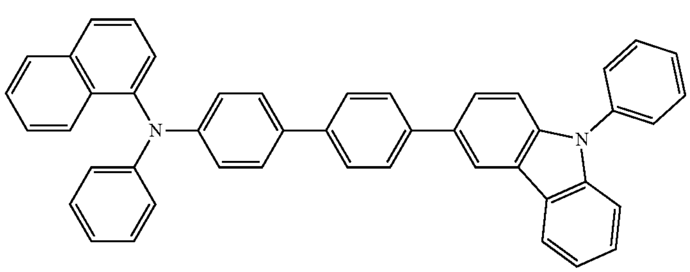
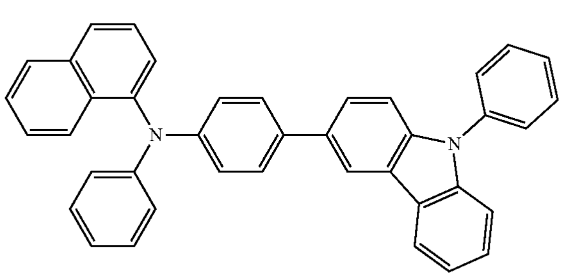

-continued
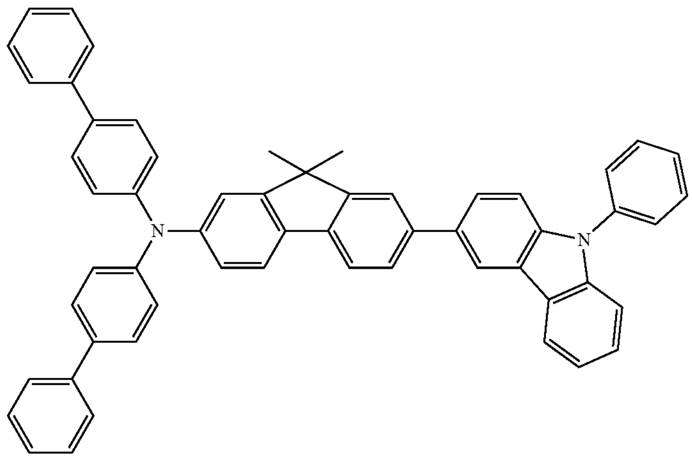
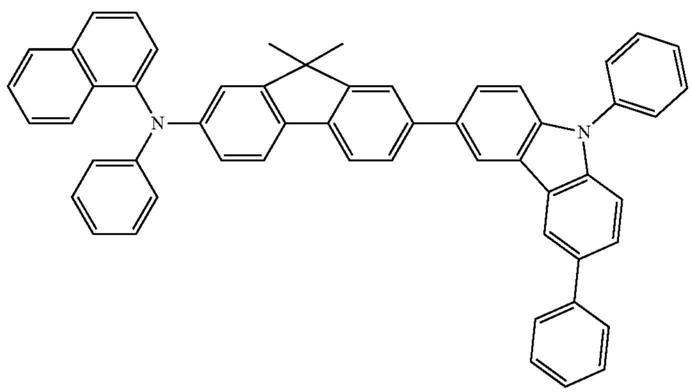
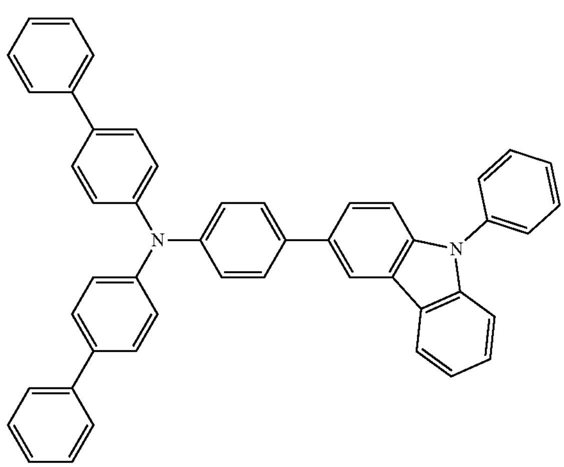

-continued
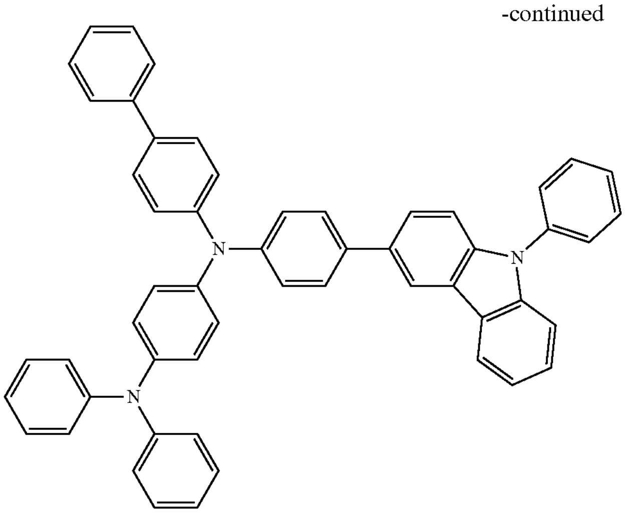
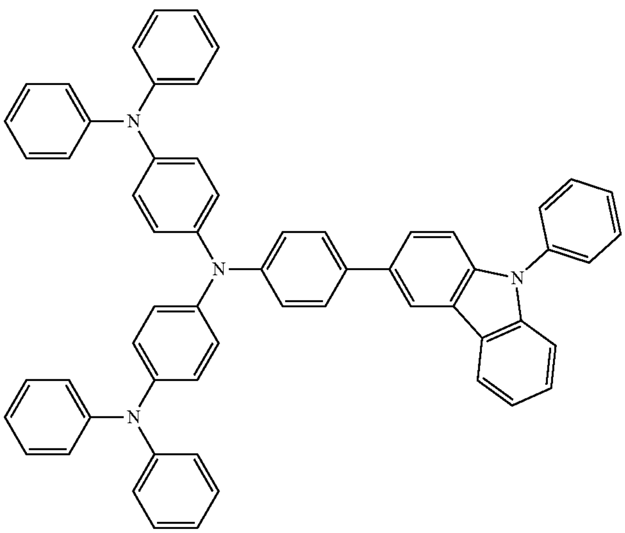
[Formula 180]
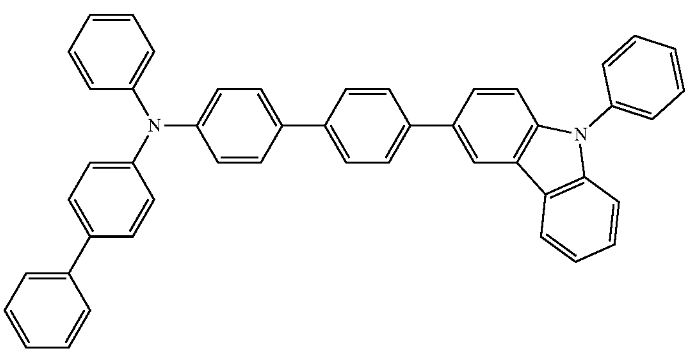
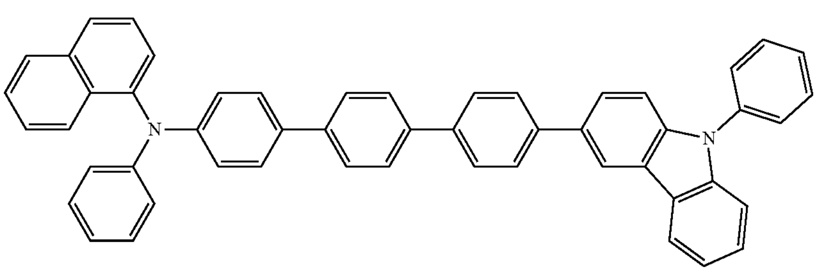

-continued
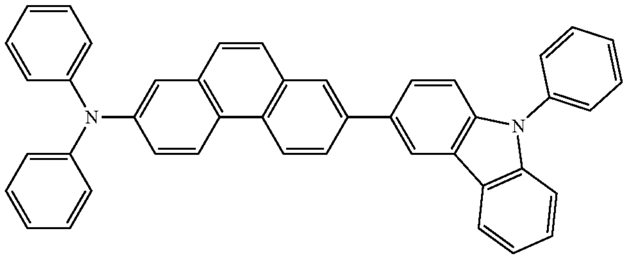
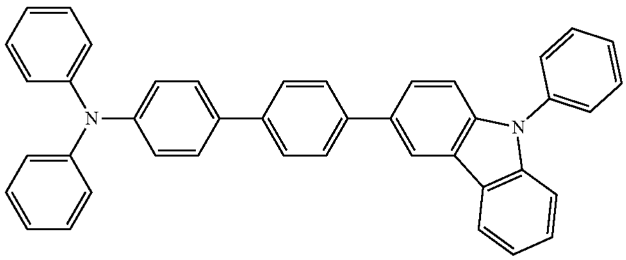
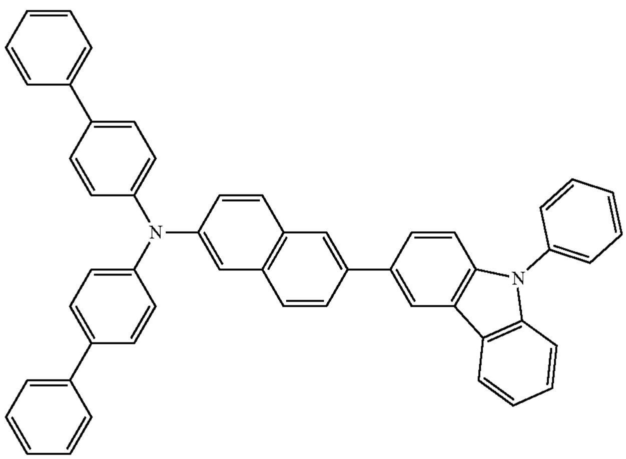
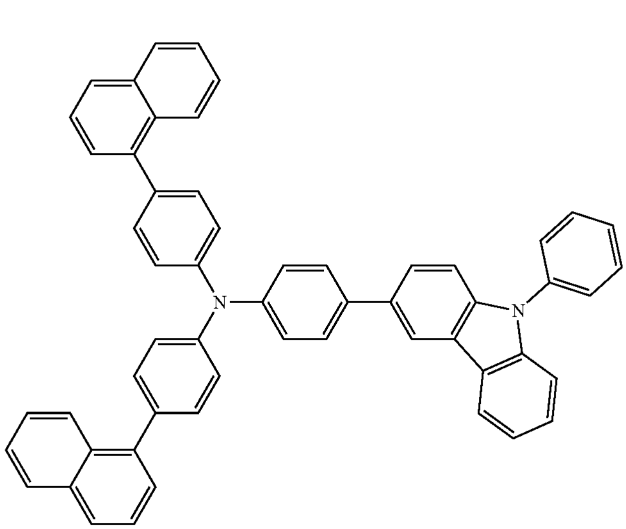

-continued
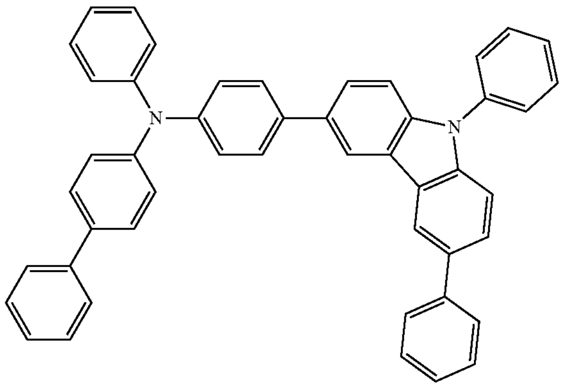
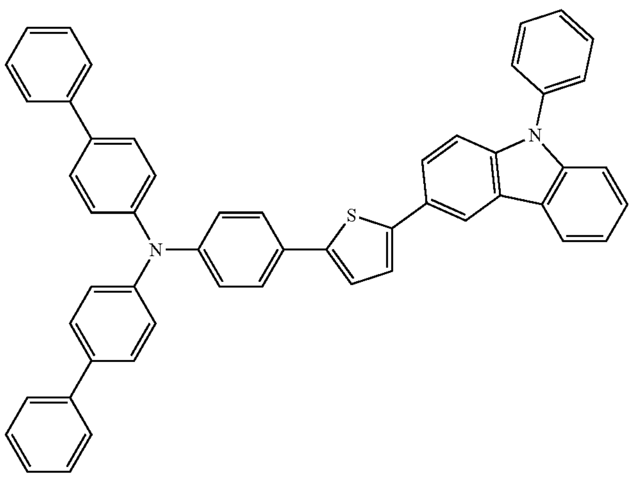
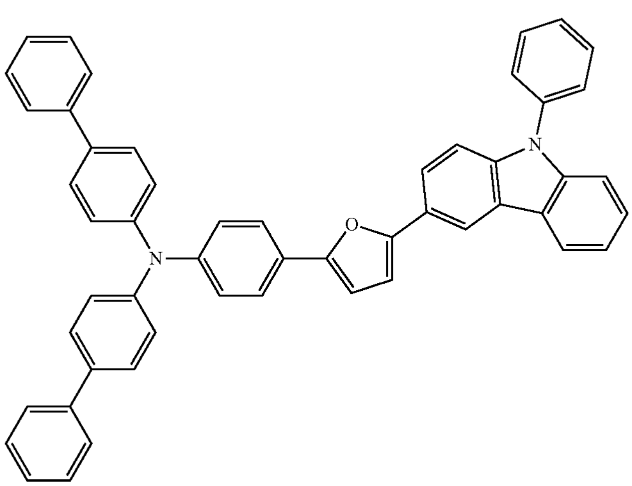
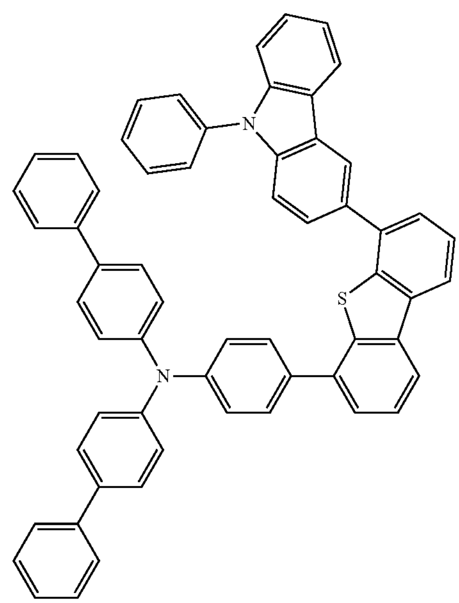

-continued
[Formula 181]
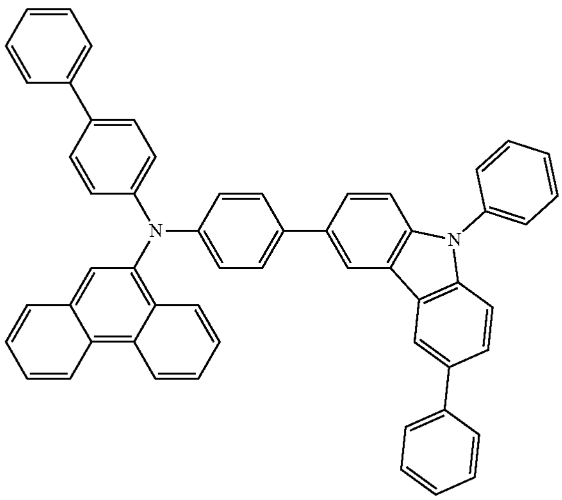
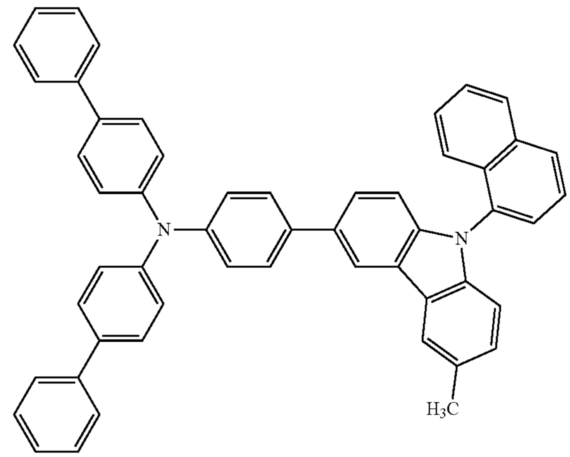
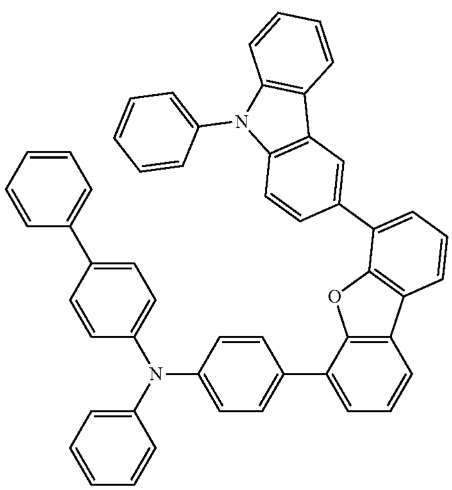
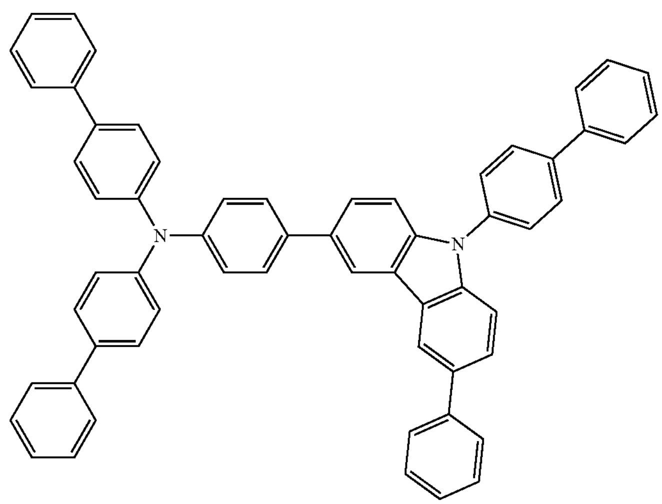
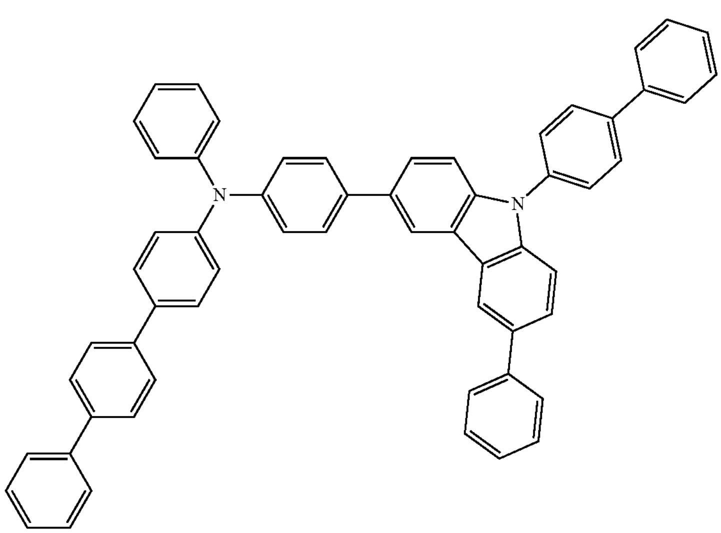

-continued
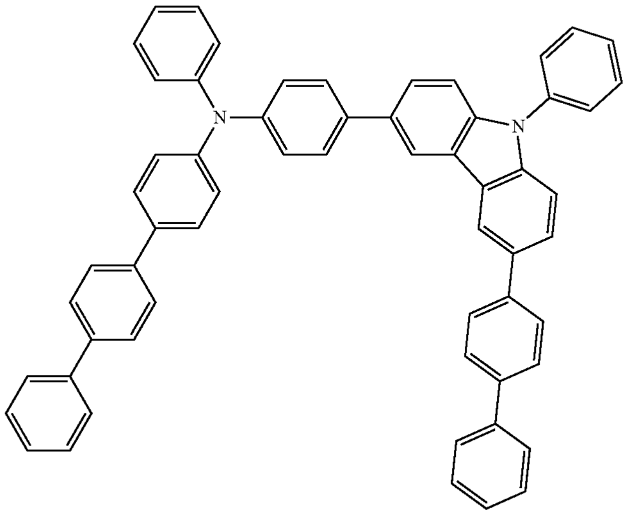
[Formula 182]
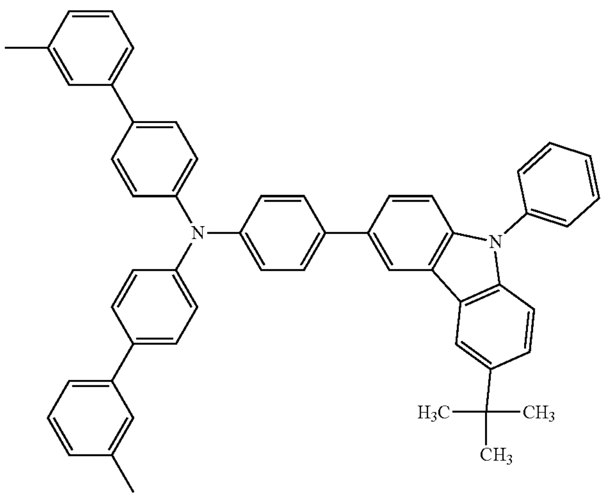
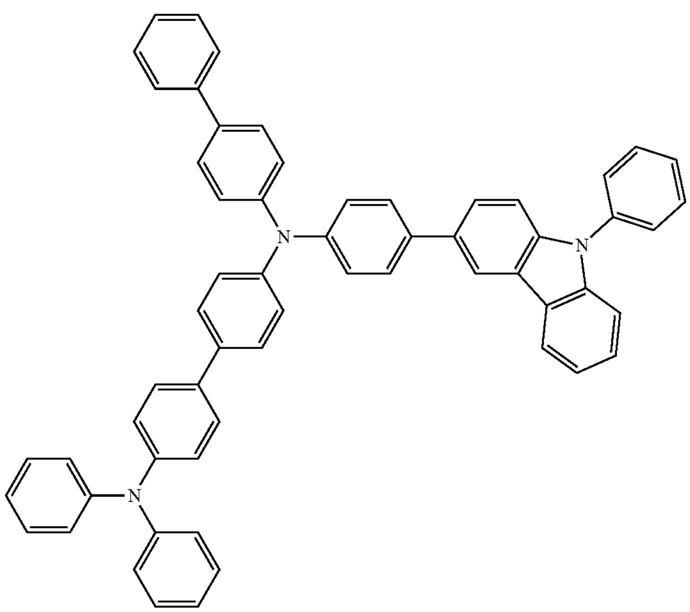

-continued
[Formula 183]
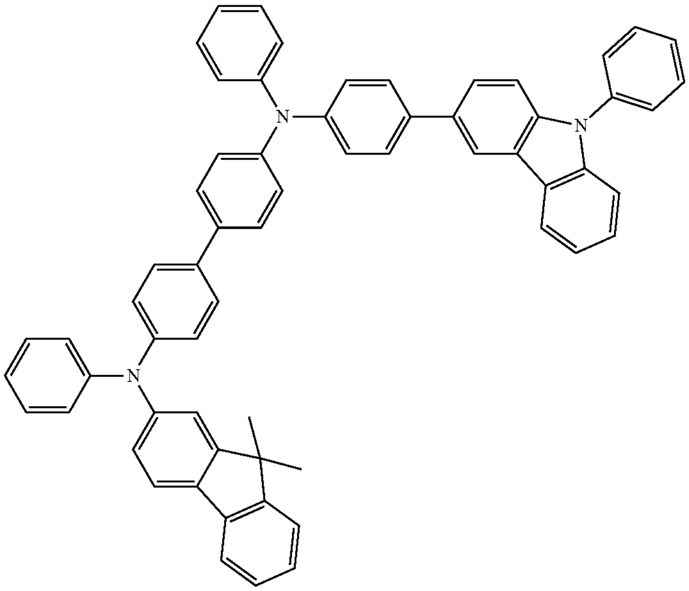
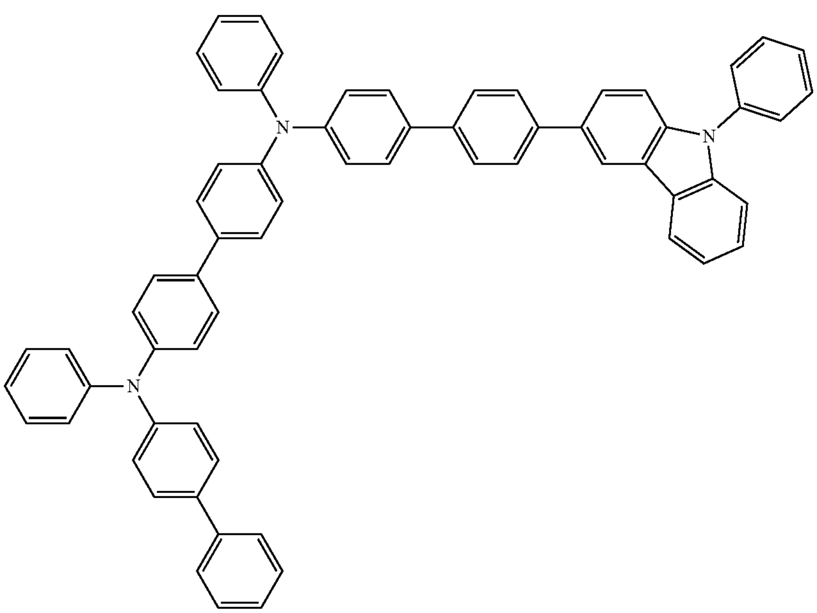

-continued
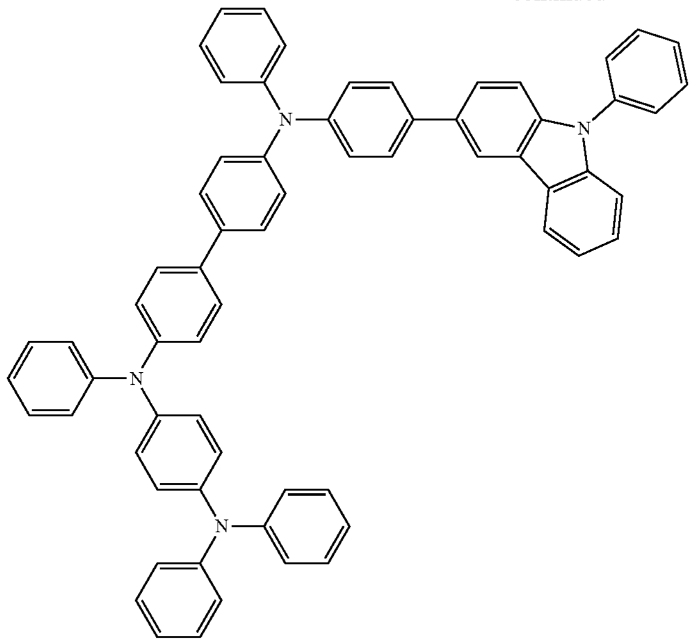
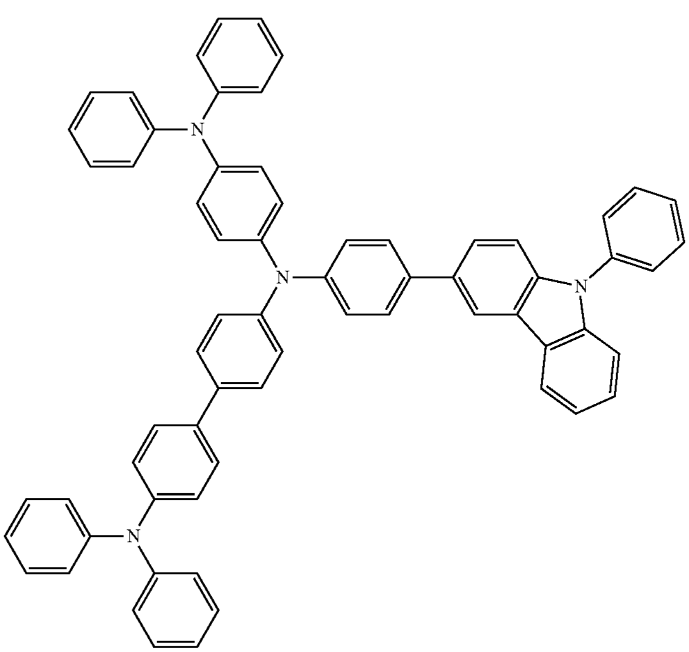

-continued
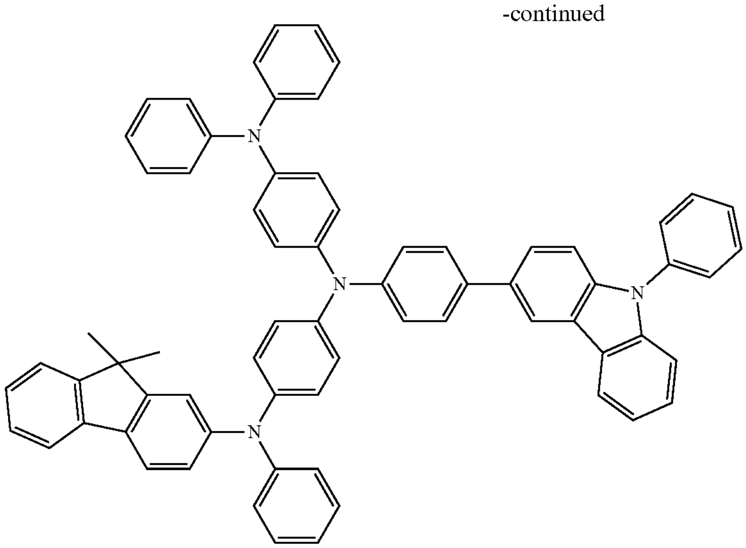
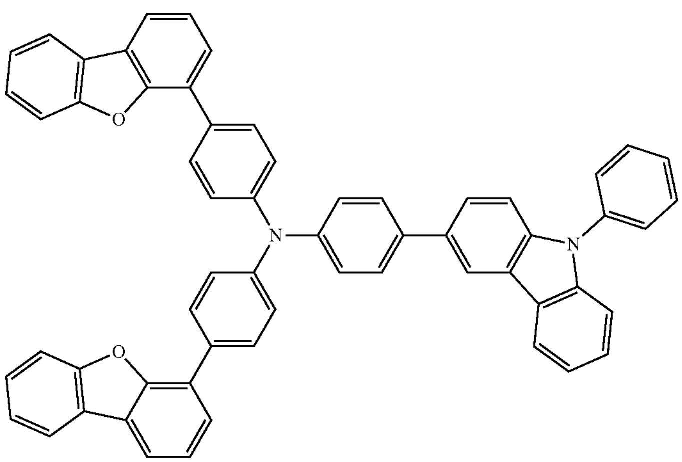
[Formula 184]
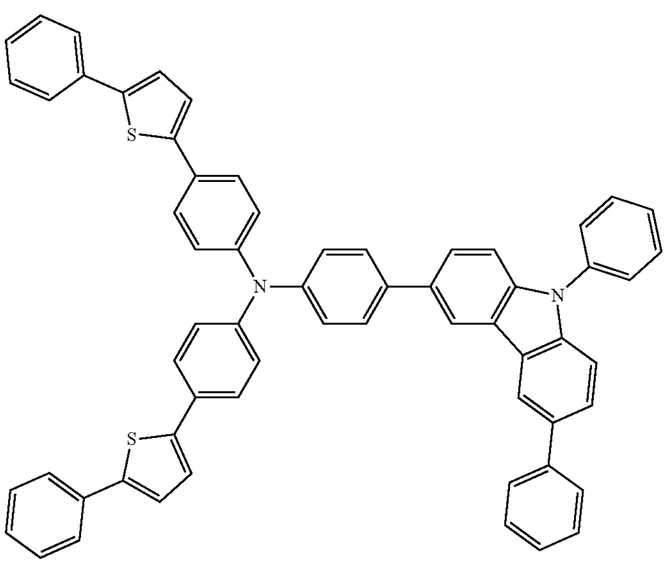

-continued
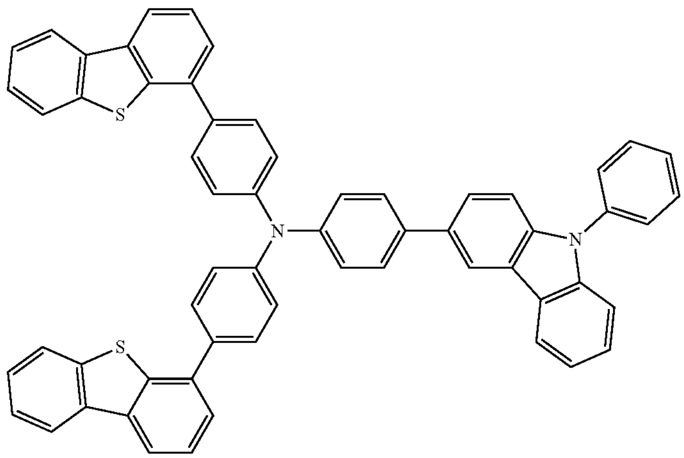
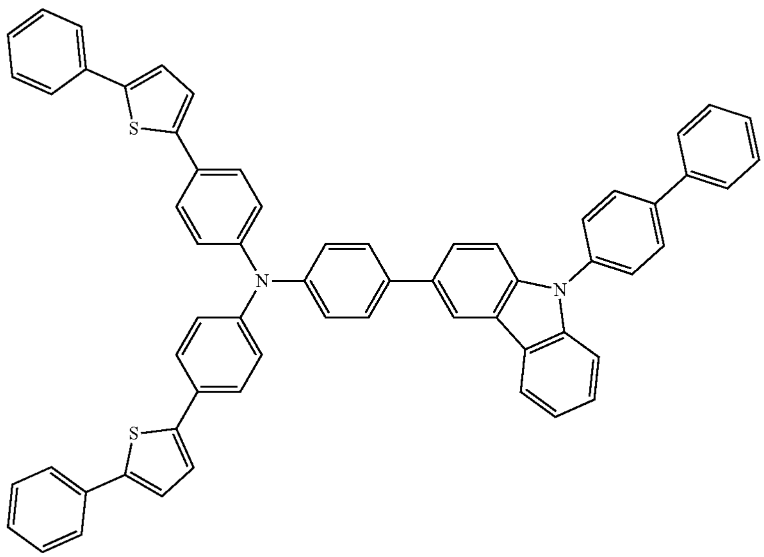
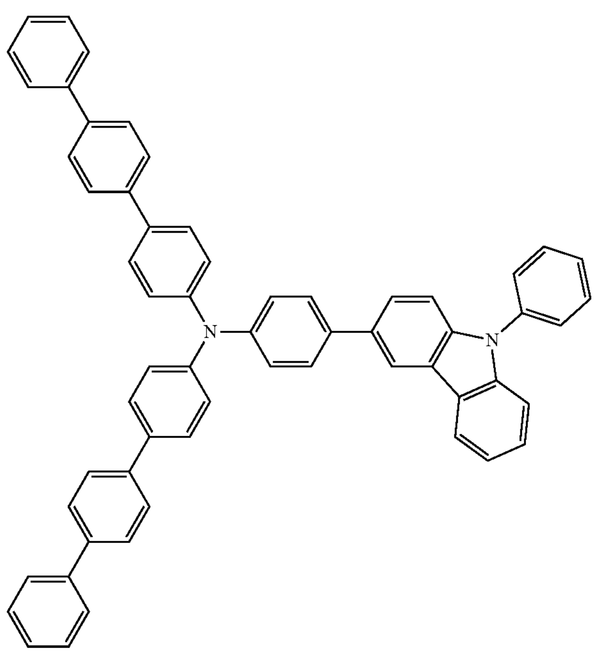

-continued
[Formula 185]
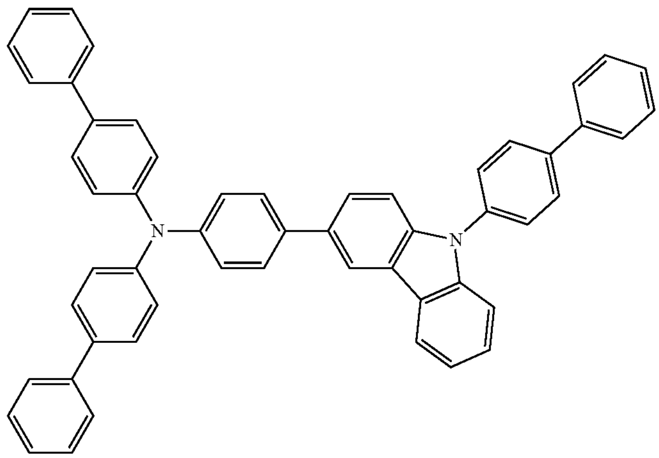
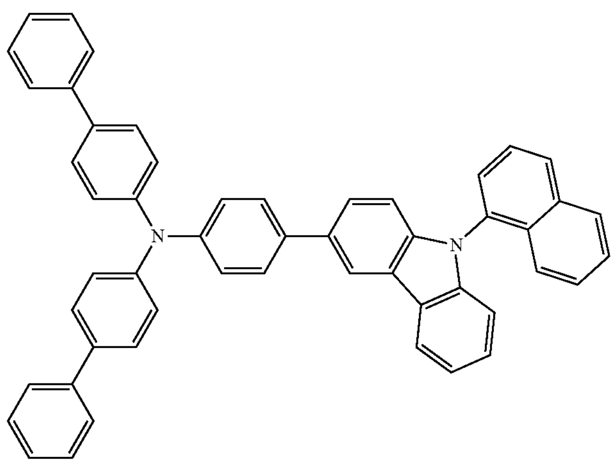
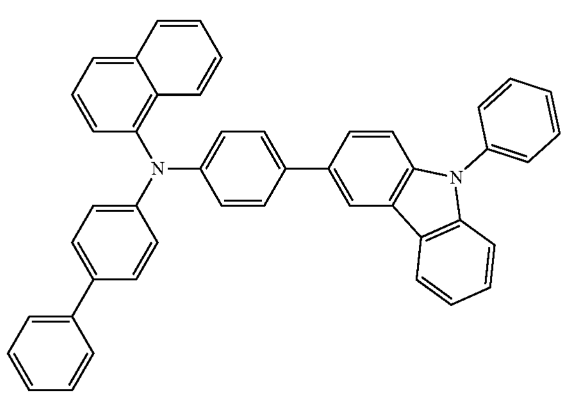

-continued
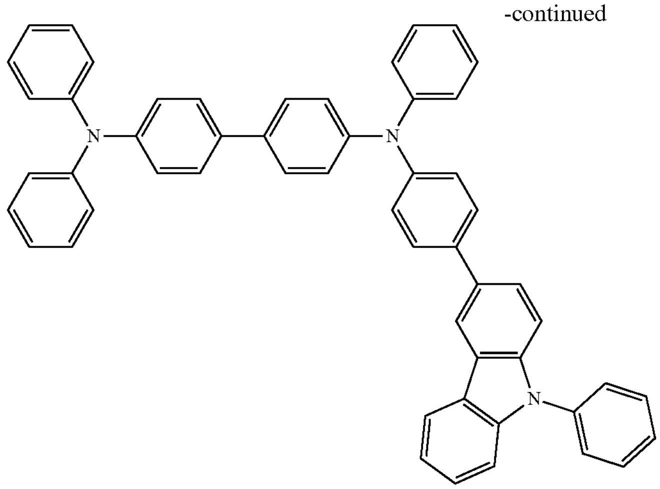
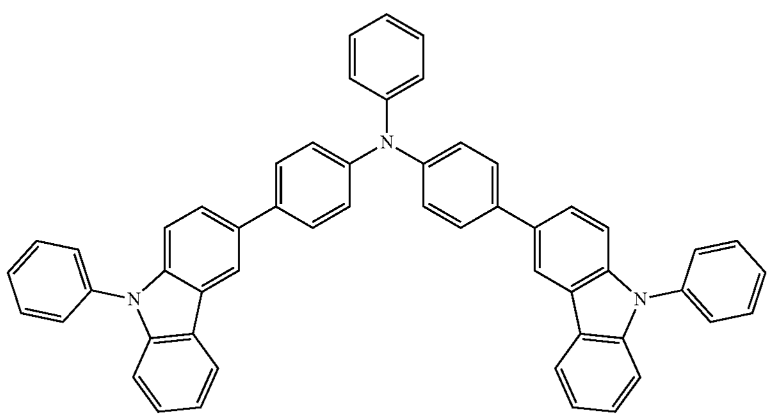
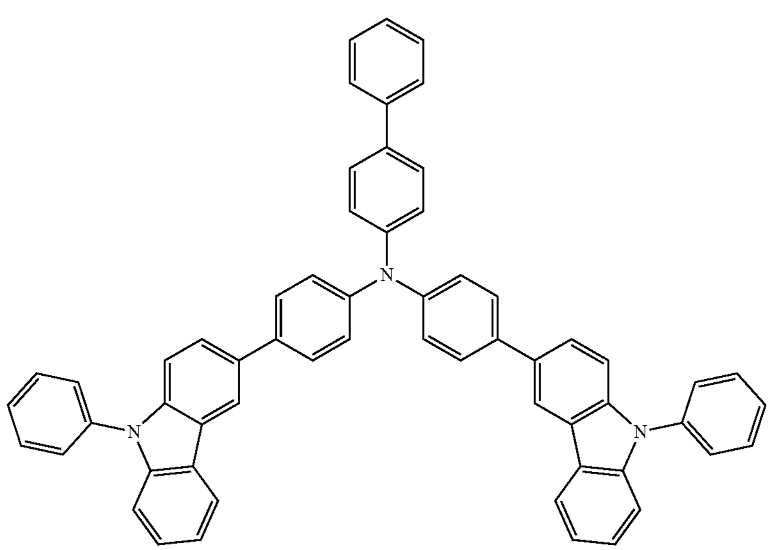

-continued
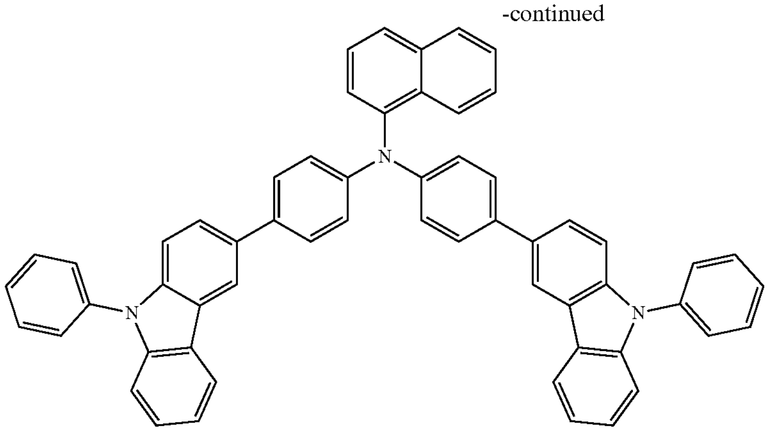
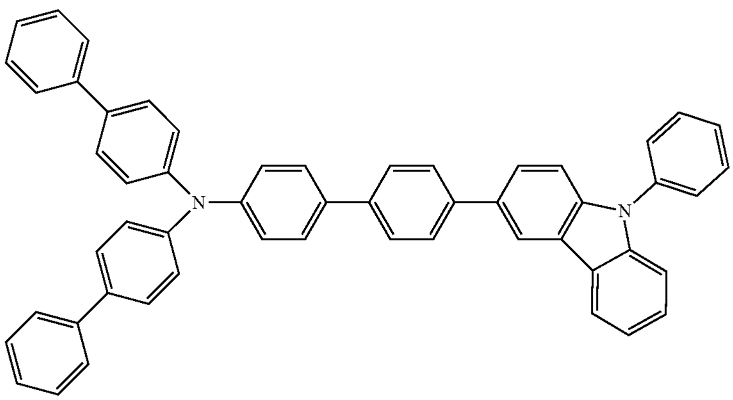
[Formula 186]
A-1
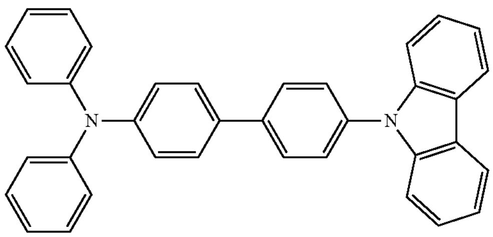
A-2
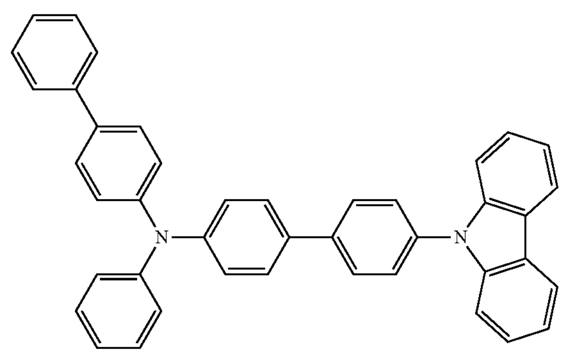
A-3
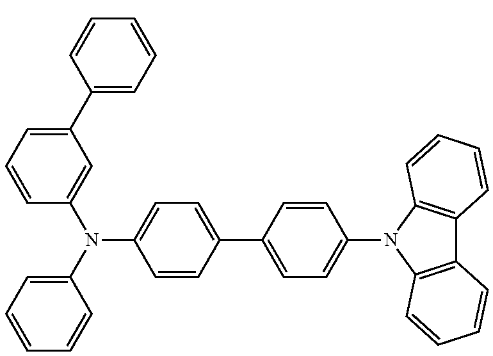
A-4
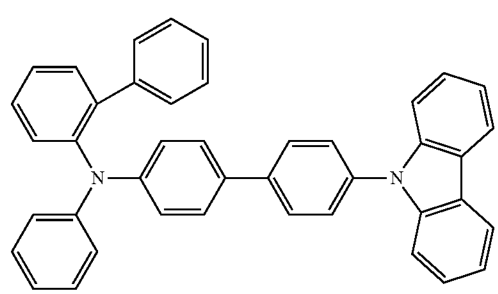

-continued
A-5
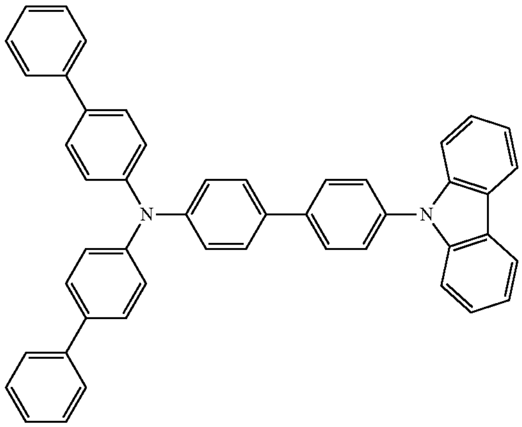
A-6
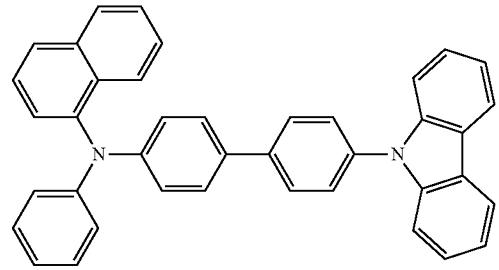
A-7
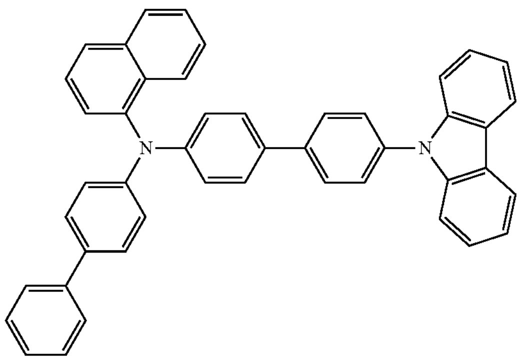
A-8
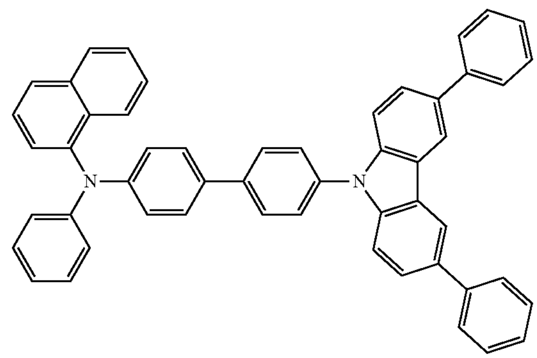
A-9
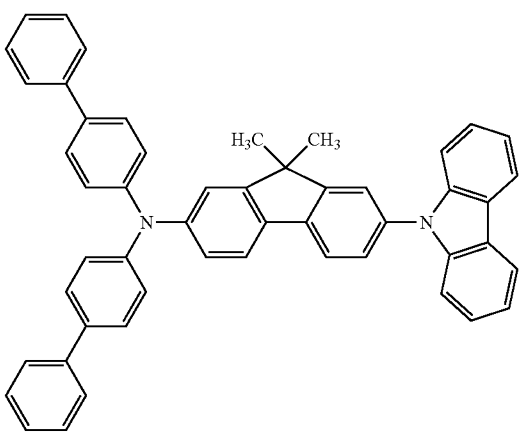
A-10
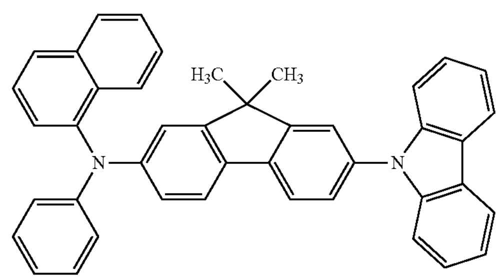
A-11
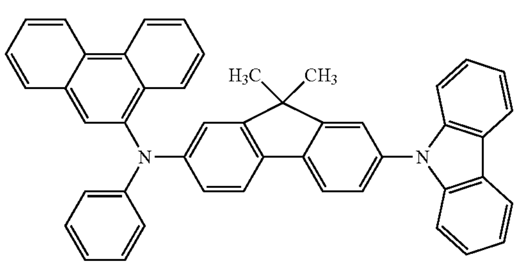
A-12
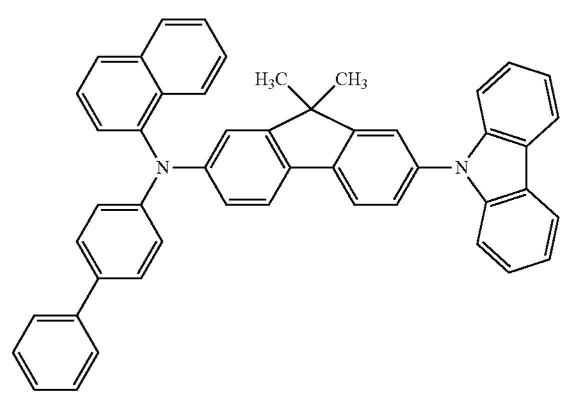

-continued
A-13
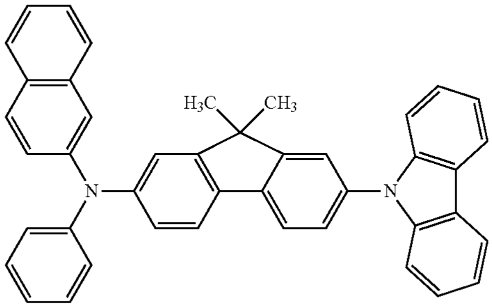
A-14
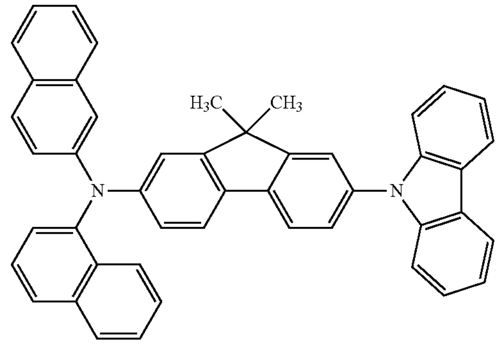
A-15
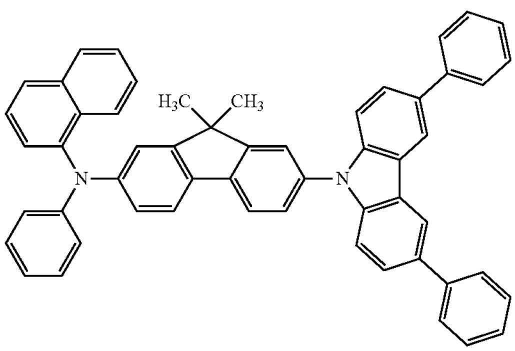
A-16
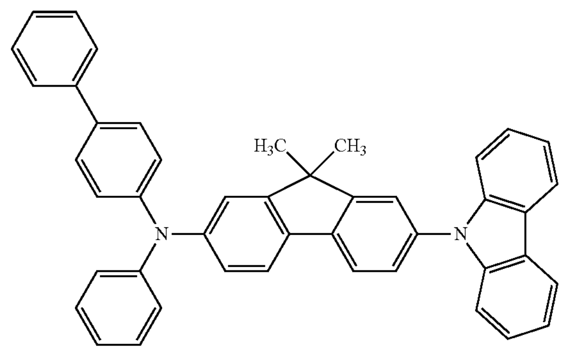
[Formula 187]
A-17
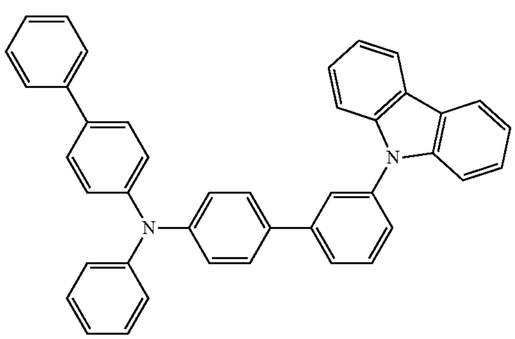
A-18
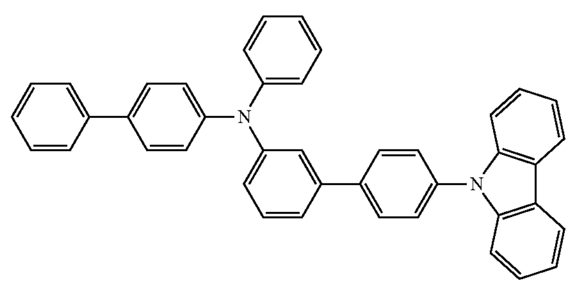
A-19
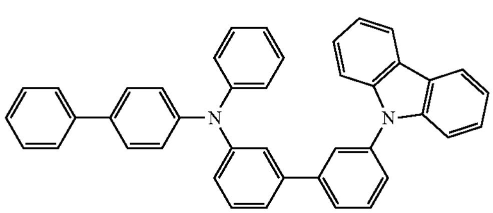
A-20
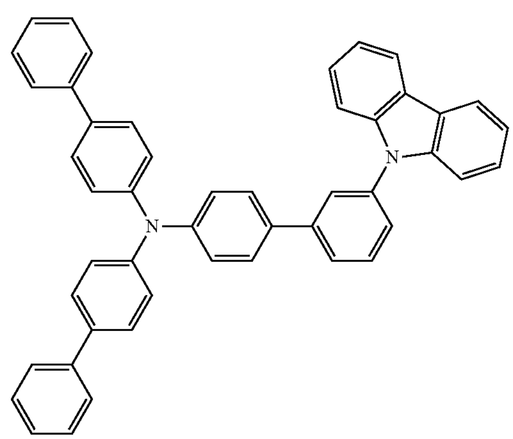

-continued
A-21
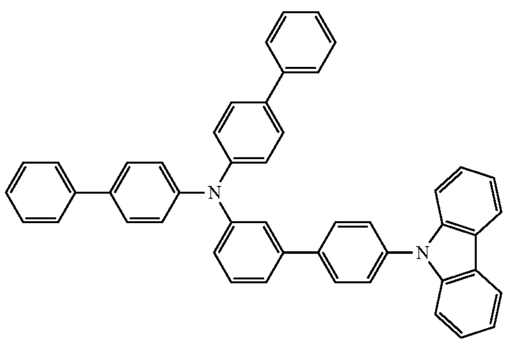
A-22
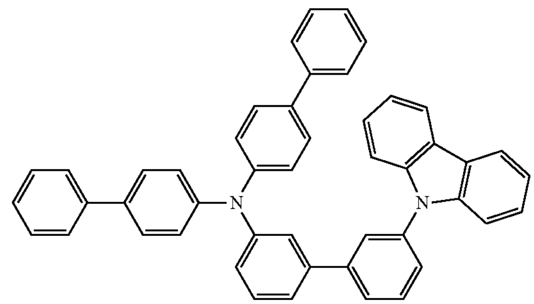
A-25
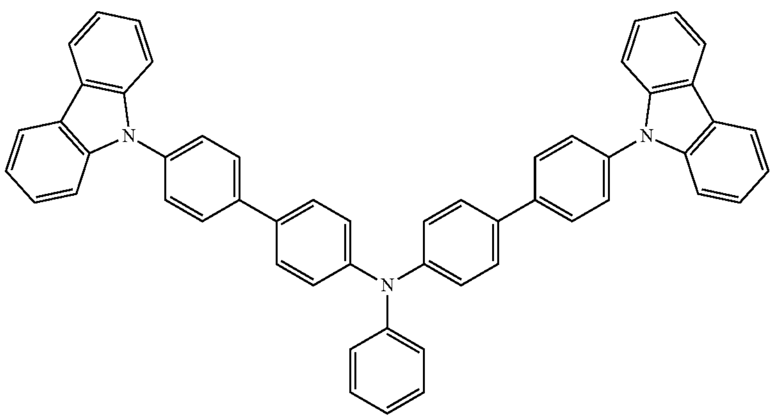
A-26
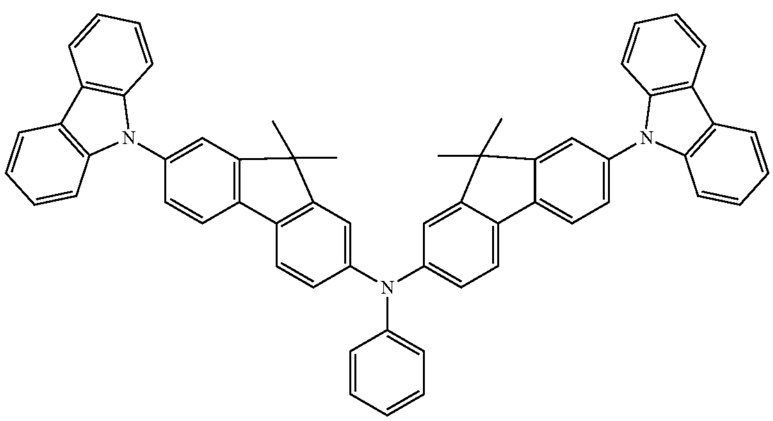
A-27
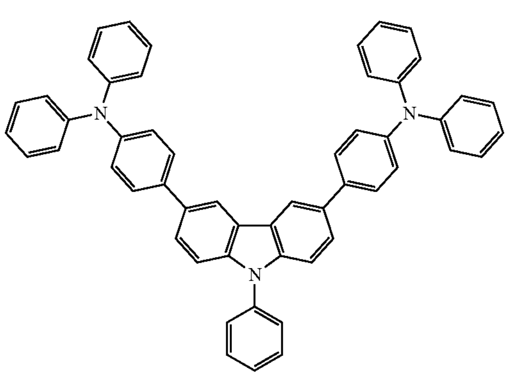
A-28
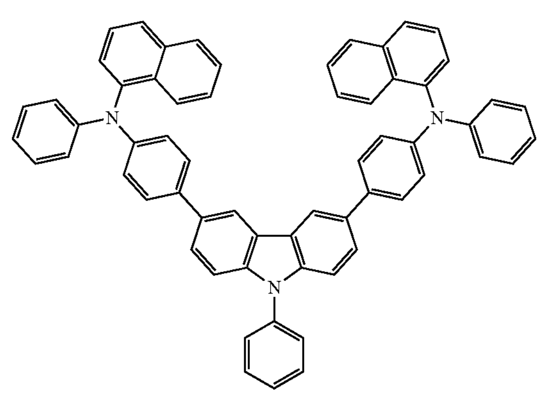

-continued
[Formula 188]
A-35
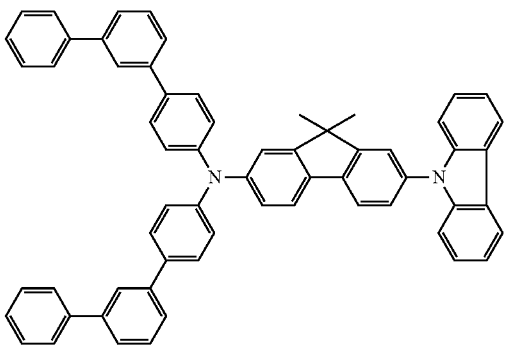
A-36
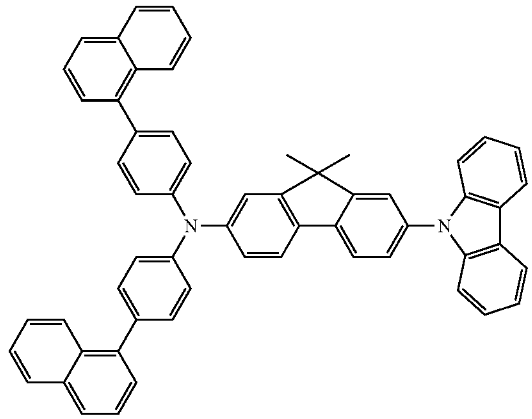
A-37
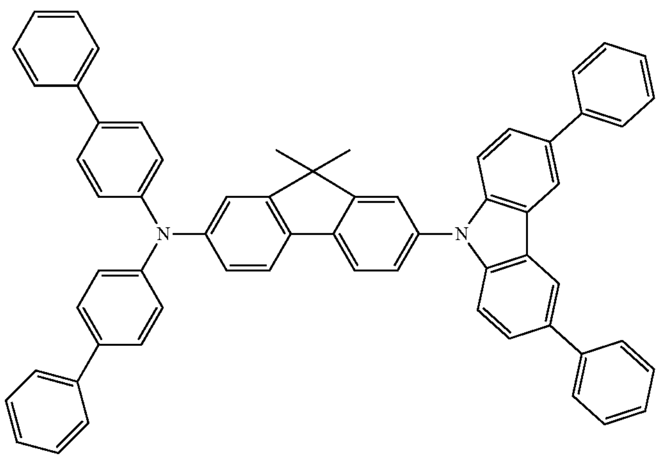
A-38
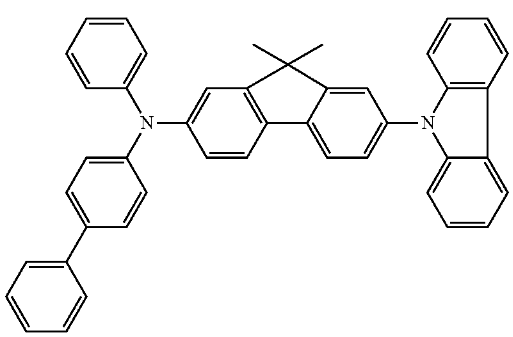
A-39
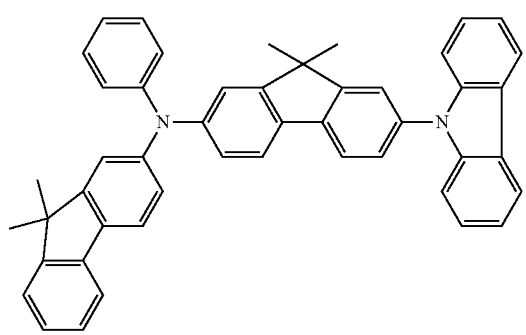

-continued
A-40
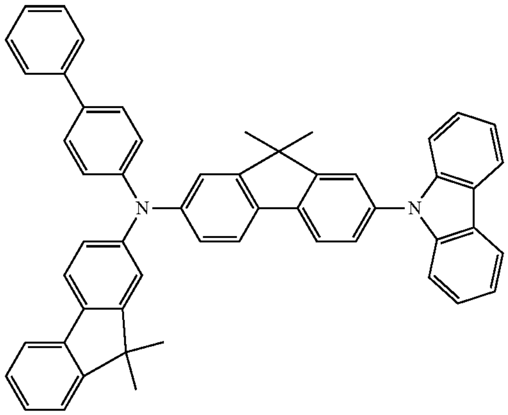
A-41
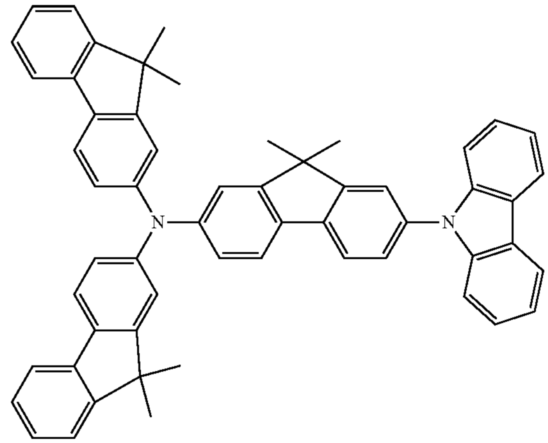
A-42
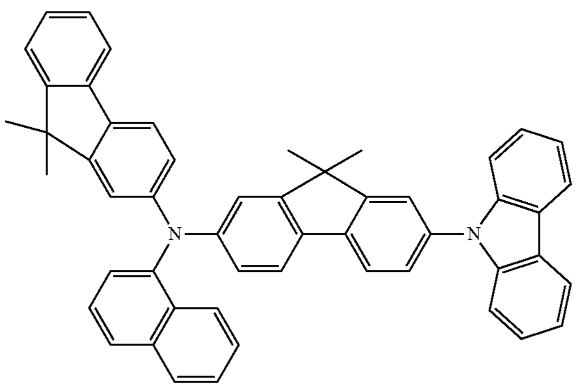
[Formula 189]
A-45
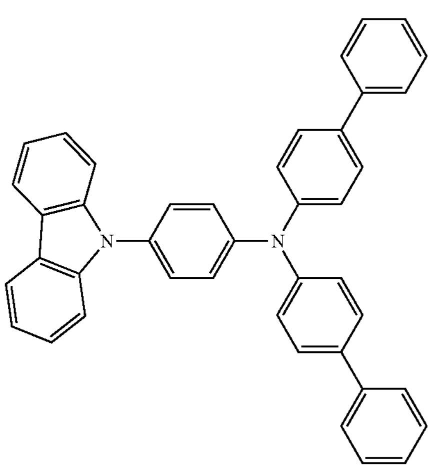
A-47
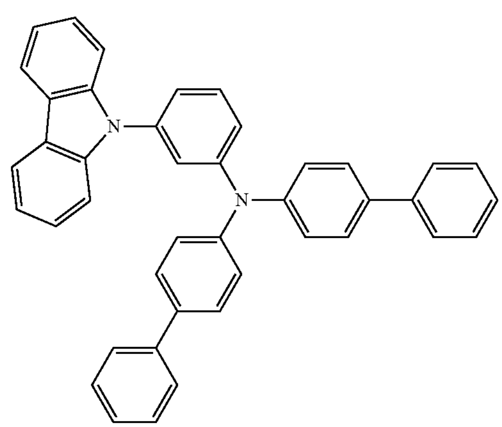

-continued
A-48
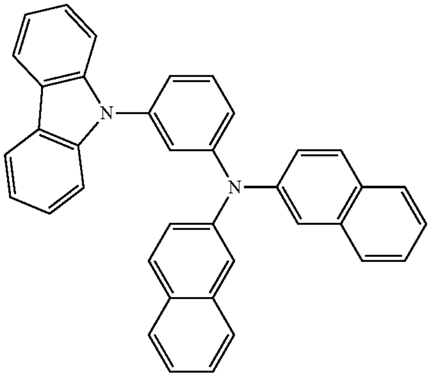
A-50
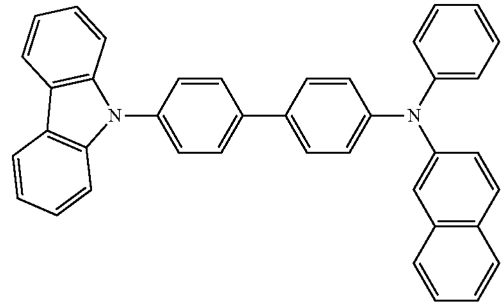
A-51
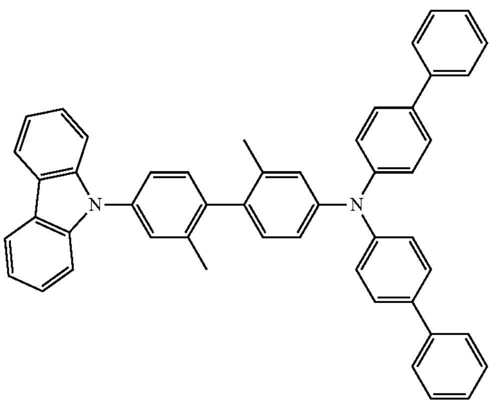
A-53
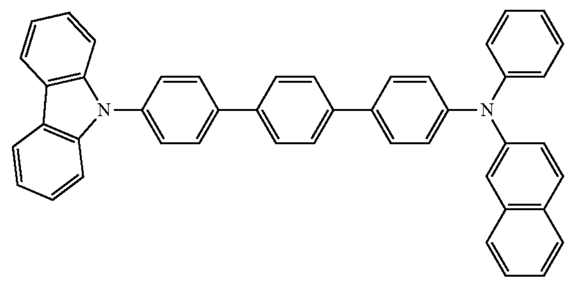
A-54
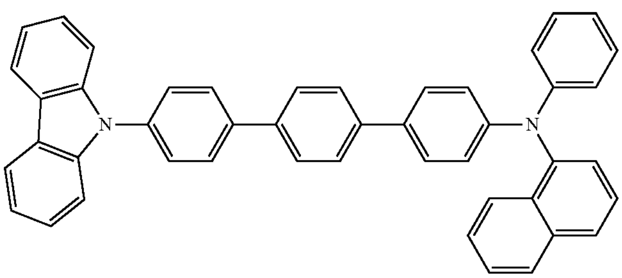
[Formula 190]
B-1
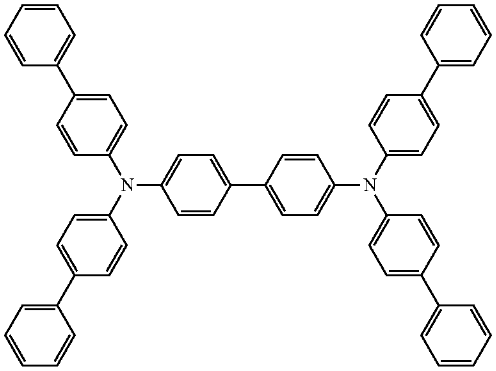
B-2
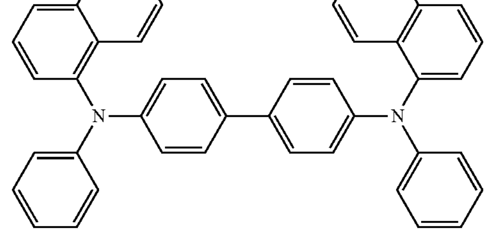

-continued
B-3
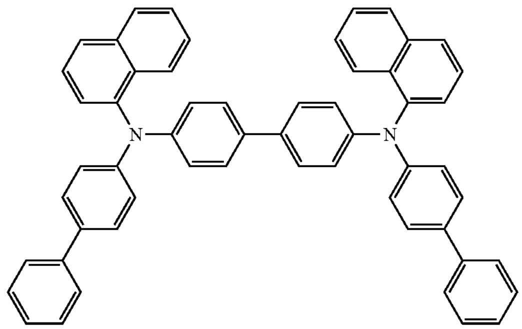
B-4
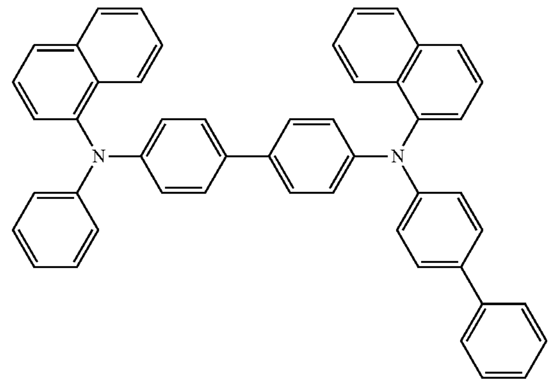
B-5
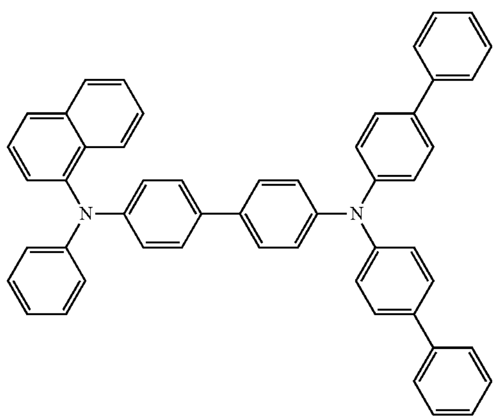
B-6
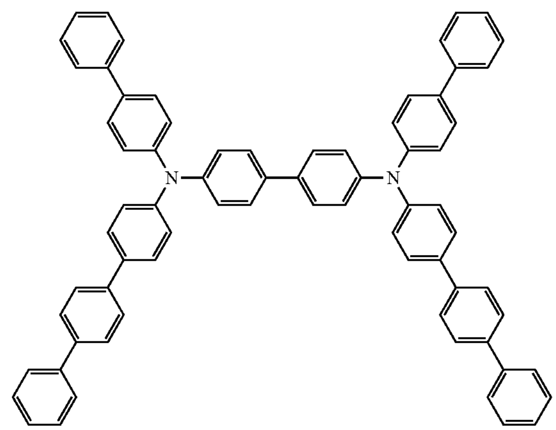
B-7
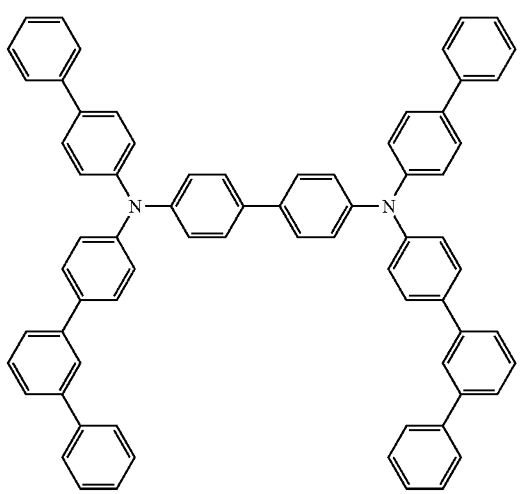
B-8
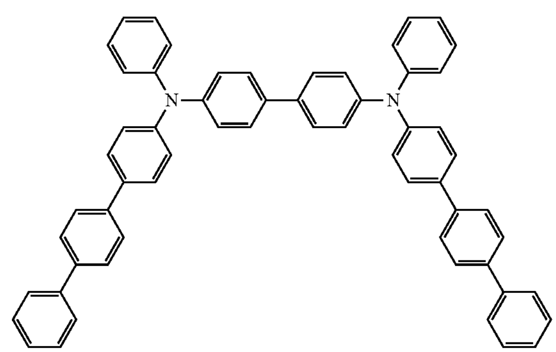

-continued
B-9
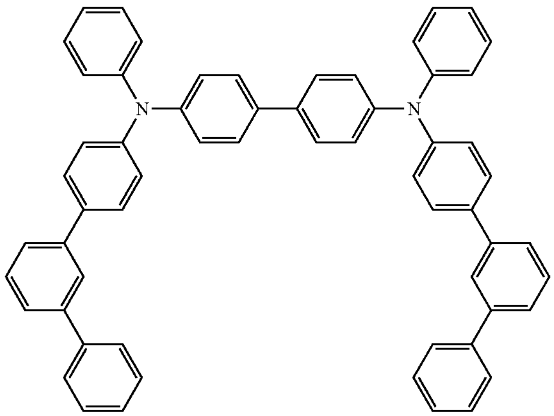
B-10
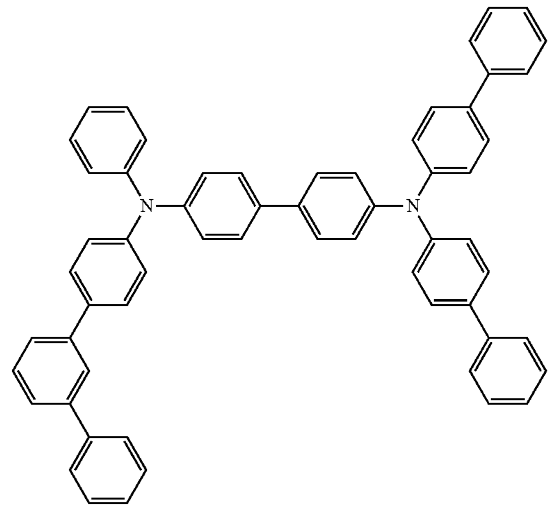
B-11
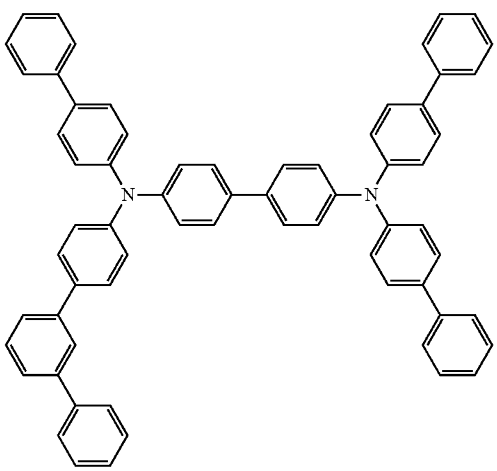
B-12
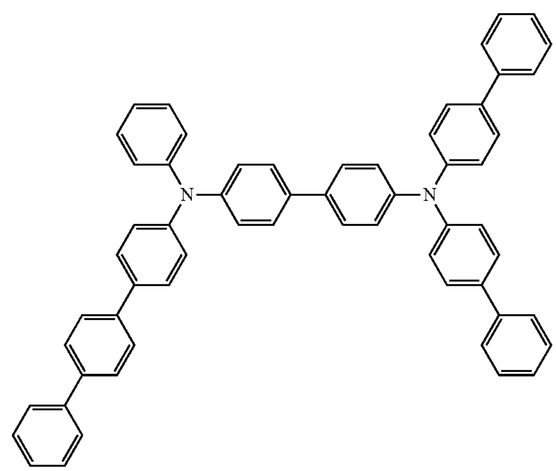
[Formula 191]
B-13
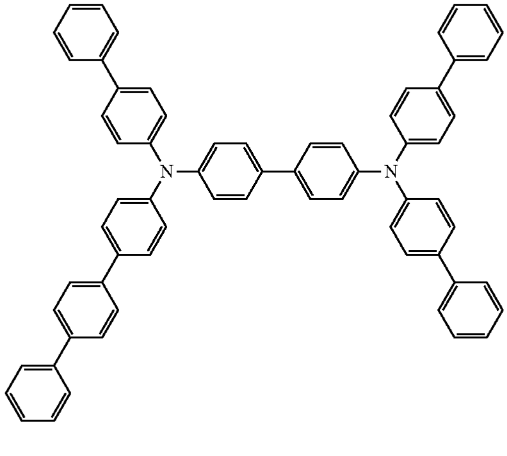
B-14
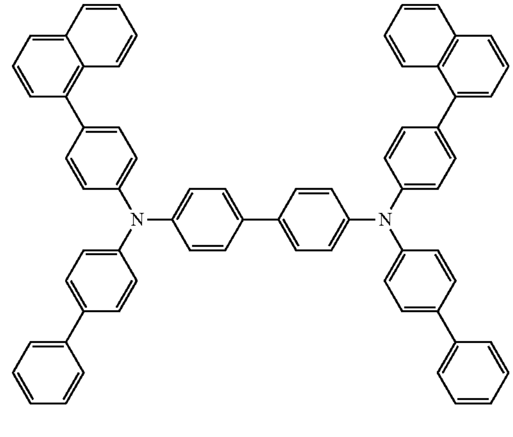

-continued
B-15
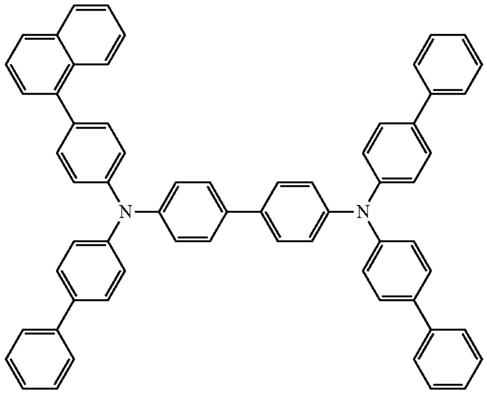
B-16
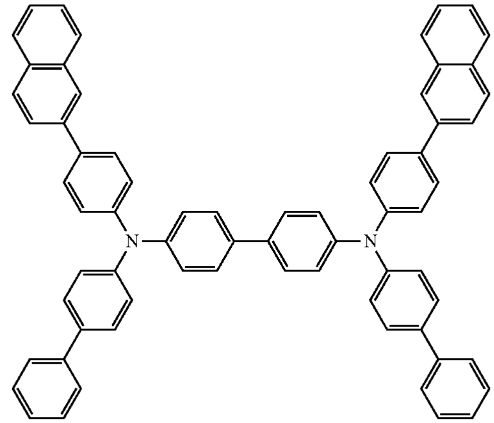
B-17
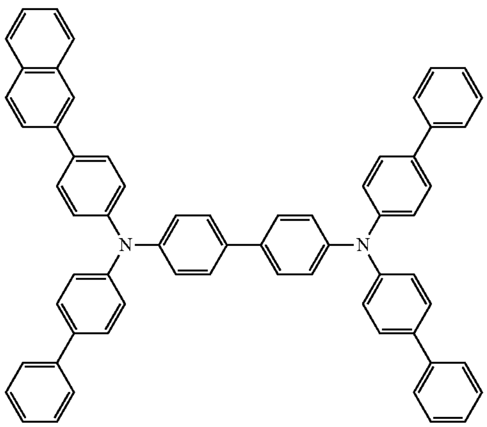
B-18
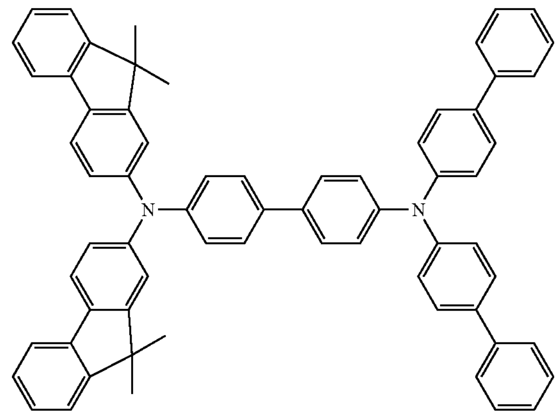
B-19
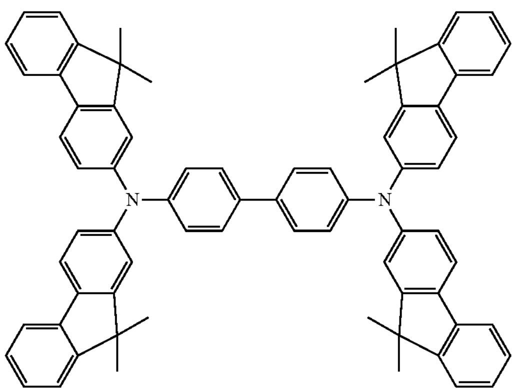
B-20
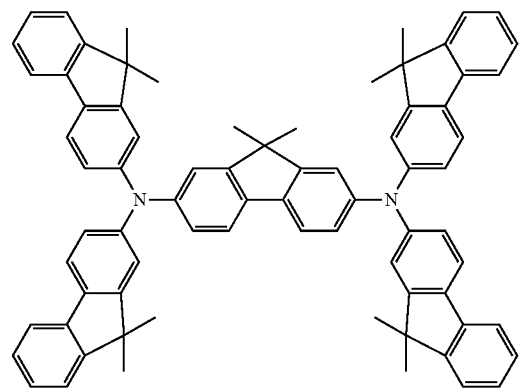
B-21
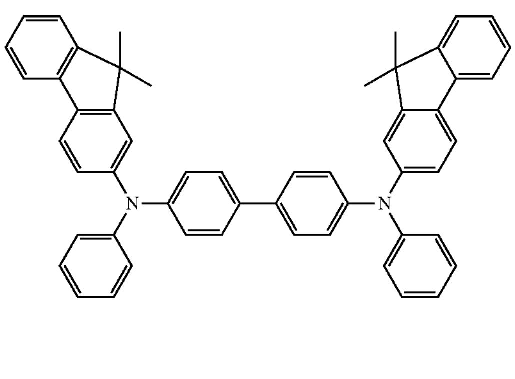
B-22
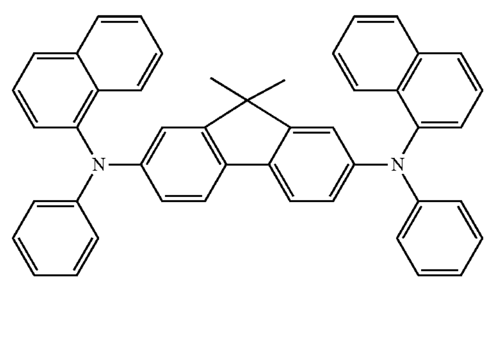

-continued
[Formula 192]
B-23
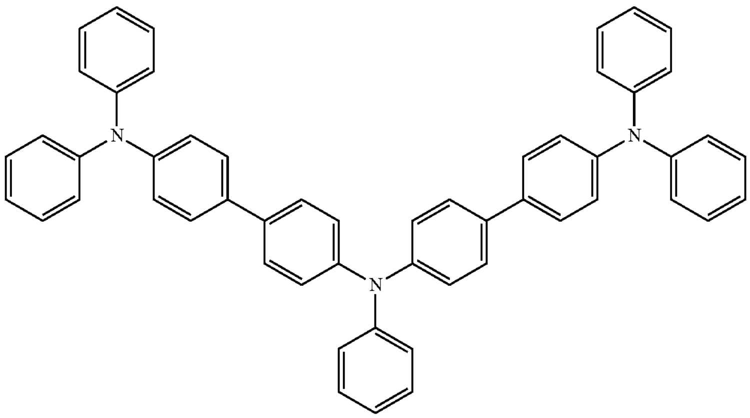
B-24
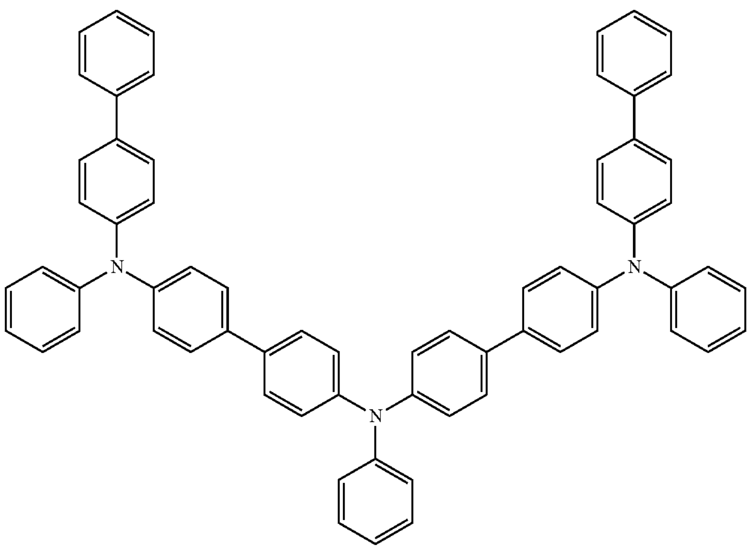
B-25
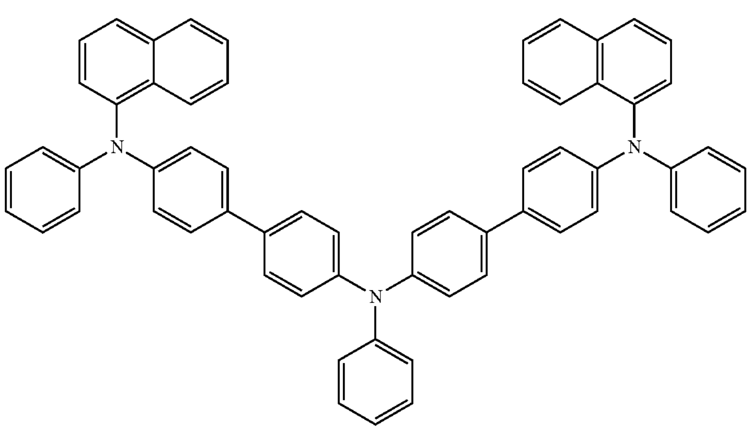

-continued
B-26
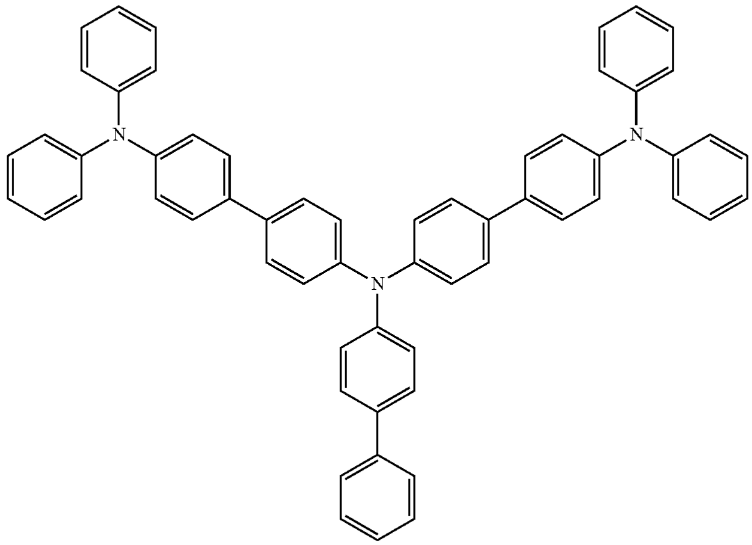
B-27
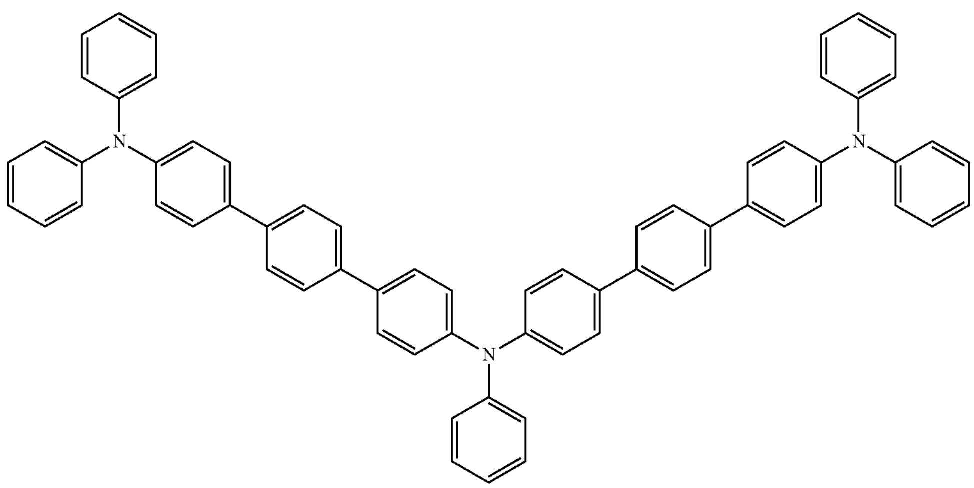
[Formula 193]
B-33
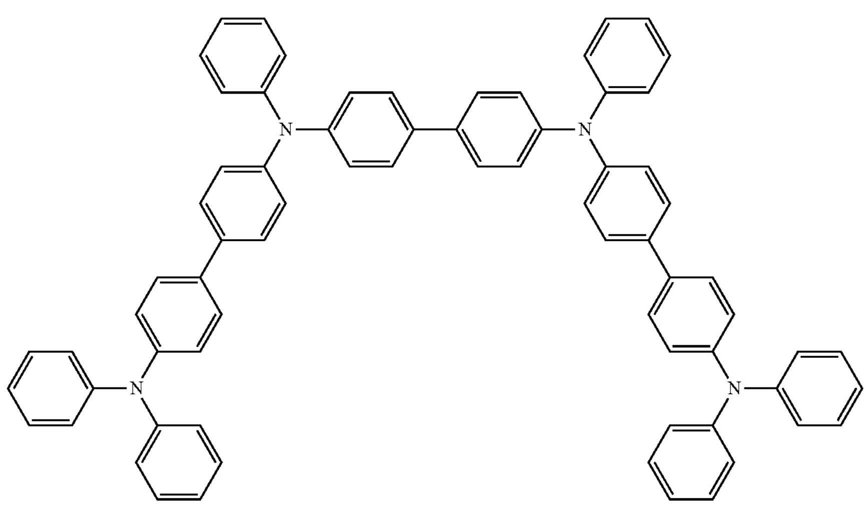

-continued
B-34
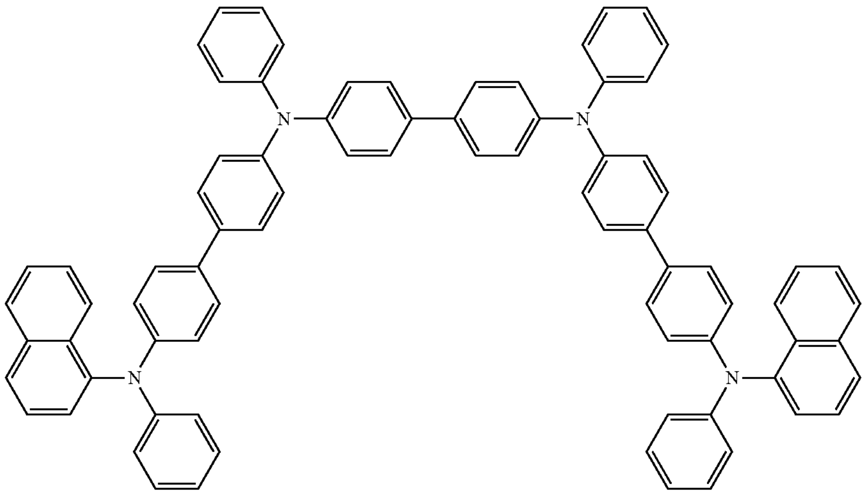
B-35
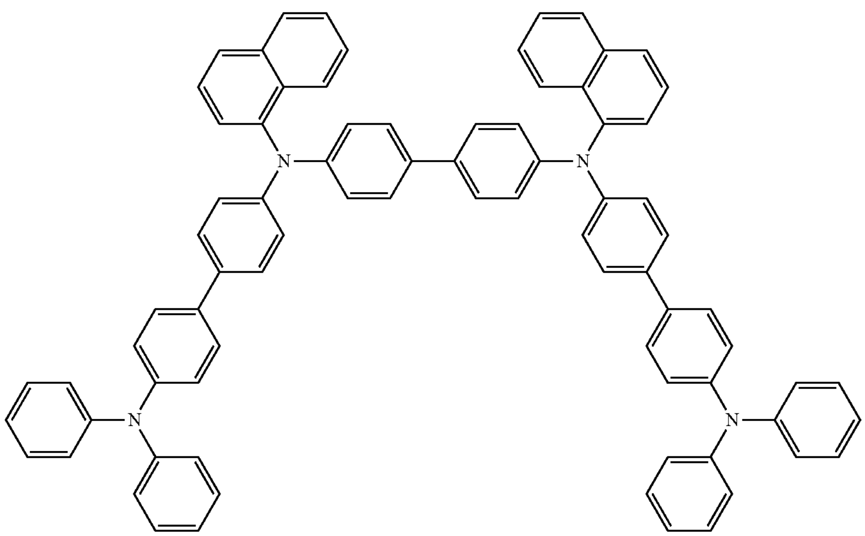
[Formula 194]
B-39
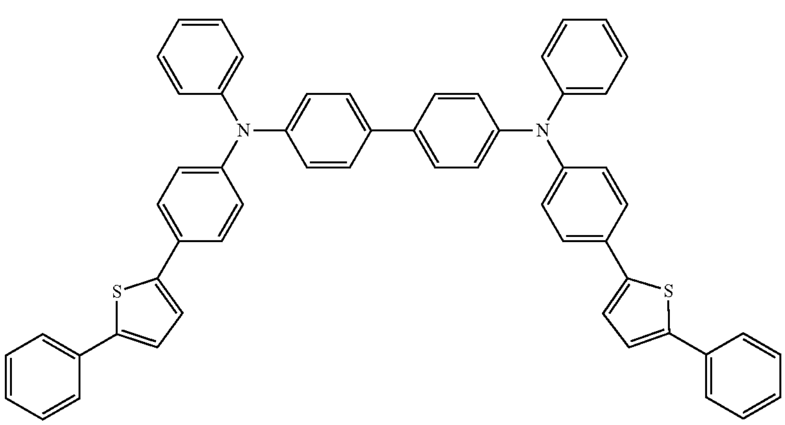

-continued
[Formula 195]
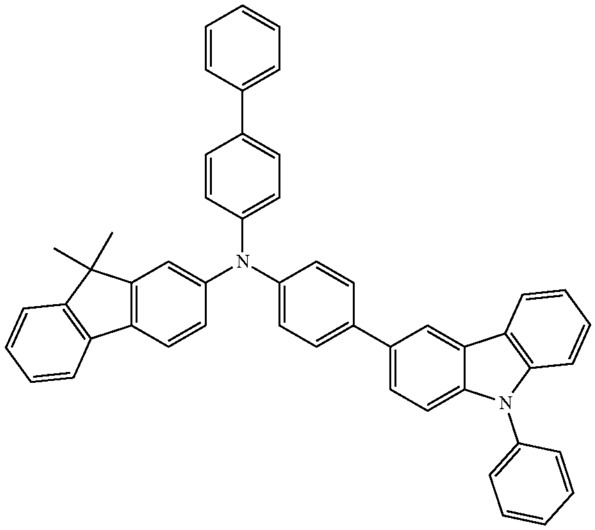
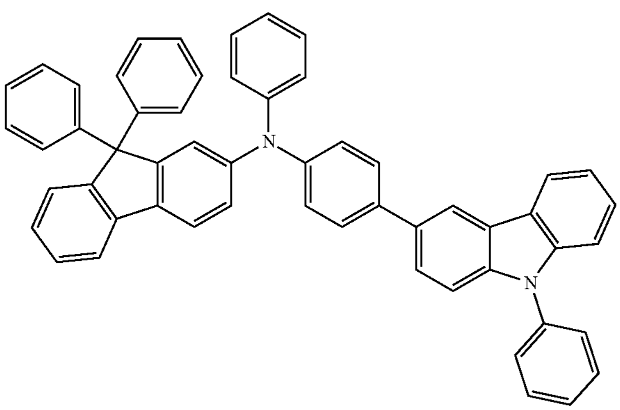
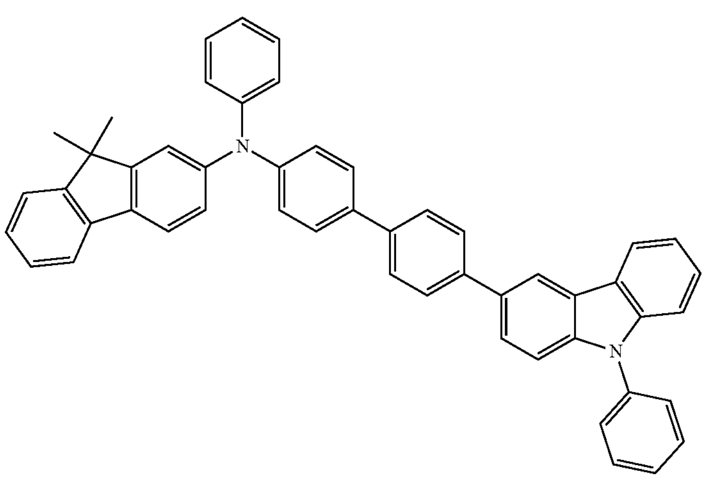

-continued
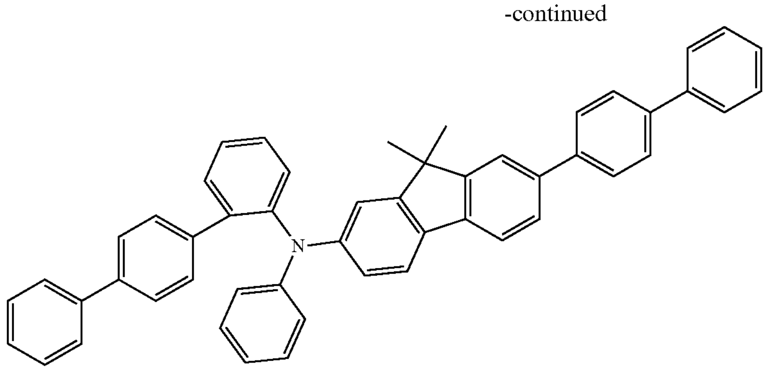
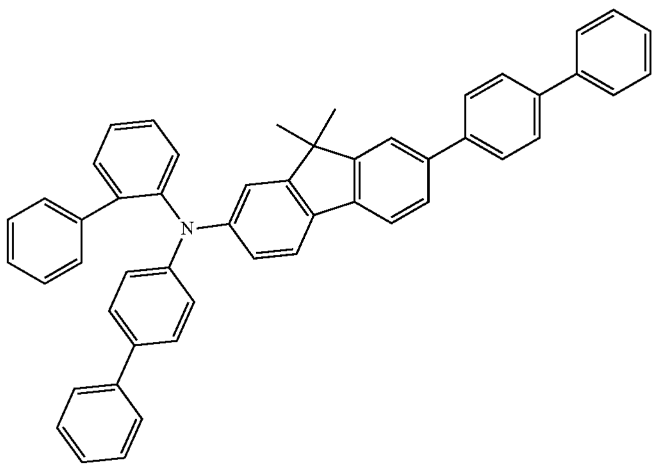
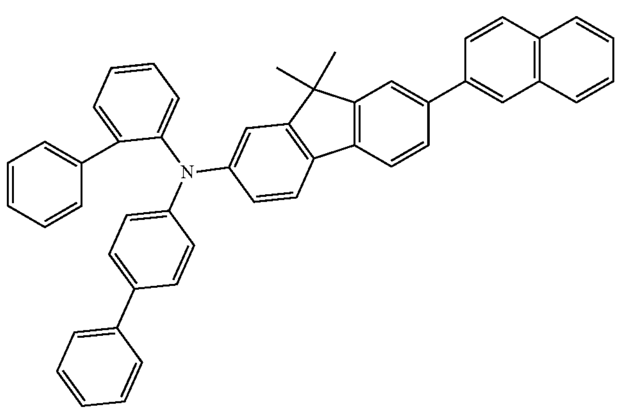
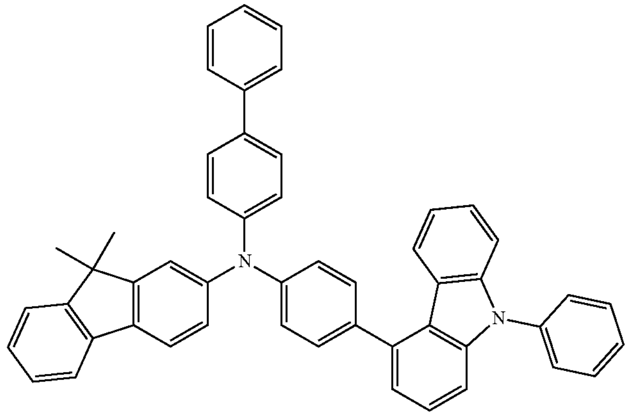

-continued
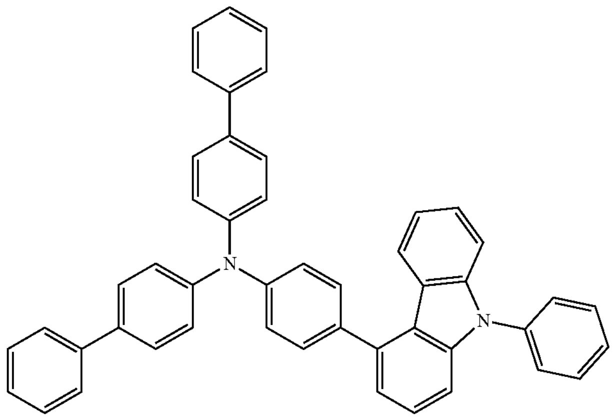
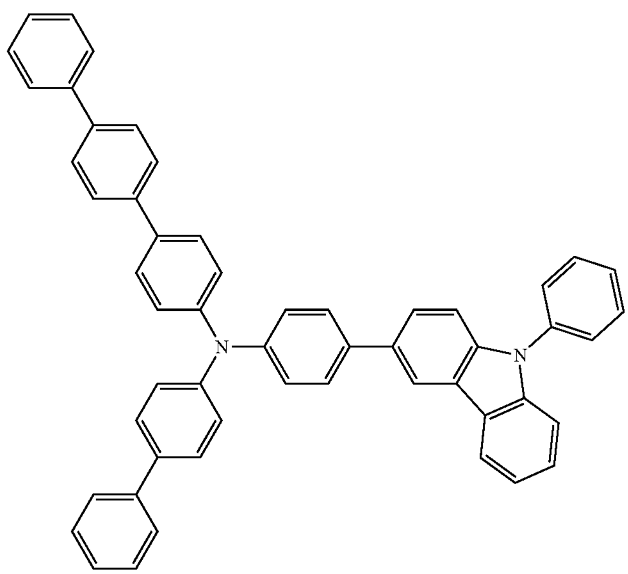
[Formula 196]
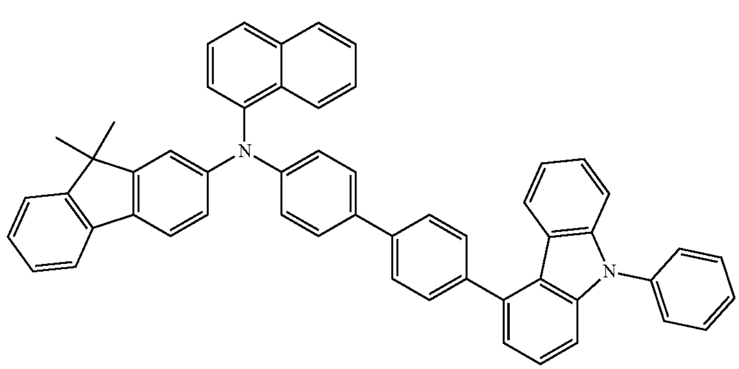

-continued
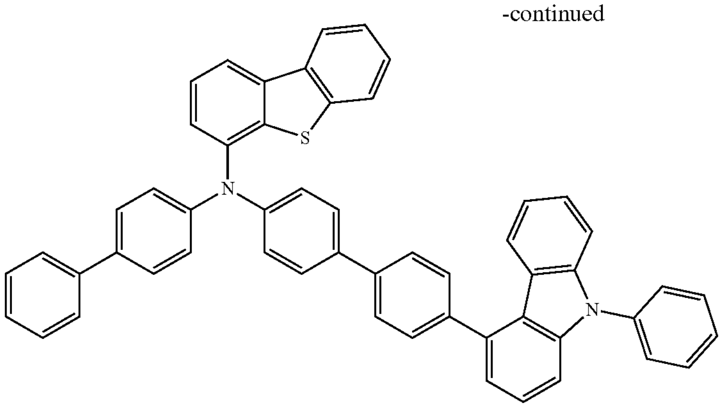
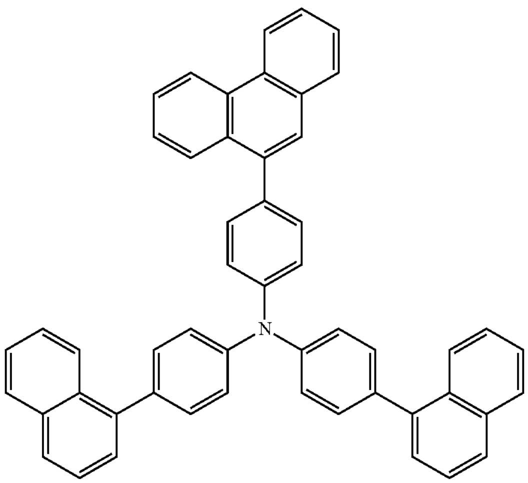
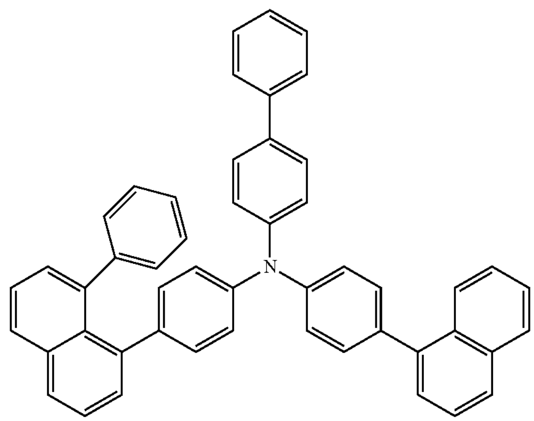
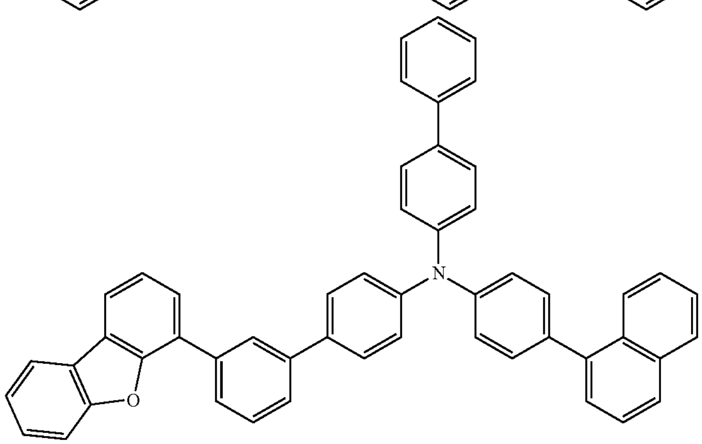
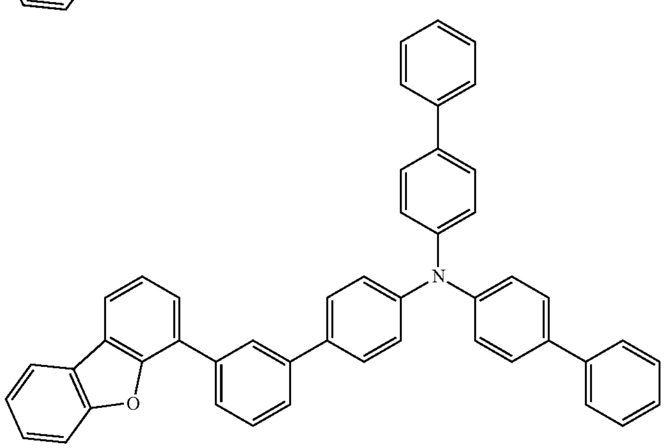

-continued
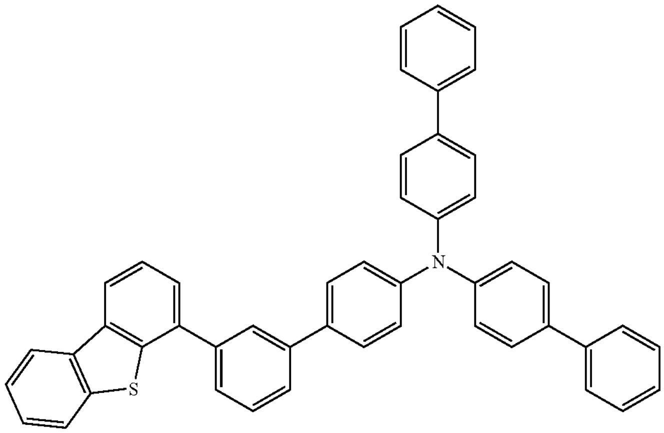
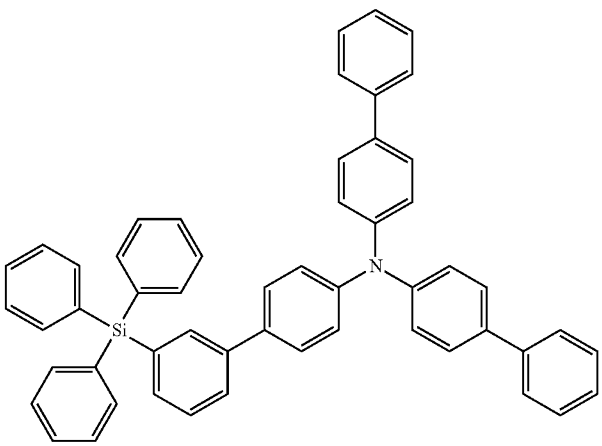
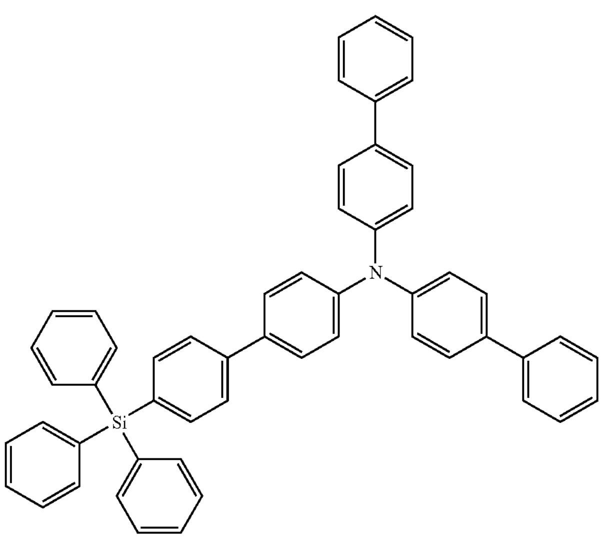

-continued
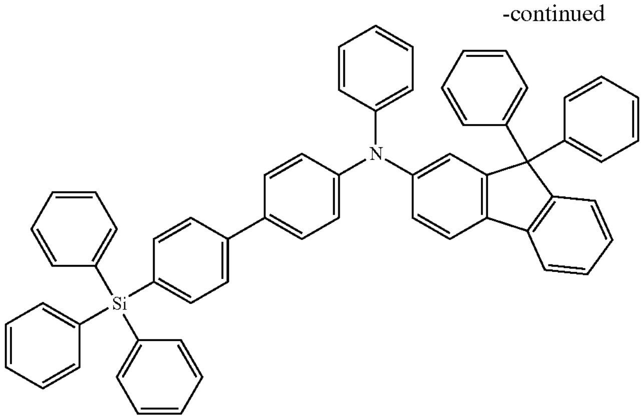
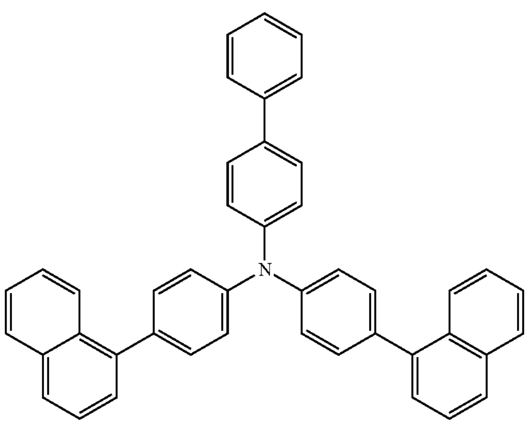
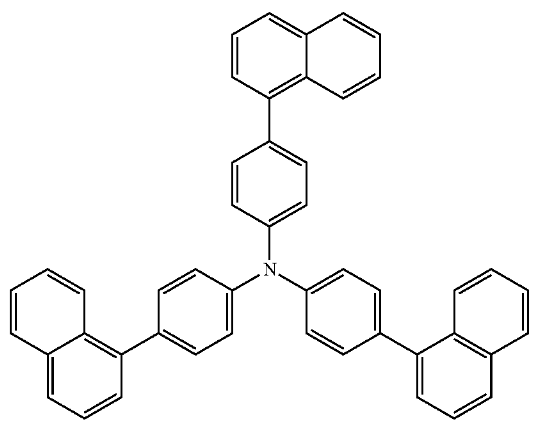
[Formula 197]
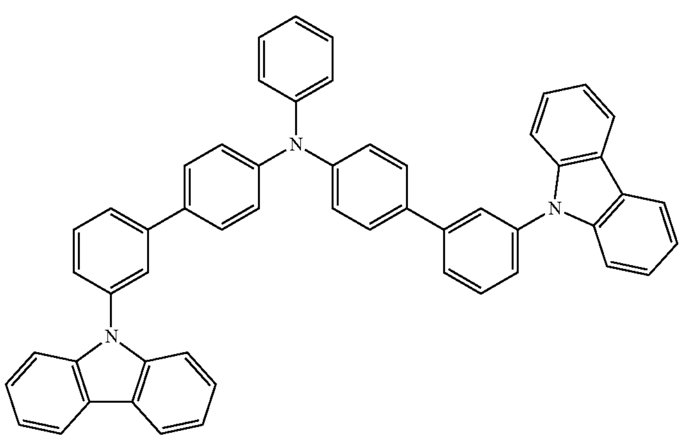

-continued
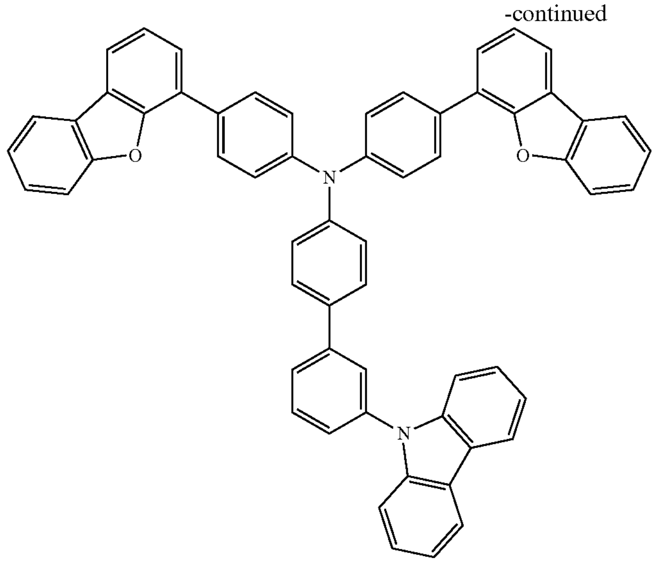
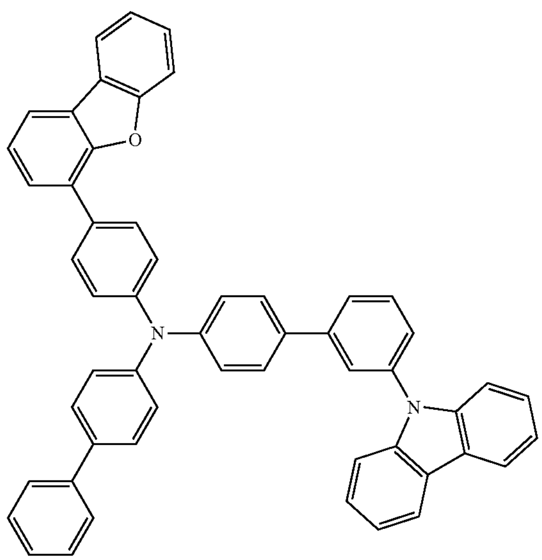
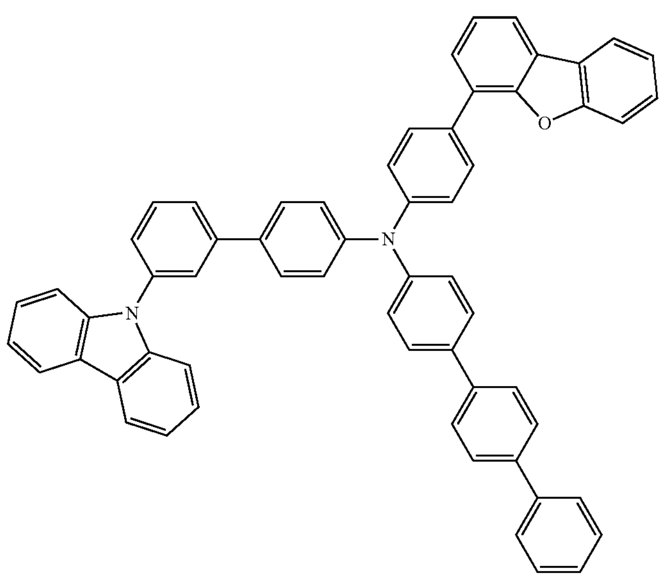

-continued
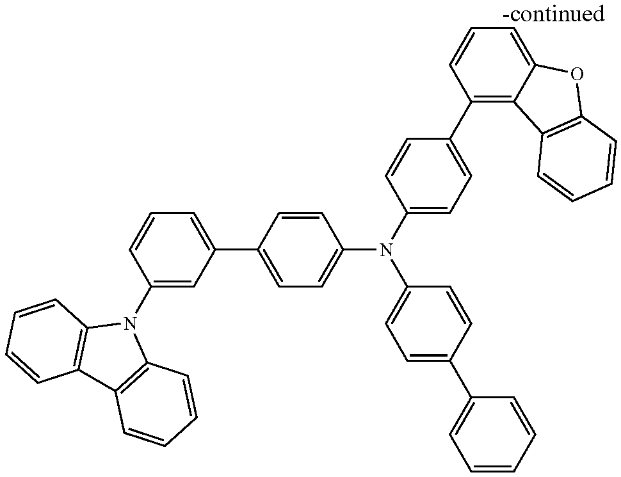
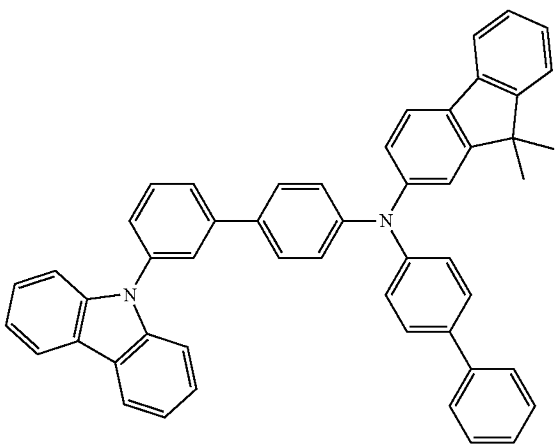
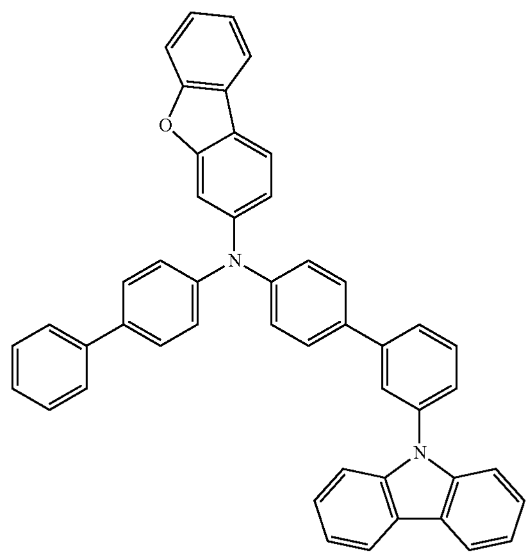
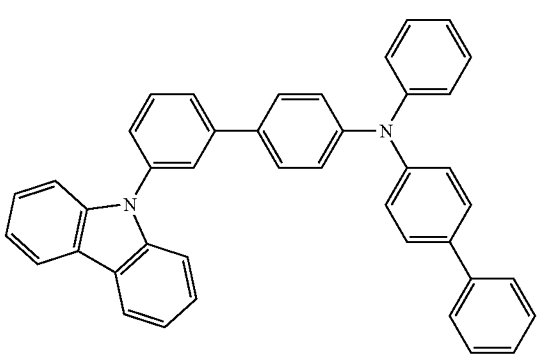

-continued
[Formula 198]
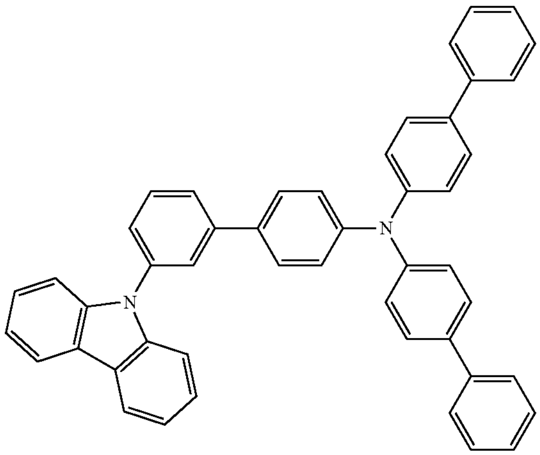
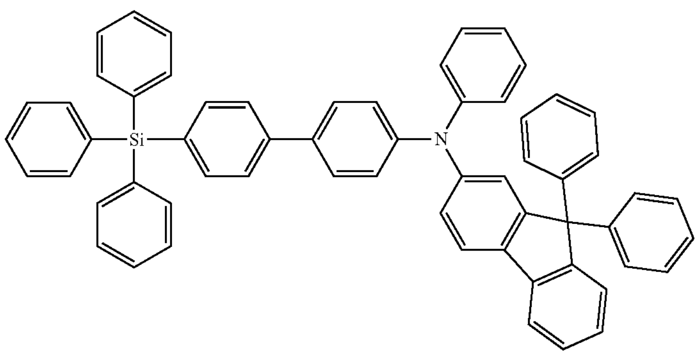
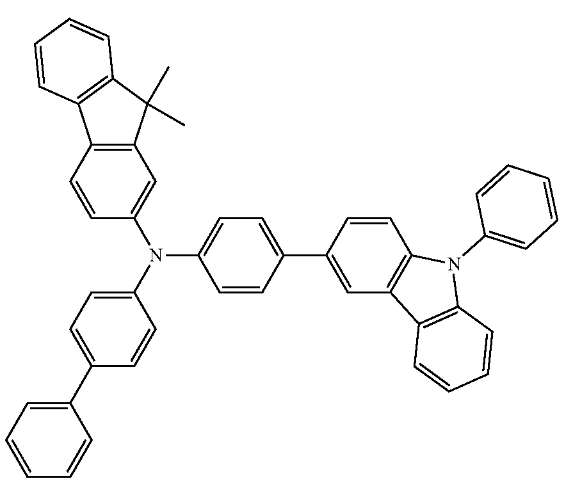

-continued

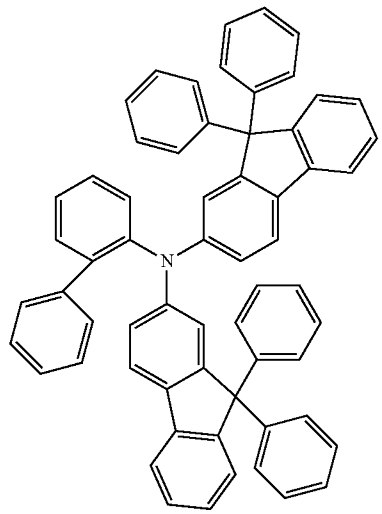

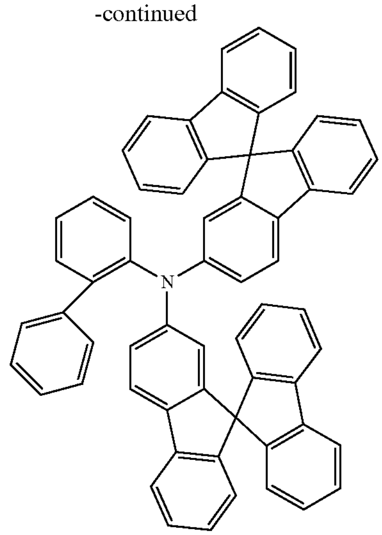

Second Exemplary Embodiment

Organic Electroluminescence Device

An organic EL device according to a second exemplary embodiment of the invention will be described.

An organic EL device according to the second exemplary embodiment includes an anode, a cathode, and an organic layer between the anode and the cathode. The organic layer includes at least one layer formed of an organic compound. Alternatively, the organic layer is provided by layering a plurality of layers each containing the organic compound. The organic layer may further contain an inorganic compound.

In the organic EL device according to the present exemplary embodiment, the organic layer contains a first compound and a second compound. The organic EL device according to the present exemplary embodiment contains a first organic layer as the organic layer. The first organic layer preferably contains the first compound and the second compound according to the first exemplary embodiment.

In the organic EL device according to the present exemplary embodiment, it is also preferable that the first compound is a compound represented by the formula (141) or (1451) and the second compound is a compound represented by the formula (22).

In the first organic layer according to the present exemplary embodiment, a total mass $W_T$ of the first compound and the second compound and a mass $W_2$ of the second compound satisfy a relationship represented by the following numerical formula (Numerical Formula 2).

$$0.1 \leq (W_2/W_T) \times 100 \quad \text{(Numerical Formula 2)}$$

In the first organic layer according to the present exemplary embodiment, it is preferable that the total mass $W_T$ of the first compound and the second compound and the mass $W_2$ of the second compound satisfy a relationship represented by the following numerical formula (Numerical Formula 2A).

$$0.1 \leq (W_2/W_T) \times 100 \leq 20.0 \quad \text{(Numerical Formula 2A)}$$

In the first organic layer according to the present exemplary embodiment, it is more preferable that the total mass $W_T$ of the first compound and the second compound and the mass $W_2$ of the second compound satisfy a relationship represented by the following numerical formula (Numerical Formula 2B).

$$0.1 \leq (W_2/W_T) \times 100 \leq 10.0 \quad \text{(Numerical Formula 2B)}$$

In the first organic layer according to the present exemplary embodiment, it is further preferable that the total mass $W_T$ of the first compound and the second compound and the mass $W_2$ of the second compound satisfy a relationship represented by the following numerical formula (Numerical Formula 2C).

$$0.5 \leq (W_2/W_T) \times 100 \leq 10.0 \quad \text{(Numerical Formula 2C)}$$

In the organic EL device of the second exemplary embodiment, at least one of the organic layer(s) is the emitting layer. Accordingly, the organic layer may consist of a single emitting layer or, alternatively, may further include at least one layer usable in organic EL devices. Examples of the layer usable in the organic EL device, which are not particularly limited, include at least one layer selected from the group consisting of a hole injecting layer, hole transporting layer, electron injecting layer, electron transporting layer, and blocking layer.

In the organic EL device according to the present exemplary embodiment, it is preferable that the organic layer includes: the first organic layer containing the first compound and the second compound, and the emitting layer.

The emitting layer is preferably provided between the first organic layer and the cathode.

The emitting layer is preferably not provided between the first organic layer and the anode.

In the organic EL device of the second exemplary embodiment, the organic layer preferably includes at least one of a hole injecting layer or a hole transporting layer provided between the anode and the emitting layer.

It is preferable that the at least one of the hole injecting layer or the hole transporting layer comprises the first compound and the second compound.

In the organic EL device of the present exemplary embodiment, the first organic layer is preferably the hole injecting layer. The organic EL device of the present exemplary embodiment includes: the emitting layer provided between the anode and the cathode; and the hole injecting layer provided between the emitting layer and the anode.

Even when the hole injecting layer contains the first compound and the second compound according to the first exemplary embodiment, the organic layer other than the hole injecting layer may contain at least one of the first compound or the second compound according to the first exemplary embodiment.

FIG. 1 schematically shows an arrangement of the organic EL device of the present exemplary embodiment.

An organic EL device 1 includes a light-transmissive substrate 2, an anode 3, a cathode 4, and an organic layer 10 provided between the anode 3 and the cathode 4. The organic layer 10 includes a hole injecting layer 6, a hole transporting layer 7, an emitting layer 5, an electron transporting layer 8, and an electron injecting layer 9, which are sequentially laminated on the anode 3.

It should be noted that the invention is not limited to the structure of the organic EL device shown in FIG. 1.

An arrangement of the organic EL device according to the present exemplary embodiment will be further described below. The codes will be sometimes omitted in the description below.

Substrate

The substrate is used as a support for the organic EL device. For instance, glass, quartz, plastics and the like are usable for the substrate. A flexible substrate is also usable. The flexible substrate is a bendable substrate, which is exemplified by a plastic substrate. Examples of the material for the plastic substrate include polycarbonate, polyarylate, polyethersulfone, polypropylene, polyester, polyvinyl fluoride, polyvinyl chloride, polyimide, and polyethylene naphthalate. Alternatively, an inorganic vapor deposition film is also usable.

Anode

Metal having a large work function (specifically, 4.0 eV or more), an alloy, an electrically conductive compound and a mixture thereof are preferably used as the anode formed on the substrate. Specific examples of the material include ITO (Indium Tin Oxide), indium oxide-tin oxide containing silicon or silicon oxide, indium oxide-zinc oxide, indium oxide containing tungsten oxide and zinc oxide, and graphene. In addition, gold (Au), platinum (Pt), nickel (Ni), tungsten (W), chrome (Cr), molybdenum (Mo), iron (Fe), cobalt (Co), copper (Cu), palladium (Pd), titanium (Ti), and nitrides of a metal material (e.g., titanium nitride) are usable.

The material is typically formed into a film by a sputtering method. For instance, the indium oxide-zinc oxide can be formed into a film by the sputtering method using a target in which zinc oxide in a range from 1 mass % to 10 mass % is added to indium oxide. Moreover, for instance, the indium oxide containing tungsten oxide and zinc oxide can be formed by the sputtering method using a target in which tungsten oxide in a range from 0.5 mass % to 5 mass % and zinc oxide in a range from 0.1 mass % to 1 mass % are added to indium oxide. In addition, the anode may be formed by a vacuum deposition method, a coating method, an inkjet method, a spin coating method or the like.

Among the organic layers formed on the anode, since the hole injecting layer adjacent to the anode is formed of a composite material into which holes are easily injectable irrespective of the work function of the anode, a material usable as an electrode material (e.g., metal, an alloy, an electroconductive compound, a mixture thereof, and the elements belonging to the group 1 or 2 of the periodic table) is also usable for the anode.

A material having a small work function such as elements belonging to Groups 1 and 2 in the periodic table of the elements, specifically, an alkali metal such as lithium (Li) and cesium (Cs), an alkaline earth metal such as magnesium (Mg), calcium (Ca) and strontium (Sr), alloys (e.g., MgAg and AlLi) including the alkali metal or the alkaline earth metal, a rare earth metal such as europium (Eu) and ytterbium (Yb), alloys including the rare earth metal are also usable for the anode. It should be noted that the vacuum deposition method and the sputtering method are usable for forming the anode using the alkali metal, alkaline earth metal and the alloy thereof. Further, when a silver paste is used for the anode, the coating method and the inkjet method are usable.

Cathode

It is preferable to use metal, an alloy, an electroconductive compound, and a mixture thereof, which have a small work function (specifically, 3.8 eV or less) for the cathode. Examples of the material for the cathode include elements belonging to Groups 1 and 2 in the periodic table of the elements, specifically, the alkali metal such as lithium (Li) and cesium (Cs), the alkaline earth metal such as magnesium (Mg), calcium (Ca) and strontium (Sr), alloys (e.g., MgAg and AlLi) including the alkali metal or the alkaline earth metal, the rare earth metal such as europium (Eu) and ytterbium (Yb), and alloys including the rare earth metal.

It should be noted that the vacuum deposition method and the sputtering method are usable for forming the cathode using the alkali metal, alkaline earth metal and the alloy thereof. Further, when a silver paste is used for the cathode, the coating method and the inkjet method are usable.

By providing the electron injecting layer, various conductive materials such as Al, Ag, ITO, graphene, and indium oxide-tin oxide containing silicon or silicon oxide may be used for forming the cathode regardless of the work function. The conductive materials can be formed into a film using the sputtering method, inkjet method, spin coating method and the like.

Hole Injecting Layer

The organic EL device according to the present exemplary embodiment may include a plurality of hole injecting layers. In the organic EL device of the present exemplary embodiment, it is only required that at least one hole injecting layer contains the first compound and the second compound and satisfies the relationships of Numerical Formulae 2, 2A, 2B or 2C, and the other hole injecting layer(s) contains a highly hole-injectable substance. Examples of the substance exhibiting a high hole injectability include molybdenum oxide, titanium oxide, vanadium oxide, rhenium oxide, ruthenium oxide, chrome oxide, zirconium oxide, hafnium oxide, tantalum oxide, silver oxide, tungsten oxide, and manganese oxide.

When the hole injecting layer in the organic EL device contains a plurality of compounds, a mass of each of the compounds can be determined using Time-of-Flight Secondary on Mass Spectrometry (TOF-SIMS).

With respect to each of the compounds contained in the hole injecting layer, a signal intensity of molecular ions by TOF-SIMS is measured in a film of an elementary substance, and the hole injecting layer in the organic EL device is exposed with a sputtering gun to be compared with the signal intensity of molecular ions by TOF-SIMS, whereby a mass ratio can be calculated.

In addition, the examples of the highly hole-injectable substance further include: an aromatic amine compound, which is a low-molecule organic compound, such that 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis [N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and 3-[N-(1-naphthyl)-N-(9-phenylcarbazole-3-yl)amino]-9-phenylcarbazole (abbreviation: PCzPCN1); and dipyrazino[2,3f:20,30-h]quinoxaline-2,3,6,7,10,11-hexacarbonitrile (HAT-CN).

In addition, a high polymer compound (e.g., oligomer, dendrimer and polymer) is usable as the substance exhibiting a high hole injectability. Examples of the high-molecule compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD). Moreover, an acid-added high polymer compound such as poly(3,4-ethylenedioxythiophene)/poly(styrene sulfonic acid) (PEDOT/PSS) and polyaniline/poly(styrene sulfonic acid)(PAni/PSS) are also usable.

Hole Transporting Layer

The hole transporting layer is a layer containing a highly hole-transporting substance. An aromatic amine compound, carbazole derivative, anthracene derivative and the like are usable for the hole transporting layer. Specific examples of a material for the hole transporting layer include 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4-phenyl-4'-(9-phenylfluorene-9-yl)triphenylamine (abbreviation: BAFLP), 4,4'-bis[N-(9,9-dimethylfluorene-2-yl)-N-phenylamino]biphenyl (abbreviation: DFLDPBi), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB). The above-described substances mostly have a hole mobility of $10^{-6}$ $cm^2/(V\cdot s)$ or more.

For the hole transporting layer, a carbazole derivative such as CBP, 9-[4-(N-carbazolyl)]phenyl-10-phenylanthracene (CzPA), and 9-phenyl-3-[4-(10-phenyl-9-anthryl)phenyl]-9H-carbazole (PCzPA) and an anthracene derivative such as t-BuDNA, DNA, and DPAnth may be used. A high polymer compound such as poly(N-vinylcarbazole) (abbreviation: PVK) and poly(4-vinyltriphenylamine) (abbreviation: PVTPA) is also usable.

However, in addition to the above substances, any substance exhibiting a higher hole transportability than an electron transportability may be used. It should be noted that the layer containing the substance exhibiting a high hole transportability may be not only a single layer but also a laminate of two or more layers formed of the above substance(s).

Guest Material of Emitting Layer

The emitting layer, which is a layer containing a highly luminescent substance, can contain various materials. Examples of the highly luminescent substance includes a fluorescent compound emitting fluorecense or a phosphorescent compound emitting phosphorescence. The fluorescent compound is a compound emittable from a singlet state. The phosphorescent compound is a compound emittable from a triplet state.

The guest material is occasionally referred to as a dopant material, emitter or luminescent material.

Examples of a blue fluorescent material usable for the emitting layer include a pyrene derivative, styrylamine derivative, chrysene derivative, fluoranthene derivative, fluorene derivative, diamine derivative, and triarylamine derivative. Specific examples include N,N'-bis[4-(9H-carbazole-9-yl)phenyl]-N,N'-diphenylstilbene-4,4'-diamine (abbreviation: YGA2S), 4-(9H-carbazole-9-yl)-4'-(10-phenyl-9-anthryl)triphenylamine (abbreviation: YGAPA), and 4-(10-phenyl-9-anthryl)-4'-(9-phenyl-9H-carbazole-3-yl)triphenylamine (abbreviation: PCBAPA).

Examples of a green fluorescent material usable for the emitting layer include an aromatic amine derivative. Specific examples include N-(9,10-diphenyl-2-anthryl)-N,9-diphenyl-9H-carbazole-3-amine (abbreviation: 2PCAPA), N-[9,10-bis(1,1'-biphenyl-2-yl)-2-anthryl]-N,9-diphenyl-9H-carbazole-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazole-9-yl)phenyl]-N-phenylanthracene-2-amine (abbreviation: 2YGABPhA), and N,N,9-triphenylanthracene-9-amine (abbreviation: DPhAPhA).

Examples of a red fluorescent material usable for the emitting layer include a tetracene derivative and a diamine derivative. Specific examples include N,N,N',N'-tetrakis(4-methylphenyl)tetracene-5,11-diamine (abbreviation: p-mPhTD), and 7,14-diphenyl-N,N,N',N'-tetrakis(4-methylphenyl)acenaphtho[1,2-a]fluoranthene-3,10-diamine (abbreviation: p-mPhAFD).

Examples of a blue phosphorescent material usable for the emitting layer include metal complexes such as an iridium complex, osmium complex and platinum complex. Specific examples include bis[2-(4',6'-difluorophenyl)pyridinato-N,C2']iridium(III)tetrakis(1-pyrazolyl)borate (abbreviation: Flr6), bis[2-(4',6'-difluorophenyl)pyridinato-N,C2']iridium(III)picolinate (abbreviation: Flrpic), bis[2-(3',5'bistrifluoromethylphenyl)pyridinato-N,C2']iridium (III)picolinate (abbreviation: $Ir(CF_3ppy)_2(pic)$), and bis[2-(4',6'-difluorophenyl)pyridinato-N,C2']iridium(III)acetylacetonato (abbreviation: Flracac).

Examples of a green phosphorescent material usable for the emitting layer include an iridium complex. Specific examples include tris(2-phenylpyridinato-N,C2')iridium(III) (abbreviation: $Ir(ppy)_3$), bis(2-phenylpyridinato-N,C2')iridium(III)acetylacetonato (abbreviation: $Ir(ppy)_2(acac)$), bis(1,2-diphenyl-1H-benzimidazolato)iridium(III)acetylacetonato (abbreviation: $Ir(pbi)_2(acac)$), and bis(benzo[h]quinolinato)iridium(III)acetylacetonato (abbreviation: $Ir(bzq)_2(acac)$).

Examples of a red phosphorescent material usable for the emitting layer include metal complexes such as an iridium complex, platinum complex, terbium complex, and europium complex. Specific examples include organic metal complexes such as bis[2-(2'-benzo[4,5-a]thienyl)pyridinato-N,C3']iridium(III)acetylacetonato (abbreviation: $Ir(btp)_2(acac)$), bis(1-phenylisoquinolinato-N,C2')iridium(III)acetylacetonato (abbreviation: $Ir(piq)_2(acac)$), (acetylacetonato)bis[2,3-bis(4-fluorophenyl)quinolinato]iridium(III) (abbreviation: $Ir(Fdpq)_2(acac)$), and 2,3,7,8,12,13,17,18-octaethyl-21H,23H-porphyrinplatinum(II) (abbreviation: PtOEP).

Moreover, since a rare-earth metal complex, examples of which include tris(acetylacetonato)(monophenanthroline)terbium(III) (abbreviation: $Tb(acac)_3(Phen)$), tris(1,3-diphenyl-1,3-propanedionatodionato)(monophenanthroline)europium(III) (abbreviation: $Eu(DBM)_3(Phen)$), and tris[1-(2-thenoyl)-3,3,3-trifluoroacetonato](monophenanthroline) europium(III) (abbreviation: $Eu(TTA)_3(Phen)$), emits light from rare-earth metal ions (electron transition between different multiplicities), the rare-earth metal complex is usable as a phosphorescent compound.

Host Material of Emitting Layer

The emitting layer may include the above-described highly luminescent substance (guest material) dispersed in another substance (host material). The host material is occasionally referred to as a matrix material.

The substance for dispersing the highly luminescent substance may be various substances, preferably a substance having higher Lowest Unoccupied Molecular Orbital (LUMO level) and lower Highest Occupied Molecular Orbital (HOMO level) than the highly luminescent substance.

Examples of the substance (host material) for dispersing the highly luminescent substance include: (1) a metal complex such as an aluminum complex, beryllium complex, or zinc complex; (2) a heterocyclic compound such as an oxadiazole derivative, benzimidazole derivative, or phenanthroline derivative; (3) a fused aromatic compound such as a carbazole derivative, anthracene derivative, phenanthrene derivative, pyrene derivative, or chrysene derivative; and (4) an aromatic amine compound such as a triarylamine derivative or a fused polycylic aromatic amine derivative. Specific examples include: metal complexes such as tris(8-quinolinolato)aluminum(III) (abbreviation: Alq), tris(4-methyl-8-quinolinolato)aluminum(III) (abbreviation: $Almq_3$), bis(10-hydroxybenzo[h]quinolinato)beryllium(II) (abbreviation: $BeBq_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl] benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), bathocuproine (abbreviation: BCP); a fused aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), 9,10-diphenylanthracene (abbreviation: DPAnth), 6,12-dimethoxy-5,11-diphenylchrysene; and an aromatic amine compound such as N,N-diphenyl-9-[4-(10-phenyl-9-anthryl)phenyl]-9H-carbazole-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazole-3-amine (abbreviation: PCAPA), N,9-diphenyl-N-{4-[4-(10-phenyl-9-anthryl)phenyl] phenyl}-9H-carbazole-3-amine (abbreviation: PCAPBA), N-(9,10-diphenyl-2-anthryl)-N,9-diphenyl-9H-carbazole-3-amine (abbreviation: 2PCAPA), NPB (or α-NPD), TPD, DFLDPBi, and BSPB. Moreover, the substance (host material) for dispersing the highly luminescent substance (guest material) can be used in plural.

Electron Transporting Layer

The electron transporting layer is a layer containing a highly electron-transporting substance. For the electron transporting layer, 1) a metal complex such as an aluminum complex, beryllium complex, and zinc complex, 2) a hetero aromatic compound such as imidazole derivative, benzimidazole derivative, azine derivative, carbazole derivative, and phenanthroline derivative, and 3) a high polymer compound are usable. Specifically, as a low-molecule organic compound, a metal complex such as Alq, tris(4-methyl-8-quinolinato)aluminum (abbreviation: $Almq_3$), bis(10-hydroxybenzo[h]quinolinato)beryllium (abbreviation: $BeBq_2$), BAlq, Znq, ZnPBO and ZnBTZ is usable. In addition to the metal complex, a heteroaromatic compound such as 2-(4-biphenylyl)-5-(4-tert-butylphenyl)-1,3,4-oxadiazole (abbreviation: PBD), 1,3-bis[5-(ptert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and 4,4'-bis(5-methylbenzoxazole-2-yl)stilbene (abbreviation: BzOs) is usable. In the present exemplary embodiment, a benzimidazole compound is preferably usable. The above-described substances mostly have an electron mobility of $10^{-6}$ $cm^2/(V \cdot s)$ or more. It should be noted that any substance other than the above substance may be used for the electron transporting layer as long as the substance exhibits a higher electron transportability than the hole transportability. The electron transporting layer may be provided in the form of a single layer or a laminate of two or more layers of the above substance(s).

Moreover, a high polymer compound is usable for the electron transporting layer. For instance, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy) and the like are usable.

Electron Injecting Layer

The electron injecting layer is a layer containing a highly electron-injectable substance. Examples of a material for the electron injecting layer include an alkali metal, alkaline earth metal and a compound thereof, examples of which include lithium (Li), cesium (Cs), calcium (Ca), lithium fluoride (LiF), cesium fluoride (CsF), calcium fluoride ($CaF_2$), and lithium oxide (LiOx). In addition, the alkali metal, alkaline earth metal or the compound thereof may be added to the substance exhibiting the electron transportability in use. Specifically, for instance, magnesium (Mg) added to Alq may be used. In this case, the electrons can be more efficiently injected from the anode.

Alternatively, the electron injecting layer may be provided by a composite material in a form of a mixture of the organic compound and the electron donor. Such a composite material exhibits excellent electron injectability and electron transportability since electrons are generated in the organic compound by the electron donor. In this case, the organic compound is preferably a material excellent in transporting the generated electrons. Specifically, the above examples (e.g., the metal complex and the hetero aromatic compound) of the substance forming the electron transporting layer are usable. As the electron donor, any substance exhibiting electron donating property to the organic compound is usable. Specifically, the electron donor is preferably alkali metal, alkaline earth metal and rare earth metal such as lithium, cesium, magnesium, calcium, erbium and ytterbium. The electron donor is also preferably alkali metal oxide and alkaline earth metal oxide such as lithium oxide, calcium oxide, and barium oxide. Moreover, a Lewis base such as magnesium oxide is usable. Further, the organic compound such as tetrathiafulvalene (abbreviation: TTF) is usable.

Layer Formation Method(s)

With respect to a method of forming each layer of the organic EL device of the present exemplary embodiment, the first organic layer containing the first compound and the second compound is manufactured by a dry film-forming method such as vacuum deposition method, sputtering method, plasma method and ion-plating method.

A method of forming layers other than the first organic layer, which is not limited except as described above, may be the dry film-forming method described above or a wet film-forming method such as spin coating, dipping, flow coating and ink jet printing.

Film Thickness

There is no restriction except for the above particular description for a film thickness of each of the organic layers of the organic EL device in the present exemplary embodiment. The thickness of each of the organic layers of the organic EL device is usually preferably in a range from several nanometers to 1 μm, because too small film thickness causes defects (e.g., pin holes) and too large film thickness requires application of high voltage, resulting in deterioration in the efficiency.

A film thickness of the first organic layer containing the first compound and the second compound according to the first exemplary embodiment is preferably in a range from 1 nm to 30 nm, more preferably in a range from 1 nm to 15 nm, further preferably in a range from 3 nm to 12 nm.

Electronic Device

An electronic device according to the present exemplary embodiment is preferably installed with an organic EL device according to the present exemplary embodiment. Examples of the electronic device include a display device and a light-emitting unit.

Examples of the display device include a display component (e.g., an organic EL panel module), TV, mobile phone, tablet and personal computer. Examples of the light-emitting unit include an illuminator and a vehicle light.

In some embodiments, mixtures according to [1] to [38] below, organic electroluminescence devices according to [39] to [44] below, and an electronic device according to [45] below are also provided.

[1] A mixture includes: a first compound; and a second compound, in which the first compound includes s at least one of a first cyclic structure represented by a formula (11) or a second cyclic structure represented by a formula (12), the second compound is a compound represented by a formula (21) or a compound represented by a formula (22), and a total mass $M_T$ of the first compound and the second compound and a mass $M_2$ of the second compound in the mixture satisfy Numerical Formula 1, (Numerical Formula 1)

$$0.1 \leq (M_2/M_T) \times 100$$

(11)

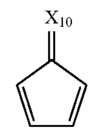

(12)

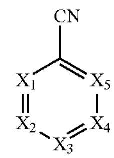

in the formulae (11) and (12):

the first cyclic structure represented by the formula (11) is fused to at least one cyclic structure of a substituted or unsubstituted aromatic hydrocarbon ring having 6 to 50 ring carbon atoms or a substituted or unsubstituted heterocycle having 5 to 50 ring atoms in a molecule of the first compound, and a structure represented by $=X_{10}$ is represented by a formula (11a), (11b), (11c), (11d), (11e), (11f), (11g), (11h), (11i), (11j), (11k) or (11m), (11a)

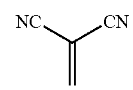

(11b)

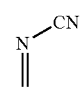

(11c)

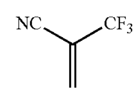

(11d)

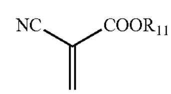

(11e)

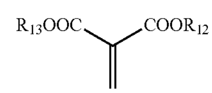

(11f)

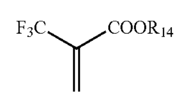

(11g)

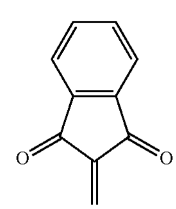

(11h)

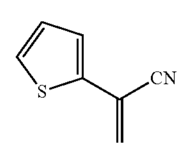

-continued (11i)

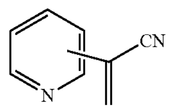

(11j)

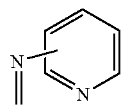

(11k)

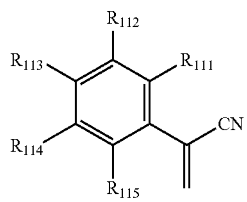

(11m)

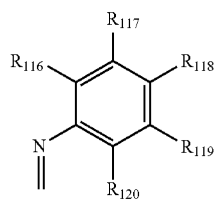

in the formula (11a), (11b), (11c), (11d), (11e), (11f), (11g), (11h), (11i), (11j), (11k) or (11m):

$R_{11}$ to $R_{14}$ and $R_{111}$ to $R_{120}$ are each independently a hydrogen atom, a halogen atom, hydroxy group, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aryl group having 6 to 50 ring carbon atoms, or a substituted or unsubstituted heterocyclic group having 5 to 50 ring atoms, in the formula (12):

$X_1$ to $X_5$ are each independently a nitrogen atom, a carbon atom to be bonded to $R_{15}$, or a carbon atom to be bonded to another atom in the molecule of the first compound;

at least one of $X_1$ to $X_5$ is a carbon atom to be bonded to another atom in the molecule of the first compound;

$R_{15}$ is selected from the group consisting of a hydrogen atom, a halogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a substituted or unsubstituted aryl group having 6 to 50 ring carbon atoms, a substituted or unsubstituted heterocyclic group having 5 to 50 ring atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted alkenyl group having 2 to 50 carbon atoms, a substituted or unsubstituted aralkyl group having 7 to 50 carbon atoms, a carboxy group, a substituted or unsubstituted ester group, a substituted or unsubstituted carbamoyl group, a nitro group, and a substituted or unsubstituted siloxanyl group; and when a plurality of $R_{15}$ are present, the plurality of $R_{15}$ are mutually the same or different, (21)

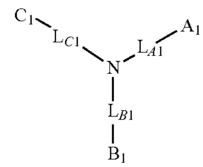

(22)

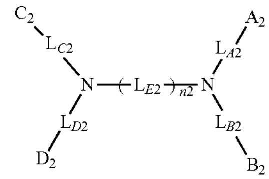

in the formulae (21) and (22):

$L_{A1}$, $L_{B1}$, $L_{C1}$, $L_{A2}$, $L_{B2}$, $L_{C2}$ and $L_{D2}$ are each independently a single bond, a substituted or unsubstituted arylene group having 6 to 50 ring carbon atoms, or a substituted or unsubstituted divalent heterocyclic group having 5 to 50 ring atoms;

n2 is 1, 2, 3 or 4;

when n2 is 1, $L_{E2}$ is a substituted or unsubstituted arylene group having 6 to 50 ring carbon atoms, or a substituted or unsubstituted divalent heterocyclic group having 5 to 50 ring atoms;

when n2 is 2, 3 or 4, a plurality of $L_{E2}$ are mutually the same or different;

when n2 is 2, 3 or 4, the plurality of $L_{E2}$ are mutually bonded to form a substituted or unsubstituted monocyclic ring, mutually bonded to form a substituted or unsubstituted fused ring, or not mutually bonded;

$L_{E2}$ forming neither the monocyclic ring nor the fused ring is a substituted or unsubstituted arylene group having 6 to 50 ring carbon atoms, or a substituted or unsubstituted divalent heterocyclic group having 5 to 50 ring atoms;

$A_1$, $B_1$, $C_1$, $A_2$, $B_2$, $C_2$ and $D_2$ are each independently a substituted or unsubstituted aryl group having 6 to 50 ring carbon atoms, a substituted or unsubstituted heterocyclic group having 5 to 50 ring atoms, or —Si($R'_{901}$)($R'_{902}$)($R'_{903}$), $R'_{901}$, $R'_{902}$ and $R'_{903}$ are each independently a substituted or unsubstituted aryl group having 6 to 50 ring carbon atoms;

when a plurality of $R'_{901}$ are present, the plurality of $R'_{901}$ are mutually the same or different;

when a plurality of $R'_{902}$ are present, the plurality of $R'_{902}$ are mutually the same or different;

when a plurality of $R'_{903}$ are present, the plurality of $R'_{903}$ are mutually the same or different;

in the first compound and the second compound, $R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

[2] In the mixture according to [1], the first compound is a fused compound formed by fusing two or three structures represented by a formula (13) to a third cyclic structure selected from a substituted or unsubstituted aromatic hydrocarbon ring having 6 to 50 ring carbon atoms and a substituted or unsubstituted heterocycle having 5 to 50 ring atoms, (13)

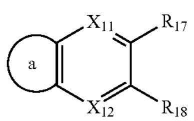

in the formula (13):

a is a cyclic structure fused to the third cyclic structure and is represented by the formula (11);

$X_{11}$ and $X_{12}$ are each independently $C(R_{16})$ or a nitrogen atom;

a plurality of $R_{16}$ are mutually the same or different; and $R_{16}$, $R_{17}$ and $R_{18}$ are each independently a hydrogen atom, a halogen atom, hydroxy group, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a substituted or unsubstituted aryl group having 6 to 50 ring carbon atoms, or a substituted or unsubstituted heterocyclic group having 5 to 50 ring atoms.

[3] In the mixture according to [2], the first compound is a compound represented by a formula (14) or (15), (14)

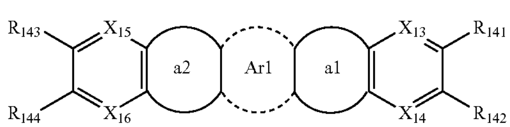

(15)

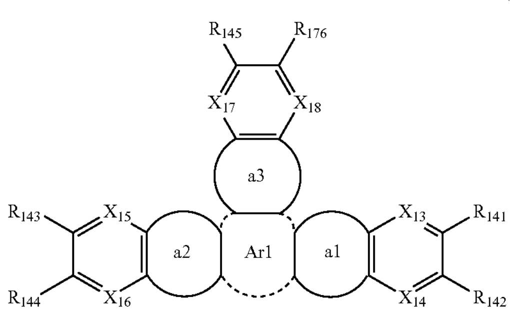

in the formulae (14) and (15):

Ar1 is a substituted or unsubstituted aromatic hydrocarbon ring having 6 to 50 ring carbon atoms or a substituted or unsubstituted heterocycle having 5 to 50 ring atoms;

a1, a2 and a3 each independently represent the cyclic structure represented by the formula (11);

$X_{13}$ to $X_{18}$ each independently represent the same as $X_{11}$ and $X_{12}$ of the formula (13); and $R_{141}$ to $R_{146}$ each independently represent the same as $R_{17}$ and $R_{18}$ in the formula (13).

[4] In the mixture according to [3],

Ar1 in the formulae (14) and (15) is a substituted or unsubstituted benzene ring or a substituted or unsubstituted heterocyclic group having 6 ring atoms.

[5] In the mixture according to [3] or [4], the first compound is represented by a formula (14A) or (15A), (14A)

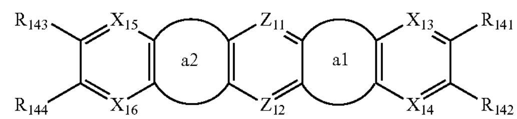

(15A)

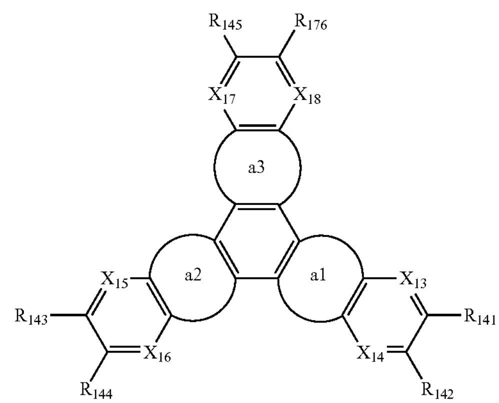

in the formulae (14A) and (15A):

a1, a2 and a3 each independently represent the cyclic structure represented by the formula (11);

$X_{13}$ to $X_{18}$ each independently represent the same as $X_{11}$ and $X_{12}$ of the formula (13); and $R_{141}$ to $R_{146}$ each independently represent the same as $R_{17}$ and $R_{18}$ of the formula (13), and in the formula (14A), $Z_{11}$ and $Z_{12}$ are each independently CH or a nitrogen atom.

[6] In the mixture according to any one of [2] to [5], at least one of $R_{17}$ and $R_{18}$ in the formula(13) is a fluorine atom, a fluoroalkyl group, a fluoroalkoxy group, or a cyano group.

[7] In the mixture according to any one of [1] to [6], the first cyclic structure represented by the formula (11) is a cyclic structure represented by a formula (11A)

(11A)

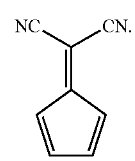

[8] In the mixture according to any one of [1] to [7], the first compound is a compound represented by one of formulae (145) to (148), (145)

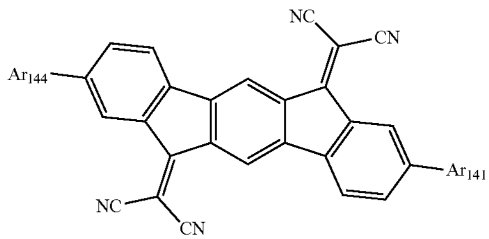

(146)

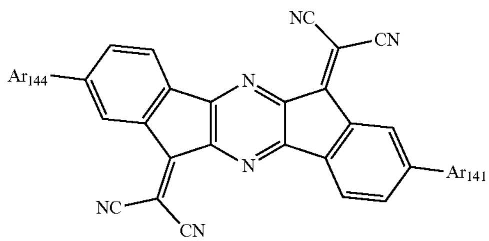

(147)

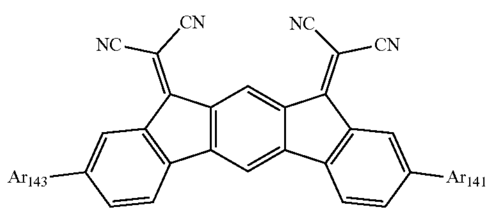

(148)

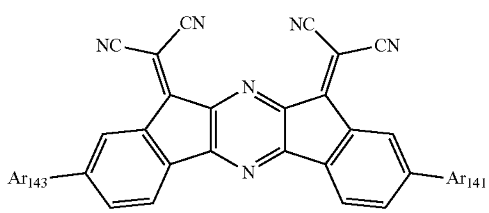

in the formulae (145) to (148):

$A_{r141}$, $Ar_{143}$ and $Ar_{144}$ are each independently an aromatic hydrocarbon group having 6 to 30 ring carbon atoms and having at least one substituent selected from the group consisting of a fluorine atom, a fluoroalkyl group, a fluoroalkoxy group and a cyano group, or a heterocyclic group having 5 to 30 ring atoms and having at least one substituent selected from a fluorine atom, a fluoroalkyl group, a fluoroalkoxy group and a cyano group.

[9] In the mixture according to any one of [1] to [8], the first compound is a compound represented by a formula (1451), (1451)

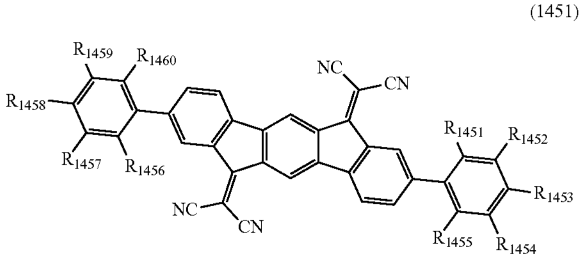

in the formula (1451):

$R_{1451}$ to $R_{1460}$ are each independently a hydrogen atom, a fluorine atom, a fluoroalkyl group, a fluoroalkoxy group, or a cyano group; and at least one of $R_{1451}$ to $R_{1460}$ is a fluorine atom, a fluoroalkyl group, a fluoroalkoxy group, or a cyano group.

[10] In the mixture according to any one of [1] to [8], the first compound is a compound represented by a formula (1461), (1461)

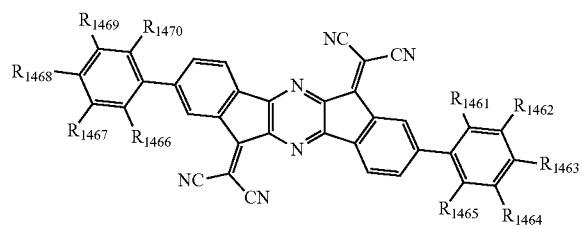

in the formula (1461):

$R_{1461}$ to $R_{1470}$ are each independently a hydrogen atom, a fluorine atom, a fluoroalkyl group, a fluoroalkoxy group, or a cyano group; and at least one of $R_{1461}$ to $R_{1470}$ is a fluorine atom, a fluoroalkyl group, a fluoroalkoxy group, or a cyano group.

[11] In the mixture according to any one of [1] to [7], the first compound is a compound represented by one of formulae (141) to (144) and (151), (141)

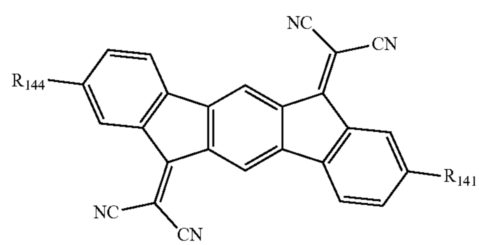

(142)

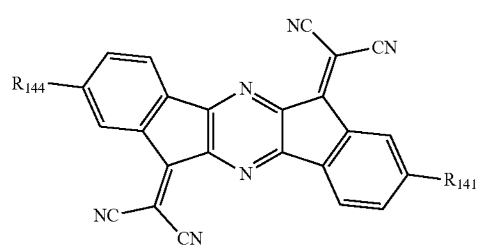

(143)

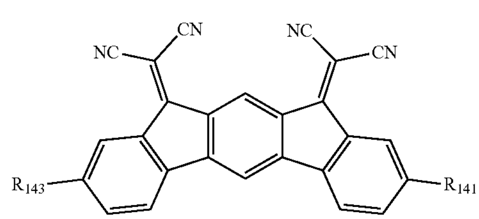

-continued (144)

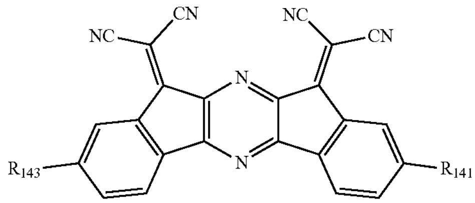

(151)

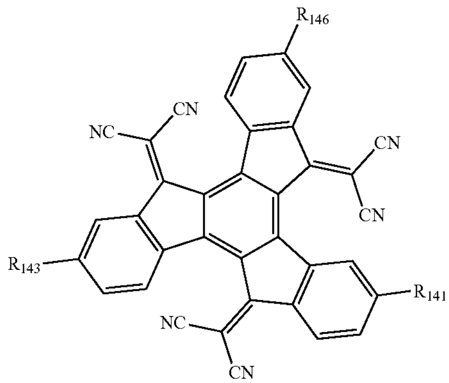

in the formulae (141) to (144) and (151):

$R_{141}$, $R_{143}$, $R_{144}$ and $R_{146}$ are each independently a fluorine atom, a fluoroalkyl group, a fluoroalkoxy group, or a cyano group.

[12] In the mixture according to [11], the first compound is a compound represented by the formula (143).

[13] In the mixture according to [2], the first compound is a compound represented by a formula (16) or (17), (16)

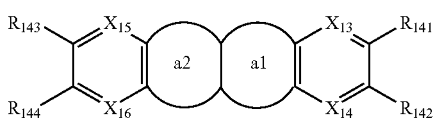

(17)

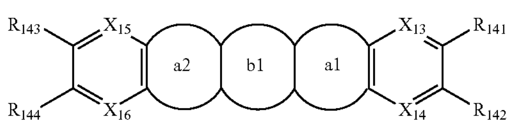

in the formulae (16) and (17):

$X_{13}$ to $X_{16}$ each independently represent the same as $X_{11}$ and $X_{12}$ of the formula (13);

$R_{141}$ to $R_{144}$ each independently represent the same as $R_{17}$ and $R_{18}$ of the formula (13);

a1 and a2 are each independently the cyclic structure represented by the formula (11); and b1 is a cyclic structure represented by a formula (171), (171)

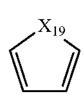

in the formula (171):

$X_{19}$ is a sulfur or an oxygen atom.

[14] In the mixture according to [13], at least one of $R_{141}$ to $R_{144}$ is a fluorine atom, a fluoroalkyl group, a fluoroalkoxy group, a cyano group, an aromatic hydrocarbon group having 6 to 30 ring carbon atoms and having at least one substituent selected from the group consisting of a fluorine atom, a fluoroalkyl group, a fluoroalkoxy group and a cyano group, or a heterocyclic group having 5 to 30 ring atoms and having at least one substituent selected from a fluorine atom, a fluoroalkyl group, a fluoroalkoxy group and a cyano group.

[15] In the mixture according to [13] or [14], the first cyclic structure represented by the formula (11) is 2 cyclic structure represented by a formula (11A), (11A)

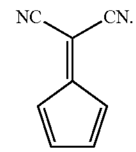

[16] In the mixture according to any one of [1] to [15], the second cyclic structure represented by the formula (12) is a cyclic structure represented by a formula (121) or (122), (121)

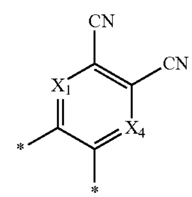

(122)

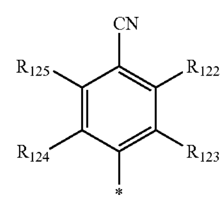

$X_1$ and $X_4$ in the formula (121) are each independently a nitrogen atom, or a carbon atom bonded to $R_{121}$, $R_{121}$ in the formula (121) and $R_{122}$ to $R_{125}$ in the formula (122) each independently represent the same $R_{15}$ in the formula (12), a plurality of $R_{121}$ are mutually the same or different, and

* in the formulae (121) and (122) each independently represent a bonding position to another atom in a molecule of the first compound.

[17] In the mixture according to [16], the first compound is a compound represented by a formula (121A), (121A)

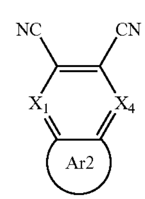

in the formula (121A):

Ar2 is a substituted or unsubstituted aromatic hydrocarbon ring having 6 to 50 ring carbon atoms or a substituted or unsubstituted heterocycle having 5 to 50 ring atoms;

$X_1$ and $X_4$ are each independently a nitrogen atom, or a carbon atom bonded to $R_{121}$;

$R_{121}$ each independently represents the same as $R_{15}$ in the formula (12); and a plurality of $R_{121}$ are mutually the same or different.

[18] In the mixture according to [17], the first compound is a compound represented by a formula (121B), (121B)

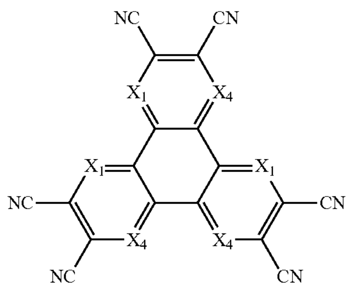

in the formula (121B):

$X_1$ and $X_4$ are each independently a nitrogen atom or a carbon atom bonded to $R_{121}$;

a plurality of $X_1$ are mutually the same or different;

a plurality of $X_4$ are mutually the same or different;

$R_{121}$ each independently represent the same as $R_{15}$ in the formula (12); and a plurality of $R_{121}$ are mutually the same or different.

[19] In the mixture according to any one of [1] to [15], the first compound includes the second cyclic structure represented by the formula (12) as a group represented by a formula (122B),

[Formula 20]

(122B)

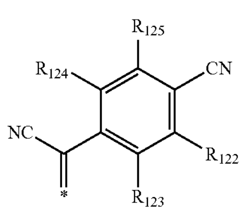

in the formula (122B):

$R_{122}$ to $R_{125}$ each independently represent the same as $R_{15}$ in the formula (12); and

* represents a bonding position to another atom in the molecule of the first compound.

[20] In the mixture according to [19], the first compound is a compound represented by a formula (122C), (122C)

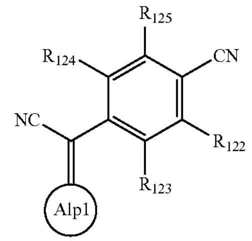

in the formula (122C):

$R_{122}$ to $R_{125}$ each independently represent the same as $R_{15}$ in the formula (12); and Alp1 is a substituted or unsubstituted aliphatic ring having 3 to 6 ring carbon atoms.

[21] In the mixture according to any one of [1] to [15], the first compound is a compound represented by a formula (122E), (122E)

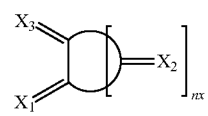

in the formula (122E):

nx is 1, 2, 3 or 4; and structures represented by $=X_1$, $=X_2$ and $=X_3$ are each independently represented by a formula (E1), formula (E2), formula (E3) or formula (E4), (E1)

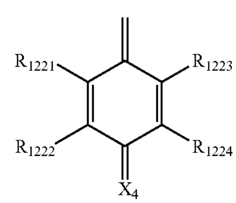

(E2)

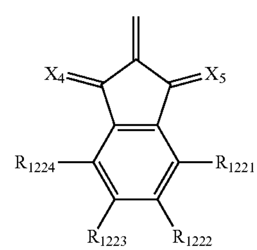

(E3)

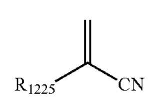

(E4)

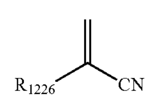

in the formulae (E1), (E2), (E3) and (E4):

$X_4$ and $X_5$ are each independently selected from oxo and dicyanomethylidene;

$R_{1225}$ is a substituted or unsubstituted aryl group having 6 to 50 ring carbon atoms;

$R_{1226}$ is a substituted or unsubstituted heterocyclic group having 5 to 50 ring atoms;

$R_{1221}$ to $R_{1224}$ are each independently a hydrogen atom, a halogen atom, a cyano group, a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

[22] In the mixture according to [20] or [21], the first compound is a compound represented by a formula (122D), (122D)

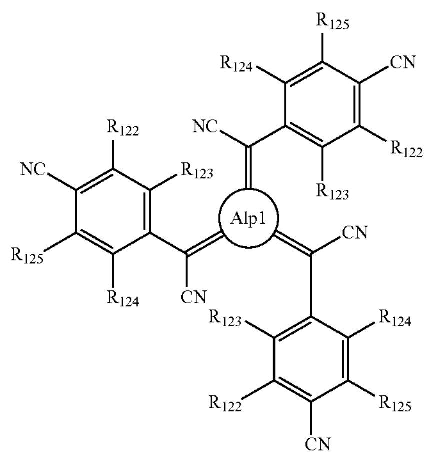

in the formula (122D):

$R_{122}$ to $R_{125}$ each independently represent the same as $R_{15}$ in the formula (12);

a plurality of $R_{122}$ are mutually the same or different;

a plurality of $R_{123}$ are mutually the same or different;

a plurality of $R_{124}$ are mutually the same or different;

a plurality of $R_{125}$ are mutually the same or different; and

Alp1 is a substituted or unsubstituted aliphatic ring having 3 to 6 ring carbon atoms.

[23] In the mixture according to any one of [1] to [22], at least one of $A_1$, $B_1$ and $C_1$ is a group selected from the group consisting of groups represented by formulae (21a), (21b), (21c) and (21d), and at least one of $A_2$, $B_2$, $C_2$ and $D_2$ is a group selected from the group consisting of the groups represented by the formulae (21a), (21b), (21c) and (21d), (21a)

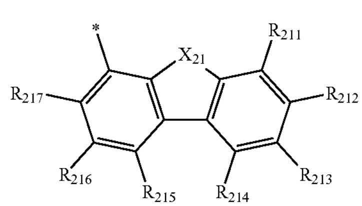

(21b)

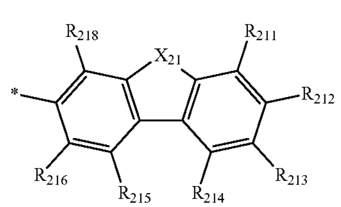

-continued (21c)

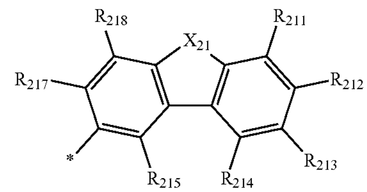

(21d)

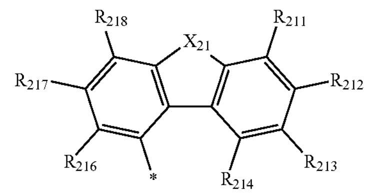

in the formulae (21a), (21b), (21c) and (21d):

$X_{21}$ is $NR_{21}$, $CR_{22}R_{23}$, an oxygen atom or a sulfur atom;

when a plurality of $X_{21}$ are present, the plurality of $X_{21}$ are mutually the same or different;

when $X_{21}$ is $CR_{22}R_{23}$, a combination of $R_{22}$ and $R_{23}$ is mutually bonded to form a substituted or unsubstituted monocyclic ring, mutually bonded to form a substituted or unsubstituted fused ring, or not mutually bonded;

$R_{21}$, and $R_{22}$ and $R_{23}$ not forming the monocyclic ring and not forming the fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a substituted or unsubstituted aryl group having 6 to 50 ring carbon atoms, or a substituted or unsubstituted heterocyclic group having 5 to 50 ring atoms;

at least one combination of adjacent two or more of $R_{211}$ to $R_{218}$ are mutually bonded to form a substituted or unsubstituted monocyclic ring, mutually bonded to form a substituted or unsubstituted fused ring, or not mutually bonded; and $R_{211}$ to $R_{218}$ not forming the monocyclic ring and not forming the fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a substituted or unsubstituted aryl group having 6 to 50 ring carbon atoms, or a substituted or unsubstituted heterocyclic group having 5 to 50 ring atoms; and

* in the formulae (21a), (21b), (21c) and (21d) is each independently a bonding position to $L_{A1}$, $L_{B1}$, $L_{C1}$, $L_{A2}$, $L_{B2}$, $L_{C2}$, $L_{D2}$ or $L_{E2}$.

[24] In the mixture according to [23], a combination of adjacent two or more of $R_{211}$ to $R_{218}$ are not mutually bonded, and $R_{211}$ to $R_{218}$ are each independently a hydrogen atom, a substituted or unsubstituted alkyl group having 1 to 30 carbon atoms, a substituted or unsubstituted cycloalkyl group having 3 to 30 ring carbon atoms, a substituted or unsubstituted aryl group having 6 to 30 ring carbon atoms, or a substituted or unsubstituted heterocyclic group having 5 to 30 ring atoms.

[25] In the mixture according to [23] or [24], $R_{211}$ to $R_{215}$ are hydrogen atoms.

[26] In the mixture according to any one [1] to [25], the second compound is a compound represented by a formula (211), (211)

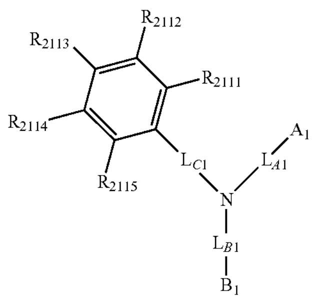

in the formula (211):

$L_{A1}$, $L_{B1}$ and $L_{C1}$ are each independently a single bond, a substituted or unsubstituted arylene group having 6 to 50 ring carbon atoms, or a substituted or unsubstituted divalent heterocyclic group having 5 to 50 ring atoms;

$A_1$ and $B_1$ are each independently a substituted or unsubstituted aryl group having 6 to 50 ring carbon atoms, a substituted or unsubstituted heterocyclic group having 5 to 50 ring atoms, or —Si($R_{901}$)($R'_{902}$)($R'_{903}$), $R'_{901}$, $R'_{902}$ and $R'_{903}$ represent the same as $R'_{901}$, $R'_{902}$ and $R'_{903}$ in the formula (21);

at least one combination of adjacent two or more of $R_{2111}$ to $R_{2115}$ are mutually bonded to form a substituted or unsubstituted monocyclic ring, mutually bonded to form a substituted or unsubstituted fused ring; or not mutually bonded; and $R_{2111}$ to $R_{2115}$ not forming the monocyclic ring and not forming the fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —N($R_{906}$)($R_{907}$), a substituted or unsubstituted aryl group having 6 to 50 ring carbon atoms, or a substituted or unsubstituted heterocyclic group having 5 to 50 ring atoms.

[27] In the mixture according to any one of [1] to [26], $A_1$ and $B_1$ are each independently a group selected from the group consisting of the groups represented by the formulae (21a), (21b), (21c) and (21d).

[28] In the mixture according to any one of [1] to [27], $L_{A1}$, $L_{B1}$ and $L_{C1}$ are each independently a single bond, a substituted or unsubstituted arylene group having 6 to 30 ring carbon atoms, or a substituted or unsubstituted divalent heterocyclic group having 5 to 30 ring atoms.

[29] In the mixture according to any one of [1] to [25], a first amino group represented by a formula (22A) and a second amino represented by a formula (22B) in the formula (22) are mutually different groups, (22A)

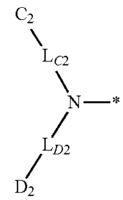

(22B)

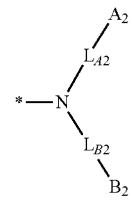

in the formulae (22A) and (22B), $L_{A2}$, $L_{B2}$, $L_{C2}$ and $L_{D2}$ each independently represent the same as $L_{A2}$, $L_{B2}$, $L_{C2}$ and $L_{D2}$ in the formula (22);

$A_2$, $B_2$, $C_2$ and $D_2$ each independently represent the same as $A_2$, $B_2$, $C_2$ and $D_2$ in the formula (22); and

* each represents a bonding position to $L_{E2}$.

[30] In the mixture according to any one of [1] to [25], the second compound is a compound represented by a formula (221),

[Formula 28]

(221)

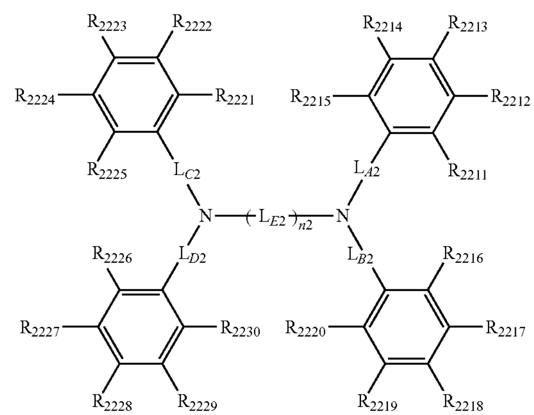

in the formula (221):

$L_{A2}$, $L_{B2}$, $L_{C2}$ and $L_{D2}$ each independently represent the same as $L_{A2}$, $L_{B2}$, $L_{C2}$ and $L_{D2}$ in the formula (22);

$L_{E2}$ represents the same as $L_{E2}$ in the formula (22);

n2 is 1, 2, 3 or 4;

at least one combination of adjacent two or more of $R_{2211}$ to $R_{2230}$ is mutually bonded to form a substituted or unsubstituted monocyclic ring, mutually bonded to form a substituted or unsubstituted fused ring, or not mutually bonded;

$R_{2211}$ to $R_{2230}$ not forming the monocyclic ring and not forming the fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —N($R_{906}$)($R_{907}$), a substituted or unsubstituted aryl group having 6 to 50 ring carbon atoms, or a substituted or unsubstituted heterocyclic group having 5 to 50 ring atoms.

[31] In the mixture according to [30], $L_{A2}$, $L_{B2}$, $L_{C2}$ and $L_{D2}$ are each independently a single bond, a substituted or unsubstituted arylene group having 6 to 30 ring carbon atoms, or a substituted or unsubstituted divalent heterocyclic group having 5 to 30 ring atoms; and $L_{E2}$ is a substituted or unsubstituted arylene group having 6 to 30 ring carbon atoms, or a substituted or unsubstituted divalent heterocyclic group having 5 to 30 ring atoms.

[32] In the mixture according to [30] or [31], a combination of adjacent two or more of $R_{2211}$ to $R_{2230}$ are not mutually bonded, and $R_{2211}$ to $R_{2230}$ are each independently a hydrogen atom, a substituted or unsubstituted alkyl group having 1 to 30 carbon atoms, a substituted or unsubstituted cycloalkyl group having 3 to 30 ring carbon atoms, a substituted or unsubstituted aryl group having 6 to 30 ring carbon atoms, or a substituted or unsubstituted heterocyclic group having 5 to 30 ring atoms.

[33] In the mixture according to any one of [30] to [32], $R_{2211}$ to $R_{2230}$ are hydrogen atoms.

[34] In the mixture according to any one of [30] to [33], a first amino group represented by a formula (221A) and a second amino represented by a formula (221B) in the formula (221) are mutually different groups, (221A)

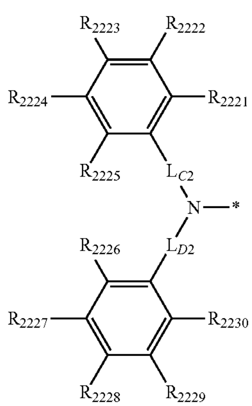

(221B)

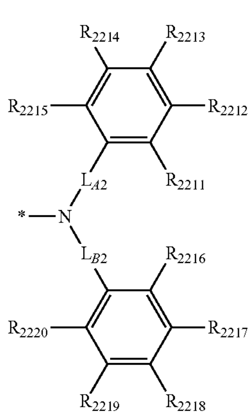

in the formula (221A) and (221B):

$R_{2211}$ to $R_{2230}$ each independently represent the same as $R_{2211}$ to $R_{2230}$ in the formula (221);

$L_{A2}$, $L_{B2}$, $L_{C2}$ and $L_{D2}$ each independently represent the same as $L_{A2}$, $L_{B2}$, $L_{C2}$ and $L_{D2}$ in the formula (22); and

* each represents a bonding position to $L_{E2}$.

[35] In the mixture according to any one of [1] to [34], the second compound includes at least one substituted or unsubstituted biphenyl group in a molecule.

[36] In the mixture according to any one of [1] to [35], the mixture does not include a compound represented by a formula (2210) and a compound represented by a formula (2211), (2210)

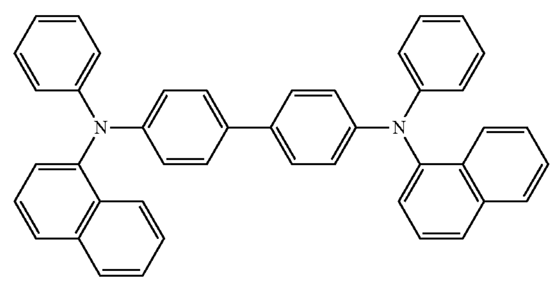

(2211)

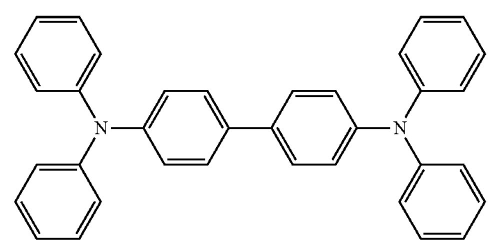

[37] In the mixture according to any one of [1] to [36], a total mass $M_T$ of the first compound and the second compound and a mass $M_2$ of the second compound in the mixture satisfy Numerical Formula 1A, $$0.1 \leq (M_2/M_T) \times 100 \leq 20.0 \quad \text{(Numerical Formula 1A).}$$

[38] In the mixture according to any one of [1] to [37], the total mass $M_T$ of the first compound and the second compound and the mass $M_2$ of the second compound in the mixture satisfy Numerical Formula 1B, $$0.1 \leq (M_2/M_T) \times 100 \leq 10.0 \quad \text{(Numerical Formula 1B).}$$

[39] An organic electroluminescence device includes:

an anode;

a cathode;

an organic layer containing a first compound and a second compound, in which the first compound has at least one of a first cyclic structure represented by a formula (11) or a second cyclic structure represented by a formula (12), the second compound is a compound represented by a formula (21) or a compound represented by a formula (22), a total mass $W_T$ of the first compound and the second compound and a mass $W_2$ of the second compound in the organic layer satisfy Numerical Formula 2.

(Numerical Formula 2)

$$0.1 \leq (W_2/W_T) \times 100$$

(11)

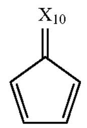

(12)

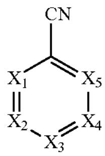

in the formula (11):

the first cyclic structure represented by the formula (11) is fused to at least one cyclic structure of a substituted or unsubstituted aromatic hydrocarbon ring having 6 to 50 ring carbon atoms or a substituted or unsubstituted heterocycle having 5 to 50 ring atoms in a molecule of the first compound, and a structure represented by $=X_{10}$ is represented by a formula (11a), (11b), (11c), (11d), (11e), (11f), (11g), (11h), (11i), (11j), (11k) or (11m), (11a)

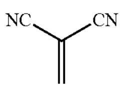

(11b)

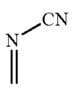

(11c)

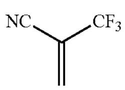

(11d)

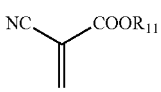

(11e)

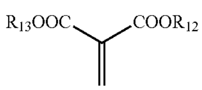

(11f)

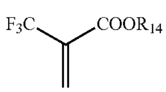

(11g)

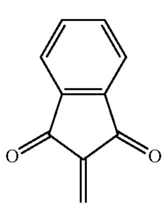

(11h)

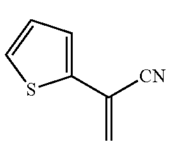

-continued (11i)

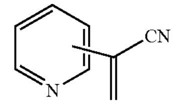

(11j)

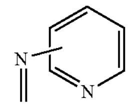

(11k)

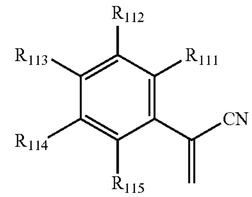

(11m)

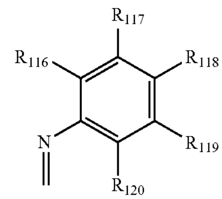

in the formula (11a), (11b), (11c), (11d), (11e), (11f), (11g), (11h), (11i), (11j), (11k) or (11m):

$R_{11}$ to $R_{14}$ and $R_{111}$ to $R_{120}$ are each independently a hydrogen atom, a halogen atom, hydroxy group, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aryl group having 6 to 50 ring carbon atoms, or a substituted or unsubstituted heterocyclic group having 5 to 50 ring atoms; in the formula (12):

$X_1$ to $X_5$ are each independently a nitrogen atom, a carbon atom to be bonded to $R_{15}$, or a carbon atom to be bonded to another atom in the molecule of the first compound;

at least one of $X_1$ to $X_5$ is a carbon atom to be bonded to another atom in the molecule of the first compound;

$R_{15}$ is selected from the group consisting of a hydrogen atom, a halogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a substituted or unsubstituted aryl group having 6 to 50 ring carbon atoms, a substituted or unsubstituted heterocyclic group having 5 to 50 ring atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted alkenyl group having 2 to 50 carbon atoms, a substituted or unsubstituted aralkyl group having 7 to 50 carbon atoms, a carboxy group, a substituted or unsubstituted ester group, a substituted or unsubstituted carbamoyl group, a nitro group, and a substituted or unsubstituted siloxanyl group; and when a plurality of $R_{15}$ are present, the plurality of $R_{15}$ are mutually the same or different;

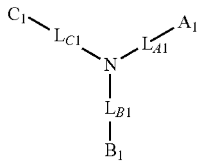
(21)

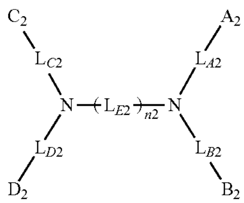
(22)

in the formulae (21) and (22):

$L_{A1}$, $L_{B1}$, $L_{C1}$, $L_{A2}$, $L_{B2}$, $L_{C2}$ and $L_{D2}$ are each independently a single bond, a substituted or unsubstituted arylene group having 6 to 50 ring carbon atoms, or a substituted or unsubstituted divalent heterocyclic group having 5 to 50 ring atoms;

n2 is 1, 2, 3 or 4;

when n2 is 1, $L_{E2}$ is a substituted or unsubstituted arylene group having 6 to 50 ring carbon atoms, or a substituted or unsubstituted divalent heterocyclic group having 5 to 50 ring atoms;

when n2 is 2, 3 or 4, a plurality of $L_{E2}$ are mutually the same or different;

when n2 is 2, 3 or 4, the plurality of $L_{E2}$ are mutually bonded to form a substituted or unsubstituted monocyclic ring, mutually bonded to form a substituted or unsubstituted fused ring, or not mutually bonded;

$L_{E2}$ forming neither the monocyclic ring nor the fused ring is a substituted or unsubstituted arylene group having 6 to 50 ring carbon atoms, or a substituted or unsubstituted divalent heterocyclic group having 5 to 50 ring atoms;

$A_1$, $B_1$, $C_1$, $A_2$, $B_2$, $C_2$ and $D_2$ are each independently a substituted or unsubstituted aryl group having 6 to 50 ring carbon atoms, a substituted or unsubstituted heterocyclic group having 5 to 50 ring atoms, or —Si($R'_{901}$)($R'_{902}$)($R_{903}$);

$R'_{901}$, $R'_{902}$ and $R'_{903}$ are each independently a substituted or unsubstituted aryl group having 6 to 50 ring carbon atoms;

when a plurality of $R'_{901}$ are present, the plurality of $R'_{901}$ are mutually the same or different;

when a plurality of $R'_{902}$ are present, the plurality of $R'_{902}$ are mutually the same or different;

when a plurality of $R'_{903}$ are present, the plurality of $R'_{903}$ are mutually the same or different;

in the first compound and the second compound, $R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

[40] In the organic electroluminescence device according to [39], the organic layer includes: a first organic layer containing the first compound and the second compound; and an emitting layer, the emitting layer is provided between the first organic layer and the cathode, and the emitting layer is not provided between the first organic layer and the anode.

[41] In the organic electroluminescence device according to [40], the organic layer includes at least one of a hole injecting layer or a hole transporting layer provided between the anode and the emitting layer, and the at least one of the hole injecting layer or the hole transporting layer contains the first compound and the second compound.

[42] In the organic electroluminescence device according to any one of [39] to [41], the first compound is a compound represented by a formula (141) or a formula (1451), and the second compound is a compound represented by the formula (22), (141)

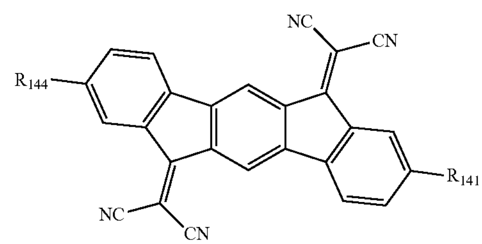

(1451)

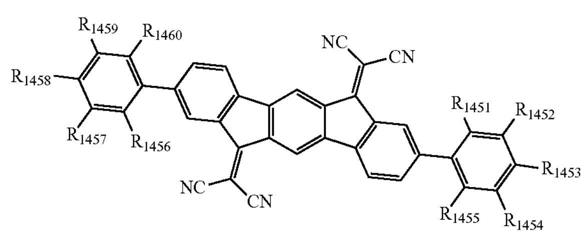

in the formula (141): $R_{141}$ and $R_{144}$ are each independently a fluorine atom, a fluoroalkyl group, a fluoroalkoxy group, or a cyano group, in the formula (1451):

$R_{1451}$ to $R_{1460}$ are each independently a hydrogen atom, a fluorine atom, a fluoroalkyl group, a fluoroalkoxy group, or a cyano group; and at least one of $R_{1451}$ to $R_{1460}$ is a fluorine atom, a fluoroalkyl group, a fluoroalkoxy group, or a cyano group.

[43] In the organic electroluminescence device according to any one of [39] to [42], a total mass $W_T$ of the first compound and the second compound and a mass $W_2$ of the second compound in the organic layer satisfy a relationship represented by Numerical Formula 2A, $$0.1 \leq (W_2/W_T) \times 100 \leq 20.0 \quad \text{(Numerical Formula 2A).}$$

[44] In the organic electroluminescence device according to any one of [39] to [43], the total mass $W_T$ of the first compound and the second compound and the mass $W_2$ of the second compound in the organic layer satisfy a relationship represented by Numerical Formula 2B, $$0.1 \leq (W_2/W_T) \times 100 \leq 10.0 \quad \text{(Numerical Formula 2B).}$$

[45] An electronic device includes the organic electroluminescence device according to any one of [39] to [44].

Modification of Embodiment(s)

It should be noted that the invention is not limited to the above exemplary embodiments but may include any modification and improvement as long as such modification and improvement are compatible with the invention.

For instance, the mixture of the above exemplary embodiment may contain a third compound in addition to the first compound and the second compound.

For instance, the emitting layer is not limited to a single layer, but may be provided by laminating a plurality of emitting layers. When the organic EL device has a plurality of organic layers, it is only required to satisfy the conditions described in the second exemplary embodiment while at least one of the organic layers contains the first compound and the second compound.

When the organic EL device includes the plurality of emitting layers, in some embodiments, the plurality of emitting layers are adjacent to each other, or provide a so-called tandem-type organic EL device in which a plurality of emitting units are layered through an intermediate layer.

For instance, in some embodiments, a blocking layer is provided adjacent to at least one side of a side near the anode and a side near the cathode of the emitting layer. The blocking layer is preferably provided in contact with the emitting layer to at least block holes, electrons or excitons.

For instance, when the blocking layer is provided in contact with the cathode-side of the emitting layer, the blocking layer permits transport of electrons, but blocks holes from reaching a layer provided near the cathode (e.g., the electron transporting layer) beyond the blocking layer. When the organic EL device includes the electron transporting layer, the organic EL device preferably includes the blocking layer between the emitting layer and the electron transporting layer.

When the blocking layer is provided in contact with the anode-side of the emitting layer, the blocking layer permits transport of holes, but blocks electrons from reaching a layer provided near the anode (e.g., the hole transporting layer) beyond the blocking layer. When the organic EL device includes the hole transporting layer, the organic EL device preferably includes the blocking layer between the emitting layer and the hole transporting layer.

Moreover, for instance, in some embodiments, the blocking layer abuts on the emitting layer so that excited energy does not leak out from the emitting layer toward neighboring layer(s). The blocking layer blocks excitons generated in the emitting layer from transferring to a layer(s) (e.g., the electron transporting layer and the hole transporting layer) closer to the electrode(s) beyond the blocking layer.

The emitting layer and the blocking layer are preferably bonded with each other.

Specific structure and shape of the components in the present invention may be designed in any manner as long as the object of the present invention can be achieved.

EXAMPLES

Example(s) of the invention will be described below. However, the invention is not limited to Example(s).

Compounds

A structure of the first compound used in Examples 1 to 39 will be described.

[Formula 199]

HI-1

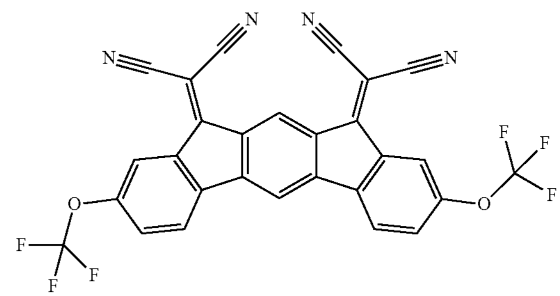

HI-2

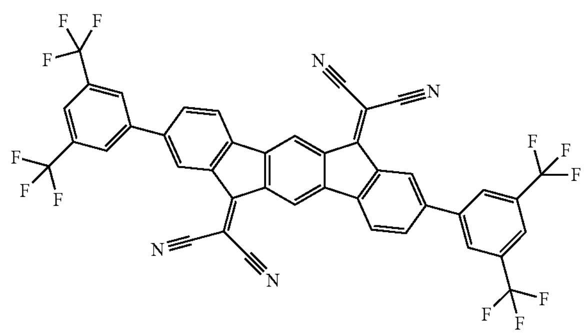

[Formula 200]

HI-3

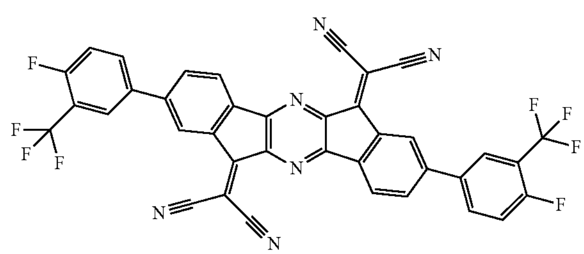

HI-4

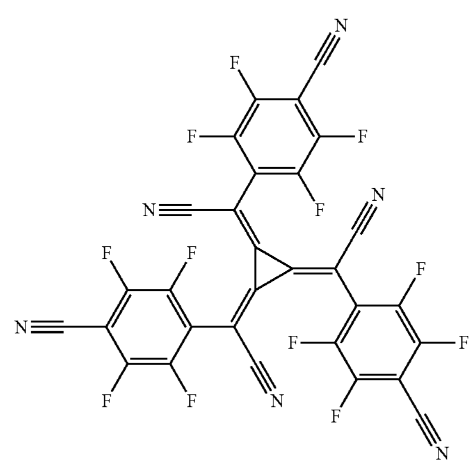

A structure of the second compound used in Examples 1 to 39 will be described.
[Formula 201]
HT-1
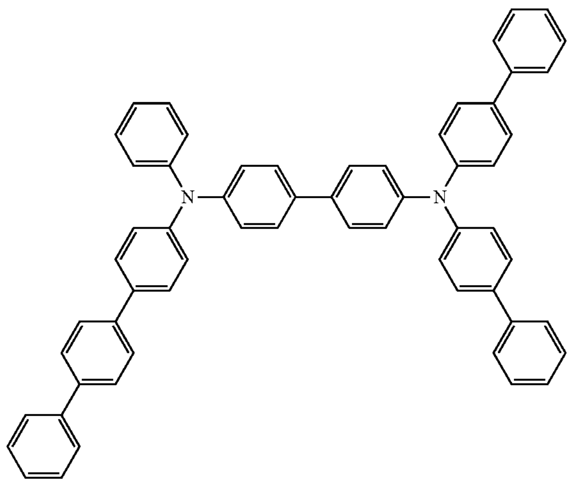
HT-2
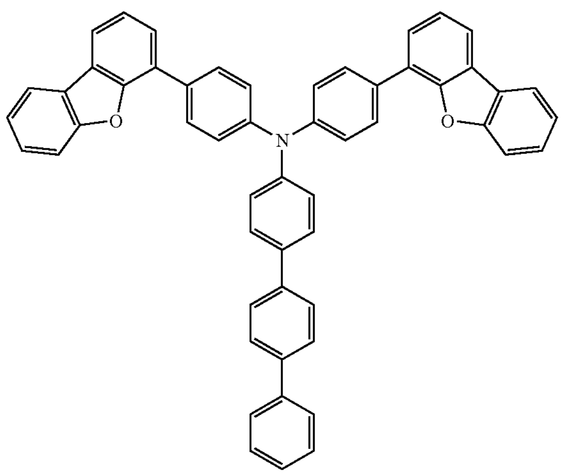
HT-3
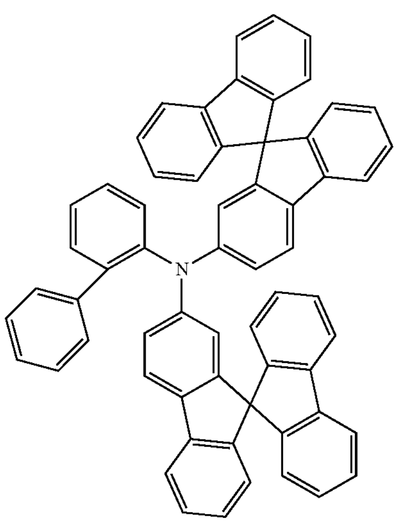
-continued
[Formula 202]
HT-4
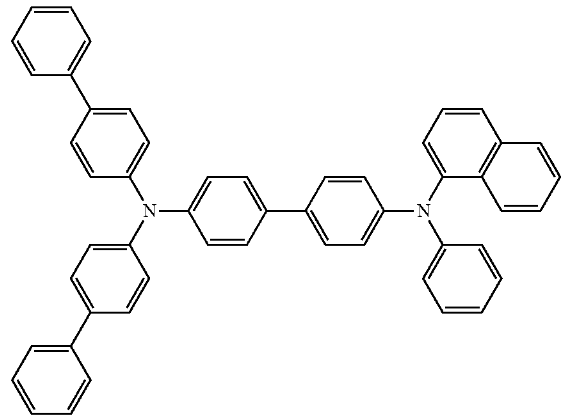
HT-5
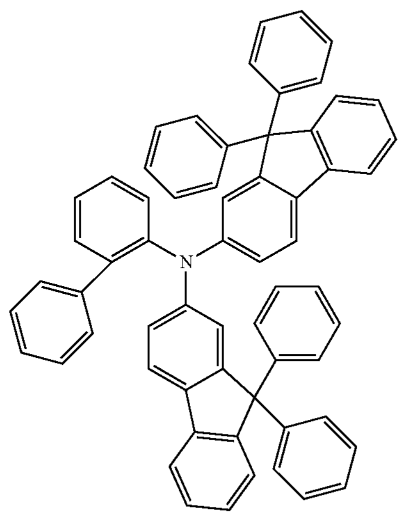
[Formula 203]
HT-7
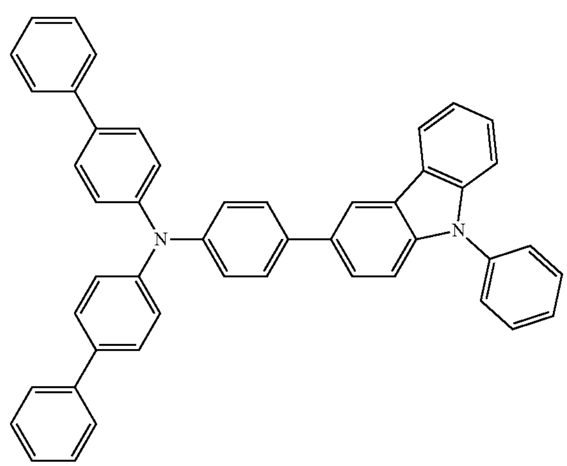

-continued
HT-8
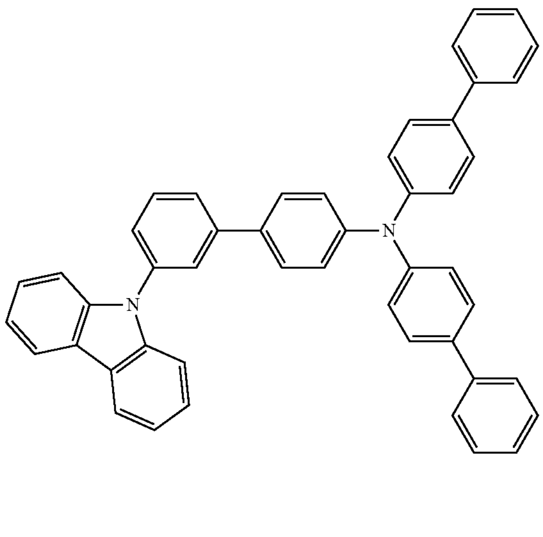
HT-9
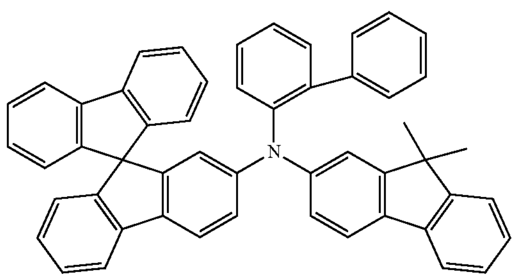
HT-10
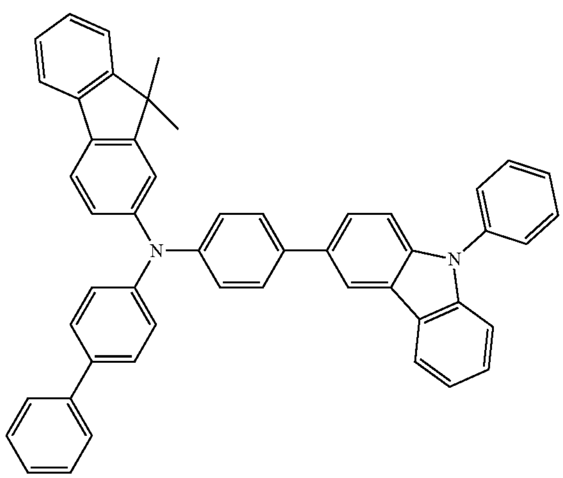
A structure of other compounds used for manufacturing organic EL devices in Examples and Comparatives will be described below.
[Formula 204]
HT-2
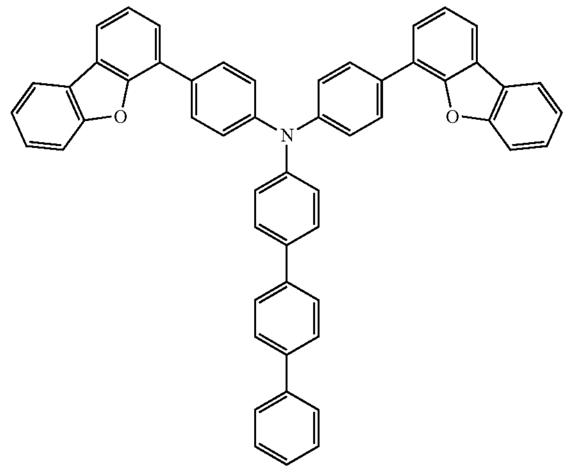
HT-6
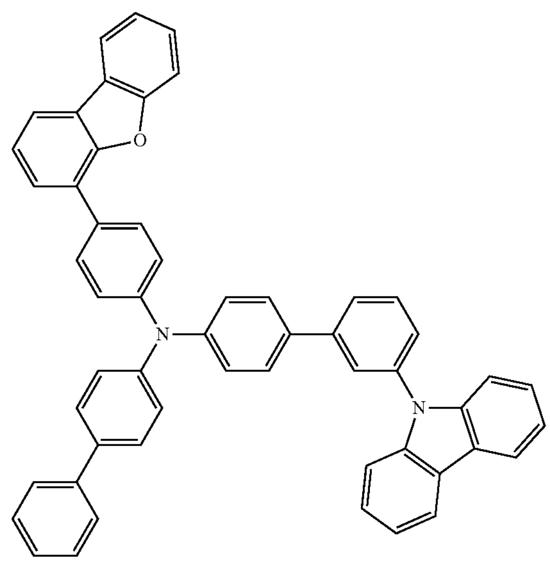
[Formula 205]
BH
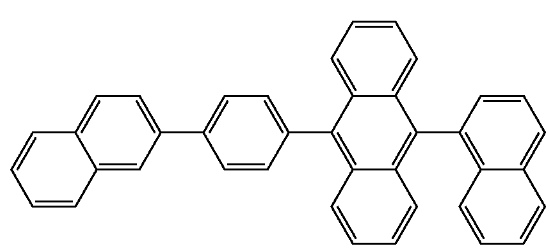

-continued

BD

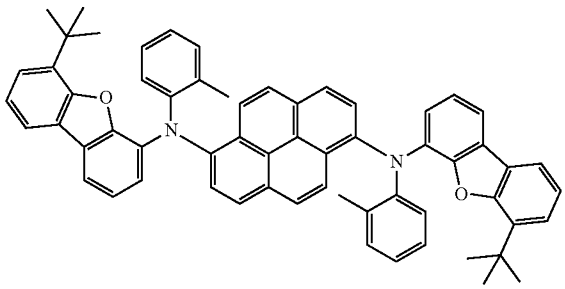

BH-2

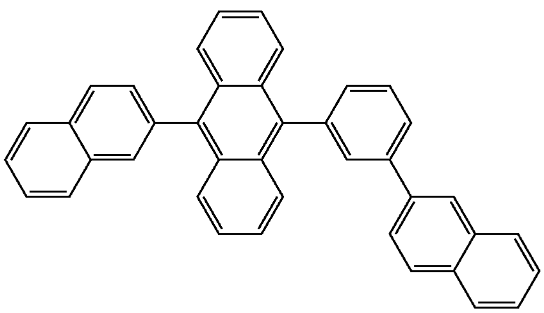

BD-2

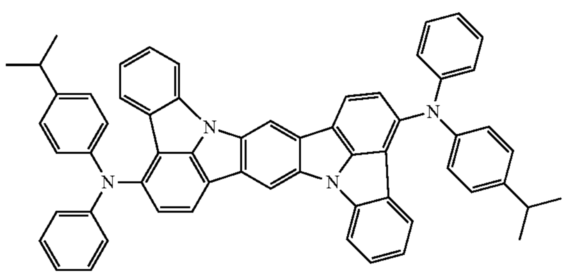

[Formula 206]

ET-1

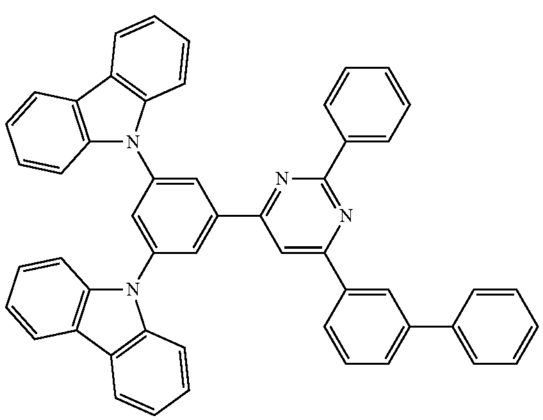

ET-2

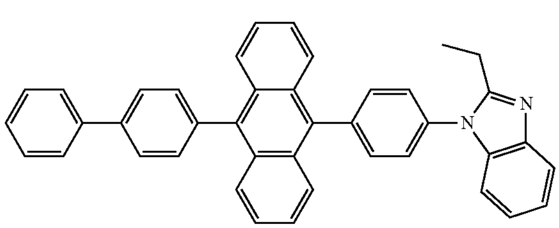

-continued

[Formula 207]

ET-3

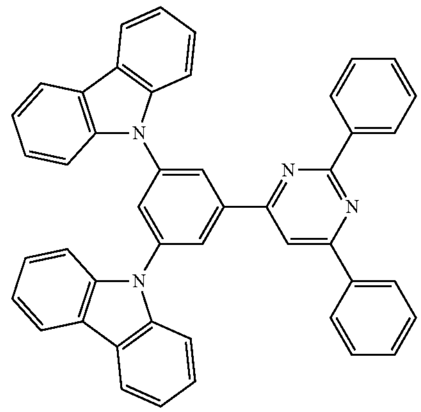

ET-4

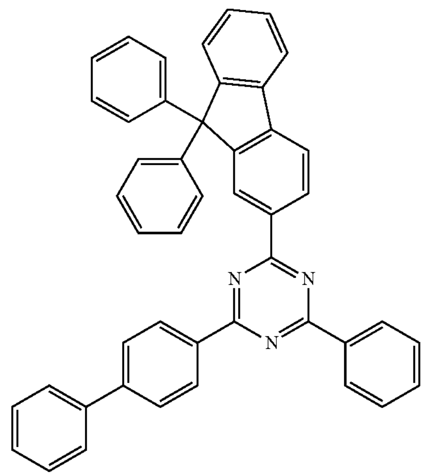

ET-5

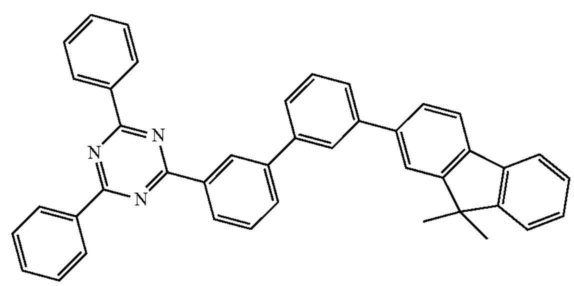

<Film Formation of Organic Layer and Cross-Sectional SEM Observation 1>

Example 1

Single Film Formation of Material

A mixture according Example 1 was used for forming an organic layer as follows.

A glass substrate whose surface was UV-cleaned was prepared as a base material.

200 mg of the mixture containing a compound HI-1 (first compound) and a compound HT-1 (second compound) was put into a crucible. In the mixture of Example 1, a mass $M_2$ of the second compound was 2 mg and a mass $M_1$ of the first compound was 198 mg, resulting in $(M_2/M_T)\times100=1$ which satisfies Numerical Formula 1.

The mixture in Example 1 was formed into a film on a to-be-cleaned surface of the base material using a vacuum deposition apparatus.

A cross section of the formed organic layer was observed using SEM.

Figure 2A:
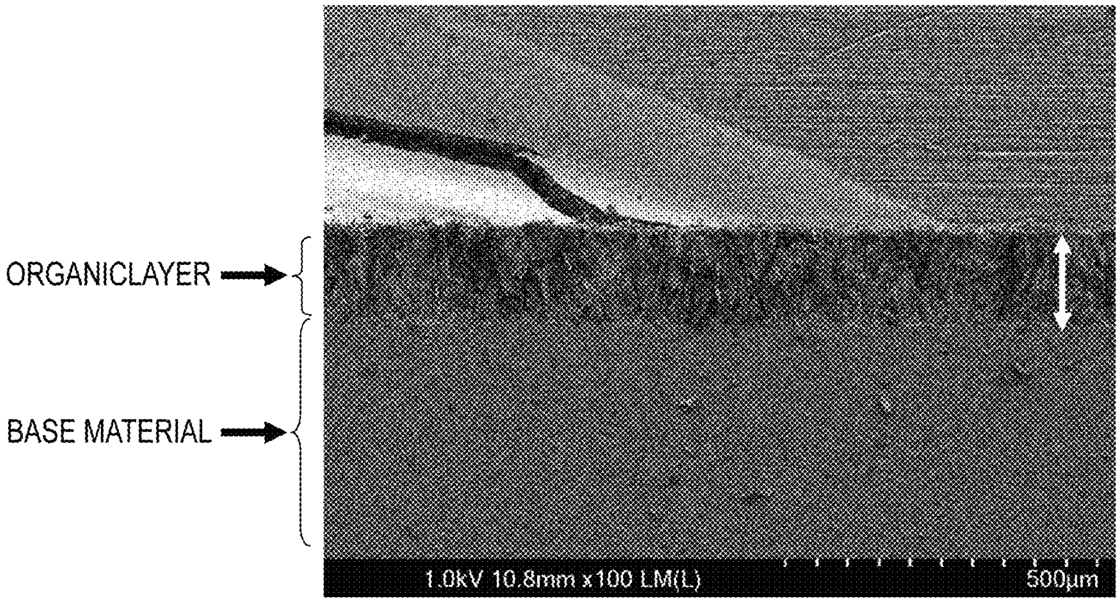
FIG. 2A shows a cross-sectional SEM image of an organic layer formed of a mixture of Example 1.

FIG. 2A shows a cross-sectional SEM image of the organic layer formed of the mixture of Example 1.

SEM Observation

The cross section of the above-manufactured organic layer was observed with Scanning Electron Microscope (SEM) (model No.: SU8220 manufactured by Hitachi High Technologies, accelerating voltage for observation: 1 kV).

Example 2

In Example 2, an organic layer was formed into a film with a vacuum deposition apparatus under the same film-formation conditions in the same manner as in Example 1 except for using a compound HT-2 in place of the compound HT-1 as the second compound in the mixture.

Figure 3A:
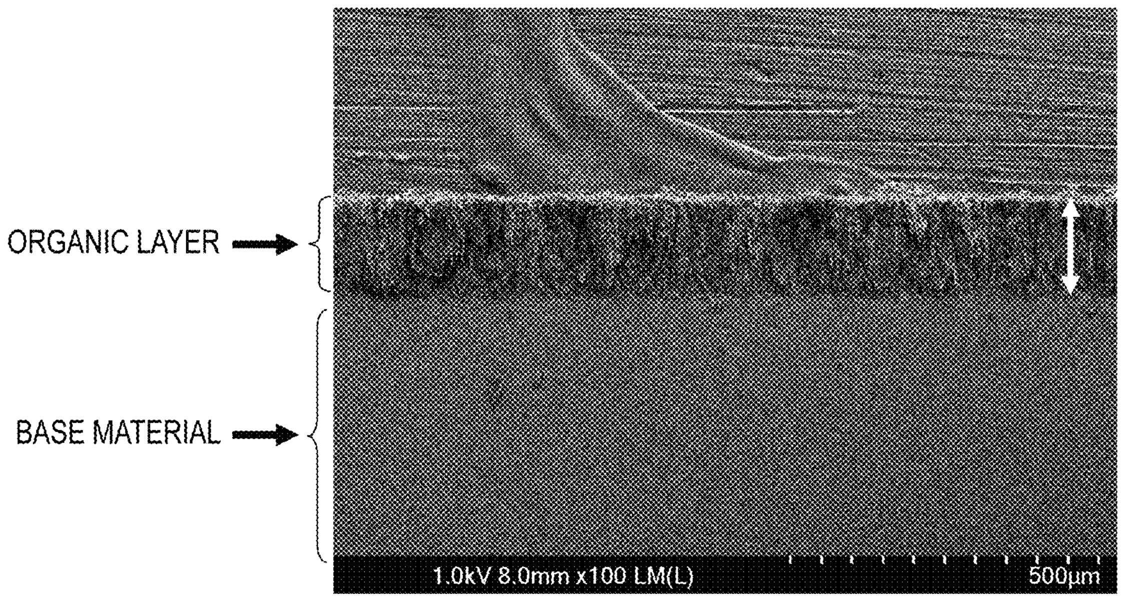
FIG. 3A shows a cross-sectional SEM image of an organic layer formed of a mixture of Example 2.

FIG. 3A shows a cross-sectional SEM image of the organic layer in Example 2.

Example 3

In Example 3, an organic layer was formed into a film with a vacuum deposition apparatus under the same film-formation conditions in the same manner as in Example 1 except for using a compound HT-3 in place of the compound HT-1 as the second compound in the mixture.

Figure 3B:
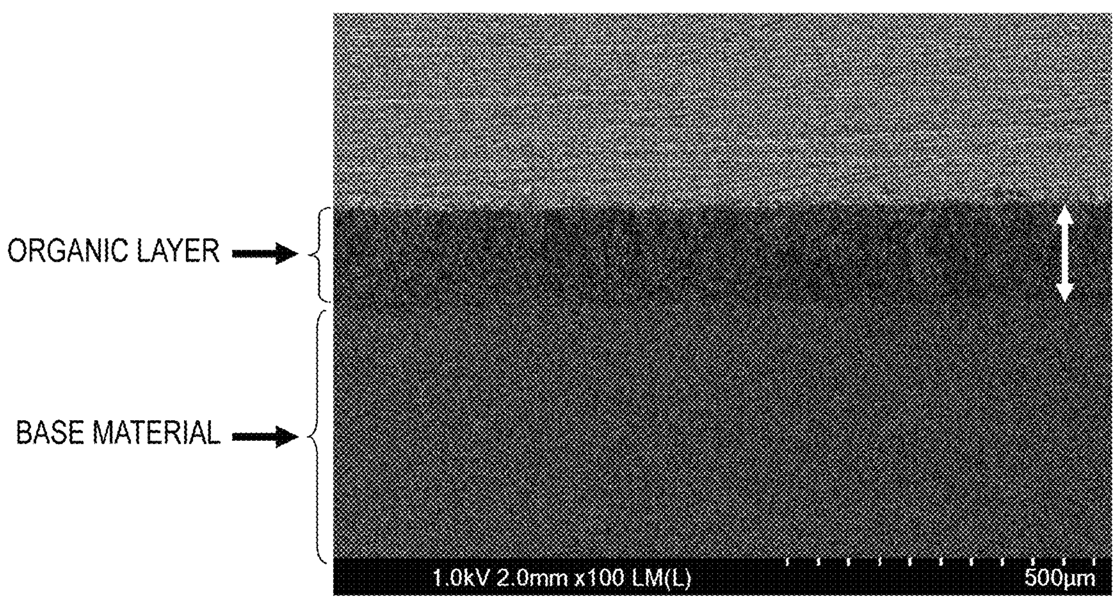
FIG. 3B shows a cross-sectional SEM image of an organic layer formed of a mixture of Example 3.

FIG. 3B shows a cross-sectional SEM image of the organic layer in Example 3.

Comparative 1

In Comparative 1, an organic layer was formed into a film with a vacuum deposition apparatus under the same film-formation conditions in the same manner as in Example 1 except that not a mixture but 200 mg of the compound HI-1 was solely put into a crucible as the first compound.

Figure 2B:
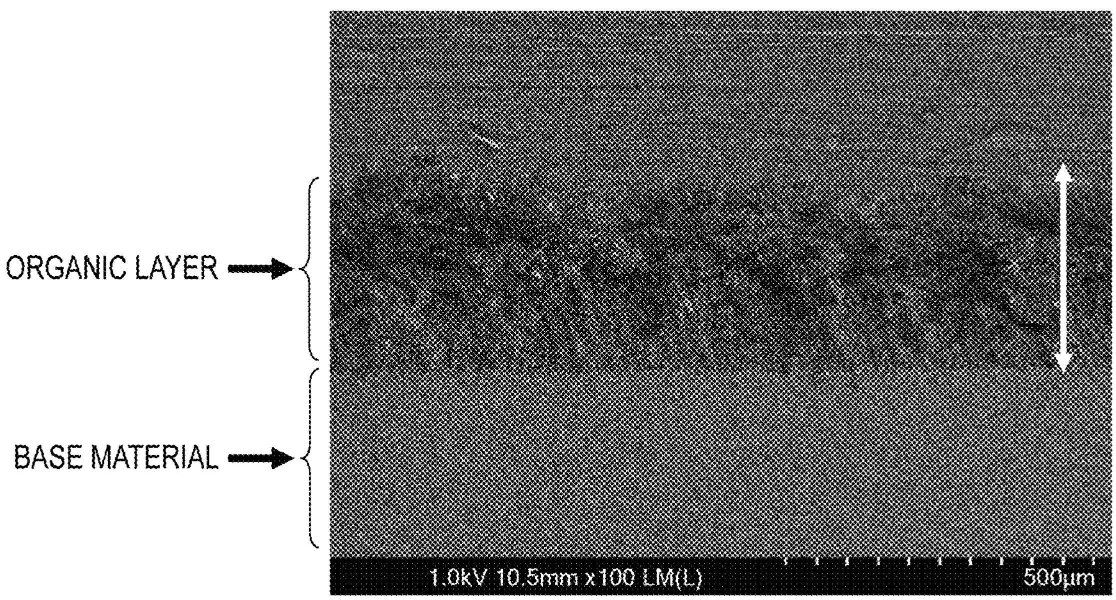
FIG. 2B shows a cross-sectional SEM image of an organic layer of Comparative 1.

FIG. 2B shows a cross-sectional SEM image of the organic layer in Comparative 1.

As a result of the film formation from a single material of the first compound, the organic layer of Comparative 1 exhibited a bulky crystal growth on the base material as shown in the cross-sectional SEM of FIG. 2B. In contrast to Comparative 1, it was found that, when a mixture prepared by mixing a slight amount (1 mass %) of the second compound (compound HT-1, HT-2 or HT-3) with the first compound (compound HI-1) was used to form a film, a dense and less bulky organic layer was formed as shown in the cross-sectional SEM image of FIGS. 2A, 3A and 3B.

<Manufacturing 1 of Organic Electroluminescence Device>

Organic Electroluminescence devices were prepared and evaluated as follows.

Example 4

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for one minute. A film of ITO was 65 nm thick.

The cleaned glass substrate having the transparent electrode line was attached to a substrate holder of a vacuum deposition apparatus. Initially, the compound HI-1 (first compound) and the compound HT-1 (second compound) in a form of a mixture, which contained the compounds HI-1 and HT-1 at a mass ratio of 95 mass %:5 mass %, were co-deposited on a surface provided with the transparent electrode line to cover the transparent electrode, thereby forming a 10-nm-thick hole injecting layer.

Next, the compound HT-1 was vapor-deposited on the hole injecting layer to form a 35-nm-thick hole transporting layer.

Next, the compound HT-2 was vapor-deposited on the hole transporting layer to form a 10-nm-thick electron blocking layer.

Thereafter, a compound BH and a compound BD were co-deposited on the electron blocking layer to form a 25-nm-thick emitting layer. The compound BH and the compound BD were respectively 96 mass % and 4 mass % in the emitting layer in concentration.

Next, a compound ET-1 was vapor-deposited on the emitting layer to form a 10-nm-thick hole blocking layer.

Next, a compound ET-2 was vapor-deposited on the hole blocking layer to form a 5-nm-thick electron transporting layer.

Lithium fluoride (LiF) was vapor-deposited on the electron transporting layer to form a 1-nm-thick electron injectable electrode (cathode).

Subsequently, metal aluminum (Al) was vapor-deposited on the electron injectable electrode to form an 80-nm-thick metal Al cathode.

A device arrangement of the organic EL device in Example 4 is roughly shown as follows.

ITO(65)/HI-1:HT-1(10, 95%:5%)/HT-1(35)/HT-2(10)/BH:BD(25, 96%:4%)/ET-1(10)/ET-2(5)/LiF(1)/Al(80)

The numerals in parentheses represent film thickness (unit: nm).

The numerals represented by percentage in the same parentheses (95%:5%) each indicate a ratio (mass %) between the compound HI-1 and the compound HT-1 in the hole injecting layer, and the numerals represented by percentage in the same parentheses (96%:4%) each indicate a ratio (mass %) between the compound BH and the compound BD. Similar notations apply to the description below.

Example 5

An organic EL device in Example 5 was manufactured in the same manner as in Example 4 except that the ratio between the first compound (compound HI-1) and the second compound (compound HT-1) in the mixture used for forming the hole injecting layer was changed to the ratio shown in Table 1.

Example 6

An organic EL device in Example 6 was manufactured in the same manner as in Example 4 except that the ratio between the first compound (compound HI-1) and the second compound (compound HT-1) in the mixture used for forming the hole injecting layer was changed to the ratio shown in Table 1.

Comparative 2

An organic EL device in Comparative 2 was manufactured in the same manner as in Example 4 except that not the mixture but the first compound (compound HI-1) was solely used for forming the hole injecting layer.

Evaluation of Organic EL Devices

The organic EL devices manufactured in Examples 4 to 6 and Comparative 2 were evaluated as follows. Evaluation results are shown in the Table 1.

Drive Voltage

The voltage (unit: V) when electric current was applied between the anode (ITO transparent electrode) and the cathode (metal Al cathode) such that the current density was 10 mA/cm$^2$ was measured.

External Quantum Efficiency EQE

Voltage was applied on the organic EL devices such that a current density was 10 mA/cm$^2$, where spectral radiance spectrum was measured by a spectroradiometer (CS-2000 manufactured by Konica Minolta, Inc.). The external quantum efficiency EQE (unit: %) was calculated based on the obtained spectral-radiance spectra, assuming that the spectra was provided under a Lambertian radiation.

Lifetime (LT95)

Voltage was applied using a spectroradiometer CS-200 (manufactured by Konica Minolta, Inc.) on the resultant devices such that a current density was 50 mA/cm$^2$, where a time (unit: hr)) elapsed before a luminance intensity was reduced to 95% of the initial luminance intensity was measured.

Herein, the time elapsed before the luminance intensity was reduced to 95% of the initial luminance intensity is occasionally referred to as "Lifetime (LT95)."

Blockage

Blockage was judged as follows from the measurement results of the single films formed on the glass substrate in <Film Formation of Organic Layer and Cross-sectional SEM Observation 1>.

A: A bulky thick film was observed in the SEM image.

B: A less bulky and densely thick film was observed in the SEM image.

TABLE 1

| | Hole Injecting Layer | | | | | | | |
|---|---|---|---|---|---|---|---|---|
| | First Compound | | Second Compound | | | | | |
| | Kind | Ratio [mass %] | Kind | Ratio [mass %] | Drive Voltage [V] | EQE [%] | LT95 [h] | Blockage |
| EX. 4 | HI-1 | 95 | HT-1 | 5 | 3.72 | 9.0 | 145 | A |
| EX. 5 | HI-1 | 90 | HT-1 | 10 | 3.69 | 9.4 | 143 | A |
| EX. 6 | HI-1 | 70 | HT-1 | 30 | 4.03 | 8.2 | 142 | A |
| COMP. 2 | HI-1 | 100 | — | — | 3.59 | 9.3 | 145 | B |

It has been found that the organic EL devices in Examples 4 to 6, in which the mixture obtained by adding the second compound to the first compound was used to form the hole injecting layer, exhibited performance that was not significantly lower than performance of the organic EL device in Comparative 2. The organic EL devices in Examples 4 and 5 exhibited the device performance equivalent to that in Comparative 2.

Based on the above examination results in Example 1, a formation of the organic layer through the dry film-forming using the mixture containing the first compound and the second compound according to the above exemplary embodiment can inhibit a formation of a bulky adhering film, so that an organic EL device can be manufactured without a decrease in a production efficiency and a significant decrease of a device performance.

<Film Formation of Organic Layer and Cross-Sectional SEM Observation 2>

Example 7

Single Film Formation of Material

A mixture according Example 7 was used for forming an organic layer as follows.

A glass substrate whose surface was UV-cleaned was prepared as a base material.

200 mg of the mixture according to Example 7 containing a compound HI-2 (first compound) and a compound HT-1 (second compound) was put into a crucible. In the mixture of Example 7, a mass $M_2$ of the second compound was 6 mg and a mass $M_1$ of the first compound was 194 mg, resulting in $(M_2/M_T)\times100=3$ which satisfies Numerical Formula 1.

The mixture in Example 7 was formed into a film on a to-be-cleaned surface of the base material using a vacuum deposition apparatus.

A cross section of the formed organic layer was observed using SEM.

Figure 4:
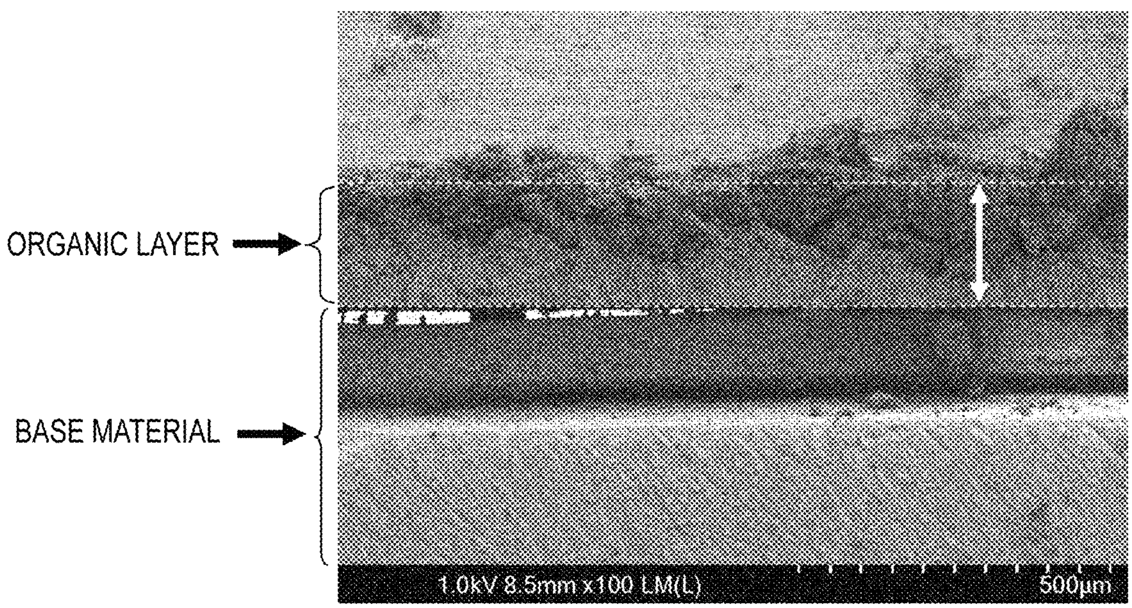
FIG. 4 shows a cross-sectional SEM image of an organic layer formed of a mixture of Example 7.

FIG. 4 shows a cross-sectional SEM image of the organic layer formed of the mixture of Example 7.

SEM Observation

The cross section of the above-manufactured organic layer was observed with Scanning Electron Microscope (SEM) (model No.: SU8220 manufactured by Hitachi High Techonlogies, accelerating voltage for observation: 1 kV).

Example 8

In Example 8, an organic layer was formed into a film with a vacuum deposition apparatus under the same film-formation conditions in the same manner as in Example 7 except for using a compound HT-4 in place of the compound HT-1 as the second compound in the mixture.

Figure 5:
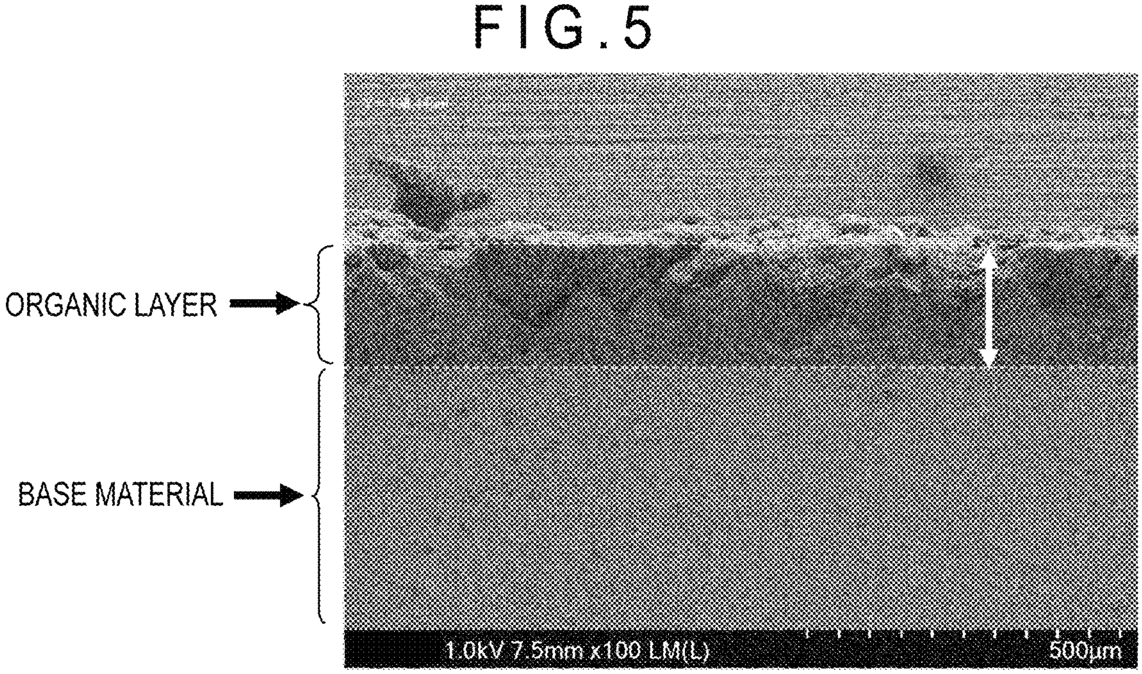
FIG. 5 shows a cross-sectional SEM image of an organic layer formed of a mixture of Example 8.

FIG. 5 shows a cross-sectional SEM image of the organic layer in Example 8.

Example 9

In Example 9, an organic layer was formed into a film with a vacuum deposition apparatus under the same film-formation conditions in the same manner as in Example 7 except for using the compound HT-2 in place of the compound HT-1 as the second compound in the mixture.

Figure 6:
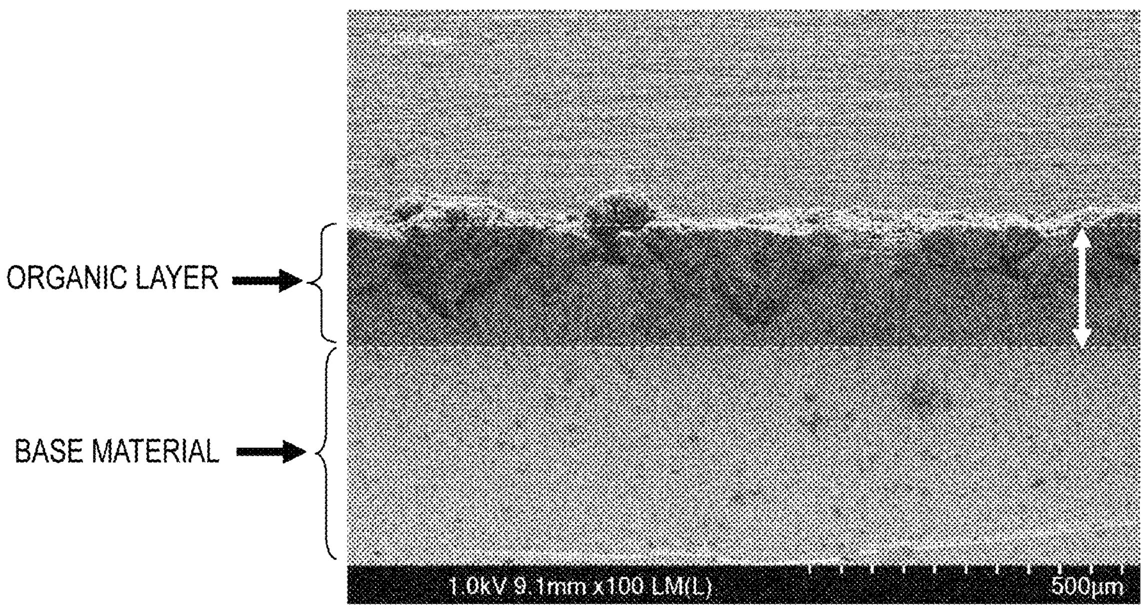
FIG. 6 shows a cross-sectional SEM image of an organic layer formed of a mixture of Example 9.

FIG. 6 shows a cross-sectional SEM image of the organic layer in Example 9.

Example 10

In Example 10, an organic layer was formed into a film with a vacuum deposition apparatus under the same film-formation conditions in the same manner as in Example 7 except for using a compound HT-7 in place of the compound HT-1 as the second compound in the mixture.

Figure 7:
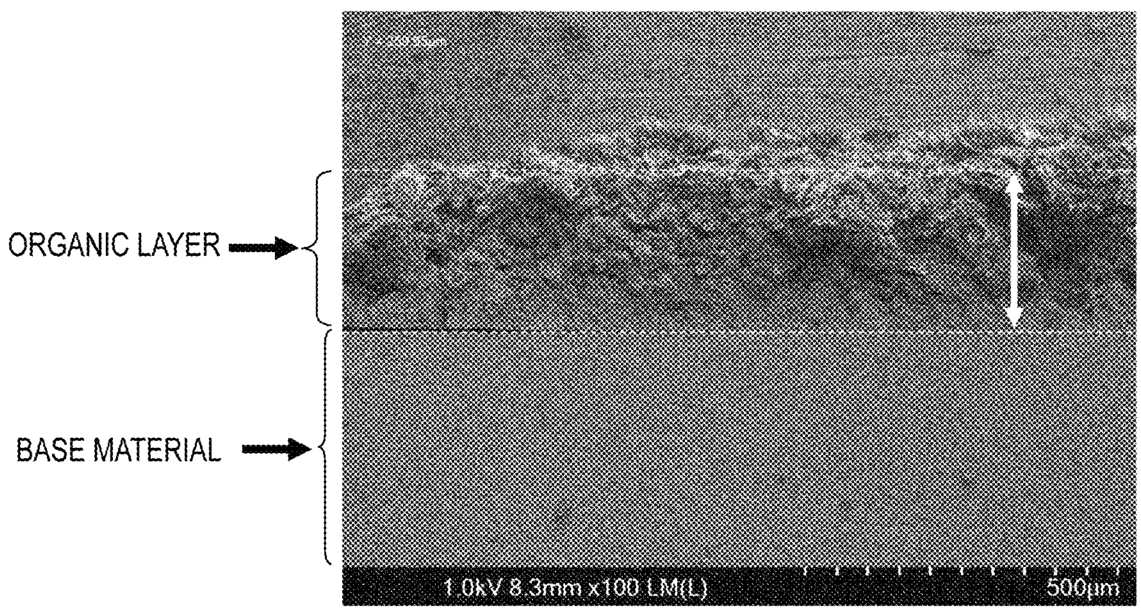
FIG. 7 shows a cross-sectional SEM image of an organic layer formed of a mixture of Example 10.

FIG. 7 shows a cross-sectional SEM image of the organic layer in Example 10.

Example 11

In Example 11, an organic layer was formed into a film with a vacuum deposition apparatus under the same film-formation conditions in the same manner as in Example 7 except for using a compound HT-8 in place of the compound HT-1 as the second compound in the mixture.

Figure 8:
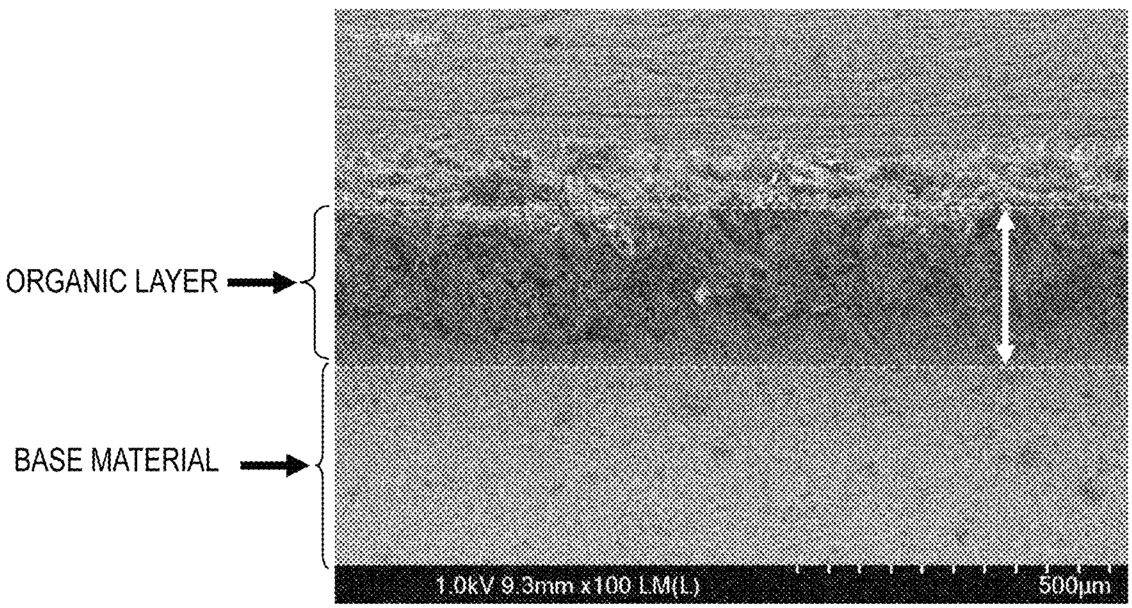
FIG. 8 shows a cross-sectional SEM image of an organic layer formed of a mixture of Example 11.

FIG. 8 shows a cross-sectional SEM image of the organic layer in Example 11.

Example 12

In Example 12, an organic layer was formed into a film with a vacuum deposition apparatus under the same film-formation conditions in the same manner as in Example 7 except for using a compound HT-9 in place of the compound HT-1 as the second compound in the mixture.

Figure 9:
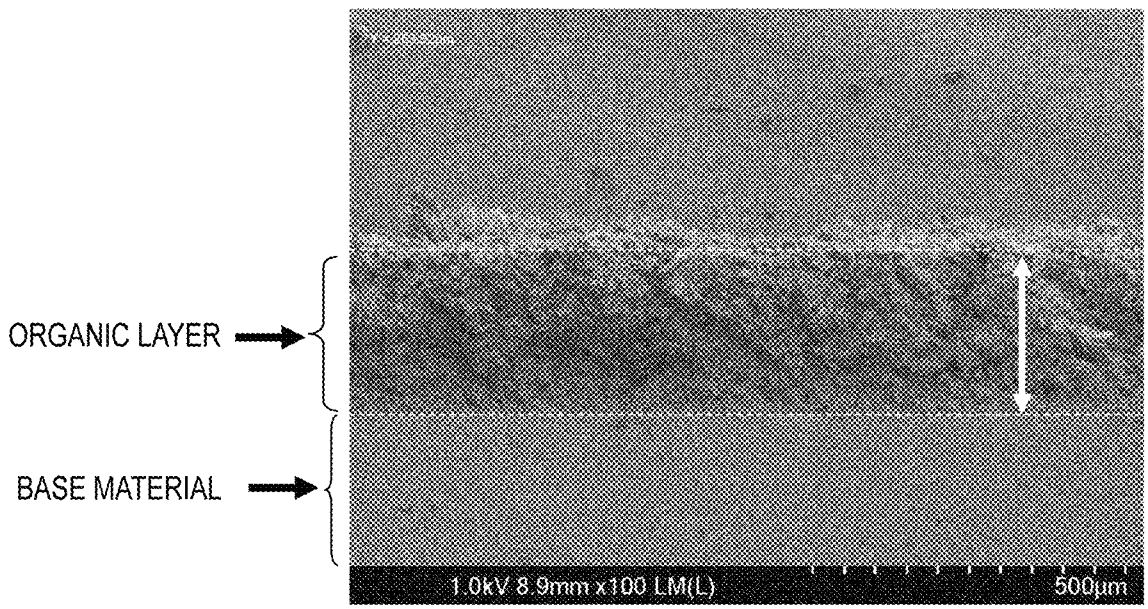
FIG. 9 shows a cross-sectional SEM image of an organic layer formed of a mixture of Example 12.

FIG. 9 shows a cross-sectional SEM image of the organic layer in Example 12.

Example 13

In Example 13, an organic layer was formed into a film with a vacuum deposition apparatus under the same film-formation conditions in the same manner as in Example 7 except for using a compound HI-3 in place of the compound HI-2 as the first compound and using a compound HT-4 in place of the compound HT-1 as the second compound in the mixture.

Figure 10:
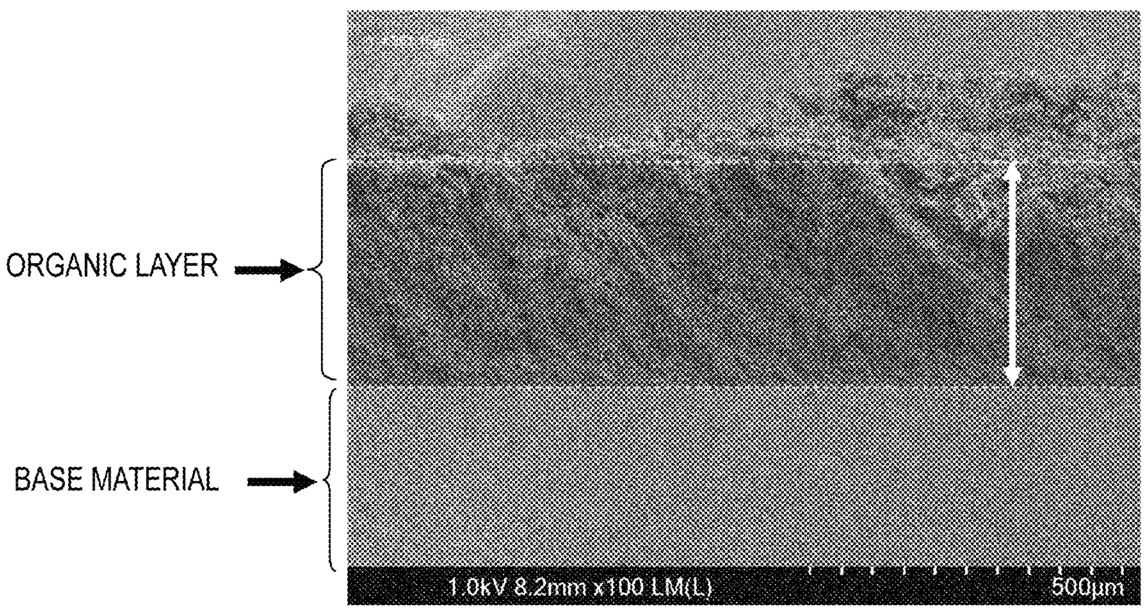
FIG. 10 shows a cross-sectional SEM image of an organic layer formed of a mixture of Example 13.

FIG. 10 shows a cross-sectional SEM image of the organic layer in Example 13.

Comparative 3

In Comparative 3, an organic layer was formed into a film with a vacuum deposition apparatus under the same film-formation conditions in the same manner as in Example 7 except that not a mixture but 200 mg of only the compound HI-2 as the first compound was put into a crucible.

Figure 11A:
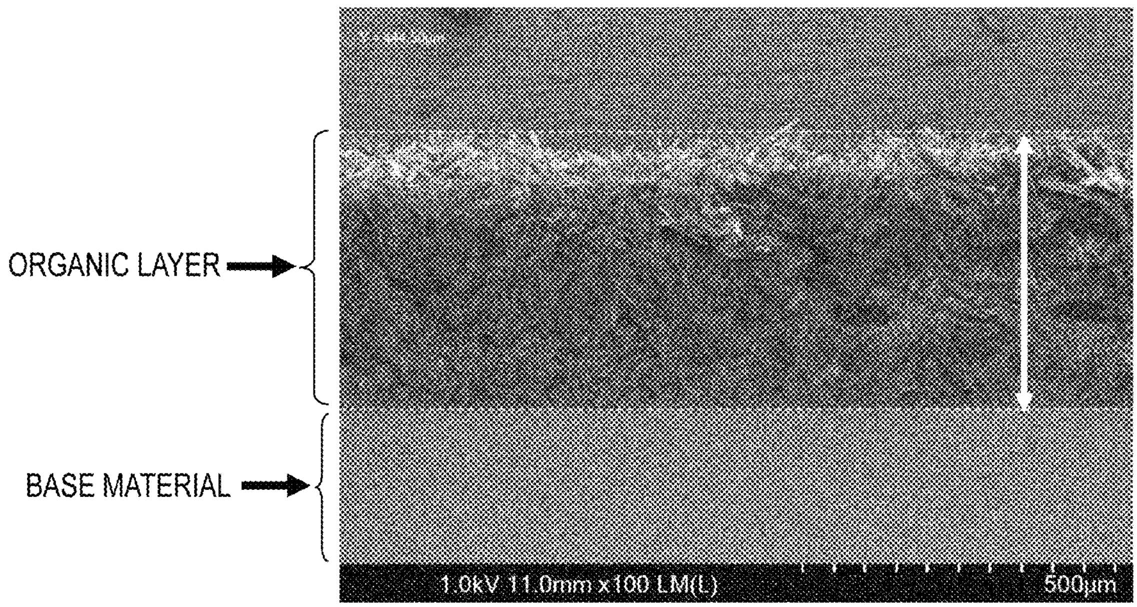
FIG. 11A shows a cross-sectional SEM image of an organic layer of Comparative 3.

FIG. 11A shows a cross-sectional SEM image of the organic layer in Comparative 3.

Comparative 4

In Comparative 4, an organic layer was formed into a film with a vacuum deposition apparatus under the same film-formation conditions in the same manner as in Example 7 except that not a mixture but 200 mg of the compound HI-4 was solely put into a crucible as the first compound.

Figure 11B:
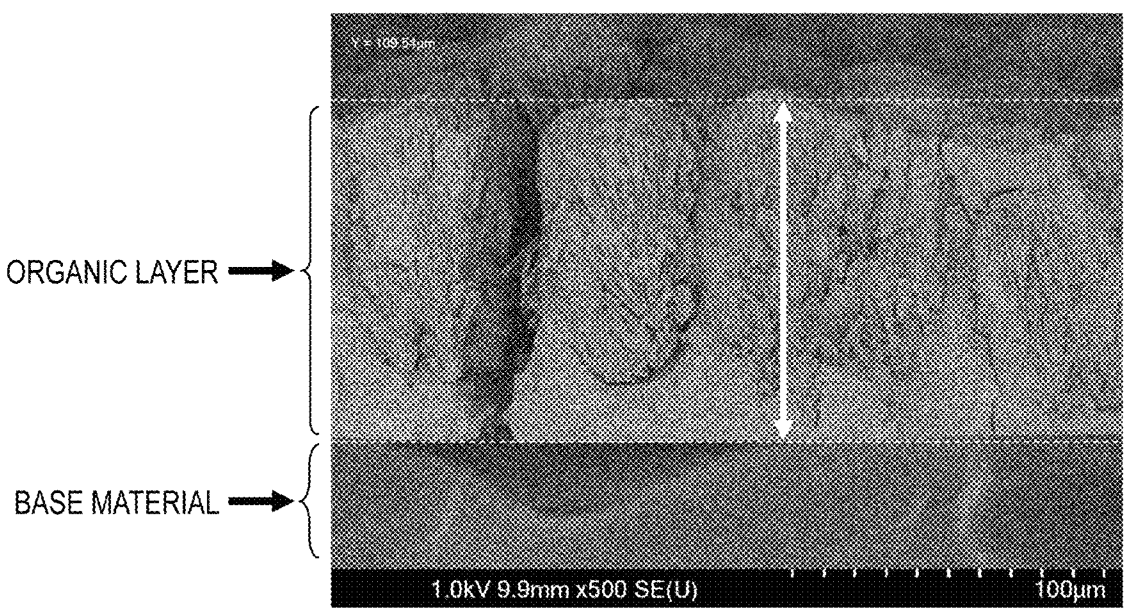
FIG. 11B shows a cross-sectional SEM image of an organic layer of Comparative 4.

FIG. 11B shows a cross-sectional SEM image of the organic layer in Comparative 4.

Comparative 5

In Comparative 5, an organic layer was formed into a film with a vacuum deposition apparatus under the same film-formation conditions in the same manner as in Example 7 except that not a mixture but 200 mg of the compound HI-3 was solely put into a crucible as the first compound.

Figure 12:
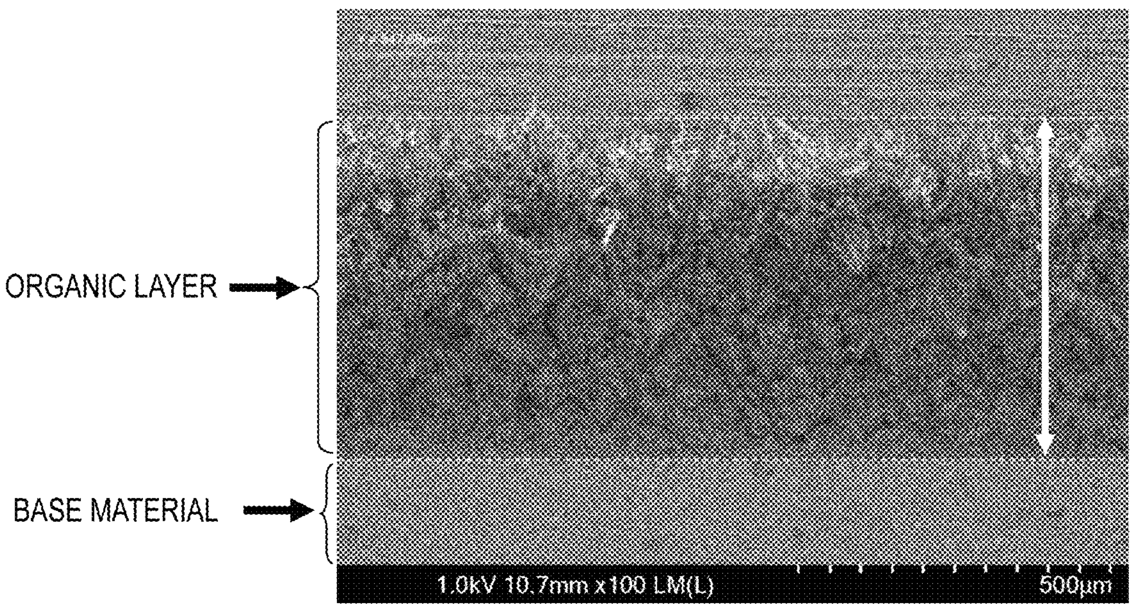
FIG. 12 shows a cross-sectional SEM image of an organic layer of Comparative 5.

FIG. 12 shows a cross-sectional SEM image of the organic layer in Comparative 5.

As a result of the film formation from a single material of the first compound, the organic layers of Comparatives 3 to 5 exhibited a bulky crystal growth on the base material as shown in the cross-sectional SEM images of FIGS. 11A, 11B and 12. In contrast to Comparatives 3 to 5, it was found that, when a film was formed from a mixture prepared by mixing the second compound of 1 mass %, 3 mass %, 5 mass % or 15 mass % with the first compound, a dense and less bulky organic layer was formed as shown in the cross-sectional SEM images in FIGS. 4 to 10.

<Manufacturing 2 of Organic Electroluminescence Device>

Organic electroluminescence devices were prepared and evaluated as follows.

Example 14

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for one minute. A film of ITO was 130 nm thick.

The cleaned glass substrate having the transparent electrode line was attached to a substrate holder of a vacuum deposition apparatus. Initially, the compound HI-2 (first compound) and the compound HT-1 (second compound) in a form of a mixture, which contained the compounds HI-2 and HT-1 at a mass ratio of 99 mass %:1 mass %, were co-deposited on a surface provided with the transparent electrode line to cover the transparent electrode, thereby forming a 3-nm-thick hole injecting layer.

Next, the compound HT-4 was vapor-deposited on the hole injecting layer to form a 87-nm-thick hole transporting layer.

Next, the compound HT-6 was vapor-deposited on the hole transporting layer to form a 5-nm-thick electron blocking layer.

Thereafter, a compound BH-2 and a compound BD-2 were co-deposited on the electron blocking layer to form a 20-nm-thick emitting layer. The compound BH-2 and the compound BD-2 were respectively 99 mass % and 1 mass % in the emitting layer in concentration.

Next, a compound ET-3 was vapor-deposited on the emitting layer to form a 5-nm-thick hole blocking layer.

Next, a compound ET-4 and a compound Liq were vapor-deposited on the hole blocking layer to form a 25-nm-thick electron transporting layer (ET). A ratio of each of the compound ET-4 and the compound Liq was 50 mass % in the electron transporting layer (ET). Liq is an abbreviation of (8-quinolinolato)lithium ((8-Quinolinolato)lithium).

Next, ytterbium (Yb) was vapor-deposited on the electron transporting layer to form a 1-nm-thick electron injectable electrode (cathode).

Subsequently, metal aluminum (Al) was vapor-deposited on the electron injectable electrode to form an 80-nm-thick metal Al cathode.

A device arrangement of the organic EL device in Example 14 is roughly shown as follows.

ITO(130)/HI-2:HT-1(3,99%:1%)/HT-4(87)/HT-6(5)/BH-2:BD-2(20,99%:1%)/ET-3(5)/ET-4:Liq(25,50%:50%)/Yb (1)/Al(80)

The numerals in parentheses represent film thickness (unit: nm).

The numerals represented by percentage in the same parentheses (95%:1%) each indicate a ratio (mass %) between the compound HI-2 and the compound HT-1 in the hole injecting layer or a ratio (mass %) between the compound BH-2 and the compound BD-2 in the emitting layer. The numerals represented by percentage in the same parentheses (50%:50%) each indicate a ratio (mass %) between the compound ET-4 and the compound Liq in the electron transporting layer (ET). Similar notations apply to the description below.

Examples 15 to 16

Organic EL devices in Examples 15 and 16 were manufactured in the same manner as in Example 14 except that the ratio between the first compound and the second compound in the mixture used for forming the hole injecting layer was changed to the ratios shown in Table 2.

Comparative 6

An organic EL device in Comparative 6 was manufactured in the same manner as in Example 14 except that not a mixture but only the first compound (compound HI-2) was used for forming the hole injecting layer.

<Evaluation 2 of Organic EL Device>

The organic EL devices manufactured in Examples 14 to 39 and Comparatives 6 to 11 were evaluated through the same method applied to those in Examples 4 and the like. Evaluation results are shown in Tables 2 to 9.

TABLE 2

| | Hole Injecting Layer | | | | | | | |
|---|---|---|---|---|---|---|---|---|
| | First Compound | | Second Compoud | | | | | |
| | Kind | Ratio [mass %] | Kind | Ratio [mass %] | Thickness [nm] | Drive Voltage [V] | EQE [%] | LT95 [h] |
| EX. 14 | HI-2 | 99 | HT-1 | 1 | 3 | 3.99 | 10.7 | 194 |
| EX. 15 | HI-2 | 95 | HT-1 | 5 | 3 | 3.69 | 10.8 | 182 |
| EX. 16 | HI-2 | 85 | HT-1 | 15 | 3 | 3.64 | 10.8 | 190 |
| COMP. 6 | HI-2 | 100 | — | — | 3 | 3.61 | 10.7 | 182 |

Example 17

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for one minute. A film of ITO was 130 nm thick.

The cleaned glass substrate having the transparent electrode line was attached to a substrate holder of a vacuum deposition apparatus. Initially, the compound HI-2 (first compound) and the compound HT-1 (second compound) in a form of a mixture, which contained the compounds HI-2 and HT-1 at a mass ratio of 99 mass %:1 mass %, were co-deposited on a surface provided with the transparent electrode line to cover the transparent electrode, thereby forming a 5-nm-thick hole injecting layer.

Next, the compound HT-4 was vapor-deposited on the hole injecting layer to form a 85-nm-thick hole transporting layer.

Next, the compound HT-6 was vapor-deposited on the hole transporting layer to form a 5-nm-thick electron blocking layer.

Thereafter, the compound BH-2 and the compound BD-2 were co-deposited on the electron blocking layer to form a 20-nm-thick emitting layer. The compound BH-2 and the compound BD-2 were respectively 99 mass % and 1 mass % in the emitting layer in concentration.

Next, the compound ET-3 was vapor-deposited on the emitting layer to form a 5-nm-thick hole blocking layer.

Next, the compound ET-4 and the compound Liq were vapor-deposited on the hole blocking layer to form a 25-nm-thick electron transporting layer (ET). A ratio of each of the compound ET-4 and the compound Liq was 50 mass % in the electron transporting layer (ET).

Next, ytterbium (Yb) was vapor-deposited on the electron transporting layer to form a 1-nm-thick electron injectable electrode (cathode).

Subsequently, metal aluminum (Al) was vapor-deposited on the electron injectable electrode to form an 80-nm-thick metal Al cathode.

A device arrangement of the organic EL device in Example 17 is roughly shown as follows.

ITO(130)/HI-2:HT-1(5,99%:1%)/HT-4(85)/HT-6(5)/BH-2:BD-2(20,99%:1%)/ET-3(5)/ET-4:Liq(25,50%:50%)/Yb (1)/Al(80)

Examples 18 to 20

Organic EL devices in Examples 18 to 20 were manufactured in the same manner as in Example 17 except that the ratio between the first compound and the second compound in the mixture used for forming the hole injecting layer was changed to the ratios shown in Table 3.

Comparative 7

An organic EL device in Comparative 7 was manufactured in the same manner as in Example 17 except that not a mixture but only the first compound (compound HI-2) was used for forming the hole injecting layer.

TABLE 3

| | Hole Injection Layer | | | | | | | |
|---|---|---|---|---|---|---|---|---|
| | First Compound | | Second Compoud | | | | | |
| | Kind | Ratio [mass %] | Kind | Ratio [mass %] | Thickness [nm] | Drive Voltage [V] | EQE [%] | LT95 [h] |
| EX. 17 | HI-2 | 99 | HT-1 | 1 | 5 | 3.55 | 10.7 | 192 |
| EX. 15 | HI-2 | 97 | HT-1 | 3 | 5 | 3.57 | 10.7 | 179 |
| EX. 19 | HI-2 | 95 | HT-1 | 5 | 5 | 3.56 | 10.9 | 206 |
| EX. 20 | HI-2 | 65 | HT-1 | 15 | 5 | 3.55 | 10.8 | 186 |
| COMP. 7 | HI-2 | 100 | — | — | 5 | 3.55 | 10.6 | 162 |

Example 21

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for one minute. A film of ITO was 130 nm thick.

The cleaned glass substrate having the transparent electrode line was attached to a substrate holder of a vacuum deposition apparatus. Initially, the compound HI-2 (first compound) and the compound HT-1 (second compound) in a form of a mixture containing the compounds HI-2 and HT-1 at a mass ratio of 99 mass %:1 mass % were co-deposited on a surface provided with the transparent electrode line to cover the transparent electrode, thereby forming a 10-nm-thick hole injecting layer.

Next, the compound HT-4 was vapor-deposited on the hole injecting layer to form a 80-nm-thick hole transporting layer.

Next, the compound HT-6 was vapor-deposited on the hole transporting layer to form a 5-nm-thick electron blocking layer.

Thereafter, the compound BH-2 and the compound BD-2 were co-deposited on the electron blocking layer to form a 20-nm-thick emitting layer. The compound BH-2 and the compound BD-2 were respectively 99 mass % and 1 mass % in the emitting layer in concentration.

Next, the compound ET-3 was vapor-deposited on the emitting layer to form a 5-nm-thick hole blocking layer.

Next, the compound ET-4 and the compound Liq were vapor-deposited on the hole blocking layer to form a 25-nm-thick electron transporting layer (ET). A ratio of each of the compound ET-4 and the compound Liq was 50 mass % in the electron transporting layer (ET).

Next, ytterbium (Yb) was vapor-deposited on the electron transporting layer to form a 1-nm-thick electron injectable electrode (cathode).

Subsequently, metal aluminum (Al) was vapor-deposited on the electron injectable electrode to form an 80-nm-thick metal Al cathode.

A device arrangement of the organic EL device in Example 21 is roughly shown as follows.

ITO(130)/HI-2:HT-1(10,99%:1%)/HT-4(80)/HT-6(5)/BH-2:BD-2(20,99%:1%)/ET-3(5)/ET-4:Liq(25,50%:50%)/Yb(1)/Al(80)

Examples 22 to 24

Organic EL devices in Examples 22 to 24 were manufactured in the same manner as in Example 21 except that the ratio between the first compound and the second compound in the mixture used for forming the hole injecting layer was changed to the ratios shown in Table 4.

Comparative 8

An organic EL device in Comparative 8 was manufactured in the same manner as in Example 21 except that not a mixture but only the first compound (compound HI-2) was used for forming the hole injecting layer.

TABLE 4

| | Hole Injecting Layer | | | | | | | |
|---|---|---|---|---|---|---|---|---|
| | First Compound | | Second Compound | | | | | |
| | Kind | Ratio [mass %] | Kind | Ratio [mass %] | Thickness [nm] | Drive Voltage [V] | EQE [%] | LT95 [h] |
| EX. 21 | HI-2 | 99 | HT-1 | 1 | 10 | 3.60 | 10.6 | 187 |
| EX. 22 | HI-2 | 97 | HT-1 | 3 | 10 | 3.63 | 10.6 | 164 |
| EX. 23 | HI-2 | 95 | HT-1 | 5 | 10 | 3.62 | 10.6 | 190 |
| EX. 24 | HI-2 | 85 | HT-1 | 15 | 10 | 3.62 | 10.6 | 197 |
| COMP. 8 | HI-2 | 100 | — | — | 10 | 3.59 | 10.6 | 177 |

Example 25

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for one minute. A film of ITO was 130 nm thick.

The cleaned glass substrate having the transparent electrode line was attached to a substrate holder of a vacuum deposition apparatus. Initially, the compound HI-2 (first compound) and the compound HT-1 (second compound) in a form of a mixture containing the compounds HI-2 and HT-1 at a mass ratio of 99 mass %:1 mass % were co-deposited on a surface provided with the transparent electrode line to cover the transparent electrode, thereby forming a 20-nm-thick hole injecting layer.

Next, the compound HT-4 was vapor-deposited on the hole injecting layer to form a 70-nm-thick hole transporting layer.

Next, the compound HT-6 was vapor-deposited on the hole transporting layer to form a 5-nm-thick electron blocking layer.

Thereafter, the compound BH-2 and the compound BD-2 were co-deposited on the electron blocking layer to form a 20-nm-thick emitting layer. The compound BH-2 and the compound BD-2 were respectively 99 mass % and 1 mass % in the emitting layer in concentration.

Next, the compound ET-3 was vapor-deposited on the emitting layer to form a 5-nm-thick hole blocking layer.

Next, the compound ET-4 and the compound Liq were vapor-deposited on the hole blocking layer to form a 25-nm-thick electron transporting layer (ET). A ratio of each of the compound ET-4 and the compound Liq was 50 mass % in the electron transporting layer (ET).

Next, ytterbium (Yb) was vapor-deposited on the electron transporting layer to form a 1-nm-thick electron injectable electrode (cathode).

Subsequently, metal aluminum (Al) was vapor-deposited on the electron injectable electrode to form an 80-nm-thick metal Al cathode.

A device arrangement of the organic EL device in Example 25 is roughly shown as follows.

ITO(130)/HI-2:HT-1(20,99%:1%)/HT-4(70)/HT-6(5)/BH-2:BD-2(20,99%:1%)/ET-3(5)/ET-4:Liq(25,50%:50%)/Yb(1)/Al(80)

Examples 26 to 28

Organic EL devices in Examples 26 to 28 were manufactured in the same manner as in Example 25 except that the ratio between the first compound and the second compound in the mixture used for forming the hole injecting layer was changed to the ratios shown in Table 5.

Comparative 9

An organic EL device in Comparative 9 was manufactured in the same manner as in Example 25 except that not a mixture but only the first compound (compound HI-2) was used for forming the hole injecting layer.

TABLE 5

| | Hole Injecting Layer | | | | | | | |
|---|---|---|---|---|---|---|---|---|
| | First Compound | | Second Compoud | | | | | |
| | Kind | Ratio [mass %] | Kind | Ratio [mass %] | Thickness [nm] | Drive Voltage [V] | EQE [%] | LT95 [h] |
| EX. 25 | HI-2 | 99 | HT-1 | 1 | 20 | 3.74 | 10.6 | 184 |
| EX. 26 | HI-2 | 97 | HT-1 | 3 | 20 | 3.77 | 10.5 | 191 |
| EX. 27 | HI-2 | 95 | HT-1 | 5 | 20 | 3.79 | 10.5 | 183 |
| EX. 28 | HI-2 | 85 | HT-1 | 15 | 20 | 3.79 | 10.5 | 185 |
| COMP. 9 | HI-2 | 100 | — | — | 20 | 3.71 | 10.5 | 175 |

Example 29

A silver alloy layer, i.e., APC (Ag—Pd—Cu) layer (reflective layer) (film thickness: 100 nm) and ITO film (film thickness: 10 nm) were formed in this order by sputtering on a glass substrate (size: 25 mm×75 mm×1.1 mm thick) for manufacturing the devices. By this operation, a conductive material layer of the APC layer and the ITO layer was obtained. Subsequently, using a typical lithography technique, the conductive material layer was patterned by etching with a resist pattern as a mask to form the lower electrode (anode). A substrate in a form of the lower electrode was ultrasonic-cleaned in isopropyl alcohol for five minutes, and then UV/ozone-cleaned for 30 minutes. Subsequently, the compound HI-2 (first compound) and the compound HT-4 (second compound) in a form of a mixture containing the compounds HI-2 and HT-4 at a mass ratio of 99 mass %:1 mass % were co-deposited on the lower electrode (anode) to form a 5-nm-thick hole injecting layer.

Next, the compound HT-4 was vapor-deposited on the hole injecting layer to form a 115-nm-thick hole transporting layer.

Next, the compound HT-6 was vapor-deposited on the hole transporting layer to form a 5-nm-thick electron blocking layer.

Thereafter, the compound BH-2 and the compound BD-2 were co-deposited on the electron blocking layer to form a 20-nm-thick emitting layer. The compound BH-2 and the compound BD-2 were respectively 99 mass % and 1 mass % in the emitting layer in concentration.

Next, the compound ET-5 was vapor-deposited on the emitting layer to form a 5-nm-thick hole blocking layer.

Next, the compound ET-4 and the compound Liq were vapor-deposited on the hole blocking layer to form a 25-nm-thick electron transporting layer (ET). A ratio of each of the compound ET-4 and the compound Liq was 50 mass % in the electron transporting layer (ET).

Next, ytterbium (Yb) was vapor-deposited on the electron transporting layer to form a 1-nm-thick electron injectable electrode (cathode).

Subsequently, Mg and Ag were co-deposited on the electron injectable electrode at a mixing ratio (mass % ratio) of 10%:90%, thereby forming a 15-nm thick semi-transparent upper electrode (cathode) formed of Mg—Ag alloy.

A device arrangement of the organic EL device in Example 29 is roughly shown as follows.

APC(100)/ITO(10)/HI-2:HT-4(5, 99%:1%)/HT-4(115)/HT-6(5)/BH-2:BD-2(20,99%:1%)/ET-5(5)/ET-4:Liq(25, 50%:50%)/Yb(1)/Mg:Ag(15,10%:90%)

Example 30

An organic EL devices in Example 30 was manufactured in the same manner as in Example 29 except that the ratio between the first compound and the second compound in the mixture used for forming the hole injecting layer was changed to the ratio shown in Table 6.

Comparative 10

An organic EL device in Comparative 10 was manufactured in the same manner as in Example 29 except that not a mixture but only the first compound (compound HI-2) was used for forming the hole injecting layer.

TABLE 6

| | Hole Injecting Layer | | | | | | | |
|---|---|---|---|---|---|---|---|---|
| | First Compound | | Second Compoud | | | | | |
| | Kind | Ratio [mass %] | Kind | Ratio [mass %] | Thickness [nm] | Drive Voltage [V] | EQE [%] | LT95 [h] |
| EX. 29 | HI-2 | 99 | HT-4 | 1 | 5 | 3.74 | 18.6 | 170 |
| EX. 30 | HI-2 | 97 | HT-4 | 3 | 5 | 3.76 | 18.8 | 166 |
| COMP. 10 | HI-2 | 100 | — | — | 5 | 3.73 | 18.8 | 159 |

Example 31

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for one minute. A film of ITO was 130 nm thick.

The cleaned glass substrate having the transparent electrode line was attached to a substrate holder of a vacuum deposition apparatus. Initially, the compound HI-2 (first compound) and the compound HT-2 (second compound) in a form of a mixture containing the compounds HI-2 and HT-2 at a mass ratio of 97 mass %:3 mass % were co-deposited on a surface provided with the transparent electrode line to cover the transparent electrode, thereby forming a 5-nm-thick hole injecting layer.

Next, the compound HT-4 was vapor-deposited on the hole injecting layer to form a 85-nm-thick hole transporting layer.

Next, the compound HT-6 was vapor-deposited on the hole transporting layer to form a 5-nm-thick electron blocking layer.

Thereafter, the compound BH-2 and the compound BD-2 were co-deposited on the electron blocking layer to form a 20-nm-thick emitting layer. The compound BH-2 and the compound BD-2 were respectively 99 mass % and 1 mass % in the emitting layer in concentration.

Next, the compound ET-3 was vapor-deposited on the emitting layer to form a 5-nm-thick hole blocking layer.

Next, the compound ET-4 and the compound Liq were vapor-deposited on the hole blocking layer to form a 25-nm-thick electron transporting layer (ET). A ratio of each of the compound ET-4 and the compound Liq was 50 mass % in the electron transporting layer (ET).

Next, ytterbium (Yb) was vapor-deposited on the electron transporting layer to form a 1-nm-thick electron injectable electrode (cathode).

Subsequently, metal aluminum (Al) was vapor-deposited on the electron injectable electrode to form an 80-nm-thick metal Al cathode.

A device arrangement of the organic EL device in Example 31 is roughly shown as follows.

ITO(130)/HI-2:HT-2(5,97%:3%)/HT-4(85)/HT-6(5)/BH-2:BD-2(20,99%:1%)/ET-3(5)/ET-4:Liq(25,50%:50%)/Yb (1)/Al(80)

Examples 32 to 34

Organic EL devices in Examples 32 to 34 were manufactured in the same manner as in Example 31 except that the second compound in the mixture used for forming the hole injecting layer was replaced by the compounds shown in Table 7.

The evaluation results of the organic EL device in Comparative 7 are again shown in Table 7 for comparison.

TABLE 7

| | Hole Injecting Layer | | | | | | | |
|---|---|---|---|---|---|---|---|---|
| | First Compound | | Second Compoud | | | | | |
| | Kind | Ratio [mass %] | Kind | Ratio [mass %] | Thickness [nm] | Drive Voltage [V] | EQE [%] | LT95 [h] |
| EX. 31 | HI-2 | 97 | HT-2 | 3 | 5 | 3.56 | 105 | 158 |
| EX. 32 | HI-2 | 97 | HT-5 | 3 | 5 | 3.54 | 10.6 | 166 |
| EX. 33 | HI-2 | 97 | HT-7 | 3 | 5 | 3.58 | 10.5 | 164 |
| EX. 34 | HI-2 | 97 | HT-8 | 3 | 5 | 3.59 | 10.7 | 160 |
| COMP. 7 | HI-2 | 100 | — | — | 5 | 3.55 | 10.6 | 162 |

Example 35

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for one minute. A film of ITO was 130 nm thick.

The cleaned glass substrate having the transparent electrode line was attached to a substrate holder of a vacuum deposition apparatus. Initially, the compound HI-3 (first compound) and the compound HT-4 (second compound) in a form of a mixture containing the compounds HI-3 and HT-4 at a mass ratio of 97 mass %:3 mass % were co-deposited on a surface provided with the transparent electrode line to cover the transparent electrode, thereby forming a 5-nm-thick hole injecting layer.

Next, the compound HT-4 was vapor-deposited on the hole injecting layer to form a 85-nm-thick hole transporting layer.

Next, the compound HT-6 was vapor-deposited on the hole transporting layer to form a 5-nm-thick electron blocking layer.

Thereafter, the compound BH-2 and the compound BD-2 were co-deposited on the electron blocking layer to form a 20-nm-thick emitting layer. The compound BH-2 and the compound BD-2 were respectively 99 mass % and 1 mass % in the emitting layer in concentration.

Next, the compound ET-3 was vapor-deposited on the emitting layer to form a 5-nm-thick hole blocking layer.

Next, the compound ET-4 and the compound Liq were vapor-deposited on the hole blocking layer to form a 25-nm-thick electron transporting layer (ET). A ratio of each of the compound ET-4 and the compound Liq was 50 mass % in the electron transporting layer (ET).

Next, ytterbium (Yb) was vapor-deposited on the electron transporting layer to form a 1-nm-thick electron injectable electrode (cathode).

Subsequently, metal aluminum (Al) was vapor-deposited on the electron injectable electrode to form an 80-nm-thick metal Al cathode.

A device arrangement of the organic EL device in Example 35 is roughly shown as follows.

ITO(130)/HI-3:HT-4(5,97%:3%)/HT-4(85)/HT-6(5)/BH-2:BD-2(20,99%:1%)/ET-3(5)/ET-4:Liq(25,50%:50%)/Yb (1)/Al(80)

Examples 36 to 38

Organic EL devices in Examples 36 to 38 were manufactured in the same manner as in Example 35 except that the second compound in the mixture used for forming the hole injecting layer was replaced by the compounds shown in Table 8.

Comparative 11

An organic EL device in Comparative 11 was manufactured in the same manner as in Example 35 except that not a mixture but the first compound (compound HI-3) was solely used for forming the hole injecting layer.

TABLE 8

| | Hole Injecting Layer | | | | | | | |
|---|---|---|---|---|---|---|---|---|
| | First Compound | | Second Compoud | | | | | |
| | Kind | Ratio [mass %] | Kind | Ratio [mass %] | Thickness [nm] | Drive Voltage [V] | EQE [%] | LT95 [h] |
| EX. 35 | HI-3 | 97 | HT-4 | 3 | 5 | 3.56 | 10.7 | 168 |
| EX. 36 | HI-3 | 97 | HT-2 | 3 | 5 | 3.57 | 10.7 | 171 |
| EX. 37 | HI-3 | 97 | HT-5 | 3 | 5 | 3.58 | 10.8 | 173 |
| EX. 38 | HI-3 | 97 | HT-7 | 3 | 5 | 3.70 | 11.0 | 169 |
| COMP. 11 | HI-3 | 100 | — | — | 5 | 3.55 | 10.7 | 170 |

Example 39

An organic EL devices in Example 39 was manufactured in the same manner as in Example 31 except that the second compound in the mixture used for forming the hole injecting layer was replaced by the compound shown in Table 9.

The evaluation results of the organic EL device in Comparative 7 are again shown in Table 9 for comparison.

TABLE 9

| | Hole Injection Layer | | | | | | | |
|---|---|---|---|---|---|---|---|---|
| | First Compound | | Second Compoud | | | | | |
| | Kind | Ratio [mass %] | Kind | Ratio [mass %] | Thickness [nm] | Drive Voltage [V] | EQE [%] | LT95 [h] |
| EX. 39 | HI-2 | 97 | HT-10 | 3 | 5 | 3.60 | 10.7 | 162 |
| COMP. 7 | HI-2 | 100 | — | — | 5 | 3.55 | 10.6 | 162 |

It has been found that the organic EL devices in Examples 14 to 39, in which the mixture obtained by adding the second compound to the first compound was used to form the hole injecting layer, exhibit performance that is not significantly lower than performance of the organic EL device in Comparative in which only the first compound was used without adding the second compound to form the hole injecting layer.

Based on the above examination results in Examples 7 to 13, a formation of the organic layer through the dry film-forming using the mixture containing the first compound and the second compound according to the above exemplary embodiment can inhibit a formation of a bulky adhering film, so that an organic EL device can be manufactured without a decrease in a production efficiency and a significant decrease of a device performance.

What is claimed is:

1. A mixture comprising:

a first compound; and a second compound, wherein the first compound is a compound represented by a formula (14A), the second compound is a compound represented by a formula (22), and a total mass MT of the first compound and the second compound and a mass $M_2$ of the second compound in the mixture satisfy Numerical Formula 1A, (Numerical Formula 1A)

$$0.1 \leq (W_2/W_T) \times 100 \leq 20.0$$

(14A)

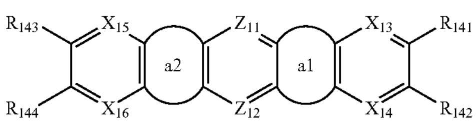

wherein:

a1 and a2 each independently represent a cyclic structure represented by a formula (11) below;

$X_{13}$ to $X_{16}$ each independently represent $C(R_{16})$ or a nitrogen atom;

a plurality of $R_{16}$ are the same or different;

$R_{16}$ and $R_{141}$ to $R_{144}$ each independently represent a hydrogen atom, a halogen atom, hydroxy group, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S— $(R_{905})$, a group represented by —$N(R_{906})(R_{907})$, a substituted or unsubstituted aryl group having 6 to 50 ring carbon atoms, or a substituted or unsubstituted heterocyclic group having 5 to 50 ring atoms; and $Z_{11}$ and $Z_{12}$ are each independently CH or a nitrogen atom, (11)

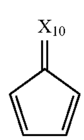

wherein:

the first cyclic structure represented by the formula (11) is fused to at least one cyclic structure of a substituted or unsubstituted aromatic hydrocarbon ring having 6 to 50 ring carbon atoms or a substituted or unsubstituted heterocycle having 5 to 50 ring atoms in a molecule of the first compound, and a structure represented by $=X_{10}$ is represented by a formula (11a), (11b), (11c), (11d), (11e), (11f), (11g), (11h), (11i), (11j), (11k) or (11m), (11a)

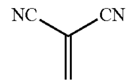

(11b)

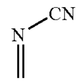

(11c)

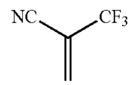

(11d)

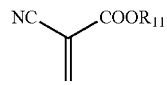

(11e)

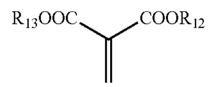

(11f)

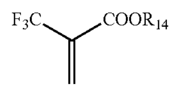

(11g)

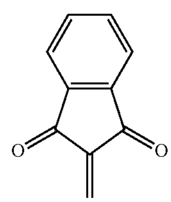

(11h)

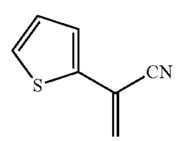

(11i)

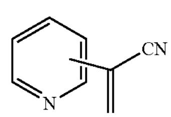

(11j)

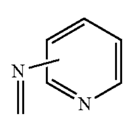

(11k)

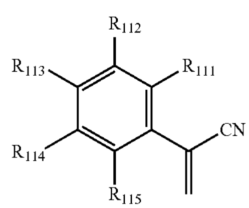

(11m)

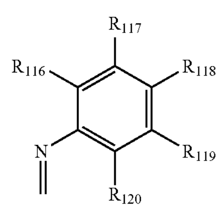

in the formula (11a), (11b), (11c), (11d), (11e), (11f), (11g), (11h), (11i), (11j), (11k) or (11m):

$R_{11}$ to $R_{14}$ and $R_{111}$ to $R_{120}$ are each independently a hydrogen atom, a halogen atom, hydroxy group, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aryl group having 6 to 50 ring carbon atoms, or a substituted or unsubstituted heterocyclic group having 5 to 50 ring atoms,

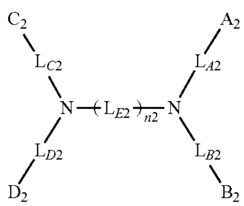
(22)

in the formula (22):

$L_{A2}$, $L_{B2}$, $L_{C2}$ and $L_{D2}$ are each independently a single bond, a substituted or unsubstituted arylene group having 6 to 50 ring carbon atoms, or a substituted or unsubstituted divalent heterocyclic group having 5 to 50 ring atoms;

n2 is 1, 2, 3 or 4;

when n2 is 1, $L_{E2}$ is a substituted or unsubstituted arylene group having 6 to 50 ring carbon atoms, or a substituted or unsubstituted divalent heterocyclic group having 5 to 50 ring atoms;

when n2 is 2, 3 or 4, a plurality of $L_{E2}$ are mutually the same or different;

when n2 is 2, 3 or 4, the plurality of $L_{E2}$ are mutually bonded to form a substituted or unsubstituted monocyclic ring, mutually bonded to form a substituted or unsubstituted fused ring, or not mutually bonded;

$L_{E2}$ forming neither the monocyclic ring nor the fused ring is a substituted or unsubstituted arylene group having 6 to 50 ring carbon atoms, or a substituted or unsubstituted divalent heterocyclic group having 5 to 50 ring atoms;

$A_2$, $B_2$, $C_2$ and $D_2$ are each independently a substituted or unsubstituted aryl group having 6 to 50 ring carbon atoms, a substituted or unsubstituted heterocyclic group having 5 to 50 ring atoms, or —Si($R'_{901}$)($R'_{902}$)($R'_{903}$);

$R'_{901}$, $R'_{902}$ and $R'_{903}$ are each independently a substituted or unsubstituted aryl group having 6 to 50 ring carbon atoms;

when a plurality of $R'_{901}$ are present, the plurality of $R'_{901}$ are mutually the same or different;

when a plurality of $R'_{902}$ are present, the plurality of $R'_{902}$ are mutually the same or different;

when a plurality of R'903 are present, the plurality of R'903 are mutually the same or different;

in the first compound and the second compound, $R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different wherein a first amino group represented by a formula (22A) and a second amino represented by a formula (22B) in the formula (22) are mutually different groups,

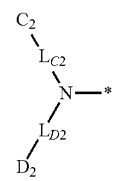
(22A)

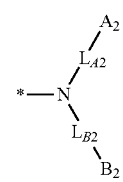
(22B)

2. The mixture according to claim 1, wherein at least one of $R_{141}$ to $R_{144}$ in the formula(14A) is a fluorine atom, a fluoroalkyl group, a fluoroalkoxy group, or a cyano group.

3. The mixture according to claim 1, wherein the first cyclic structure represented by the formula (11) is a cyclic structure represented by a formula (11A),

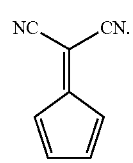
(11A)

4. The mixture according to claim 1, wherein the first compound is a compound represented by one of formulae (145) to (148), (145)

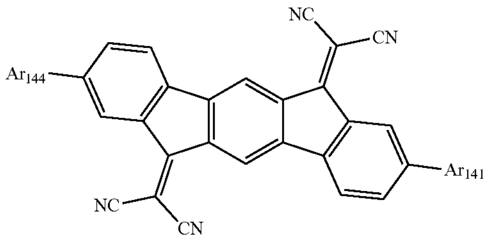

(146)

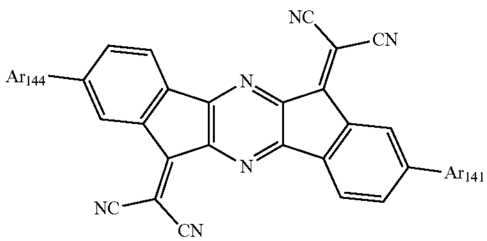

(147)

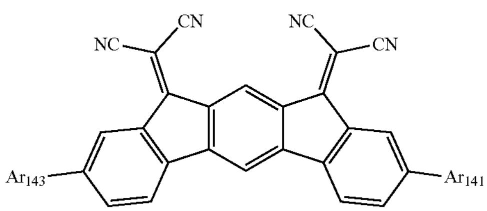

(148)

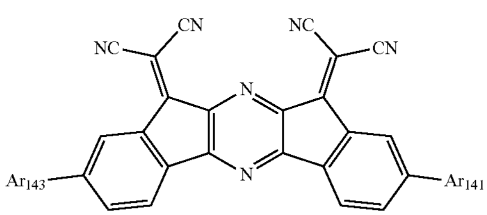

in the formulae (145) to (148):

$Ar_{141}$, $Ar_{143}$ and $Ar_{144}$ are each independently an aromatic hydrocarbon group having 6 to 30 ring carbon atoms and having at least one substituent selected from the group consisting of a fluorine atom, a fluoroalkyl group, a fluoroalkoxy group and a cyano group, or a heterocyclic group having 5 to 30 ring atoms and having at least one substituent selected from a fluorine atom, a fluoroalkyl group, a fluoroalkoxy group and a cyano group.

5. The mixture according to claim 1, wherein the first compound is a compound represented by a formula (1451), (1451)

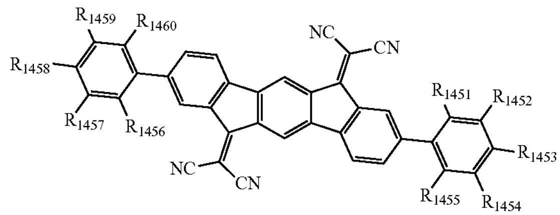

where:

$R_{1451}$ to $R_{1460}$ are each independently a hydrogen atom, a fluorine atom, a fluoroalkyl group, a fluoroalkoxy group, or a cyano group; and at least one of $R_{1451}$ to $R_{1460}$ is a fluorine atom, a fluoroalkyl group, a fluoroalkoxy group, or a cyano group.

6. The mixture according to claim 1, wherein the first compound is a compound represented by a formula (1461), (1461)

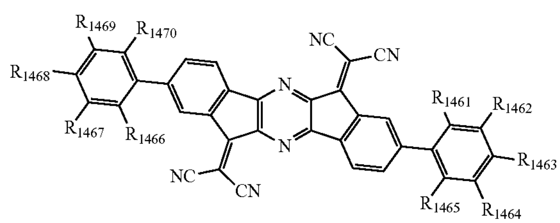

where: $R_{1461}$ to $R_{1470}$ are each independently a hydrogen atom, a fluorine atom, a fluoroalkyl group, a fluoroalkoxy group, or a cyano group; and at least one of $R_{1461}$ to $R_{1470}$ is a fluorine atom, a fluoroalkyl group, a fluoroalkoxy group, or a cyano group.

7. The mixture according to claim 1, wherein the first compound is a compound represented by one of formulae (141) to (144), (141)

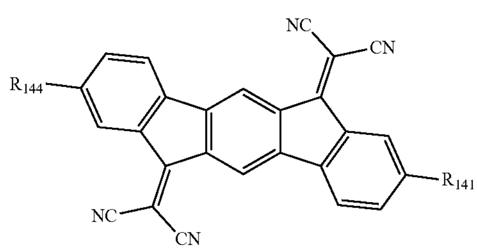

(142)

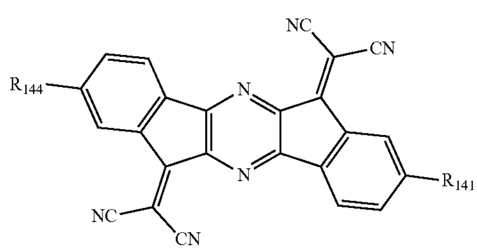

-continued (143)

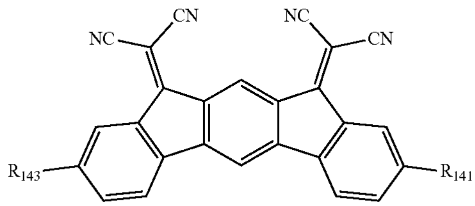

(144)

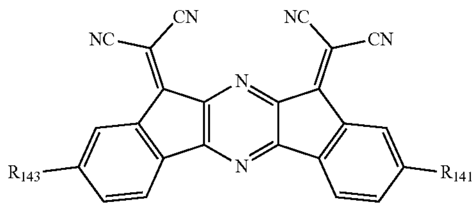

in the formulae (141) to (144):

$R_{141}$, $R_{143}$, and $R_{144}$ are each independently a fluorine atom, a fluoroalkyl group, a fluoroalkoxy group, or a cyano group.

8. The mixture according to claim 7, wherein the first compound is a compound represented by the formula (143).

9. The mixture according to claim 1, wherein at least one of $A_2$, $B_2$, $C_2$ and $D_2$ is a group selected from the group consisting of groups represented by formulae (21a), (21b), (21c) and (21d), (21a)

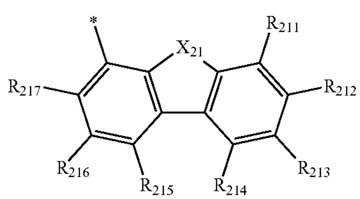

(21b)

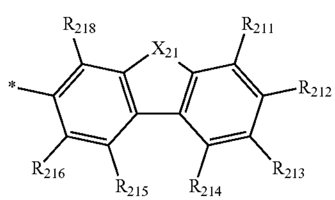

(21c)

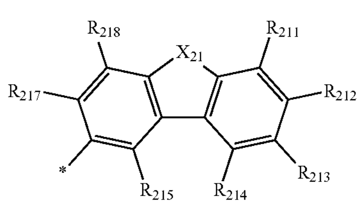

(21d)

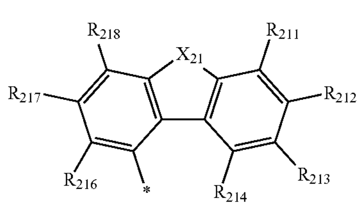

in the formulae (21a), (21b), (21c) and (21d):

$X_{21}$ is $NR_{21}$, $CR_{22}R_{23}$, an oxygen atom or a sulfur atom;

when a plurality of $X_{21}$ are present, the plurality of $X_{21}$ are mutually the same or different;

when $X_{21}$ is $CR_{22}R_{23}$, a combination of $R_{22}$ and $R_{23}$ is mutually bonded to form a substituted or unsubstituted monocyclic ring, mutually bonded to form a substituted or unsubstituted fused ring, or not mutually bonded;

$R_{21}$, and $R_{22}$ and $R_{23}$ not forming the monocyclic ring and not forming the fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms;

at least one combination of adjacent two or more of $R_{211}$ to $R_{218}$ are mutually bonded to form a substituted or unsubstituted monocyclic ring, mutually bonded to form a substituted or unsubstituted fused ring, or not mutually bonded; and $R_{211}$ to $R_{218}$ not forming the monocyclic ring and not forming the fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms; and

* in the formulae (21a), (21b), (21c) and (21d) is each independently a bonding position to $L_{A2}$, $L_{B2}$, $L_{C2}$, or $L_{D2}$.

10. The mixture according to claim 9, wherein $R_{211}$ to $R_{218}$ are hydrogen atoms.

11. The mixture according to claim 1, wherein the second compound is a compound represented by a formula (221), (221)

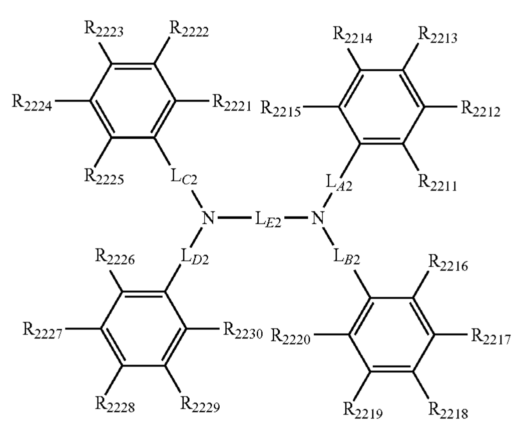

in the formula (221):

$L_{A2}$, $L_{B2}$, $L_{C2}$ and $L_{D2}$ each independently represent the same as $L_{A2}$, $L_{B2}$, $L_{C2}$ and $L_{D2}$ in the formula (22);

$L_{E2}$ represents the same as $L_{E2}$ in the formula (22);

n2 is 1, 2, 3 or 4;

at least one combination of adjacent two or more of $R_{2211}$ to $R_{2230}$ is mutually bonded to form a substituted or unsubstituted monocyclic ring, mutually bonded to form a substituted or unsubstituted fused ring, or not mutually bonded;

$R_{2211}$ to $R_{2230}$ not forming the monocyclic ring and not forming the fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —N($R_{906}$)($R_{907}$), a substituted or unsubstituted aryl group having 6 to 50 ring carbon atoms, or a substituted or unsubstituted heterocyclic group having 5 to 50 ring atoms.

12. The mixture according to claim 11, wherein $L_{A2}$, $L_{B2}$, $L_{C2}$ and $L_{D2}$ are each independently a single bond, a substituted or unsubstituted arylene group having 6 to 30 ring carbon atoms, or a substituted or unsubstituted divalent heterocyclic group having 5 to 30 ring atoms; and $L_{E2}$ is a substituted or unsubstituted arylene group having 6 to 30 ring carbon atoms, or a substituted or unsubstituted divalent heterocyclic group having 5 to 30 ring atoms.

13. The mixture according to claim 11, wherein a combination of adjacent two or more of $R_{2211}$ to $R_{2230}$ are not mutually bonded, and $R_{2211}$ to $R_{2230}$ are each independently a hydrogen atom, a substituted or unsubstituted alkyl group having 1 to 30 carbon atoms, a substituted or unsubstituted cycloalkyl group having 3 to 30 ring carbon atoms, a substituted or unsubstituted aryl group having 6 to 30 ring carbon atoms, or a substituted or unsubstituted heterocyclic group having 5 to 30 ring atoms.

14. The mixture according to claim 11, wherein $R_{2211}$ to $R_{2230}$ are hydrogen atoms.

15. The mixture according to claim 11, wherein a first amino group represented by a formula (221A) and a second amino represented by a formula (221 B) in the formula (221) are mutually different groups, (221A)

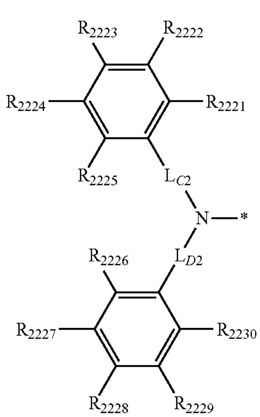

-continued (221B)

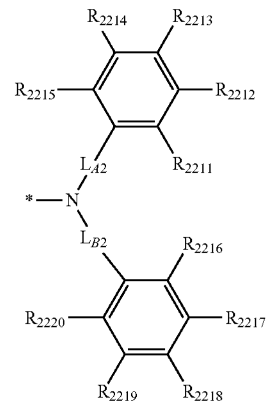

where:

$R_{2211}$ to $R_{2230}$ each independently represent the same as $R_{2211}$ to $R_{2230}$ in the formula (221);

$L_{A2}$, $L_{B2}$, $L_{C2}$ and $L_{D2}$ each independently represent the same as $L_{A2}$, $L_{B2}$, $L_{C2}$ and $L_{D2}$ in the formula (22); and

* each represents a bonding position to $L_{E2}$.

16. The mixture according to claim 1, wherein the second compound comprises at least one substituted or unsubstituted biphenyl group in a molecule.

17. The mixture according to claim 1, wherein the mixture does not comprise a compound represented by a formula (2210) and a compound represented by a formula (2211), (2210)

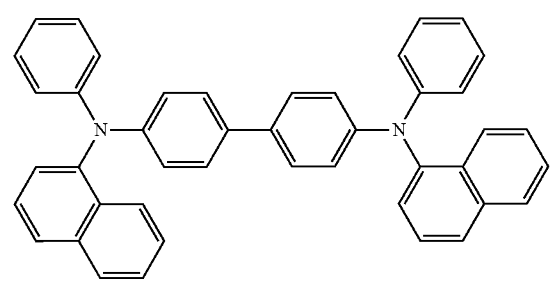

(2211)

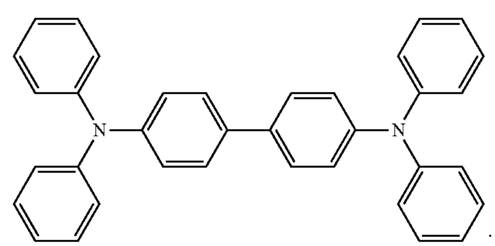

18. An organic electroluminescence device comprising:

an anode;

a cathode;

an organic layer comprising a first compound and a second compound, wherein the first compound is a compound represented by a formula (14A), the second compound is a compound represented by a formula (22), a total mass $W_T$ of the first compound and the second compound and a mass $W_2$ of the second compound in the organic layer satisfy Numerical Formula 2A, (Numerical Formula 2A)

$$0.1 \leq (W_2/W_T) \times 100 \leq 20.0$$

(14A)

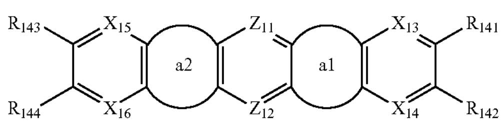

a1 and a2 each independently represent a cyclic structure represented by a formula (11) below;

$X_{13}$ to $X_{16}$ each independently represent $C(R_{16})$ or a nitrogen atom;

a plurality of $R_{16}$ are the same or different;

$R_{16}$ and $R_{141}$ to $R_{144}$ each independently represent a hydrogen atom, a halogen atom, hydroxy group, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a substituted or unsubstituted aryl group having 6 to 50 ring carbon atoms, or a substituted or unsubstituted heterocyclic group having 5 to 50 ring atoms;

and

Z11 and Z12 are each independently CH or a nitrogen atom, (11)

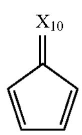

wherein:

the first cyclic structure represented by the formula (11) is fused to at least one cyclic structure of a substituted or unsubstituted aromatic hydrocarbon ring having 6 to 50 ring carbon atoms or a substituted or unsubstituted heterocycle having 5 to 50 ring atoms in a molecule of the first compound, and a structure represented by $=X_{10}$ is represented by a formula (11a), (11b), (11c), (11d), (11e), (11f), (11g), (11h), (11i), (11j), (11k) or (11m), (11a)

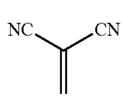

(11b)

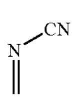

(11c)

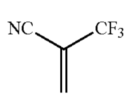

-continued (11d)

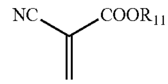

(11e)

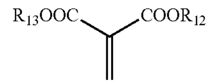

(11f)

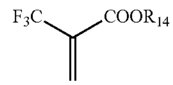

(11g)

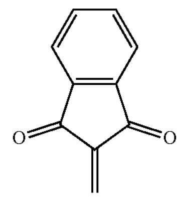

(11h)

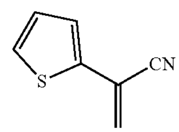

(11i)

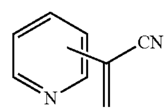

(11j)

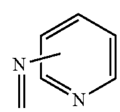

(11k)

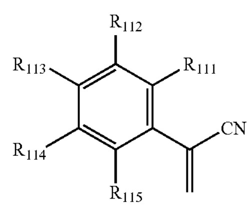

(11m)

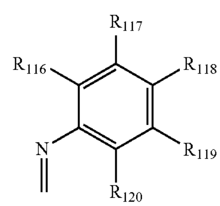

in the formula (11a), (11b), (11c), (11d), (11e), (11f), (11g), (11h), (11i), (11j), (11k) or (11m):

$R_{11}$ to $R_{14}$ and $R_{111}$ to $R_{120}$ are each independently a hydrogen atom, a halogen atom, hydroxy group, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a substituted or unsubstituted aryl group having 6 to 50 ring carbon atoms, or a substituted or unsubstituted heterocyclic group having 5 to 50 ring atoms;

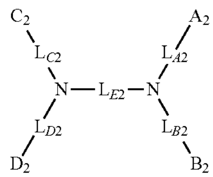
(22)

in the formula (22):

$L_{A2}$, $L_{B2}$, $L_{C2}$ and $L_{D2}$ are each independently a single bond, a substituted or unsubstituted arylene group having 6 to 50 ring carbon atoms, or a substituted or unsubstituted divalent heterocyclic group having 5 to 50 ring atoms;

n2 is 1, 2, 3 or 4;

when n2 is 1, $L_{E2}$ is a substituted or unsubstituted arylene group having 6 to 50 ring carbon atoms, or a substituted or unsubstituted divalent heterocyclic group having 5 to 50 ring atoms;

when n2 is 2, 3 or 4, a plurality of $L_{E2}$ are mutually the same or different; when n2 is 2, 3 or 4, the plurality of $L_{E2}$ are mutually bonded to form a substituted or unsubstituted monocyclic ring, mutually bonded to form a substituted or unsubstituted fused ring, or not mutually bonded;

$L_{E2}$ forming neither the monocyclic ring nor the fused ring is a substituted or unsubstituted arylene group having 6 to 50 ring carbon atoms, or a substituted or unsubstituted divalent heterocyclic group having 5 to 50 ring atoms;

$A_2$, $B_2$, $C_2$ and $D_2$ are each independently a substituted or unsubstituted aryl group having 6 to 50 ring carbon atoms, a substituted or unsubstituted heterocyclic group having 5 to 50 ring atoms, or —Si($R'_{901}$)($R'_{902}$)($R'_{903}$);

$R'_{901}$, $R'_{902}$ and $R'_{903}$ are each independently a substituted or unsubstituted aryl group having 6 to 50 ring carbon atoms;

when a plurality of $R'_{901}$ are present, the plurality of $R'_{901}$ are mutually the same or different;

when a plurality of $R'_{902}$ are present, the plurality of $R'_{902}$ are mutually the same or different;

when a plurality of $R'_{903}$ are present, the plurality of $R'_{903}$ are mutually the same or different;

in the first compound and the second compound, $R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different wherein a first amino group represented by a formula (22A) and a second amino represented by a formula (22B) in the formula (22) are mutually different groups,

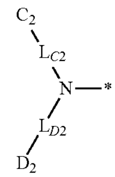
(22A)

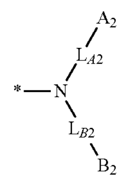
(22B)

19. The organic electroluminescence device according to claim 18, wherein the organic layer comprises: a first organic layer comprising the first compound and the second compound; and an emitting layer, the emitting layer is provided between the first organic layer and the cathode, and the emitting layer is not provided between the first organic layer and the anode.

20. The organic electroluminescence device according to claim 19, wherein the organic layer comprises at least one of a hole injecting layer or a hole transporting layer provided between the anode and the emitting layer, and the at least one of the hole injecting layer or the hole transporting layer comprises the first compound and the second compound.

21. The organic electroluminescence device according to claim 18, wherein the first compound is a compound represented by a formula (141) or a formula (1451),

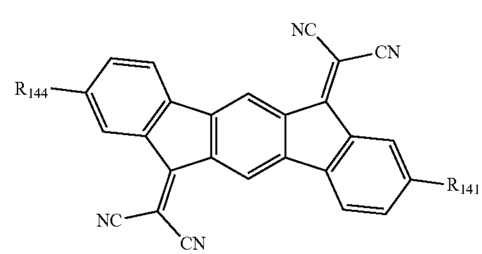
(141)

-continued (1451)

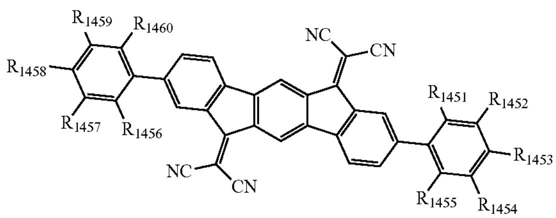

in the formula (141): $R_{141}$ and $R_{144}$ are each independently a fluorine atom, a fluoroalkyl group, a fluoroalkoxy group, or a cyano group, in the formula (1451):

$R_{1451}$ to $R_{1460}$ are each independently a hydrogen atom, a fluorine atom, a fluoroalkyl group, a fluoroalkoxy group, or a cyano group; and at least one of $R_{1451}$ to $R_{1460}$ is a fluorine atom, a fluoroalkyl group, a fluoroalkoxy group, or a cyano group.

22. The organic electroluminescence device according to claim 18, wherein the total mass $W_T$ of the first compound and the second compound and the mass $W_2$ of the second compound in the organic layer satisfy a relationship represented by Numerical Formula 2B, $$0.1 \leq (W_2/W_T) \times 100 \leq 10.0 \quad \text{(Numerical Formula 2B).}$$

23. An electronic device comprising the organic electroluminescence device according to claim 18.

* * * * *